US012772655B2

(12) United States Patent
Tasaki et al.

(10) Patent No.: US 12,772,655 B2
(45) Date of Patent: Oct. 20, 2026

(54) ORGANIC ELECTROLUMINESCENT ELEMENT AND ELECTRONIC DEVICE

(71) Applicant: IDEMITSU KOSAN CO., LTD., Tokyo (JP)

(72) Inventors: Satomi Tasaki, Tokyo (JP); Tetsuya Masuda, Tokyo (JP); Hiroaki Toyoshima, Tokyo (JP); Masato Nakamura, Tokyo (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 1045 days.

(21) Appl. No.: 17/918,267

(22) PCT Filed: Apr. 13, 2021

(86) PCT No.: PCT/JP2021/015333
§ 371 (c)(1),
(2) Date: Oct. 11, 2022

(87) PCT Pub. No.: WO2021/210582
PCT Pub. Date: Oct. 21, 2021

(65) Prior Publication Data

US 2023/0171977 A1 Jun. 1, 2023

(30) Foreign Application Priority Data

Apr. 15, 2020 (JP) ................................ 2020-073062
Jun. 29, 2020 (JP) ................................ 2020-111932

(51) Int. Cl.
*H01L 51/50* (2006.01)
*H10K 50/12* (2023.01)
(Continued)

(52) U.S. Cl.
CPC ............ *H10K 50/13* (2023.02); *H10K 50/12* (2023.02); *B82Y 30/00* (2013.01); *H10K 2102/351* (2023.02)

(58) Field of Classification Search
None
See application file for complete search history.

(56) References Cited

U.S. PATENT DOCUMENTS

2007/0273270 A1 11/2007 Jinde et al.
2007/0275266 A1 11/2007 Jinde et al.
(Continued)

FOREIGN PATENT DOCUMENTS

JP 2007-294261 A 11/2007
JP 2009-016478 A 1/2009
(Continued)

OTHER PUBLICATIONS

International Searching Authority, "International Search Report," issued in connection with International Patent Application No. PCT/JP2021/015333, dated Jun. 8, 2021.
(Continued)

*Primary Examiner* — Gregory D Clark
(74) *Attorney, Agent, or Firm* — Foley & Lardner LLP

(57) ABSTRACT

An organic EL device includes a first emitting layer and a second emitting layer. The first emitting layer contains a first host material and a first dopant material. The second emitting layer contains a second host material and a second dopant material. The first host material and the second host material are different from each other. The first dopant material is a compound having a maximum peak wavelength of 500 nm or less. The second dopant material is a compound having a maximum peak wavelength of 500 nm or less. The first dopant material and the second dopant material are different from each other. A triplet energy $T_1$(H1) of
(Continued)

the first host material and a triplet energy $T_1(H2)$ of the second host material satisfy a relationship of a numerical formula (Numerical Formula 1), $$T_1(H1)>T_1(H2) \quad \text{(Numerical Formula 1).}$$

31 Claims, 1 Drawing Sheet

(51) Int. Cl.

| | |
|---|---|
| ***H10K 50/13*** | (2023.01) |
| *B82Y 30/00* | (2011.01) |
| *H10K 102/00* | (2023.01) |

(56) References Cited

U.S. PATENT DOCUMENTS

| | | | | |
|---|---|---|---|---|
| 2010/0295444 | A1 | 11/2010 | Kuma et al. | |
| 2010/0301318 | A1 | 12/2010 | Kuma et al. | |
| 2011/0108810 | A1 * | 5/2011 | Kishino | H10K 50/11 257/40 |
| 2013/0270539 | A1 | 10/2013 | Kuma et al. | |
| 2014/0183500 | A1 | 7/2014 | Ikeda et al. | |
| 2017/0229660 | A1 | 8/2017 | Ogiwara et al. | |
| 2017/0324043 | A1 | 11/2017 | Ikeda et al. | |
| 2019/0280209 | A1 | 9/2019 | Fujita | |

FOREIGN PATENT DOCUMENTS

| | | | | |
|---|---|---|---|---|
| JP | 2013-157552 | A | 8/2013 | |
| WO | WO-2007/138906 | A1 | 12/2007 | |
| WO | WO-2010/134350 | A1 | 11/2010 | |
| WO | WO-2014/104144 | A1 | 7/2014 | |
| WO | WO-2016/031703 | A1 | 3/2016 | |
| WO | WO 2018/206138 | A1 * | 11/2018 | H01L 51/52 |
| WO | WO-2021/049653 | A1 | 3/2021 | |

OTHER PUBLICATIONS

International Searching Authority, "Written Opinion," issued in connection with International Patent Application No. PCT/JP2021/015333, dated Jun. 8, 2021.

International Searching Authority, "Written Opinion," issued in connection with International Patent Application No. PCT/JP2021/015333, dated Jun. 8, 2021 (English Translation dated Oct. 13, 2022).

* cited by examiner

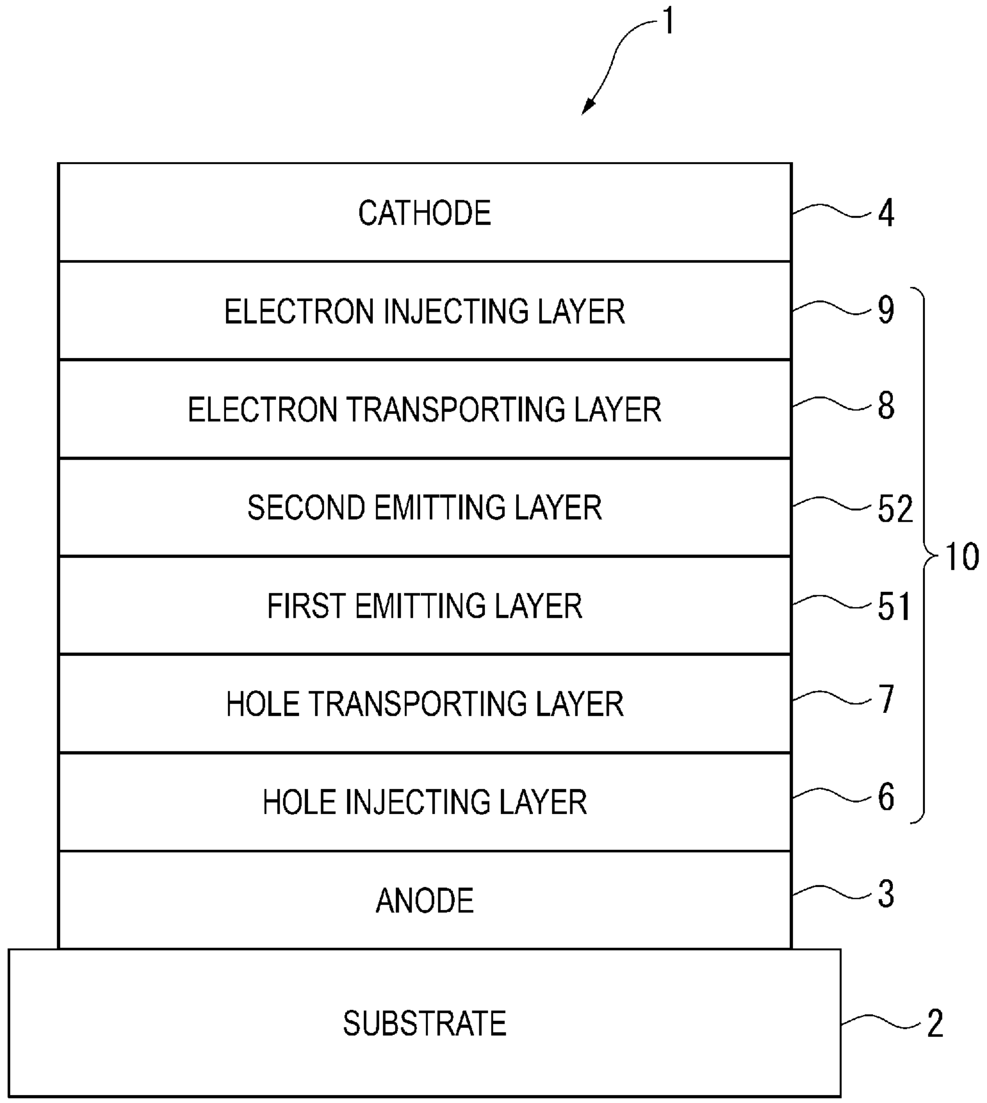
1
CATHODE
4
ELECTRON INJECTING LAYER
9
ELECTRON TRANSPORTING LAYER
8
SECOND EMITTING LAYER
52
10
FIRST EMITTING LAYER
51
HOLE TRANSPORTING LAYER
7
HOLE INJECTING LAYER
6
ANODE
3
SUBSTRATE
2

ORGANIC ELECTROLUMINESCENT ELEMENT AND ELECTRONIC DEVICE

CROSS-REFERENCE TO RELATED APPLICATIONS

The present application claims priority under 37 U.S.C. § 371 to International Patent Application No. PCT/JP2021/015333, filed Apr. 13, 2021, which claims priority to and the benefit of Japanese Patent Application Nos. 2020-073062, filed on Apr. 15, 2020, and 2020-111932, filed on Jun. 29, 2020. The contents of these applications are hereby incorporated by reference in their entireties.

TECHNICAL FIELD

The present invention relates to an organic electroluminescent device and an electronic device.

BACKGROUND ART

An organic electroluminescence device (hereinafter, occasionally referred to as "organic EL device") has found its application in a full-color display for mobile phones, televisions and the like. When a voltage is applied to the organic EL device, holes are injected from an anode and electrons are injected from a cathode into an emitting layer. The injected electrons and holes are recombined in the emitting layer to form excitons. Specifically, according to the electron spin statistics theory, singlet excitons and triplet excitons are generated at a ratio of 25%:75%.

In order to improve the performance of the organic EL device, various studies have been made for compounds to be used for the organic EL device in, for instance, Patent Literatures 1 to 4 and 6. In addition, Patent Literature 5 describes a phenomenon where singlet excitons are generated by collision and fusion of two triplet excitons (hereinafter, sometimes referred to as a Triplet-Triplet Fusion (TTF) phenomenon) in order to improve the performance of the organic EL device.

The performance of the organic EL device is exemplified by luminance, emission wavelength, chromaticity, luminous efficiency, drive voltage, and lifetime.

CITATION LIST

Patent Literature(s)

Patent Literature 1: JP 2013-157552 A

Patent Literature 2: JP 2009-016478 A

Patent Literature 3: International Publication No. 2007/138906

Patent Literature 4: US Patent Application Publication No. 2019/280209

Patent Literature 5: International Publication No. WO 2010/134350

Patent Literature 6: JP 2007-294261 A

SUMMARY OF THE INVENTION

Problems to be Solved by the Invention

An object of the invention is to provide an organic electroluminescence device having an improved performance. An object of the invention is to provide an organic electroluminescence device having an improved luminous efficiency and an electronic device including the organic electroluminescence device.

Means for Solving the Problem(s)

According to an aspect of the invention, an organic electroluminescence device includes a first emitting layer and a second emitting layer, in which the first emitting layer includes a first host material, the second emitting layer includes a second host material, the first host material and the second host material are different from each other, the first emitting layer at least includes a compound capable of emitting fluorescence having a maximum peak wavelength of 500 nm or less, the second emitting layer at least includes a compound capable of emitting fluorescence having a maximum peak wavelength of 500 nm or less, the compound capable of emitting fluorescence having a maximum peak wavelength of 500 nm or less contained in the first emitting layer and the compound capable of emitting fluorescence having a maximum peak wavelength of 500 nm or less contained in the second emitting layer are mutually the same or different, and a triplet energy $T_1(H1)$ of the first host material and a triplet energy $T_1(H2)$ of the second host material satisfy a relationship of a numerical formula (Numerical Formula 1) below, $$T_1(H1)>T_1(H2) \quad \text{(Numerical Formula 1).}$$

According to another aspect of the invention, an organic electroluminescence device includes a first emitting layer and a second emitting layer, in which the first emitting layer includes a first host material and a first dopant material, the second emitting layer includes a second host material and a second dopant material, the first host material and the second host material are different from each other, the first dopant material is a compound having a maximum peak wavelength of 500 nm or less, the second dopant material is a compound having a maximum peak wavelength of 500 nm or less, the first dopant material and the second dopant material are different from each other, and a triplet energy $T_1(H1)$ of the first host material and a triplet energy $T_1(H2)$ of the second host material satisfy the relationship of the numerical formula (Numerical Formula 1).

According to still another aspect of the invention, an electronic device including the organic electroluminescence device according to the above aspect of the invention is provided.

According to the aspect of the invention, an organic electroluminescence device having an improved performance can be provided. According to the aspect of the invention, an organic electroluminescence device having an improved luminous efficiency can be provided. According to the aspect of the invention, an electronic device including the organic electroluminescence device can be provided.

BRIEF EXPLANATION OF DRAWING(S)

The FIGURE schematically shows an exemplary arrangement of an organic electroluminescence device according to an exemplary embodiment of the invention.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituents Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group," and a substituted aryl group refers to a "substituted aryl group" in a "substituted or unsubstituted aryl group.") A simply termed "aryl group" herein includes both of an "unsubstituted aryl group" and a "substituted aryl group."

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A): phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and a monovalent aryl group derived by removing one hydrogen atom from cyclic structures represented by formulae (TEMP-1) to (TEMP-15) below.

[Formula 1]

(TEMP-1)

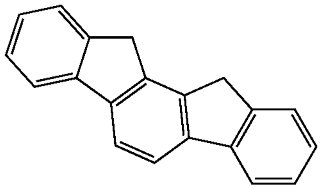

(TEMP-2)

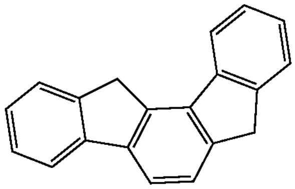

(TEMP-3)

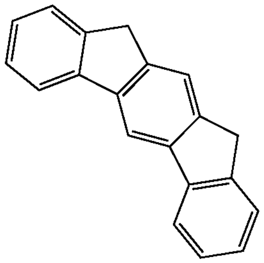

(TEMP-4)

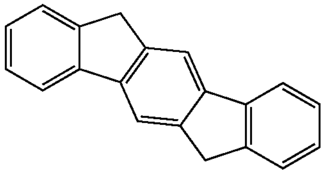

-continued (TEMP-5)

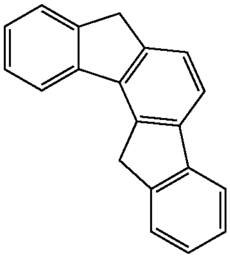

(TEMP-6)

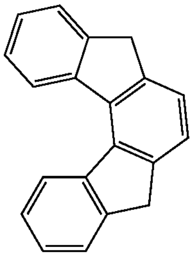

(TEMP-7)

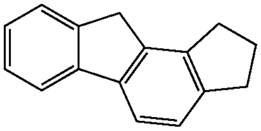

(TEMP-8)

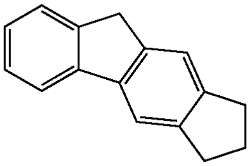

(TEMP-9)

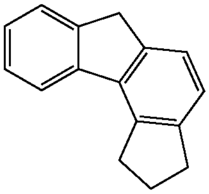

[Formula 2]

(TEMP-10)

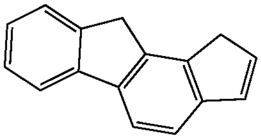

(TEMP-11)

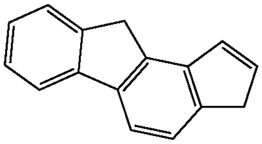

(TEMP-12)

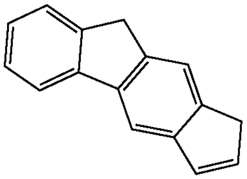

-continued (TEMP-13)

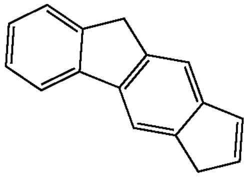

(TEMP-14)

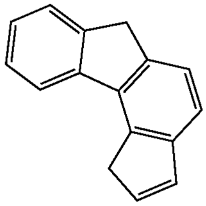

(TEMP-15)

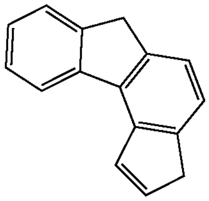

Substituted Aryl Group (Specific Example Group G1B):
o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis (4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of "unsubstituted heterocyclic group" and "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):
pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, a pyridyl group, pyridazynyl group, a pyrimidinyl group, pyrazinyl group, a triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):
furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):
thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4)

[Formula 3]

(TEMP-16)

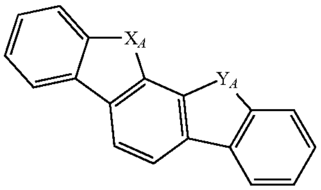

(TEMP-17)

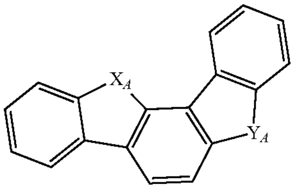

(TEMP-18)

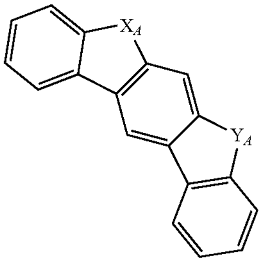

(TEMP-19)

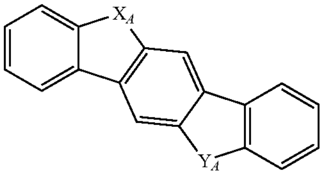

(TEMP-20)

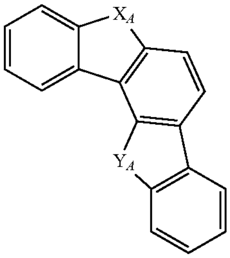

-continued (TEMP-21)

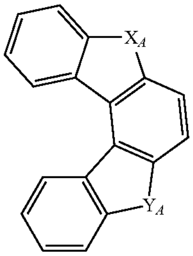

(TEMP-22)

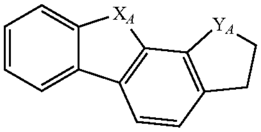

(TEMP-23)

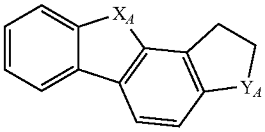

(TEMP-24)

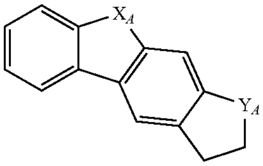

[Formula 4]

(TEMP-25)

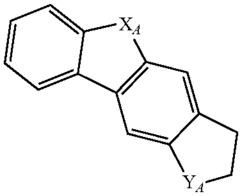

(TEMP-26)

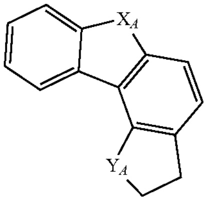

(TEMP-27)

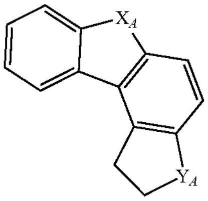

(TEMP-28)

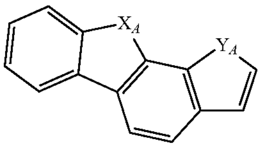

-continued (TEMP-29)

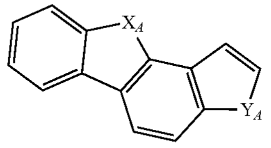

(TEMP-30)

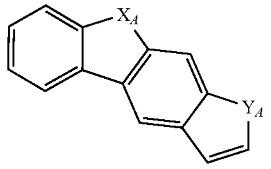

(TEMP-31)

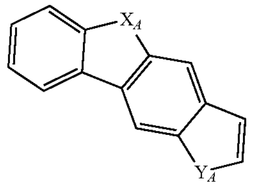

(TEMP-32)

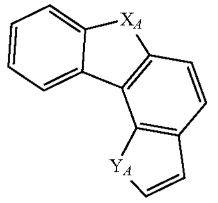

(TEMP-33)

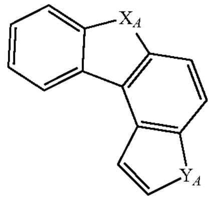

In the formulae (TEMP-16) to (TEMP-33), $X_A$ and $Y_A$ are each independently an oxygen atom, a sulfur atom, NH, or $CH_2$. However, at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH, or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

phenyldibenzothiophenyl group, methyldibenzothiophenyl group, t-butyldibenzothiophenyl group, and monovalent residue of spiro[9H-thioxanthene-9, 9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4)

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B below). (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom bonded to a carbon atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

methyl group, ethyl group, n-propyl group, isopropyl group, n-butyl group, isobutyl group, s-butyl group, and t-butyl group.

Substituted Alkyl Group (Specific Example Group G3B):

heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

vinyl group, allyl group, 1-butenyl group, 2-butenyl group, and 3-butenyl group.

Substituted Alkenyl Group (Specific Example Group G4B):

1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group.") A simply termed "alkynyl group" herein includes both of "unsubstituted alkynyl group" and "substituted alkynyl group."

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of an "unsubstituted cycloalkyl group" and a "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

4-methylcyclohexyl group.

Group Represented by $—Si(R_{901})(R_{902})(R_{903})$

Specific examples (specific example group G7) of the group represented herein by $—Si(R_{901})(R_{902})(R_{903})$ include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6).

Herein: G1 Represents a "Substituted or Unsubstituted Aryl Group" in the Specific Example Group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —Si(G1)(G1)(G1) are mutually the same or different.

A plurality of G2 in —Si(G1)(G2)(G2) are mutually the same or different.

A plurality of G1 in —Si(G1)(G1)(G2) are mutually the same or different.

A plurality of G2 in —Si(G2)(G2)(G2) are mutually the same or different.

The plurality of G3 in —Si(G3)(G3)(G3) are mutually the same or different.

A plurality of G6 in —Si(G6)(G6)(G6) are mutually the same or different.

Group Represented by $—O—(R_{904})$

Specific examples (specific example group G8) of a group represented by $—O—(R_{904})$ herein include —O(G1), —O(G2), —O(G3), and —O(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by $—S—(R_{905})$

Specific examples (specific example group G9) of a group represented herein by $—S—(R_{905})$ include —S(G1), —S(G2), —S(G3), and —S(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include —N(G1)(G1), —N(G2)(G2), —N(G1)(G2), —N(G3)(G3), and —N(G6)(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —N(G1)(G1) are mutually the same or different.

A plurality of G2 in —N(G2)(G2) are mutually the same or different.

A plurality of G3 in —N(G3)(G3) are mutually the same or different.

A plurality of G6 in —N(G6)(G6)) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein includes a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein includes a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" includea benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 5]

(TEMP-Cz1)

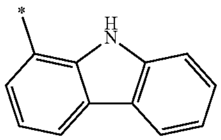

(TEMP-Cz2)

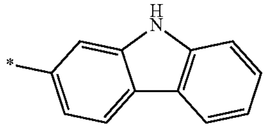

(TEMP-Cz3)

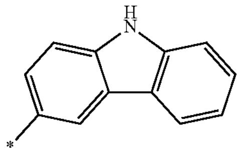

-continued (TEMP-Cz4)

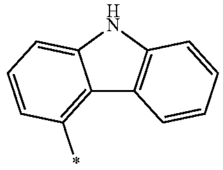

(TEMP-Cz5)

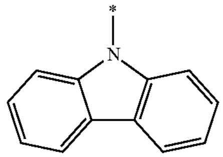

The (9-phenyl)carbazolyl group mentioned herein is, unless otherwise specified herein, specifically a group represented by one of formulae below.

[Formula 6]

(TEMP-Cz6)

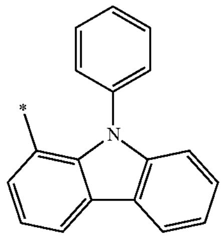

(TEMP-Cz7)

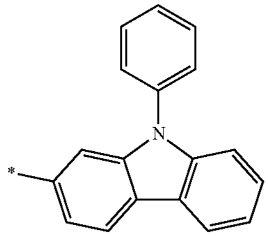

(TEMP-Cz8)

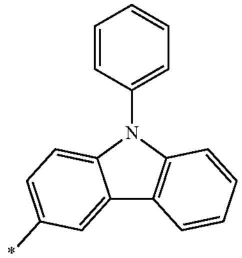

(TEMP-Cz9)

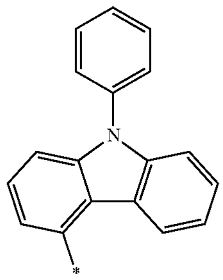

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 7]

(TEMP-34)

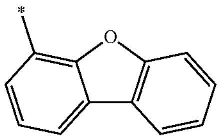

(TEMP-35)

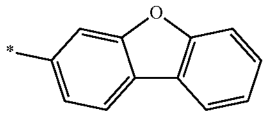

(TEMP-36)

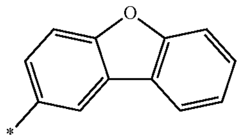

(TEMP-37)

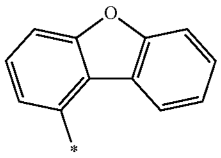

(TEMP-38)

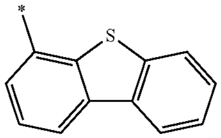

(TEMP-39)

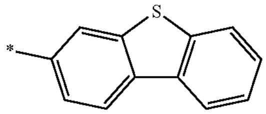

(TEMP-40)

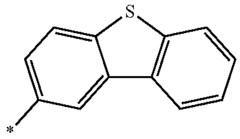

(TEMP-41)

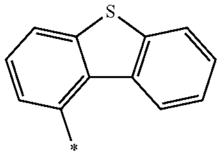

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocyclic ring of the "substituted or unsubstituted heterocyclic group." Specific examples of the "substituted or unsubstituted heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl ring of the "substituted or unsubstituted alkyl group." Specific examples of the "substituted or unsubstituted alkylene group" (specific example group G14) include a divalent group derived by removing one hydrogen atom on an alkyl ring of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

[Formula 8]

(TEMP-42)

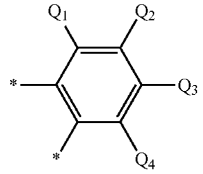

(TEMP-43)

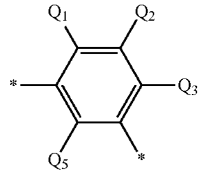

(TEMP-44)

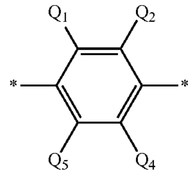

(TEMP-45)

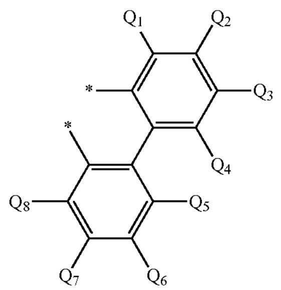

-continued
(TEMP-46)
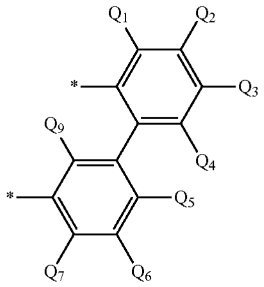
(TEMP-47)
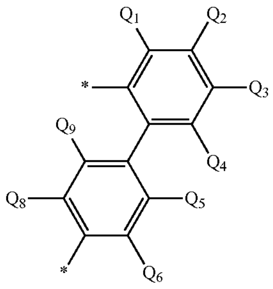
[Formula 9]
(TEMP-48)
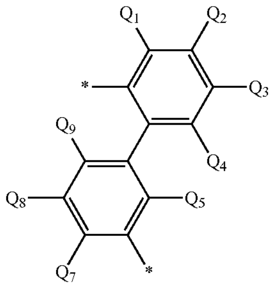
(TEMP-49)
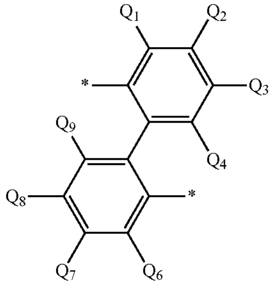
(TEMP-50)
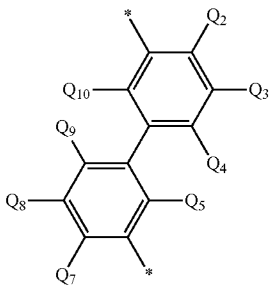
-continued
(TEMP-51)
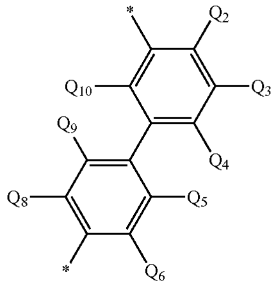
(TEMP-52)
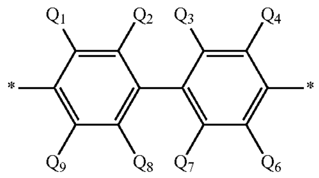
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
[Formula 10]
(TEMP 53)
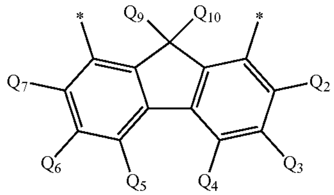
(TEMP 54)
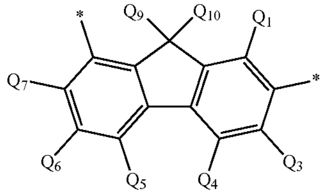
(TEMP 55)
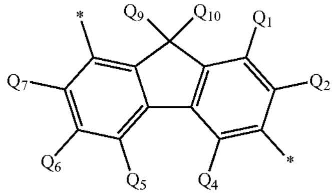
(TEMP 56)
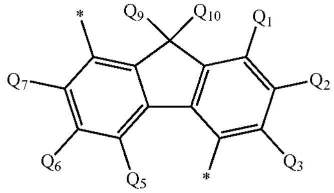

-continued (TEMP 57)

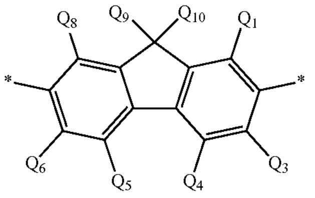

(TEMP 58)

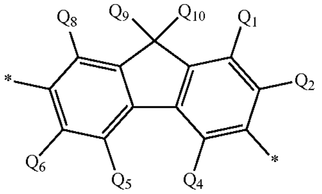

(TEMP 59)

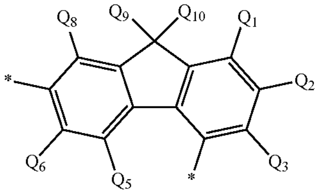

(TEMP 60)

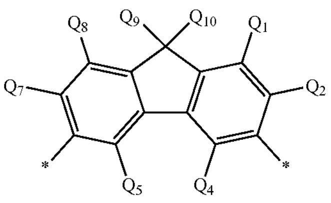

(TEMP 61)

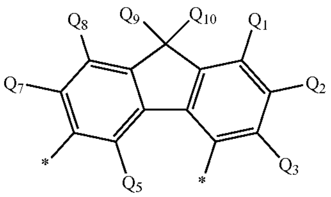

(TEMP 62)

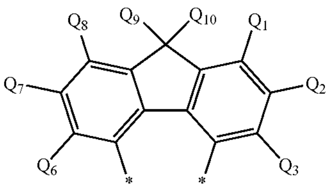

In the formulae (TEMP-53) to (TEMP-62), $Q_1$ to $Q_{10}$ each independently are a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

[Formula 11]

(TEMP-63)

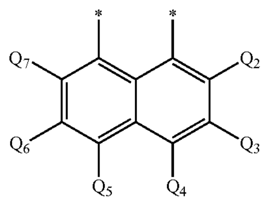

(TEMP-64)

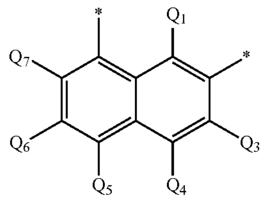

(TEMP-65)

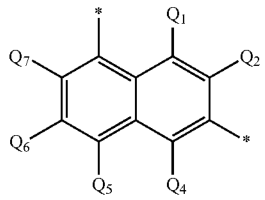

(TEMP-66)

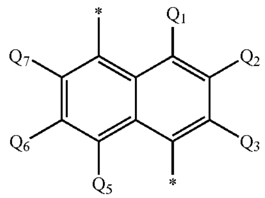

(TEMP-67)

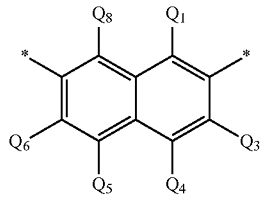

(TEMP-68)

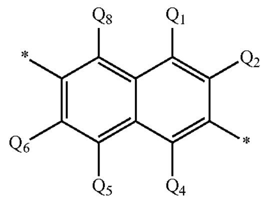

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 11]
(TEMP-69)
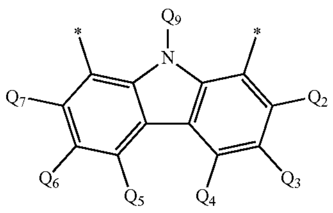
(TEMP-70)
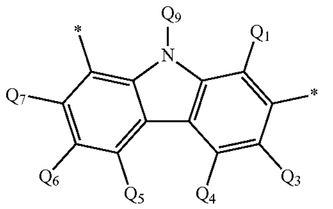
(TEMP-71)
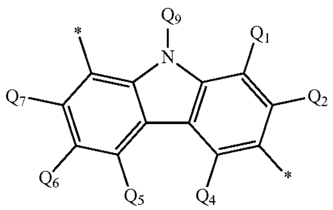
(TEMP-72)
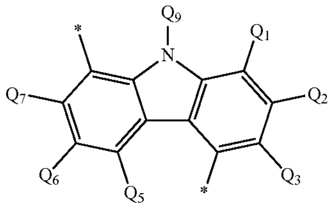
(TEMP-73)
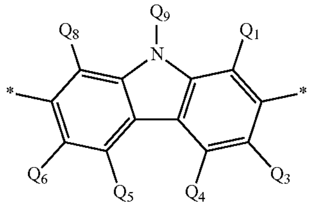
(TEMP-74)
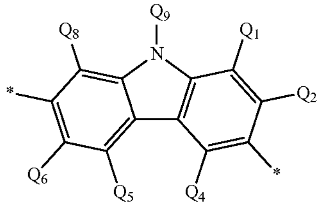
[Formula 13]
(TEMP-75)
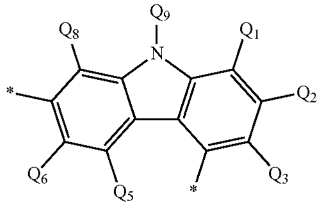
-continued
(TEMP-76)
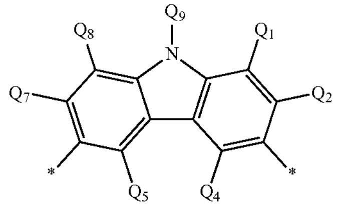
(TEMP-77)
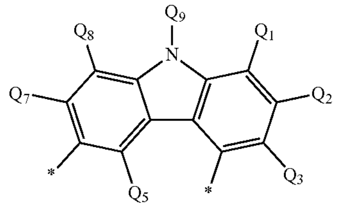
(TEMP-78)
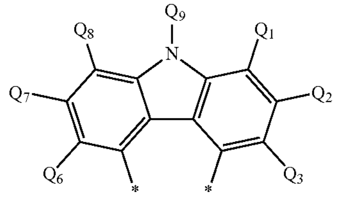
(TEMP-79)
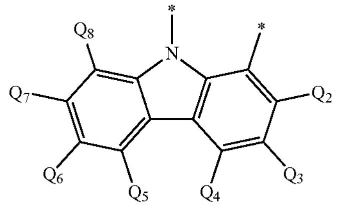
(TEMP-80)
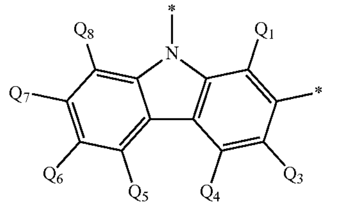
[Formula 14]
(TEMP-81)
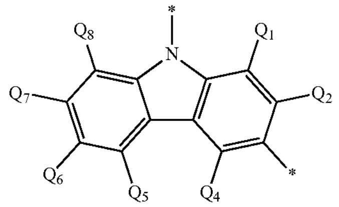
(TEMP-82)
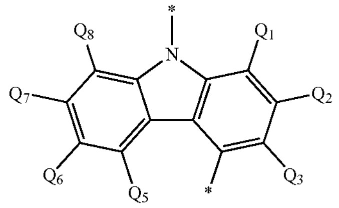
In the formulae (TEMP-69) to (TEMP-82), $Q_1$ to $Q_9$ each independently are a hydrogen atom or a substituent.

[Formula 15]
(TEMP-83)
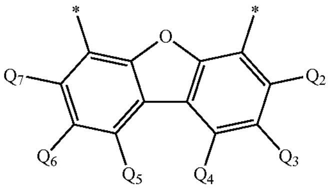
(TEMP-84)
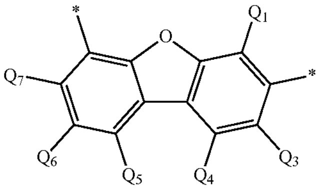
(TEMP-85)
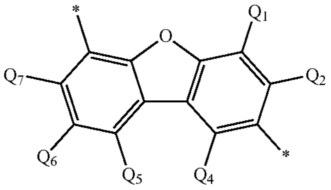
(TEMP-86)
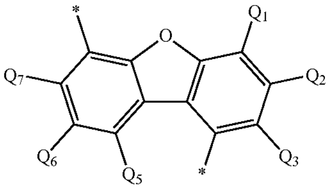
(TEMP-87)
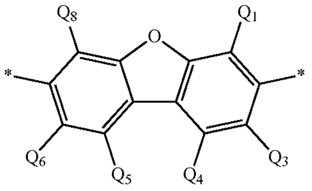
(TEMP-88)
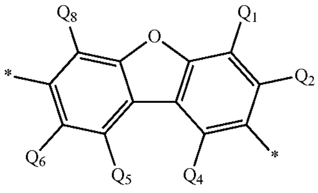
[Formula 16]
(TEMP-89)
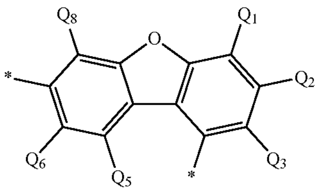
-continued
(TEMP-90)
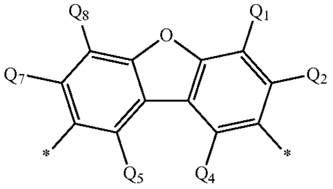
(TEMP-91)
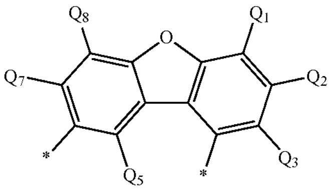
(TEMP-92)
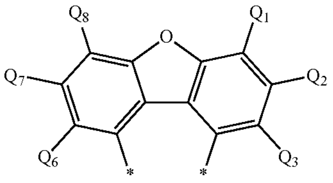
[Formula 17]
(TEMP-93)
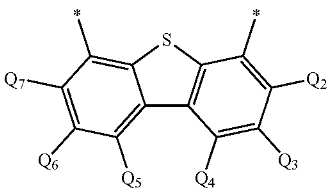
(TEMP-94)
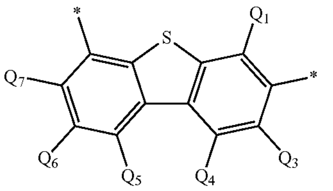
(TEMP-95)
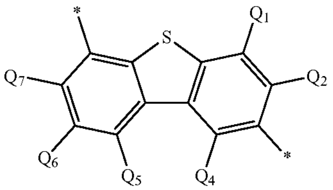
(TEMP-96)
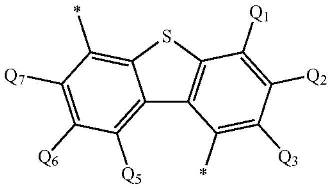
(TEMP-97)
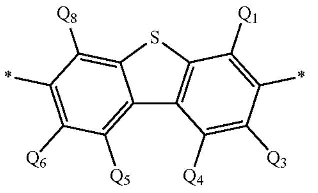

-continued (TEMP-98)

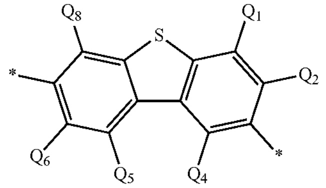

[Formula 18]

(TEMP-99)

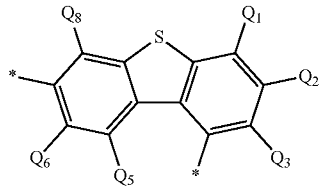

(TEMP-100)

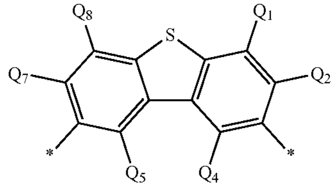

(TEMP-101)

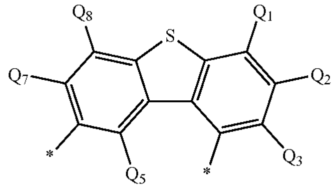

(TEMP-102)

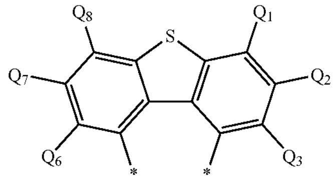

In the formulae (TEMP-83) to (TEMP-102), $Q_1$ to $Q_8$ each independently are a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring," "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

[Formula 19]

(TEMP-103)

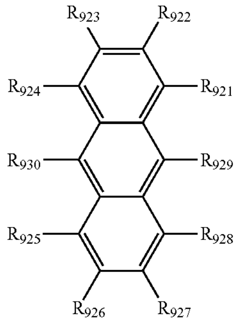

For instance, when "at least one combination of adjacent two or more of "$R_{921}$ to $R_{930}$" are mutually bonded to form a ring," the pair of adjacent ones of $R_{921}$ to $R_{930}$ (i.e. the combination at issue) is a combination of $R_{921}$ and a combination of $R_{922}$, $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of R921 to R930 may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 20]

(TEMP-104)

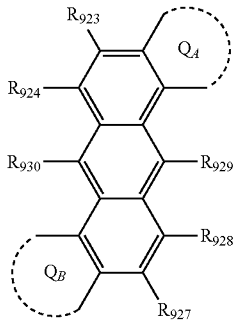

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$, $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

[Formula 21]

(TEMP-105)

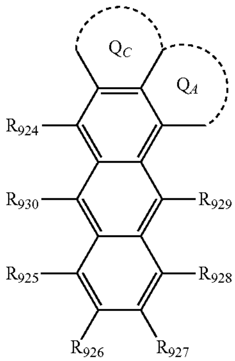

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocyclic ring include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituents Mentioned Herein."

When the "saturated ring" or the "unsaturated ring" has a substituent, the substituent is, for instance, the substituent described in later-described "optional substituent." When the "monocyclic ring" or the "fused ring" has a substituent, specific examples of the substituent are the substituents described in the above under the subtitle "Substituents Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring".

Substituent for Substituted or Unsubstituted Group

In an exemplary embodiment herein, a substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms.

Herein, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

When two or more $R_{901}$ are present, the two or more $R_{901}$ are mutually the same or different.

When two or more $R_{902}$ are present, the two or more $R_{902}$ are mutually the same or different.

When two or more $R_{903}$ are present, the two or more $R_{903}$ are mutually the same or different.

when two or more $R_{904}$ are present, the two or more $R_{904}$ are mutually the same or different;

When two or more $R_{905}$ are present, the two or more $R_{905}$ are mutually the same or different.

When two or more $R_{906}$ are present, the two or more $R_{906}$ are mutually the same or different.

When two or more $R_{907}$ are present, the two or more $R_{907}$ are mutually the same or different.

In an exemplary embodiment, a substituent for the substituted or unsubstituted group is selected from the group consisting of an alkyl group having 1 to 50 carbon atoms, an aryl group having 6 to 50 ring carbon atoms, and a heterocyclic group having 5 to 50 ring atoms.

In an exemplary embodiment, a substituent for the substituted or unsubstituted group is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted saturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

First Exemplary Embodiment

Organic Electroluminescence Device

An organic electroluminescence device according to a first exemplary embodiment includes: a first emitting layer and a second emitting layer, in which the first emitting layer includes a first host material, the second emitting layer includes a second host material, the first host material and the second host material are different from each other, the first emitting layer at least includes a compound having a maximum peak wavelength of 500 nm or less, the second emitting layer at least includes a compound having a maximum peak wavelength of 500 nm or less, the compound having a maximum peak wavelength of 500 nm or less contained in the first emitting layer and the compound having a maximum peak wavelength of 500 nm or less contained in the second emitting layer are mutually the same or different, and a triplet energy $T_1(H1)$ of the first host material and a triplet energy $T_1(H2)$ of the second host material satisfy a relationship of a numerical formula (Numerical Formula 1) below.

$$T_1(H1)>T_1(H2) \quad \text{(Numerical Formula 1)}$$

It is preferable that the organic electroluminescence device according to the first exemplary embodiment includes: a first emitting layer and a second emitting layer, in which the first emitting layer includes a first host material, the second emitting layer includes a second host material, the first host material and the second host material are different from each other, the first emitting layer at least includes a compound capable of emitting fluorescence having a maximum peak wavelength of 500 nm or less, the second emitting layer at least includes a compound capable of emitting fluorescence having a maximum peak wavelength of 500 nm or less, the compound capable of emitting fluorescence having a maximum peak wavelength of 500 nm or less contained in the first emitting layer and the compound capable of emitting fluorescence having a maximum peak wavelength of 500 nm or less contained in the second emitting layer are mutually the same or different, and a triplet energy $T_1(H1)$ of the first host material and a triplet energy $T_1(H2)$ of the second host material satisfy the relationship of the numerical formula (Numerical Formula 1).

According to the exemplary embodiment, an organic electroluminescence device having an improved performance can be provided.

Conventionally, Triplet-Triplet-Annihilation (sometimes referred to as TTA) has been known as a technique for improving the luminous efficiency of the organic electroluminescence device. TTA is a mechanism in which triplet excitons collide with one another to generate singlet excitons. It should be noted that the TTA mechanism is sometimes referred to as a TTF mechanism as described in Patent Literature 5.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as 3A*) collide with one another with an increase in the density thereof, whereby a reaction shown by the following formula occurs. In the formula, $^1A$ represents the ground state and $^1A^*$ represents the lowest singlet excitons.

$$3A^*+3A^*\rightarrow(4/9)^1A+(1/9)^1A^*+(13/9)^3A^*$$

In other words, $5^3A^* \rightarrow 4^1A + 1A^*$, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%.Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

In the organic electroluminescence device of the exemplary embodiment, it is considered that triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

An organic electroluminescence device according to the exemplary embodiment includes at least two emitting layers (i.e., the first emitting layer and the second emitting layer) satisfying a predetermined relationship. A triplet energy $T_1$(H1) of the first host material in the first emitting layer and a triplet energy $T_1$(H2) of the second host material in the second emitting layer satisfy the relationship represented by the numerical formula (Numerical Formula 1).

By including the first emitting layer and the second emitting layer so as to satisfy the numerical formula (Numerical Formula 1), triplet excitons generated in the first emitting layer can transfer to the second emitting layer without being quenched by excessive carriers and can be inhibited from back-transferring from the second emitting layer to the first emitting layer. Consequently, the second emitting layer exhibits the TTF mechanism to effectively generate singlet excitons, thereby improving the luminous efficiency.

Accordingly, the organic electroluminescence device includes, as different regions, the first emitting layer mainly generating triplet excitons and the second emitting layer mainly exhibiting the TTF mechanism using triplet excitons having transferred from the first emitting layer, and a difference in triplet energy is provided by using a compound having a smaller triplet energy than that of the first host material in the first emitting layer as the second host material in the second emitting layer, thereby improving the luminous efficiency.

In the organic EL device of the exemplary embodiment, the triplet energy $T_1$(H1) of the first host material and the triplet energy $T_1$(H2) of the second host material preferably satisfy a relationship of a numerical formula (Numerical Formula 5) below.

$$T_1(H1) - T_1(H2) > 0.03 \text{ eV} \quad \text{(Numerical Formula 5)}$$

Herein, the "host material" refers to, for instance, a material that accounts for "50 mass % or more of the layer." Accordingly, for instance, the first emitting layer contains the first host material at 50 mass % or more with respect to a total mass of the first emitting layer. The second emitting layer contains the second host material at 50 mass % or more with respect to a total mass of the second emitting layer.

Emission Wavelength of Organic EL Device

The organic electroluminescence device according to the exemplary embodiment preferably emits light having a maximum peak wavelength of 500 nm or less when being driven.

The organic electroluminescence device according to the exemplary embodiment more preferably emits light having the maximum peak wavelength in a range from 430 nm to 480 nm when being driven.

The maximum peak wavelength of the light emitted from the organic EL device when being driven is measured as follows. Voltage is applied on the organic EL devices such that a current density becomes 10 mA/cm$^2$, where spectral radiance spectrum is measured by a spectroradiometer CS-2000 (manufactured by Konica Minolta, Inc.). A peak wavelength of an emission spectrum, at which a luminous intensity of the resultant spectral radiance spectrum is at the maximum, is measured and defined as the maximum peak wavelength (unit: nm).

First Emitting Layer

The first emitting layer includes the first host material. The first host material is a compound different from the second host material contained in the second emitting layer.

The first emitting layer at least contains a compound having the maximum peak wavelength of 500 nm or less. This "compound having the maximum peak wavelength of 500 nm or less" may be the first host material or a compound different from the first host material.

In the organic EL device according to the exemplary embodiment, the first emitting layer further contains a first dopant material.

In the organic EL device of the exemplary embodiment, it is preferable that the first dopant material is a compound not having an azine ring structure in a molecule.

In the organic EL device of the exemplary embodiment, the first dopant material is preferably not a boron-containing complex, more preferably not a complex.

In the organic EL device of the exemplary embodiment, it is preferable that the first emitting layer does not contain a metal complex. Moreover, in the organic EL device of the exemplary embodiment, it is also preferable that the first emitting layer does not contain a boron-containing complex.

In the organic EL device of the exemplary embodiment, it is preferable that the first emitting layer does not contain a phosphorescent material (dopant material).

In addition, it is preferable that the first emitting layer does not contain a heavy metal complex and a phosphorescent rare earth metal complex. Examples of the heavy-metal complex herein include iridium complex, osmium complex, and platinum complex.

In the organic EL device of the exemplary embodiment, the first dopant material is preferably a compound having the maximum peak wavelength of 500 nm or less, preferably a compound capable of emitting fluorescence having the maximum peak wavelength of 500 nm or less, more preferably a fluorescent compound having the maximum peak wavelength of 500 nm or less.

A measurement method of the maximum peak wavelength of a compound is as follows. A compound to be a measurement target is dissolved in toluene at a concentration of 5 μmol/L to prepare a measurement sample (toluene solution). This measurement sample is put into a quartz cell. The measurement sample in the quartz cell is irradiated with exciting light at normal temperature (300K). A fluorescence spectrum (ordinate axis: fluorescence intensity, abscissa axis: wavelength) of the measurement sample is measured. A fluorescence spectrum can be measured with a spectrophotofluorometer manufactured by Hitachi High-Tech Science Corporation (device name: F-7000). It should be noted that a measurement device of the fluorescence spectrum is not limited to the device used herein.

A peak wavelength of an fluorescence spectrum, at which a fluorescence intensity of the fluorescence spectrum is at the maximum, is defined as the maximum peak wavelength (unit: nm). Herein, the maximum peak wavelength is sometimes referred to as a maximum fluorescence peak wavelength (FL-peak).

In the fluorescence spectrum of the first dopant material, where a peak exhibiting a maximum fluorescence intensity is defined as a maximum peak and a height of the maximum peak is defined as 1, heights of other peaks appearing in the fluorescence spectrum are preferably less than 0.6. It should be noted that the peaks in the fluorescence spectrum are defined as local maximal values.

Moreover, in the fluorescence spectrum of the first dopant material, the number of the peaks is preferably less than three.

In the organic EL device of the exemplary embodiment, it is preferable that the first emitting layer preferably emits light having the maximum peak wavelength of 500 nm or less when being driven.

The maximum peak wavelength of the light emitted from the emitting layer when the organic EL device is driven is measured by a method described in later-described Examples.

In the organic EL device of the exemplary embodiment, it is preferable that a singlet energy $S_1(H1)$ of the first host material and a singlet energy $S_1(D1)$ of the first dopant material satisfy a relationship of a numerical formula (Numerical Formula 2) below.

$$S_1(H1)>S_1(D1) \quad \text{(Numerical Formula 2)}$$

When the first host material and the first dopant material satisfy the relationship of the numerical formula (Numerical formula 2), singlet excitons generated on the first host material easily energy-transfer from the first host material to the first dopant material, thereby contributing to fluorescence of the first dopant material.

In the organic EL device of the exemplary embodiment, the triplet energy $T_1(H1)$ of the first host material and the triplet energy $T_1(D1)$ of the first dopant material preferably satisfy a relationship of a numerical formula (Numerical Formula 2A) below.

$$T_1(D1)>T_1(H1) \quad \text{(Numerical Formula 2A)}$$

When the first host material and the first dopant material satisfy the relationship of the numerical formula (Numerical Formula 2A), triplet excitons generated in the first emitting layer are transferred not onto the the first dopant material having higher triplet energy but onto the first host material, thereby being easily transferred to the second emitting layer.

The organic EL device of the exemplary embodiment preferably satisfies a numerical formula (Numerical Formula 2B) below.

$$T_1(D1)>T_1(H1)>T_1(H2) \quad \text{(Numerical Formula 2B)}$$

Triplet Energy $T_1$

A method of measuring triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescence spectrum (ordinate axis: phosphorescence intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $T_1$.

$$T_1\ [\text{eV}]=1239.85/\lambda_{edge} \quad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength region of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted in the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring the singlet energy $S_1$ with use of a solution (occasionally referred to as a solution method) is exemplified by a method below.

A toluene solution in which a measurement target compound is dissolved at a concentration from $10^{-5}$ mol/L to $10^{-4}$ mol/L is prepared and is put in a quartz cell to provide a measurement sample. Absorption spectrum (ordinate axis: absorption intensity, abscissa axis: wavelength) of the sample is measured at normal temperature (300K). A tangent is drawn to the fall of the absorption spectrum on the long-wavelength side, and a wavelength value $\lambda_{edge}$ (nm) at an intersection of the tangent and the abscissa axis is assigned to a conversion equation (F2) below to calculate singlet energy.

$$S_1\ [\text{eV}]=1239.85/\lambda_{edge} \quad \text{Conversion Equation (F2)}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The maximum absorbance of 0.2 or less is not counted as the above-mentioned local maximum absorbance closest to the long-wavelength region.

In the organic EL device of the exemplary embodiment, the first dopant material is preferably contained at more than 1.1 mass % in the first emitting layer. Specifically, the first emitting layer preferably contains the first dopant material at more than 1.1 mass % with respect to a total mass of the first emitting layer, more preferably at more than 1.2 mass % with respect to the total mass of the first emitting layer, further preferably at more than 1.5 mass % with respect to the total mass of the first emitting layer.

The first emitting layer preferably contains the first dopant material at 10 mass % or less with respect to the total mass of the first emitting layer, more preferably at 7 mass % or less with respect to the total mass of the first emitting layer, further preferably at 5 mass % or less with respect to the total mass of the first emitting layer.

In the organic EL device of the exemplary embodiment, the first emitting layer preferably contains a first compound as the first host material at 60 mass % or more with respect to the total mass of the first emitting layer, more preferably at 70 mass % or more with respect to the total mass of the first emitting layer, further preferably at 80 mass % or more with respect to the total mass of the first emitting layer, more further preferably at 90 mass % or more with respect to the total mass of the first emitting layer, still further more preferably at 95 mass % or more with respect to the total mass of the first emitting layer.

The first emitting layer preferably contains the first host material at 99 mass % or less with respect to the total mass of the first emitting layer.

In a case where the first emitting layer contains the first host material and the first dopant material, an upper limit of a total of the content ratios of the first host material and the first dopant material is 100 mass %.

It is not excluded that the first emitting layer of the exemplary embodiment further contains a material(s) other than the first host material and the first dopant material.

The first emitting layer may include a single type of the first host material or may include two or more types of the first host material. The first emitting layer may include a single type of the first dopant material or may include two or more types of the first dopant material.

A film thickness of the first emitting layer of the organic EL device in the exemplary embodiment is preferably 3 nm or more, more preferably 5 nm or more. The film thickness of the first emitting layer being 3 nm or more is a film thickness enough for causing recombination of holes and electrons in the first emitting layer.

The film thickness of the first emitting layer of the organic EL device in the exemplary embodiment is preferably 15 nm or less, more preferably 10 nm or less. The film thickness of the first emitting layer being 15 nm or less is a film thickness thin enough for transfer of triplet excitons to the second emitting layer.

The film thickness of the first emitting layer of the organic EL device in the exemplary embodiment is more preferably in a range from 3 nm to 15 nm.

Second Emitting Layer

The second emitting layer contains the second host material. The second host material is a different compound from the first host material contained in the first emitting layer.

The second emitting layer at least contains a compound having the maximum peak wavelength of 500 nm or less. This "compound having the maximum peak wavelength of 500 nm or less may be the second host material or a compound different from the second host material.

A measurement method of the maximum peak wavelength of a compound is as described above.

In the organic EL device according to the exemplary embodiment, the second emitting layer further contains a second dopant material.

In the organic EL device according to the exemplary embodiment, the second dopant material is preferably a compound having the maximum peak wavelength of 500 nm or less, preferably a compound capable of emitting fluorescence having the maximum peak wavelength of 500 nm or less, more preferably a fluorescent compound having the maximum peak wavelength of 500 nm or less.

In the organic EL device of the exemplary embodiment, it is preferable that the second emitting layer preferably emits light having the maximum peak wavelength of 500 nm or less when the organic EL device is driven.

In the organic EL device of the exemplary embodiment, it is preferable that the second dopant material has a full width at half maximum in a range from 1 nm to 20 nm at a maximum peak.

In the organic EL device of the exemplary embodiment, a Stokes shift of the second dopant material preferably exceeds 7 nm.

When the Stokes shift of the second dopant material exceeds 7 nm, a reduction in the luminous efficiency due to self-absorption is likely to be inhibited.

The self-absorption is a phenomenon that emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by a method described in Examples.

In the organic EL device of the exemplary embodiment, a triplet energy $T_1(D2)$ of the second dopant material and the triplet energy $T_1(H2)$ of the second host material preferably satisfy a relationship of a numerical formula (Numerical Formula 3) below.

$$T_1(D2)>T_1(H2) \quad \text{(Numerical Formula 3)}$$

In the organic EL device according to the exemplary embodiment, when the second dopant material and the second host material satisfy the relationship of the numerical formula (Numerical Formula 3A), in transfer of triplet excitons generated in the first emitting layer to the second emitting layer, the triplet excitons energy-transfer not to the second dopant material having higher triplet energy but to molecules of the second host material. In addition, triplet excitons generated by recombination of holes and electrons on the second host material do not transfer to the second dopant material having higher triplet energy. Triplet excitons generated by recombination on molecules of the second dopant material quickly energy-transfer to molecules of the second host material.

Triplet excitons in the second host material do not transfer to the second dopant material but efficiently collide with one another on the second host material to generate singlet excitons by the TTF phenomenon.

In the organic EL device of the exemplary embodiment, a singlet energy $S_1$(H2) of the second host material and a singlet energy $S_1$(D2) of the second dopant material preferably satisfy a relationship of a numerical formula (Numerical Formula 4) below.

$$S_1(H2)>S_1(D2) \quad \text{(Numerical Formula 4)}$$

In the organic EL device according to the exemplary embodiment, when the second dopant material and the second host material satisfy the relationship of the numerical formula (Numerical formula 4), due to the singlet energy of the second dopant material being lower than the singlet energy of the second host material, singlet excitons generated by the TTF phenomenon energy-transfer from the second host material to the second dopant material, thereby contributing to fluorescence of the second dopant material.

In the organic EL device of the exemplary embodiment, it is preferable that the second dopant material is a compound not having an azine ring structure in a molecule.

In the organic EL device of the exemplary embodiment, the second dopant material is preferably not a boron-containing complex, more preferably not a complex.

In the organic EL device of the exemplary embodiment, it is preferable that the second emitting layer does not contain a metal complex. Further, in the organic EL device of the exemplary embodiment, it is also preferable that the second emitting layer does not contain a boron-containing complex.

In the organic EL device of the exemplary embodiment, it is preferable that the second emitting layer does not contain a phosphorescent material (dopant material).

Further, it is preferable that the second emitting layer does not contain a heavy metal complex and a phosphorescent rare earth metal complex. Examples of the heavy-metal complex herein include iridium complex, osmium complex, and platinum complex.

In the organic EL device of the exemplary embodiment, the second dopant material is preferably contained at more than 1.1 mass % in the second emitting layer. That is, the second emitting layer preferably contains the second dopant material at more than 1.1 mass % with respect to a total mass of the second emitting layer, more preferably at more than 1.2 mass % with respect to the total mass of the second emitting layer, further preferably at more than 1.5 mass % with respect to the total mass of the second emitting layer.

The second emitting layer preferably contains the second dopant material at 10 mass % or less with respect to the total mass of the second emitting layer, more preferably at 7 mass % or less with respect to the total mass of the second emitting layer, further preferably at 5 mass % or less with respect to the total mass of the second emitting layer.

The second emitting layer preferably contains a second compound as the second host material at 60 mass % or more with respect to the total mass of the second emitting layer, more preferably at 70 mass % or more with respect to the total mass of the second emitting layer, further preferably at 80 mass % or more with respect to the total mass of the second emitting layer, further more preferably at 90 mass % or more with respect to the total mass of the second emitting layer, still further preferably at 95 mass % or more with respect to the total mass of the second emitting layer.

The second emitting layer preferably contains the second host material at 99 mass % or less with respect to the total mass of the second emitting layer.

It should be noted that when the second emitting layer contains the second host material and the second dopant material, an upper limit of the total of the respective content ratios of the second host material and the second dopant material is 100 mass %.

It is not excluded that the second emitting layer according to the exemplary embodiment further contains a material(s) other than the second host material and the second dopant material.

The second emitting layer may include a single type of the second host material or may include two or more types of the second host material. The second emitting layer may include a single type of the second dopant material or may include two or more types of the second dopant material.

With an organic EL device according to an exemplary embodiment in which the first emitting layer contains the first host material and the first dopant material, the second emitting layer contains the second host material and the second dopant material, the first host material and the second host material are different from each other, the first dopant material is a compound having the maximum peak wavelength of 500 nm or less, the second dopant material is a compound having the maximum peak wavelength of 500 nm or less, the first dopant material and the second dopant material are different from each other, and the triplet energy $T_1$(H1) of the first host material and the triplet energy $T_1$(H2) of the second host material satisfy the relationship represented by the numerical formula (Numerical Formula 1), an improvement in the luminous efficiency or an increase in a lifetime of the organic EL device can be expected.

Moreover, with an organic EL device according to an exemplary embodiment in which the first emitting layer contains the first dopant material, the first dopant material is a fluorescent compound, the second emitting layer contains and the second dopant material, the second dopant material is a fluorescent compound, and the first dopant material and the second dopant material are different from each other, an improvement in the luminous efficiency or an increase in the lifetime of the organic EL device can be expected.

In the organic EL device according to the exemplary embodiment, the film thickness of the second emitting layer is preferably 5 nm or more, more preferably 15 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portion on the first emitting layer.

In the organic EL device according to the exemplary embodiment, the film thickness of the second emitting layer is preferably 20 nm or less. When the film thickness of the second emitting layer is 20 nm or less, the density of the triplet excitons in the second emitting layer is improved to cause the TTF phenomenon more easily.

In the organic EL device according to the exemplary embodiment, the film thickness of the second emitting layer is preferably in a range from 5 nm to 20 nm.

In the organic EL device according to the exemplary embodiment, a triplet energy $T_1$(DX) of the compound having the maximum peak wavelength of 500 nm or less contained in the first emitting layer or the compound having the maximum peak wavelength of 500 nm or less contained in the second emitting layer, the triplet energy $T_1$(H1) of the first host material, and the triplet energy $T_1$(H2) of the second host material preferably satisfy a relationship of a numerical formula (Numerical Formula 10X), more preferably a relationship of a numerical formula (Numerical Formula 10).

$$2.7\ \text{eV} > T_1(DX) > T_1(H1) > T_1(H2) \quad \text{(Numerical Formula 10X)}$$

$$2.6\ \text{eV} > T_1(DX) > T_1(H1) > T_1(H2) \quad \text{(Numerical Formula 10)}$$

When the first emitting layer contains the first dopant material, the triplet energy $T_1$(D1) of the first dopant material preferably satisfies a relationship of a numerical formula (Numerical Formula 10AX), more preferably a relationship of a numerical formula (Numerical Formula 10A).

$$2.7\ \text{eV} > T_1(D1) > T_1(H1) > T_1(H2) \quad \text{(Numerical Formula 10AX)}$$

$$2.6\ \text{eV} > T_1(D1) > T_1(H1) > T_1(H2) \quad \text{(Numerical Formula 10A)}$$

When the second emitting layer contains the second dopant material, the triplet energy $T_1$(D2) of the second dopant material preferably satisfies a relationship of a numerical formula (Numerical Formula 10BX), more preferably a relationship of a numerical formula (Numerical Formula 10B).

$$2.7\ \text{eV} > T_1(D2) > T_1(H1) > T_1(H2) \quad \text{(Numerical Formula 10BX)}$$

$$2.6\ \text{eV} > T_1(D2) > T_1(H1) > T_1(H2) \quad \text{(Numerical Formula 10B)}$$

In the organic EL device according to the exemplary embodiment, the triplet energy $T_1$(DX) of the compound having the maximum peak wavelength of 500 nm or less contained in the first emitting layer or the compound having the maximum peak wavelength of 500 nm or less contained in the second emitting layer, and the triplet energy $T_1$(H1) of the first host material also preferably satisfy a relationship of a numerical formula (Numerical Formula 11X), more preferably a relationship of a numerical formula (Numerical Formula 11).

$$0\ \text{eV} < T_1(DX) - T_1(H1) < 0.7\ \text{eV} \quad \text{(Numerical Formula 11X)}$$

$$0\ \text{eV} < T_1(DX) - T_1(H1) < 0.6\ \text{eV} \quad \text{(Numerical Formula 11)}$$

When the first emitting layer contains the first dopant material, the triplet energy $T_1$(D1) of the first dopant material preferably satisfies a relationship of a numerical formula (Numerical Formula 11AX), more preferably a relationship of a numerical formula (Numerical Formula 11A).

$$0\ \text{eV} < T_1(D1) - T_1(H1) < 0.7\ \text{eV} \quad \text{(Numerical Formula 11AX)}$$

$$0\ \text{eV} < T_1(D1) - T_1(H1) < 0.6\ \text{eV} \quad \text{(Numerical Formula 11A)}$$

When the second emitting layer contains the second dopant material, the triplet energy $T_1$(D2) of the second dopant material preferably satisfies a relationship of a numerical formula (Numerical Formula 11BX), more preferably a relationship of a numerical formula (Numerical Formula 11B).

$$-0.15\ \text{eV} < T_1(D2) - T_1(H1) < 0.7\ \text{eV} \quad \text{(Numerical Formula 11BX)}$$

$$0\ \text{eV} < T_1(D2) - T_1(H2) < 0.8\ \text{eV} \quad \text{(Numerical Formula 11B)}$$

In the organic EL device according to the present exemplary embodiment, the triplet energy $T_1$(H1) of the first host material preferably satisfies a relationship of a numerical formula (Numerical Formula 12) below.

$$T_1(H1) > 2.0\ \text{eV} \quad \text{(Numerical Formula 12)}$$

In the organic EL device according to the exemplary embodiment, the triplet energy $T_1$(H2) of the second host material preferably satisfies a relationship of a numerical formula (Numerical Formula 13X), more preferably a relationship of a numerical formula (Numerical Formula 13).

$$T_1(H2) \geq 1.8\ \text{eV} \quad \text{(Numerical Formula 13X)}$$

$$T_1(H2) \geq 1.9\ \text{eV} \quad \text{(Numerical Formula 13).}$$

In the organic EL device according to the exemplary embodiment, the triplet energy $T_1$(H2) of the second host material also preferably satisfies a relationship of a numerical formula (Numerical Formula 13A).

$$1.9\ \text{eV} > T_1(H2) \geq 1.8\ \text{eV} \quad \text{(Numerical Formula 13A)}$$

When the first emitting layer and the second emitting layer are layered in this order from the anode in the organic EL device according to the exemplary embodiment, an electron mobility μe(H1) of the first host material and an electron mobility μe(H2) of the second host material also preferably satisfy a relationship of a numerical formula (Numerical Formula 30) below.

$$\mu e(H2) > \mu e(H1) \quad \text{(Numerical Formula 30)}$$

When the first host material and the second host material satisfy the relationship of the numerical formula (Numerical formula 30), a recombination ability between holes and electrons in the first emitting layer is improved.

When the first emitting layer and the second emitting layer are layered in this order from the anode in the organic EL device according to the exemplary embodiment, a hole mobility μh(H1) of the first host material and a hole mobility μh(H2) of the second host material also preferably satisfy a relationship of a numerical formula (Numerical Formula 31) below.

$$\mu h(H1) > \mu h(H2) \quad \text{(Numerical Formula 31)}$$

When the first emitting layer and the second emitting layer are layered in this order from the anode in the organic EL device according to the exemplary embodiment, the hole mobility μh(H1) of the first host material, the electron mobility μe(H1) of the first host material, the hole mobility μh(H2) of the second host material, and the electron mobility μe(H2) of the second host material also preferably satisfy a relationship of a numerical formula (Numerical Formula 32) below.

$$(\mu e(H2)/\mu h(H2)) > (\mu e(H1)/\mu h(H1)) \quad \text{(Numerical Formula 32)}$$

The electron mobility can be measured according to an impedance measurement using a mobility evaluation device manufactured by the following steps. The mobility evaluation device is, for instance, manufactured by the following steps.

A compound Target, which is to be measured for an electron mobility, is vapor-deposited on a glass substrate having an aluminum electrode (anode) so as to cover the aluminum electrode, thereby forming a measurement target layer. A compound ET-A below is vapor-deposited on this measurement target layer to form an electron transporting layer. LiF is vapor-deposited on the formed electron transporting layer to form an electron injecting layer. Metal aluminum (Al) is vapor-deposited on the formed electron injecting layer to form a metal cathode.

An arrangement of the mobility evaluation device above is roughly shown as follows.

glass/Al(50)/Target(200)/ET-A(10)/LiF(1)/Al(50)

Numerals in parentheses represent a film thickness (nm).

[Formula 22]

ET-A

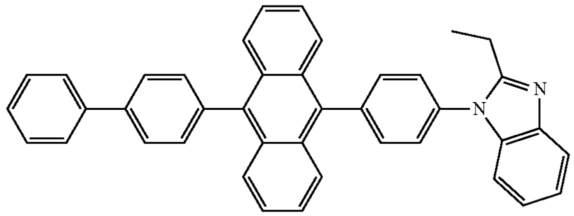

The mobility evaluation device for an electron mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using a relationship of a calculation formula (C1) below.

$$M=j\omega Z \qquad \text{Calculation formula (C1)}$$

In the calculation formula (C1), j is an imaginary unit whose square is −1 and ω is an angular frequency [rad/s].

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using a calculation formula (C2) below.

$$\tau=1/(2\pi f\text{max}) \qquad \text{Calculation formula (C2)}$$

π in the calculation formula (C2) is a symbol representing a circumference ratio.

An electron mobility μe is calculated from a relationship of a calculation formula (C3-1) below using τ.

$$\mu e=d^2/(V\tau) \qquad \text{Calculation formula (C3-1)}$$

d in the calculation formula (C3-1) is a total film thickness of organic thin film(s) forming the device. In a case of the arrangement of the mobility evaluation device for an electron mobility, d=210 [nm] is satisfied.

The hole mobility can be measured according to an impedance measurement using a mobility evaluation device manufactured by the following steps. The mobility evaluation device is, for instance, manufactured by the following steps.

A compound HA-2 below is vapor-deposited on a glass substrate having an ITO transparent electrode (anode) so as to cover the transparent electrode, thereby forming a hole injecting layer. A compound HT-A below is vapor-deposited on the formed hole injecting layer to form a hole transporting layer. Subsequently, a compound Target, which is to be measured for a hole mobility, is vapor-deposited to form a measurement target layer. Metal aluminum (Al) is vapor-deposited on this measurement target layer to form a metal cathode.

An arrangement of the mobility evaluation device above is roughly shown as follows.

ITO(130)/HA-2(5)/HT-A(10)/Target(200)/Al(80)

Numerals in parentheses represent a film thickness (nm).

[Formula 23]

HA-2

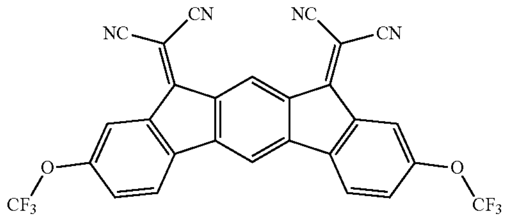

HT-A

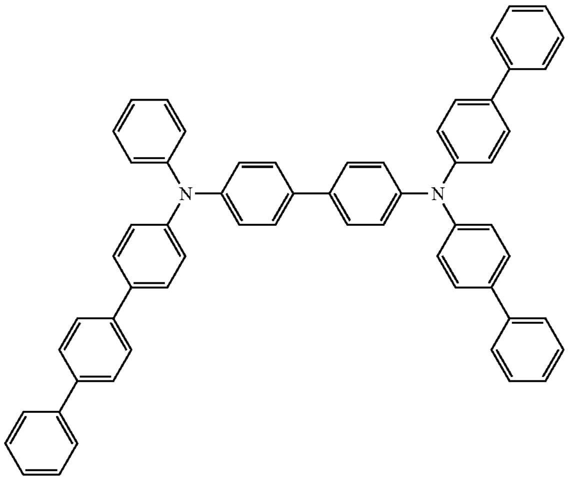

The mobility evaluation device for a hole mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using the relationship of the calculation formula (C1).

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using the calculation formula (C2).

A hole mobility μh is calculated from a relationship of a calculation formula (C3-2) below using τ obtained from the calculation formula (C2).

$$\mu h=d^2/(V\tau) \qquad \text{Calculation formula (C3-2)}$$

d in the calculation formula (C3-2) is a total film thickness of organic thin film(s) forming the device. In a case of the arrangement of the mobility evaluation device for a hole mobility, d=215 [nm] is satisfied.

The electron mobility and the hole mobility herein are each a value obtained in a case where a square root of an electric field intensity meets $E^{1/2}$=500 [$V^{1/2}/cm^{1/2}$]. The square root of the electric field intensity, $E^{1/2}$, can be calculated from a relationship of a calculation formula (C4) below.

$$E^{1/2}=V^{1/2}/d^{1/2} \quad \text{Calculation formula (C4)}$$

For the impedance measurement, a 1260 type by Solartron Analytical is used as the impedance measurement device, and for a higher accuracy, a 1296 type dielectric constant measurement interface by Solartron Analytical can be used together therewith.

Additional Layers of Organic EL Device

The organic EL device according to the exemplary embodiment may include one or more organic layer in addition to the first emitting layer and the second emitting layer. Examples of the organic layer include at least one layer selected from the group consisting of a hole injecting layer, a hole transporting layer, an emitting layer, an electron injecting layer, an electron transporting layer, a hole blocking layer, and an electron blocking layer.

In the organic EL device of the exemplary embodiment, the organic layer may consist of the first emitting layer and the second emitting layer, however, may further includes at least one layer selected from the group consisting of a hole injecting layer, a hole transporting layer, an electron injecting layer, an electron transporting layer, a hole blocking layer, and an electron blocking layer.

The organic EL device according to the exemplary embodiment preferably further includes an anode and a cathode.

It is also preferable that the organic EL device according to the exemplary embodiment include the first emitting layer between the anode and the cathode, and the second emitting layer between the first emitting layer and the cathode.

It is also preferable that the organic EL device according to the exemplary embodiment include the first emitting layer between the anode and the cathode, and the second emitting layer between the first emitting layer and the anode.

The organic EL device according to the exemplary embodiment may include the anode, the first emitting layer, the second emitting layer, and the cathode in this order. Alternatively, the order of the first emitting layer and the second emitting layer may be reversed. Specifically, the organic EL device according to the exemplary embodiment may include the anode, the second emitting layer, the first emitting layer, and the cathode in this order. Regardless of the order of the first emitting layer and the second emitting layer, the effect obtained by layering the first emitting layer and the second emitting layer can be expected by selecting a combination of the materials satisfying the numerical formula (Numerical Formula 1).

Hole Transporting Layer

It is preferable that the organic EL device according to the exemplary embodiment includes the hole transporting layer between the anode, and the first emitting layer or the second emitting layer, which is arranged closer to the anode. When the first emitting layer is arranged closer to the anode than the second emitting layer, the organic EL device according to the exemplary embodiment preferably includes the hole transporting layer between the anode and the first emitting layer.

Electron Transporting Layer

It is preferable that the organic EL device according to the exemplary embodiment includes the electron transporting layer between the cathode, and the first emitting layer or the second emitting layer, which is arranged closer to the cathode. When the first emitting layer is arranged closer to the anode than the second emitting layer, the organic EL device according to the exemplary embodiment preferably includes the electron transporting layer between the second emitting layer and the cathode.

The FIGURE schematically shows an exemplary structure of the organic EL device of the exemplary embodiment.

An organic EL device 1 includes a light-transmissive substrate 2, an anode 3, a cathode 4, and an organic layer 10 provided between the anode 3 and the cathode 4. The organic layer 10 includes the hole injecting layer 6, the hole transporting layer 7, the first emitting layer 51, the second emitting layer 52, the electron transporting layer 8, and the electron injecting layer 9 which are layered on the anode 3 in this order.

The invention is by no means limited to the arrangement of the organic EL device shown in the FIGURE. As an example of another arrangement of the organic EL device, the organic layer includes the hole injecting layer, the hole transporting layer, the second emitting layer, the first emitting layer, the electron transporting layer, and the electron injecting layer which are layered on the anode in this order.

The organic EL device according to the exemplary embodiment may further include a third emitting layer.

When the organic EL device according to the exemplary embodiment includes the third emitting layer, it is preferable that the third emitting layer contains a third host material; the first host material, the second host material, and the third host material are different from each other; the third emitting layer at least contains the compound having the maximum peak wavelength of 500 nm or less; a compound having the maximum peak wavelength of 500 nm or less contained in the first emitting layer, a compound having the maximum peak wavelength of 500 nm or less contained in the second emitting layer, and a compound having the maximum peak wavelength of 500 nm or less contained in the third emitting layer are mutually the same or different; and the triplet energy $T_1(H1)$ of the first host material and the triplet energy $T_1(H3)$ of the third host material satisfy a relationship of a numerical formula (Numerical Formula 1A) below.

$$T_1(H1)>T_1(H3) \quad \text{(Numerical Formula 1A)}$$

The third compound is preferably a fluorescent compound having the maximum peak wavelength of 500 nm or less.

When the organic EL device according to the exemplary embodiment contains the third emitting layer, the triplet energy $T_1(H2)$ of the second host material and the triplet energy $T_1(H3)$ of the third host material preferably satisfy a numerical formula (Numerical Formula 1B) below.

$$T_1(H2)>T_1(H3) \quad \text{(Numerical Formula 1B)}$$

In the organic EL device according to the exemplary embodiment, the first emitting layer and the second emitting layer are in direct contact with each other.

Herein, a layer arrangement that "the first emitting layer and the second emitting layer are in direct contact with each other" can include one of embodiments (LS1), (LS2), and (LS3) below.

(LS1) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An embodiment in which in a case of containing a luminescent compound in the first emitting layer and the second emitting layer, a region containing all of the first host material, the second host material and the luminescent compound is generated in a process of vapor-depositing the compound of the first emitting layer and vapor-depositing the compound of the second emitting layer, and is present on the interface between the first emitting layer and the second emitting layer.

(LS3) An embodiment in which in a case of containing a luminescent compound in the first emitting layer and the second emitting layer, a region containing the luminescent compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

When the organic EL device according to the exemplary embodiment includes the third emitting layer, it is preferable that the first emitting layer and the second emitting layer are in direct contact with each other and the second emitting layer and the third emitting layer are in direct contact with each other.

Herein, a layer arrangement that the second emitting layer and the third emitting layer are in direct contact with each other can include one of embodiments (LS4), (LS5) and (LS6) below.

(LS4) An embodiment in which a region containing both the second host material and the third host material is generated in a process of vapor-depositing the compound of the second emitting layer and vapor-depositing the compound of the third emitting layer, and is present on the interface between the second emitting layer and the third emitting layer.

(LS5) An embodiment in which in a case of containing a luminescent compound in the second emitting layer and the third emitting layer, a region containing all of the second host material, the third host material and the luminescent compound is generated in a process of vapor-depositing the compound of the second emitting layer and vapor-depositing the compound of the third emitting layer, and is present on the interface between the second emitting layer and the third emitting layer.

(LS6) An embodiment in which in a case of containing a luminescent compound in the second emitting layer and the third emitting layer, a region containing the luminescent compound, a region containing the second host material or a region containing the third host material is generated in a process of vapor-depositing the compound of the second emitting layer and vapor-depositing the compound of the third emitting layer, and is present on the interface between the second emitting layer and the third emitting layer.

Interposed Layer

The organic EL device according to the exemplary embodiment may have an interposed layer as the organic layer arranged between the first emitting layer and the second emitting layer.

In the exemplary embodiment, in order to inhibit an overlap between a Singlet emitting region and a TTF emitting region, the interposed layer contains no luminescent compound or may contain a luminescent compound in such an insubstantial amount that the overlap can be inhibited.

For instance, the interposed layer contains 0 mass % of a luminescent compound. Alternatively, for instance, the interposed layer may contain a luminescent compound provided that the luminescent compound contained is a component accidentally mixed in a manufacturing process or a component contained as impurities in a material.

For instance, when the interposed layer consists of a material A, a material B, and a material C, the content ratios of the materials A, B, and C in the interposed layer are each 10 mass % or more, and the total of the content ratios of the materials A, B, and C is 100 mass %.

In the following, the interposed layer is occasionally referred to as a "non-doped layer." A layer containing a luminescent compound is occasionally referred to as a "doped layer."

It is considered that the Singlet emitting region and the TTF emitting region are typically likely to be separated from each other when the emitting layers are layered, thus improving the luminous efficiency.

In the organic EL device according to the exemplary embodiment, when the interposed layer (non-doped layer) is disposed between the first emitting layer and the second emitting layer in the emitting region, it is expected that a region where the Singlet emitting region and the TTF emitting region overlap with each other is reduced to inhibit a decrease in the TTF efficiency caused by collision between triplet excitons and carriers. That is, it is considered that providing the interposed layer (non-doped layer) between the emitting layers contributes to the improvement in the efficiency of TTF emission.

The interposed layer is a non-doped layer.

The interposed layer does not contain a metal atom. Thus, the interposed layer does not contain a metal complex.

The interposed layer contains an interposed-layer material. The interposed layer material is not a luminescent compound.

The interposed layer material may be any material except for the luminescent compound.

Examples of the interposed-layer material include: 1) a heterocyclic compound such as an oxadiazole derivative, benzimidazole derivative, or phenanthroline derivative; 2) a fused aromatic compound such as a carbazole derivative, anthracene derivative, phenanthrene derivative, pyrene derivative or chrysene derivative; and 3) an aromatic amine compound such as a triarylamine derivative or a fused polycyclic aromatic amine derivative.

Although one or both of the first host material and the second host material may be used as the interposed layer material, the interposed layer material may be any material provided that the Singlet emitting region and the TTF emitting region are separated from each other and the Singlet emission and the TTF emission are not hindered.

In the organic EL device according to the exemplary embodiment, content ratios of all the materials forming the interposed layer in the interposed layer are each 10 mass % or more.

The interposed layer contains the interposed layer material as a material forming the interposed layer.

The interposed layer contains the interposed-layer material preferably at 60 mass % or more, more preferably at 70 mass % or more, further preferably at 80 mass % or more, still further preferably at 90 mass % or more, still further preferably at 95 mass % or more, with respect to the total mass of the interposed layer.

The interposed layer may include a single type of the interposed-layer material or may include two or more types of the interposed-layer material.

When the interposed layer contains two or more interposed-layer materials, an upper limit of a total content ratio of the two or more interposed-layer materials is 100 mass %.

It is not excluded that the interposed layer of the exemplary embodiment may further contain material(s) other than the interposed layer material.

The interposed layer may be a single layer or a laminate of two or more layers.

As long as the overlap between the Singlet emitting region and the TTF emitting region is inhibited, a film thickness of the interposed layer is not particularly limited but each layer in the interposed layer is preferably in a range from 3 nm to 15 nm, more preferably in a range from 5 nm to 10 nm.

The interposed layer having a film thickness of 3 nm or more easily separates the Singlet emitting region from the emitting region derived from TTF.

The interposed layer having a film thickness of 15 nm or less easily inhibits a phenomenon in which the host material of the interposed layer emits light.

It is preferable that: the interposed layer contains the interposed layer material as a material forming the interposed layer; and the triplet energy $T_1$(H1) of the first host material, the triplet energy $T_1$(H2) of the second host material, and a triplet energy $T_1(M_{mid})$ of at least one interposed layer material satisfy a relationship of a numerical formula (Numerical Formula 21) below.

$$T_1(H1) \geq T_1(M_{mid}) \geq T_1(H2) \quad \text{(Numerical Formula 21)}$$

When the interposed layer contains two or more interposed layer materials as materials forming the interposed layer, the triplet energy $T_1$(H1) of the first host material, the triplet energy $T_1$(H2) of the second host material, and a triplet energy $T_1(M_{EA})$ of each of the interposed layer materials more preferably satisfy a relationship of a numerical formula (Numerical Formula 21A) below.

$$T_1(H1) \geq T_1(M_{EA}) \geq T_1(H2) \quad \text{(Numerical Formula 21A)}$$

It is also preferable that the organic EL device of the exemplary embodiment further includes a diffusion layer.

When the organic EL device of the exemplary embodiment includes the diffusion layer, it is preferable that the diffusion layer is interposed between the first emitting layer and the second emitting layer.

An arrangement of an organic EL device will be described. It should be noted that the reference numerals will be sometimes omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule organic compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylam inophenyl)-N-phenylam ino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylam ino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N, N'-bis(4-butylphenyl)-N, N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include an aromatic amine compound such as 4,4'-bis[N-(1-naphthyl)-N-phenylamino]biphenyl (abbreviation: NPB), N,N'-bis(3-methylphenyl)-N,N'-diphenyl-[1, 1'-biphenyl]-4,4'-diamine (abbreviation: TPD), 4-phenyl-4'-(9-phenylfluorene-9-yl) triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V\cdot s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyI)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzimidazole compound is suitably usable. The above-described substances mostly have an electron mobility of $10^{-6}$ $cm^2/Vs$ or more.

It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method

A method for forming each layer of the organic EL device in the present exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

A film thickness of each of the organic layers of the organic EL device in the exemplary embodiment is not limited unless otherwise specified in the above. In general, the thickness preferably ranges from several nanometers to 1 μm because excessively small film thickness is likely to cause defects (e.g. pin holes) and excessively large thickness leads to the necessity of applying high voltage and consequent reduction in efficiency.

First Host Material, Second Host Material, and Third Host Material

In the organic EL device according to the exemplary embodiment, it is also preferable that the first host material, the second host material, and the third host material are each independently at least one compound of, for instance, the first compound represented by a formula (1), (1X), (12X), (13X), (14X) or (15X) and the second compound represented by a formula (2). The first compound is also usable as the first host material and the second host material. In this case, a compound represented by the formula (1), (1X), (12X), (13X), (14X) or (15X) used as the second host material is occasionally referred to as the second compound for convenience.

First Compound

[Formula 24]

(1)

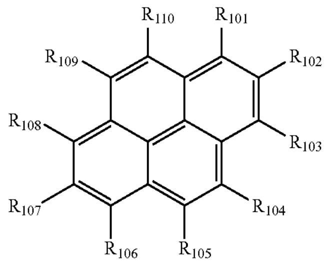

(11)

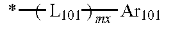

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by a formula (11) above;

at least one of $R_{101}$ to $R_{110}$ is the group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5;

when two or more $L_{101}$ are present, two or more $L_{101}$ are mutually the same or different;

when two or more $Ar_{101}$ are present, two or more $Ar_{101}$ are mutually the same or different; and in the formula (11) represents a bonding position to a pyrene ring in the formula (1).

In the first compound according to the exemplary embodiment, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device of the exemplary embodiment, a group represented by the formula (11) is preferably a group represented by a formula (111) below.

[Formula 25]

(111)

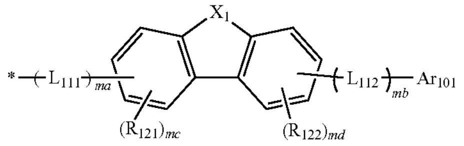

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$Ar_{101}$ represents the same as $Ar_{101}$ in the formula (11);

$R_{121}$, $R_{122}$, $R_{123}$, $R_{124}$, and $R_{125}$ are each dependently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

Among positions *1 to *8 of carbon atoms in the cyclic structure represented by a formula (111a) below in the group represented by the formula (111), $L_{111}$ is bonded to one of positions *1 to *4, $R_{121}$ is bonded to three positions of the rest of *1 to *4, $L_{112}$ is bonded to one of positions *5 to *8, and $R_{122}$ is bonded to three positions of the rest of *5 to *8.

[Formula 26]

(111a)

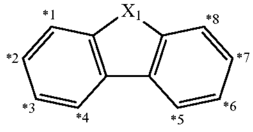

For instance, in the group represented by the formula (111), when $L_{111}$ and $L_{112}$ are bonded to *2 and *7 positions, respectively, of the carbon atom of the cyclic structure represented by the formula (111a), the group represented by the formula (111) is represented by a formula (111b) below.

[Formula 27]

(111b)

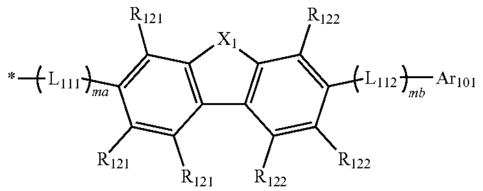

In the formula (111b): $X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device of the exemplary embodiment, the group represented by the formula (111) is preferably a group represented by the formula (111b).

In the organic EL device according to the exemplary embodiment, it is preferable that ma is 0, 1, or 2, and mb is 0, 1, or 2.

In the organic EL device according to the exemplary embodiment, it is preferable that ma is 0 or 1, and mb is 0 or 1.

In the organic EL device according to the exemplary embodiment, $Ar_{101}$ is preferably a substituted or unsubstituted aryl group having 6 to 50 ring carbon atoms.

In the organic EL device according to the exemplary embodiment, $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to the exemplary embodiment, $Ar_{101}$ is also preferably a group represented by a formula (12), (13) or (14) below.

[Formula 28]

(12)

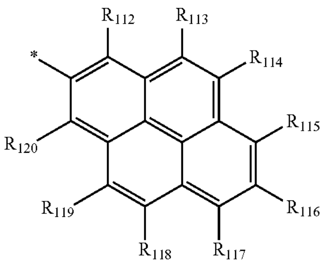

(13)

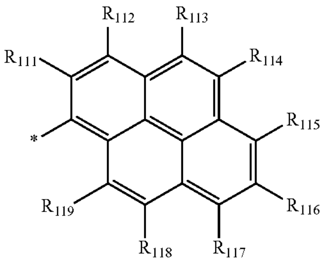

(14)

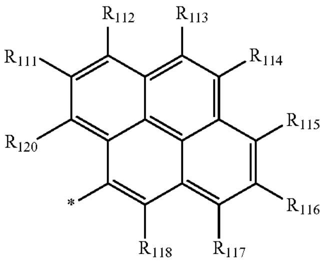

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{124}$, a group represented by $-COOR_{125}$ a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formulae (12), (13) and (14) represents a bonding position to $L_{101}$ in the formula (11), or a bonding position to $L_{112}$ in the formula (111) or (111b).

In the organic EL device according to the exemplary embodiment, the first compound is preferably represented by a formula (101) below.

[Formula 29]

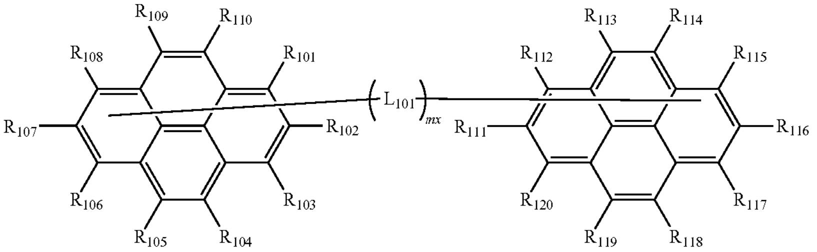

(101)

In the formula (101):

$R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4 or 5; and when two or more $L_{101}$ are present, the two or more $L_{101}$ are mutually the same or different.

In the organic EL device according to the exemplary embodiment, $L_{101}$ is preferably a single bond or a substituted or unsubstituted arylene group having 6 to 50 ring carbon atoms.

In the organic EL device according to the exemplary embodiment, the first compound is preferably represented by a formula (102).

[Formula 30]

(102)

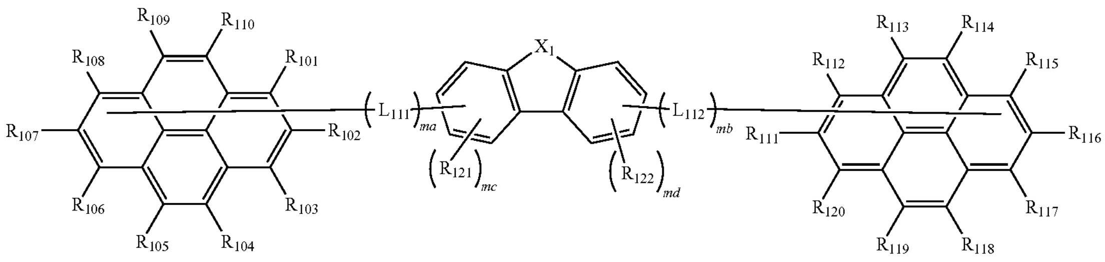

In the formula (102):

$R_{101}$ to $R_{120}$ each independently represent the same as $R_{101}$ to $R_{120}$ of the formula (101);

one of $R_{101}$ to $R_{110}$ represents a bonding position to $L_{111}$, and one of $R_{111}$ to $R_{120}$ represents a bonding position to $L_{112}$;

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$R_{121}$, $R_{122}$, $R_{123}$, $R_{124}$, and $R_{125}$ are each dependently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

and is 3; and three $R_{122}$ are mutually the same or different.

In the compound represented by a formula (102), it is preferable that ma is 0, 1, or 2, and mb is 0, 1, or 2.

In the compound represented by a formula (102), it is preferable that ma is 0 or 1, and mb is 0 or 1.

In the organic EL device according to the exemplary embodiment, two or more of $R_{101}$ to $R_{110}$ are preferably a group represented by the formula (11).

In the organic EL device according to the exemplary embodiment, it is preferable that two or more of $R_{101}$ to $R_{110}$ are preferably a group represented by the formula (11) and $Ar_{101}$ is a substituted or unsubstituted aryl group having 6 to 50 ring carbon atoms.

In the organic EL device according to the exemplary embodiment, it is preferable that $Ar_{101}$ is not a substituted or unsubstituted pyrenyl group;

$L_{101}$ is not a substituted or unsubstituted pyrenylene group; and the substituted or unsubstituted aryl group having 6 to 50 ring carbon atoms for $R_{101}$ to $R_{110}$ not being the group represented by the formula (11) is not a substituted or unsubstituted pyrenyl group.

In the organic EL device according to the exemplary embodiment, it is preferable that $R_{101}$ to $R_{110}$ not being the group represented by the formula (11) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that $R_{101}$ to $R_{110}$ not being the group represented by the formula (11) are each independently a hydrogen atom, a substituted or unsubstituted alkyl group having 1 to 50 carbon atoms, or a substituted or unsubstituted cycloalkyl group having 3 to 50 ring carbon atoms.

In the organic EL device according to the exemplary embodiment, $R_{101}$ to $R_{110}$ not being the group represented by the formula (11) are each preferably a hydrogen atom.

Compound Represented by Formula (1X)

In the organic EL device of the exemplary embodiment, the first compound is also preferably represented by a formula (1X) below.

[Formula 31]

(1X)

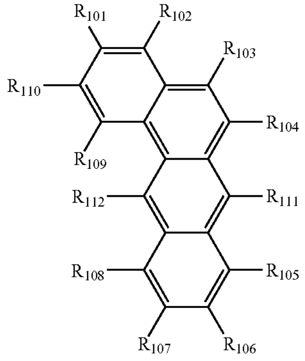

-continued (11X)

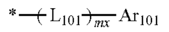

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by a formula (11X) above;

at least one of $R_{101}$ to $R_{112}$ is the group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4 or 5;

when two or more $L_{101}$ are present, two or more $L_{101}$ are mutually the same or different;

when two or more $Ar_{101}$ are present, two or more $Ar_{101}$ are mutually the same or different; and

* in the formula (11X) represents a bonding position to a benz[a]anthracene ring in the formula (1X).

In the organic EL device of the exemplary embodiment, the group represented by the formula (11X) is preferably a group represented by a formula (111X) below.

[Formula 32]

(111X)

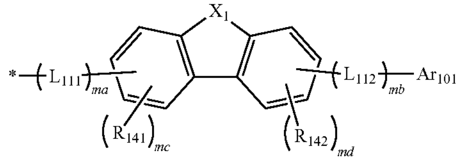

In the formula (111X);

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, or 4;

$Ar_{101}$ represents the same as $Ar_{101}$ in the formula (11X), $R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

[Formula 33]

(111aX)

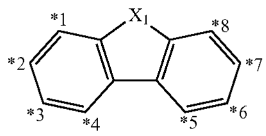

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111aX), the group represented by the formula (111X) is represented by a formula (111bX) below.

[Formula 34]

(111bX)

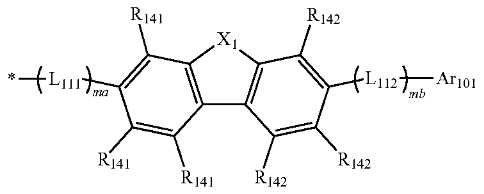

In the formula (111bX):

$X_1$, $L_{111}$, $L_{112}$, ma, mb, $Ar_{101}$, $R_{141}$, $R_{142}$, $R_{143}$, $R_{144}$ and $R_{145}$ each independently represent $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device of the exemplary embodiment, the group represented by the formula (111X) is preferably the group represented by the formula (111bX).

In the compound represented by the formula (1X), it is preferable that ma is 1 or 2 and mb is 1 or 2.

In the compound represented by the formula (1X), it is preferable that ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group; a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

[Formula 35]

(101X)

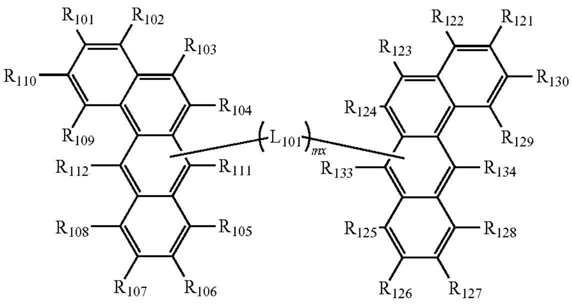

In the formula (101X):

one of $R_{111}$ and $R_{112}$ represents a bonding position to $L_{101}$ and one of $R_{133}$ and $R_{134}$ represents a bonding position to $L_{101}$;

$R_{111}$ or $R_{112}$ that is not a bonding position to $R_{101}$ to $R_{110}$, $R_{121}$ to $R_{130}$, and $L_{101}$, and $R_{133}$ or $R_{134}$ that is not a bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4 or 5; and when two or more $L_{101}$ are present, the two or more $L_{101}$ are mutually the same or different.

In the compound represented by the formula (1X), $L_{101}$ is preferably a single bond or a substituted or unsubstituted arylene group having 6 to 50 ring carbon atoms.

The compound represented by the formula (1X) is also preferably represented by a formula (102X) below.

[Formula 36]

(102X)

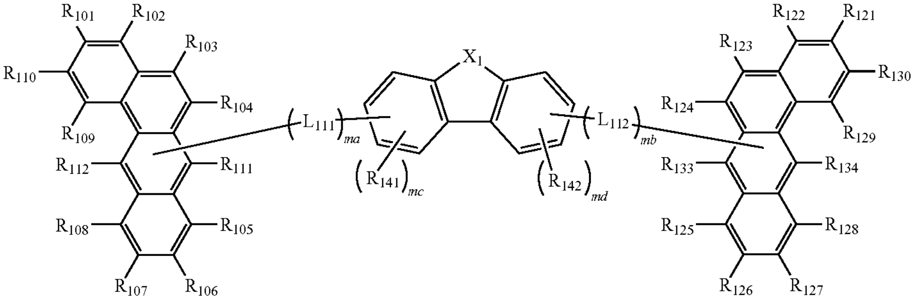

In the formula (102X):

one of $R_{111}$ and $R_{112}$ represents a bonding position to $L_{111}$ and one of $R_{133}$ and $R_{134}$ represents a bonding position to $L_{112}$;

$R_{111}$ or $R_{112}$ that is not a bonding position to $R_{101}$ to $R_{110}$, $R_{121}$ to $R_{130}$, and $L_{111}$, and $R_{133}$ or $R_{134}$ that is not a bonding position to $R_{111}$ or $R_{112}$ and $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, 4, or 5;

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

In the compound represented by the formula (1X), it is preferable that ma is 1 or 2 and mb is 1 or 2 in the formula (102X).

In the compound represented by the formula (1X), it is preferable that ma is 1 and mb is 1 in the formula (102X).

In the compound represented by the formula (1X), the group represented by the formula (11X) is also preferably a group represented by a formula (11AX) or a group represented by a formula (11BX).

[Formula 37]

(11AX)

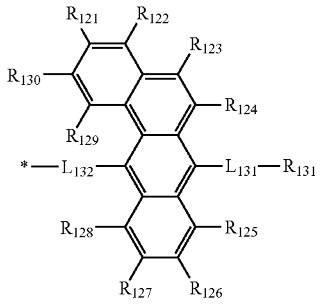

(11BX)

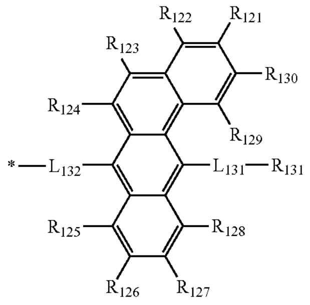

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11BX) are present, the plurality of groups represented by the formula (11BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and each * in the formulae (11AX) and (11BX) represents a bonding position to a benz[a]anthracene ring in the formula (1X).

The compound represented by the formula (1X) is also preferably represented by a formula (103X).

[Formula 38]

(103X)

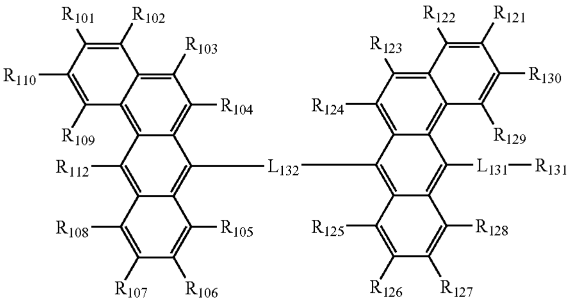

In the formula (103X):

$R_{101}$ to $R_{110}$ and $R_{112}$ respectively represent the same as $R_{101}$ to $R_{110}$ and $R_{112}$ in the formula (1X); and $R_{121}$ to $R_{131}$, $L_{131}$, and $L_{132}$ respectively represent the same as $R_{121}$ to $R_{131}$, $L_{131}$, and $L_{132}$ in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are also each preferably a group represented by the formula (11X).

In the compound represented by the formula (1X), it is preferable that two or more of $R_{101}$ to $R_{112}$ are each a group represented by the formula (11X) and $Ar_{101}$ in the formula (11X) is a substituted or unsubstituted aryl group having 6 to 50 ring carbon atoms.

In the compound represented by the formula (1X), it is also preferable that $Ar_{101}$ is not a substituted or unsubstituted benz[a]anthryl group, $L_{101}$ is not a substituted or unsubstituted benz[a]anthrylene group, and a substituted or unsubstituted aryl group having 6 to 50 ring carbon atoms as $R_{101}$ to $R_{110}$ that are not the group represented by the formula (11X) is not a substituted or unsubstituted benz[a]anthryl group.

In the compound represented by the formula (1X), $R_{101}$ to $R_{112}$ that are not the group represented by the formula (11X) are each independently preferably a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ that are not a group represented by the formula (11X) are preferably a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ that are not the group represented by the formula (11X) are each preferably a hydrogen atom.

Compound Represented by Formula (12X)

In the organic EL device of the exemplary embodiment, the first compound is also preferably the compound represented by the formula (12X).

[Formula 39]

(12X)

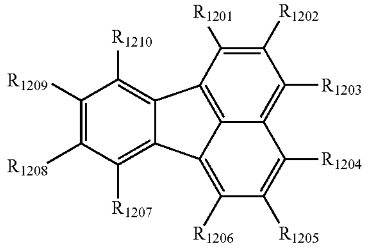

(121)

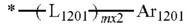

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ neither forming the substituted or unsubstituted monocyclic ring nor forming the substituted or unsubstituted fused ring each independently represent a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by the formula (121);

a substituent for substituting the substituted or unsubstituted monocyclic ring, a substituent for substituting a substituted or unsubstituted fused ring, and at least one of $R_{1201}$ to $R_{1210}$ are the group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms; and $Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device of the exemplary embodiment, the first compound is also preferably a compound represented by a formula (13X).

[Formula 40]

(13X)

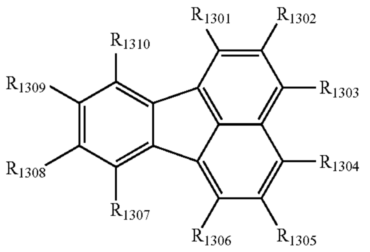

(131)

$*\!-\!(L_{1301})_{mx3}\!-\!Ar_{1301}$

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is the group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, two or more $Ar_{1301}$ are mutually the same or different; and

* in the formula (131) represents a bonding position to a fluoranthene ring in the formula (13X).

In the organic EL device of the exemplary embodiment, combinations of adjacent two or more of $R_{1301}$ to $R_{1310}$ that are not the group represented by the formula (131) are not bonded to each other. In the formula (13X), combinations of adjacent two of $R_{1301}$ to $R_{1310}$ refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device of the exemplary embodiment, the first compound is also preferably a compound represented by a formula (14X) below.

[Formula 41]

(14X)

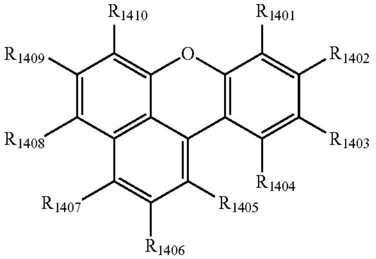

(141)

$*\!-\!(L_{1401})_{mx4}\!-\!Ar_{1401}$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is the group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device of the exemplary embodiment, the first compound is also preferably a compound represented by a formula (15X) below.

[Formula 42]

(15X)

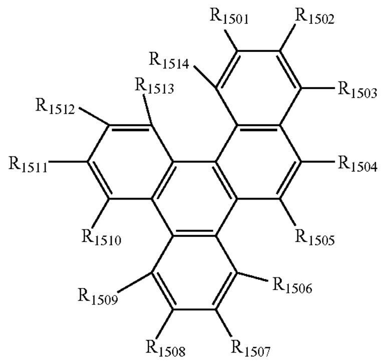

(151)

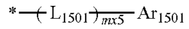

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(═O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is the group represented by the formula (151);

when a plurality of group represented by the formula (151) are present, the plurality of group represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

In the first compound and the second compound, it is preferable that all groups described as "substituted or unsubstituted" groups are "unsubstituted" groups.

Manufacturing Method of First Compound

The first compound can be manufactured by a known method. The first compound can also be manufactured based on a known method through a known alternative reaction using a known material(s) tailored for the target compound.

Specific Examples of First Compound

Specific examples of the first compound include the following compounds. It should however be noted that the invention is not limited by the specific examples of the first compound.

[Formula 43]

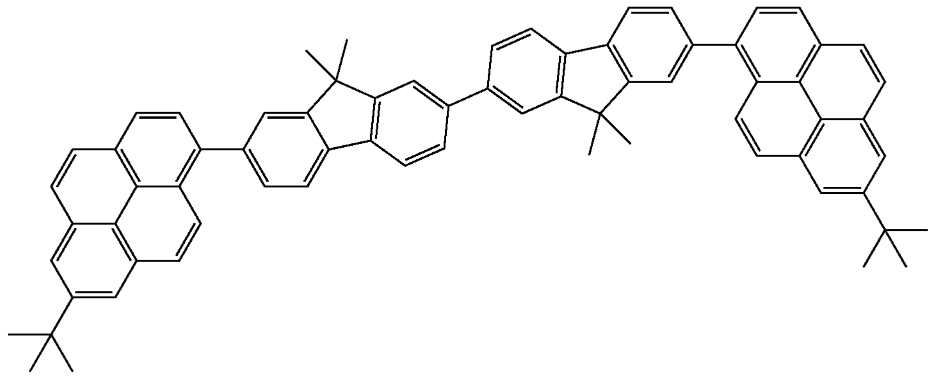

-continued
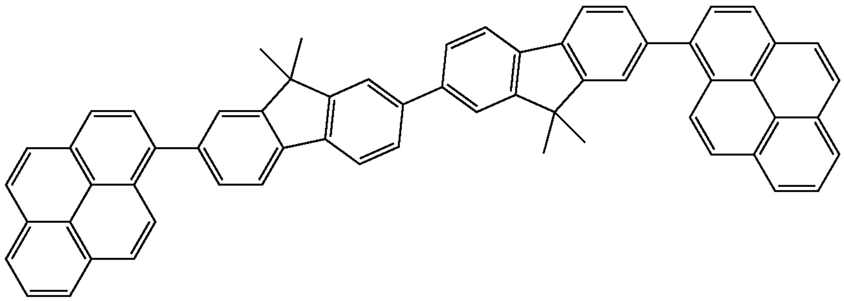
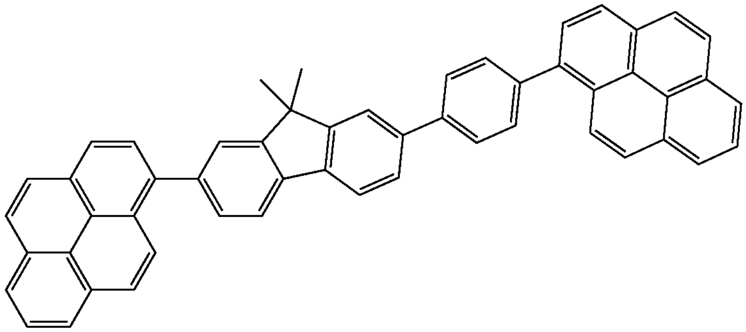
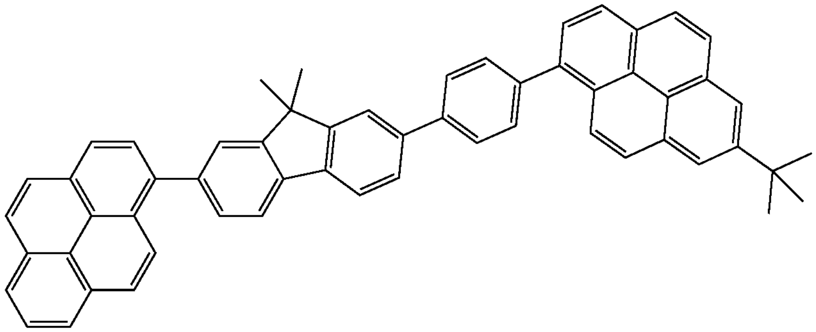
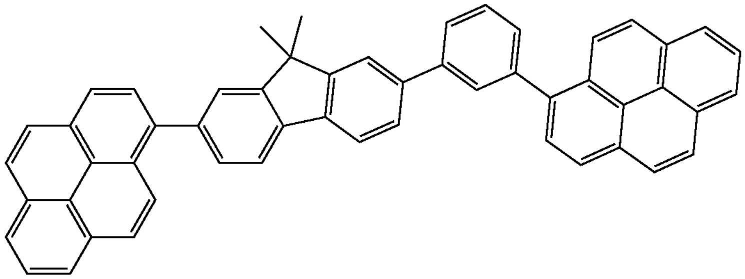
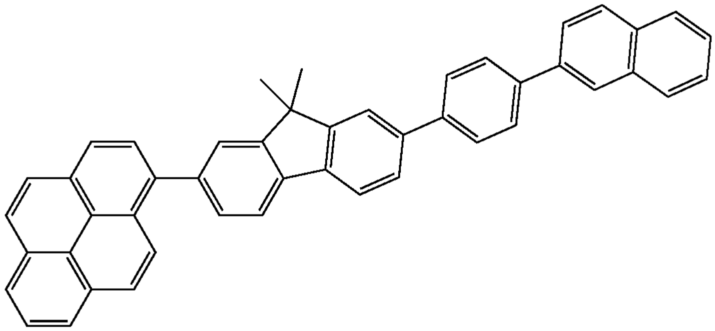

-continued
[Formula 44]
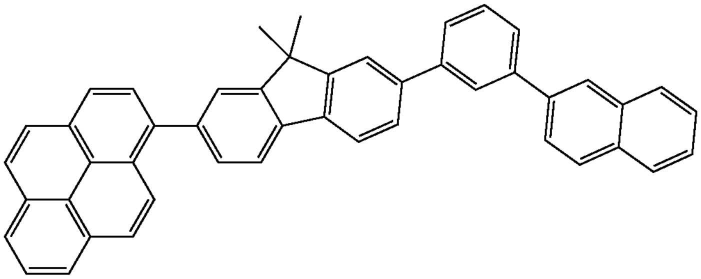
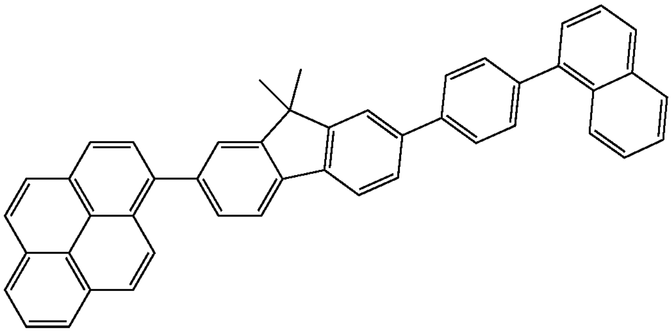
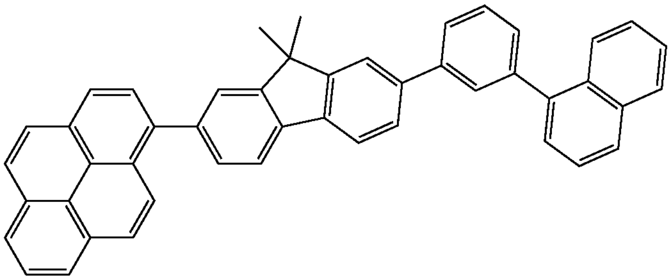
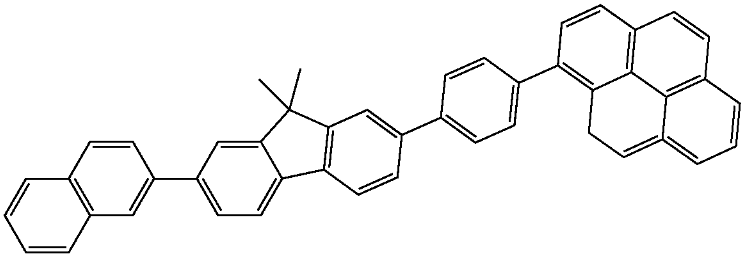
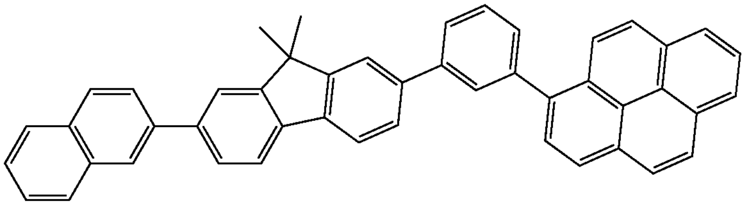
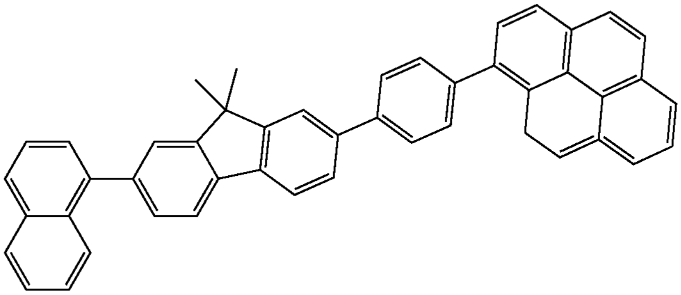

-continued
[Formula 45]
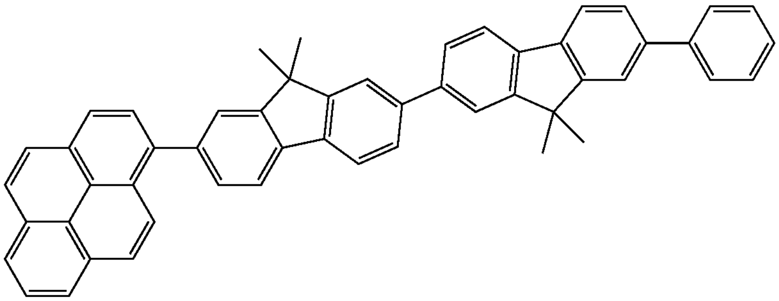
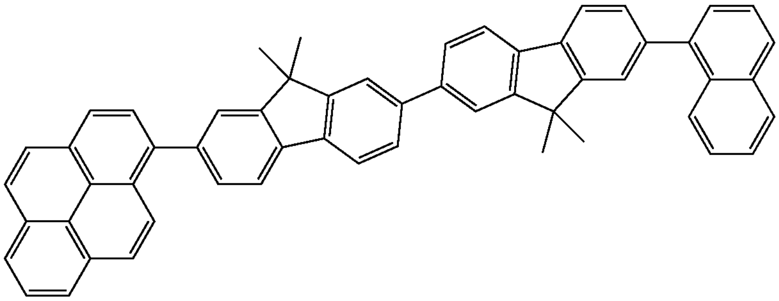
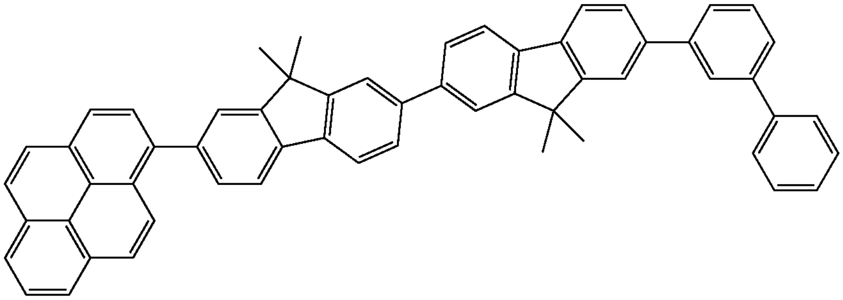
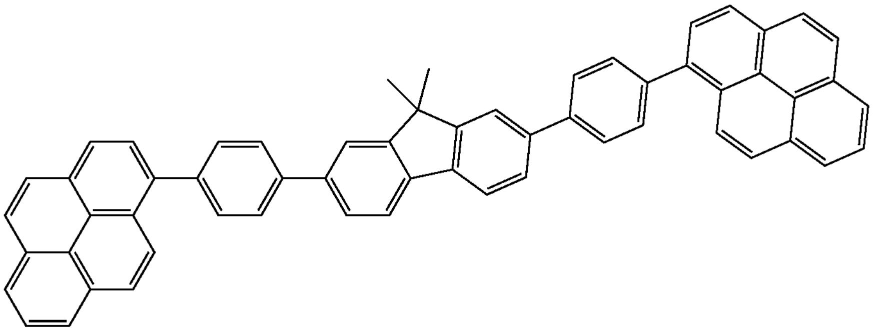
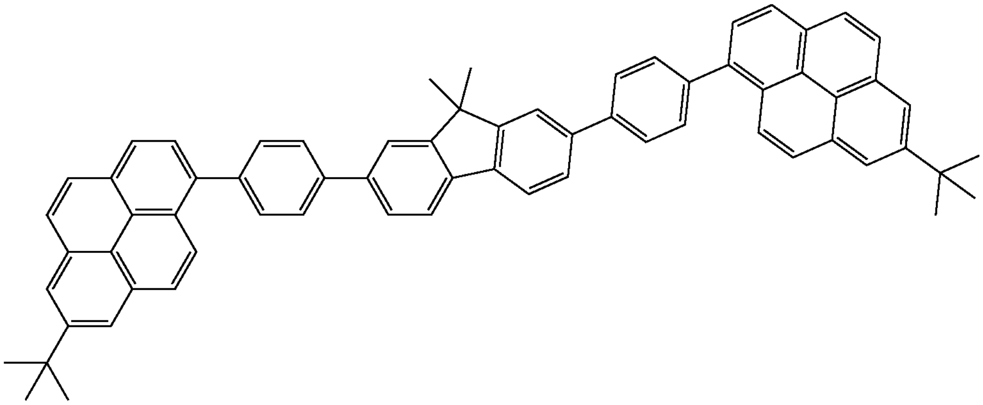

-continued
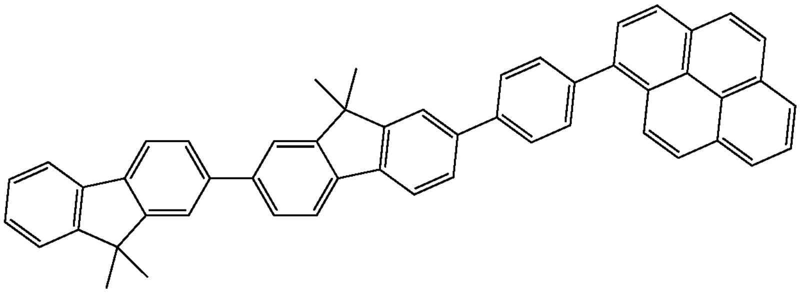
[Formula 46]
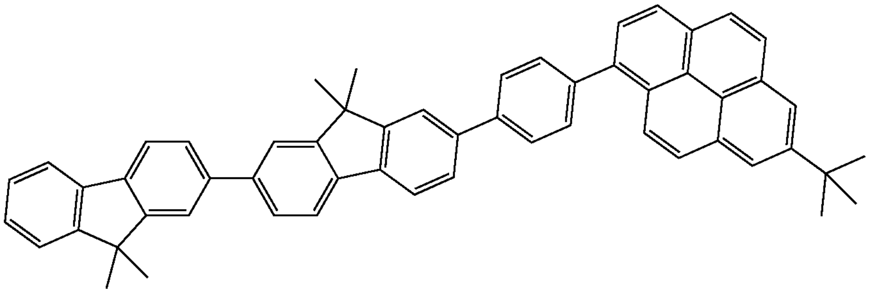
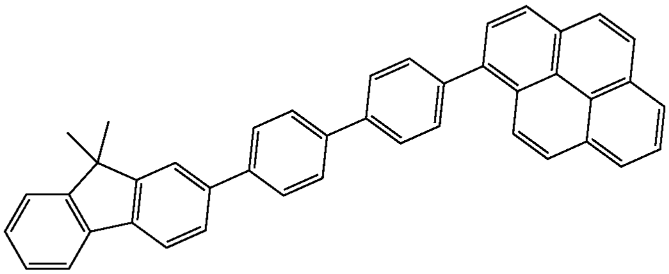
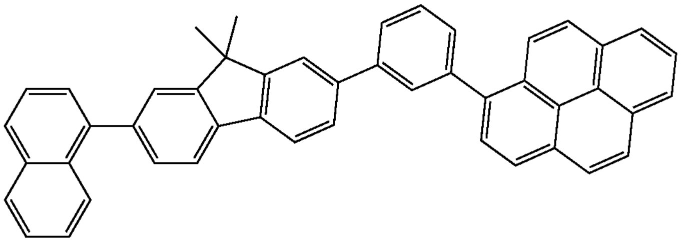
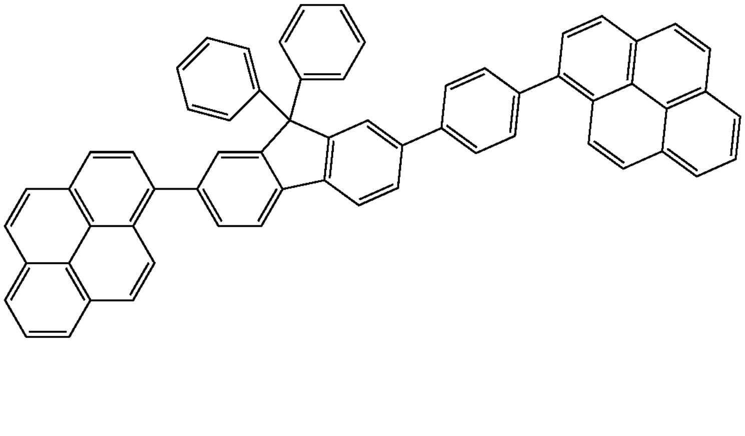

-continued
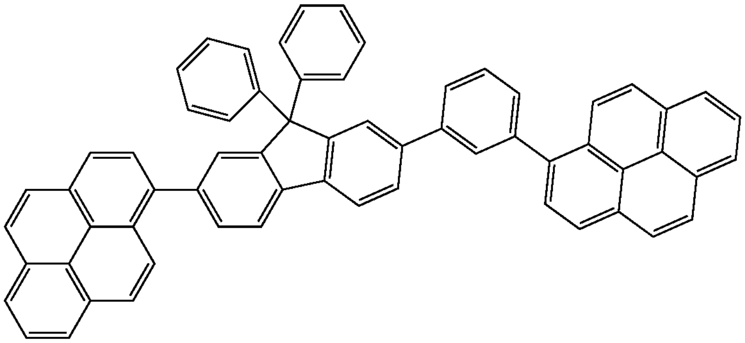
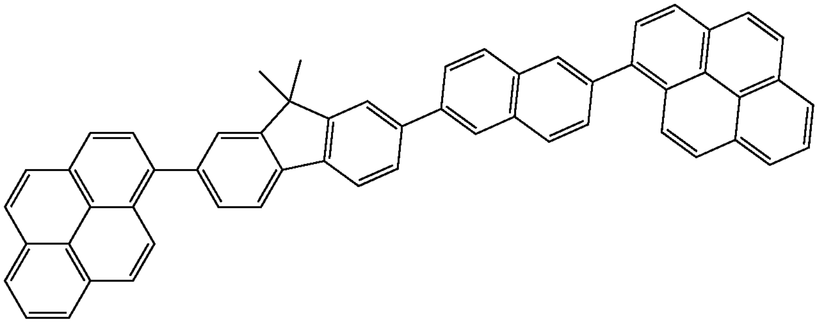
[Formula 47]
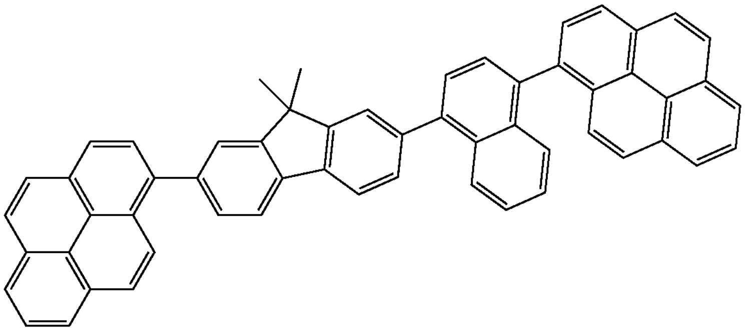
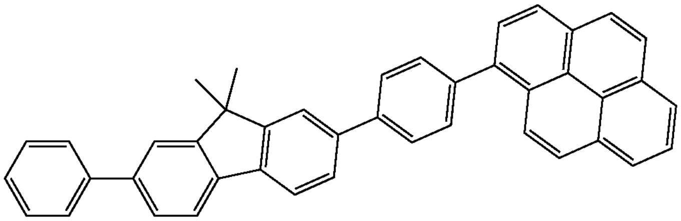
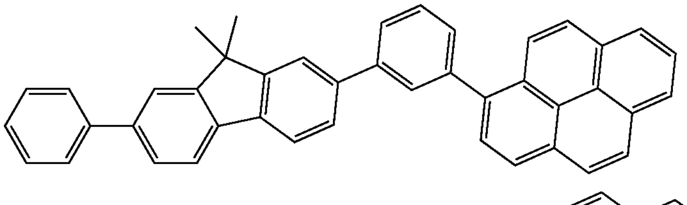
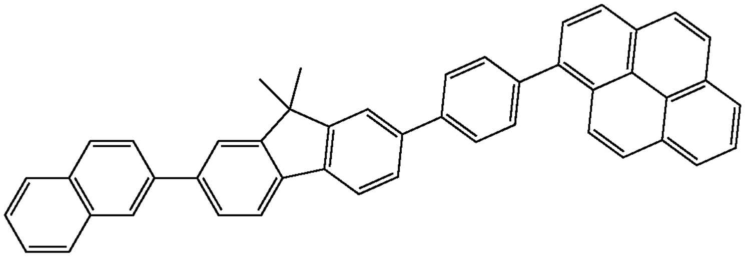

-continued
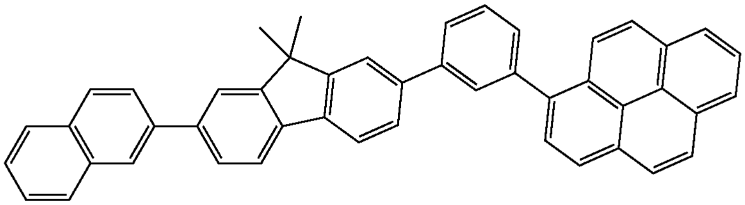
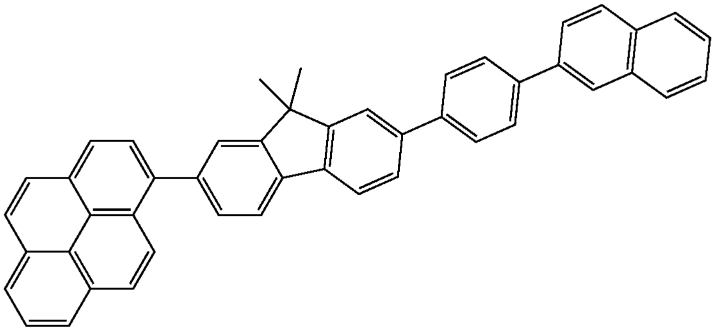
[Formula 48]
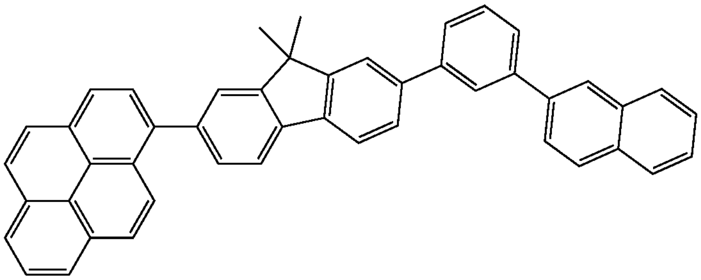
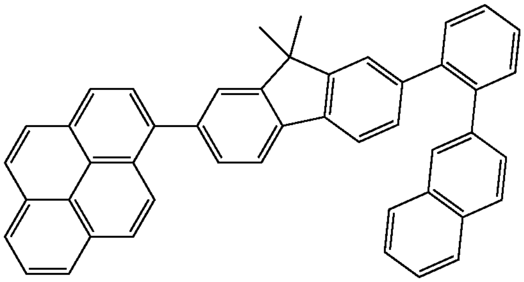
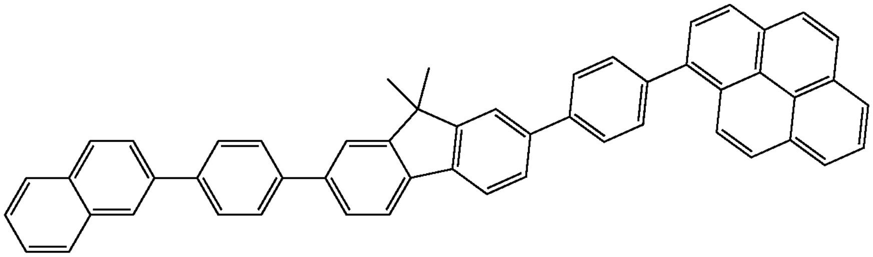
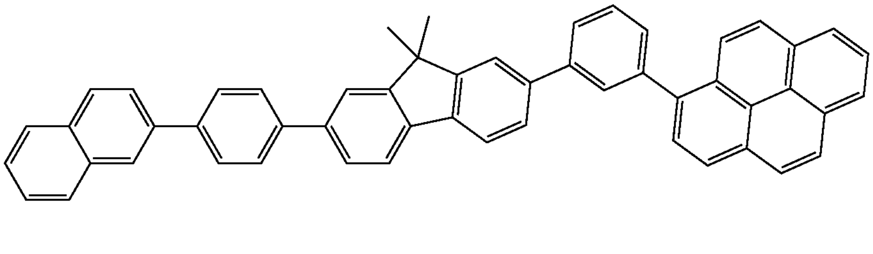

-continued
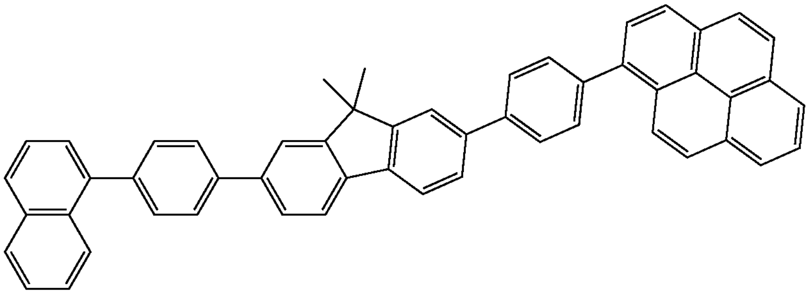
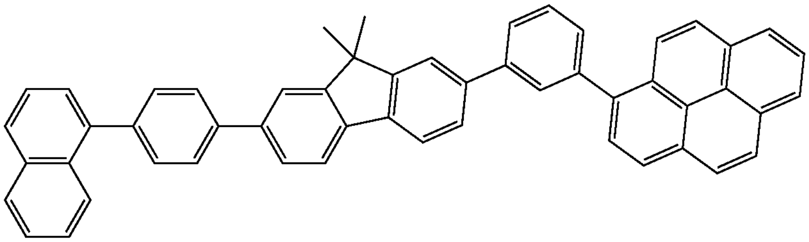
[Formula 49]
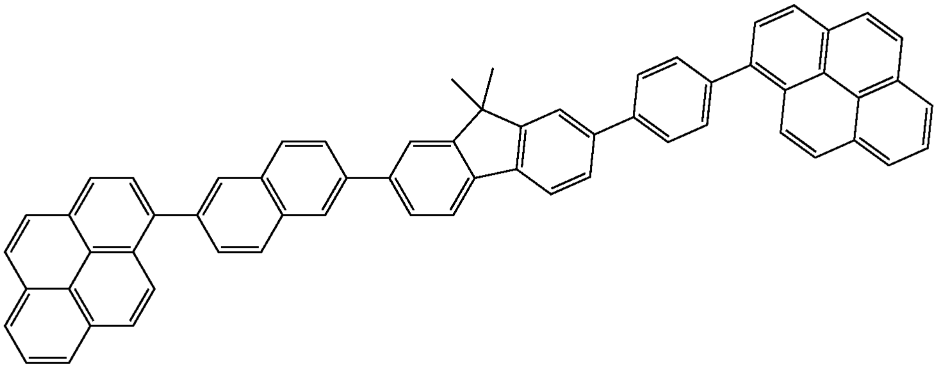
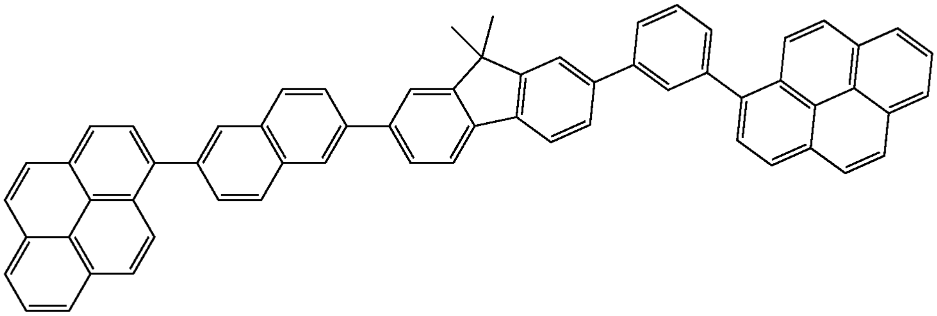
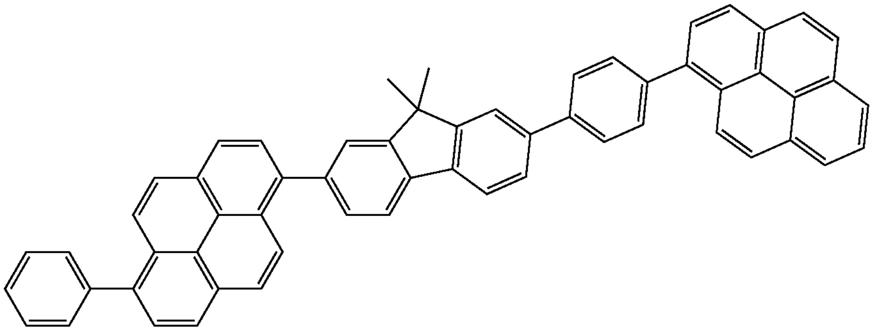

-continued
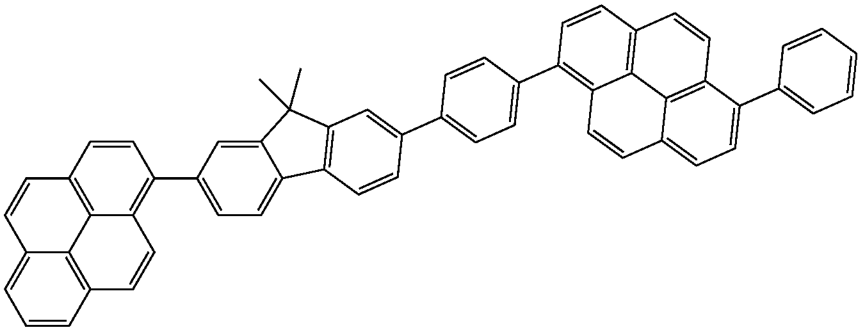
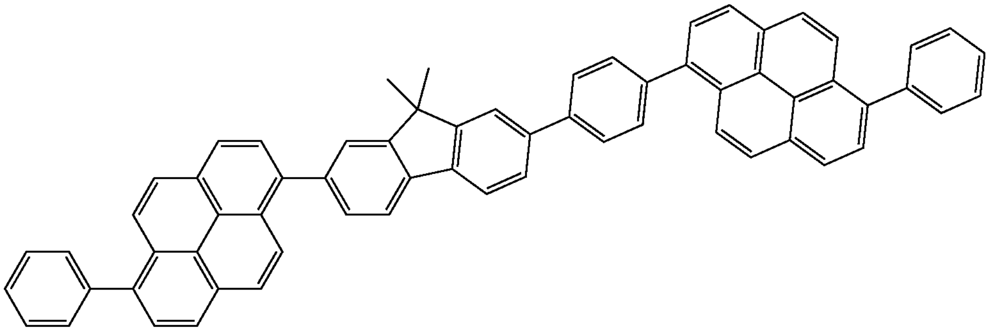
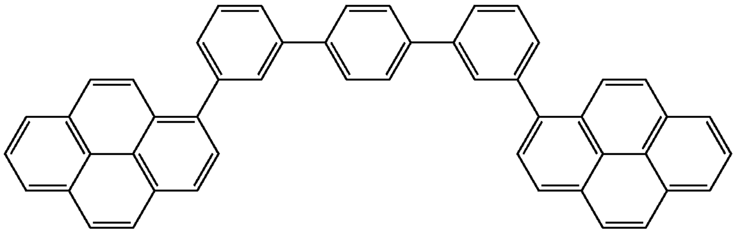
[Formula 50]
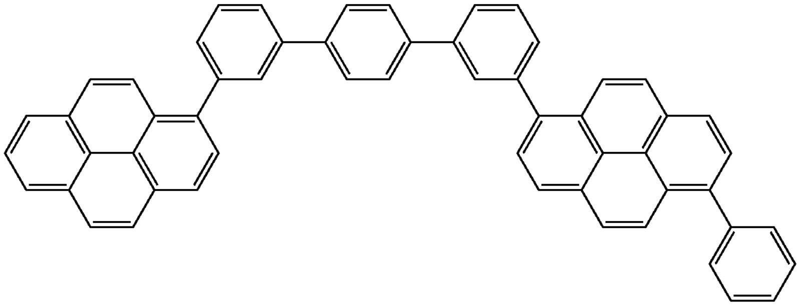
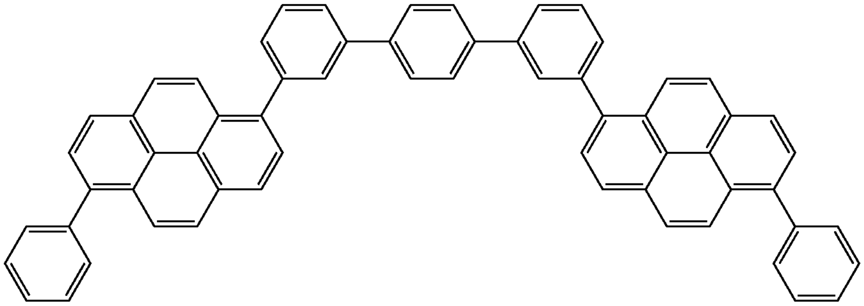

-continued
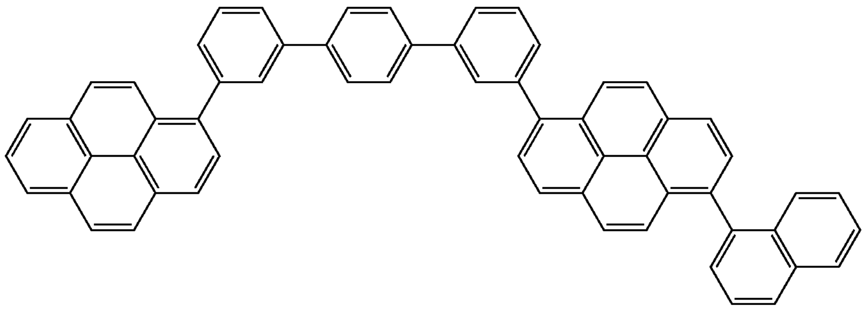
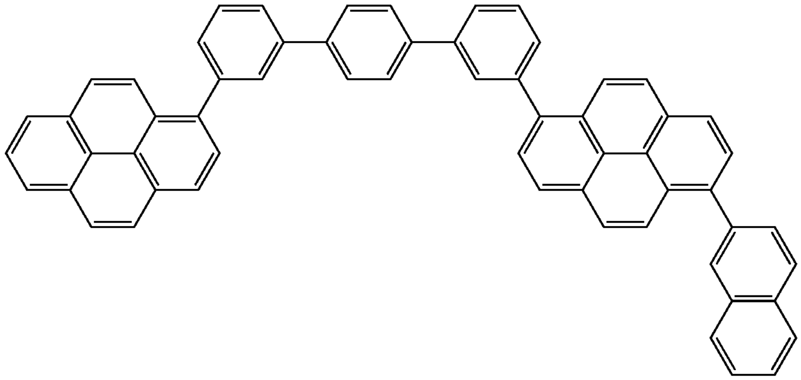
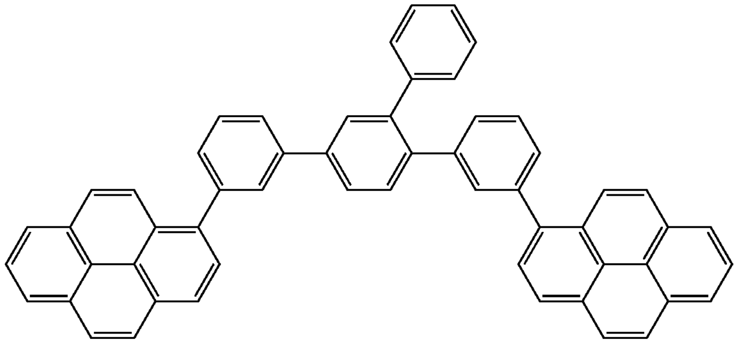
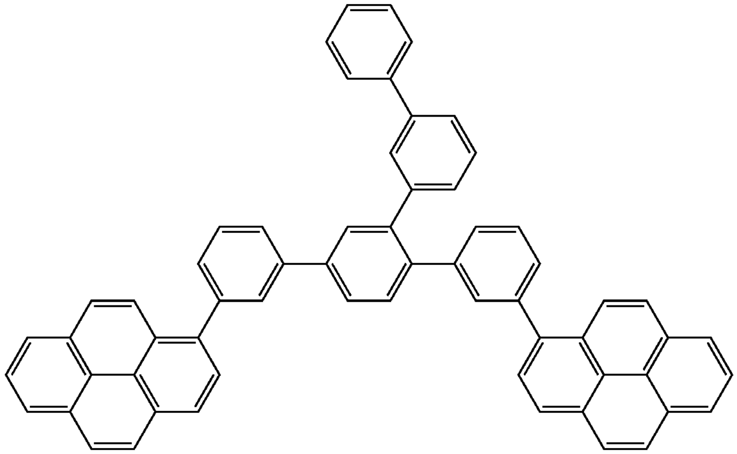

-continued
[Formula 51]
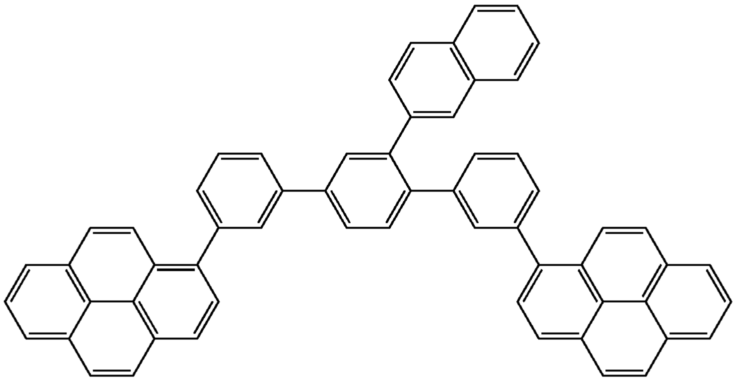
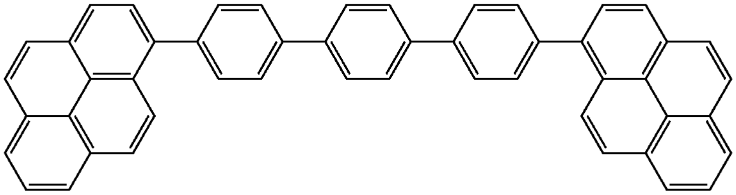
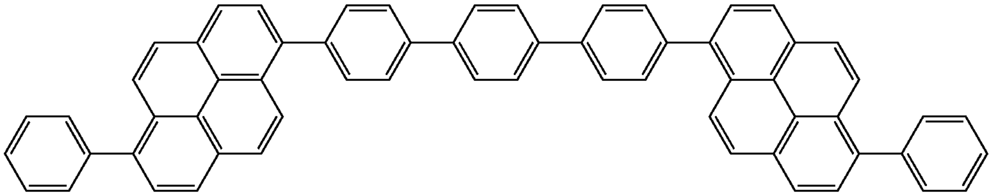
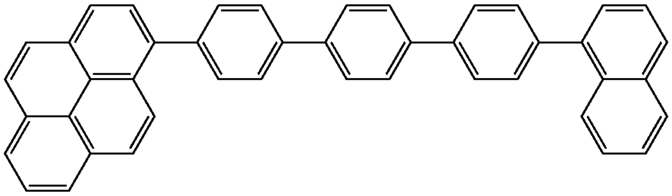
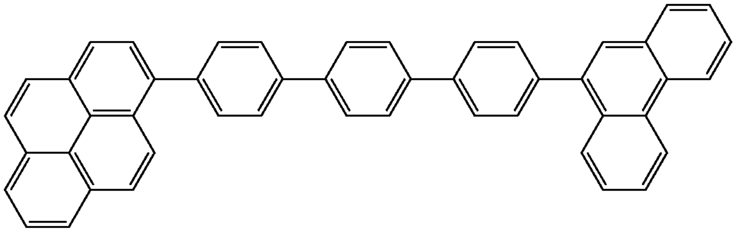
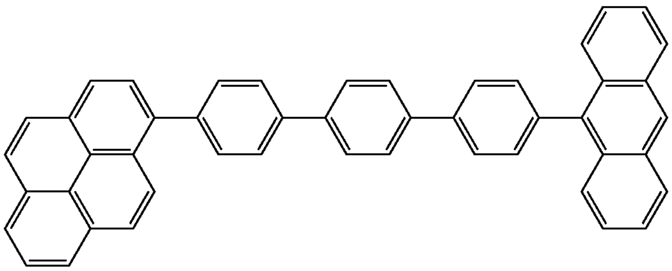

-continued
[Formula 52]
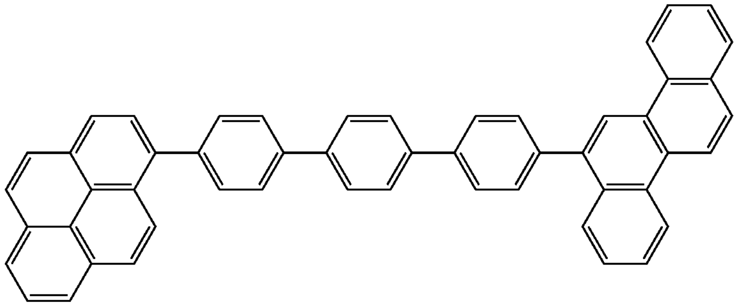
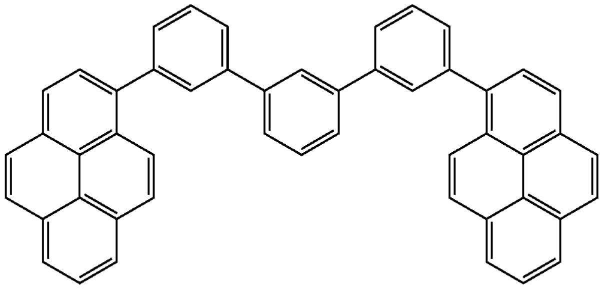
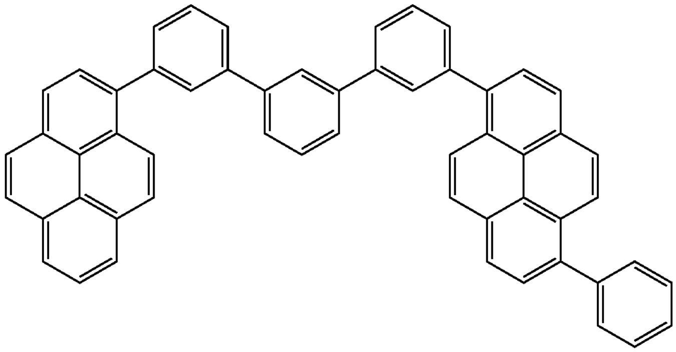
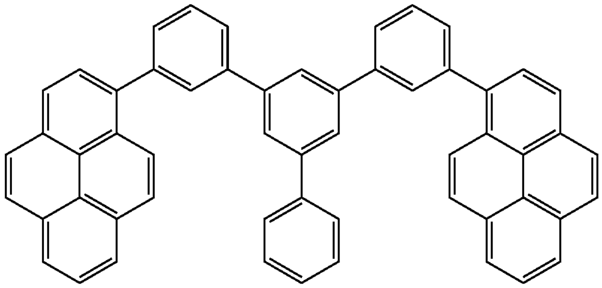
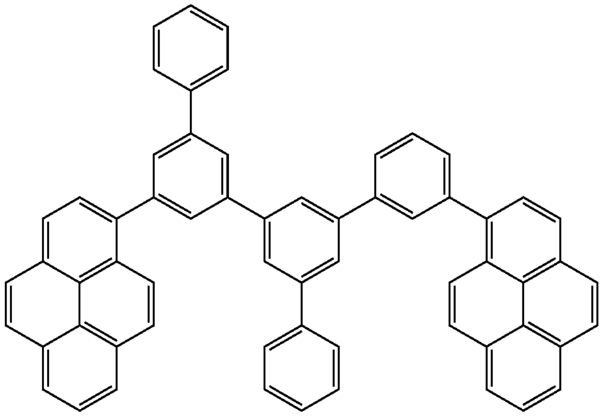

-continued
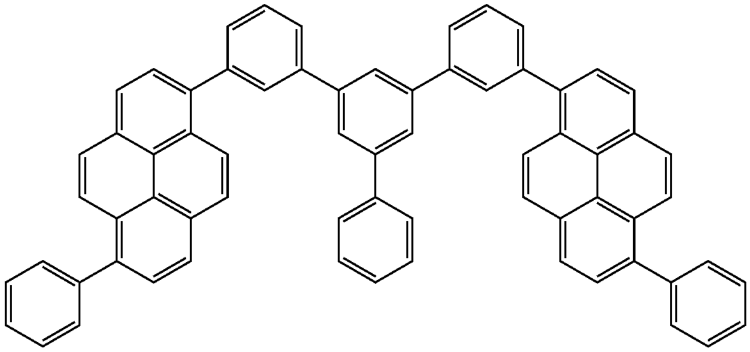
[Formula 53]
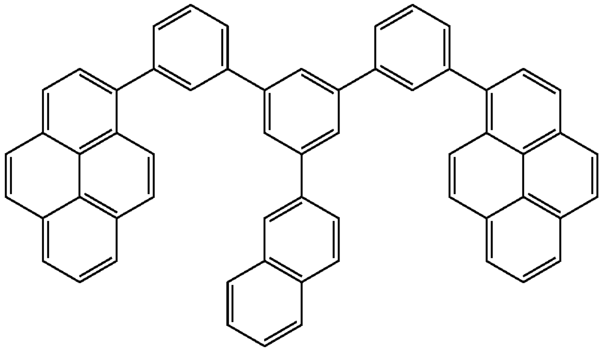
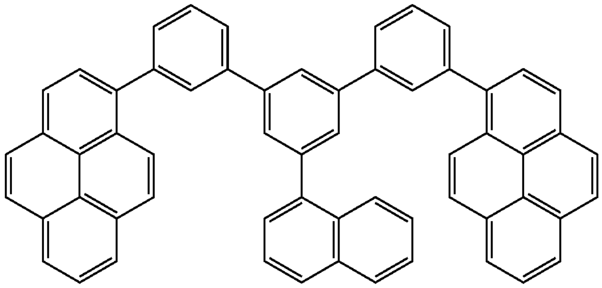
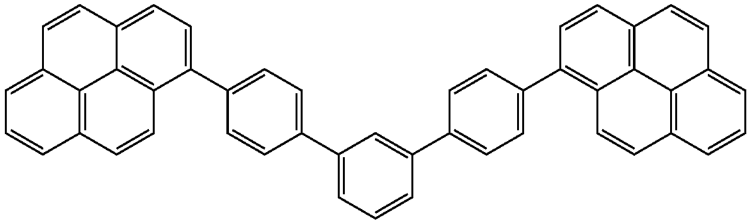
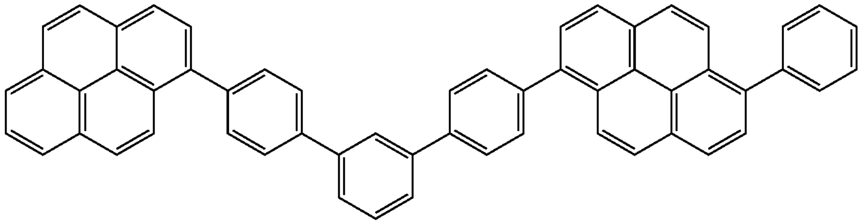
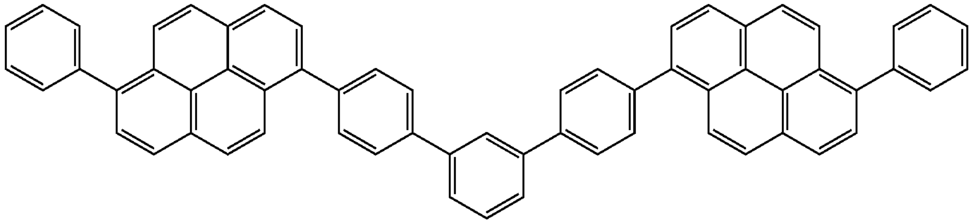

-continued
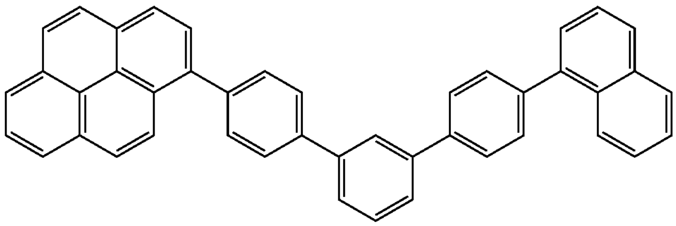
[Formula 54]
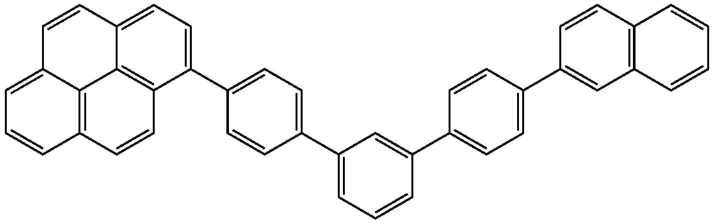
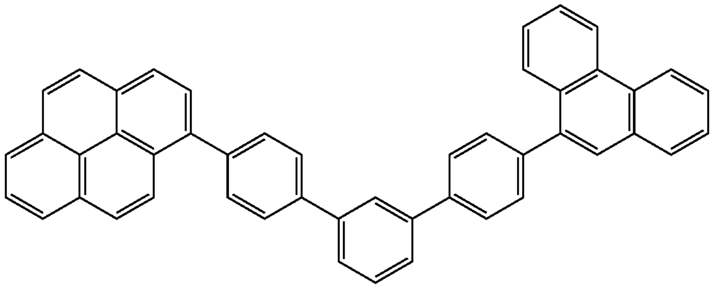
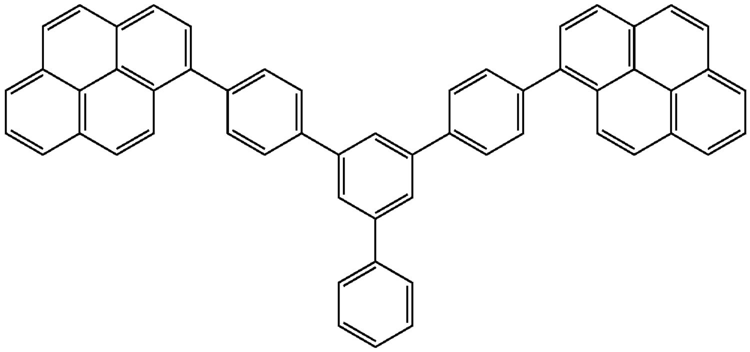
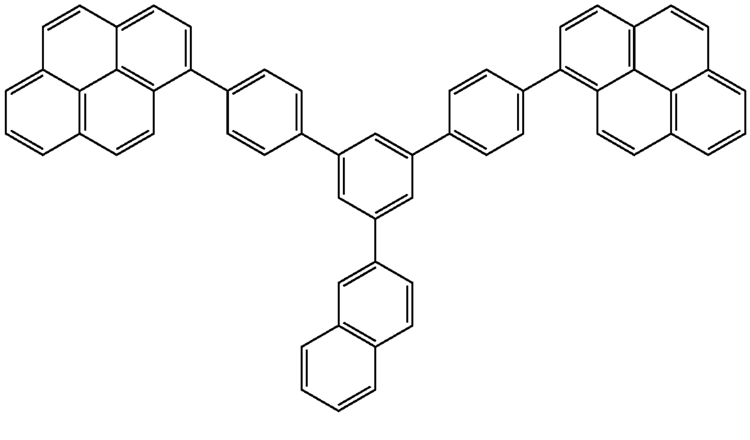

-continued
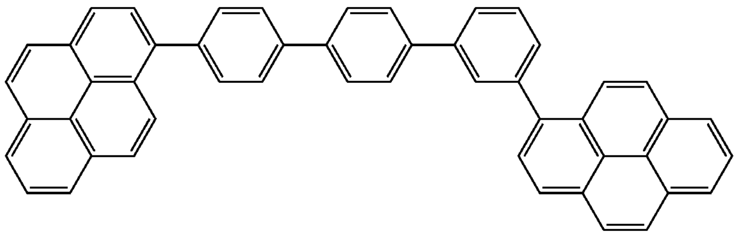
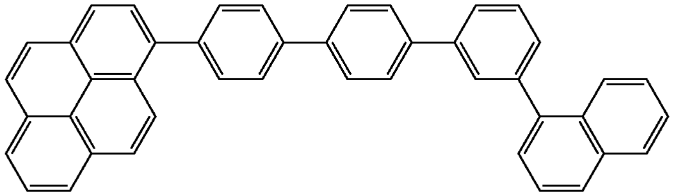
[Formula 55]
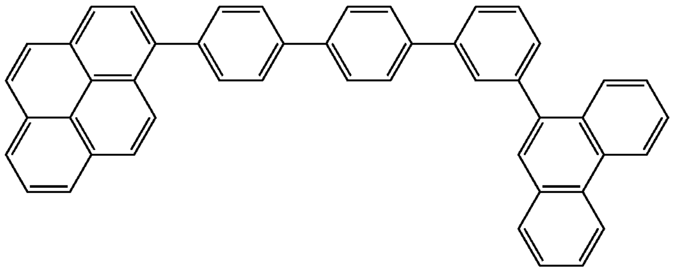
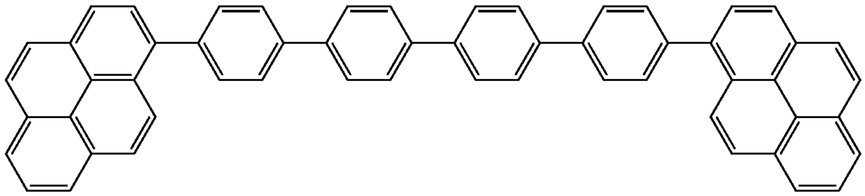
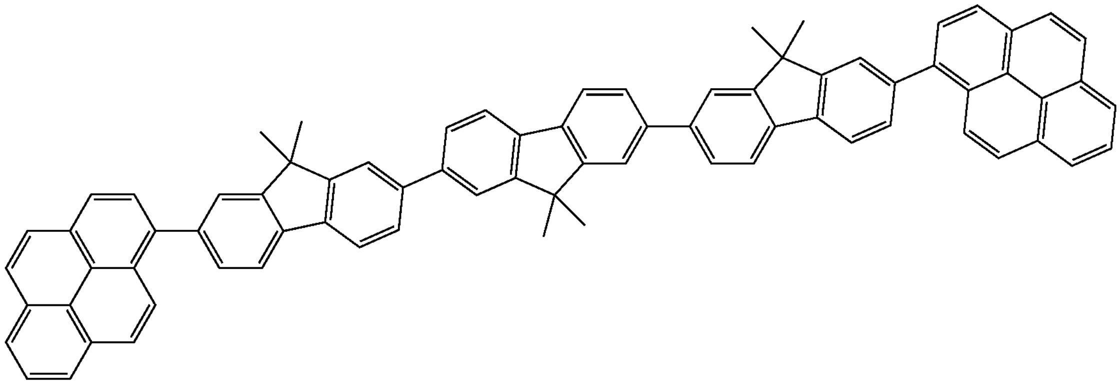

-continued
[Formula 56]
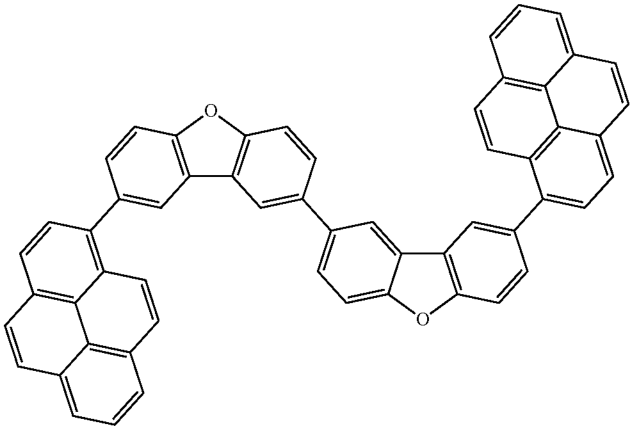
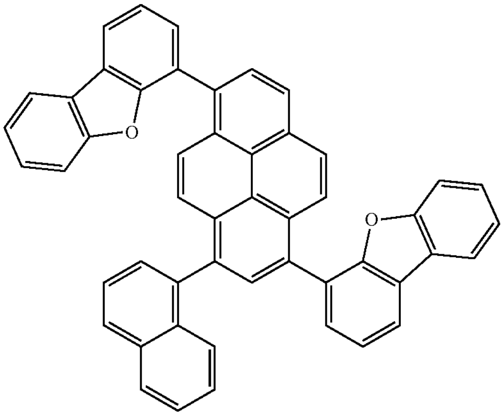
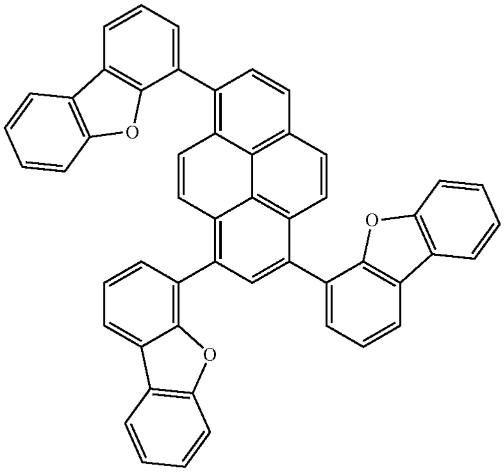
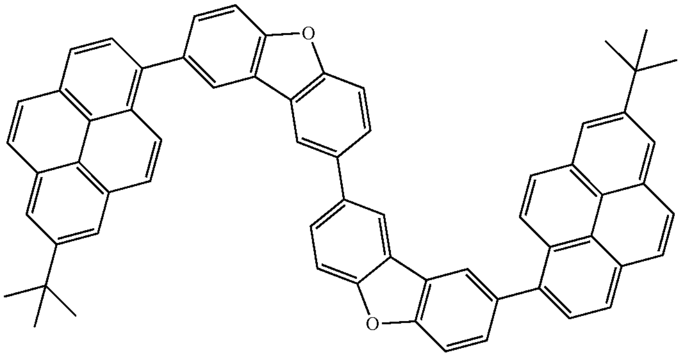
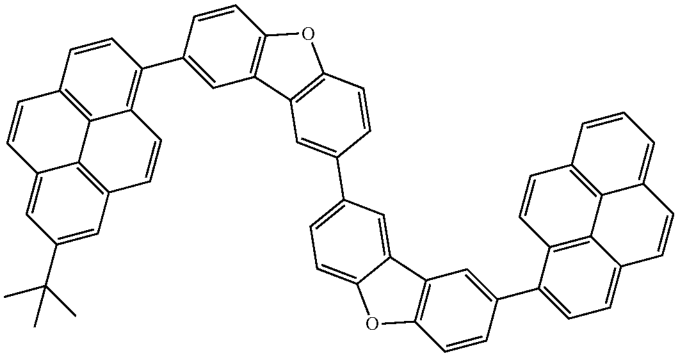

-continued
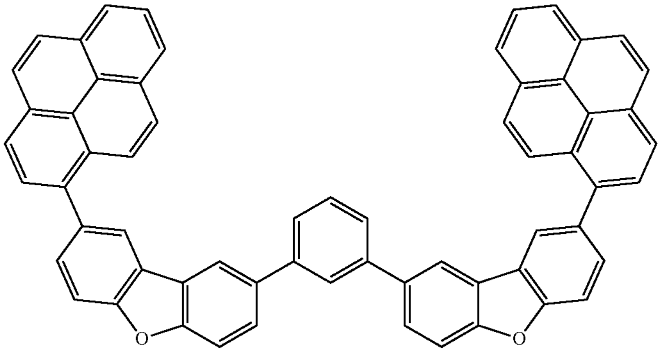
[Formula 57]
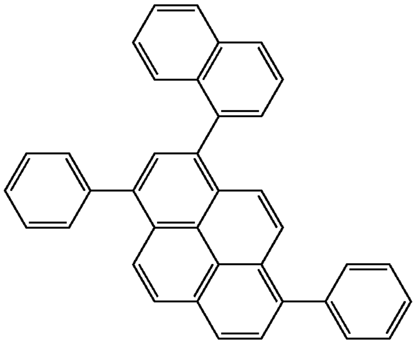
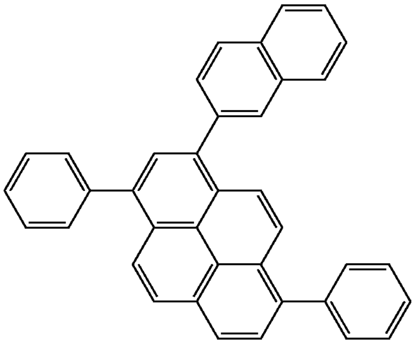
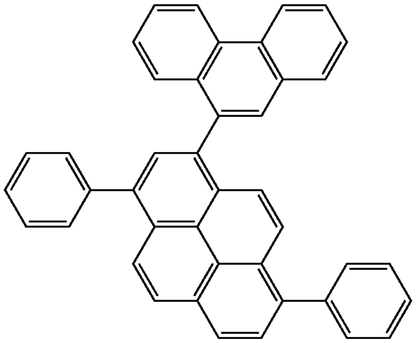
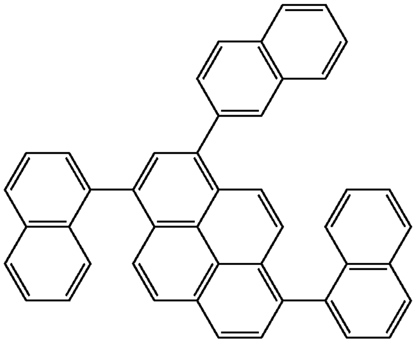
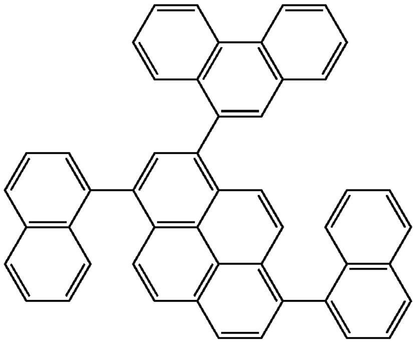
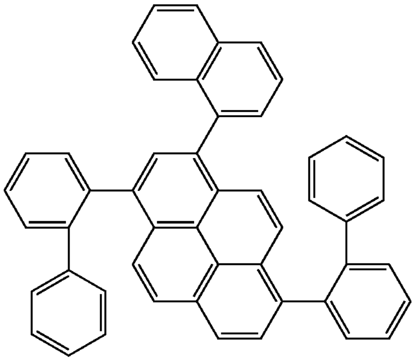

-continued
[Formula 58]
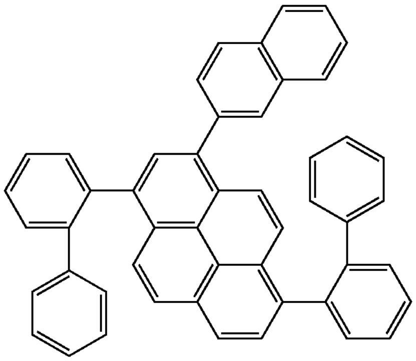
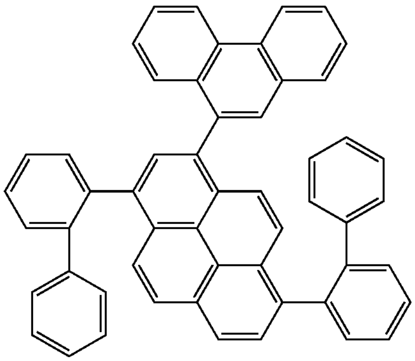
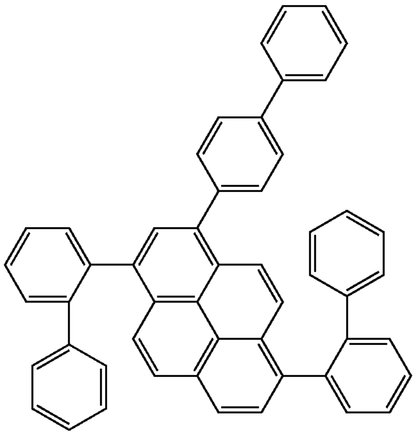
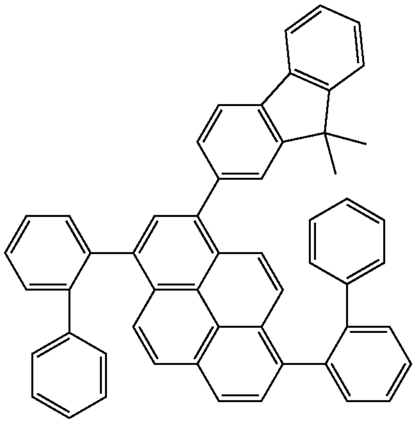
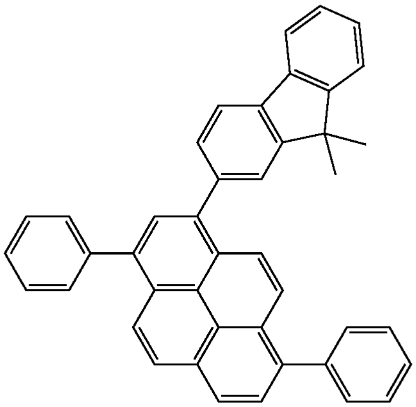
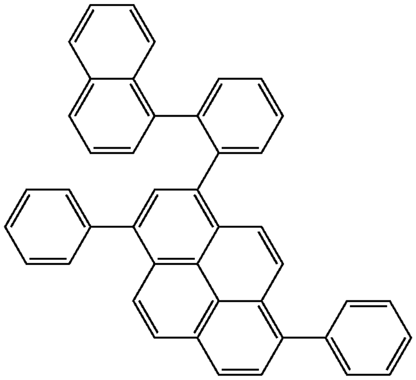
[Formula 59]
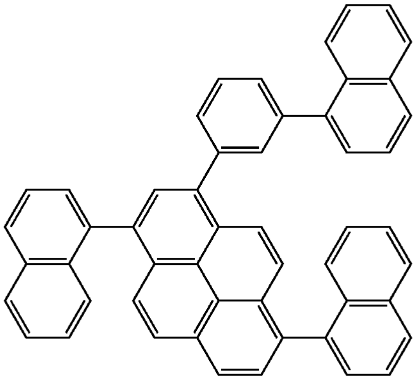
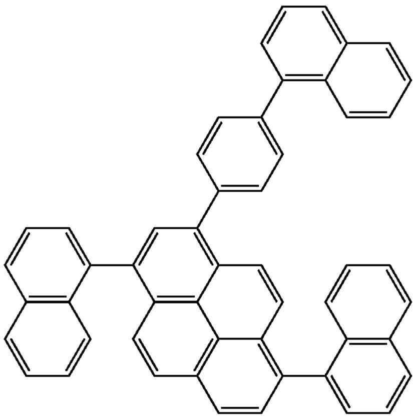

-continued
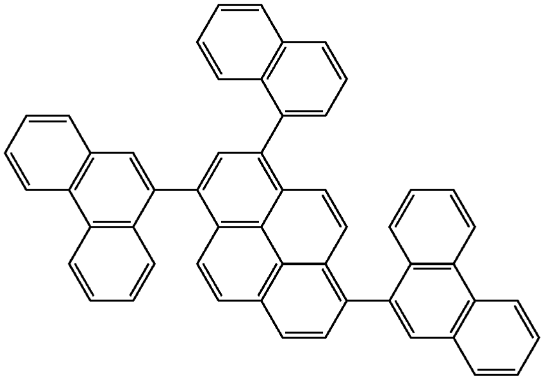
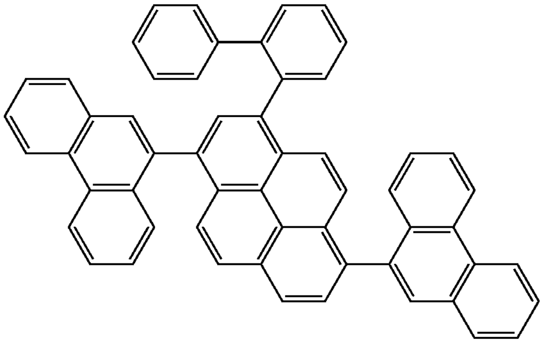
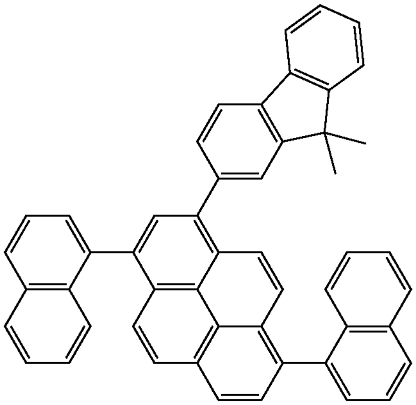
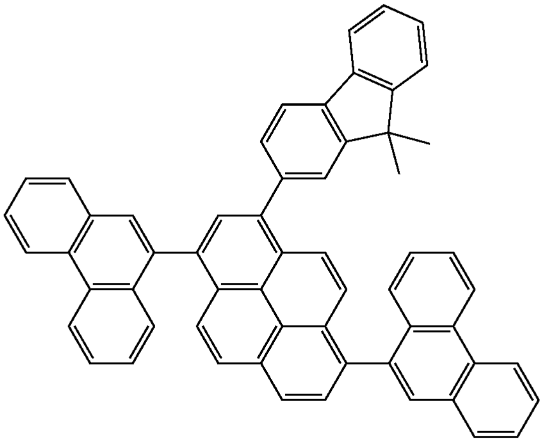
[Formula 60]
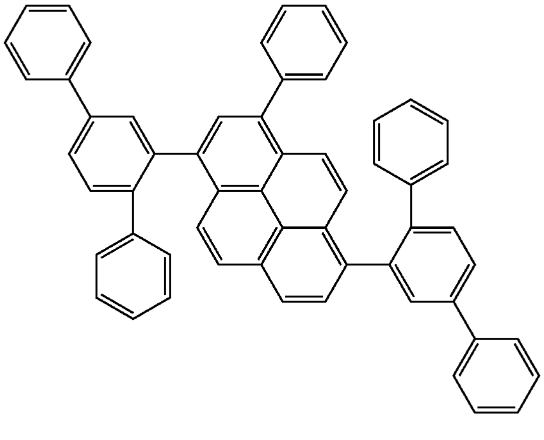
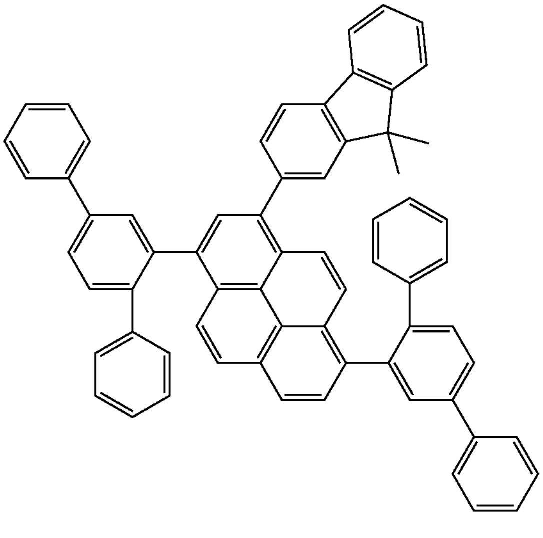

-continued
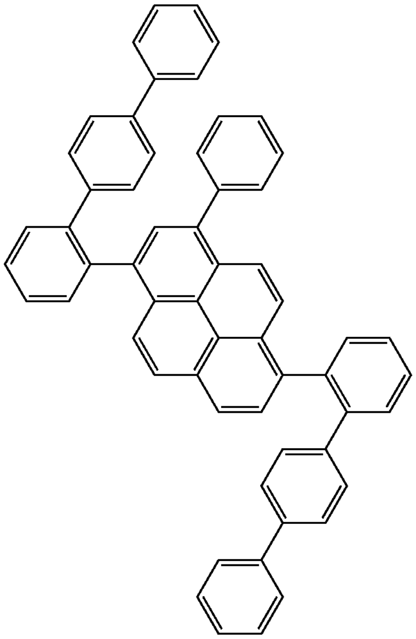
[Formula 61]
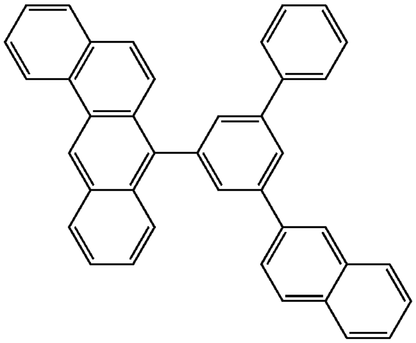
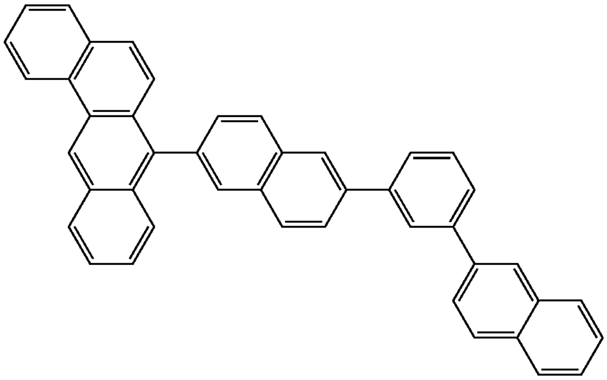
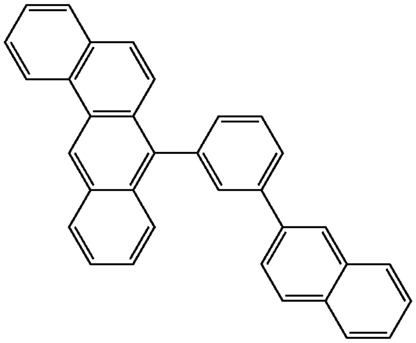
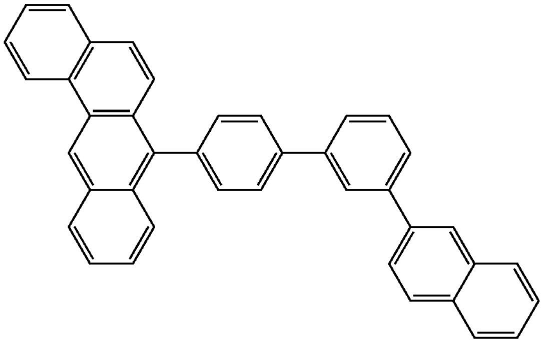

-continued
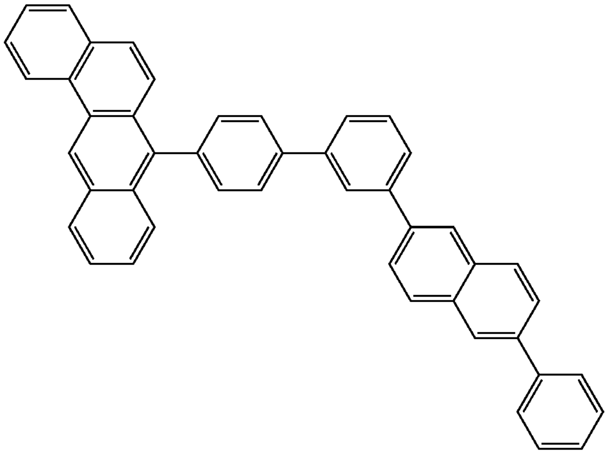
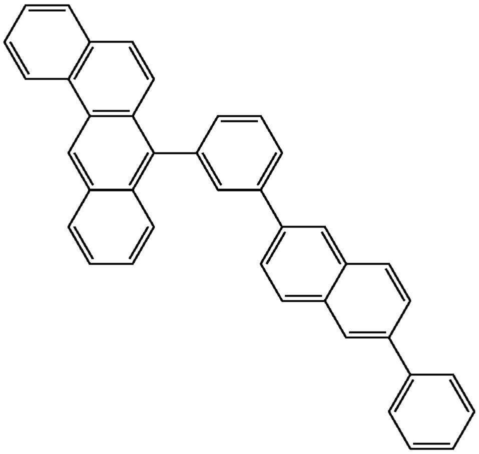
[Formula 62]
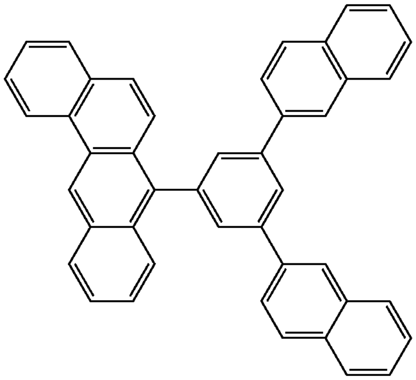
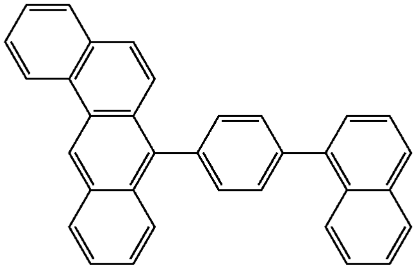
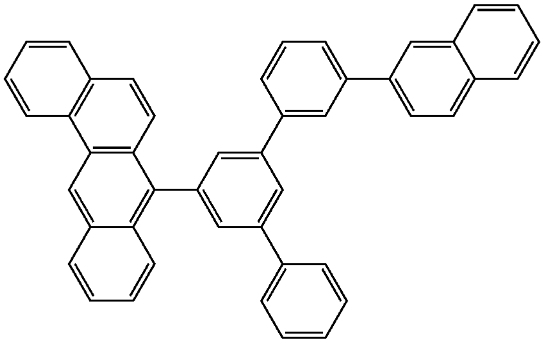
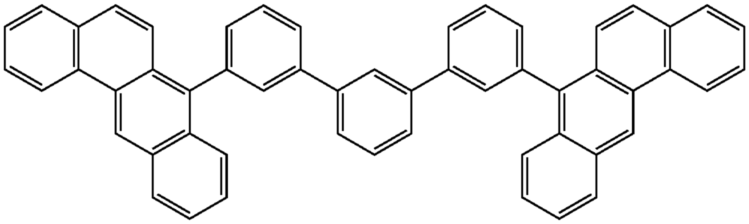
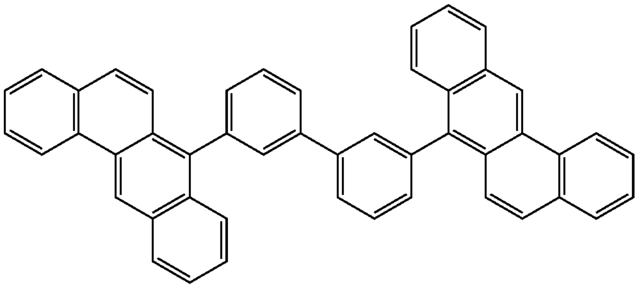

-continued
[Formula 63]
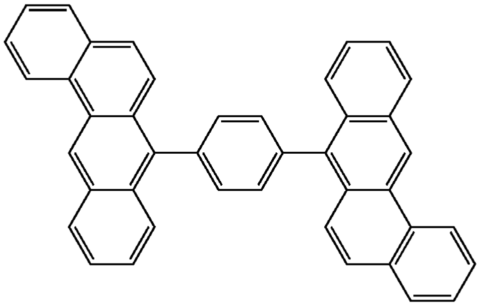
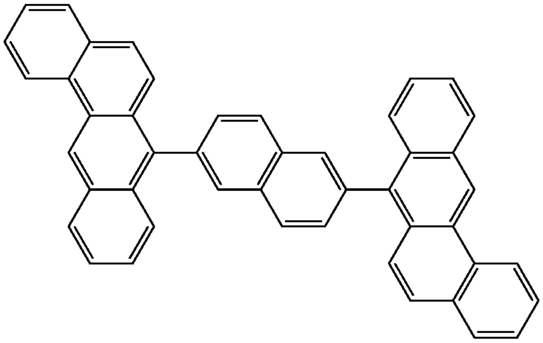
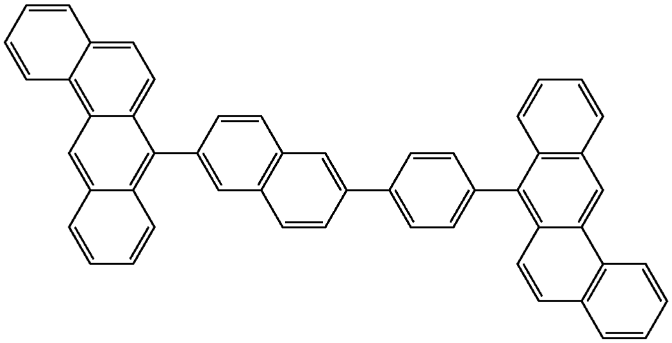
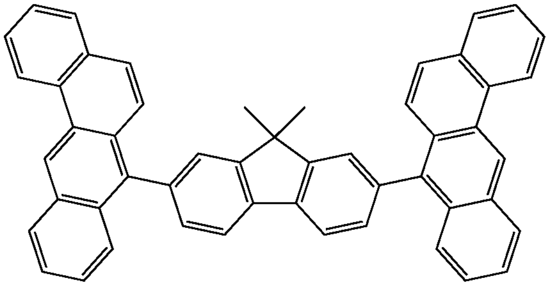
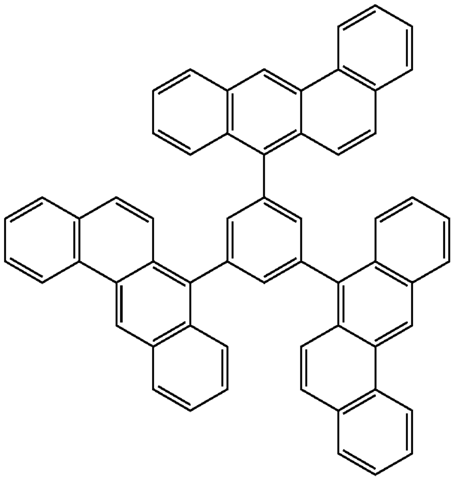
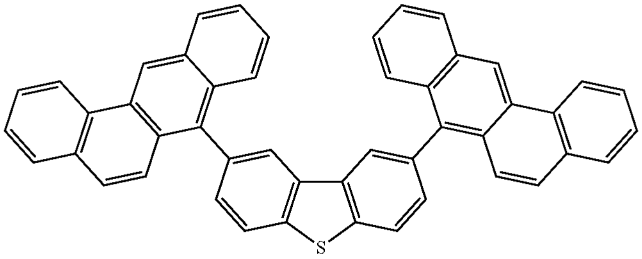

-continued
[Formula 64]
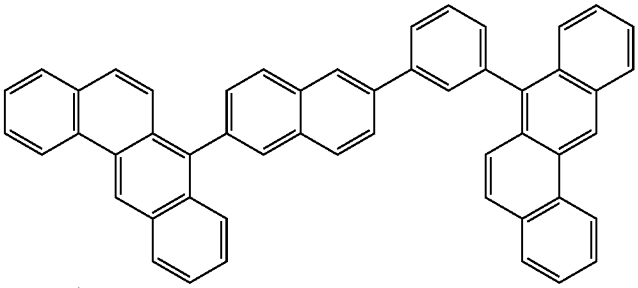
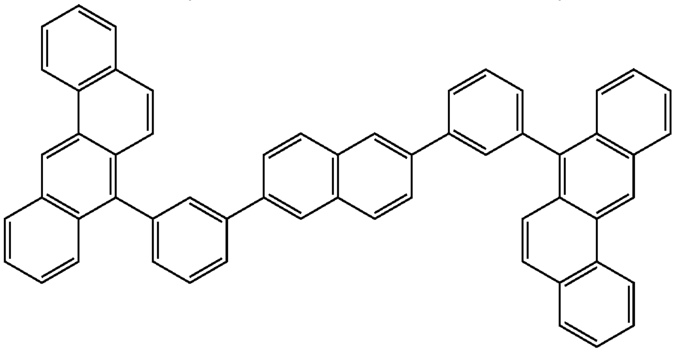
[Formula 65]
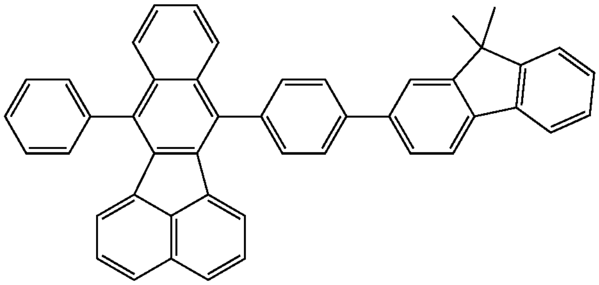
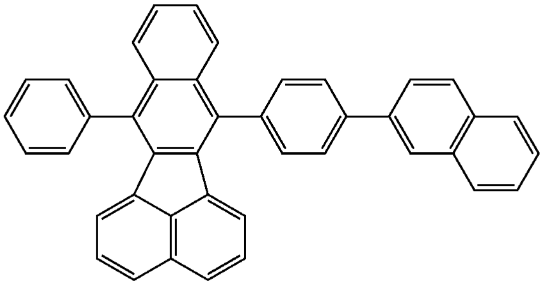
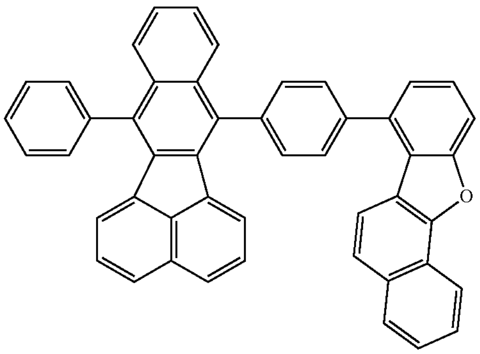
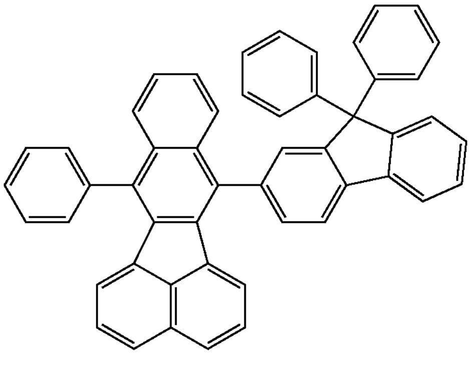

-continued
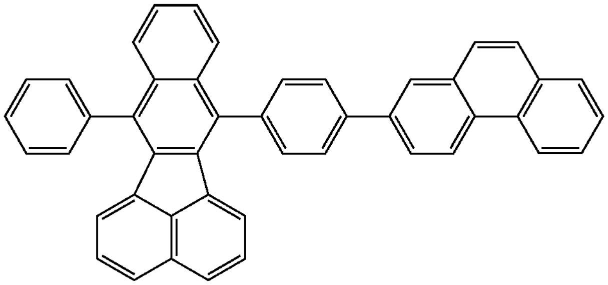
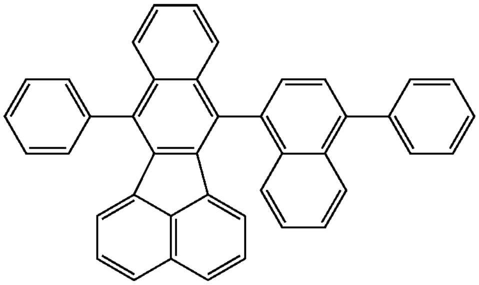
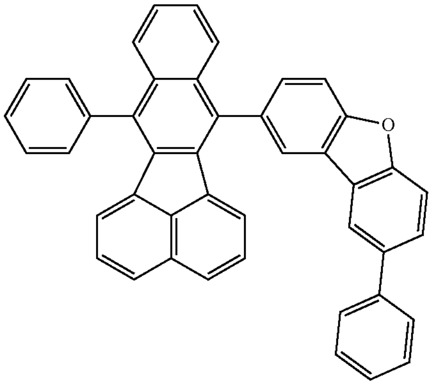
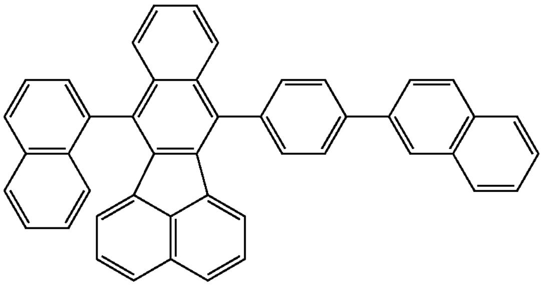
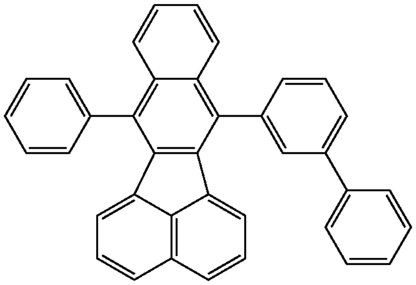
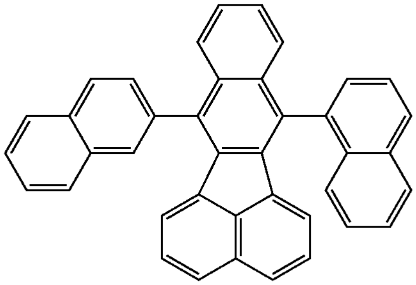
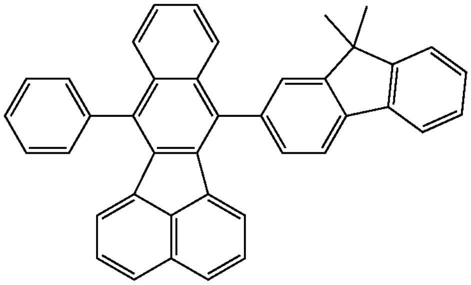
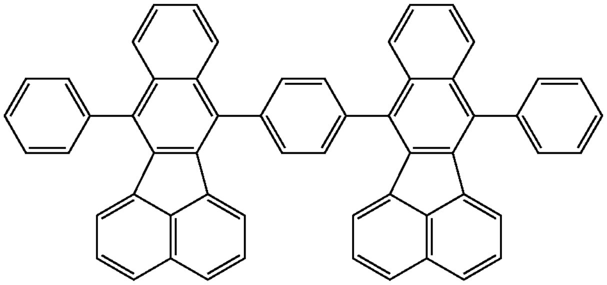
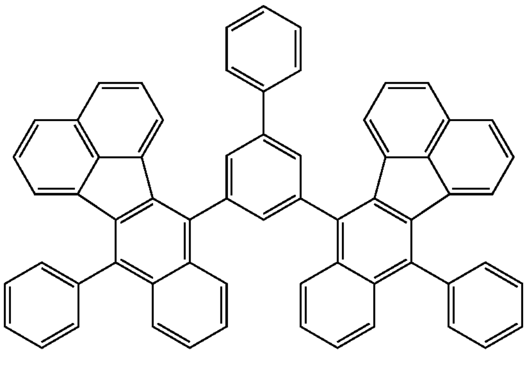
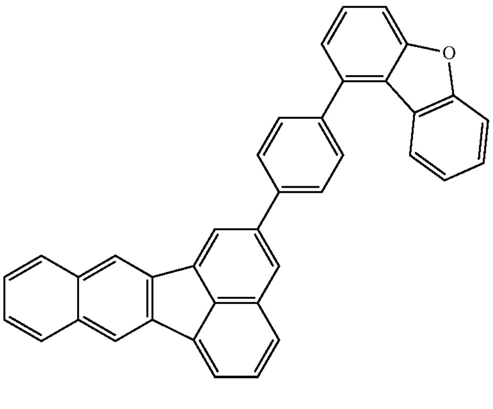

-continued
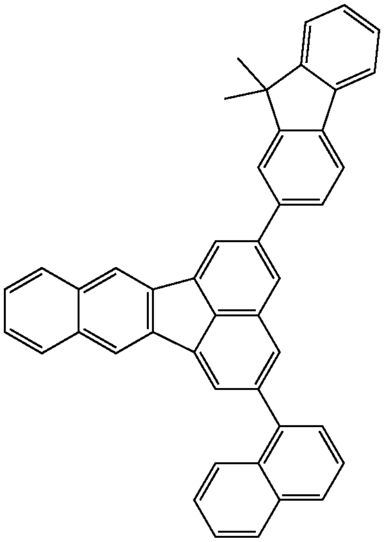
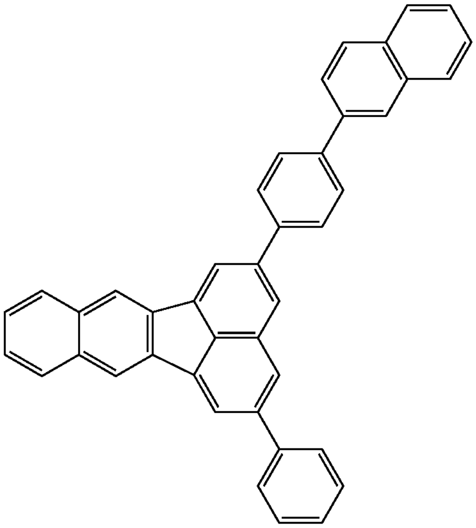
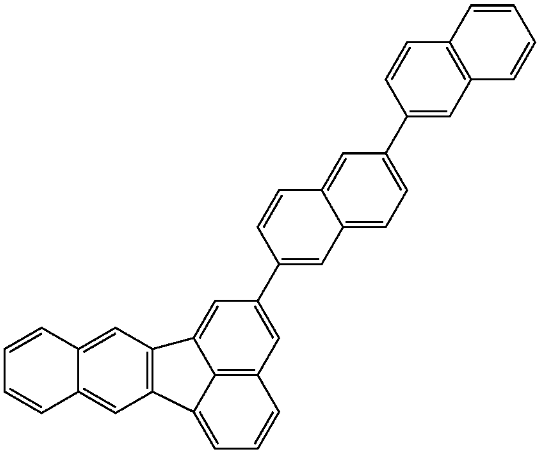
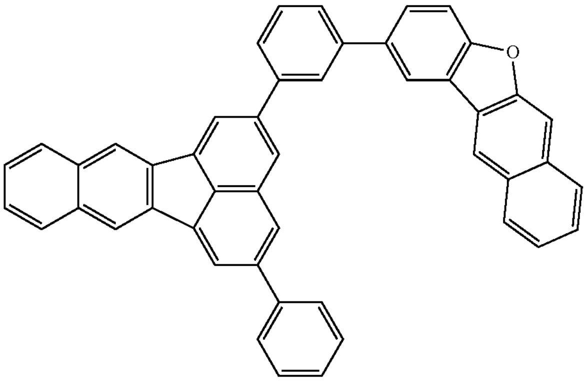
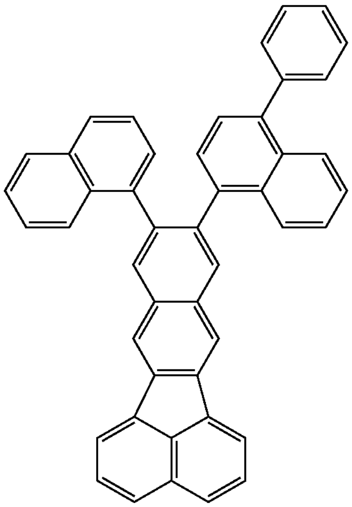
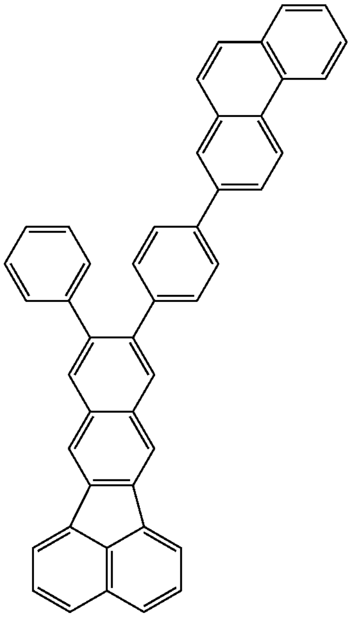

-continued
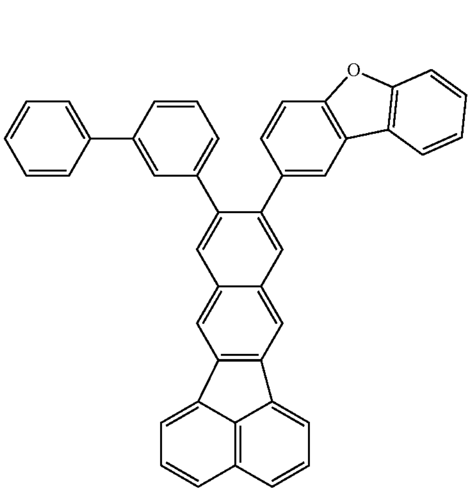
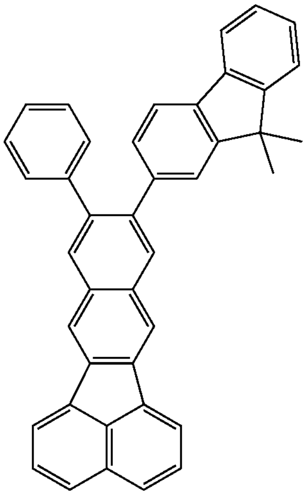
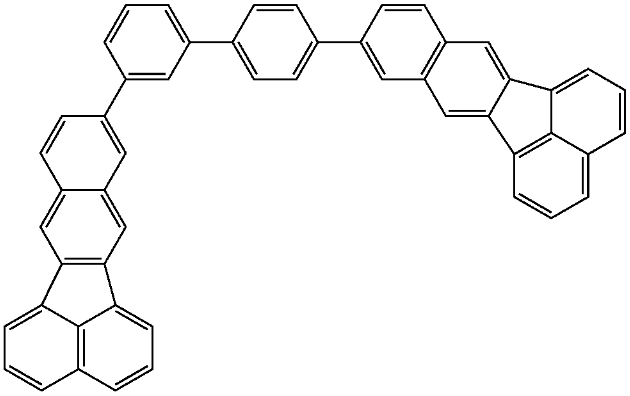
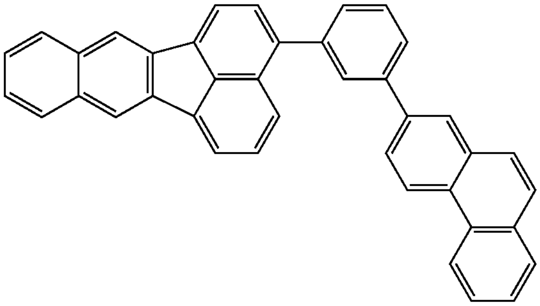
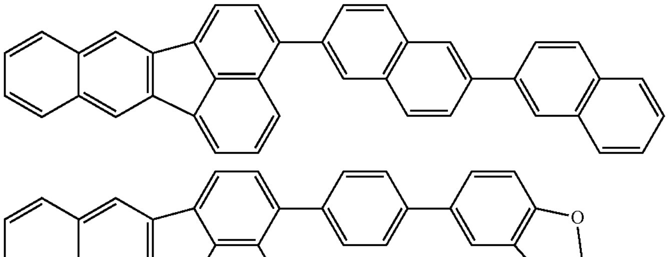
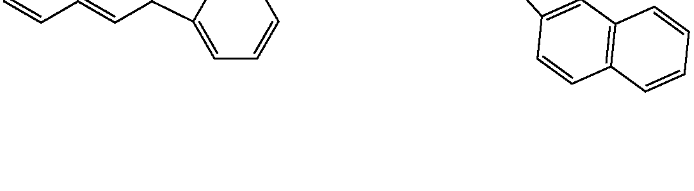

-continued
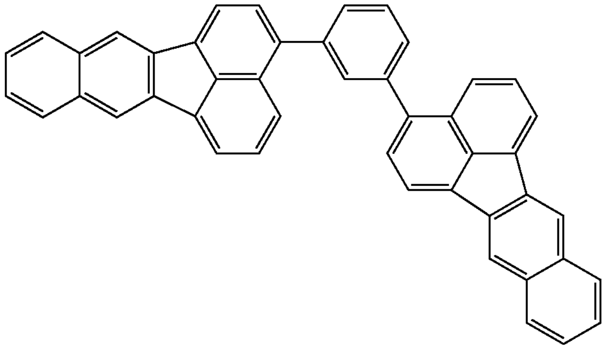
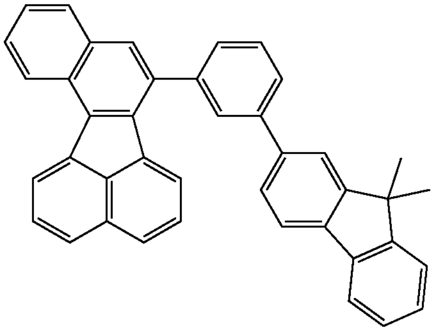
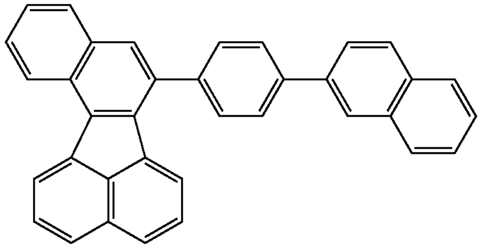
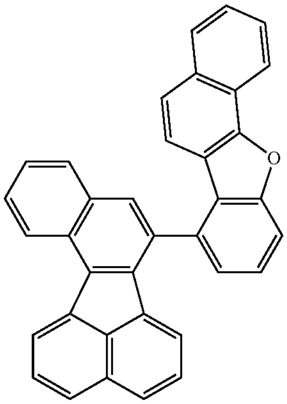
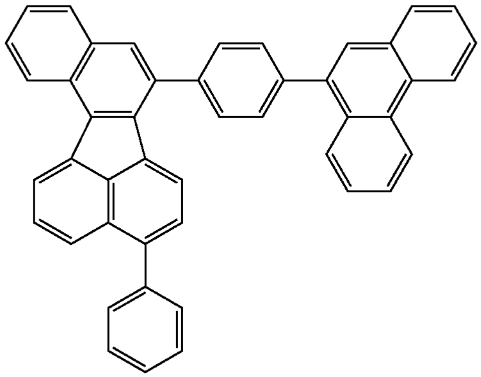
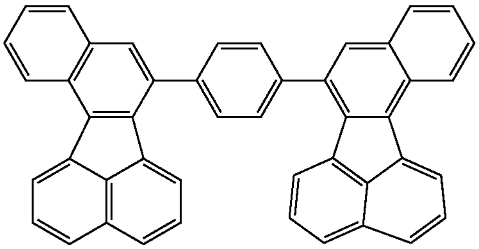
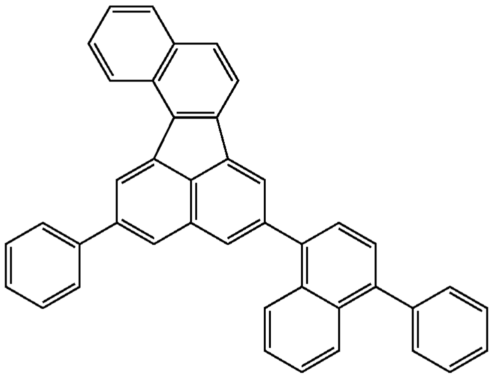
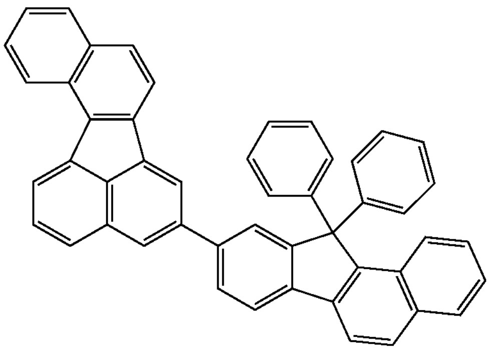

-continued
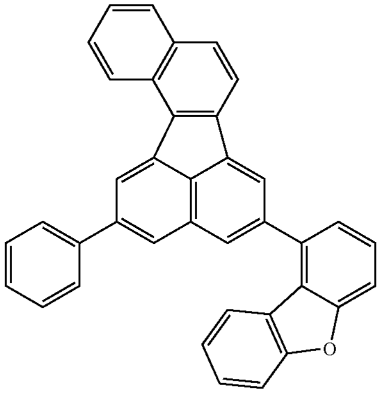
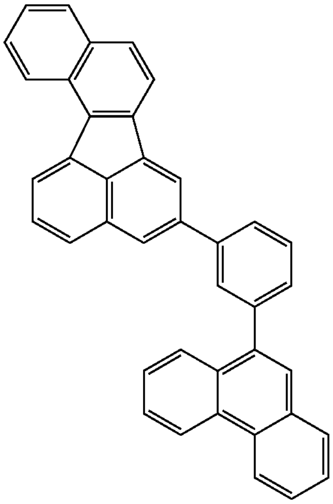
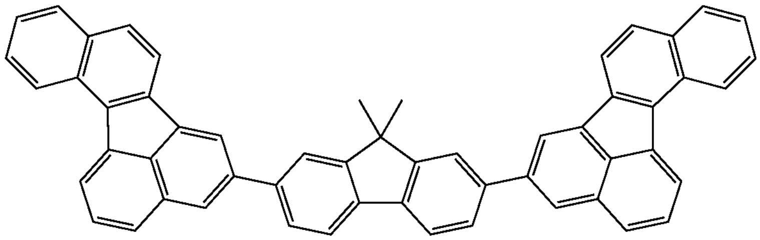
[Formula 66]
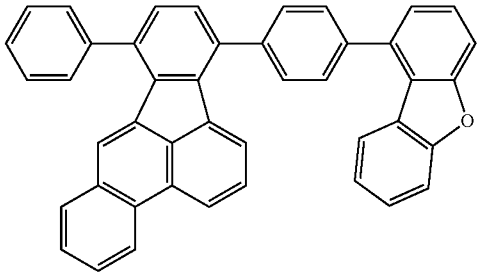
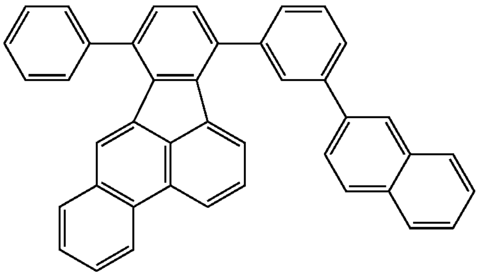
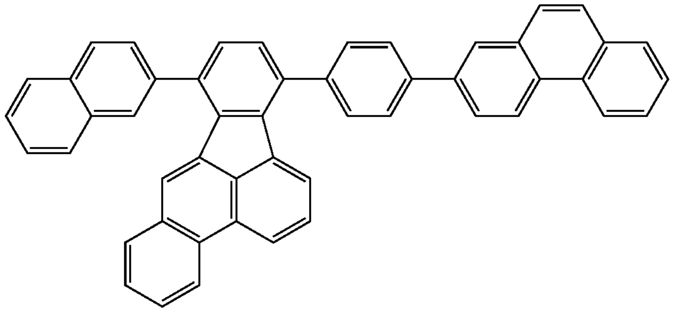
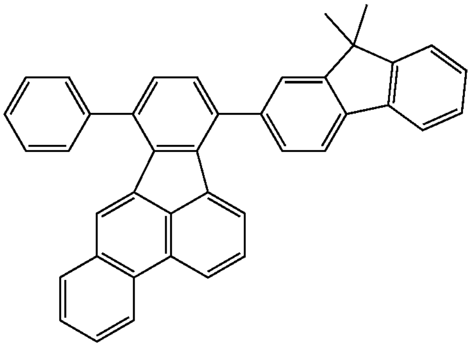

-continued
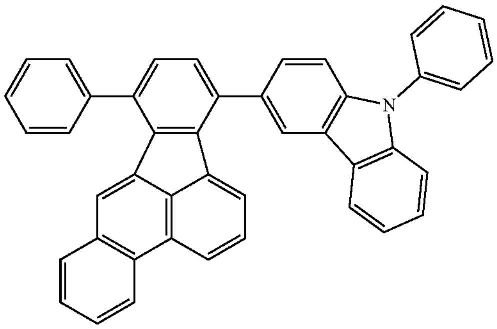
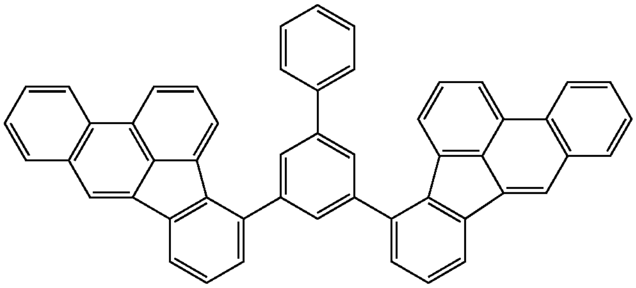
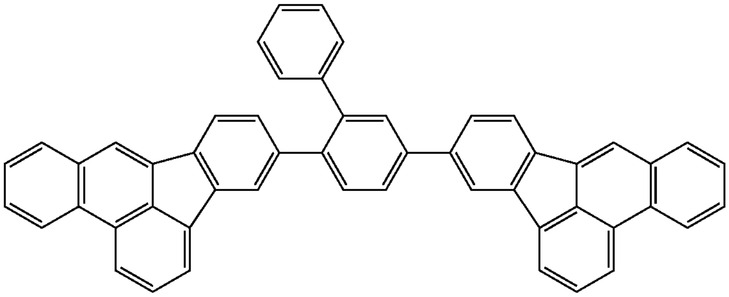
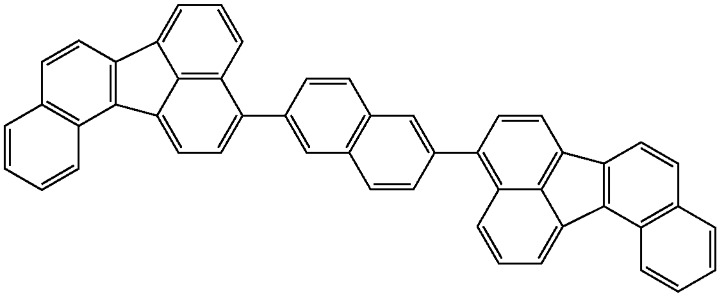
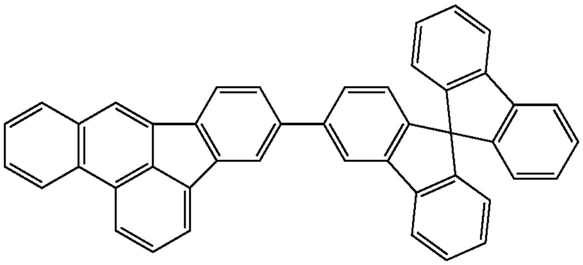
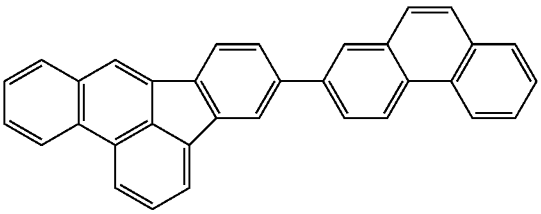
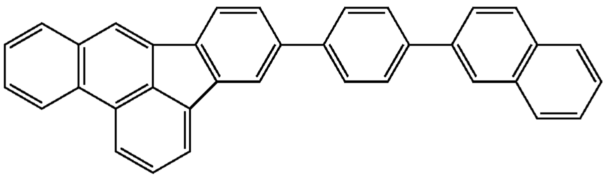
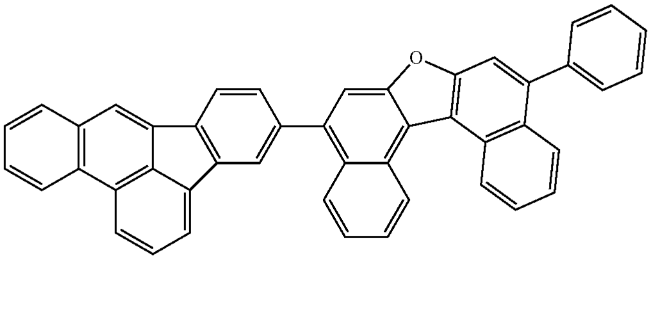

-continued
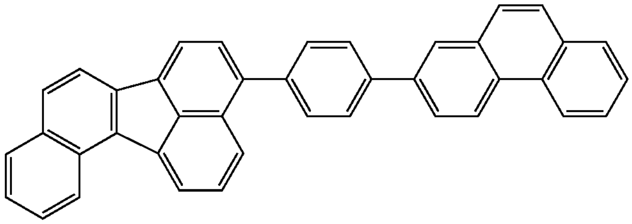
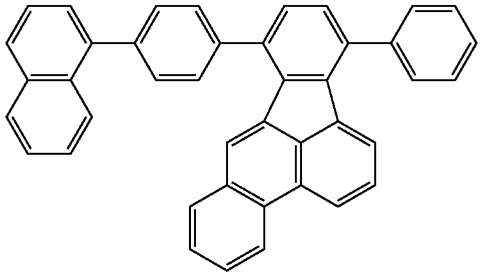
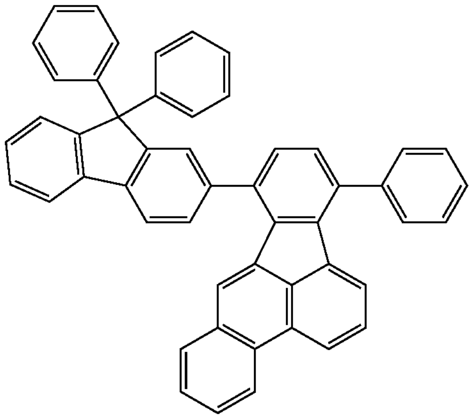
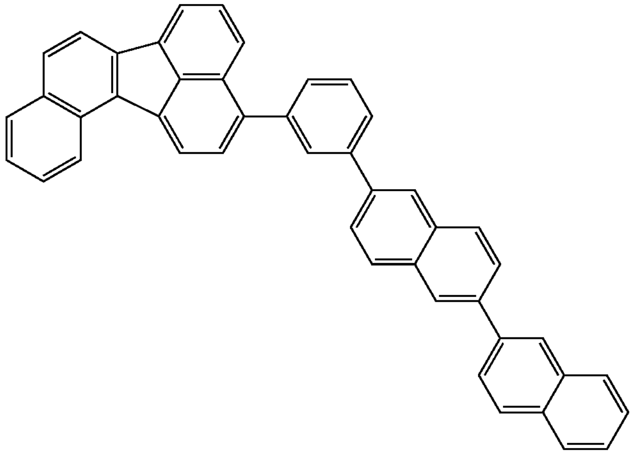
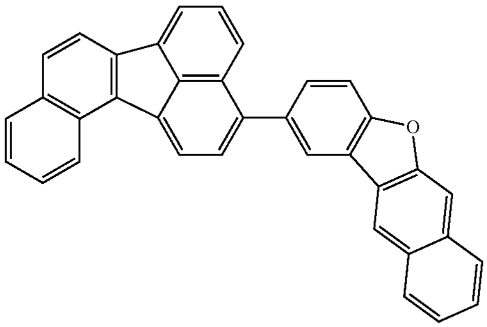
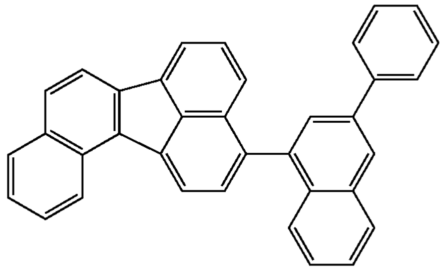
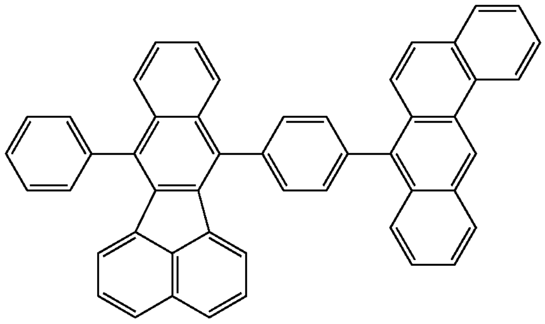
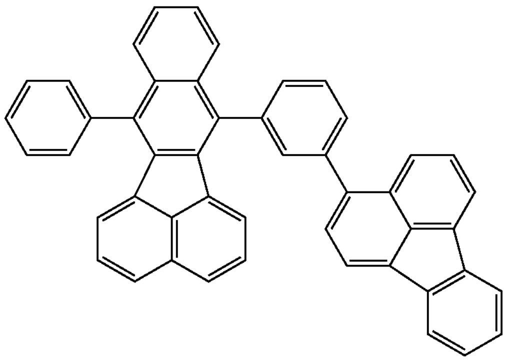

-continued
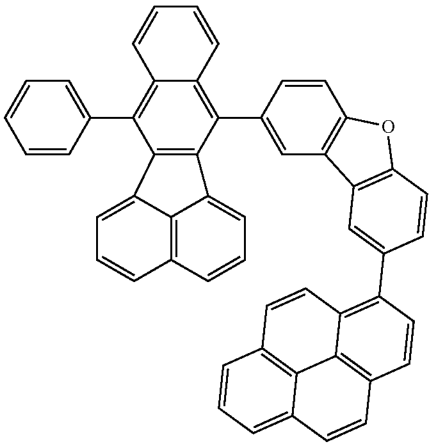
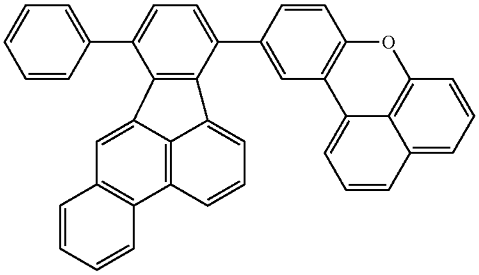
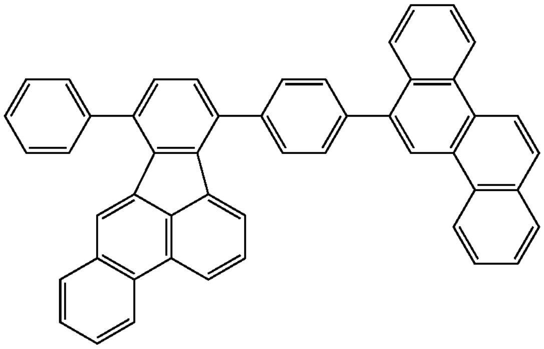
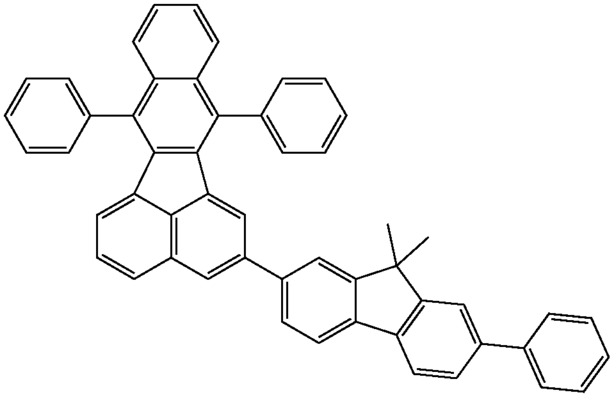
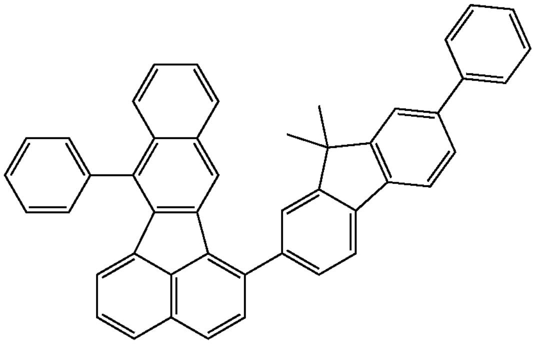
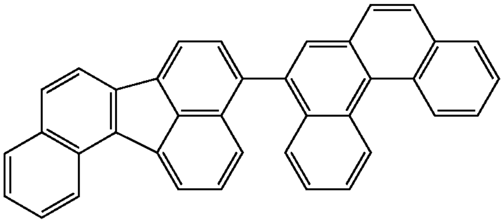

-continued
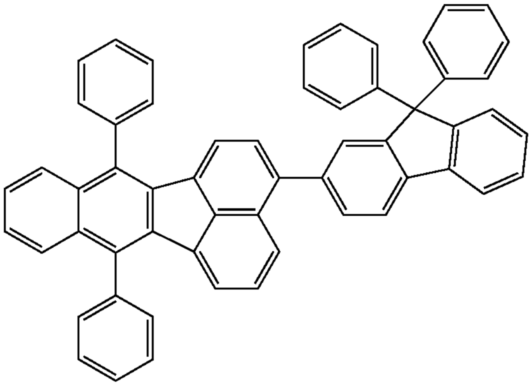
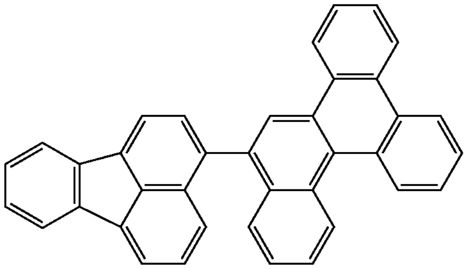
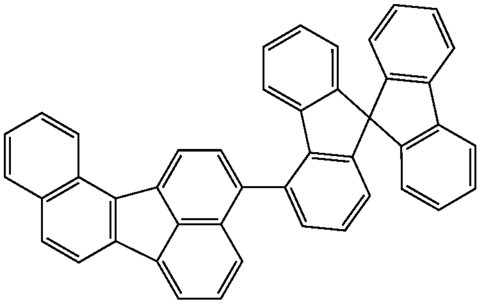
[Formula 67]
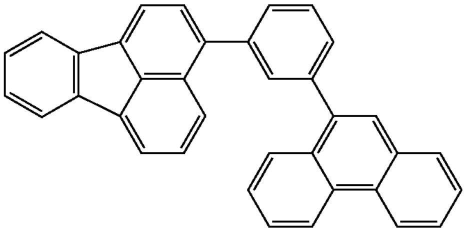
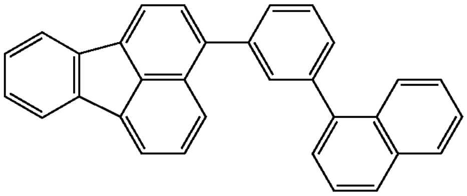
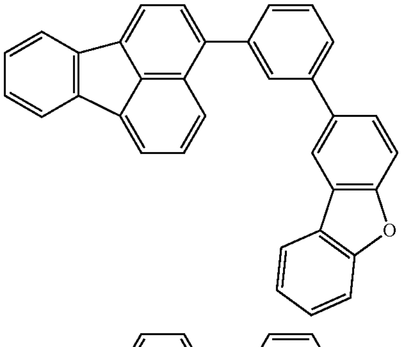
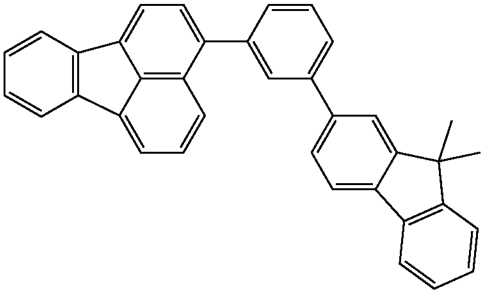
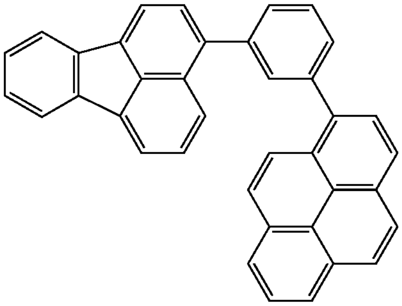
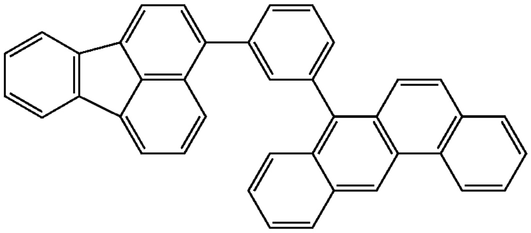

-continued
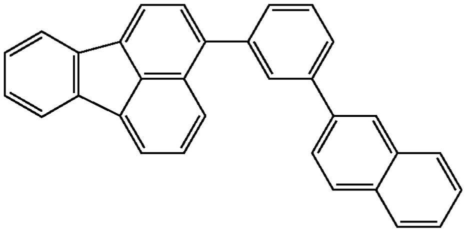
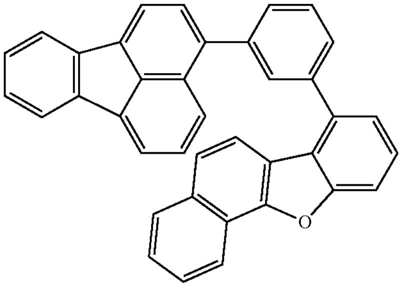
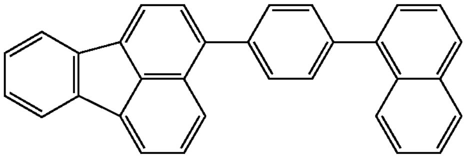
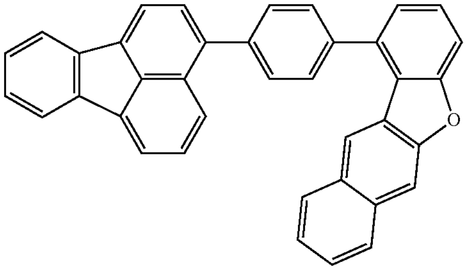
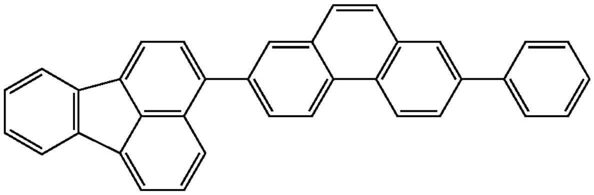
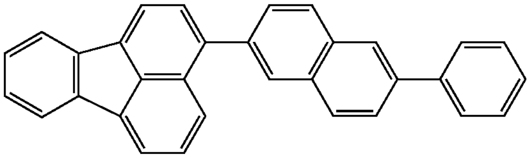
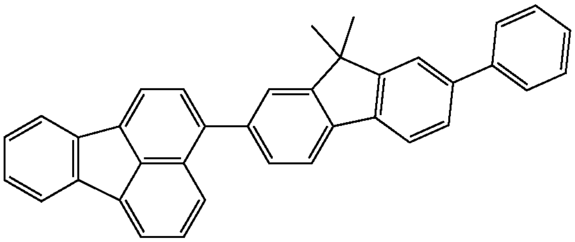
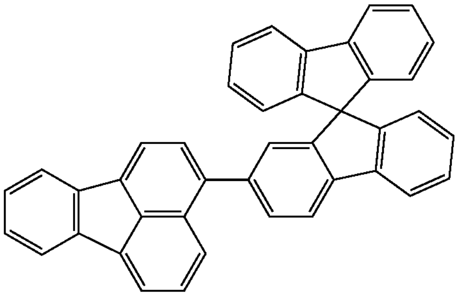
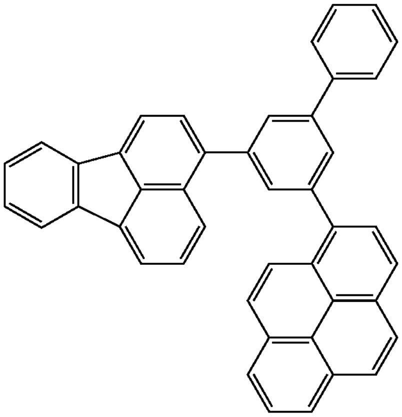
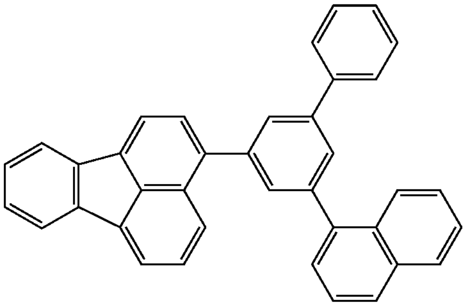
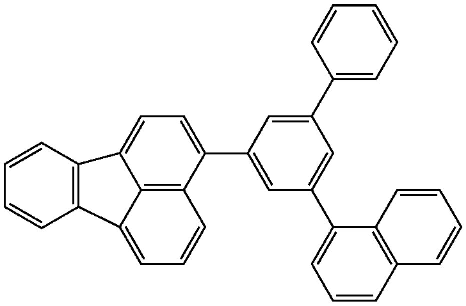

-continued
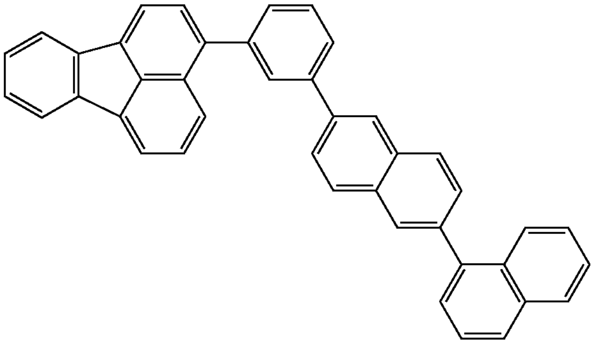
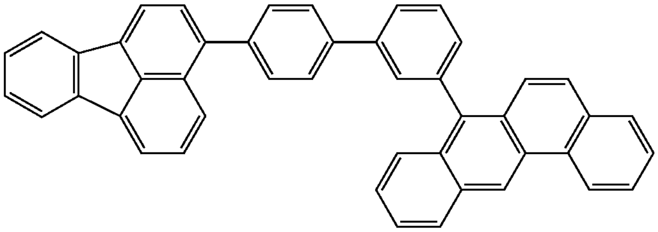
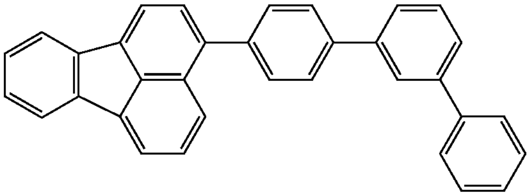
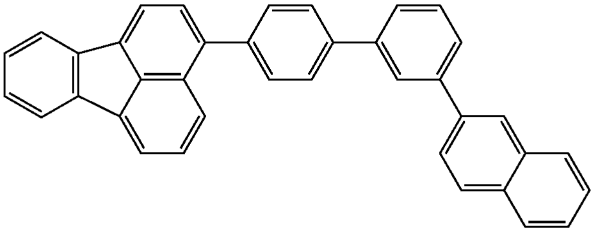
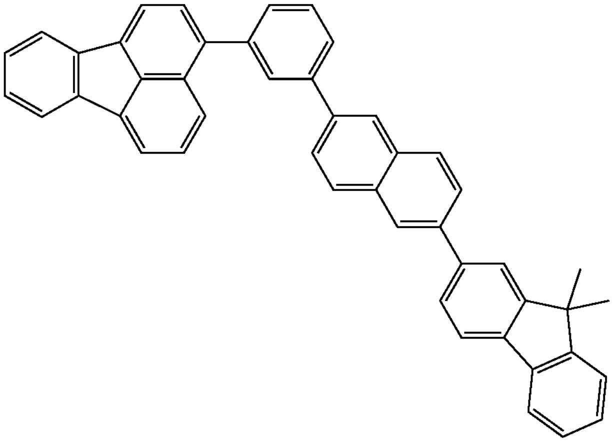
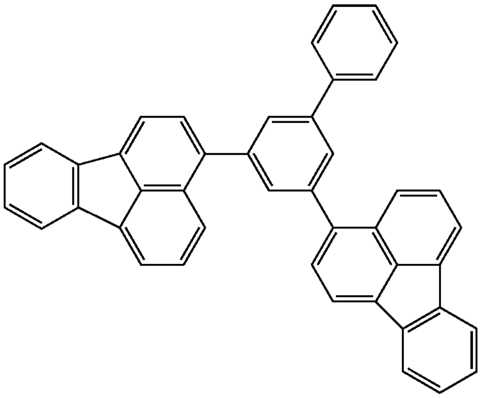
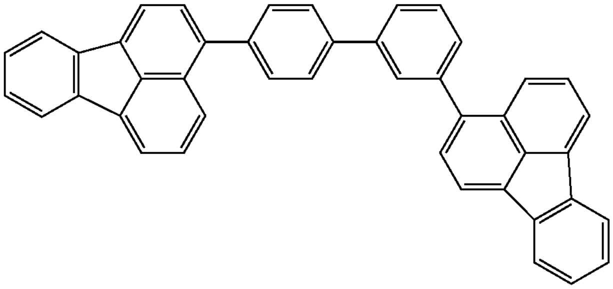
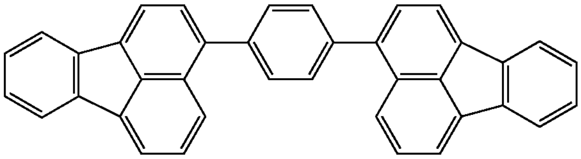

-continued
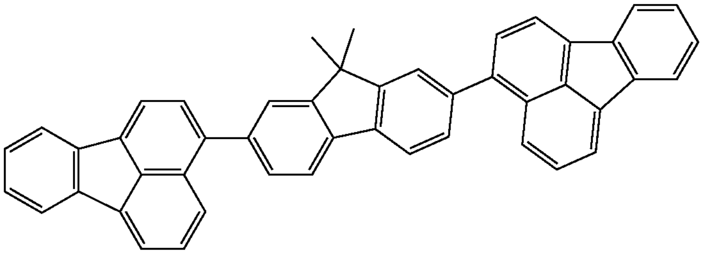
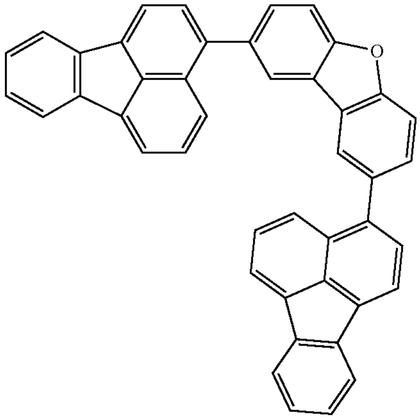
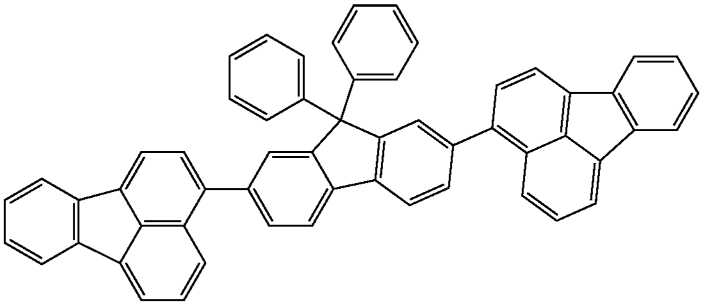
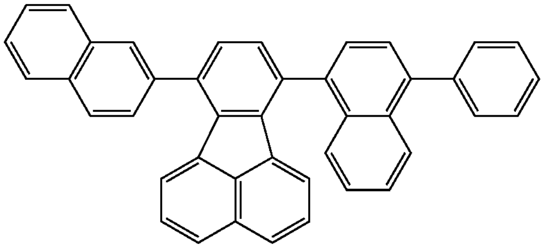
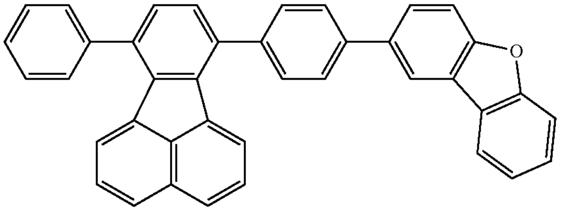
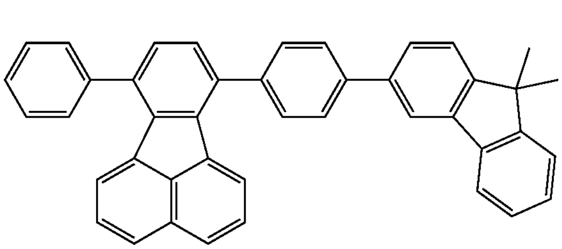
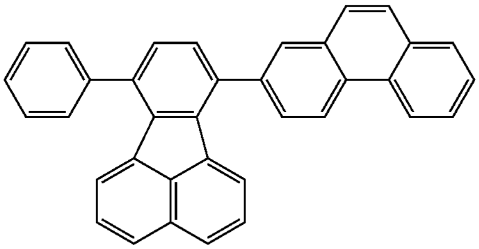
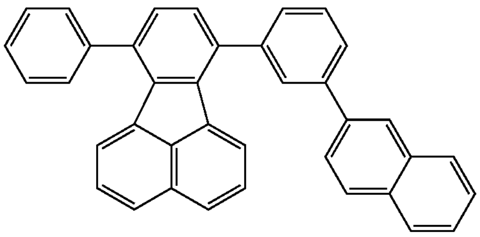
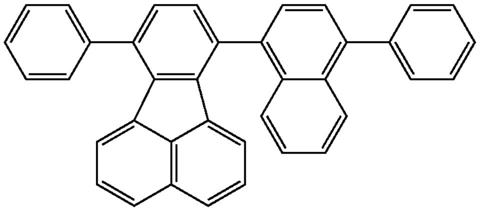
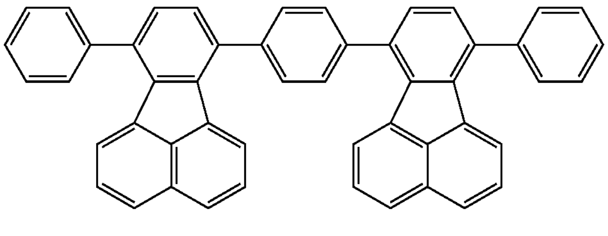

-continued
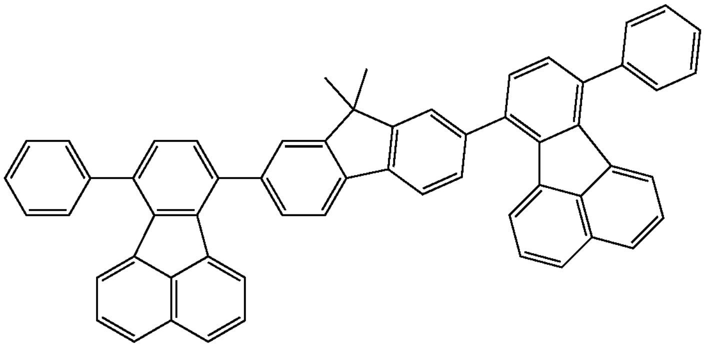
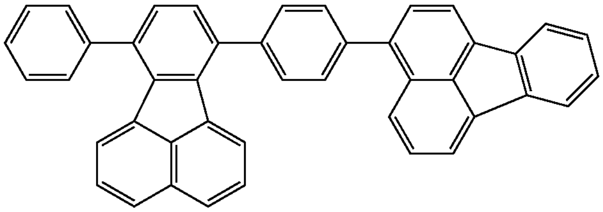
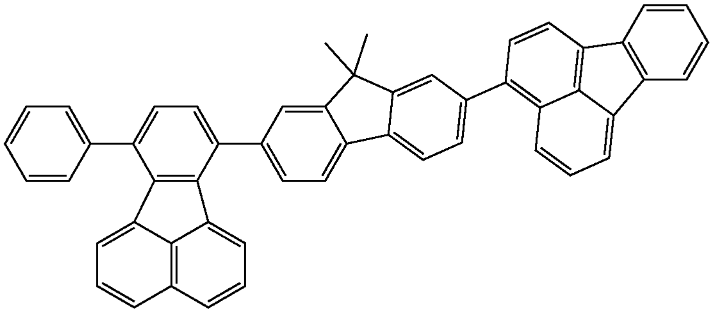
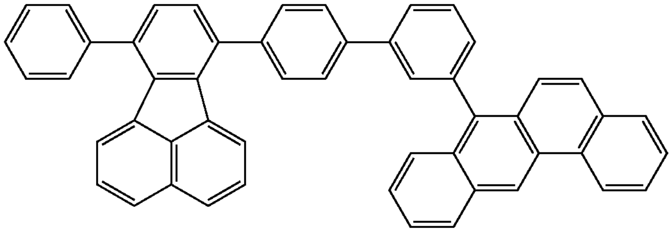
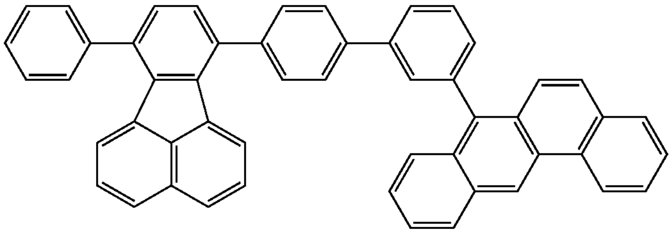
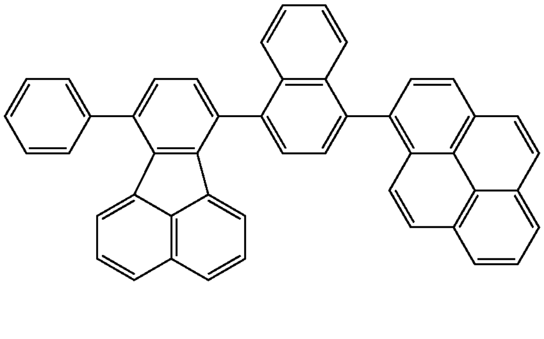
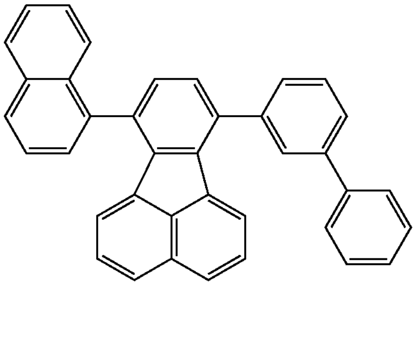

-continued
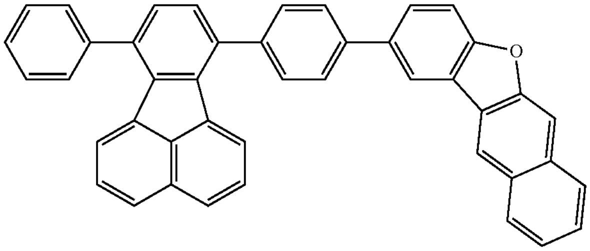
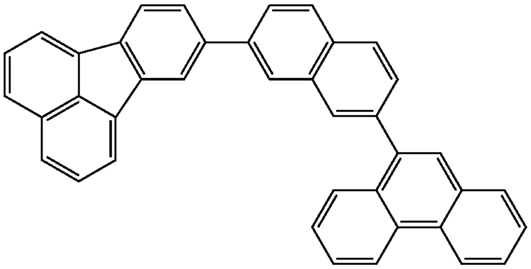
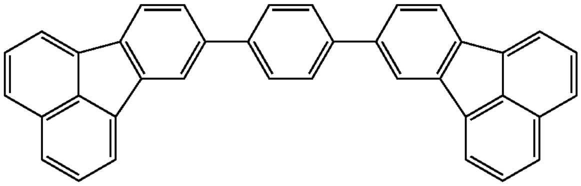
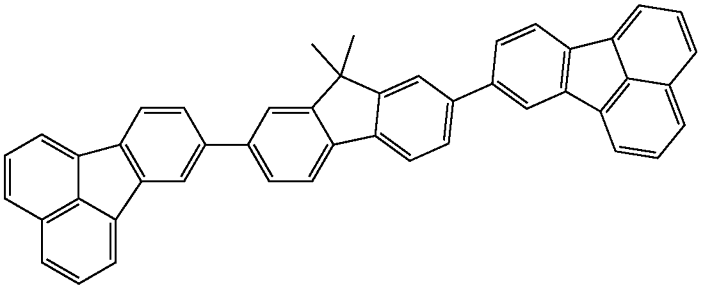
[Formula 68]
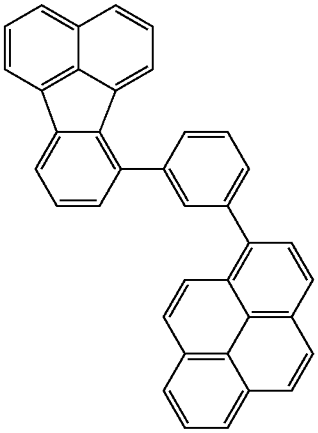
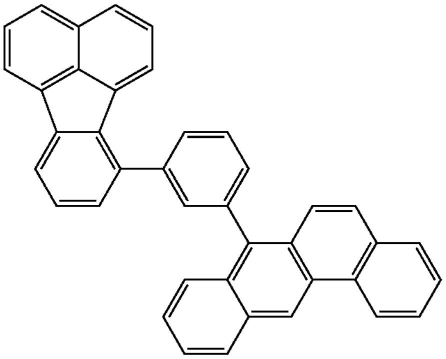
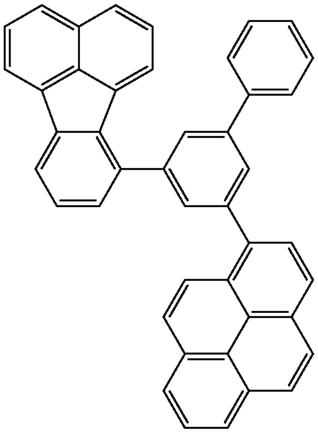
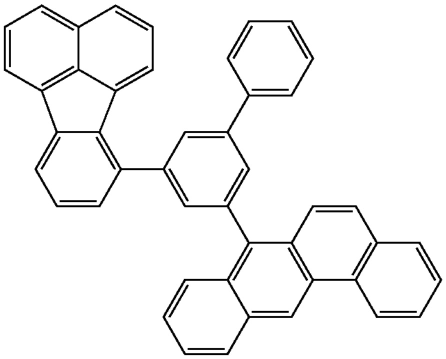
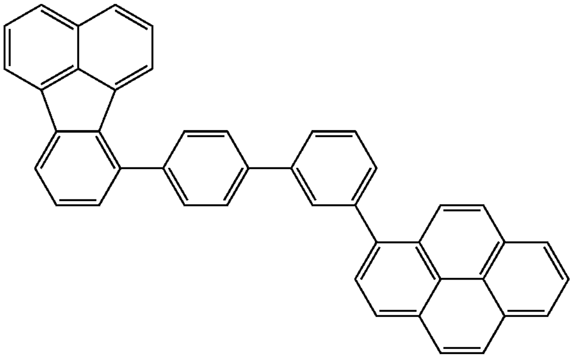

-continued
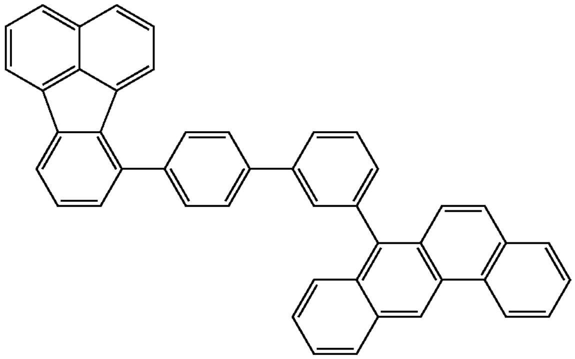
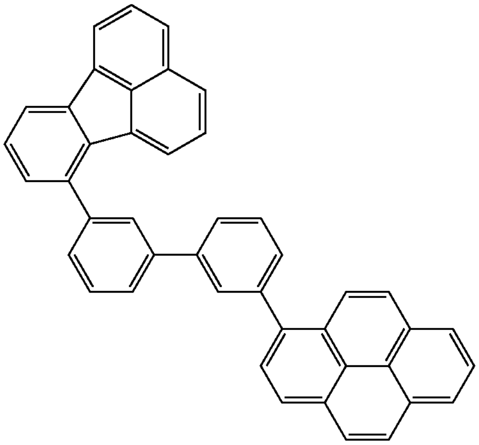
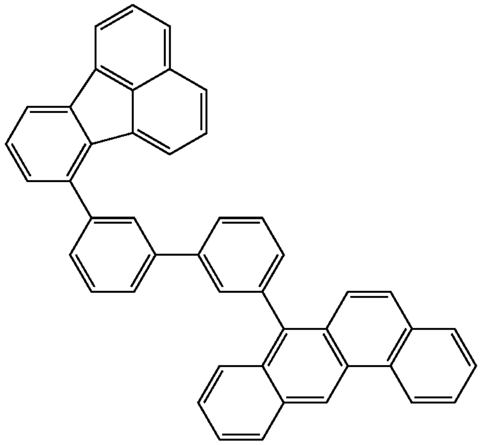
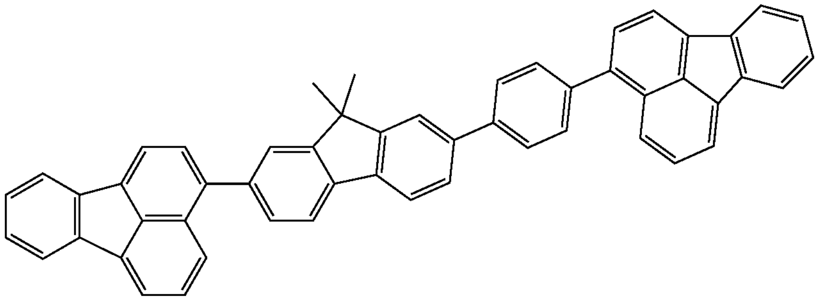
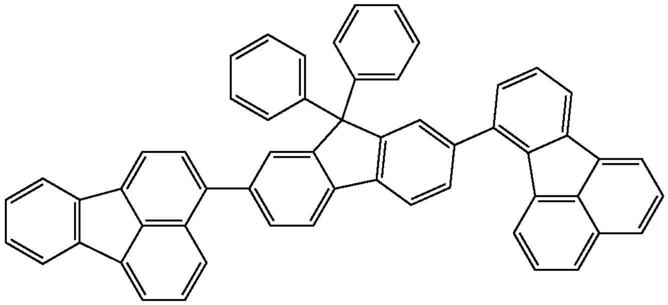
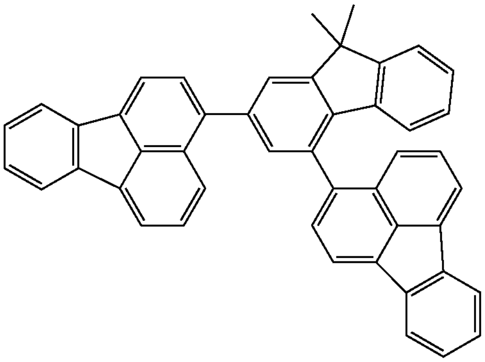

-continued
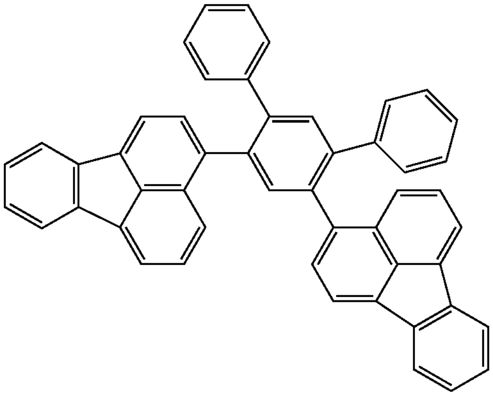
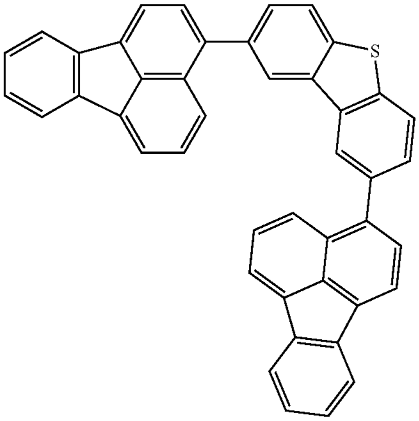
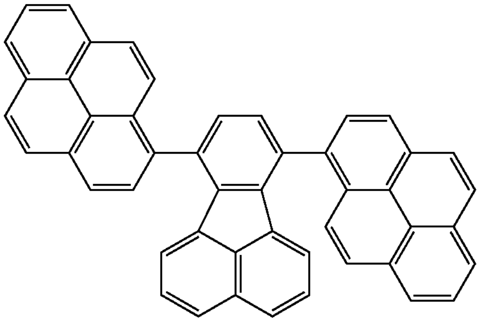
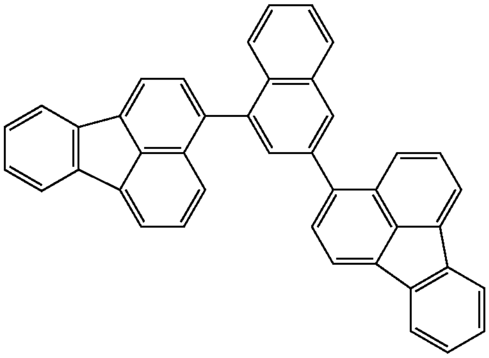
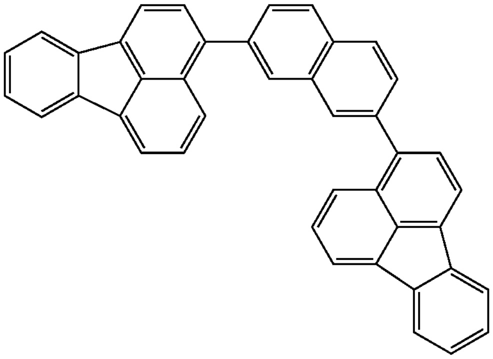
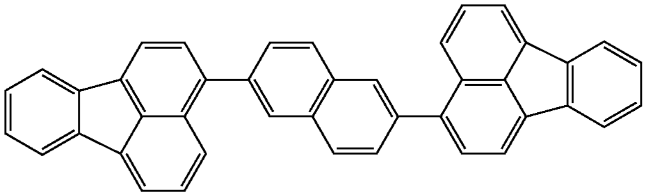
[Formula 69]
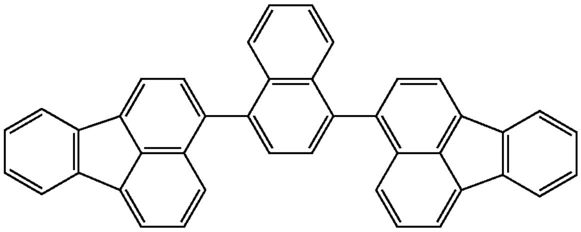
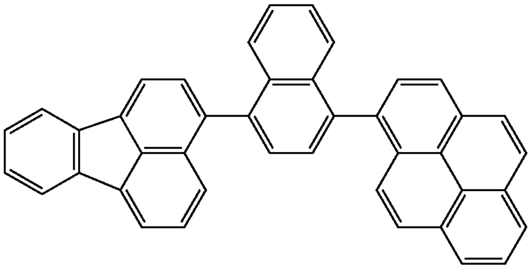

-continued
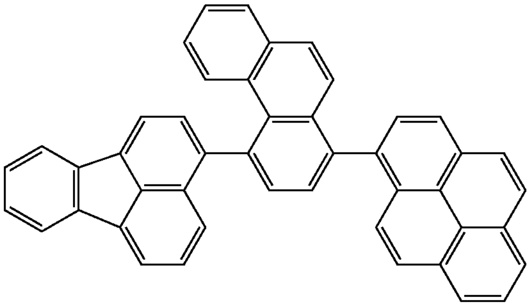
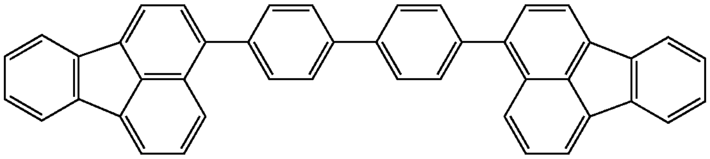
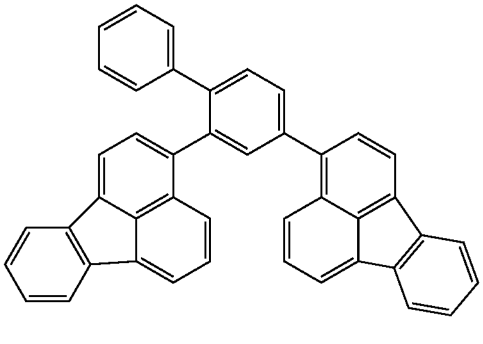
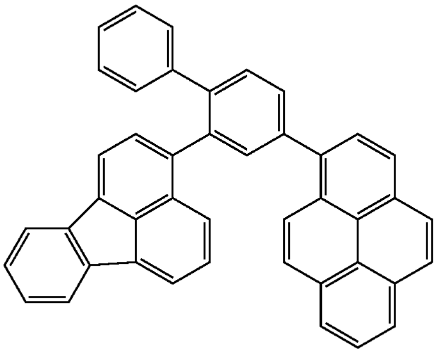
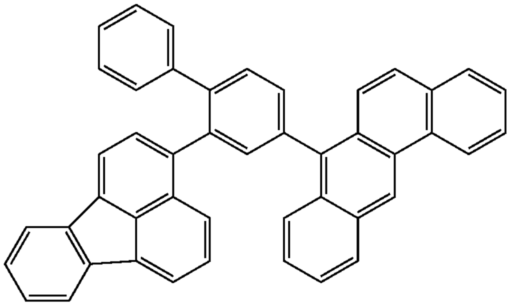
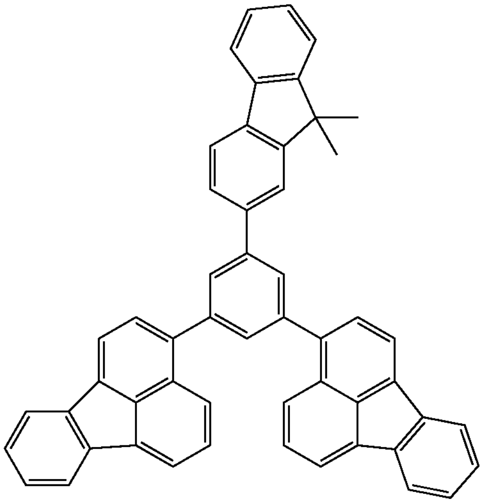

-continued
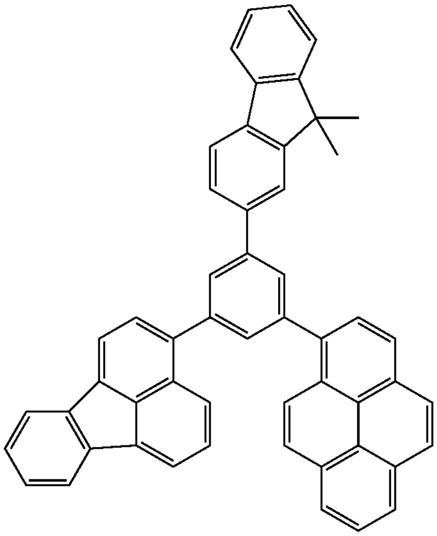
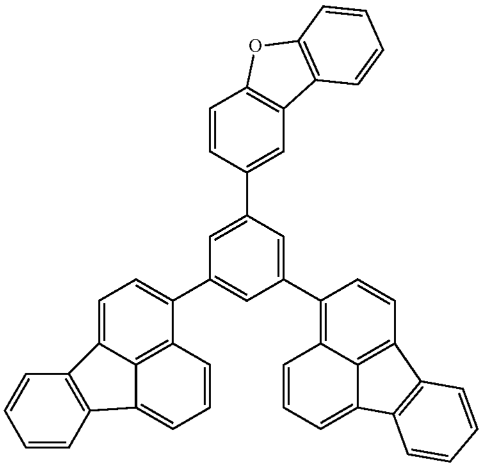
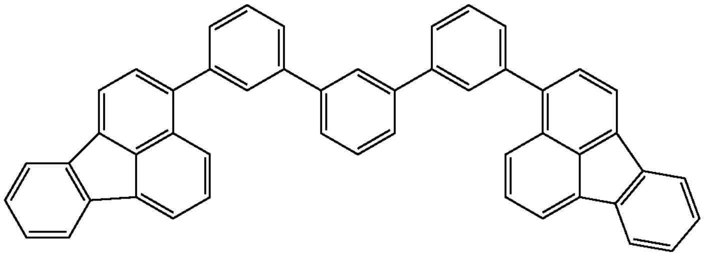
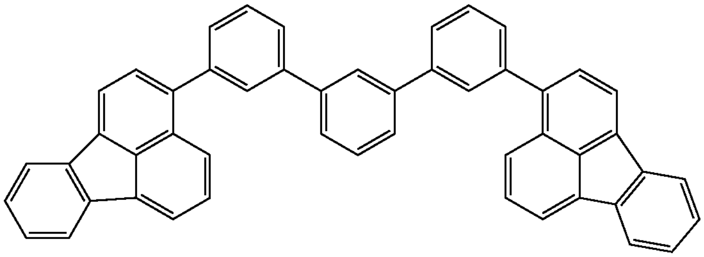
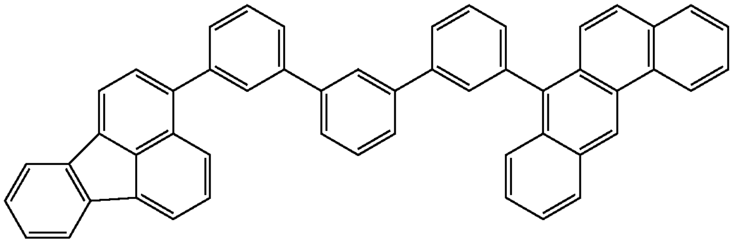
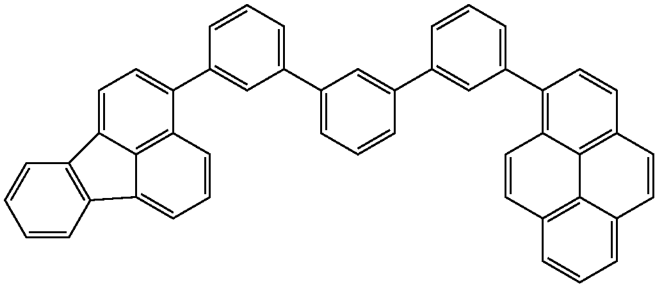

-continued
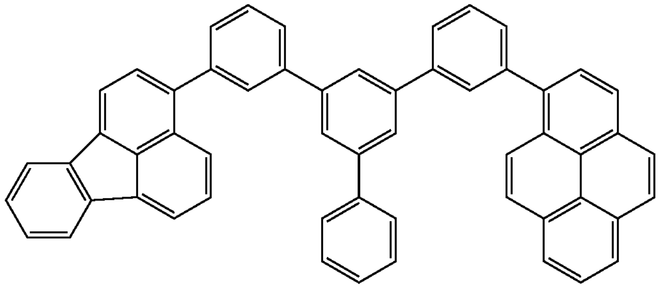
[Formula 70]
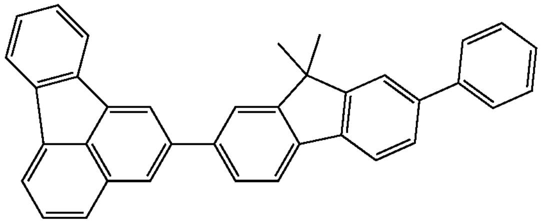
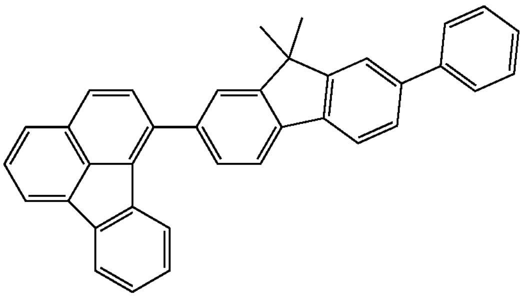
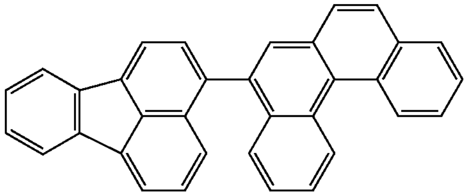
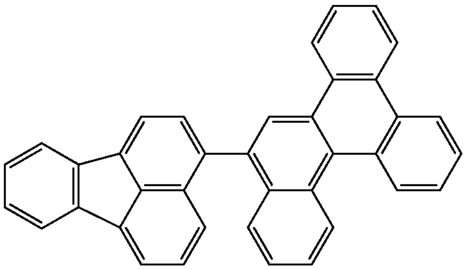
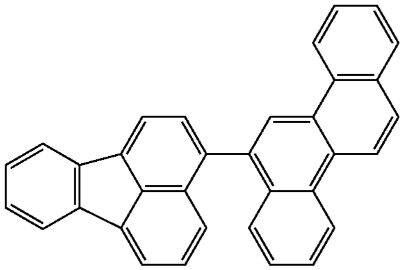
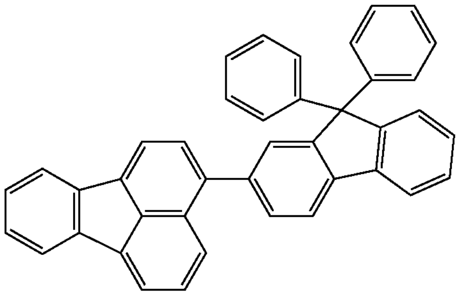
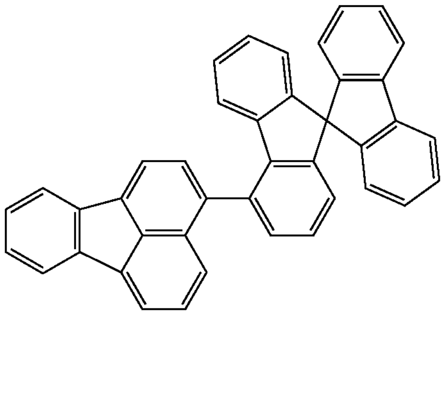
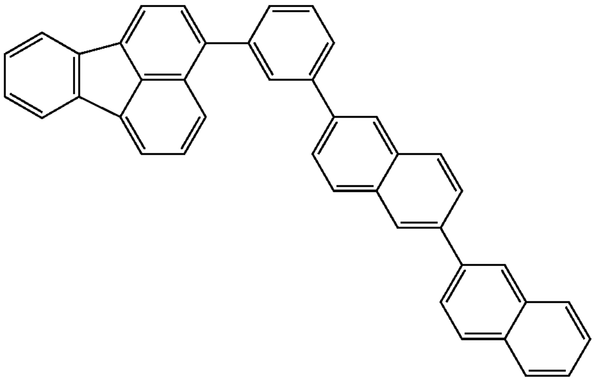

-continued
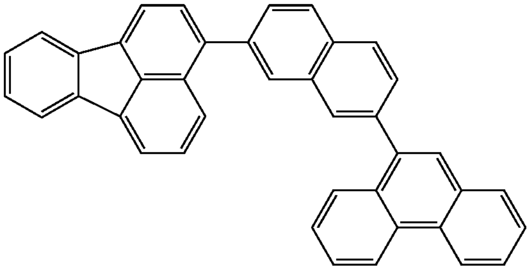
[Formula 71]
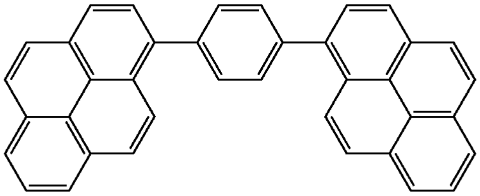
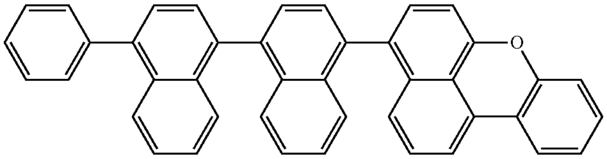
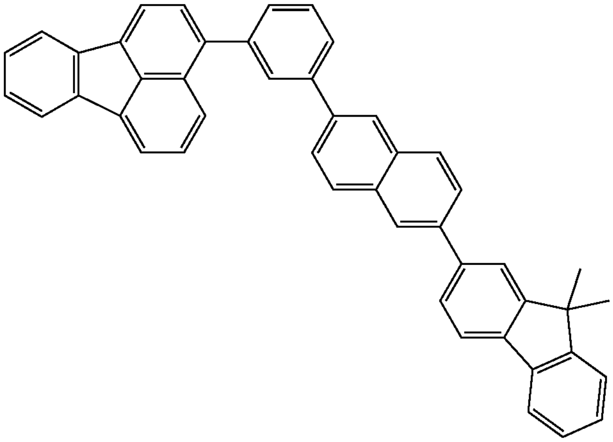
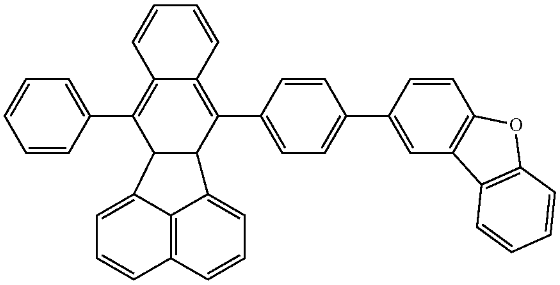
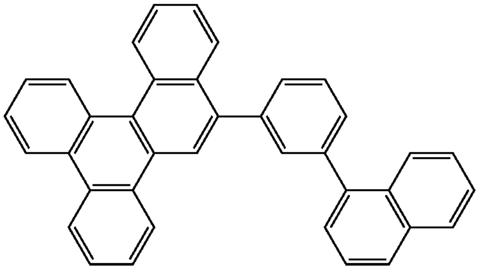
[Formula 72]
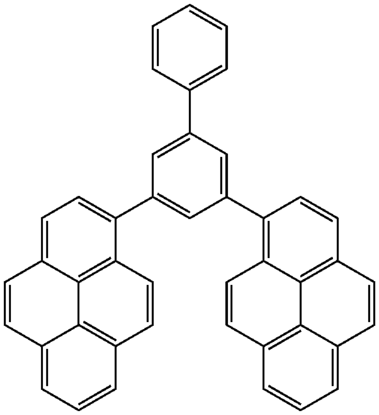
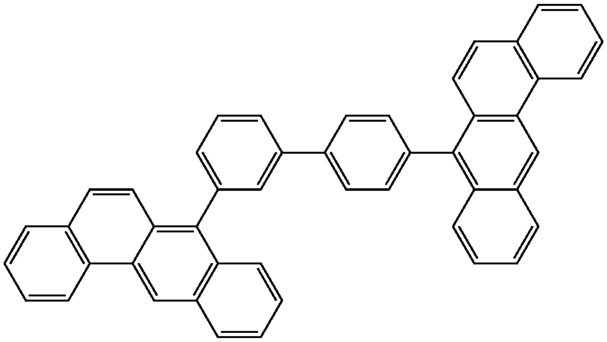

Second Compound

In the organic EL device of the exemplary embodiment, the second compound is a compound represented by a formula (2) below. In the organic EL device of the exemplary embodiment, the second host material is also preferably a compound represented by a formula (2) below.

[Formula 73]

(2)

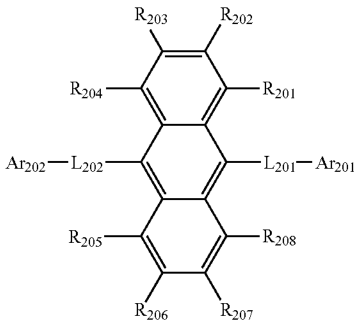

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ to $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the exemplary embodiment: $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, it is preferable that $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group or a nitro group;

$L_{201}$ to $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that $L_{201}$ and $L_{202}$ are each independently a single bond or a substituted or unsubstituted arylene group having 6 to 50 ring carbon atoms; and $Ar_{201}$ and $Ar_{202}$ are each independently a substituted or unsubstituted aryl group having 6 to 50 ring carbon atoms.

In the organic EL device according to the exemplary embodiment, it is preferable that $Ar_{201}$ and $Ar_{202}$ are each independently a phenyl group, a naphthyl group, phenanthryl group, a biphenyl group, a terphenyl group, a diphenylfluorenyl group, a dimethylfluorenyl group, benzodiphenylfluorenyl group, a benzodimethylfluorenyl group, a dibenzofuranyl group, a dibenzothienyl group, a naphthobenzofuranyl group, or a naphthobenzothienyl group.

In the organic EL device according to the exemplary embodiment, the second compound represented by the formula (2) is preferably a compound represented by a formula (201), (202), (203), (204), (205), (206), (207), (208) or (209).

[Formula 74]
(201)
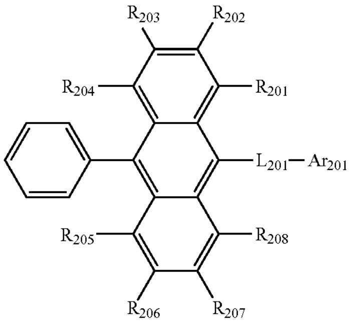
[Formula 75]
(202)
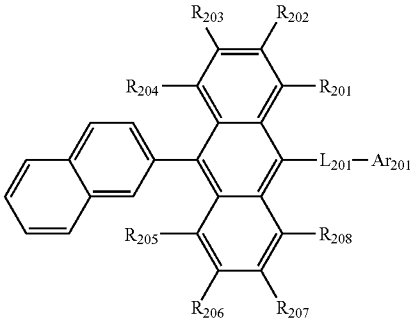
[Formula 76]
(203)
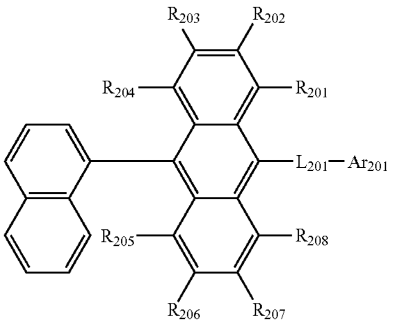
[Formula 77]
(204)
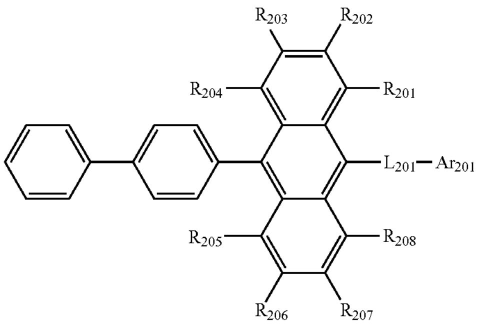
-continued
[Formula 78]
(205)
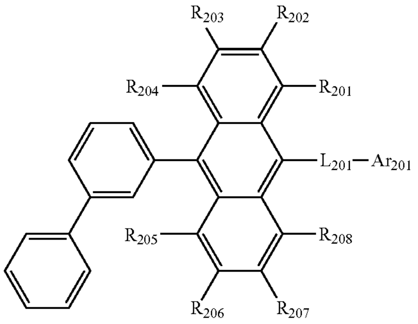
[Formula 79]
(206)
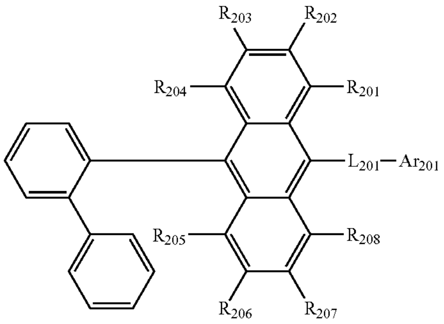
[Formula 80]
(207)
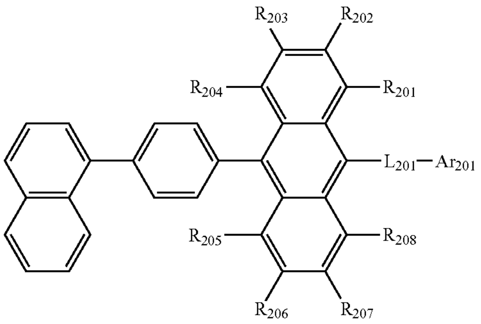
[Formula 81]
(208)
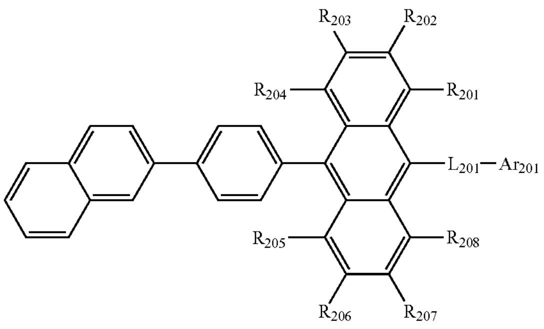

-continued

[Formula 82]

(209)

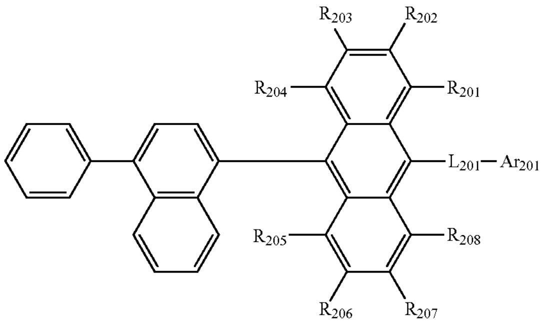

In the formulae (201) to (209), $L_{201}$ and $Ar_{201}$ represent the same as $L_{201}$ and $Ar_{201}$ in the formula (2); and $R_{201}$ to $R_{208}$ respectively represent the same as $R_{201}$ to $R_{208}$ in the formula (2).

It is also preferable that the second compound represented by the formula (2) is a compound represented by a formula (221), a formula (222), a formula (223), a formula (224), a formula (225), a formula (226), a formula (227), a formula (228), or a formula (229) below.

[Formula 83]

(221)

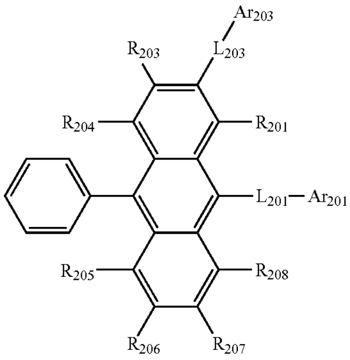

[Formula 84]

(222)

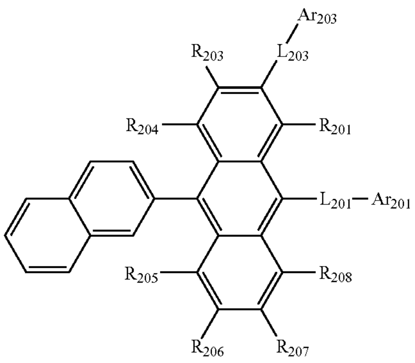

-continued

[Formula 85]

(223)

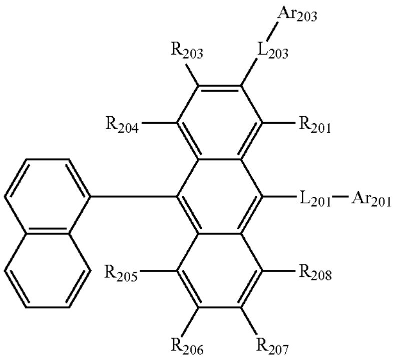

[Formula 86]

(224)

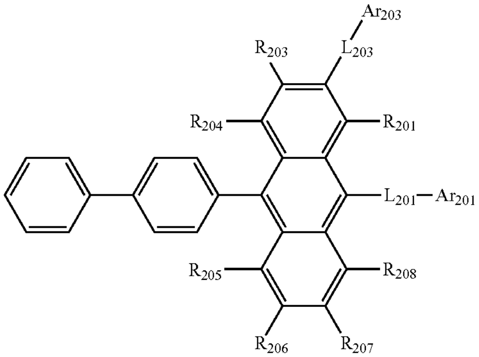

[Formula 87]

(225)

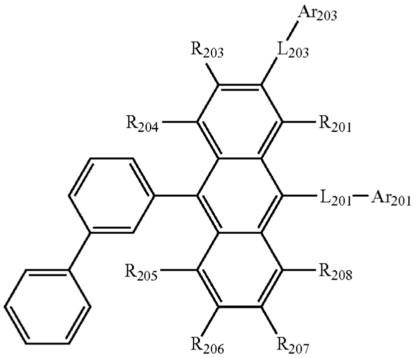

[Formula 88]

(226)

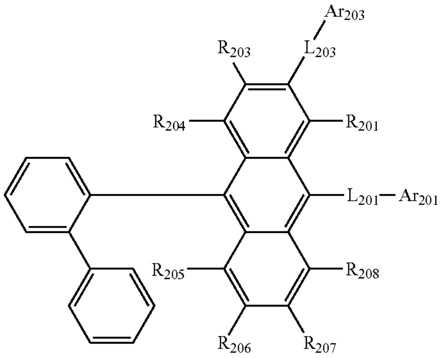

-continued

[Formula 89]

(227)

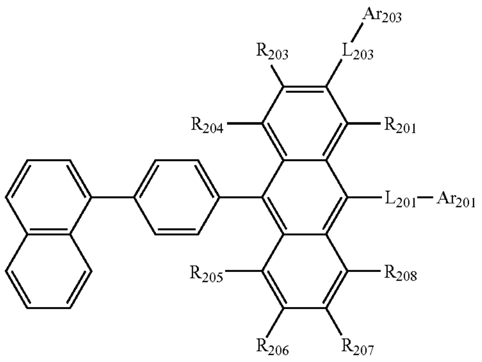

[Formula 90]

(228)

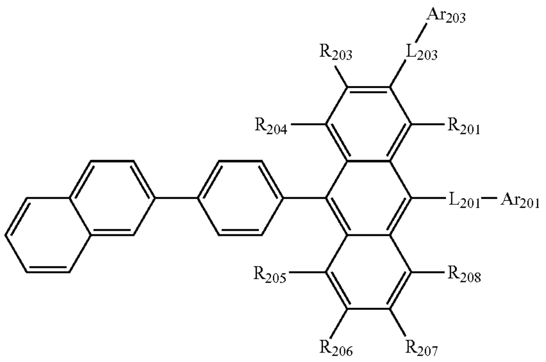

[Formula 91]

(229)

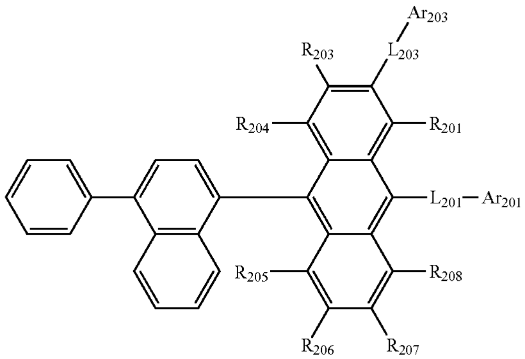

In the formulae (221), (222), (223), (224), (225), (226), (227), (228) and (229): $R_{201}$ and $R_{203}$ to $R_{208}$ respectively independently represent the same as $R_{201}$ and $R_{203}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as Arm in the formula (2); and $Ar_{203}$ and $Ar_{201}$ are mutually the same or different.

The second compound represented by the formula (2) is also preferably a compound represented by a formula (241), (242), (243), (244), (245), (246), (247), (248) or (249).

[Formula 92]

(241)

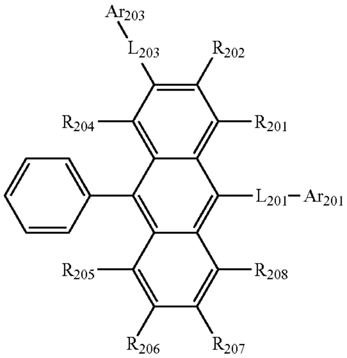

[Formula 93]

(242)

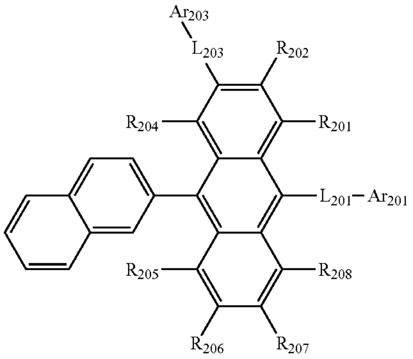

[Formula 94]

(243)

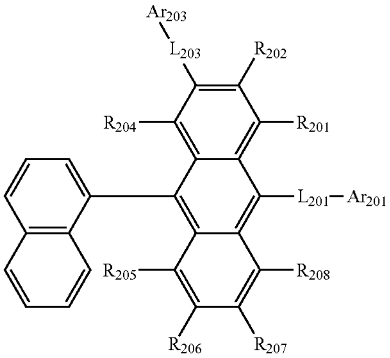

[Formula 95]

(244)

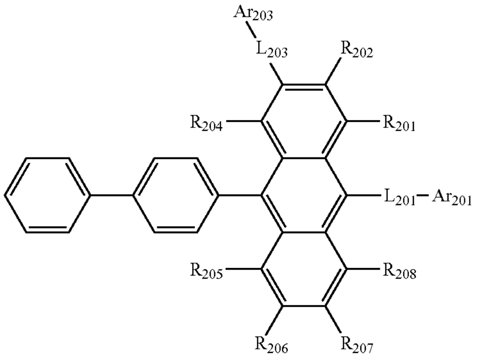

-continued

[Formula 96]

(245)

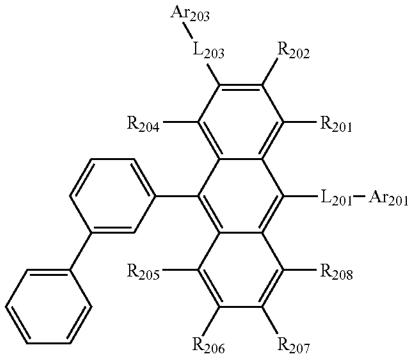

[Formula 97]

(246)

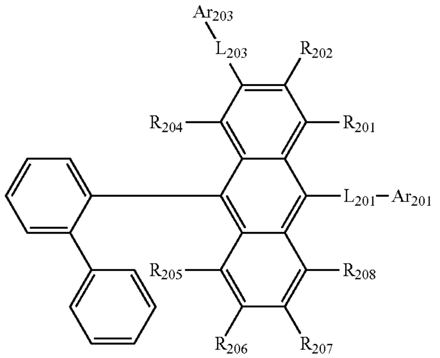

[Formula 98]

(247)

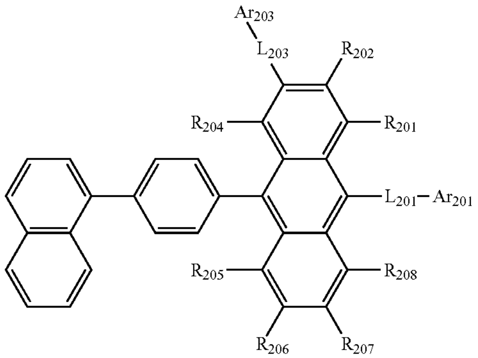

[Formula 99]

(248)

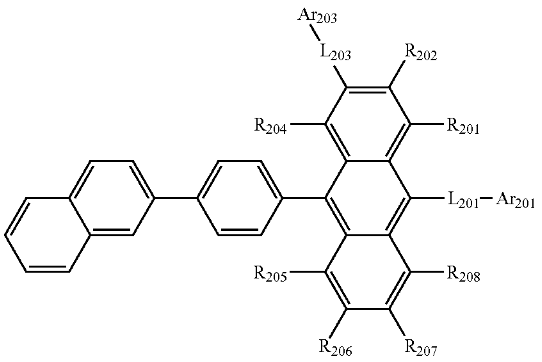

-continued

[Formula 100]

(249)

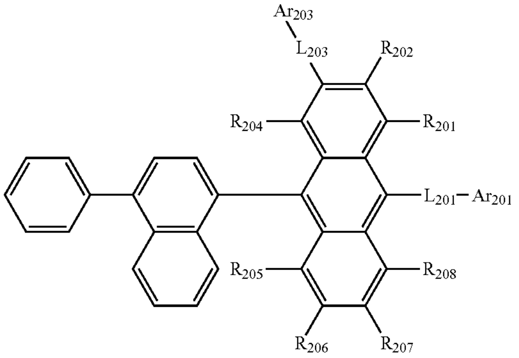

In the formulae (241), (242), (243), (244), (245), (246), (247), (248) and (249): $R_{201}$, $R_{202}$, and $R_{204}$ to $R_{208}$ respectively independently represent the same as $R_{201}$, $R_{202}$, and $R_{204}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

In the second compound represented by the formula (2), $R_{201}$ to $R_{208}$ that are not represented by the formula (21) are preferably each independently a hydrogen atom, a substituted or unsubstituted alkyl group having 1 to 50 carbon atoms, a substituted or unsubstituted cycloalkyl group having 3 to 50 ring carbon atoms, or a group represented by $-Si(R_{901})(R_{902})(R_{903})$.

It is preferable that $L_{101}$ is a single bond or an unsubstituted arylene group having 6 to 22 ring carbon atoms, and $Ar_{101}$ is a substituted or unsubstituted aryl group having 6 to 22 ring carbon atoms.

In the organic EL device according to the second exemplary embodiment, $R_{201}$ to $R_{208}$ that are substituents on an anthracene skeleton in the second compound represented by the formula (2) are preferably hydrogen atoms in terms of preventing inhibition of intermolecular interaction to inhibit a decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that a relationship of $\mu e(H2) > \mu e(H1)$ shown by the numerical formula (Numerical Formula 30) may not be satisfied. When the second compound is used in the second emitting layer, it can be expected that satisfying the relationship of $\mu e(H2) > \mu e(H1)$ inhibits a decrease in a recombination ability between holes and electrons in the first emitting layer and a decrease in the luminous efficiency. It should be noted that as the substituent, namely, a haloalkyl group, alkenyl group, alkynyl group, group represented by $-Si(R_{901})(R_{902})(R_{903})$, group represented by $-O-(R_{904})$, group represented by $-S-(R_{905})$, group represented by $-N(R_{906})(R_{907})$, aralkyl group, group represented by $-C(=O)R_{801}$, group represented by $-COOR_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COOR$_{802}$, halogen atom, cyano group, and nitro group.

In the organic EL device according to the exemplary embodiment, in the second compound represented by the formula (2), it is also preferable that $R_{201}$ to $R_{208}$ are each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In the organic EL device according to the exemplary embodiment, $R_{201}$ to $R_{208}$ in the second compound represented by the formula (2) are preferably each a hydrogen atom.

In the second compound, examples of a substituent for a "substituted or unsubstituted" group on $R_{201}$ to $R_{208}$ also preferably do not include the above-described substituent that is likely to be bulky, especially a substituted or unsubstituted alkyl group and a substituted or unsubstituted cycloalkyl group. Since the examples of the substituent for the "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

It is more preferably that $R_{201}$ to $R_{208}$, which are the substituents on the anthracene skeleton, are not bulky substituents, and $R_{201}$ to $R_{208}$ as substituents are unsubstituted. Assuming that $R_{201}$ to $R_{208}$, which are the substituents on the anthracene skeleton, are not bulky substituents and substituents are bonded to $R_{201}$ to $R_{208}$ which are the not-bulky substituents, the substituents bonded to $R_{201}$ to $R_{208}$ are also preferably not the bulky substituents; the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COOR$_{802}$, halogen atom, cyano group, and nitro group.

In the second compound, the groups specified to be "substituted or unsubstituted" are each preferably an "unsubstituted" group.

Manufacturing Method of Second Compound

The second compound can be manufactured by a known method. The second compound can also be manufactured based on a known method through a known alternative reaction using a known material(s) tailored for the target compound.

Specific Examples of Second Compound

Specific examples of the second compound include the following compounds. It should however be noted that the invention is not limited by the specific examples of the second compound.

[Formula 101]

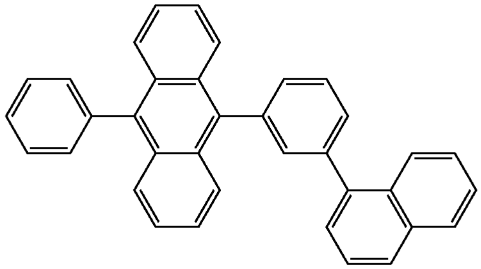

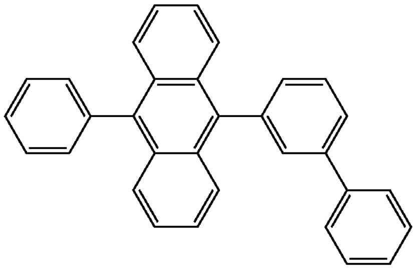

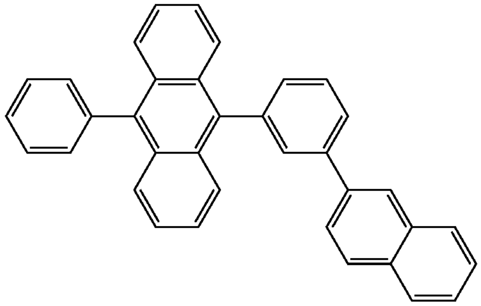

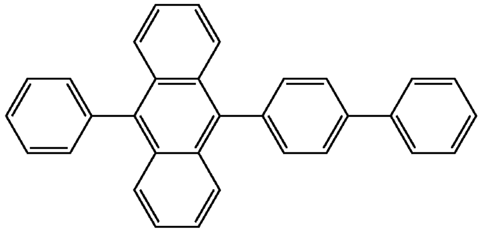

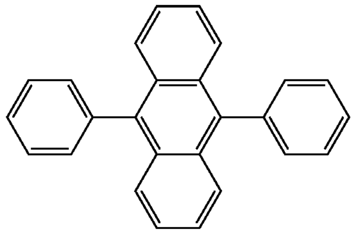

-continued
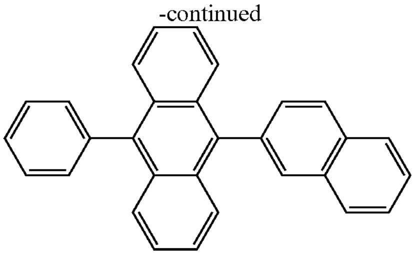
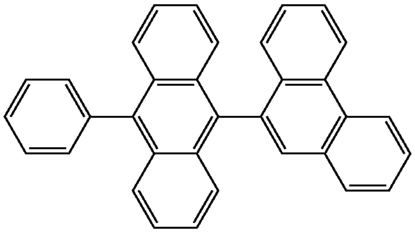
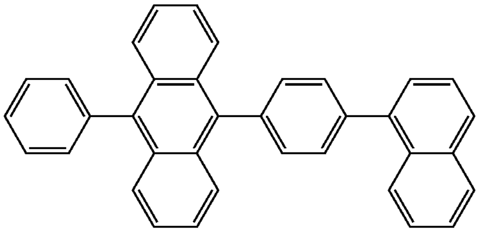
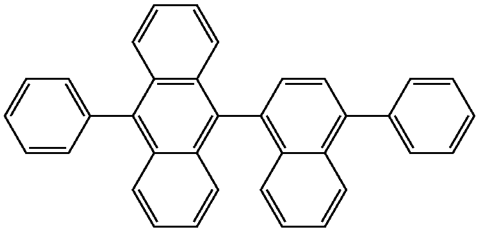
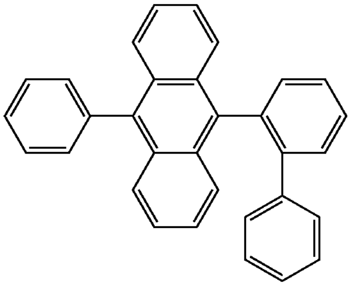
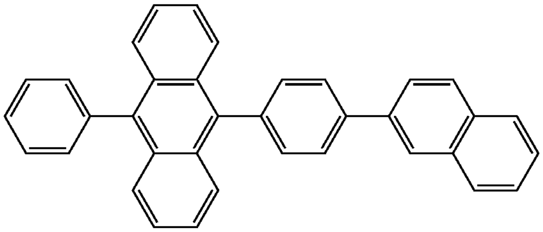
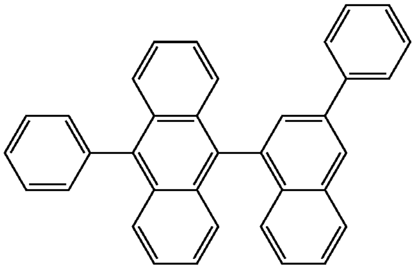
-continued
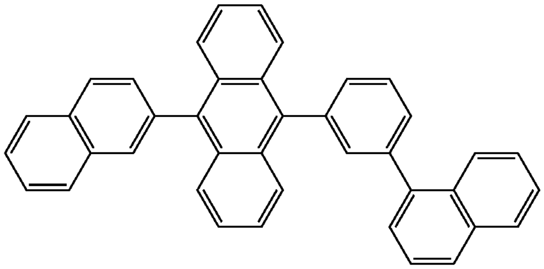
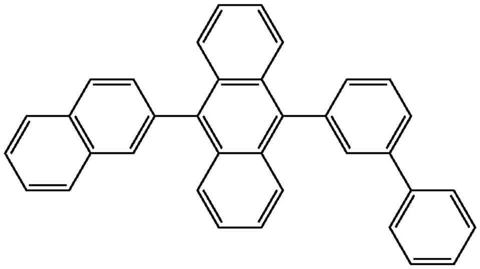
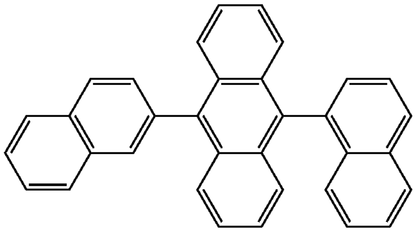
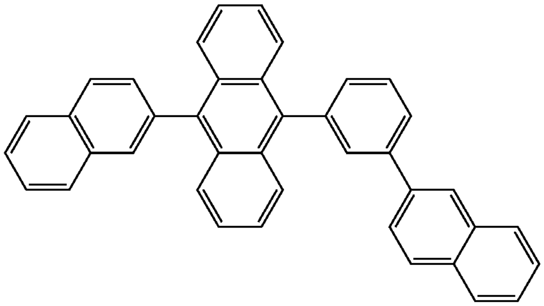
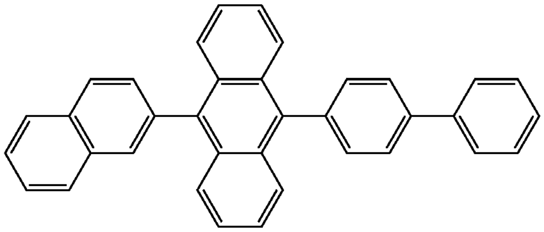
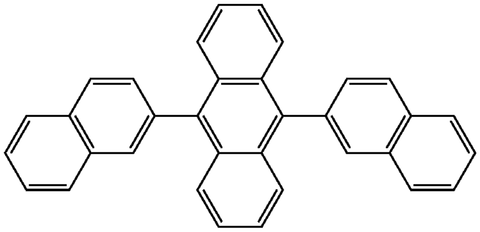

-continued
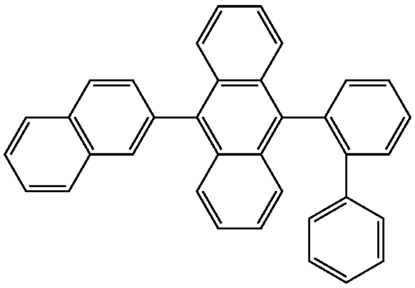
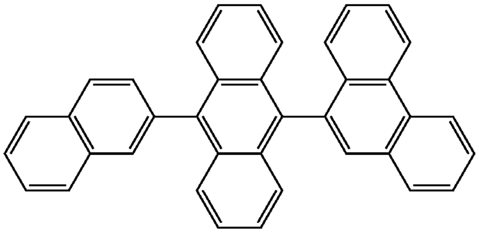
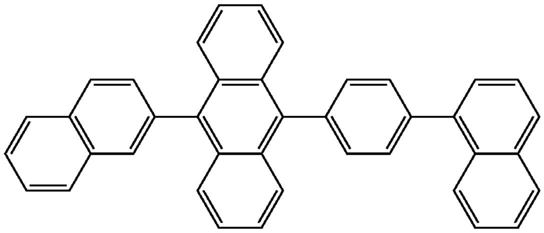
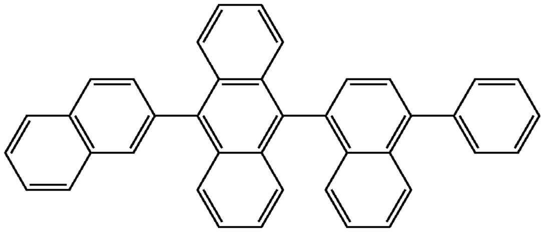
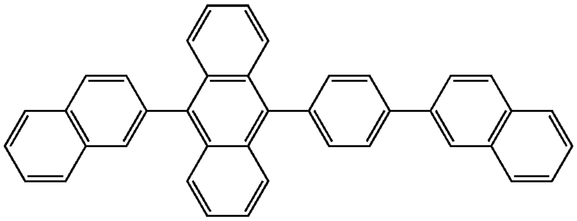
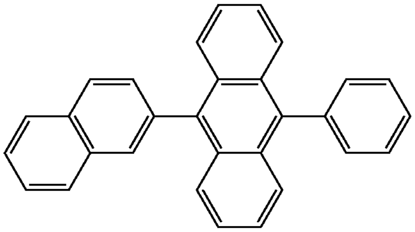
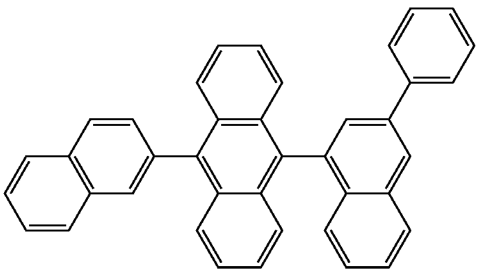
-continued
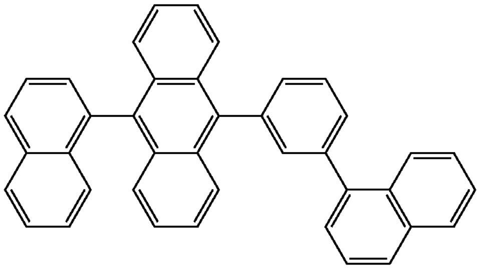
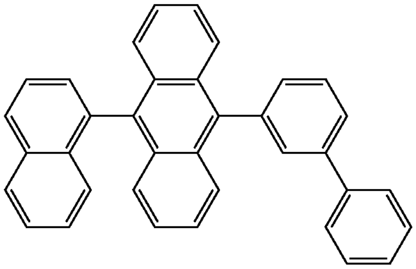
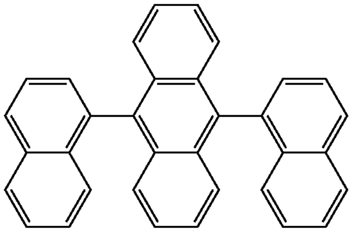
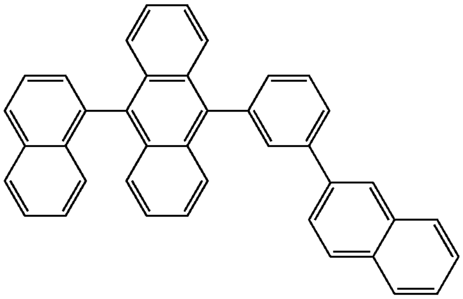
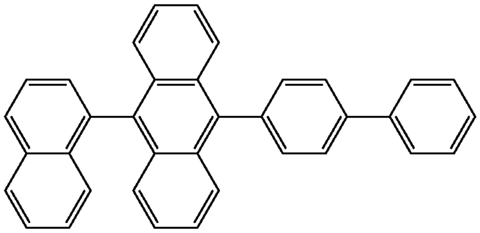
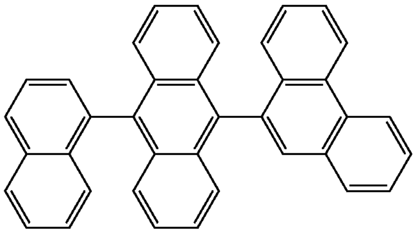

-continued
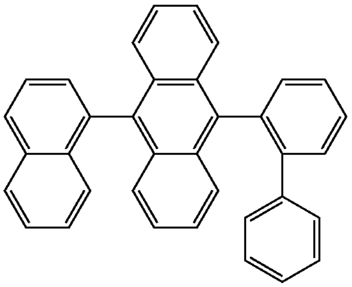
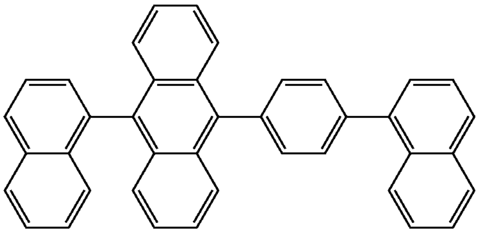
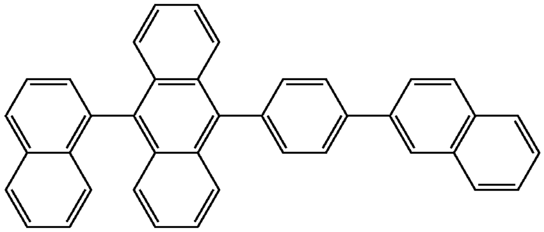
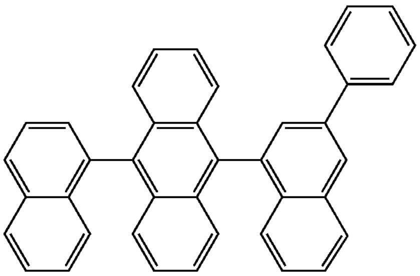
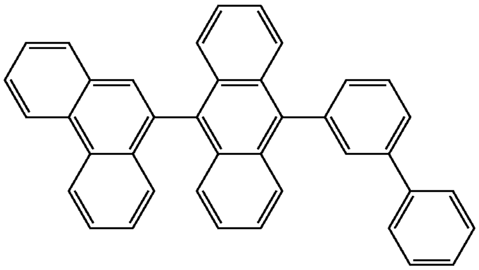
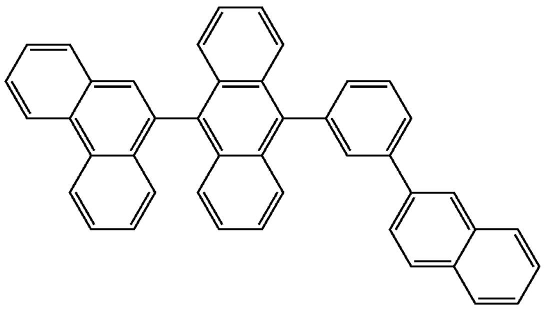
-continued
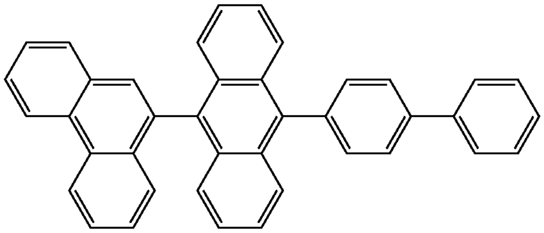
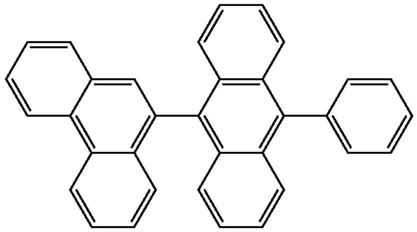
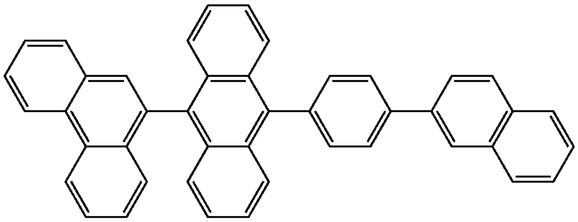
[Formula 102]
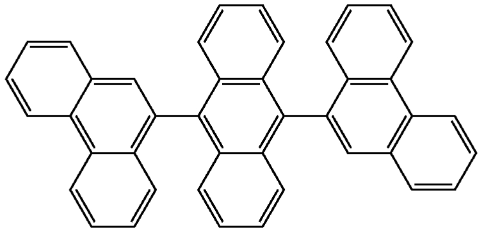
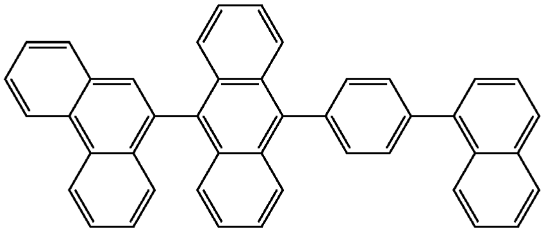
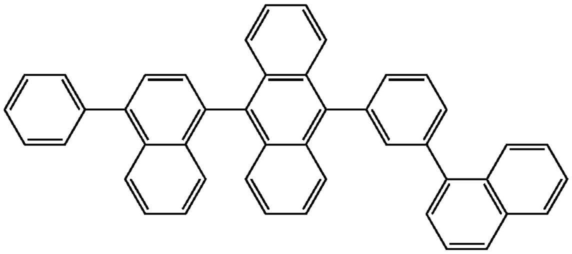
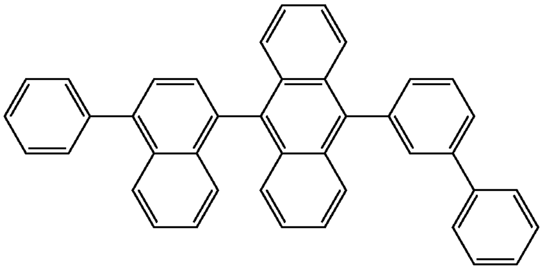

-continued
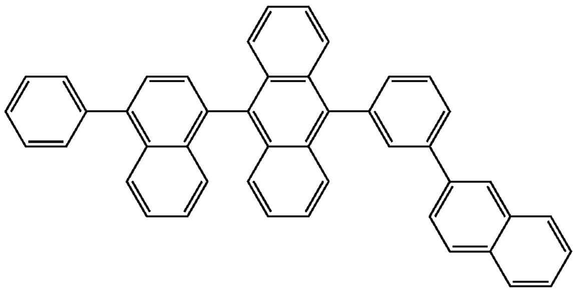
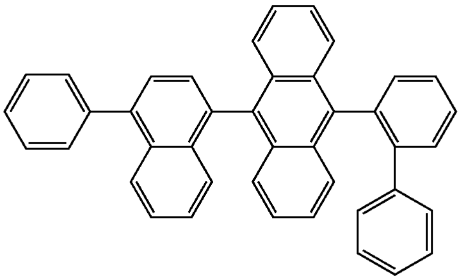
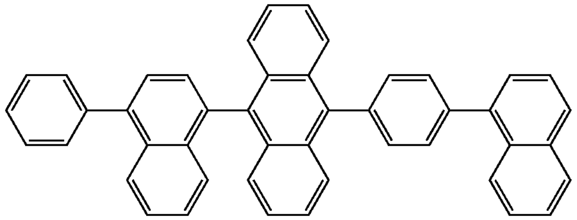
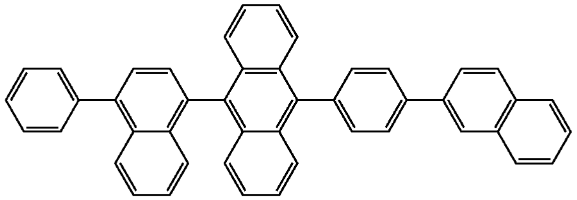
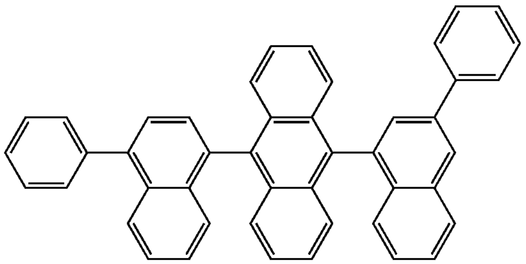
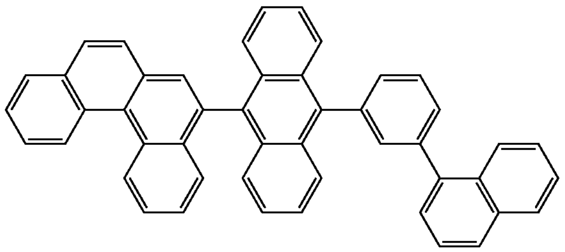
-continued
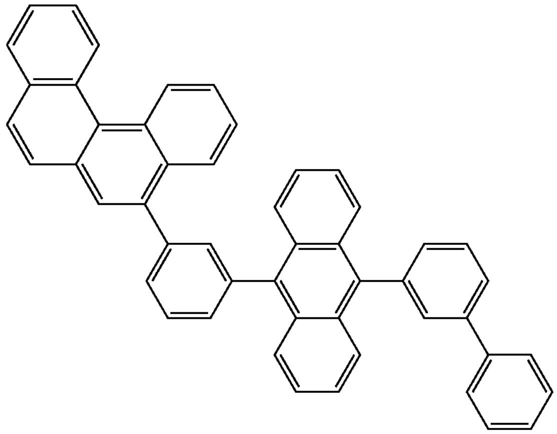
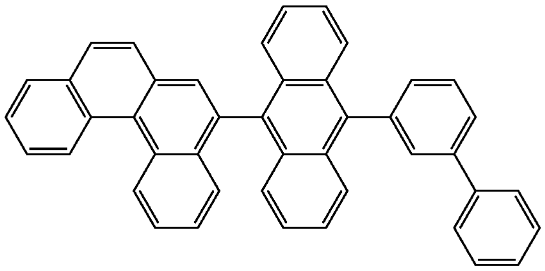
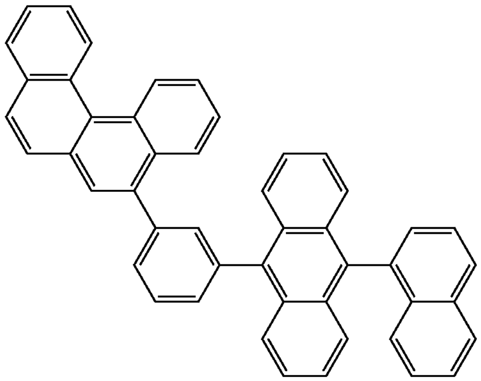
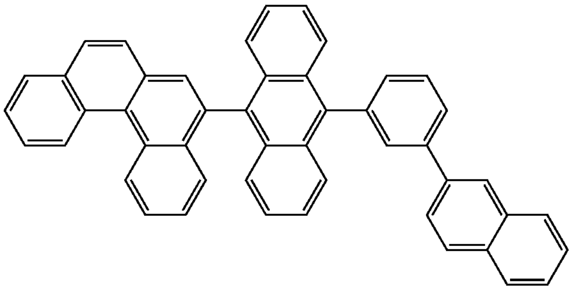
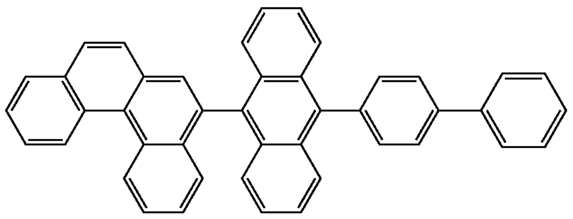

-continued
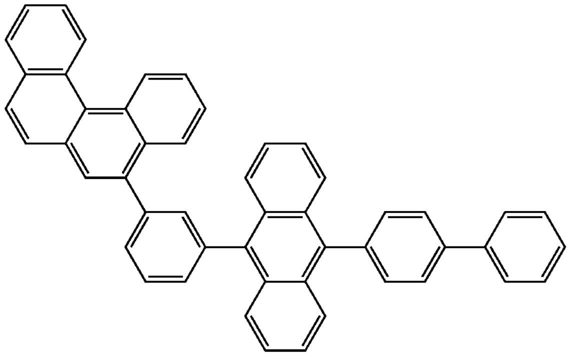
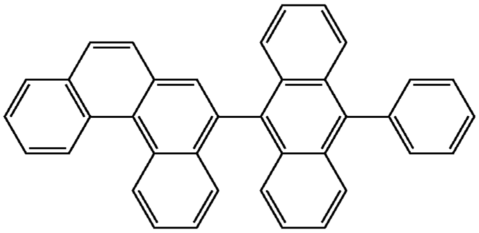
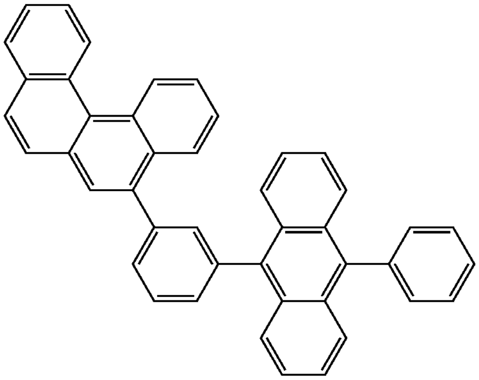
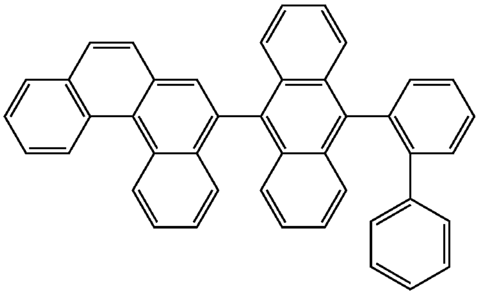
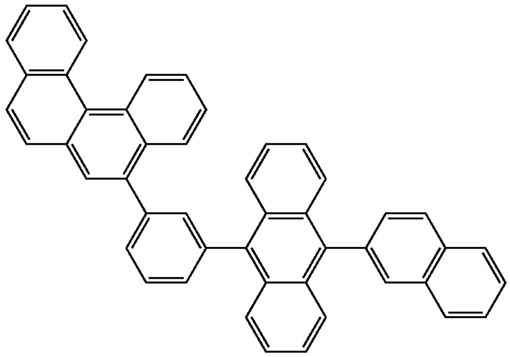
-continued
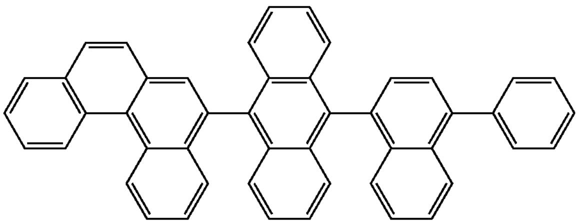
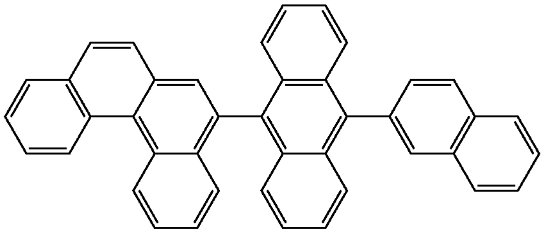
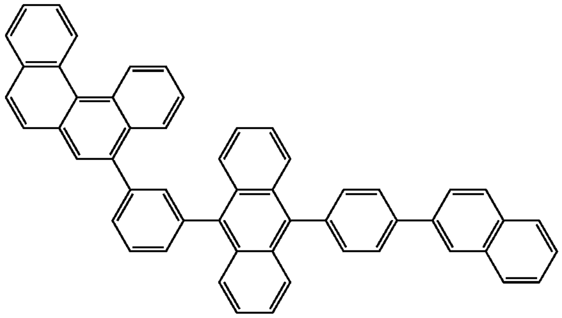
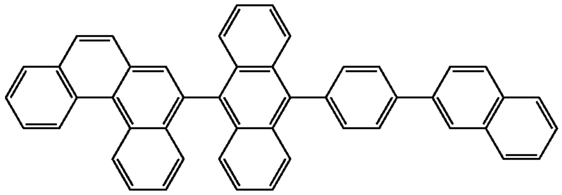
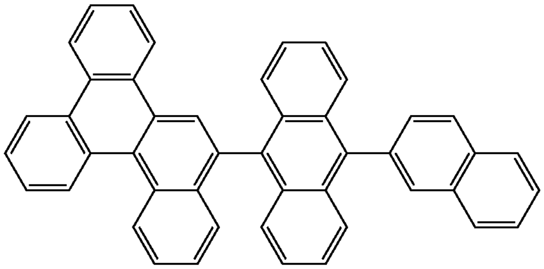
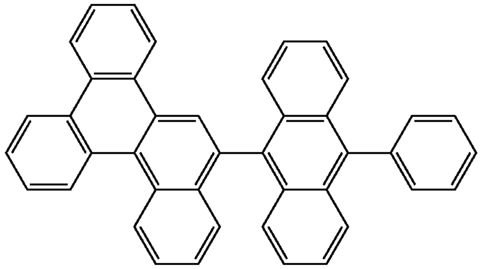

-continued
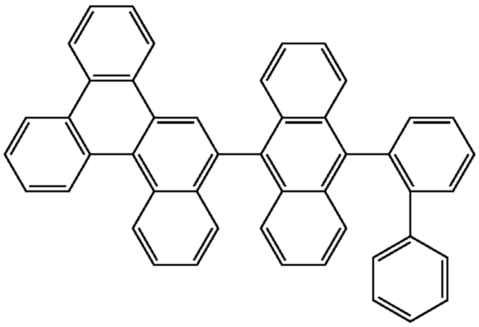
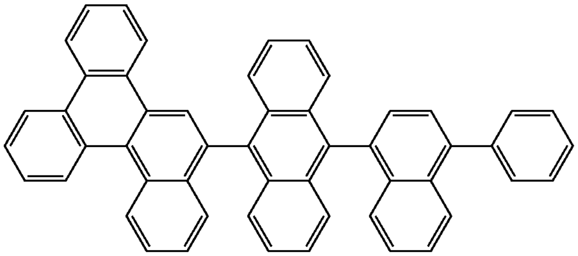
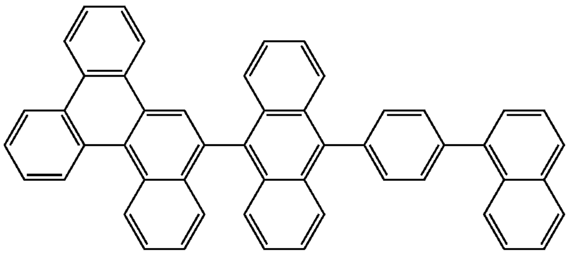
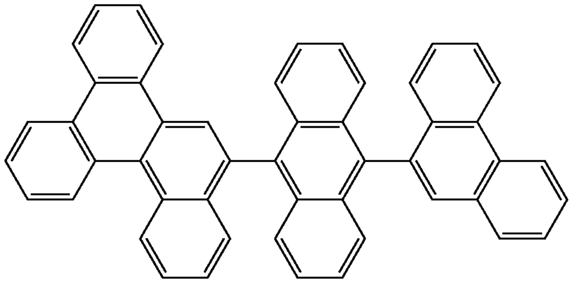
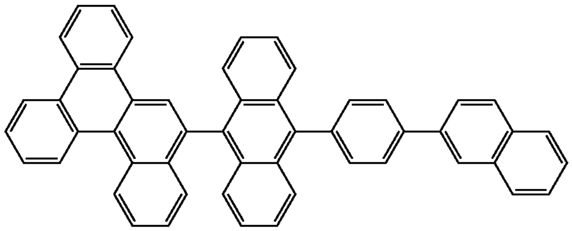
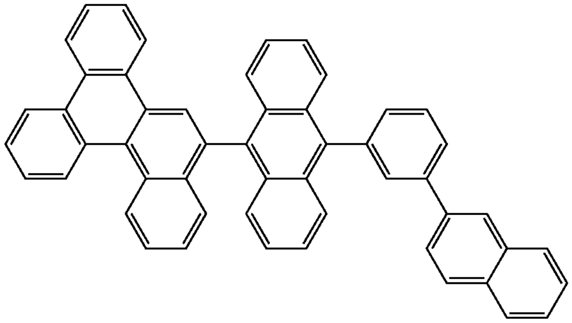
-continued
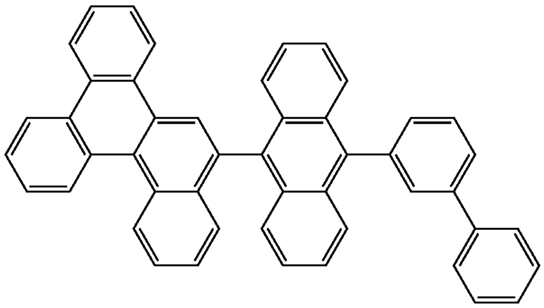
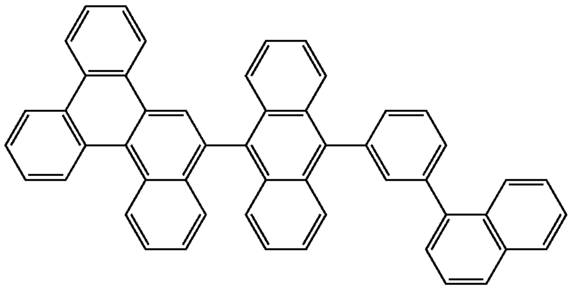
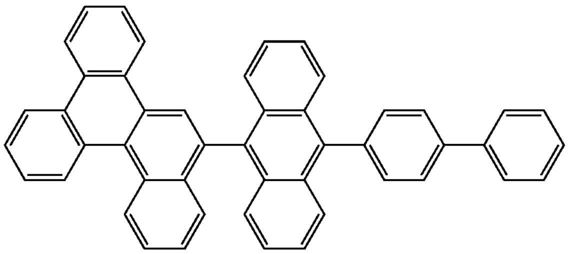
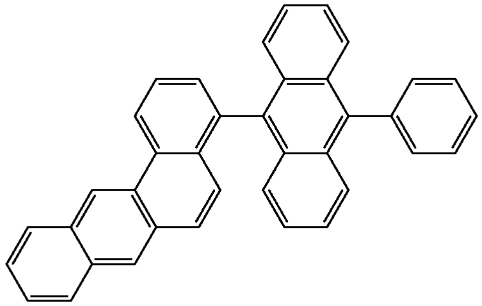
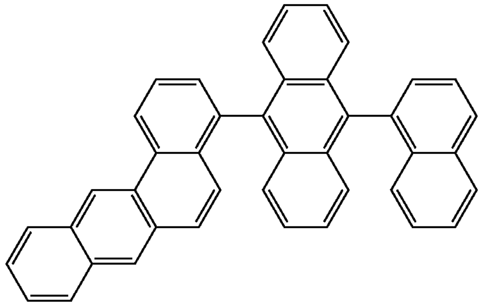

-continued
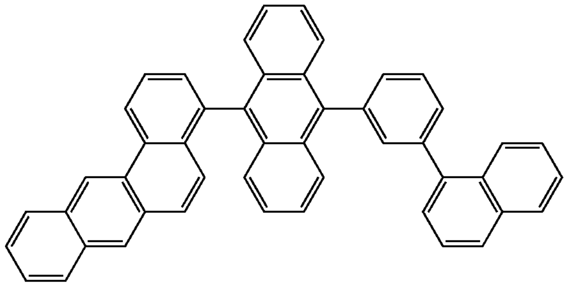
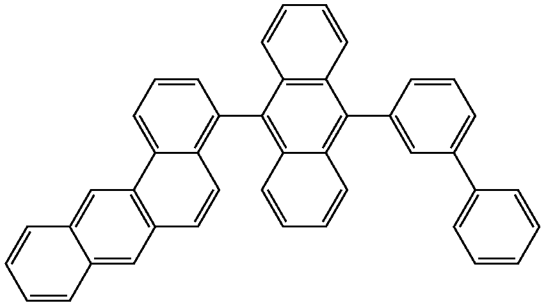
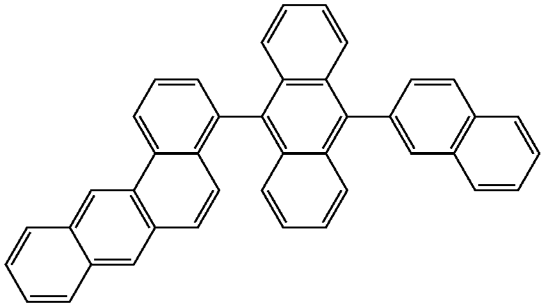
[Formula 103]
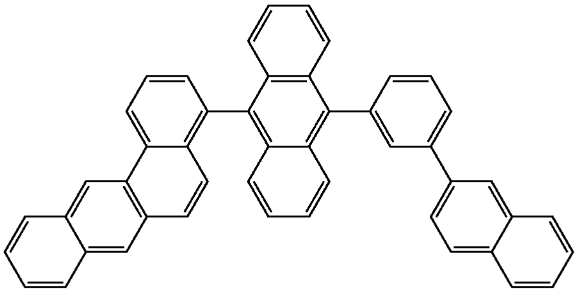
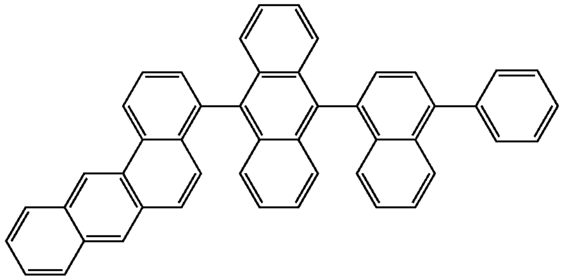
-continued
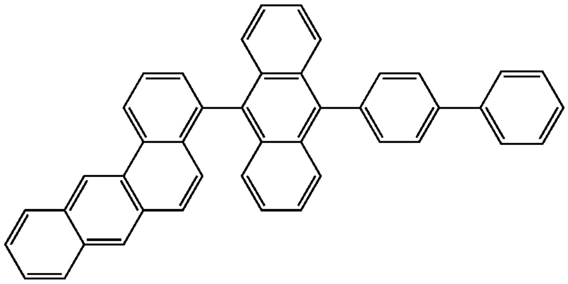
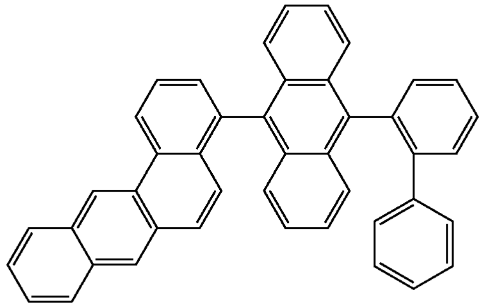
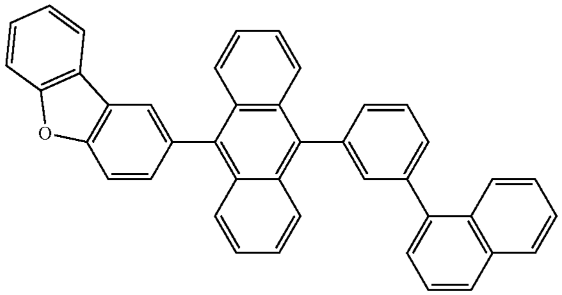
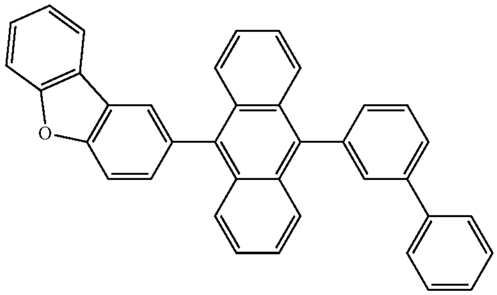
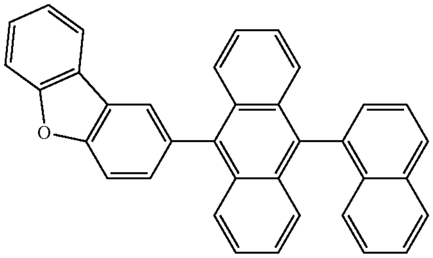

-continued
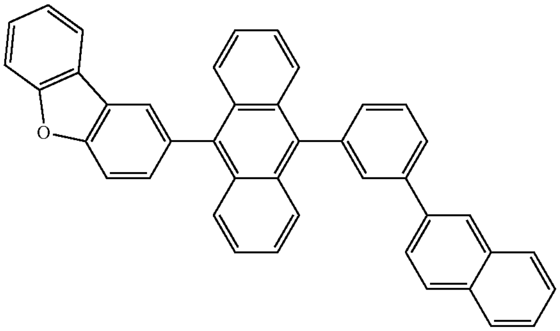
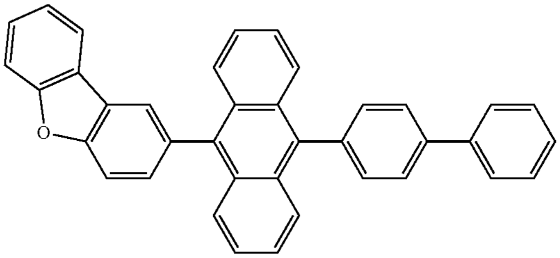
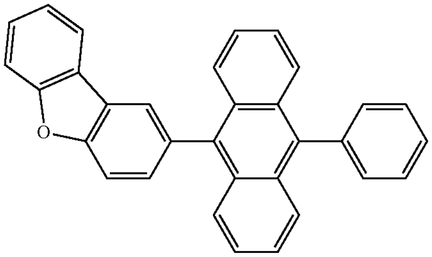
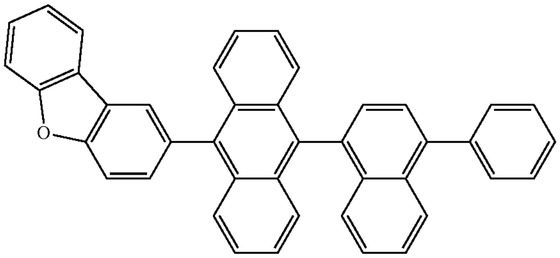
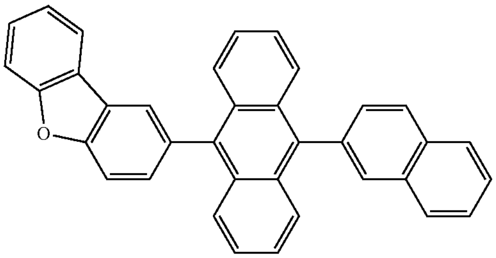
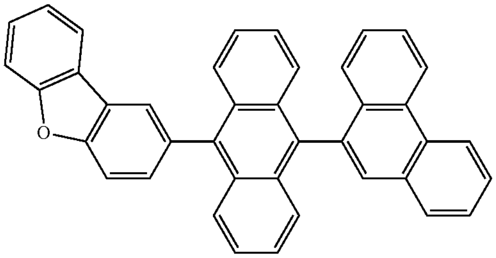
-continued
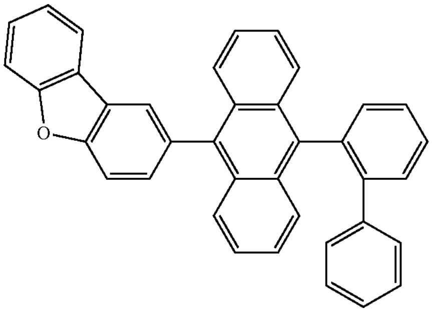
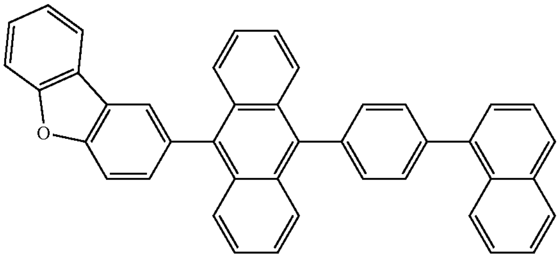
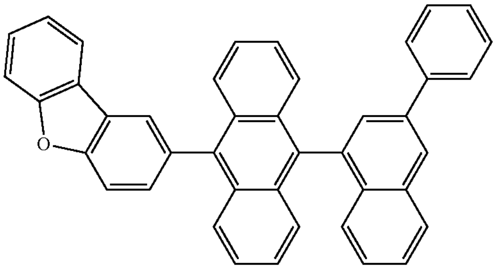
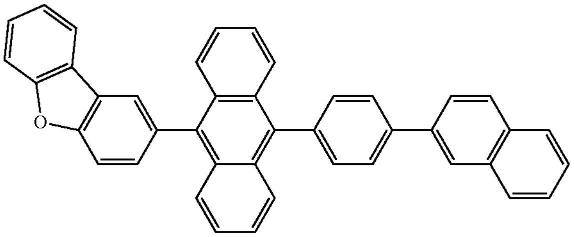
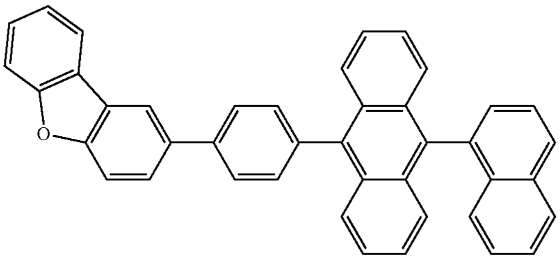
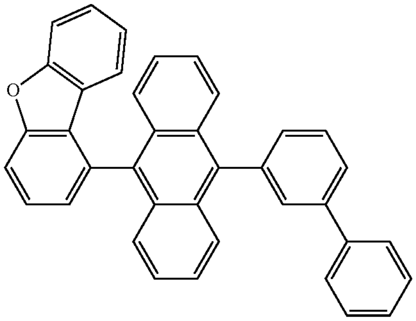

-continued
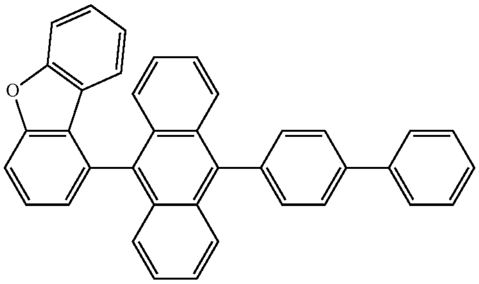
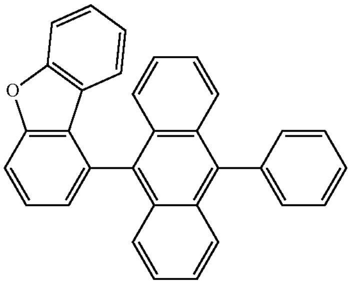
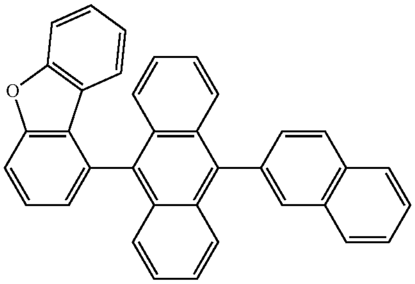
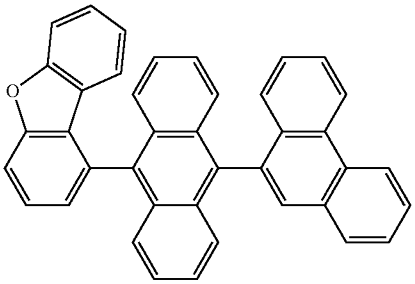
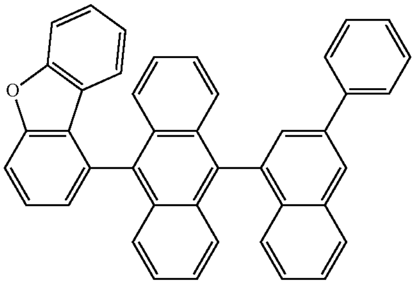
-continued
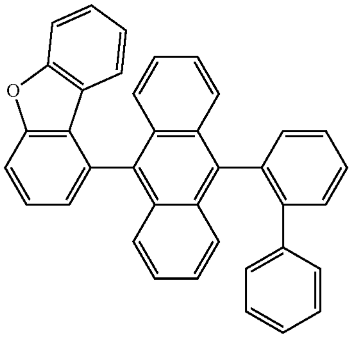
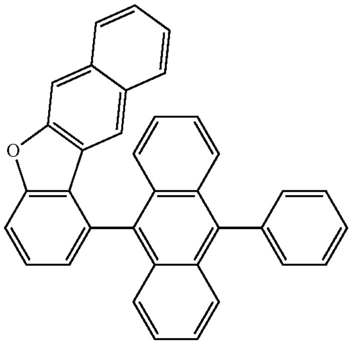
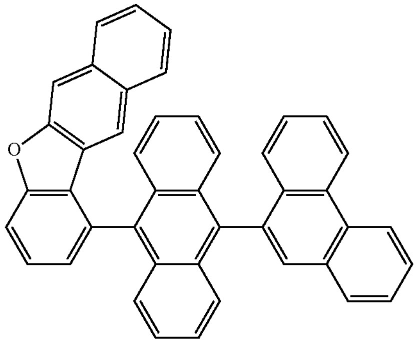
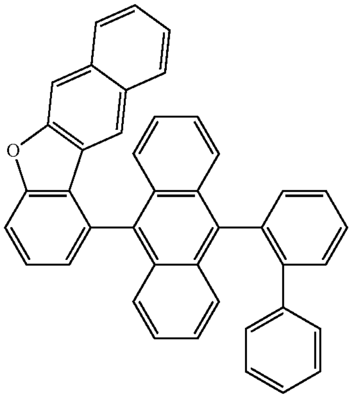

-continued
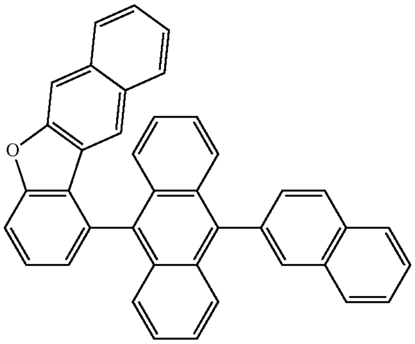
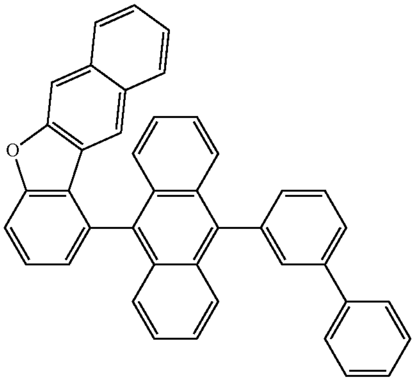
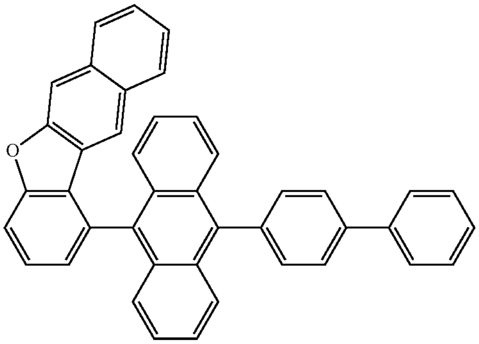
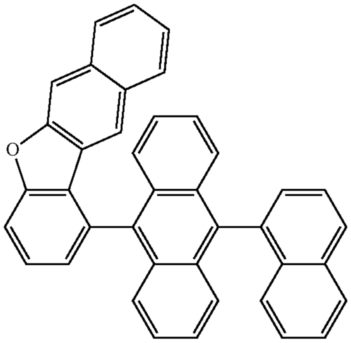
-continued
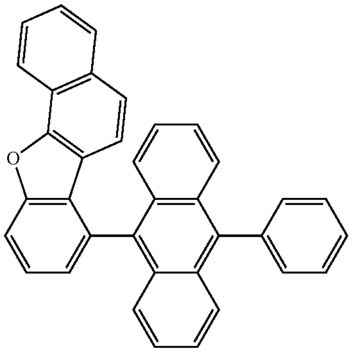
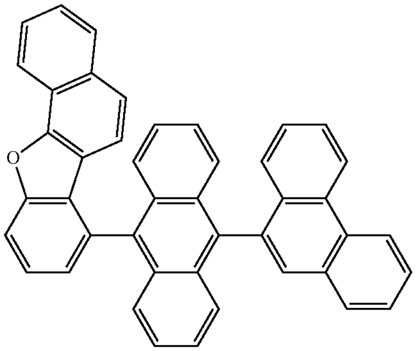
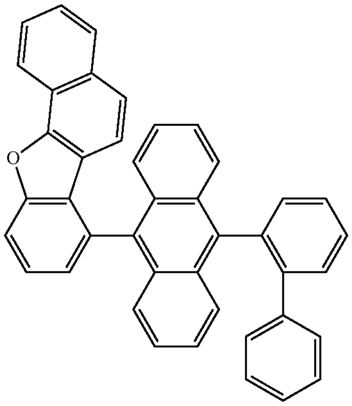
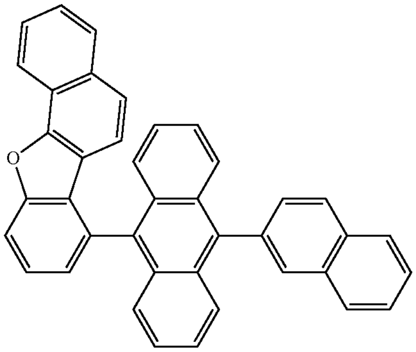

-continued
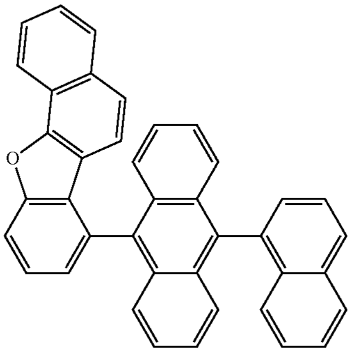
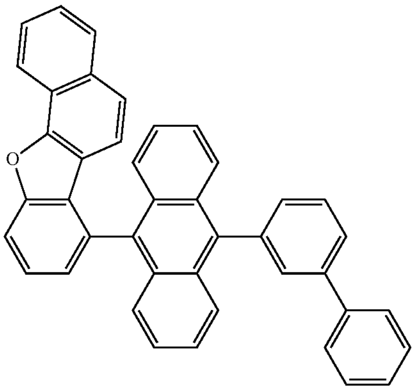
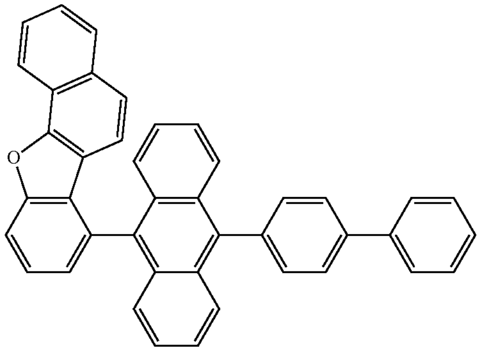
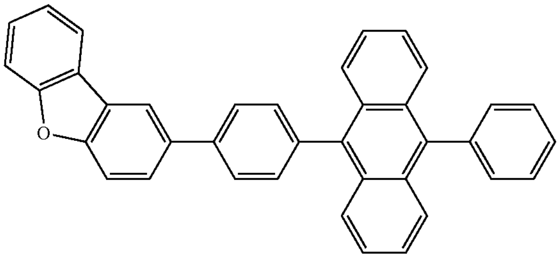
[Formula 104]
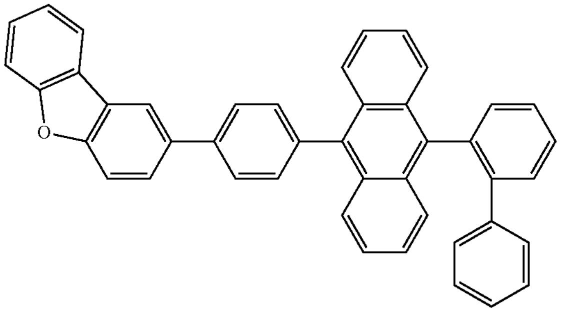
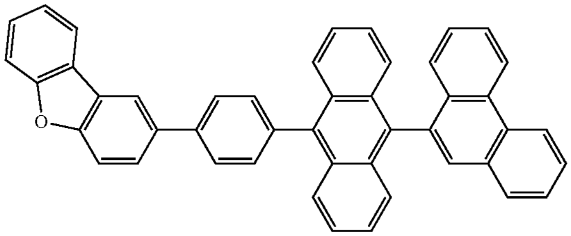
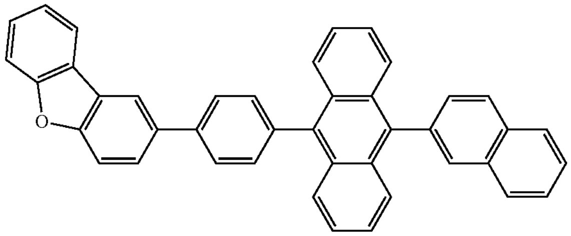
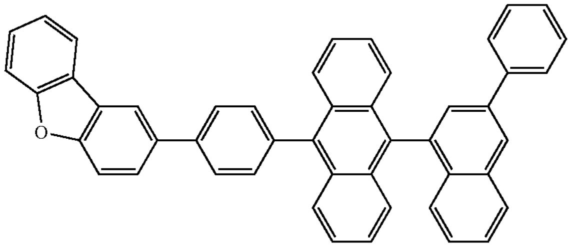
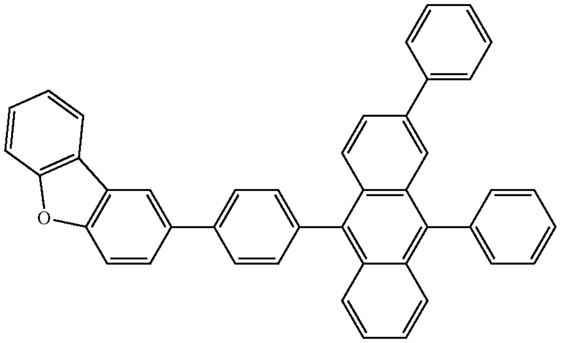
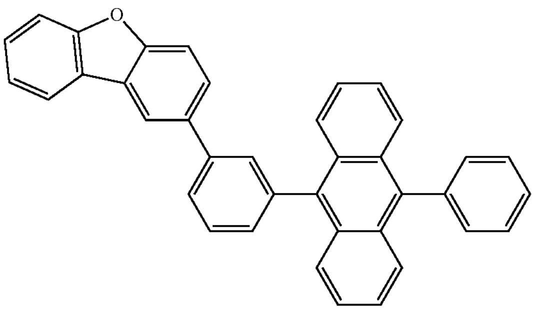

-continued
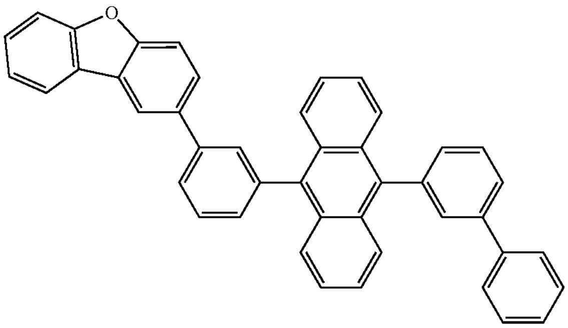
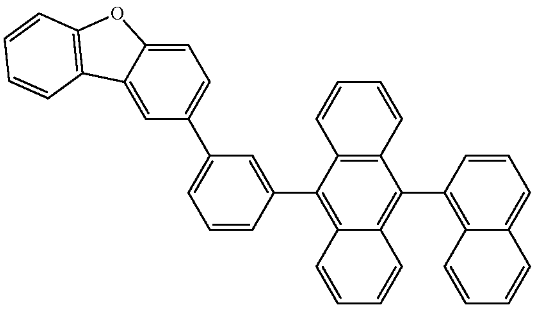
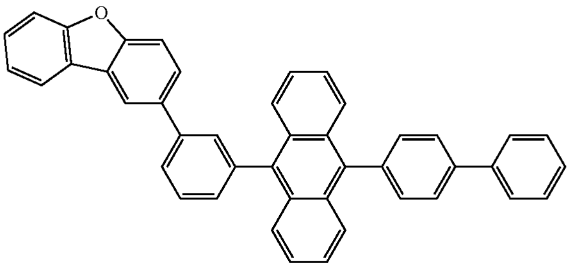
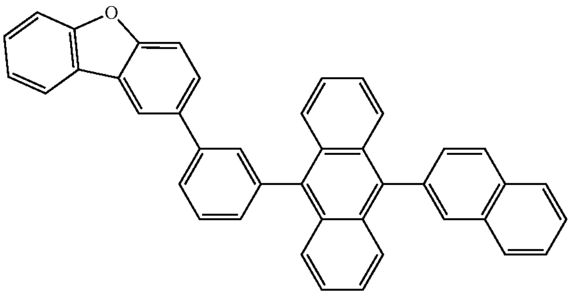
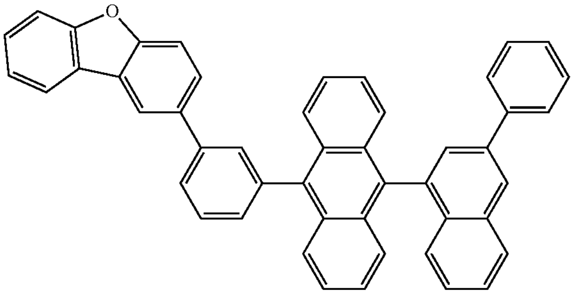
-continued
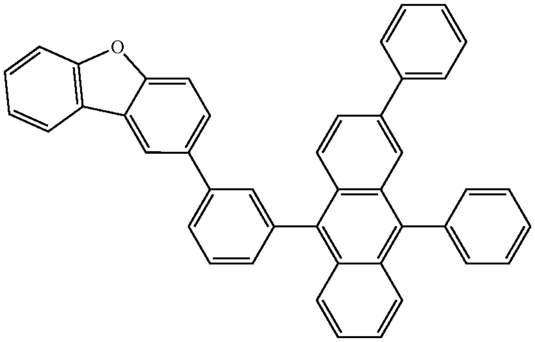
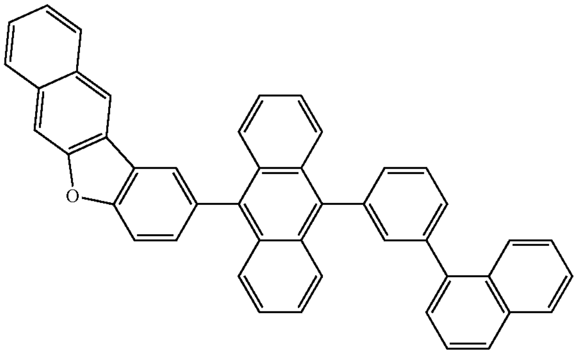
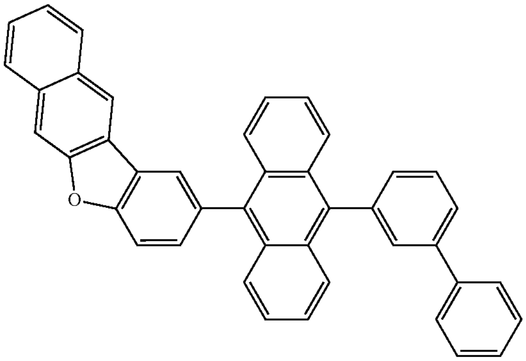
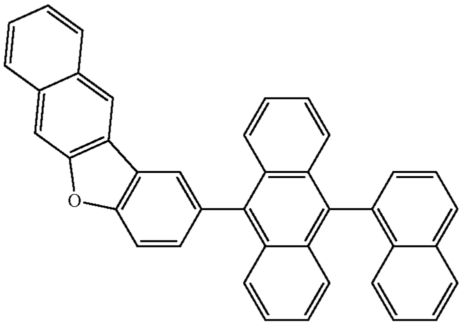

-continued
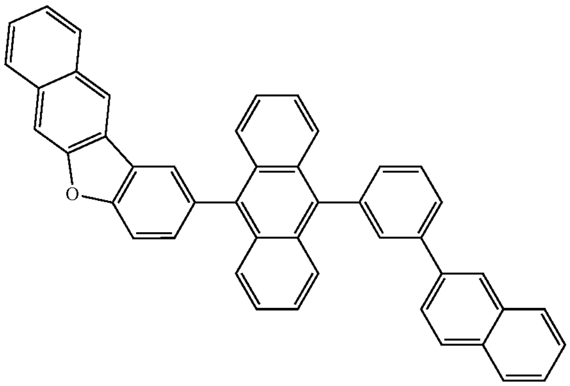
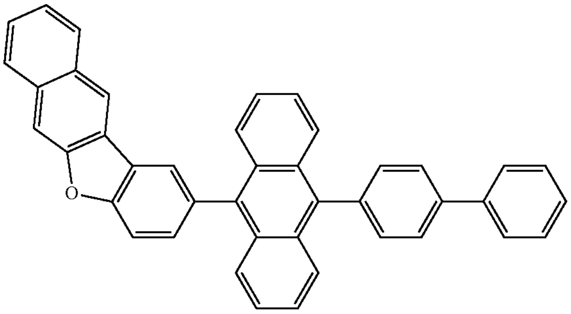
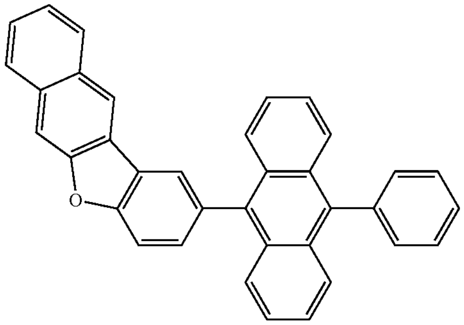
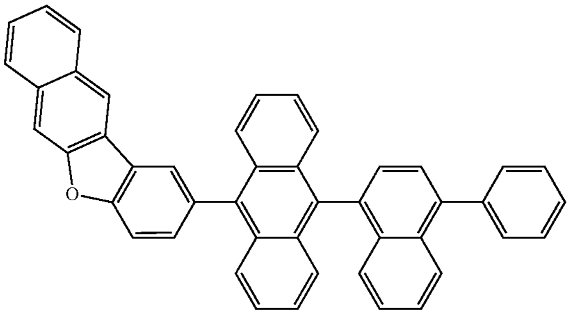
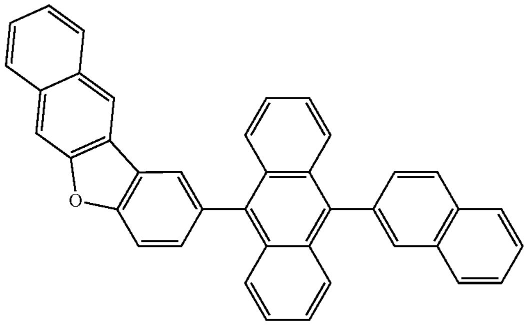
-continued
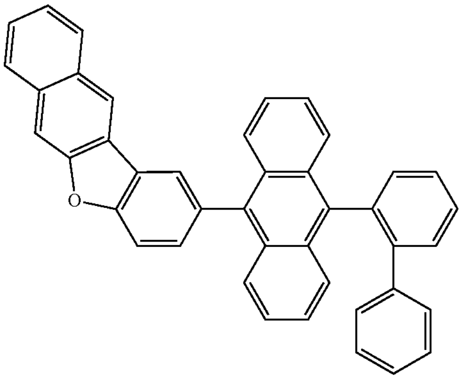
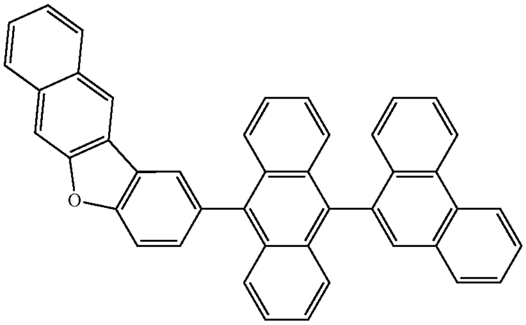
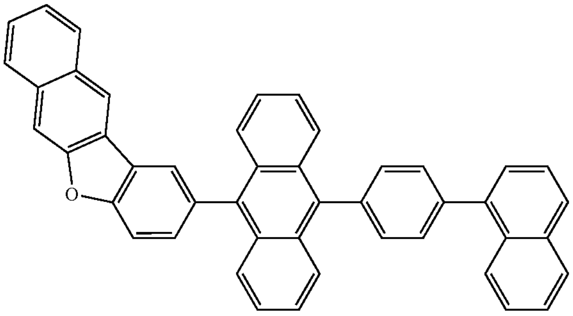
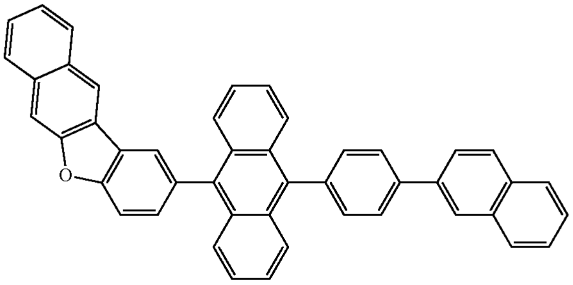
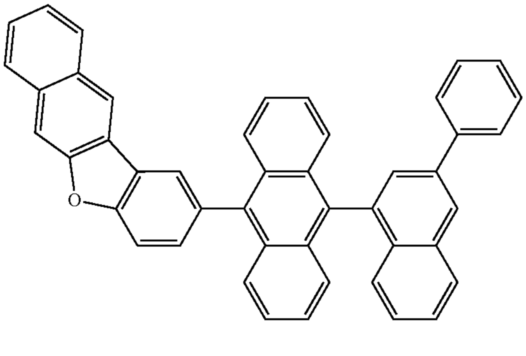

-continued
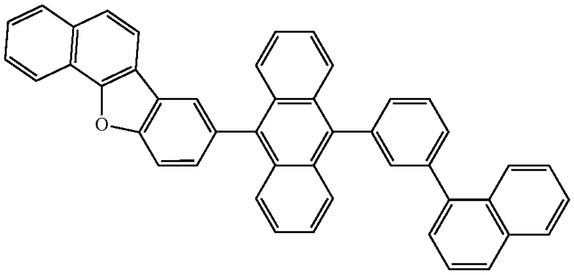
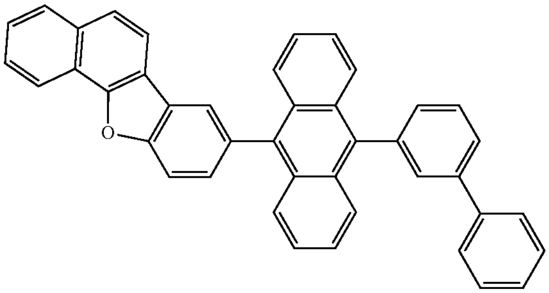
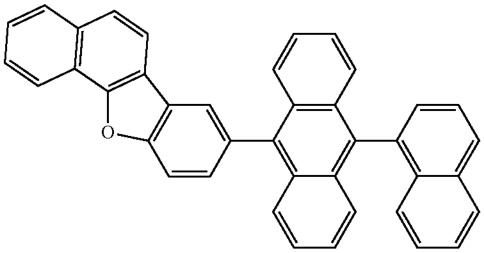
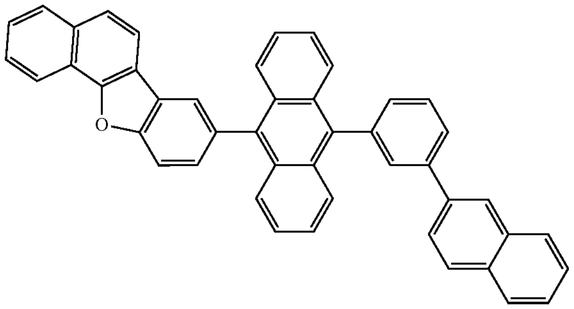
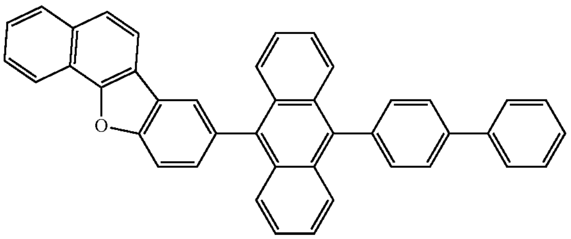
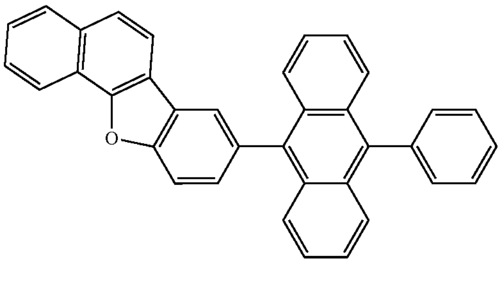
-continued
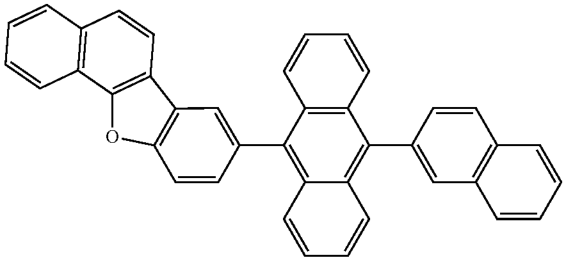
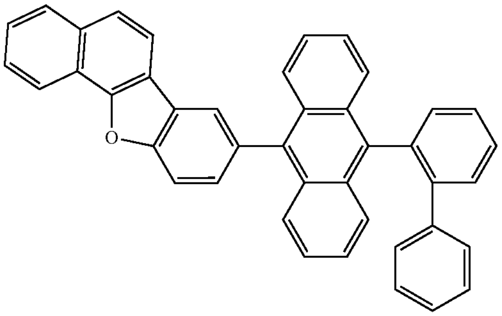
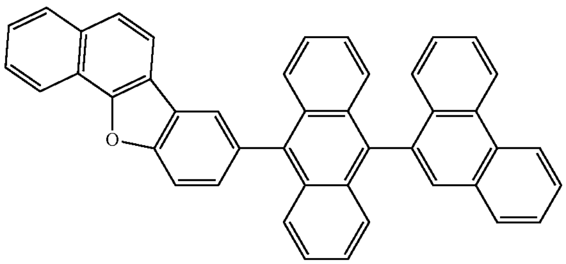
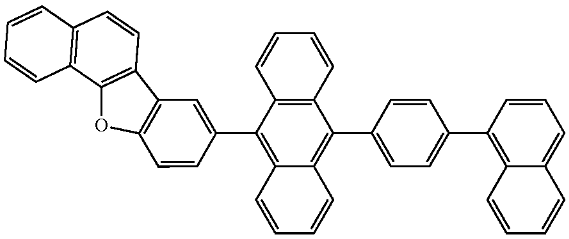
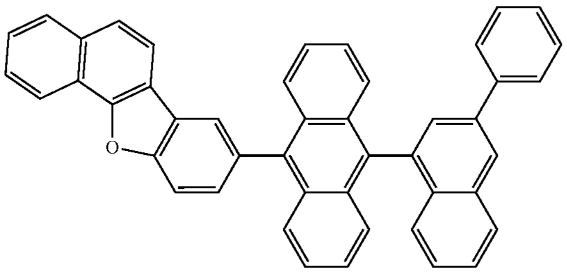
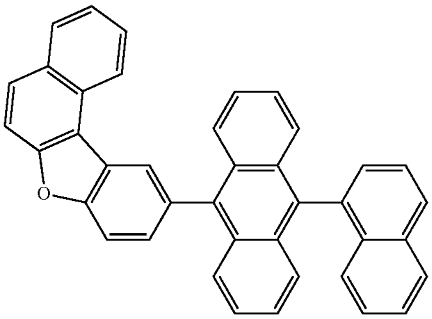

-continued
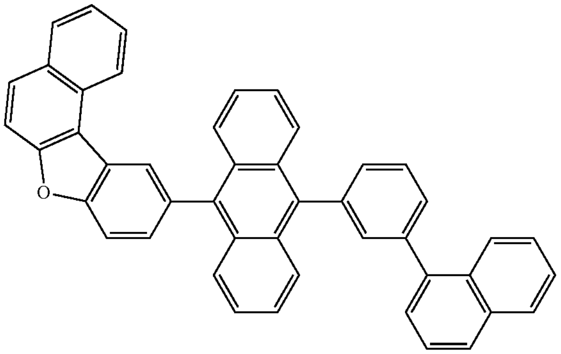
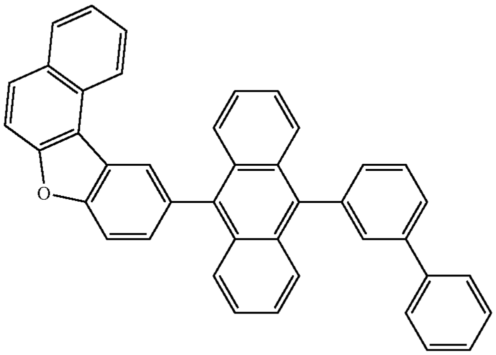
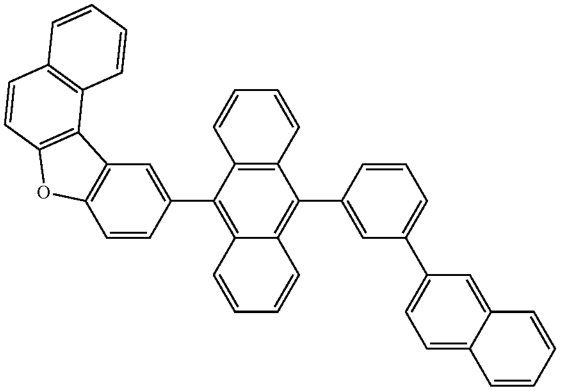
[Formula 105]
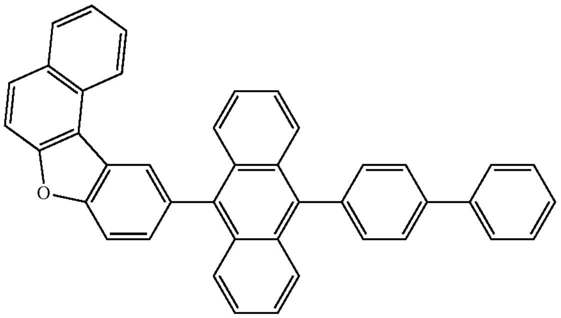
-continued
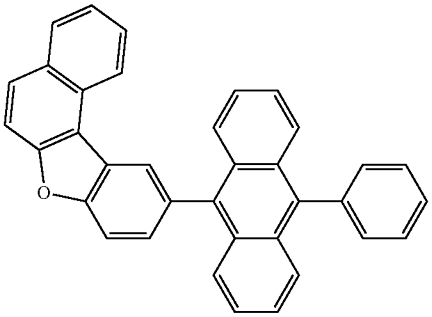
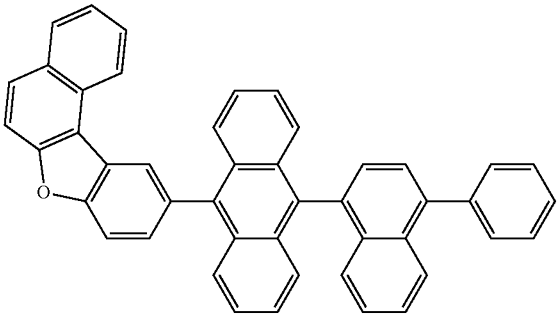
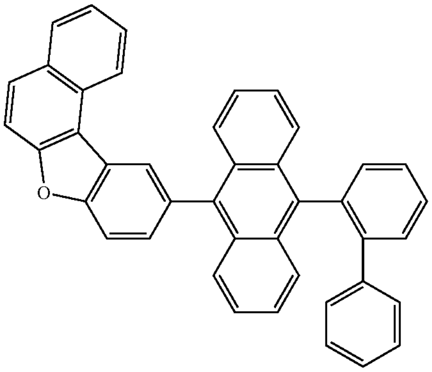
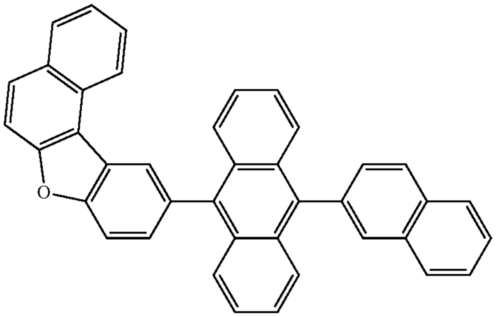
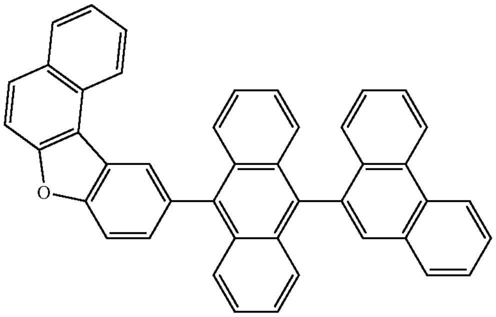

-continued
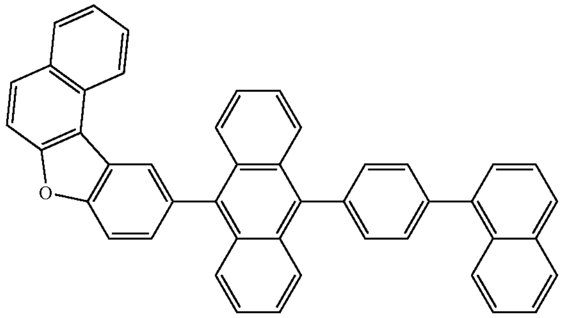
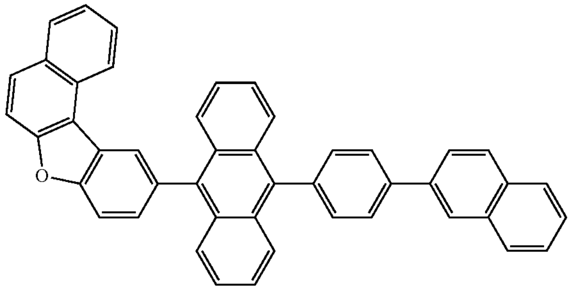
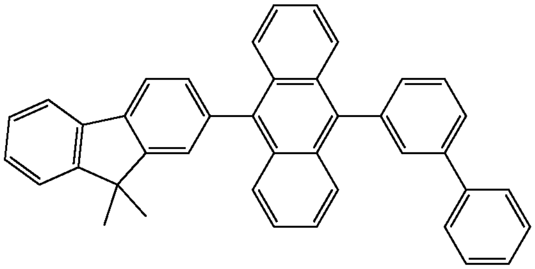
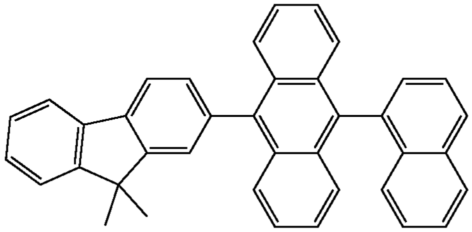
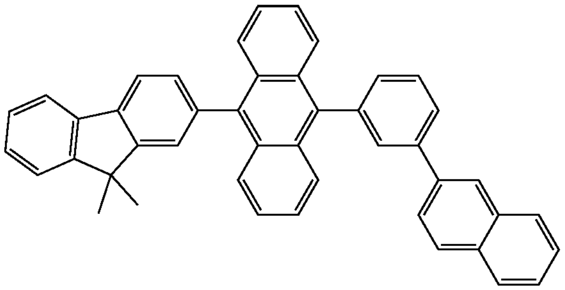
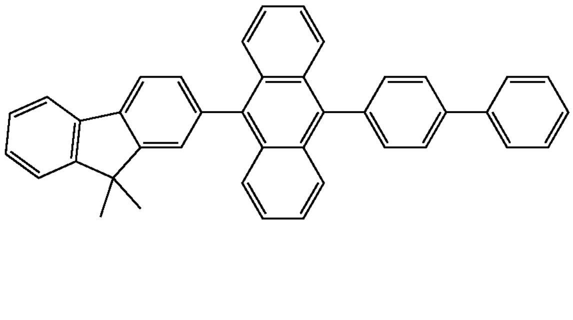
-continued
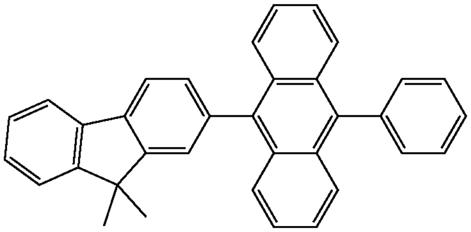
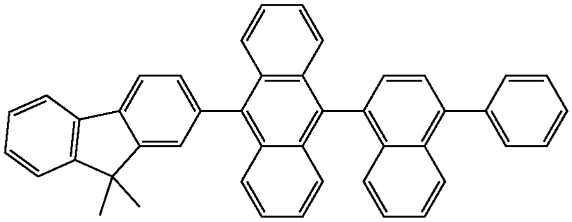
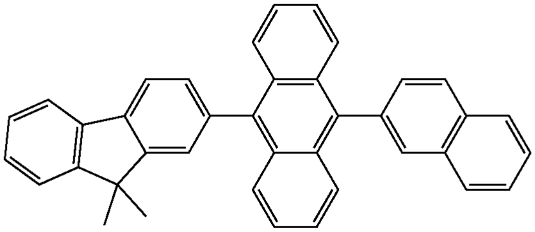
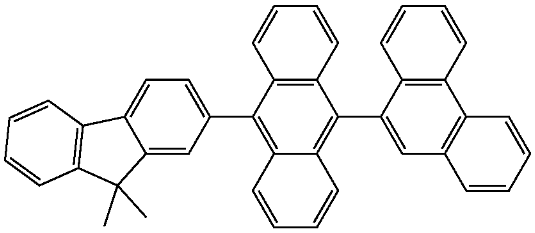
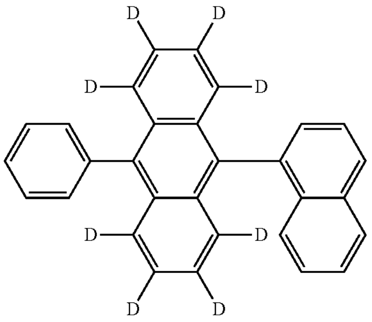
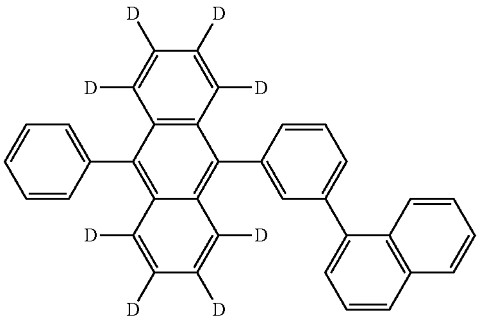

-continued
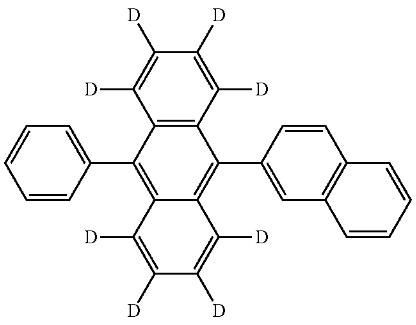
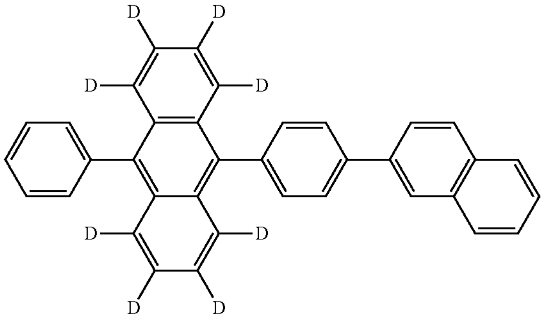
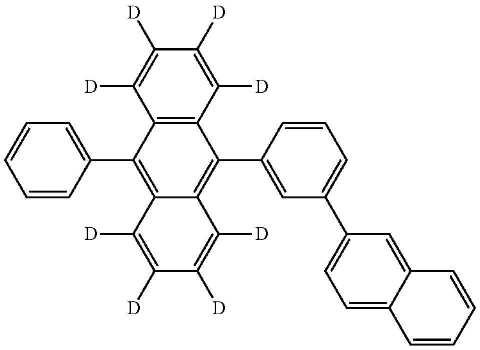
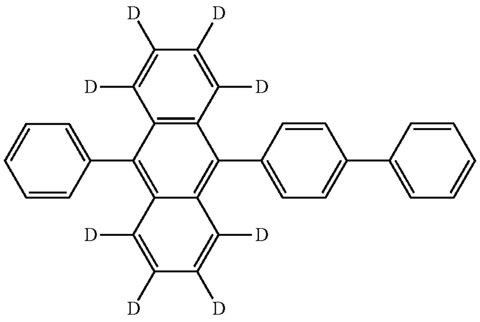
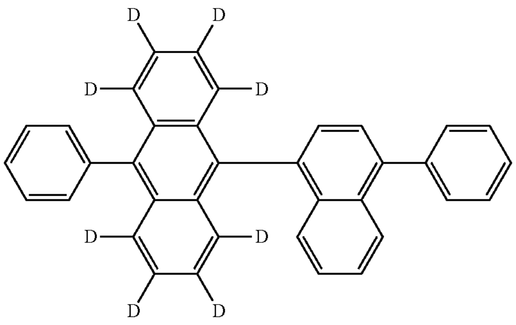
-continued
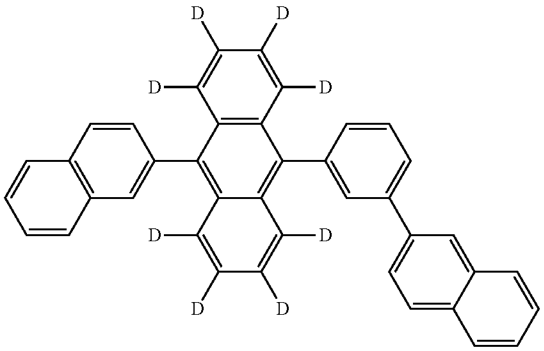
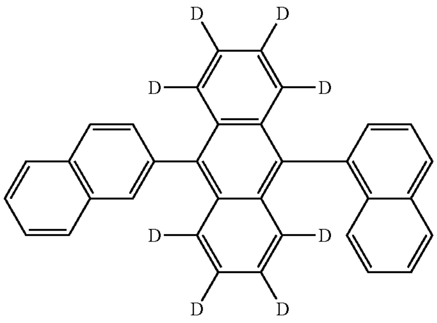
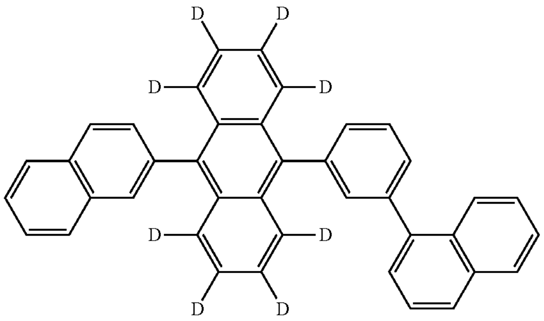
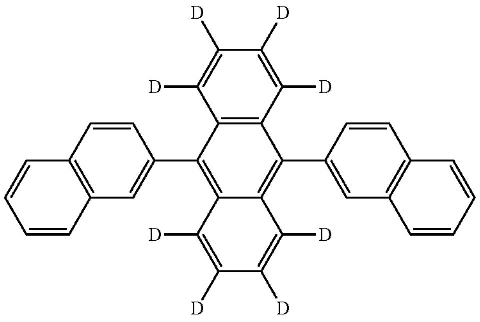
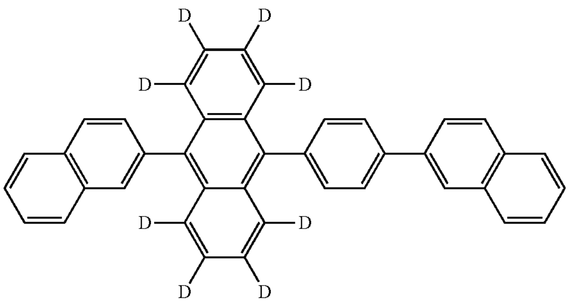

-continued
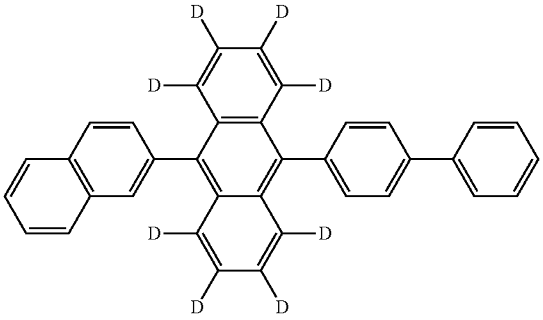
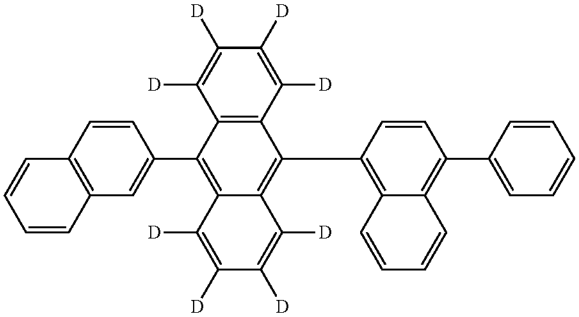
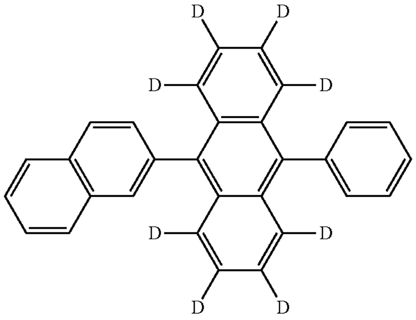
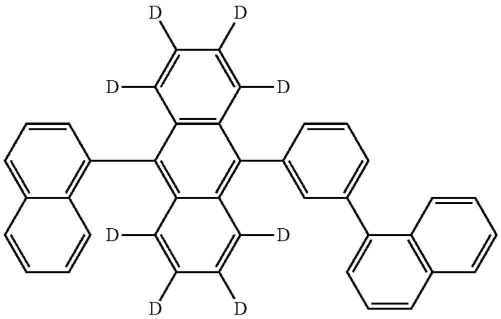
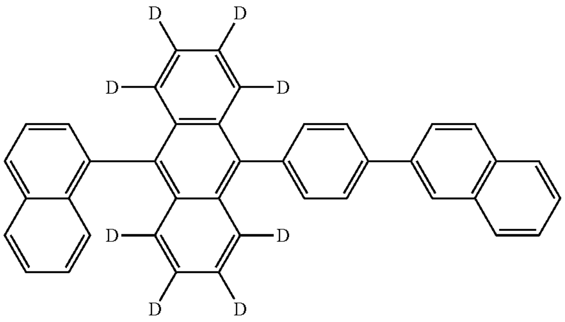
-continued
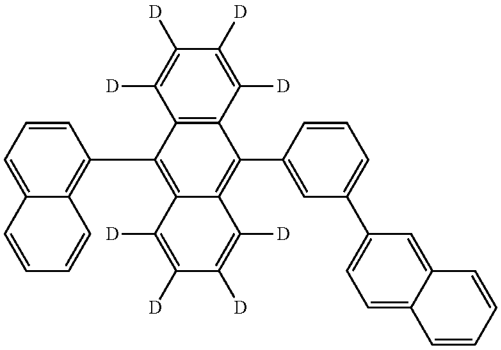
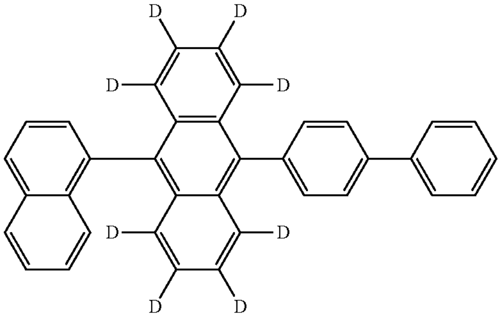
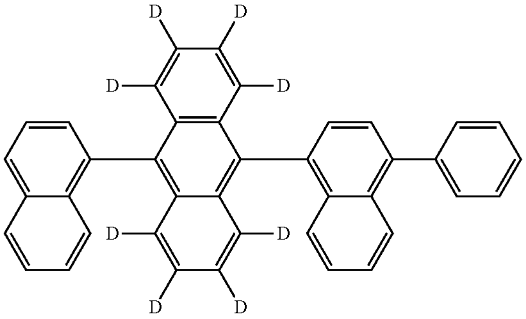
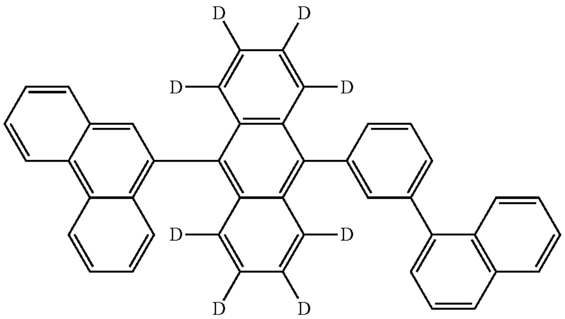
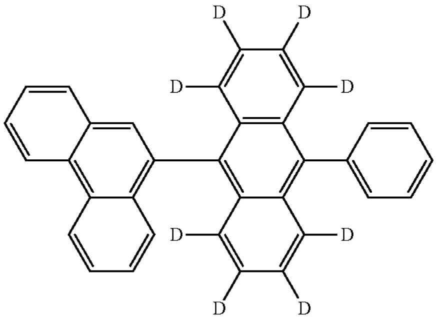

-continued
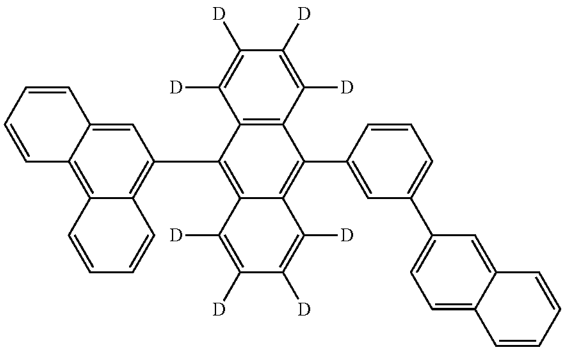
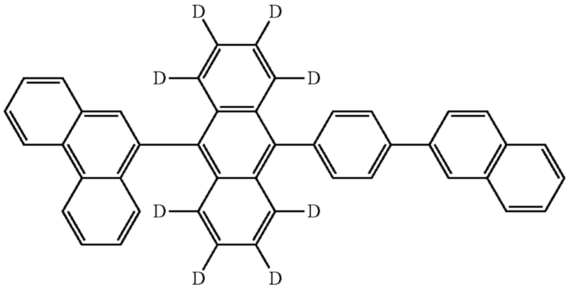
[Formula 106]
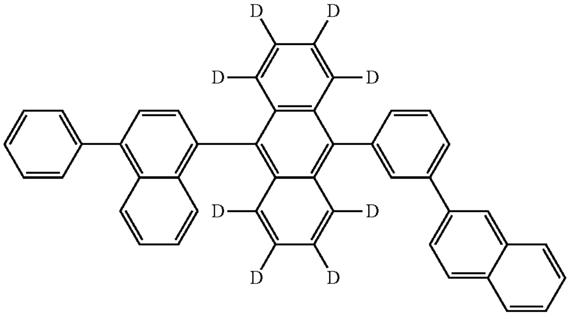
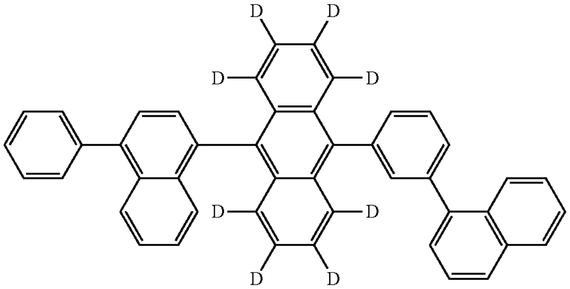
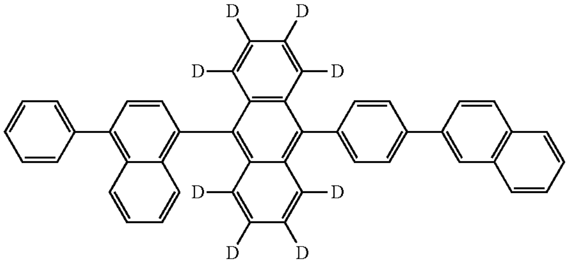
-continued
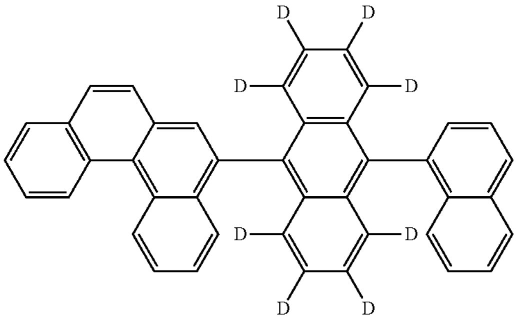
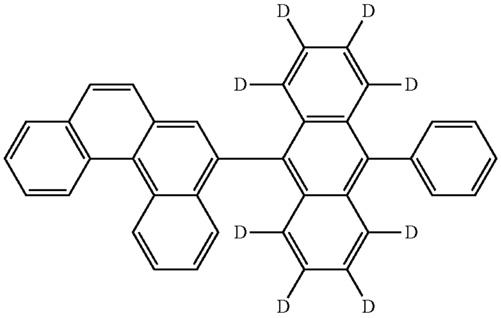
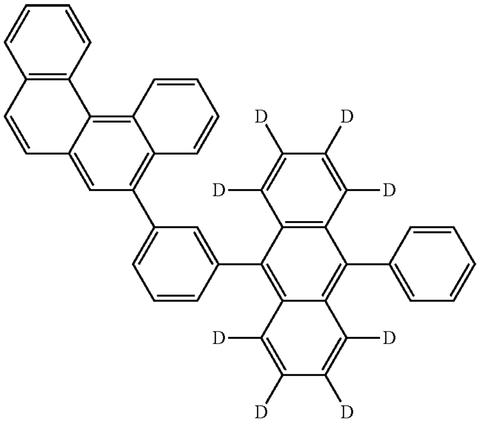
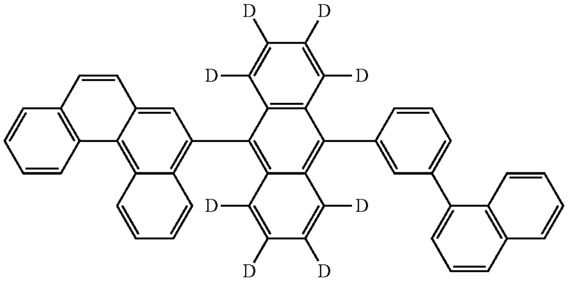

-continued
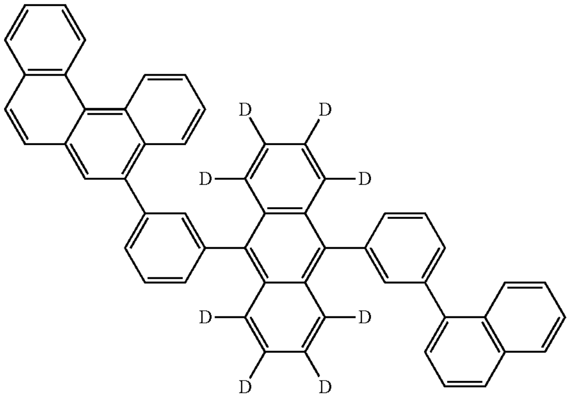
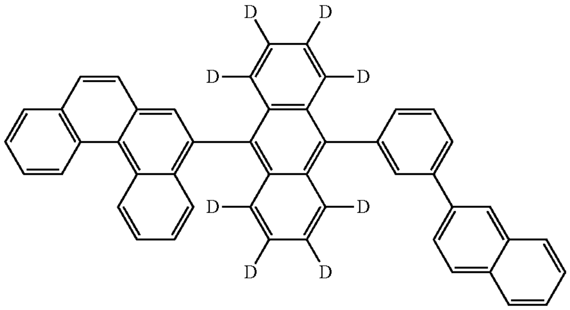
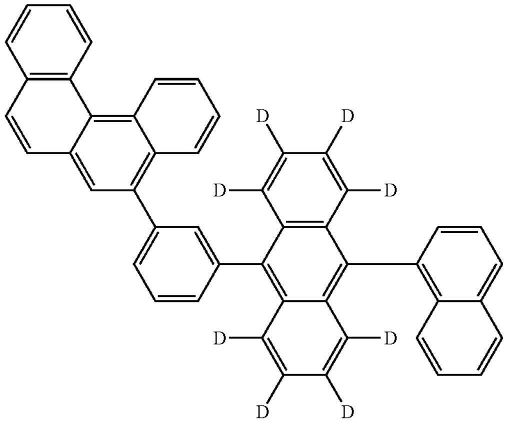
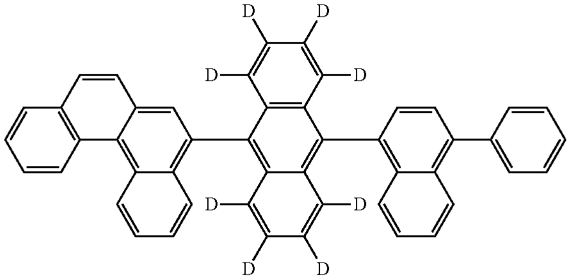
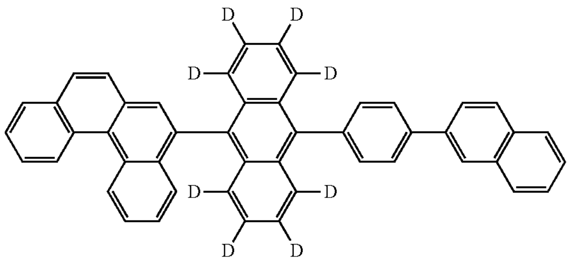
-continued
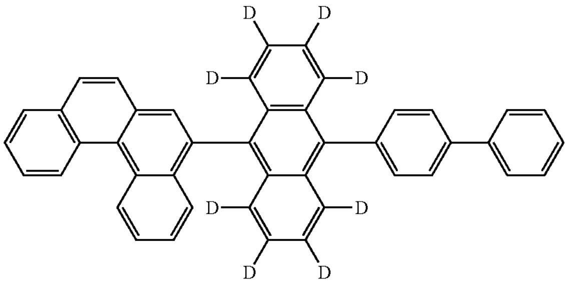
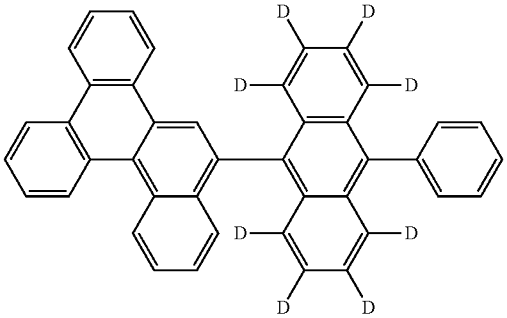
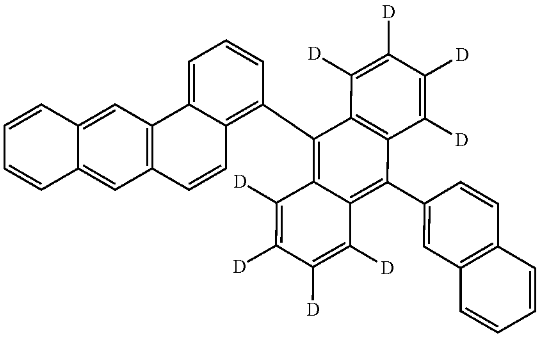
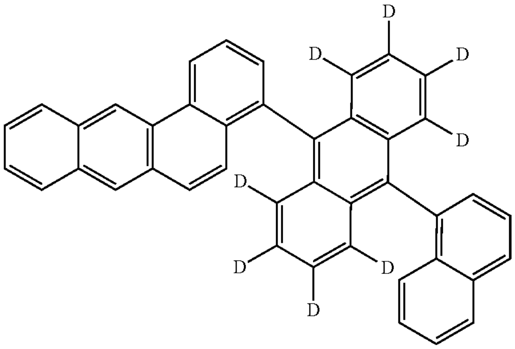
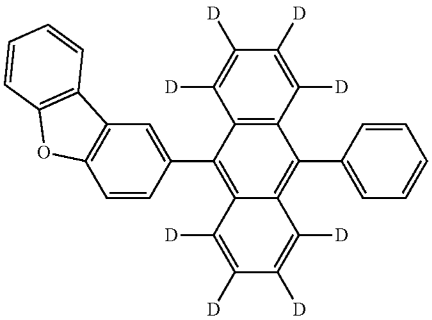

-continued
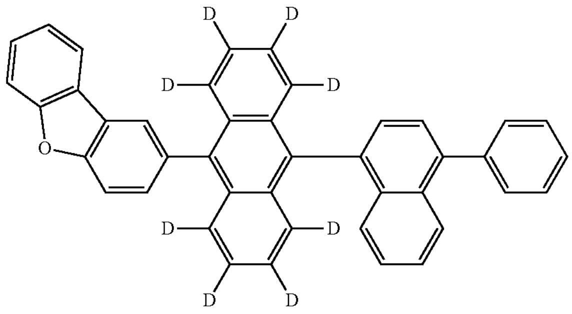
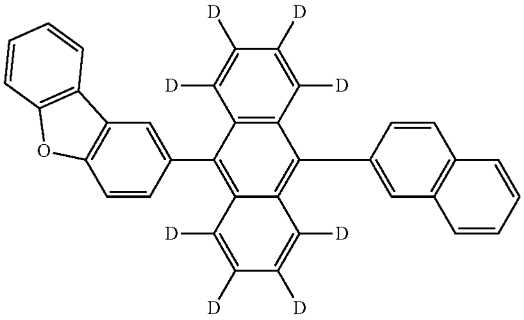
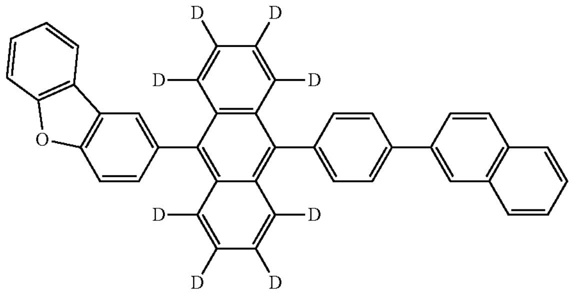
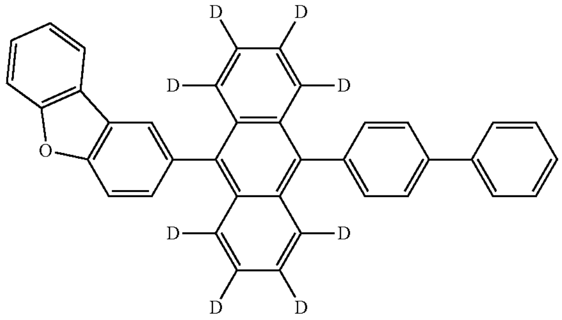
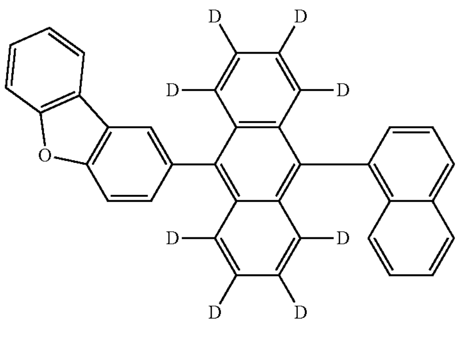
-continued
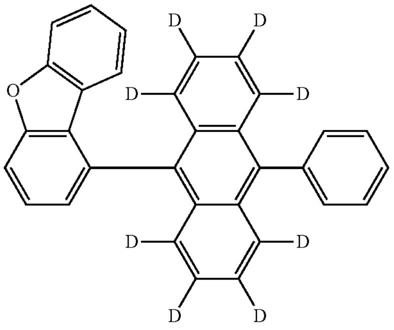
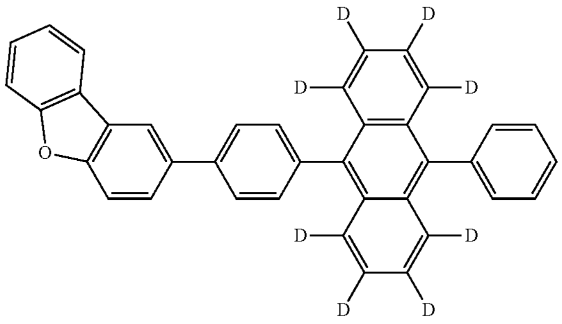
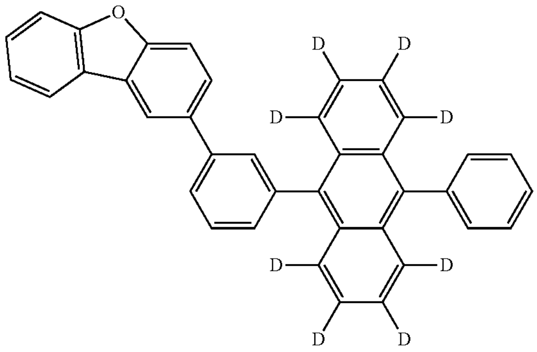
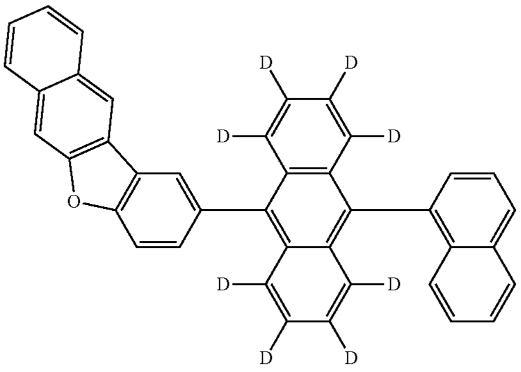
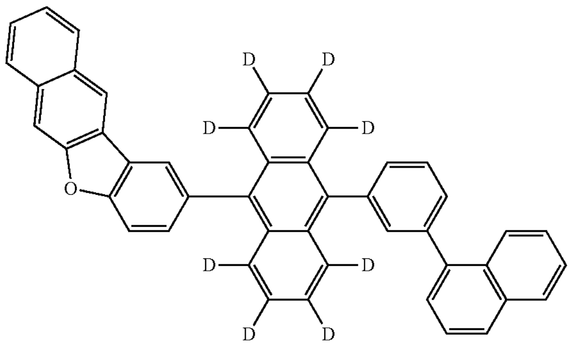

-continued
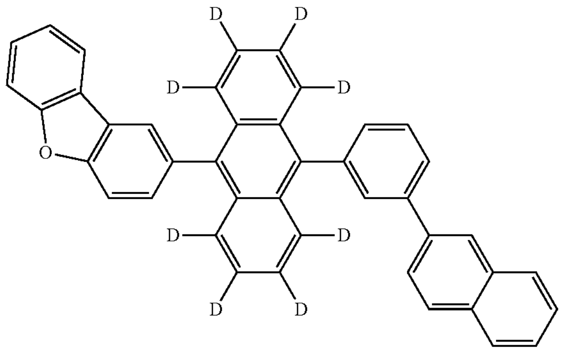
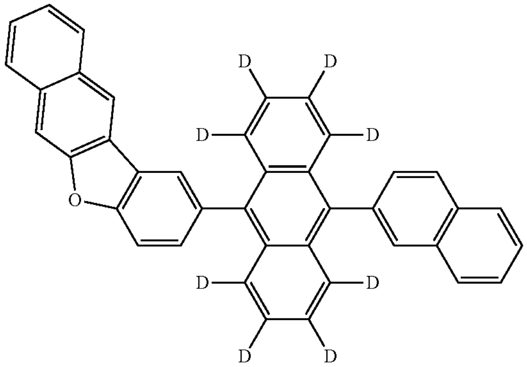
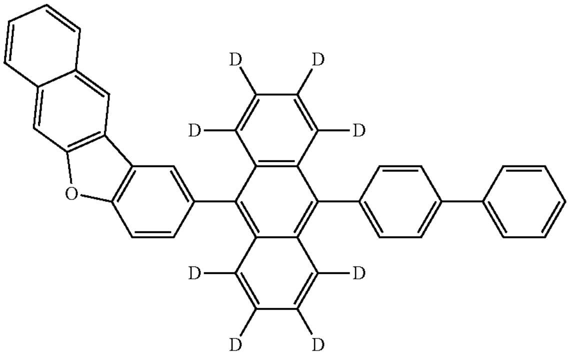
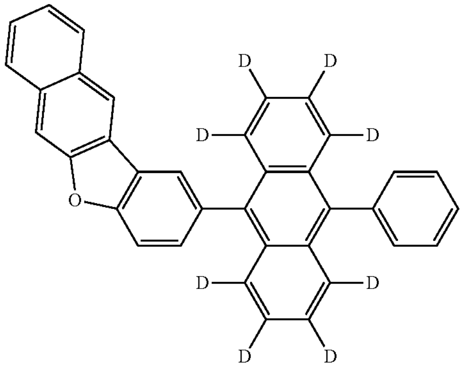
-continued
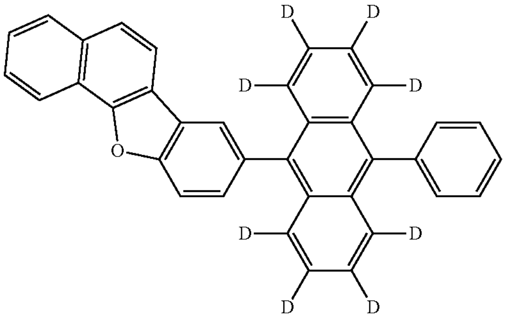
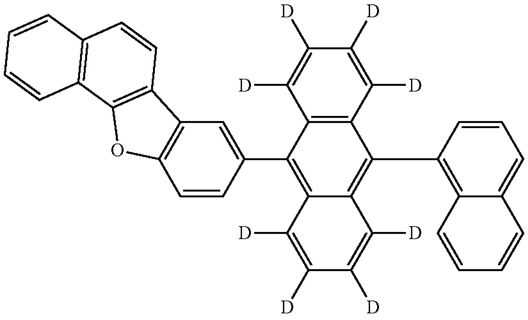
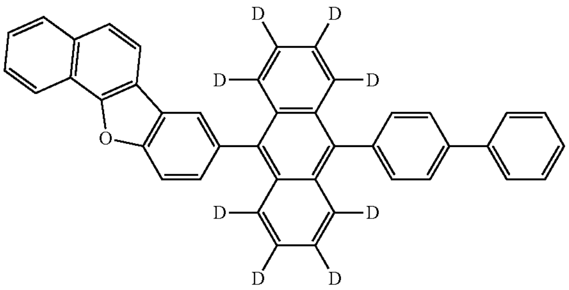
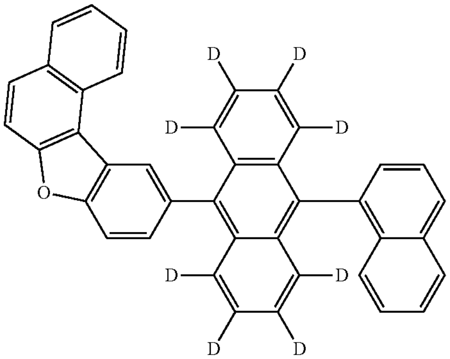
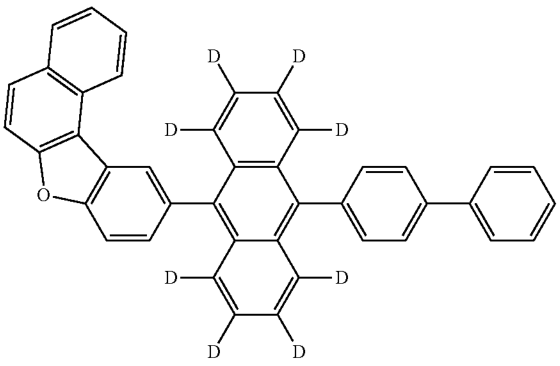

-continued
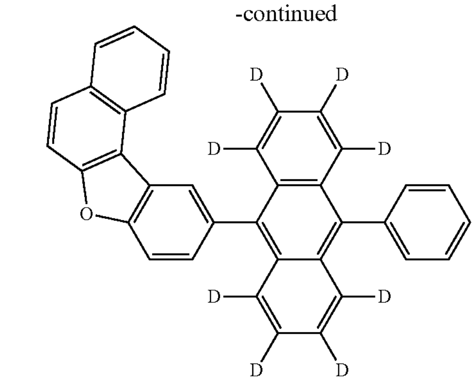
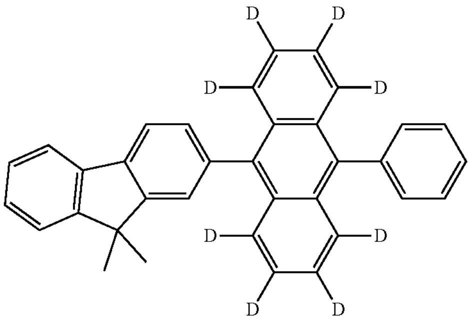
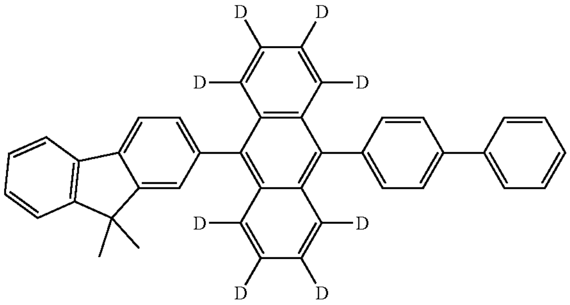
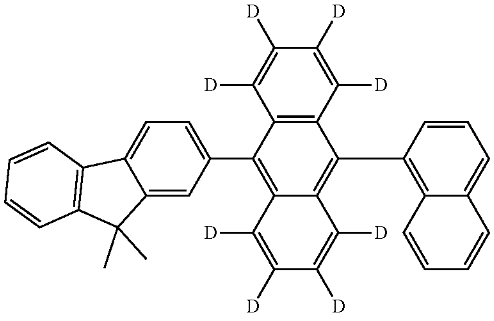
[Formula 107]
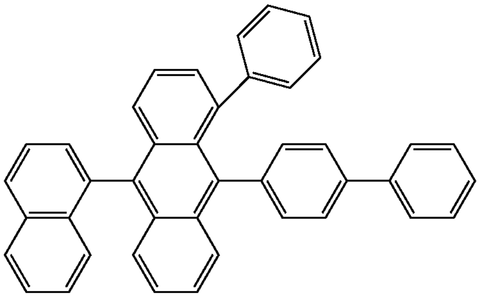
-continued
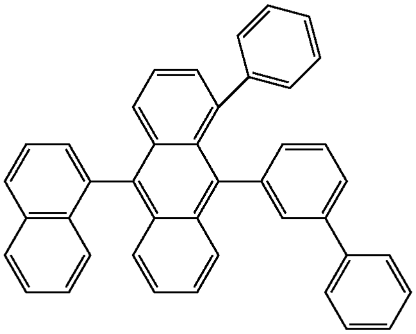
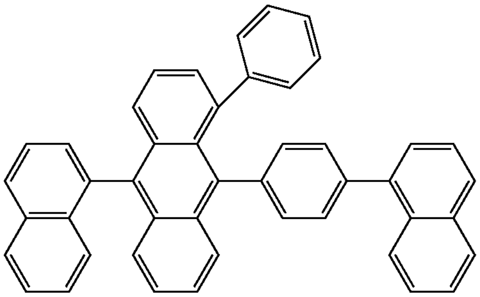
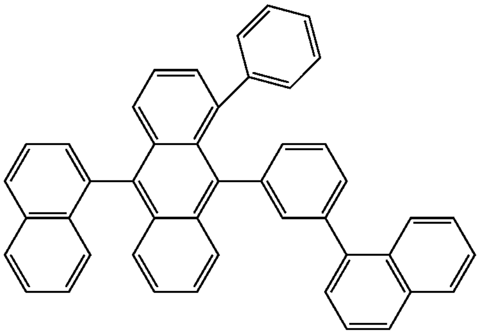
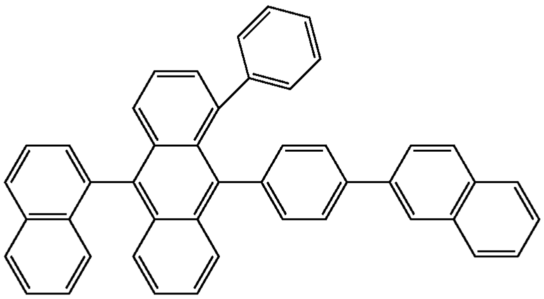
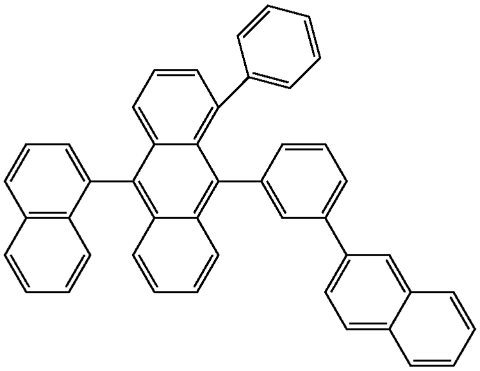

-continued
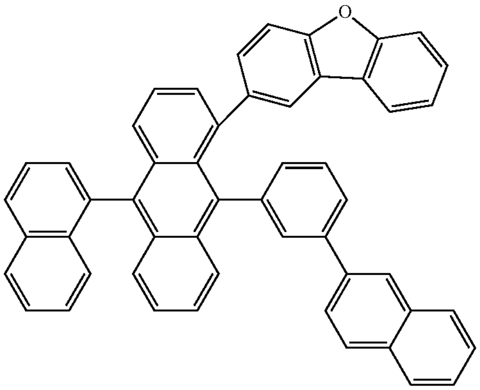
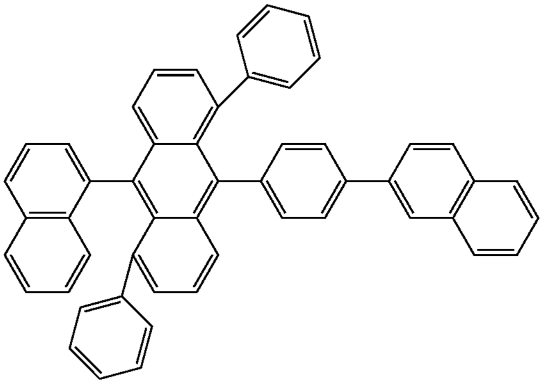
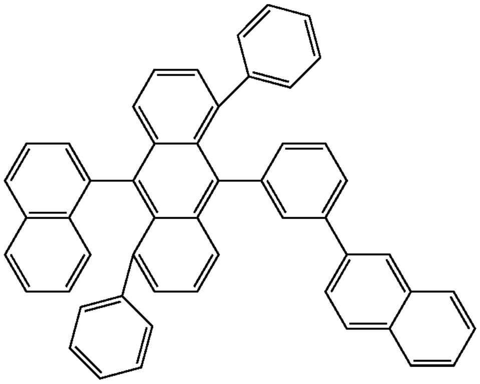
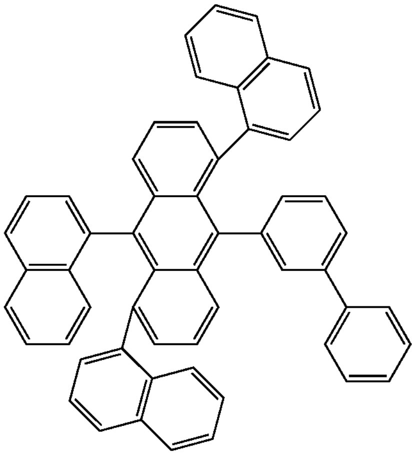
-continued
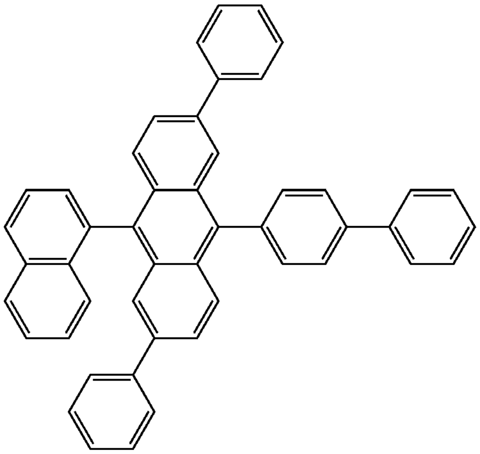
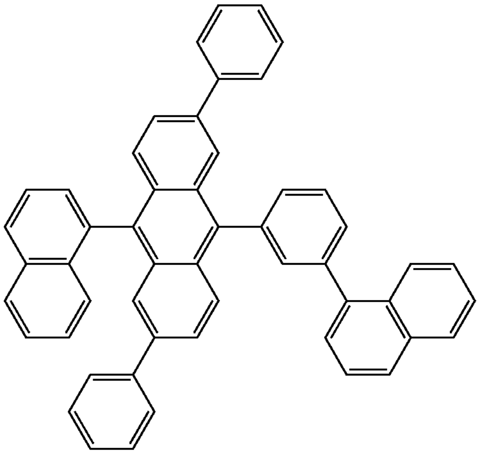
[Formula 108]
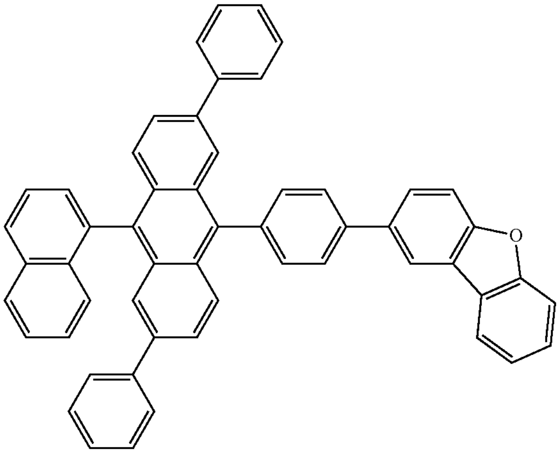

-continued
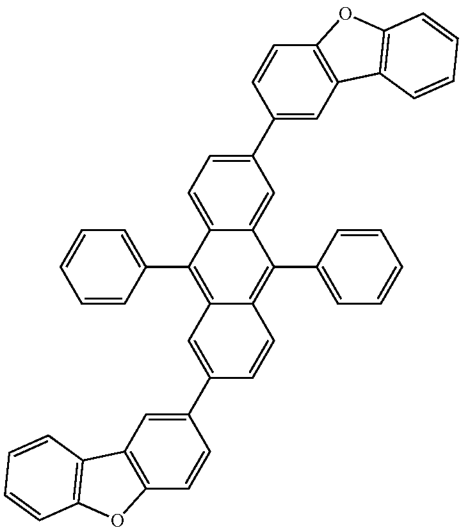
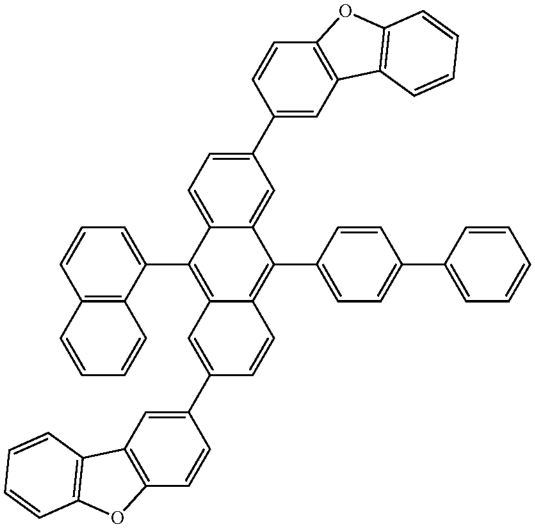
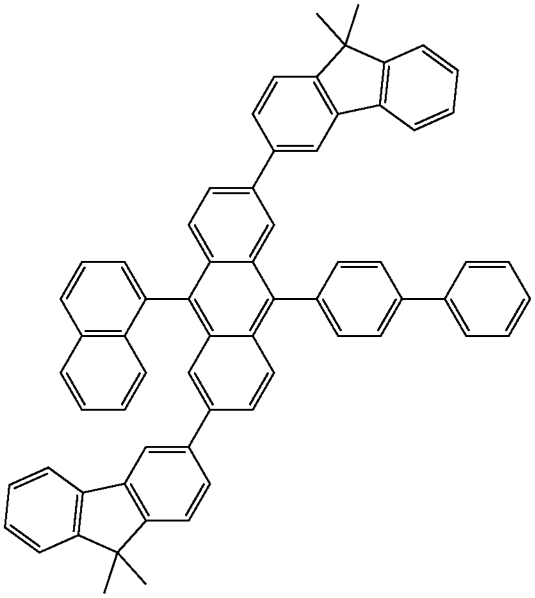
-continued
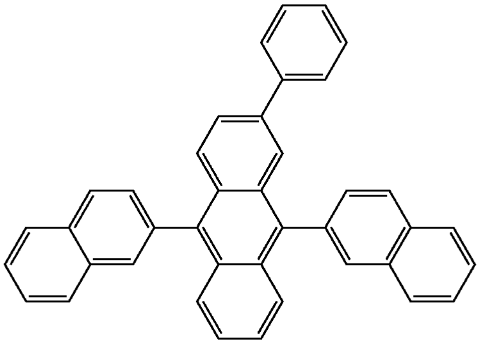
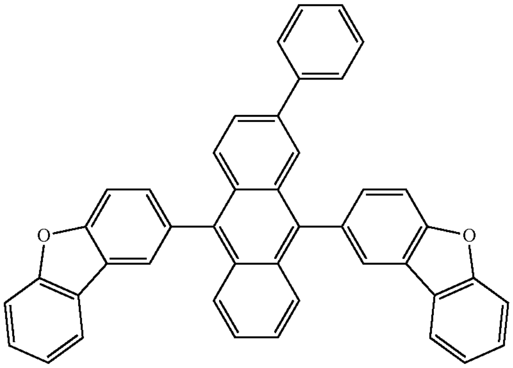
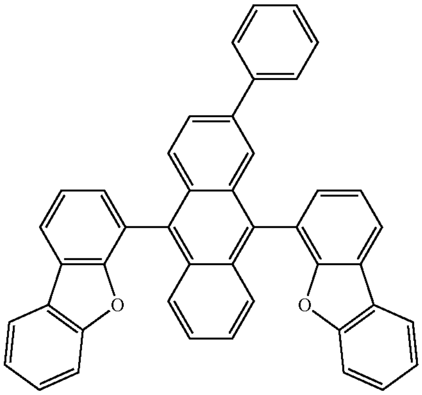
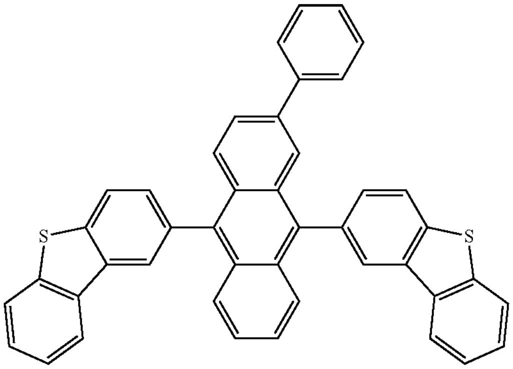

-continued
[Formula 109]
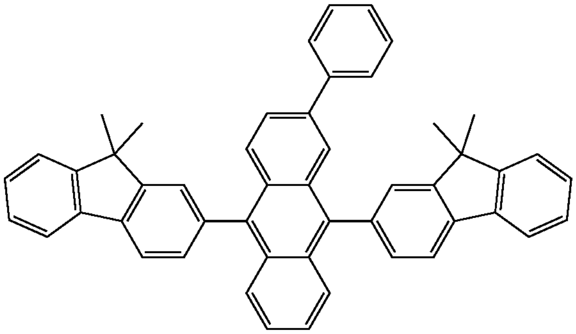
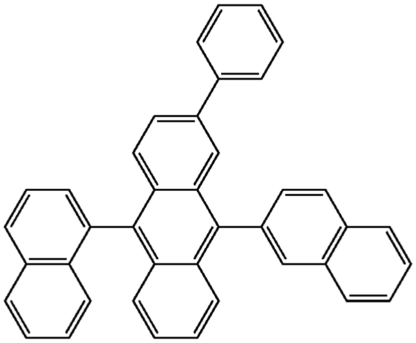
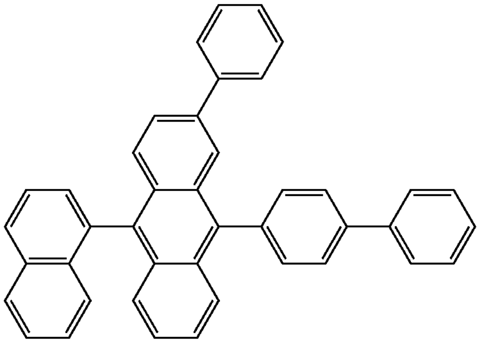
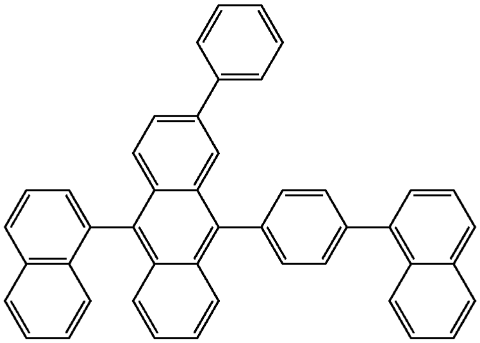
-continued
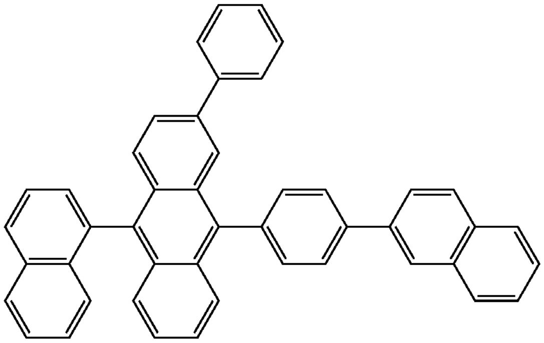
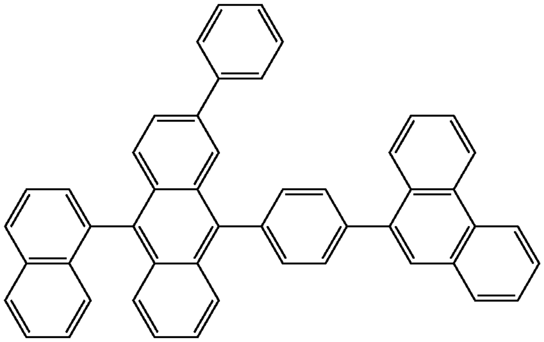
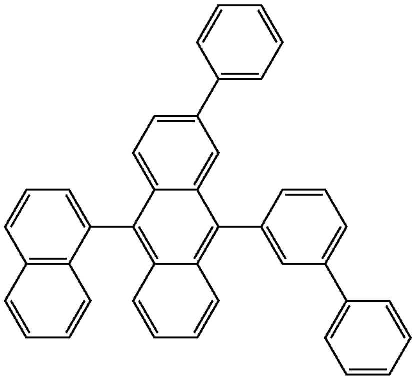
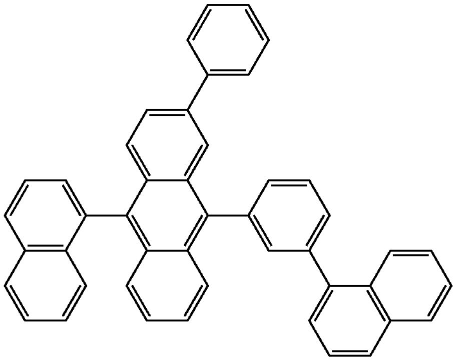

-continued
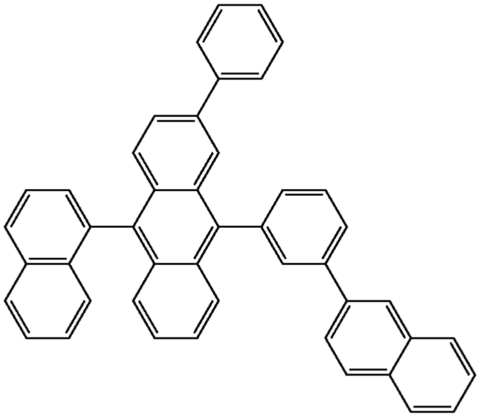
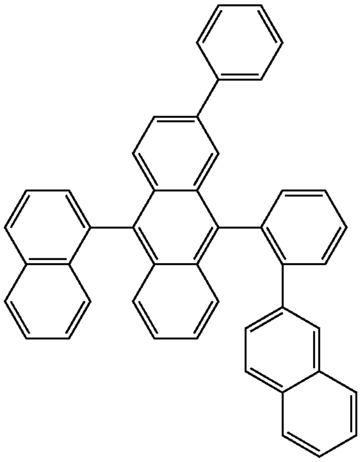
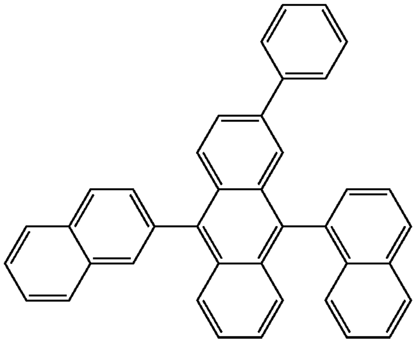
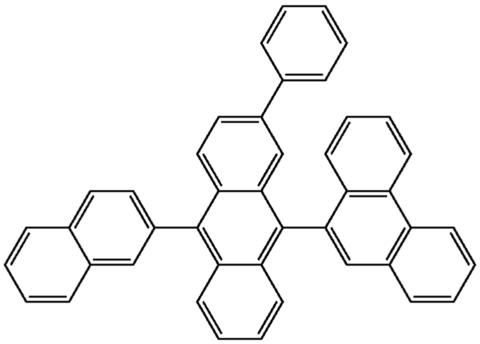
-continued
[Formula 110]
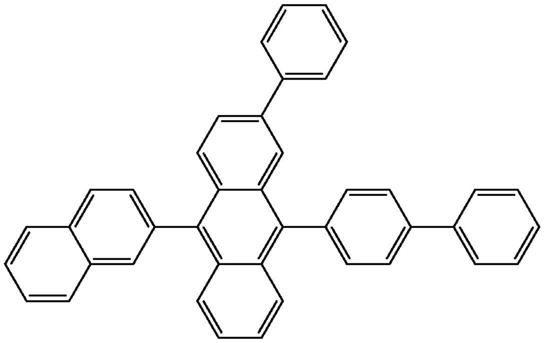
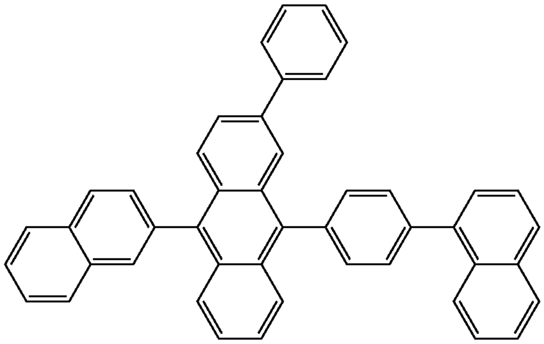
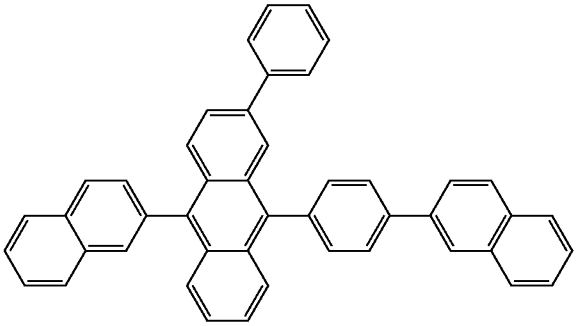
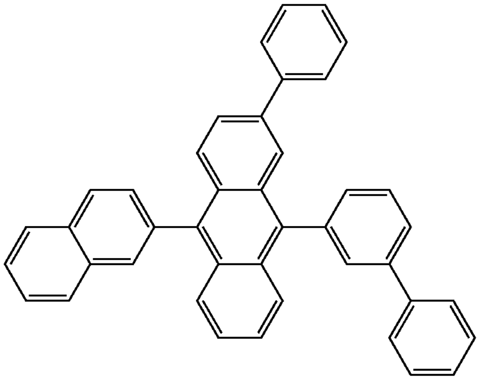

-continued
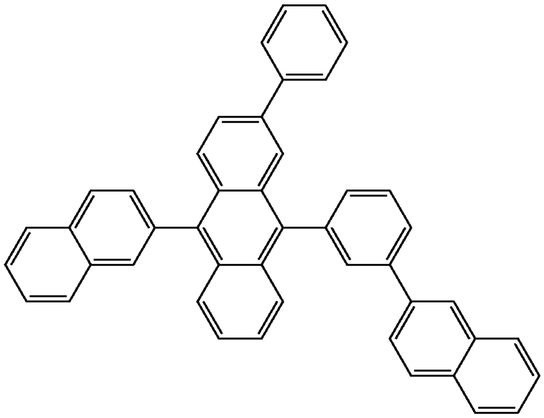
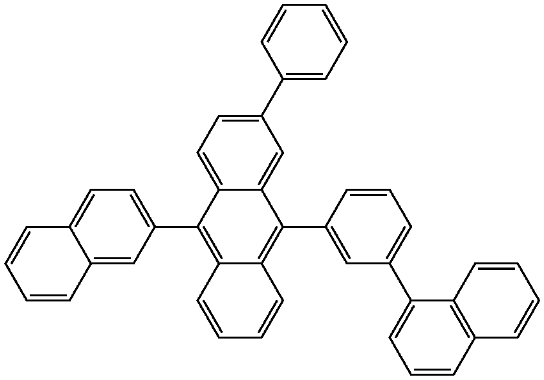
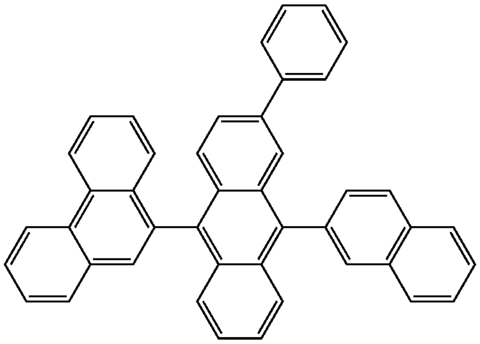
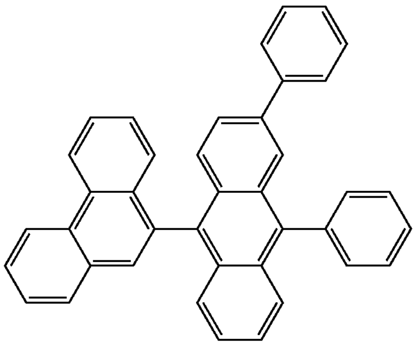
-continued
[Formula 111]
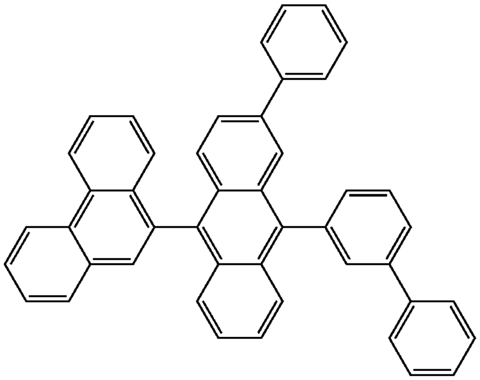
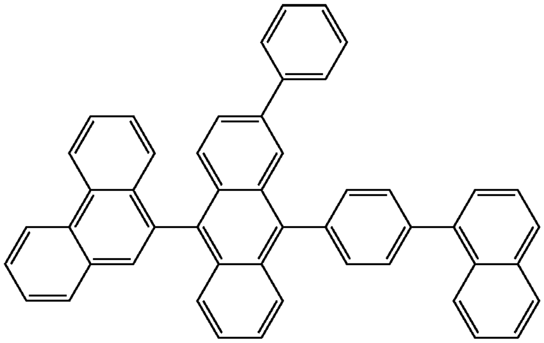
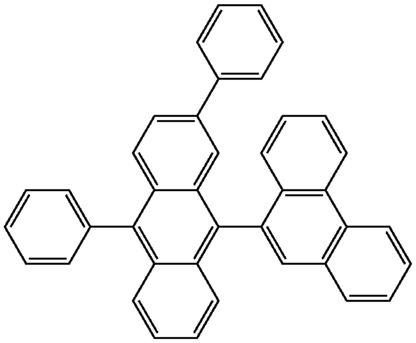
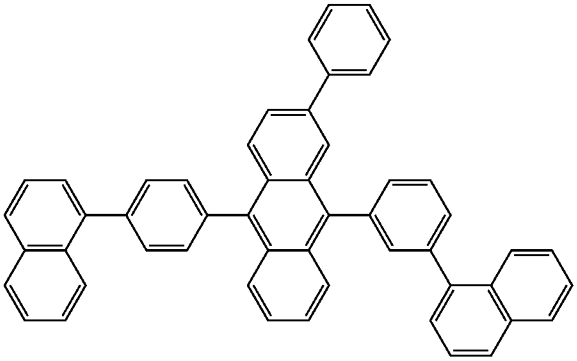

-continued
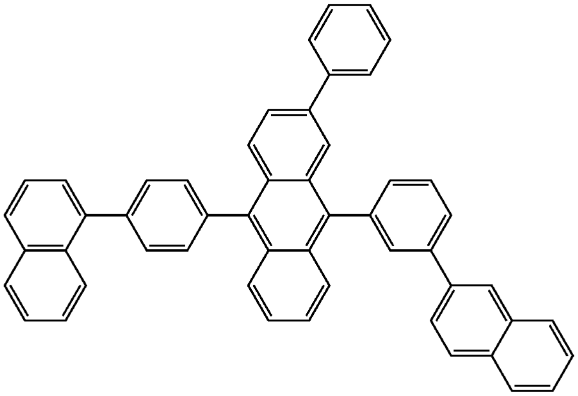
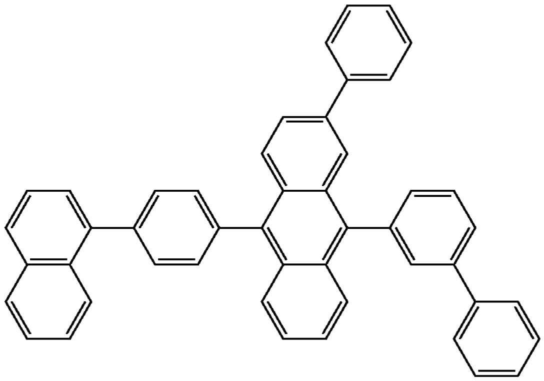
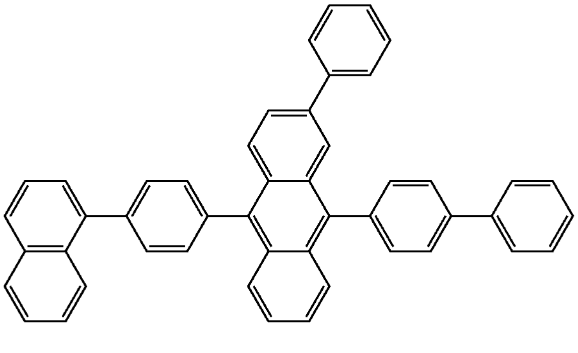
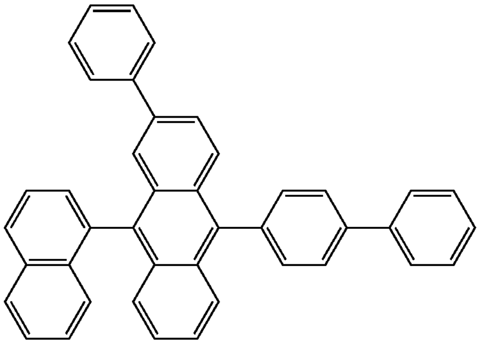
-continued
[Formula 112]
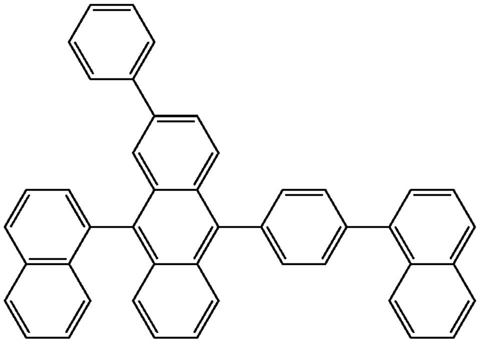
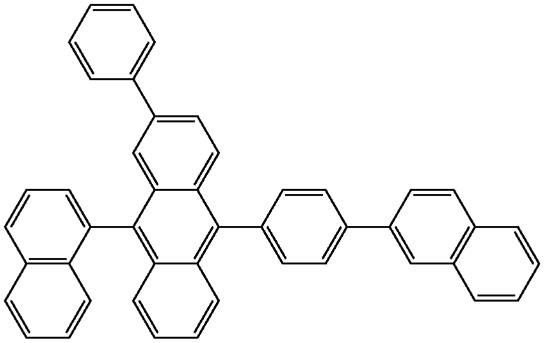
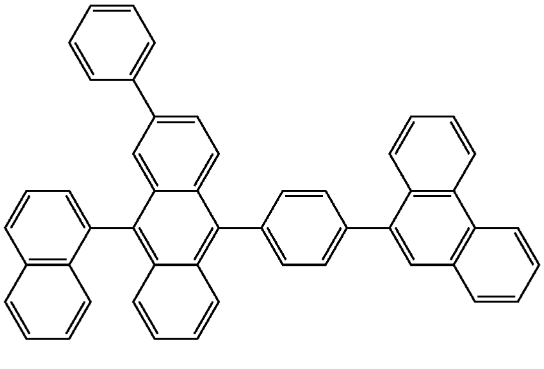
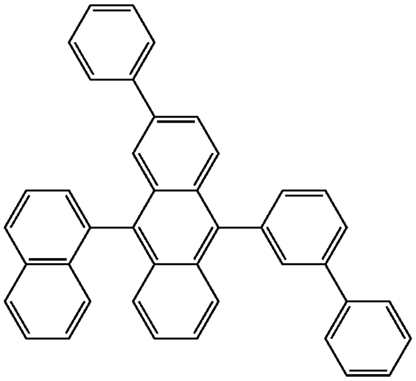

-continued
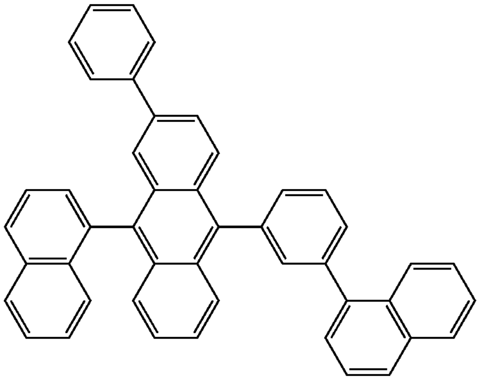
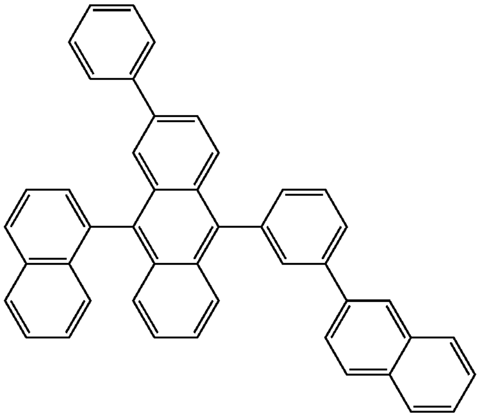
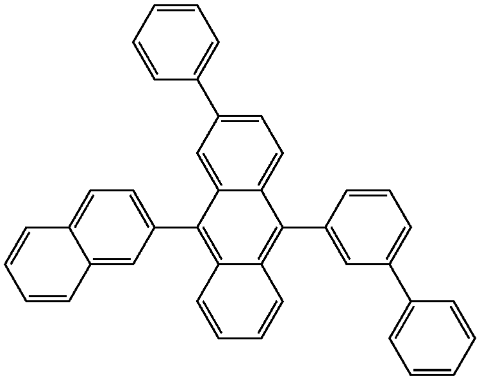
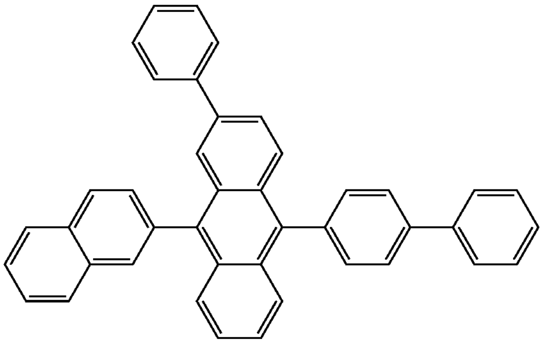
-continued
[Formula 113]
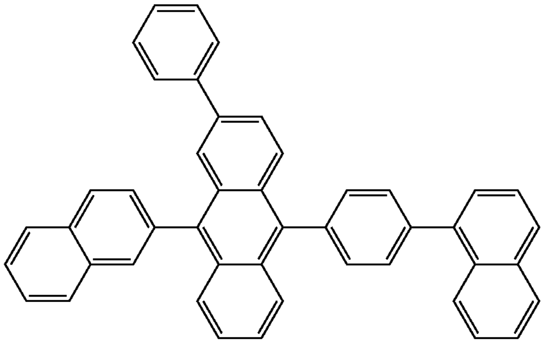
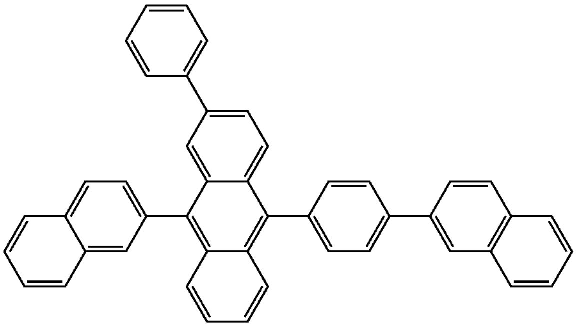
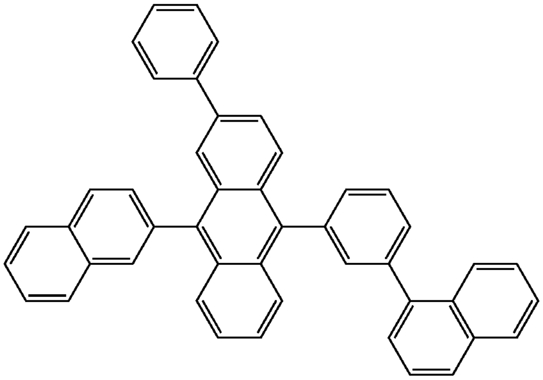
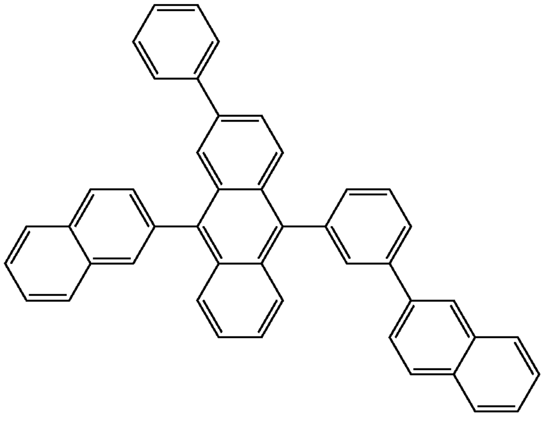

-continued
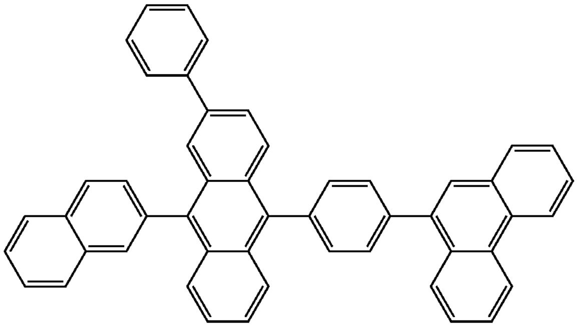
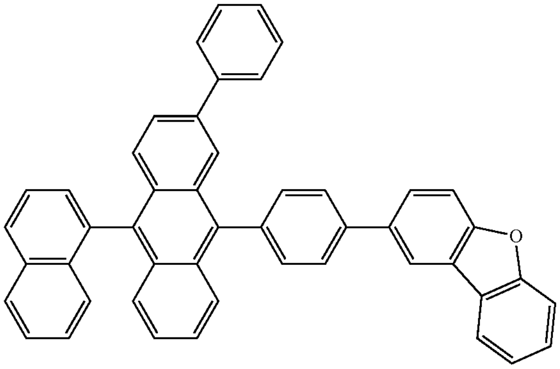
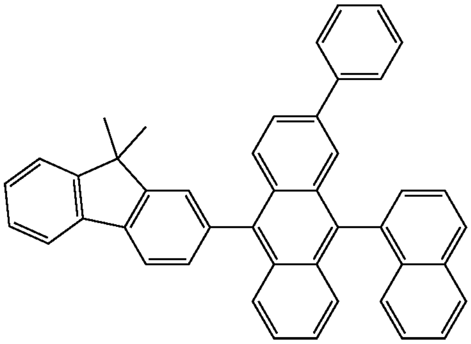
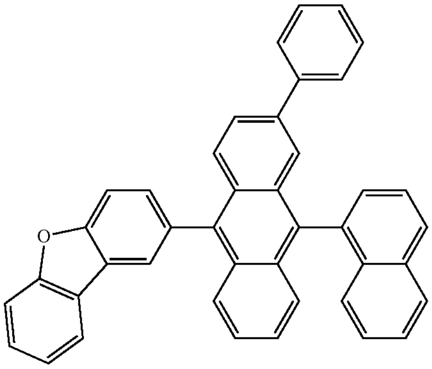
-continued
[Formula 114]
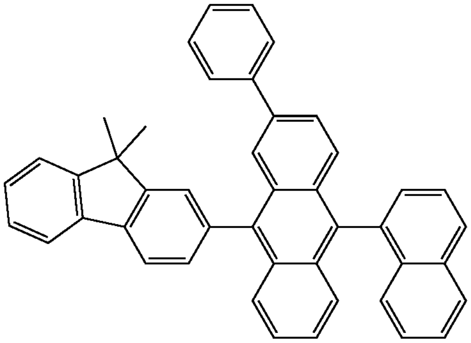
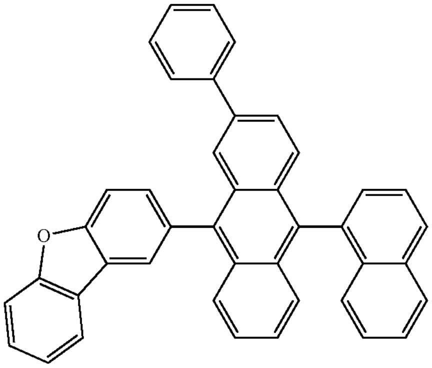
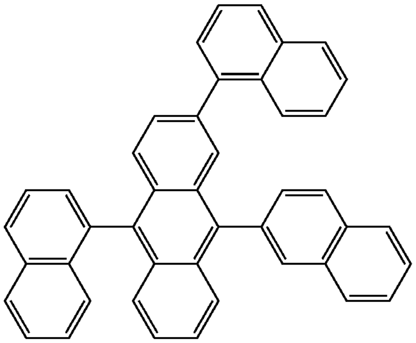
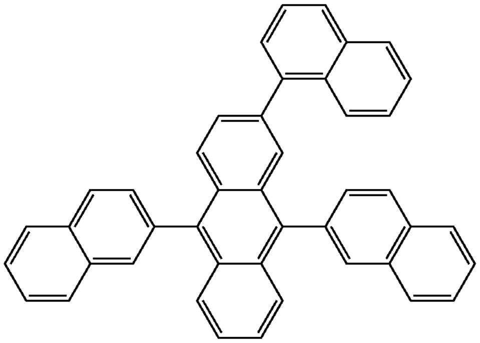

-continued
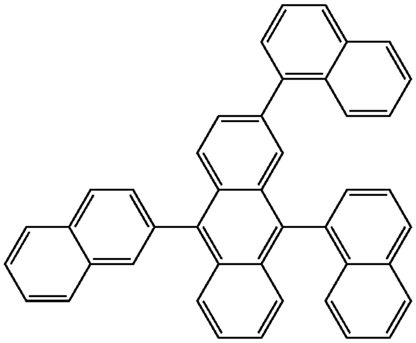
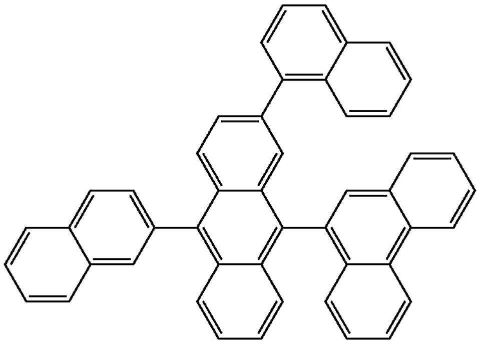
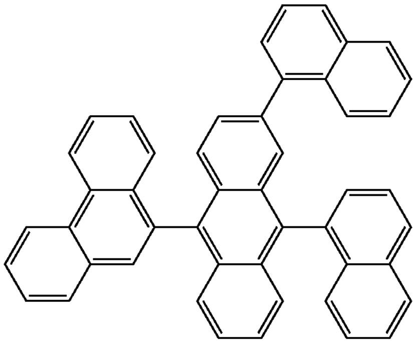
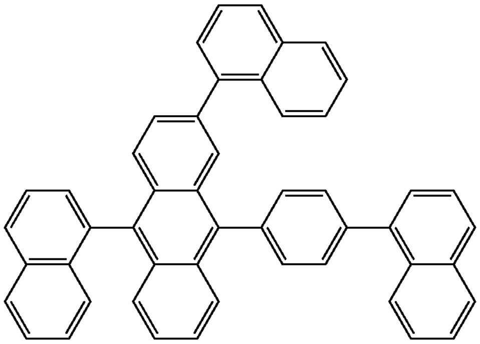
[Formula 115]
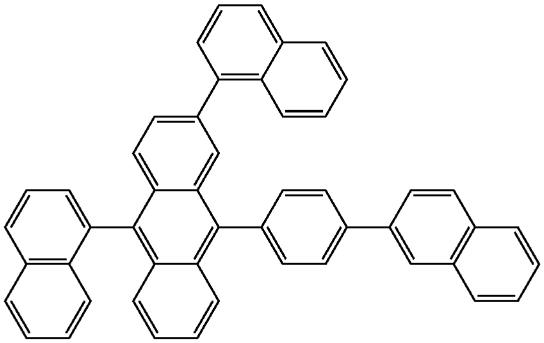
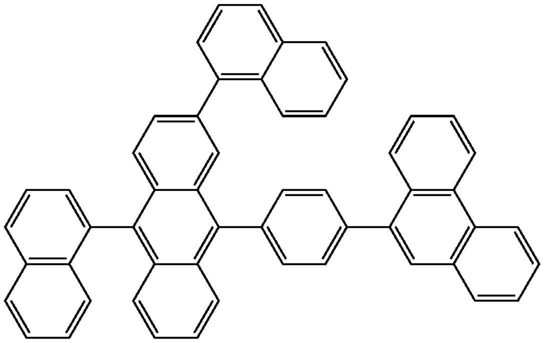
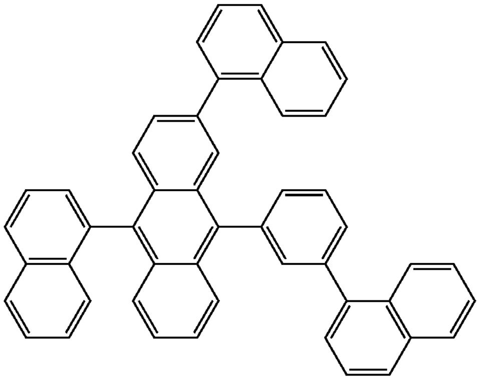
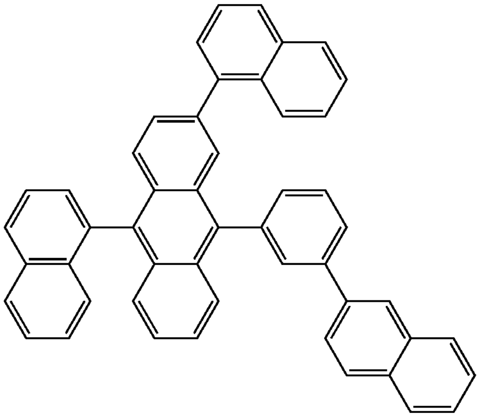

-continued
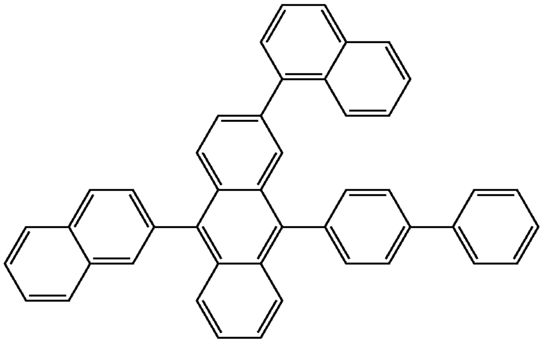
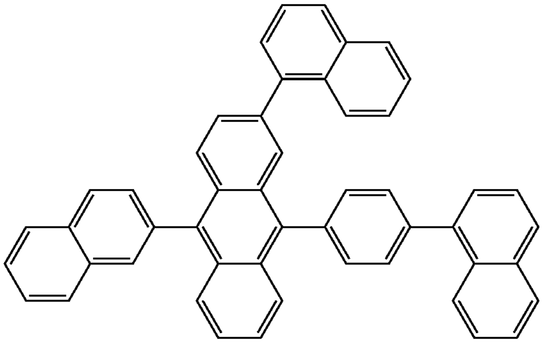
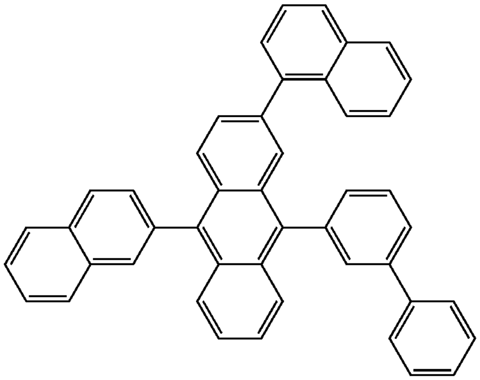
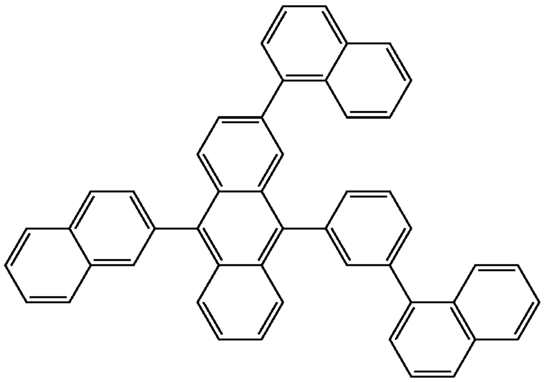
-continued
[Formula 116]
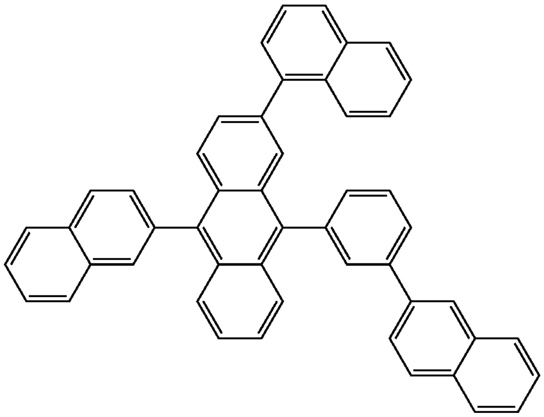
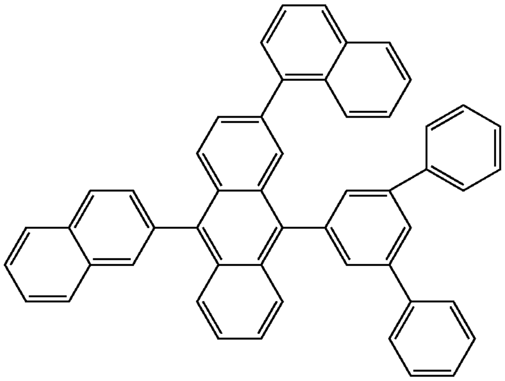
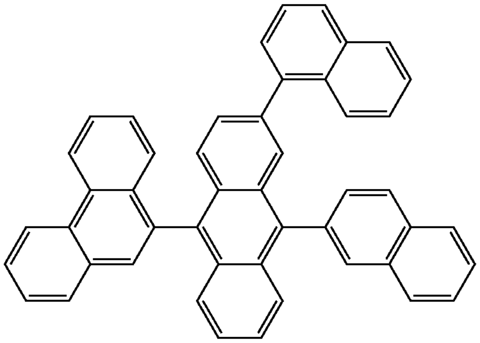
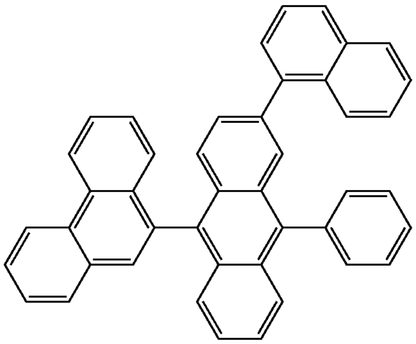

-continued
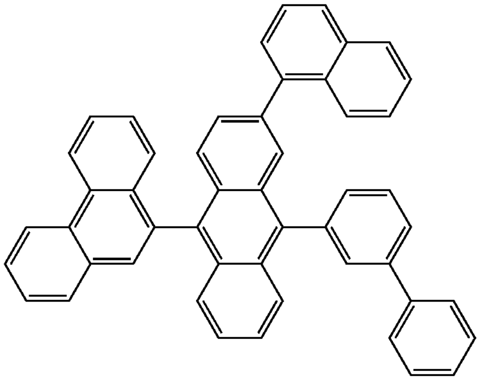
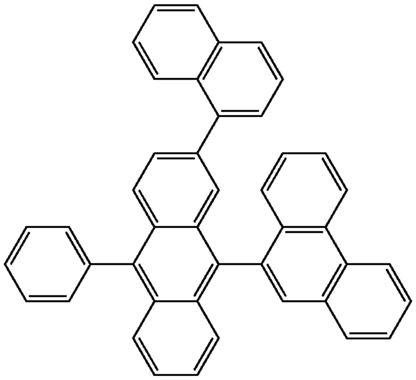
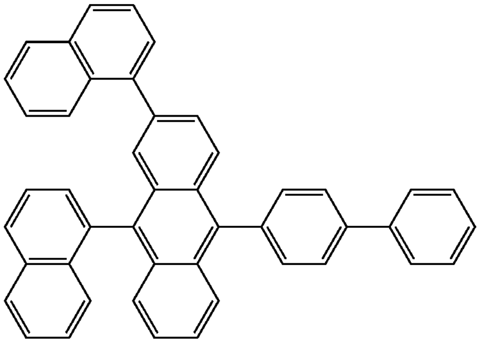
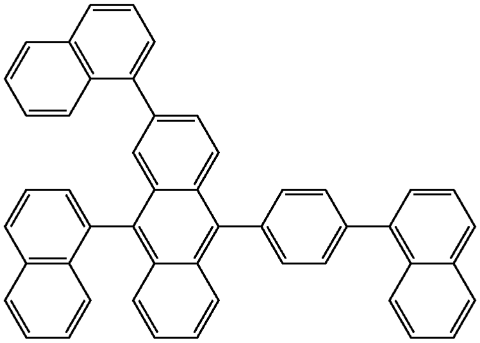
-continued
[Formula 117]
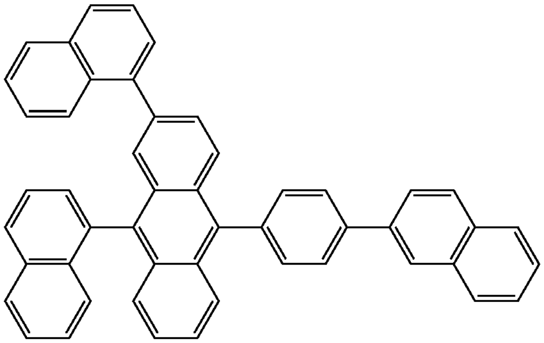
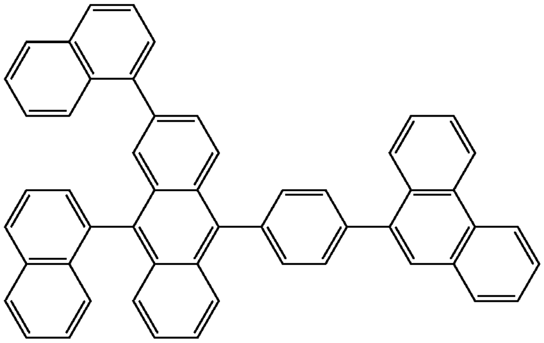
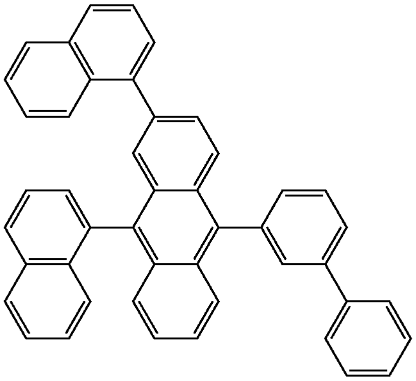
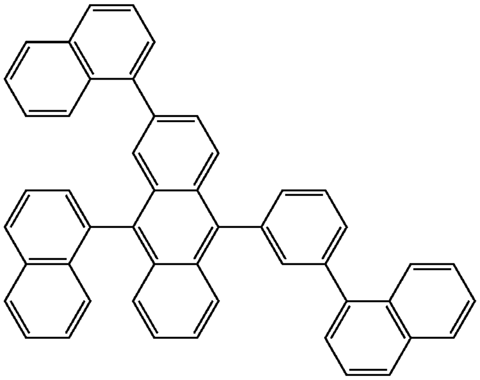

-continued
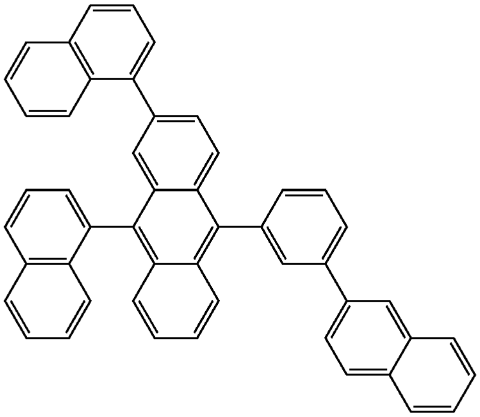
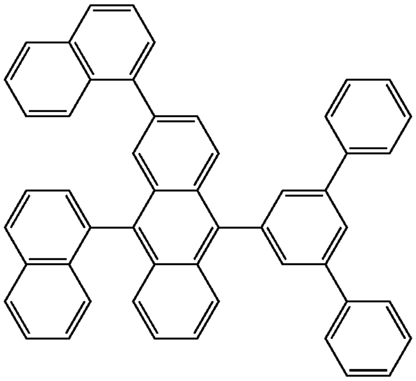
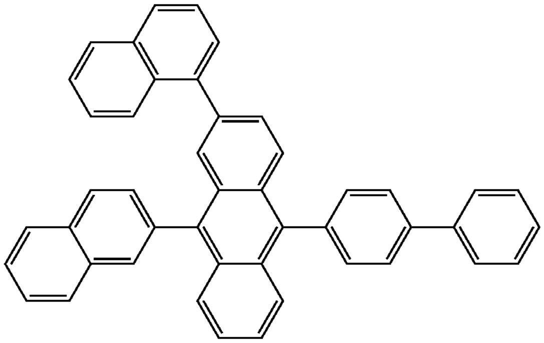
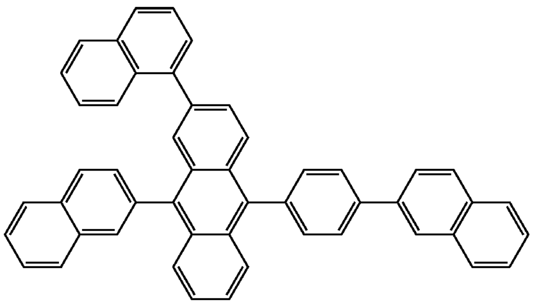
-continued
[Formula 118]
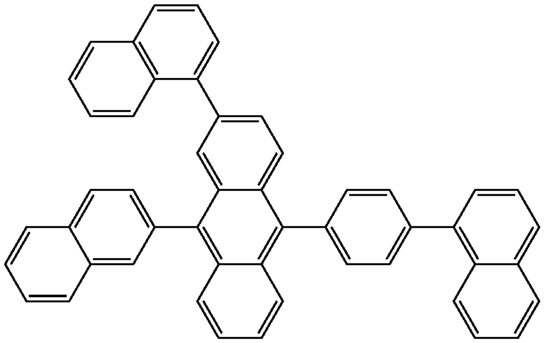
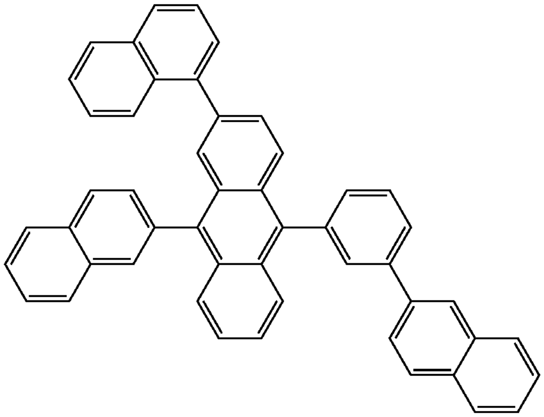
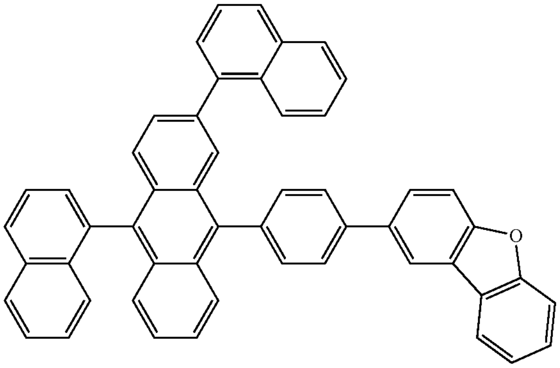
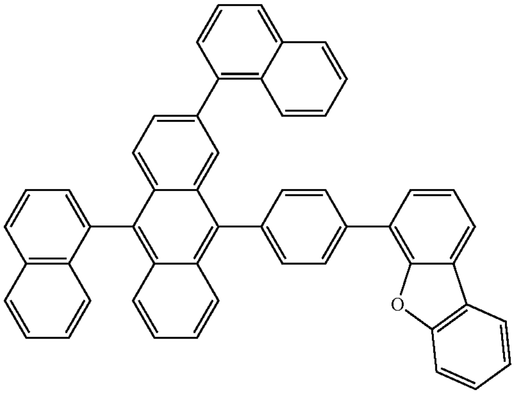

-continued
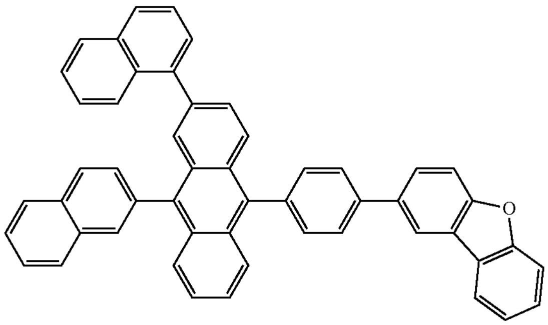
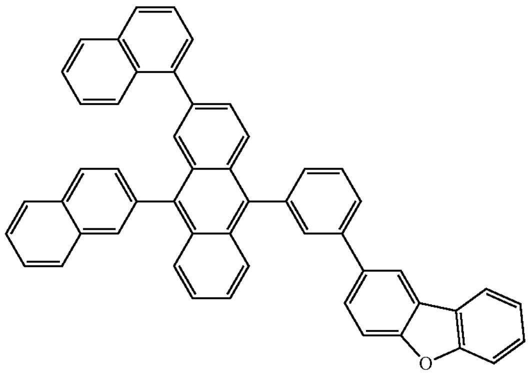
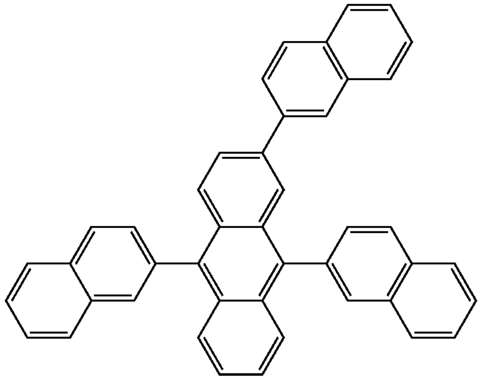
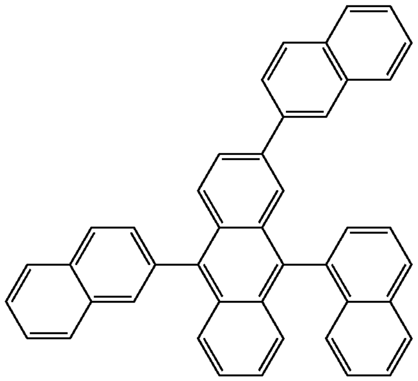
-continued
[Formula 119]
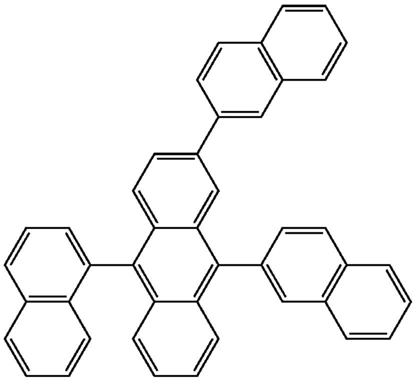
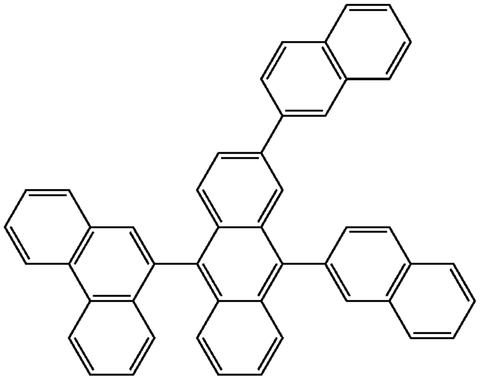
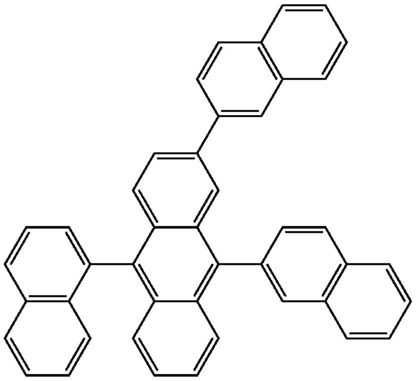
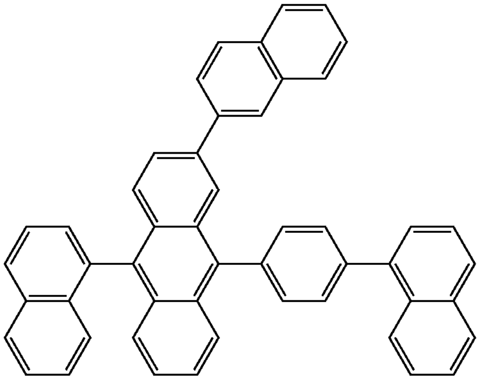

-continued
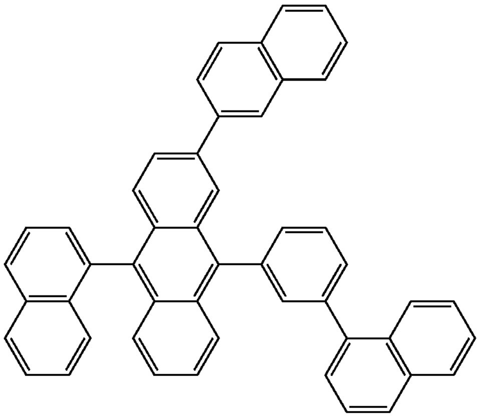
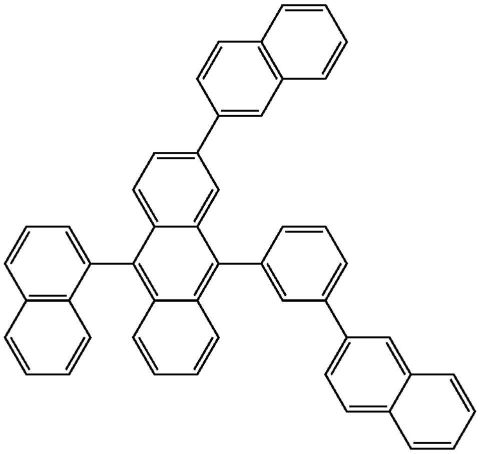
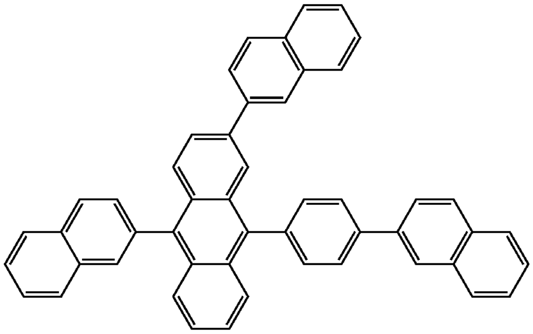
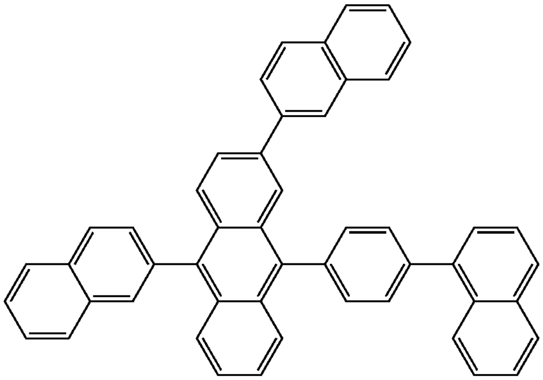
-continued
[Formula 120]
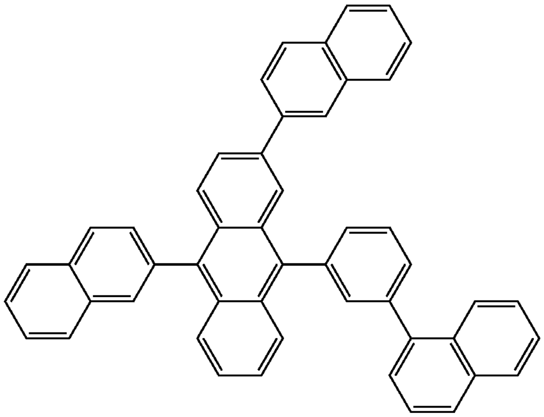
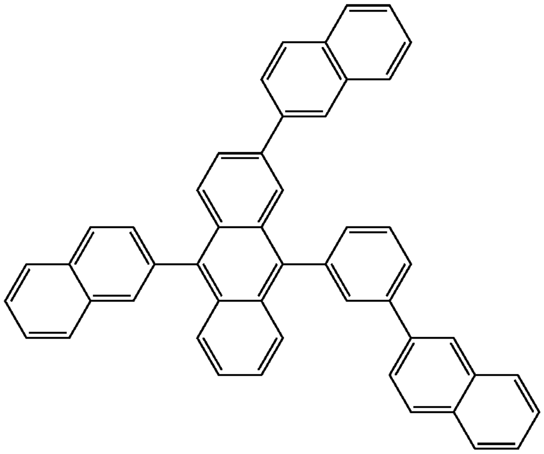
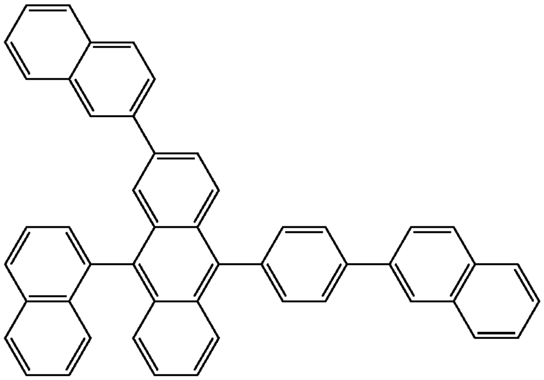
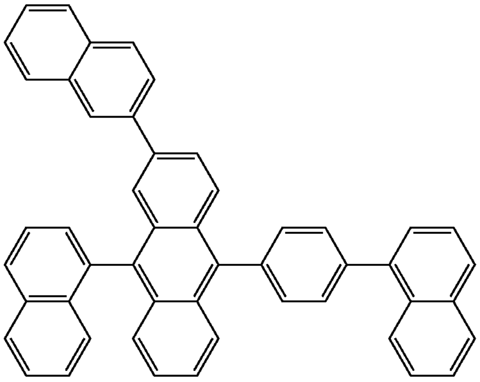

-continued
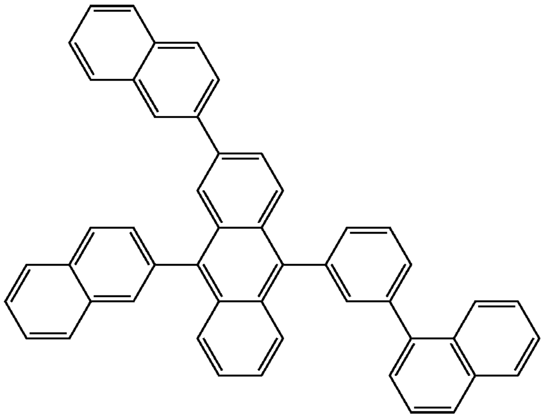
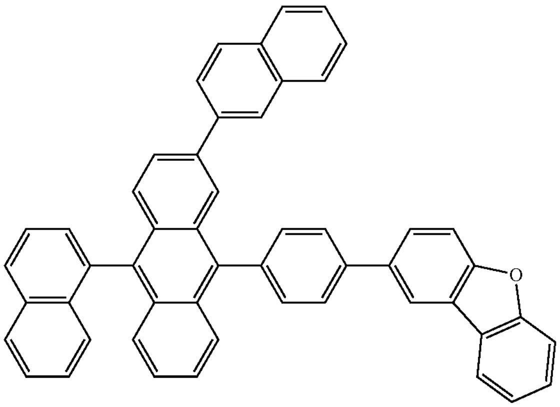
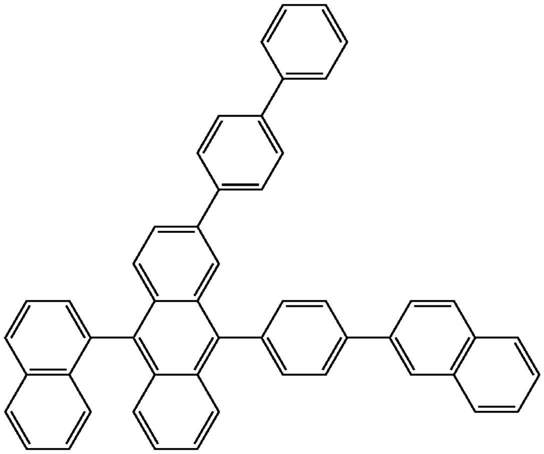
-continued
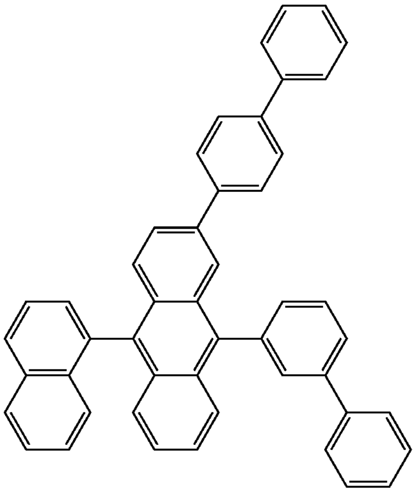
[Formula 121]
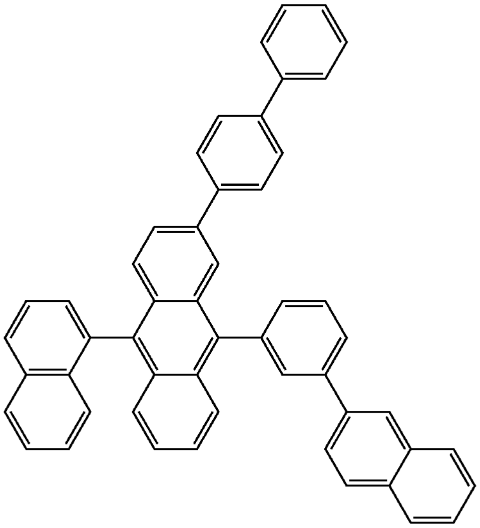
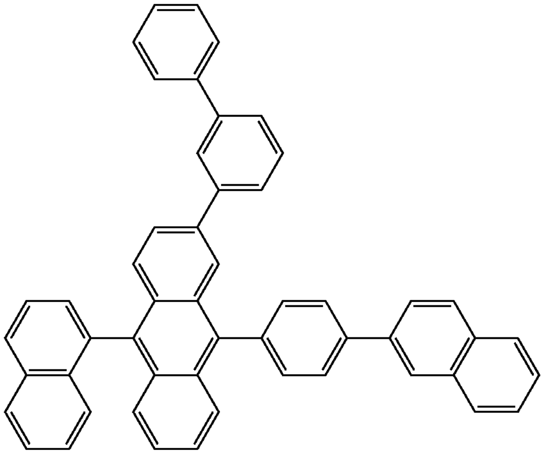

-continued
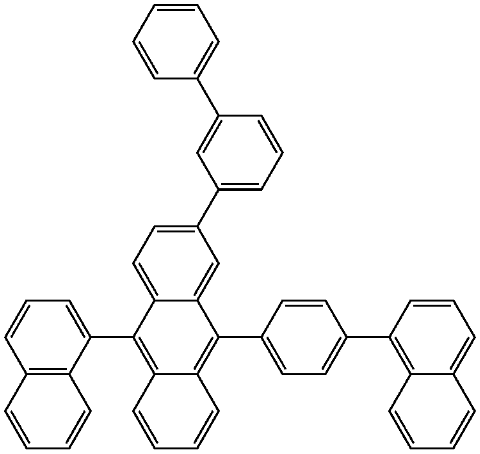
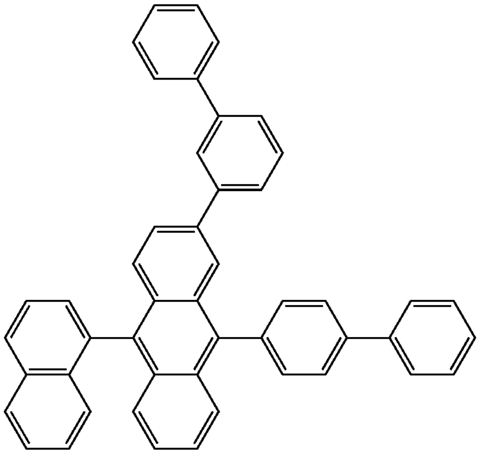
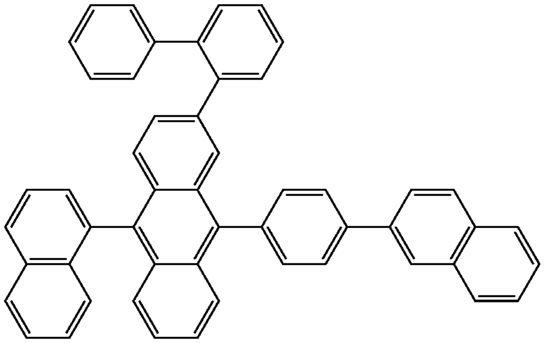
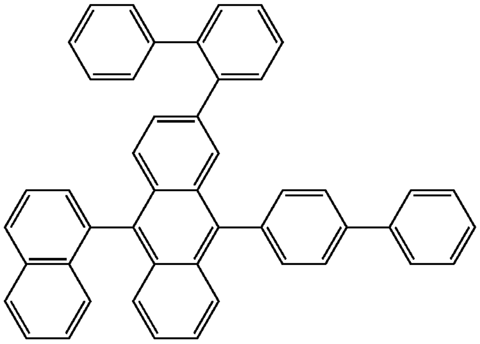
-continued
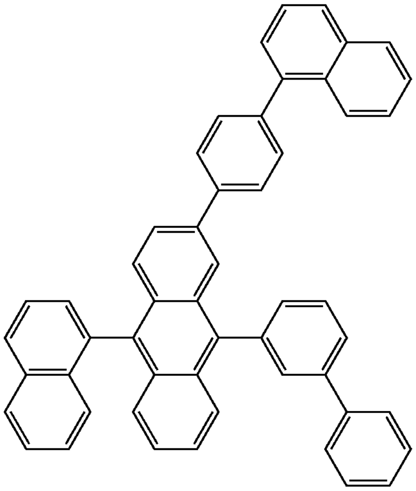
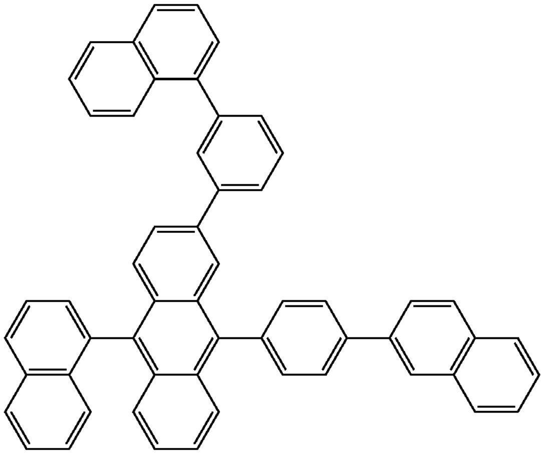
[Formula 122]
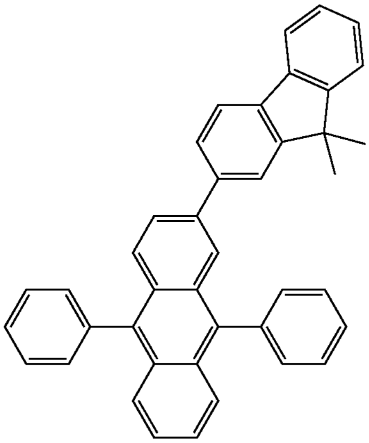

-continued
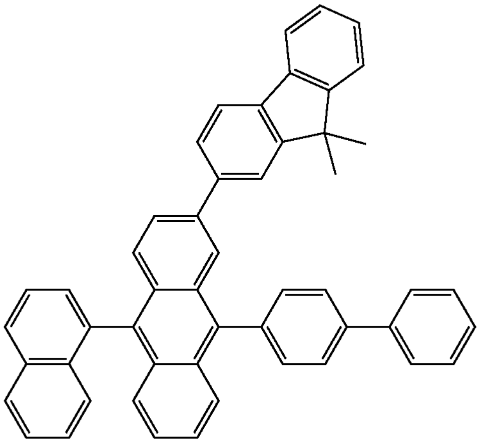
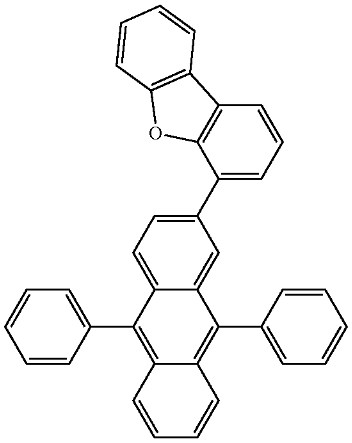
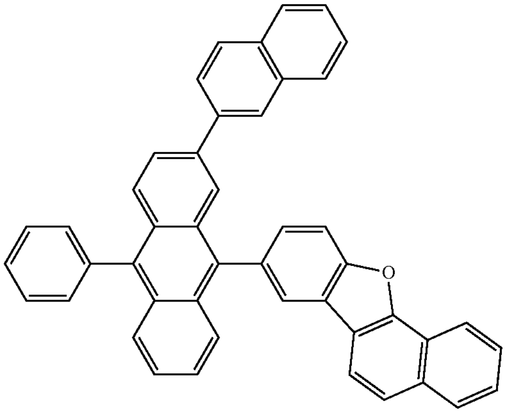
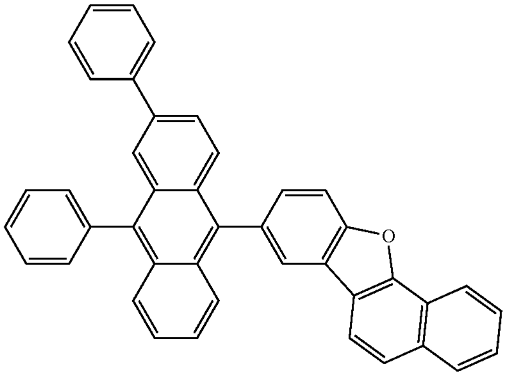
-continued
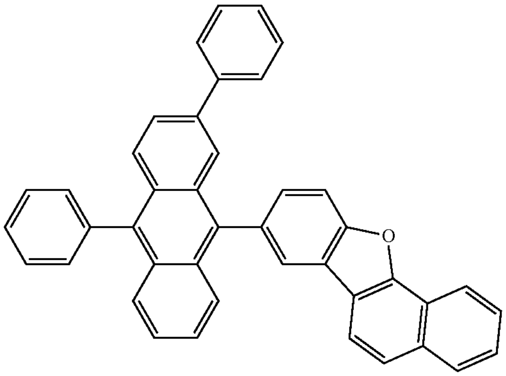
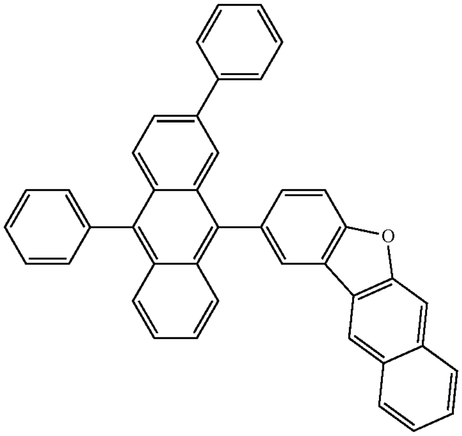
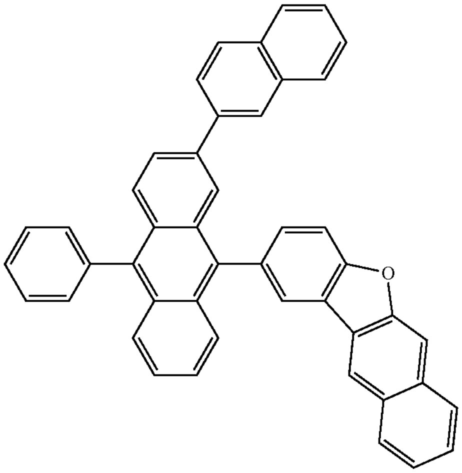

-continued
[Formula 123]
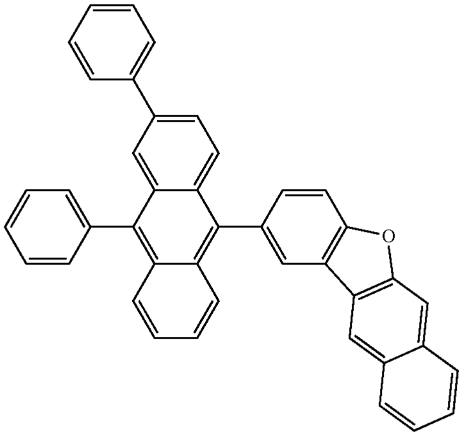
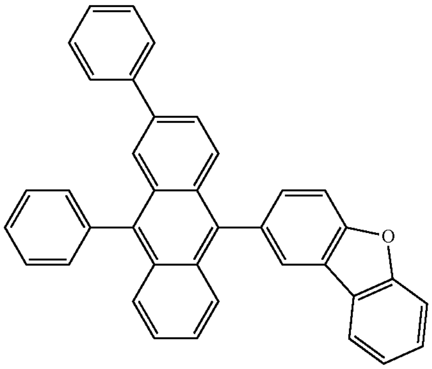
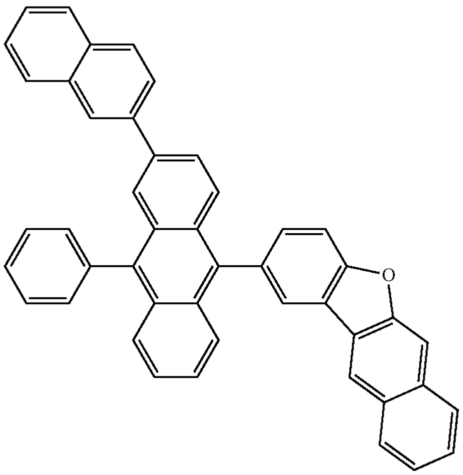
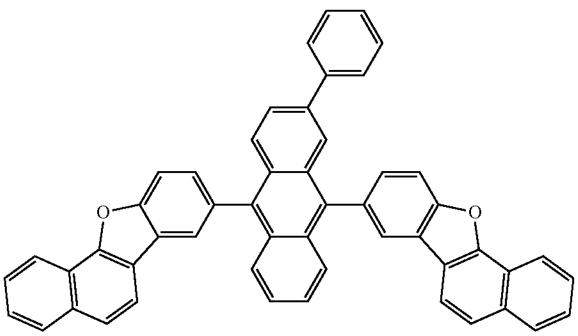
-continued
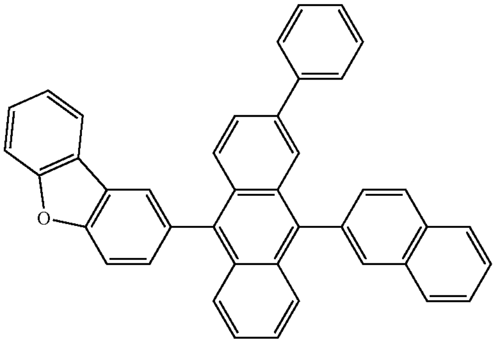
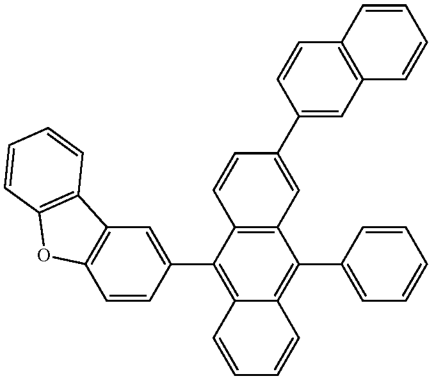
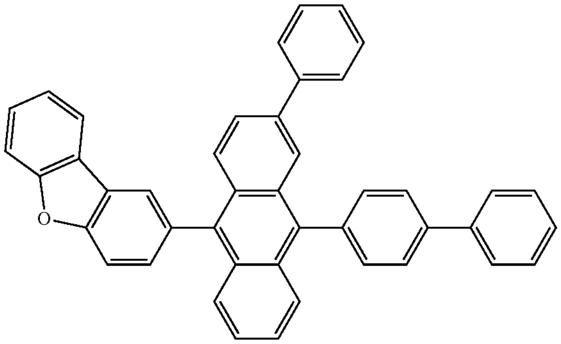
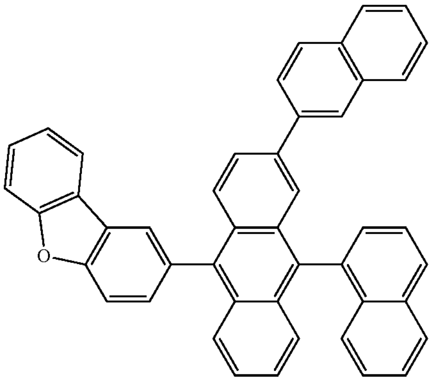

-continued
[Formula 124]
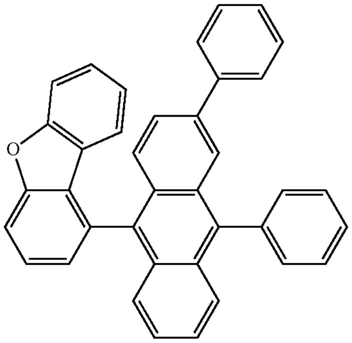
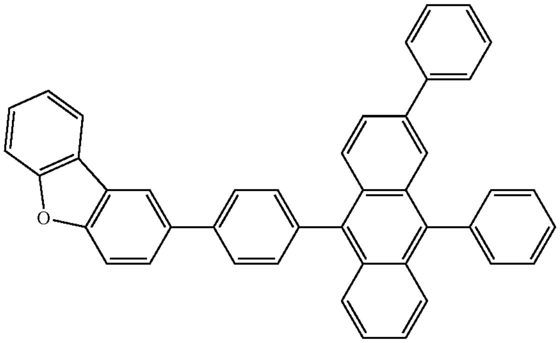
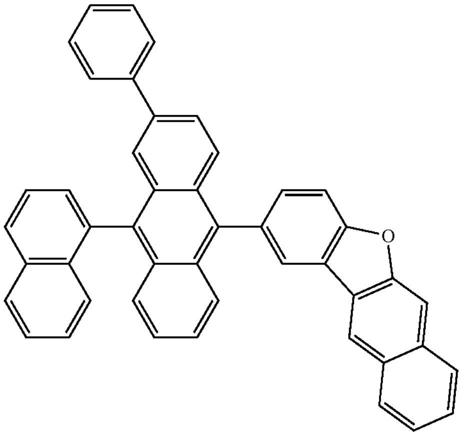
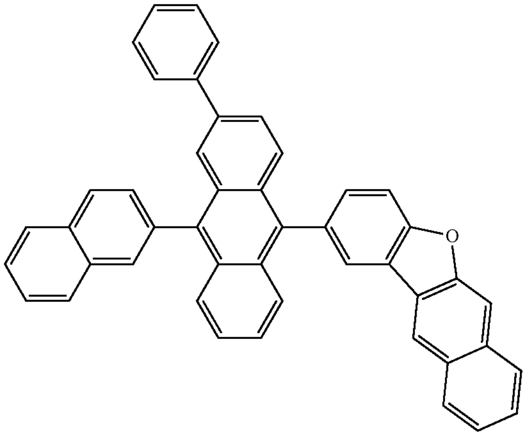
-continued
[Formula 125]
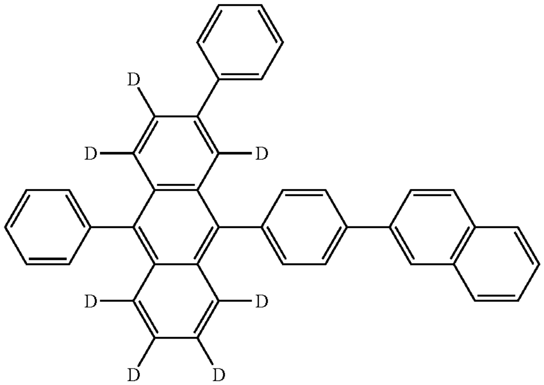
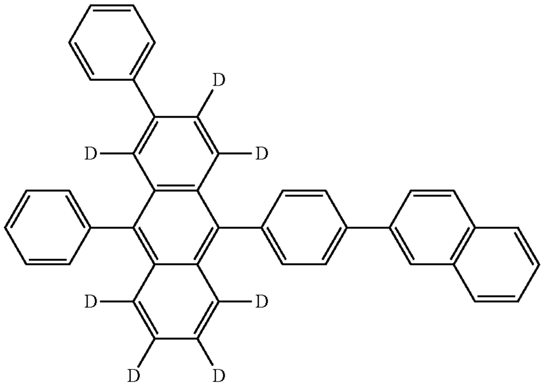
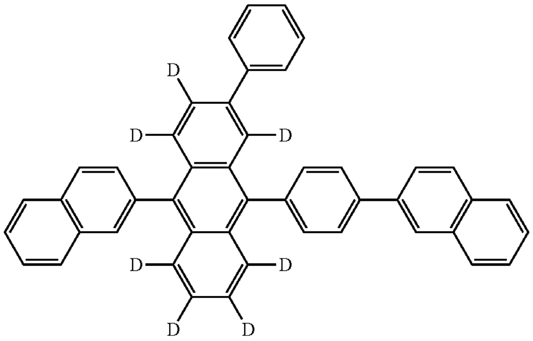
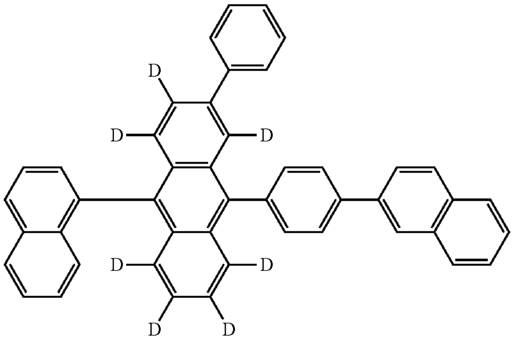

-continued

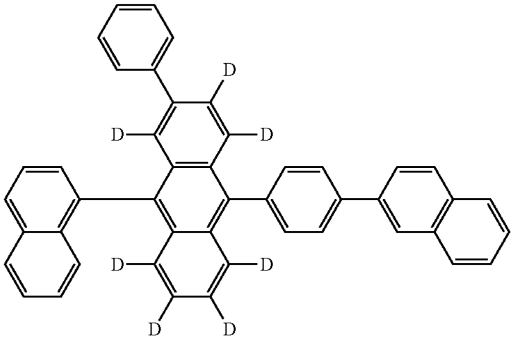

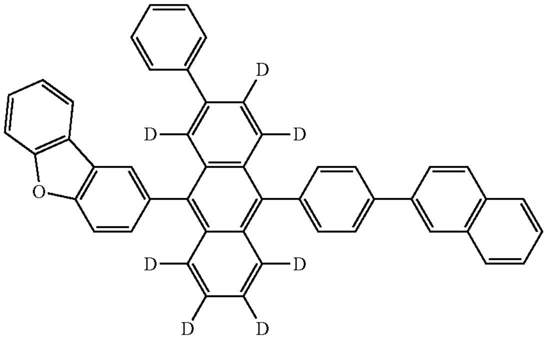

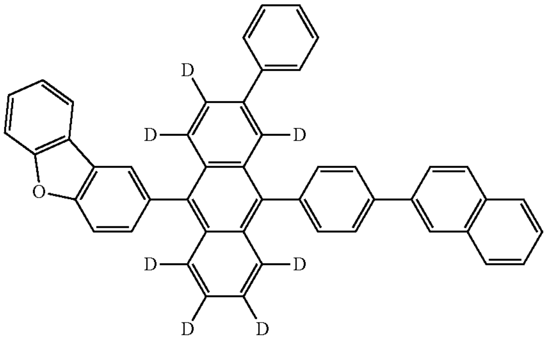

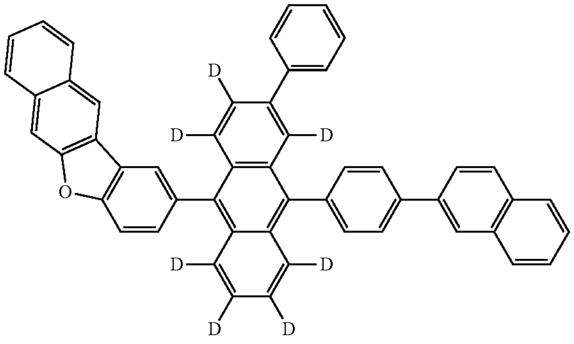

-continued

[Formula 126]

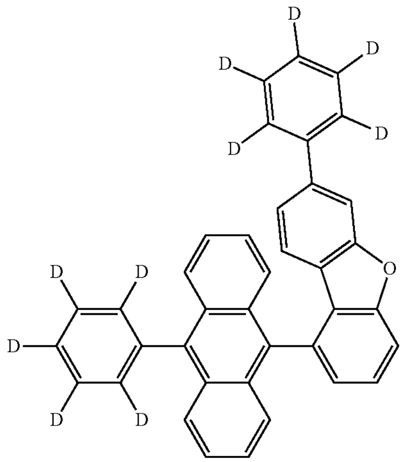

First Dopant Material, Second Dopant Material, and Third Dopant Material

In the organic EL device of the exemplary embodiment, the first dopant material, the second dopant material, and the third dopant material are, for instance, a third compound and a fourth compound below.

The third compound and the fourth compound are each independently at least one compound selected from the group consisting of a compound represented by a formula (3) below, a compound represented by a formula (4) below, a compound represented by a formula (5) below, a compound represented by a formula (6) below, a compound represented by a formula (7) below, a compound represented by a formula (8) below, a compound represented by a formula (9) below, and a compound represented by a formula (10) below.

Compound Represented by Formula (3)

The compound represented by the formula (3) will be described.

[Formula 127]

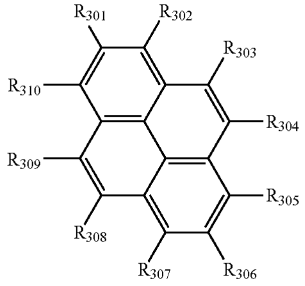

(3)

In the formula (3):

at least one combination of adjacent two or more of $R_{301}$ to $R_{310}$ are mutually bonded to form a substituted or unsubstituted monocyclic ring, mutually bonded to form a substituted or unsubstituted fused ring, or not mutually bonded;

at least one of $R_{301}$ to $R_{310}$ is a monovalent group represented by a formula (31) below; and $R_{301}$ to $R_{310}$ neither forming the monocyclic ring, forming the fused ring, nor being the monovalent group represented by the formula (31) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 128]

(31)

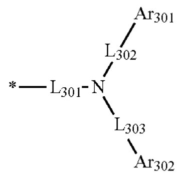

In the formula (31):

$Ar_{301}$ and $Ar_{302}$ are each independently a substituted or unsubstituted aryl group having 6 to 50 ring carbon atoms, or a substituted or unsubstituted heterocyclic group having 5 to 50 ring atoms;

$L_{301}$ to $L_{303}$ are each independently a single bond, a substituted or unsubstituted arylene group having 6 to 30 ring carbon atoms, or a substituted or unsubstituted divalent heterocyclic group having 5 to 30 ring atoms; and

* represents a bonding position to a pyrene ring in the formula (3).

In the third compound and the fourth compound, $R_{901}$, $R_{902}$, $R_{903}$, $R_{904}$, $R_{905}$, $R_{906}$ and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the formula (3), two of $R_{301}$ to $R_{310}$ are each preferably a group represented by the formula (31).

In an exemplary embodiment, the compound represented by the formula (3) is a compound represented by a formula (33) below.

[Formula 129]

(33)

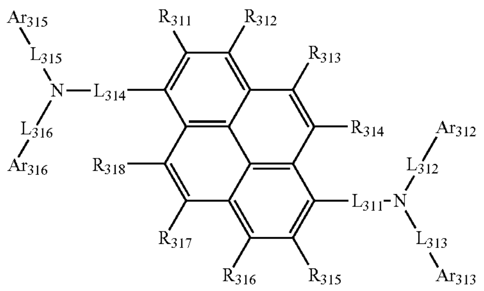

In the formula (33):

$R_{311}$ to $R_{318}$ each independently represent the same as $R_{301}$ to $R_{310}$ not being a monovalent group represented by the formula (31) in the formula 3;

$L_{311}$ to $L_{316}$ are each independently a single bond, a substituted or unsubstituted arylene group having 6 to 30 ring carbon atoms, or a substituted or unsubstituted divalent heterocyclic group having 5 to 30 ring atoms; and $Ar_{312}$, $Ar_{313}$, $Ar_{315}$ and $Ar_{316}$ are each independently a substituted or unsubstituted aryl group having 6 to 50 ring carbon atoms, or a substituted or unsubstituted heterocyclic group having 5 to 50 ring atoms.

In the formula (31), $L_{301}$ is preferably a single bond, and $L_{302}$ and $L_{303}$ are each preferably a single bond.

In an exemplary embodiment, the compound represented by the formula (3) is represented by a formula (34) or a formula (35) below.

[Formula 130]

(34)

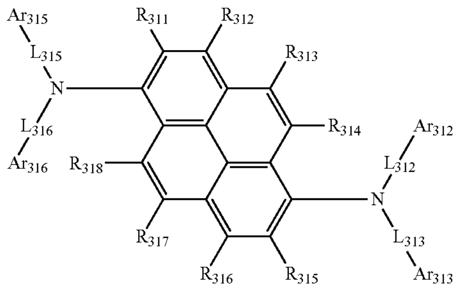

In the formula (34):

$R_{311}$ to $R_{318}$ each independently represent the same as $R_{301}$ to $R_{310}$ not being a monovalent group represented by the formula (31) in the formula 3;

$L_{312}$, $L_{313}$, $L_{315}$ and $L_{316}$ respectively represent the same as $L_{312}$, $L_{313}$, $L_{315}$ and $L_{316}$ in the formula (33); and $Ar_{312}$, $Ar_{313}$, $Ar_{315}$ and $Ar_{316}$ respectively represent the same as $Ar_{312}$, $Ar_{313}$, $Ar_{315}$ and $Ar_{316}$ in the formula (33).

[Formula 131]

(35)

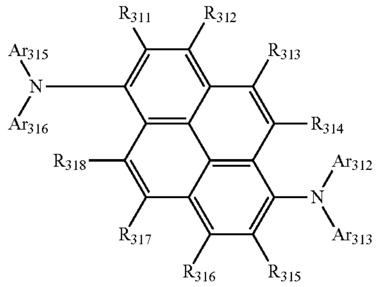

In the formula (35):

$R_{311}$ to $R_{318}$ each independently represent the same as $R_{301}$ to $R_{310}$ not being a monovalent group represented by the formula (31) in the formula 3; and $Ar_{312}$, $Ar_{313}$, $Ar_{315}$ and $Ar_{316}$ respectively represent the same as $Ar_{312}$, $Ar_{313}$, $Ar_{315}$ and $Ar_{316}$ in the formula (33).

In the formula (31), at least one of $Ar_{301}$ or $Ar_{302}$ is preferably a group represented by a formula (36).

In the formulae (33) to (35), at least one of $Ar_{312}$ or $Ar_{313}$ is preferably a group represented by the formula (36).

In the formulae (33) to (35), at least one of $Ar_{315}$ or $Ar_{316}$ is preferably a group represented by the formula (36).

[Formula 132]

(36)

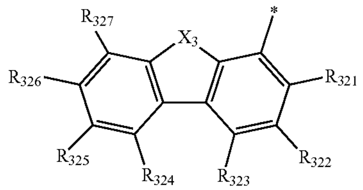

In the formula (36):

$X_3$ is an oxygen atom or a sulfur atom;

at least one combination of adjacent two or more of $R_{321}$ to $R_{327}$ are mutually bonded to form a substituted or unsubstituted monocyclic ring, mutually bonded to form a substituted or unsubstituted fused ring, or not mutually bonded;

$R_{321}$ to $R_{327}$ neither forming the monocyclic ring nor forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* represents a bonding position to $L_{302}$, $L_{303}$, $L_{312}$, $L_{313}$, $L_{315}$ or $L_{316}$.

$X_3$ is preferably an oxygen atom.

At least one of $R_{321}$ to $R_{327}$ is preferably a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the formula (31), it is preferable that $Ar_{301}$ is a group represented by the formula (36) and $Ar_{302}$ is a substituted or unsubstituted aryl group having 6 to 50 ring carbon atoms.

In the formulae (33) to (35), it is preferable that $Ar_{312}$ is a group represented by the formula (36) and $Ar_{313}$ is a substituted or unsubstituted aryl group having 6 to 50 ring carbon atoms.

In the formulae (33) to (35), it is preferable that $Ar_{315}$ is a group represented by the formula (36) and $Ar_{316}$ is a substituted or unsubstituted aryl group having 6 to 50 ring carbon atoms.

In an exemplary embodiment, the compound represented by the formula (3) is a compound represented by a formula (37) below.

[Formula 133]

(37)

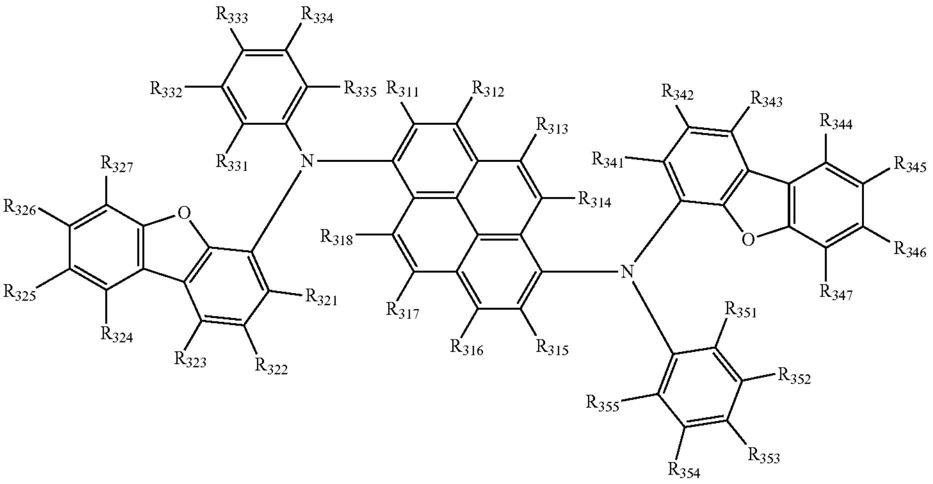

In the formula (37):

$R_{311}$ to $R_{318}$ each independently represent the same as $R_{301}$ to $R_{310}$ not being a monovalent group represented by the formula (31) in the formula 3;

at least one combination of adjacent two or more of $R_{321}$ to $R_{327}$ are mutually bonded to form a substituted or unsubstituted monocyclic ring, mutually bonded to form a substituted or unsubstituted fused ring, or not mutually bonded;

at least one combination of adjacent two or more of $R_{341}$ to $R_{347}$ are mutually bonded to form a substituted or unsubstituted monocyclic ring, mutually bonded to form a substituted or unsubstituted fused ring, or not mutually bonded;

$R_{321}$ to $R_{327}$ and $R_{341}$ to $R_{347}$ neither forming the monocyclic ring nor forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{331}$ to $R_{335}$ and $R_{351}$ to $R_{355}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (3)

Specific examples of a compound represented by the formula (3) are as follows.

[Formula 134]

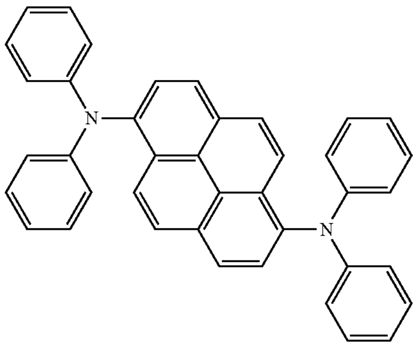

-continued

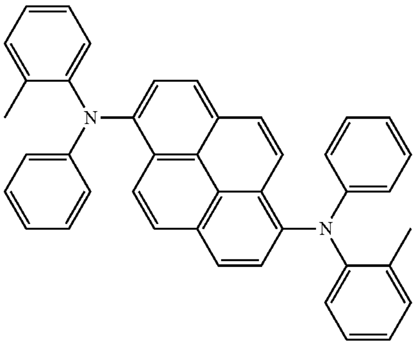

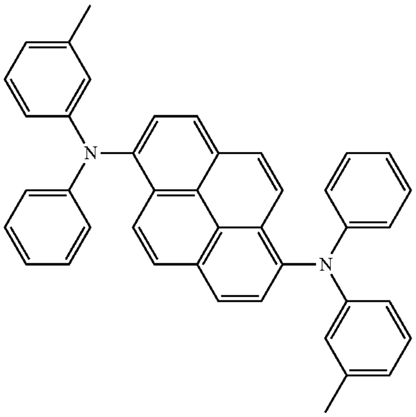

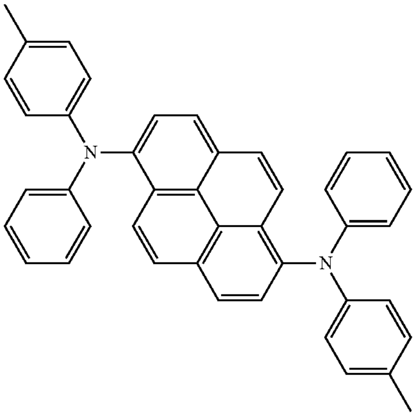

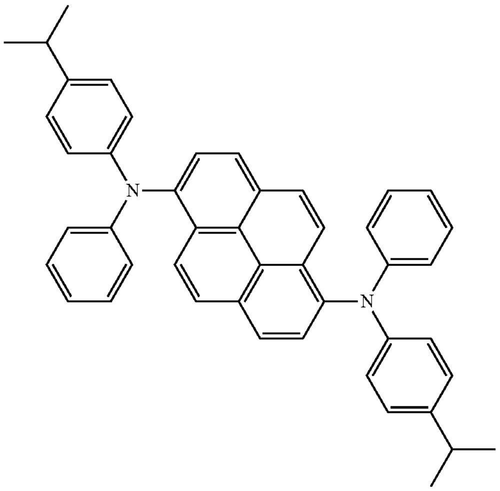

-continued
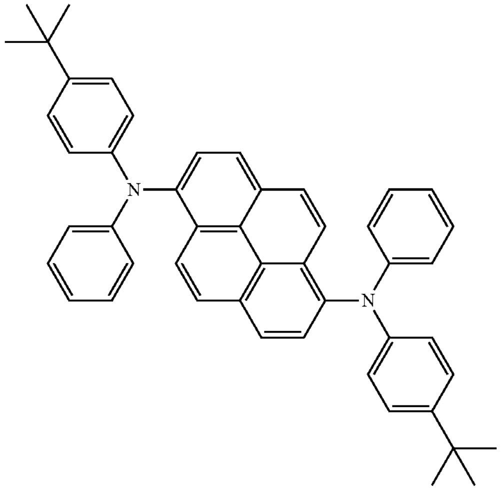
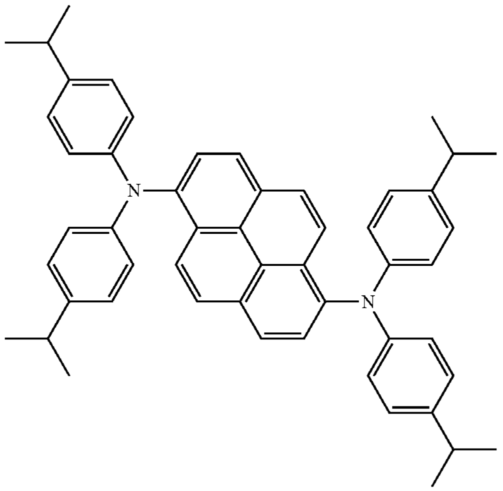
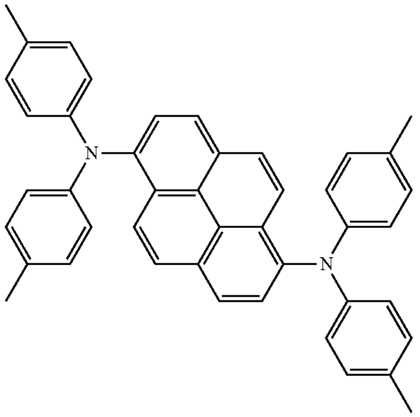
-continued
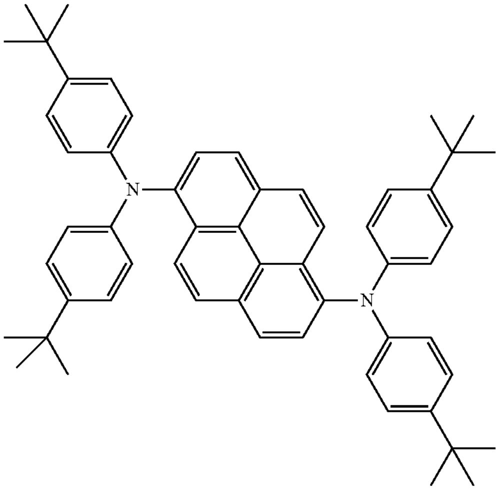
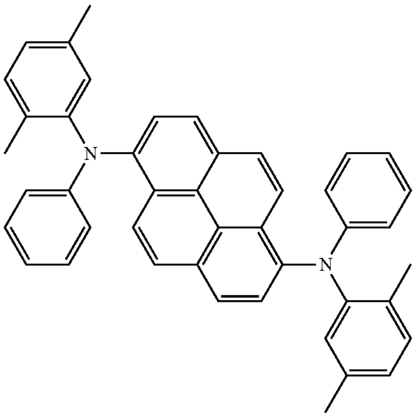
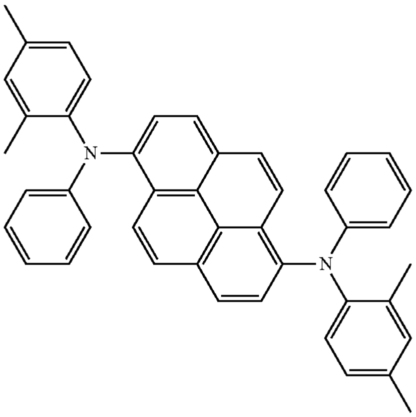

-continued
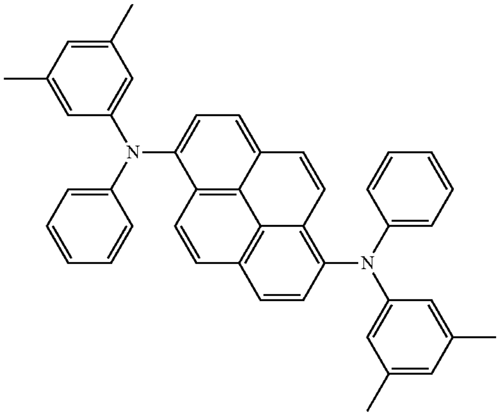
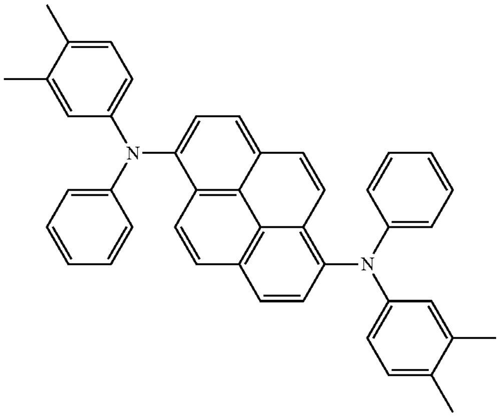
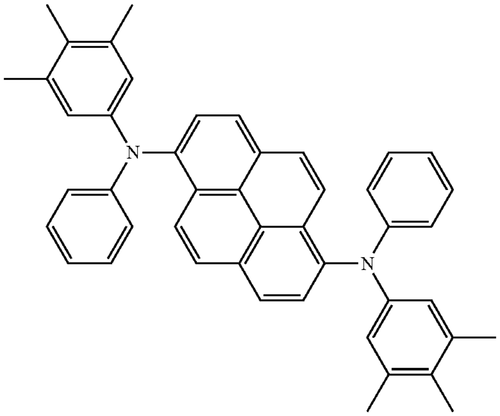
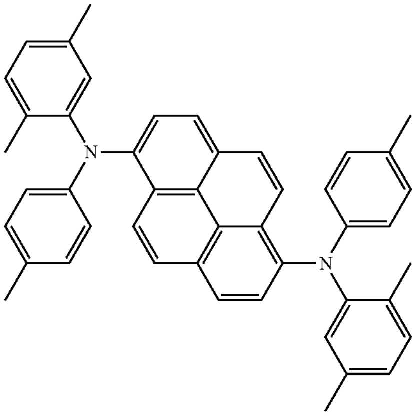
-continued
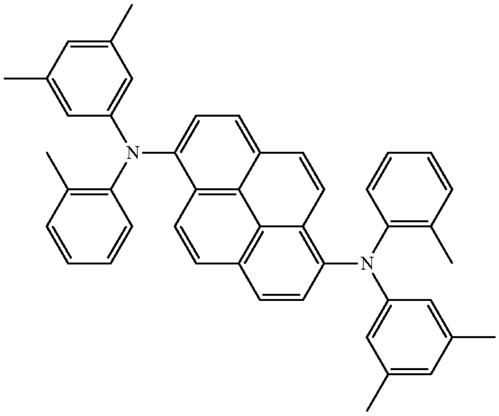
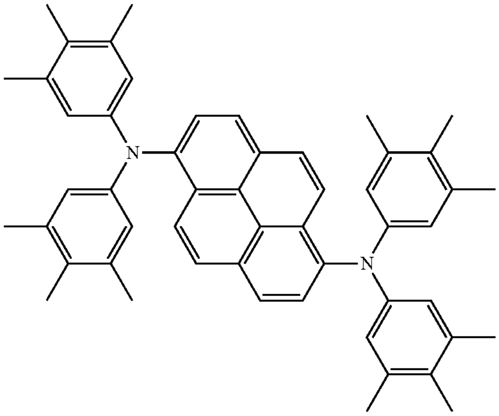
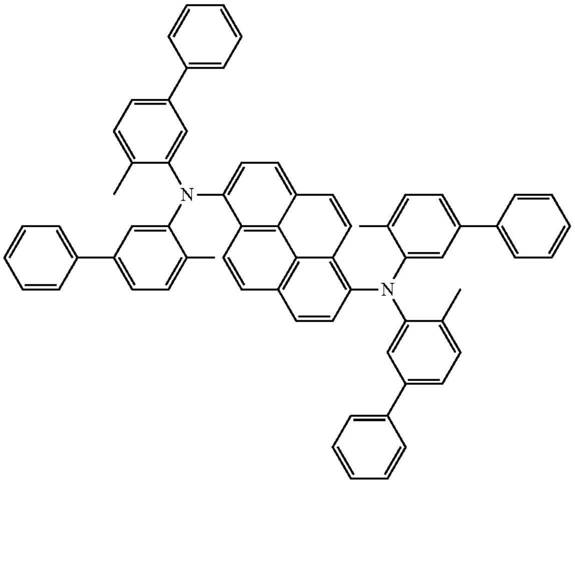

-continued
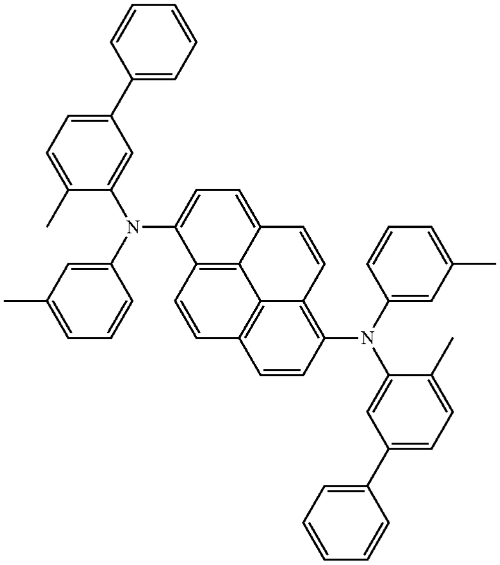
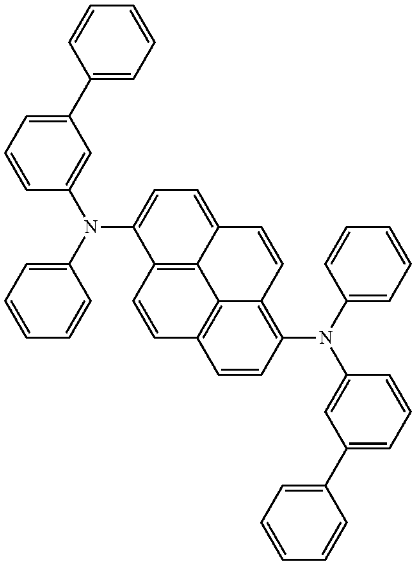 [SMILES: c1ccc(-c2cccc(N(c3ccccc3)c3ccc4ccc5c(N(c6ccccc6)c6cccc(-c7ccccc7)c6)ccc6ccc3c4c65)c2)cc1]
-continued
[Formula 135]
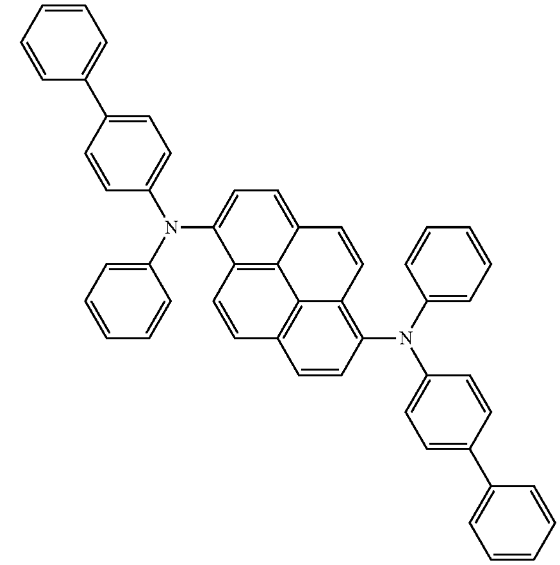
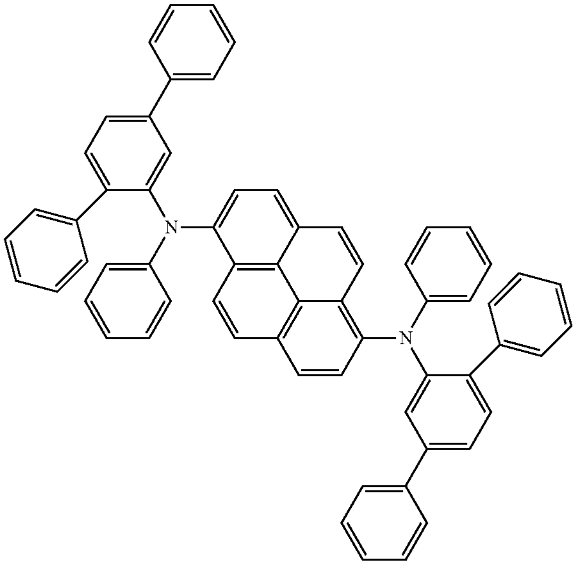
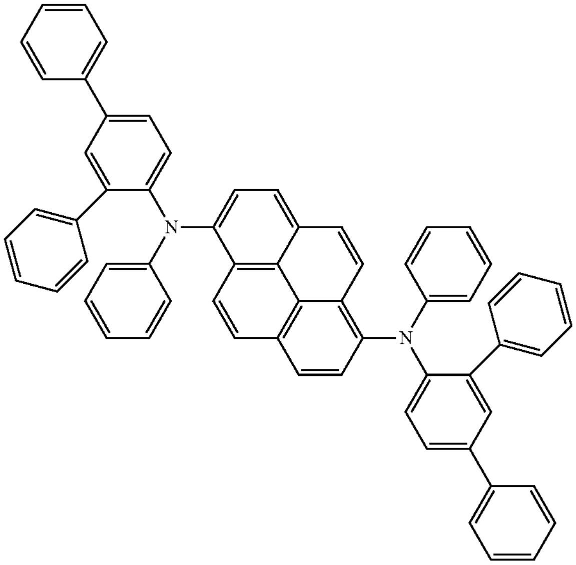

-continued
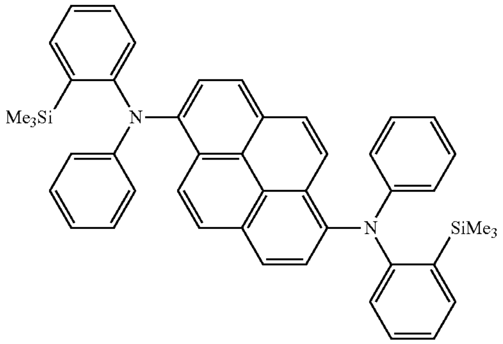
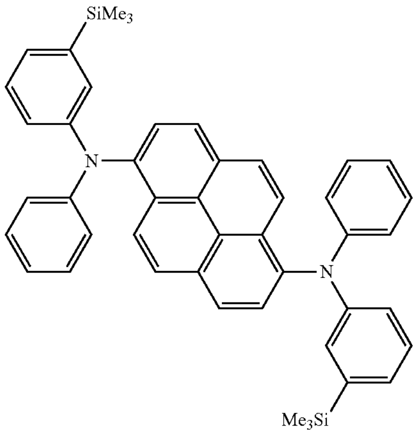
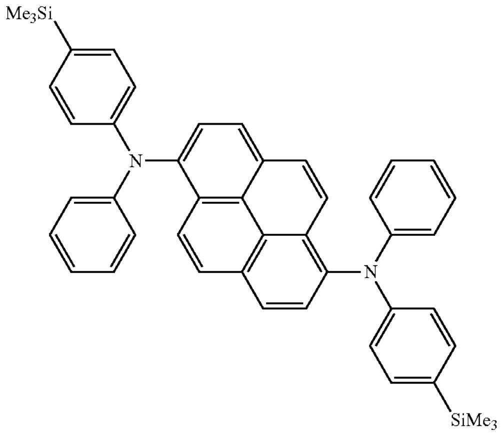
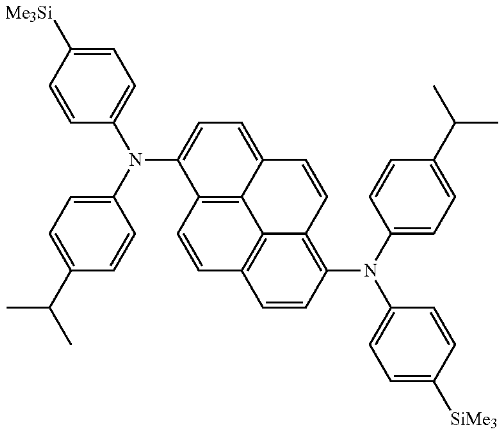
-continued
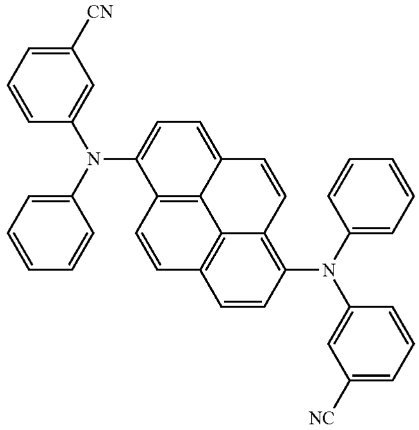
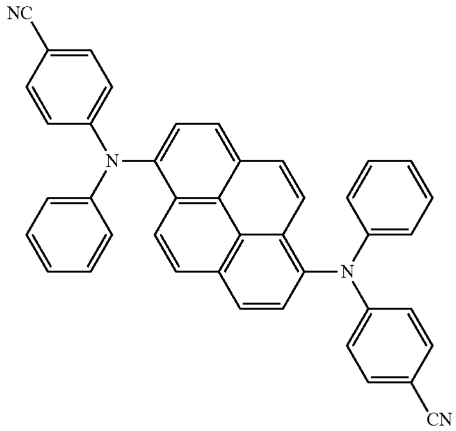
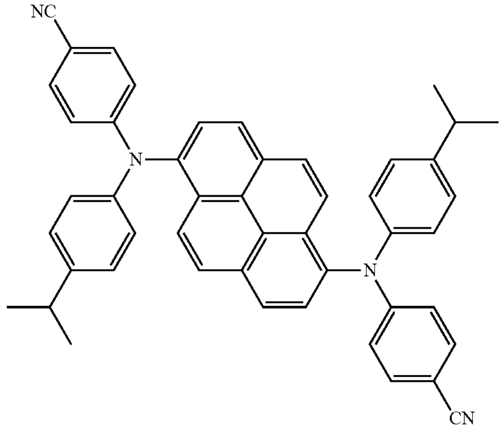
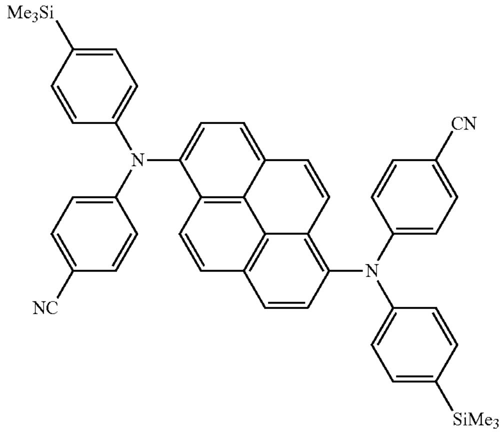

-continued
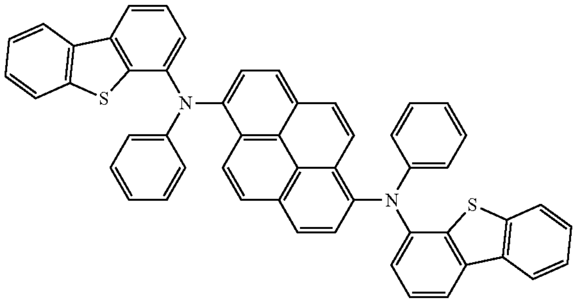
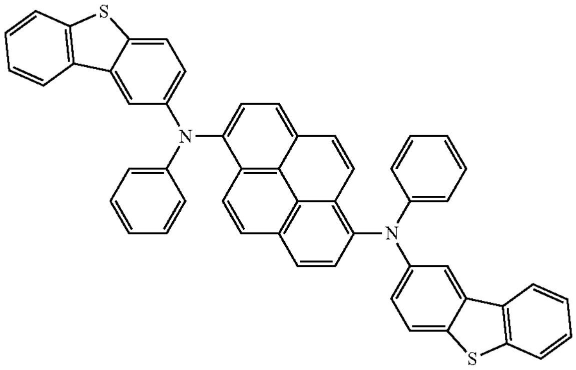
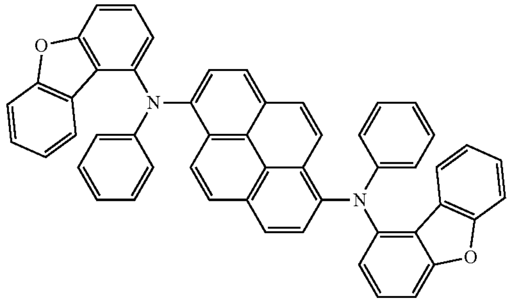
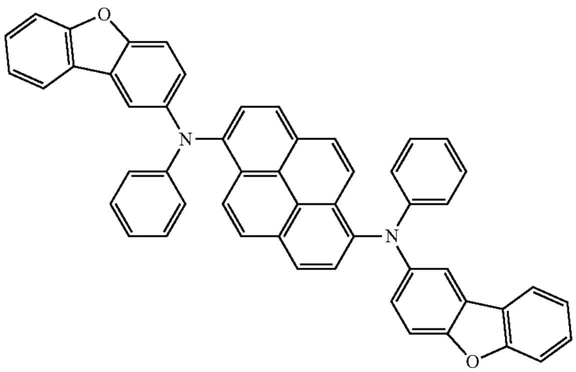
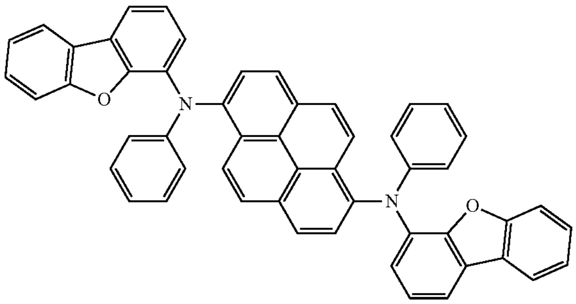
-continued
[Formula 136]
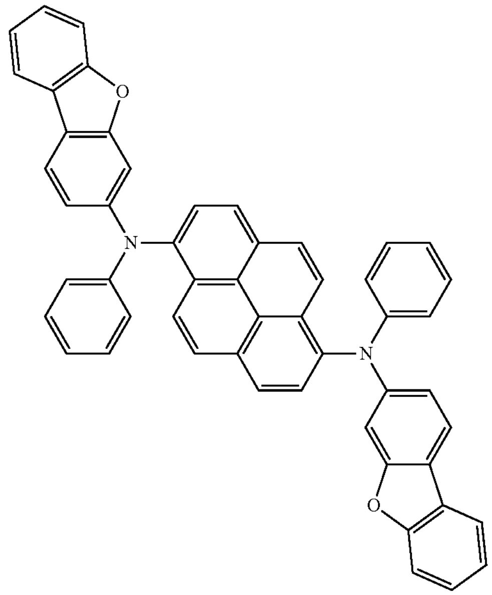
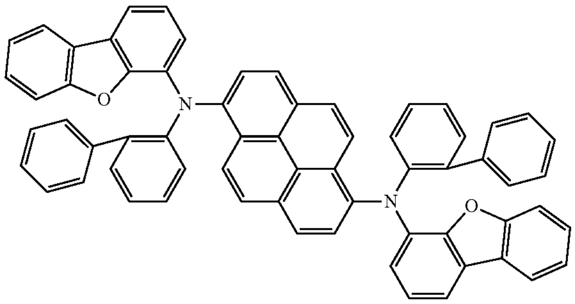
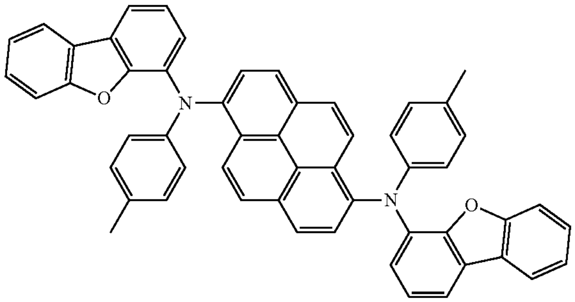
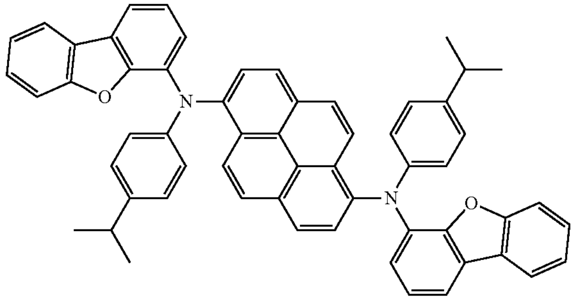

-continued
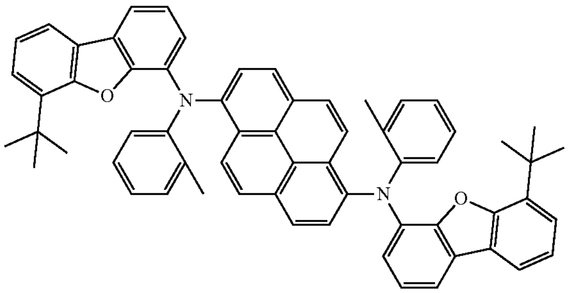
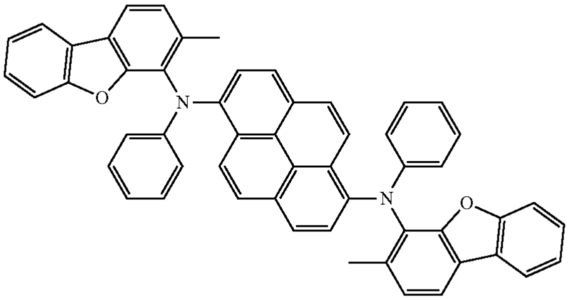
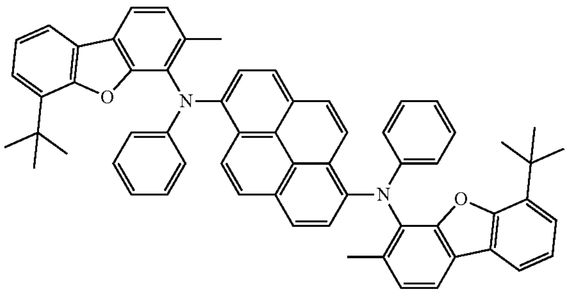
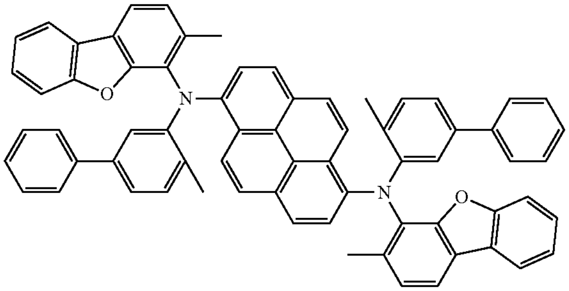
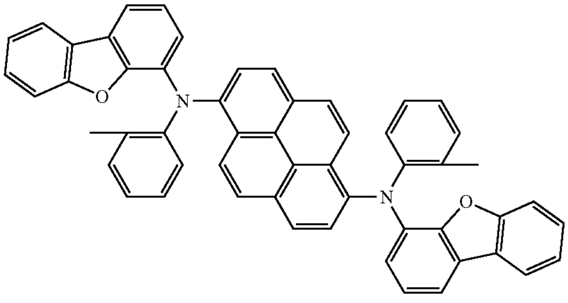
-continued
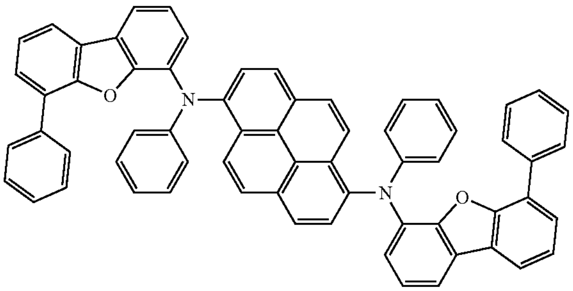
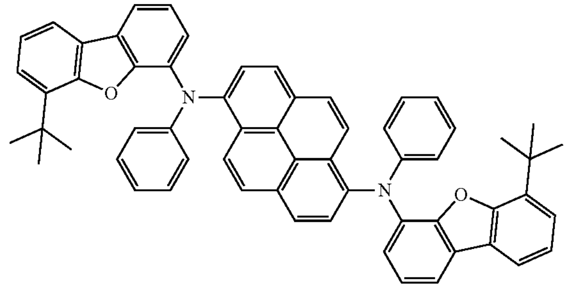
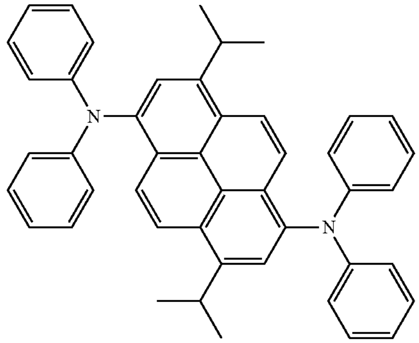
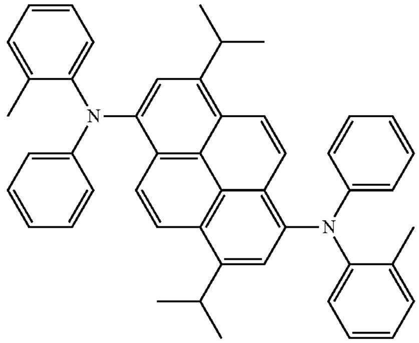
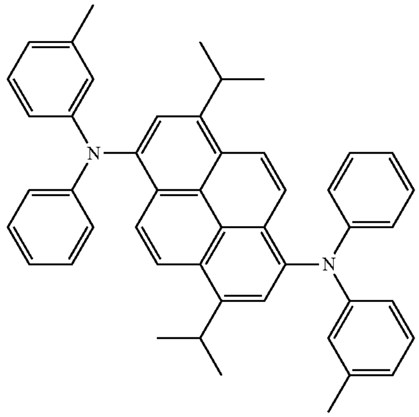

-continued
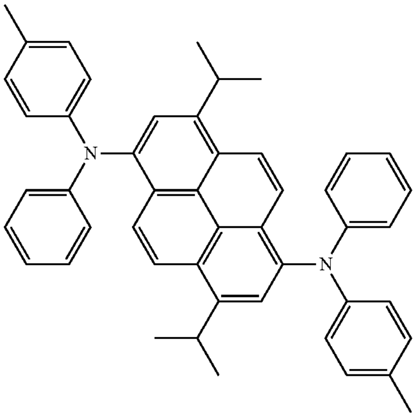
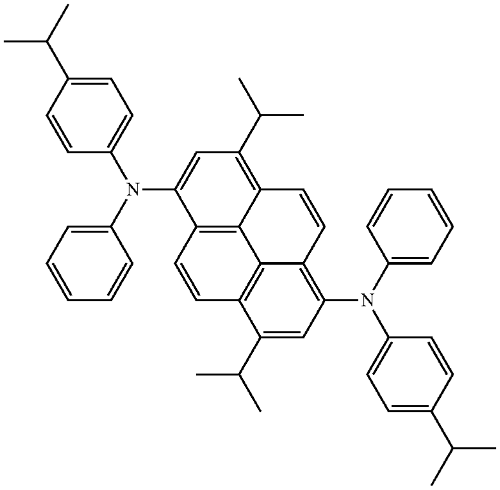
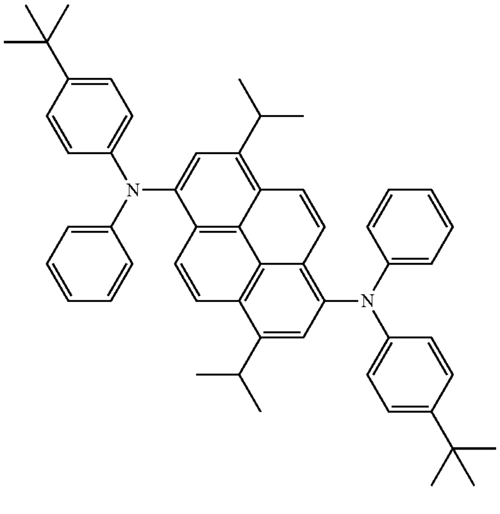
-continued
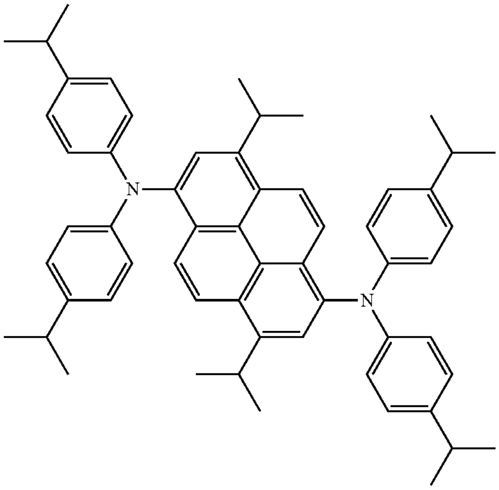
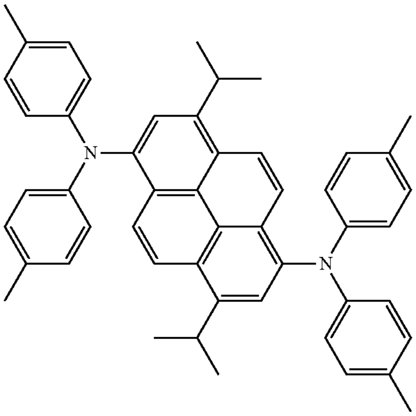
[Formula 137]
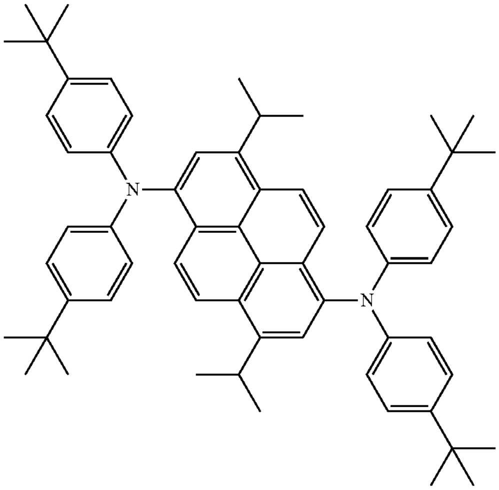

-continued
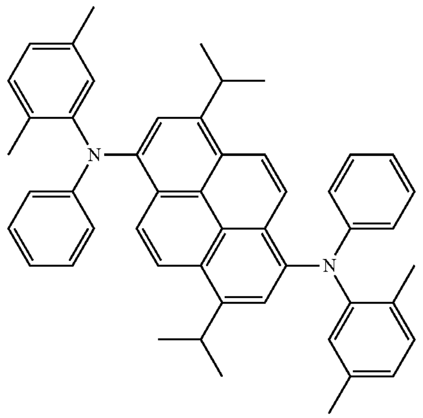
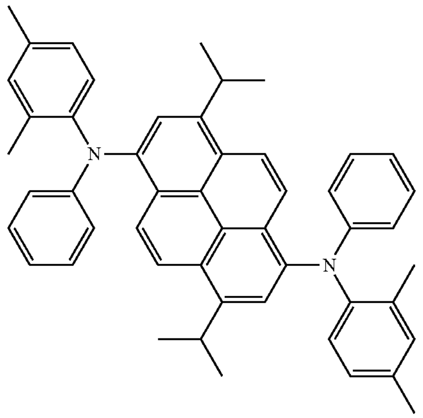
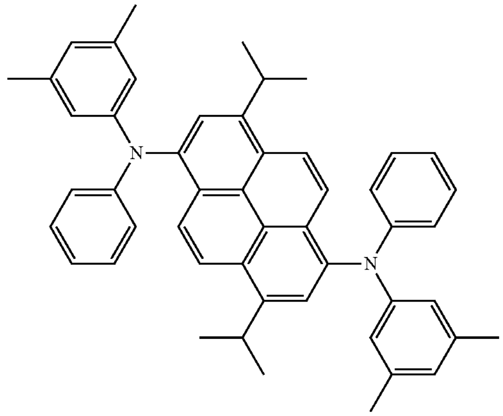
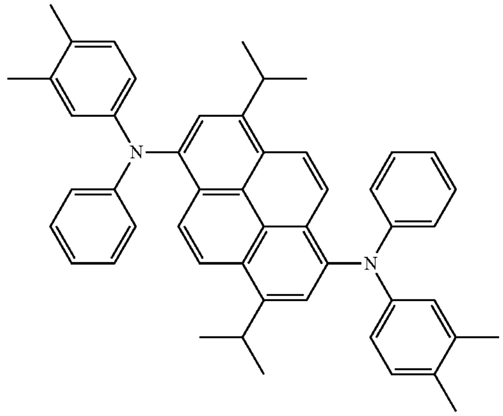
-continued
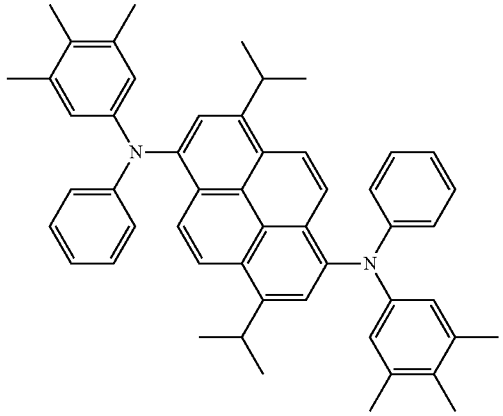
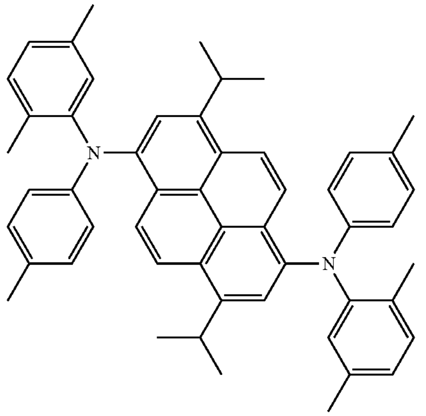
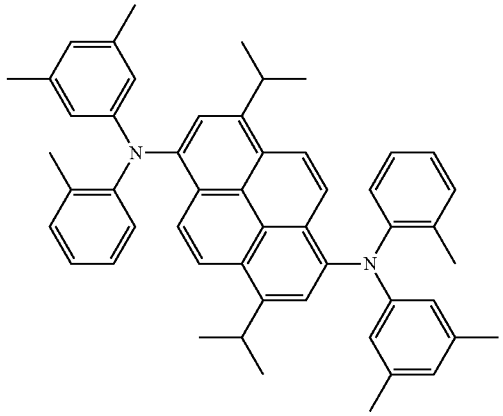
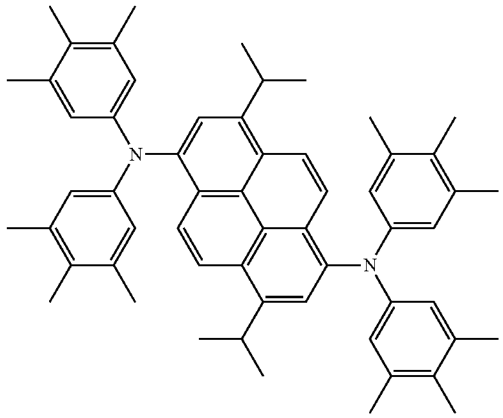

-continued
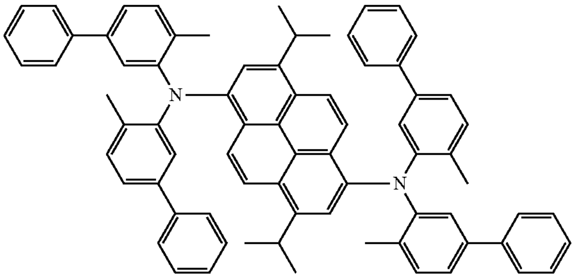
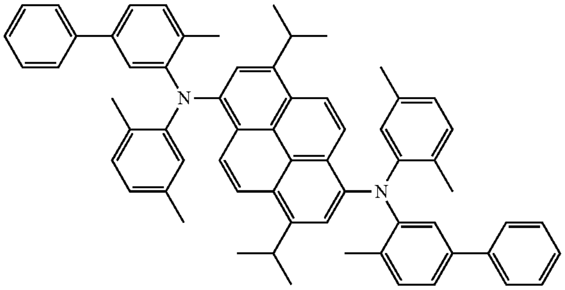
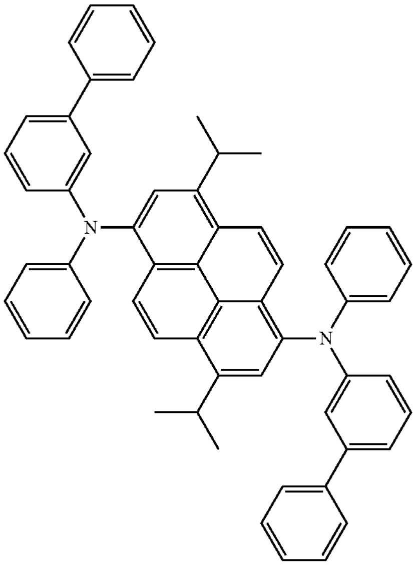
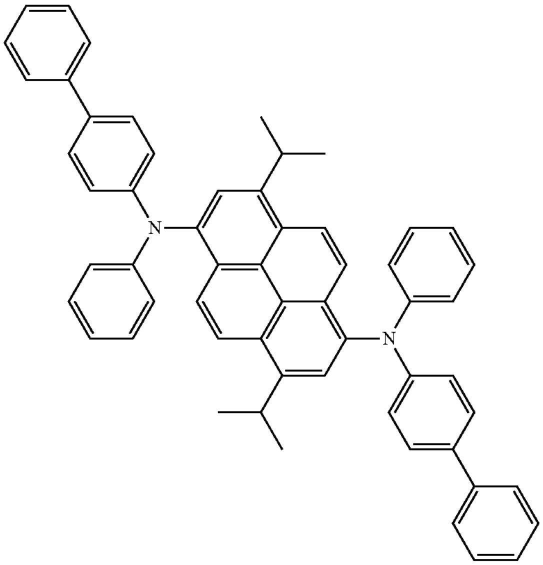
-continued
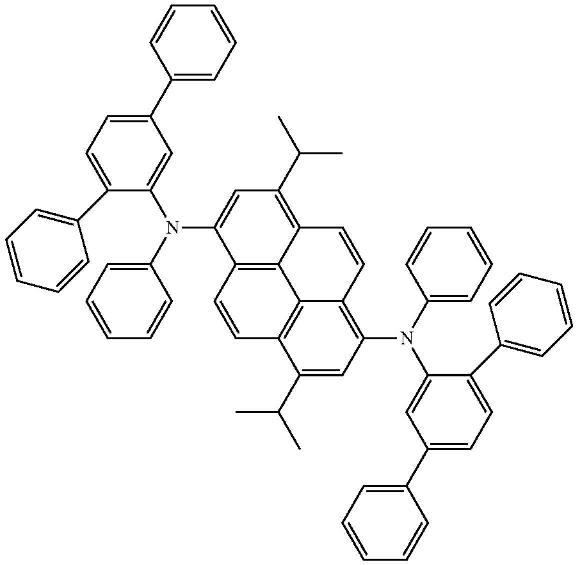
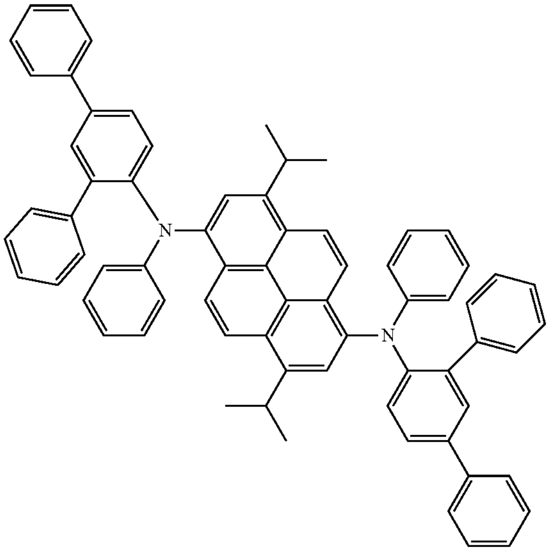
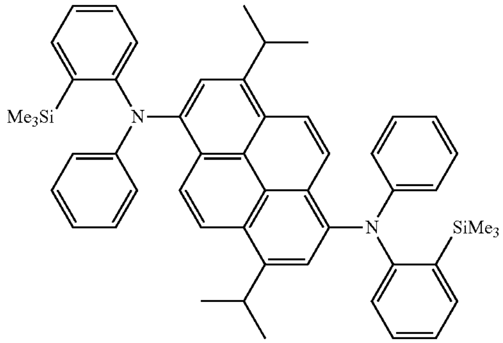

-continued
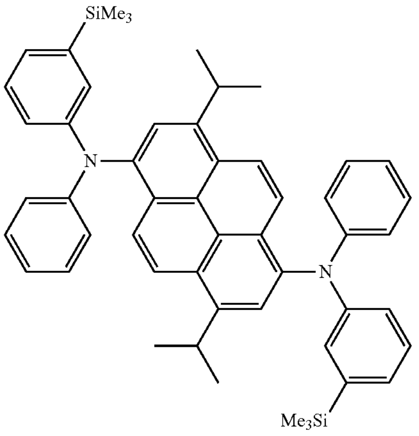
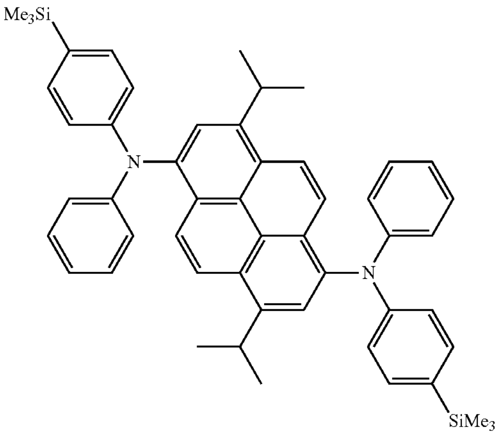
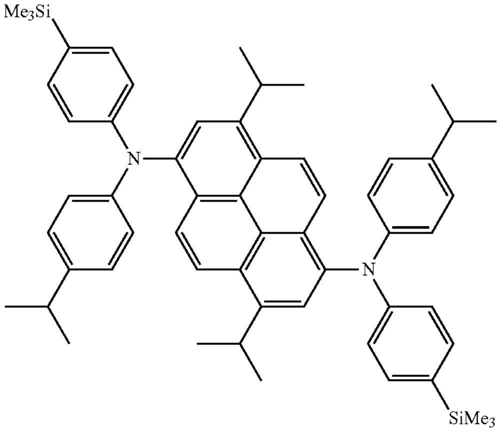
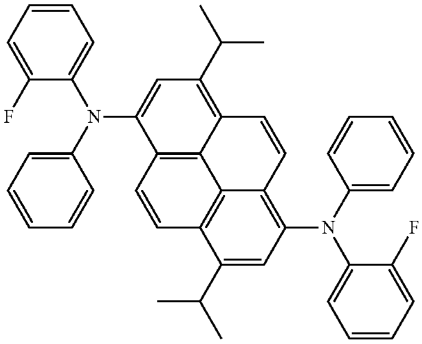
-continued
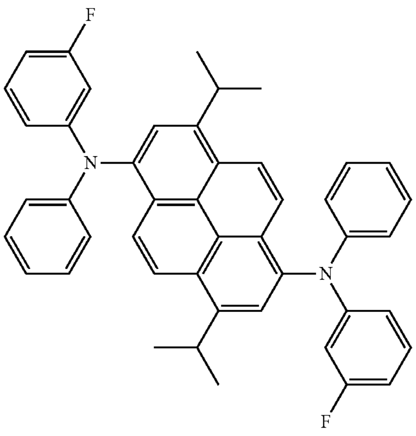
[Formula 138]
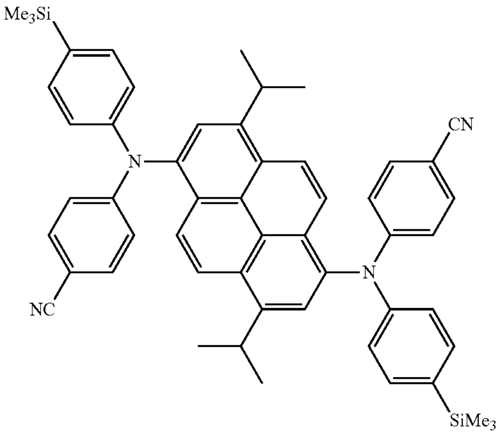
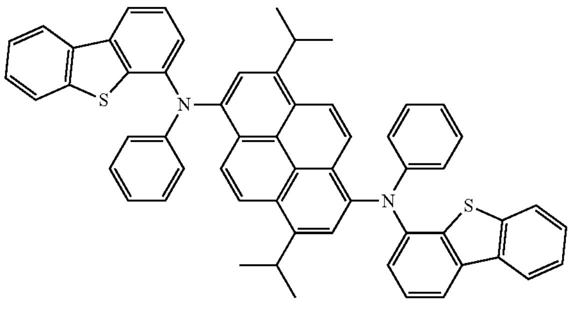
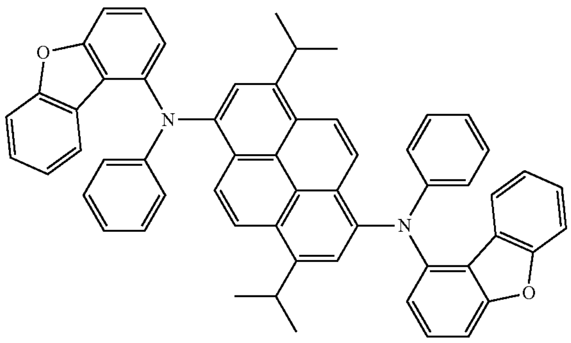

-continued
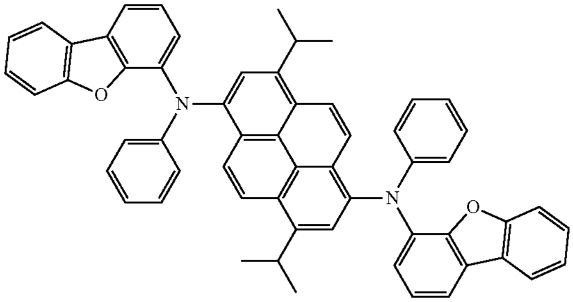
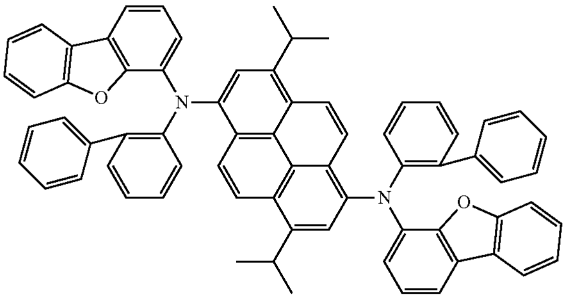
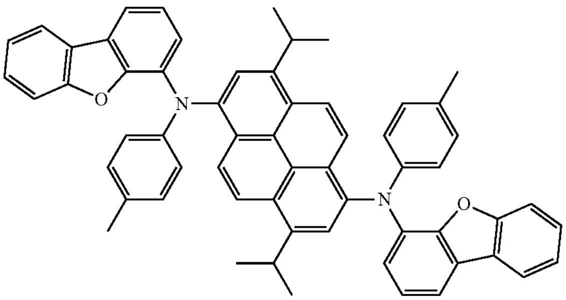
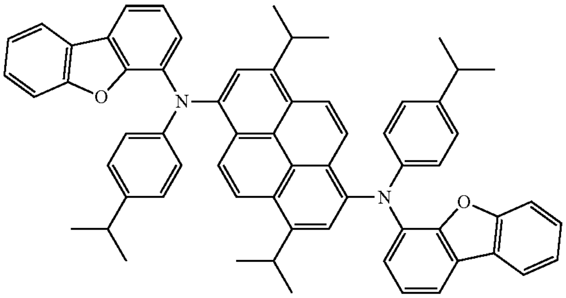
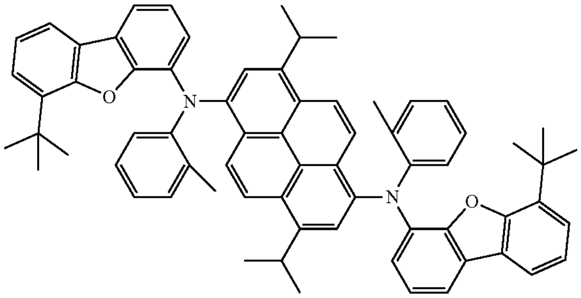
-continued
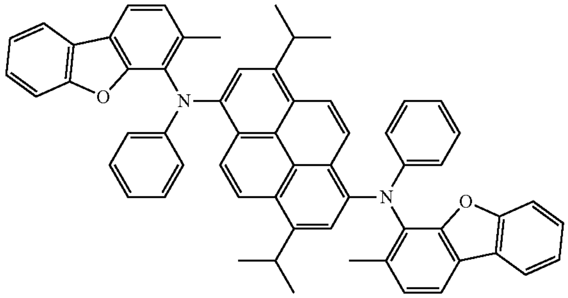
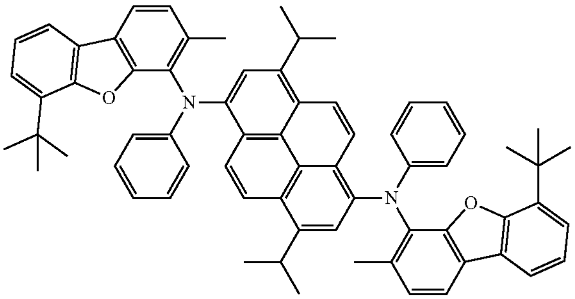
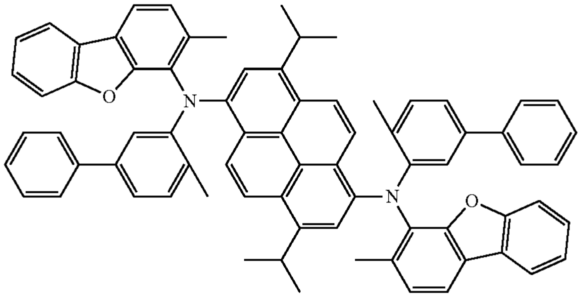
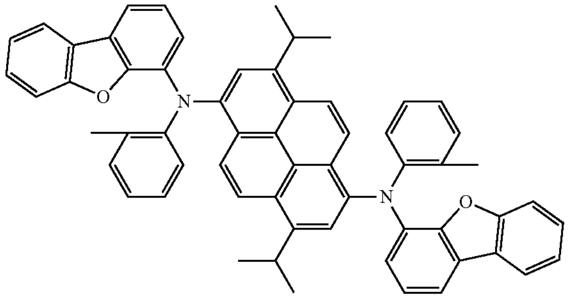
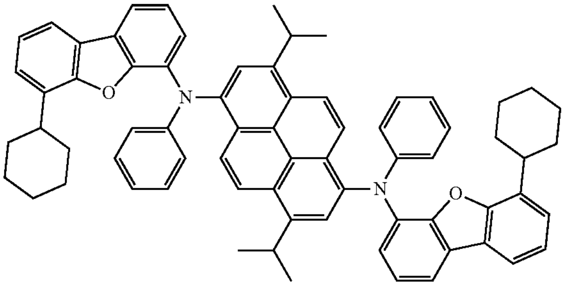

-continued

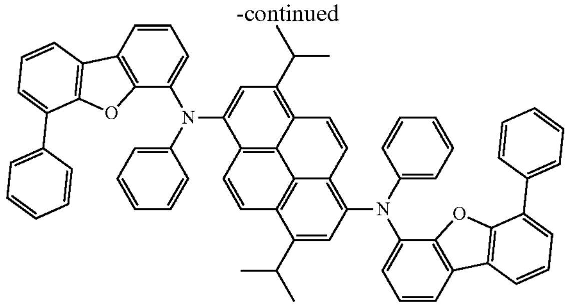

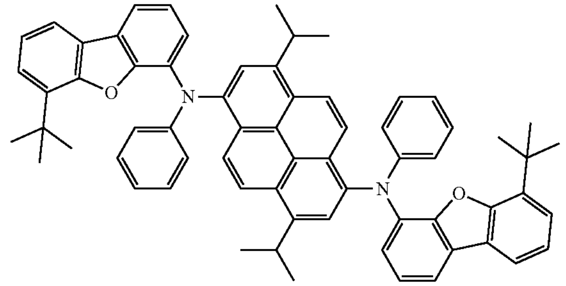

Compound Represented by Formula (4)

A compound represented by the formula (4) will be described below.

[Formula 139]

(4)

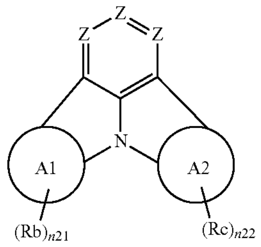

In the formula (4): Z are each independently CRa or a nitrogen atom;

- A1 ring and A2 ring are each independently a substituted or unsubstituted aromatic hydrocarbon ring having 6 to 50 ring carbon atoms or a substituted or unsubstituted heterocycle having 5 to 50 ring atoms;
- when a plurality of Ra are present, at least one combination of adjacent two or more of Ra are mutually bonded to form a substituted or unsubstituted monocyclic ring, mutually bonded to form a substituted or unsubstituted fused ring, or not mutually bonded;
- n21 and n22 are each independently 0, 1, 2, 3 or 4;
- when a plurality of Rb are present, at least one combination of adjacent two or more of Rb are mutually bonded to form a substituted or unsubstituted monocyclic ring, mutually bonded to form a substituted or unsubstituted fused ring, or not mutually bonded;
- when a plurality of Rc are present, at least one combination of adjacent two or more of Rc are mutually bonded to form a substituted or unsubstituted monocyclic ring, mutually bonded to form a substituted or unsubstituted fused ring, or not mutually bonded; and
- Ra, Rb, and Rc neither forming the monocyclic ring nor forming the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

The "aromatic hydrocarbon ring" for the A1 ring and A2 ring has the same structure as the compound formed by introducing a hydrogen atom to the "aryl group" described above.

Ring atoms of the "aromatic hydrocarbon ring" for the A1 ring and the A2 ring include two carbon atoms on a fused bicyclic structure at the center of the formula (4).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the A1 ring and A2 ring has the same structure as the compound formed by introducing a hydrogen atom to the "heterocyclic group" described above.

Ring atoms of the "heterocycle" for the A1 ring and the A2 ring include two carbon atoms on a fused bicyclic structure at the center of the formula (4).

Specific examples of the "substituted or unsubstituted heterocycle having 5 to 50 ring atoms" include a compound formed by introducing a hydrogen atom to the "heterocyclic group" described in the specific example group G2.

Rb is bonded to any one of carbon atoms forming the aromatic hydrocarbon ring for the A1 ring or any one of the atoms forming the heterocycle for the A1 ring.

Rc is bonded to any one of carbon atoms forming the aromatic hydrocarbon ring for the A2 ring or any one of the atoms forming the heterocycle for the A2 ring.

At least one of Ra, Rb, or Rc is preferably a group represented by the formula (4a) below. More preferably, at least two of Ra, Rb, and Rc are groups represented by the formula (4a).

[Formula 140]

$$*\text{-}L_{401}\text{-}Ar_{401} \quad (4a)$$

In the formula (4a): $L_{401}$ is a single bond, a substituted or unsubstituted arylene group having 6 to 30 ring carbon atoms, or a substituted or unsubstituted divalent heterocyclic group having 5 to 30 ring atoms; and $Ar_{401}$ is a substituted or unsubstituted aryl group having 6 to 50 ring carbon atoms, a substituted or unsubstituted heterocyclic group having 5 to 50 ring atoms, or a group represented by a formula (4b) below.

[Formula 141]

(4b)

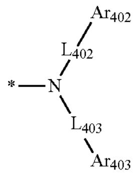

In the formula (4b): $L_{402}$ and $L_{403}$ are each independently a single bond, a substituted or unsubstituted arylene group having 6 to 30 ring carbon atoms, or a substituted or unsubstituted divalent heterocyclic group having 5 to 30 ring atoms;

a combination of $Ar_{402}$ and $Ar_{403}$ are mutually bonded to form a substituted or unsubstituted monocyclic ring, mutually bonded to form a substituted or unsubstituted fused ring, or not mutually bonded; and $Ar_{402}$ and $Ar_{403}$ neither forming the monocyclic ring nor forming the fused ring are each independently a substituted or unsubstituted aryl group having 6 to 50 ring carbon atoms, or a substituted or unsubstituted heterocyclic group having 5 to 50 ring atoms.

In an exemplary embodiment, a compound represented by the formula (4) is represented by a formula (42) below.

[Formula 142]

(42)

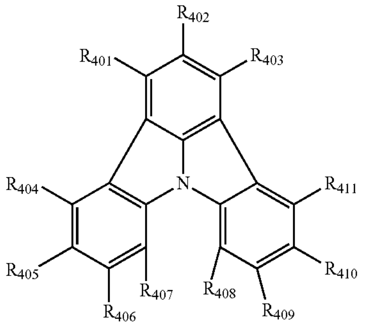

In the formula (42): at least one combination of adjacent two or more of $R_{401}$ to $R_{411}$ are mutually bonded to form a substituted or unsubstituted monocyclic ring, mutually bonded to form a substituted or unsubstituted fused ring, or not mutually bonded; and $R_{401}$ to $R_{411}$ neither forming the monocyclic ring nor forming the fused ring each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $R_{401}$ to $R_{411}$ is preferably a group represented by the formula (4a). More preferably, at least two of $R_{401}$ to $R_{411}$ are groups represented by the formula (21a).

$R_{404}$ and $R_{411}$ are preferably groups represented by the formula (4a).

In an exemplary embodiment, the compound represented by the formula (4) is a compound formed by bonding a moiety represented by a formula (4-1) or a formula (4-2) below to the A1 ring.

Further, in an exemplary embodiment, the compound represented by the formula (42) is a compound formed by bonding the moiety represented by the formula (4-1) or the formula (4-2) to the ring bonded with $R_{404}$ to $R_{407}$.

[Formula 143]

(4-1)

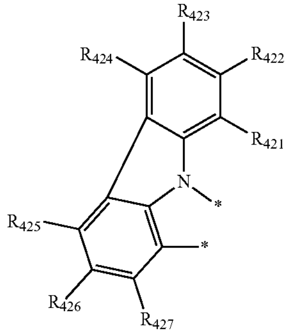

(4-2)

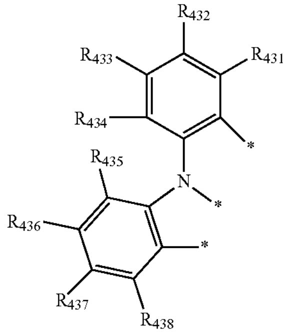

In the formula (4-1), two bonds * are each independently bonded to the ring-forming carbon atom of the aromatic hydrocarbon ring or the ring atom of the heterocycle for the A1 ring in the formula (4) or bonded to one of $R_{404}$ to $R_{407}$ in the formula (42);

in the formula (4-2), three bonds * are each independently bonded to the ring-forming carbon atom of the aromatic hydrocarbon ring or the ring atom of the heterocycle for the A1 ring in the formula (4) or bonded to one of $R_{404}$ to $R_{407}$ in the formula (42);

at least one combination of adjacent two or more of $R_{421}$ to $R_{427}$ are mutually bonded to form a substituted or unsubstituted monocyclic ring, mutually bonded to form a substituted or unsubstituted fused ring, or not mutually bonded;

at least one combination of adjacent two or more of $R_{431}$ to $R_{438}$ are mutually bonded to form a substituted or unsubstituted monocyclic ring, mutually bonded to form a substituted or unsubstituted fused ring, or not mutually bonded; and $R_{421}$ to $R_{427}$ and $R_{431}$ to $R_{438}$ neither forming the monocyclic ring nor forming the fused ring each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by a formula (41-3), a formula (41-4) or a formula (41-5) below.

[Formula 144]

(41-3)

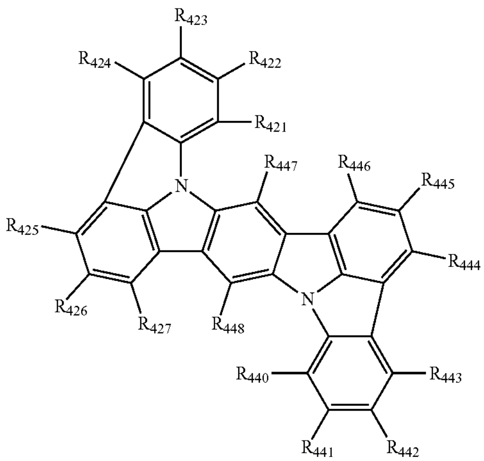

[Formula 145]

(41-4)

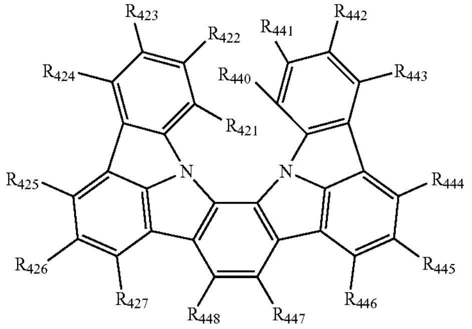

[Formula 146]

(41-5)

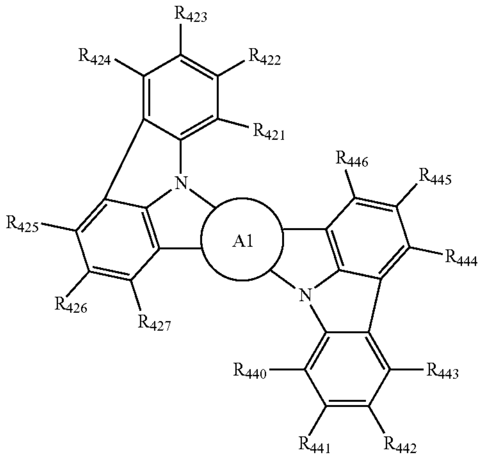

In the formulae (41-3), (41-4), and (41-5):

A1 ring is as defined for the formula (4);

$R_{421}$ to $R_{427}$ each independently represent the same as $R_{421}$ to $R_{427}$ in the formula (4-1); and $R_{440}$ to $R_{448}$ each independently represent the same as $R_{401}$ to $R_{411}$ in the formula (42).

In an exemplary embodiment, a substituted or unsubstituted aromatic hydrocarbon ring having 6 to 50 ring carbon atoms for the A1 ring in the formula (41-5) is a substituted or unsubstituted naphthalene ring, or a substituted or unsubstituted fluorene ring.

In an exemplary embodiment, a substituted or unsubstituted heterocycle having 5 to 50 ring atoms for the A1 ring in the formula (41-5) is a substituted or unsubstituted dibenzofuran ring, a substituted or unsubstituted carbazole ring, or a substituted or unsubstituted dibenzothiophene ring.

In an exemplary embodiment, the compound represented by the formula (4) or the formula (42) is a compound selected from the group consisting of compounds represented by formulae (461) to (467) below.

[Formula 147]

(461)

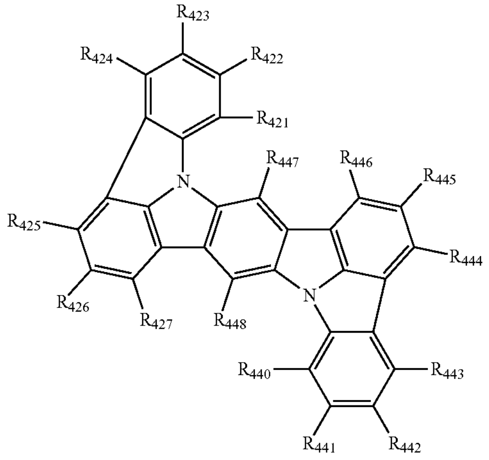

(462)

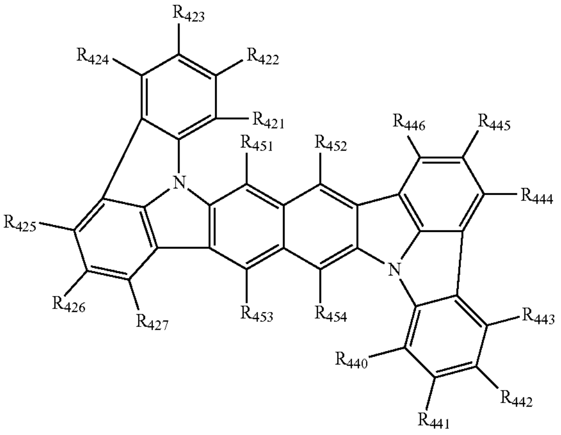

-continued

[Formula 148]

(463)

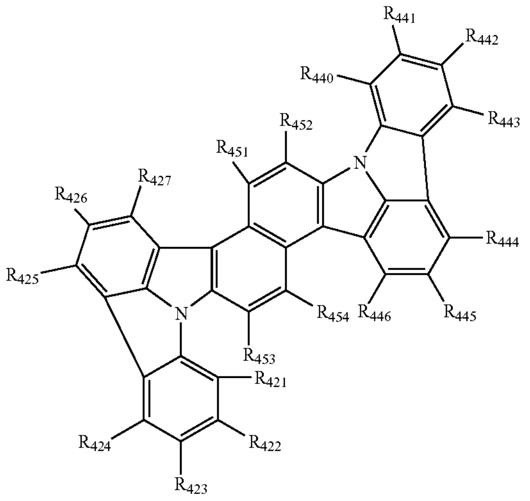

(464)

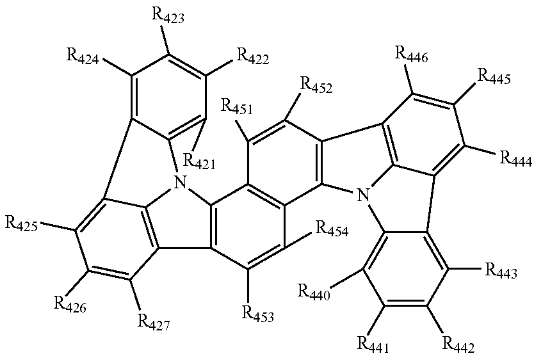

[Formula 149]

(465)

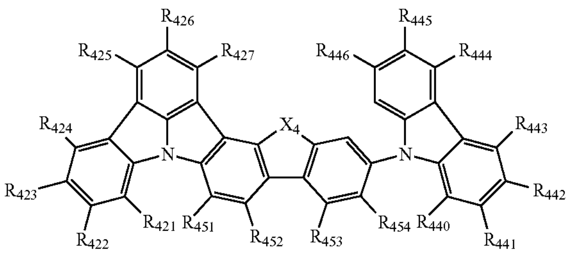

[Formula 150]

(466)

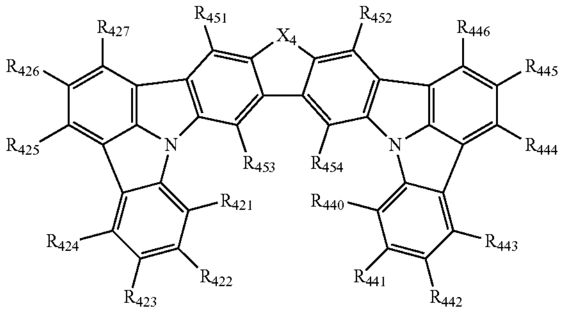

-continued

[Formula 151]

(467)

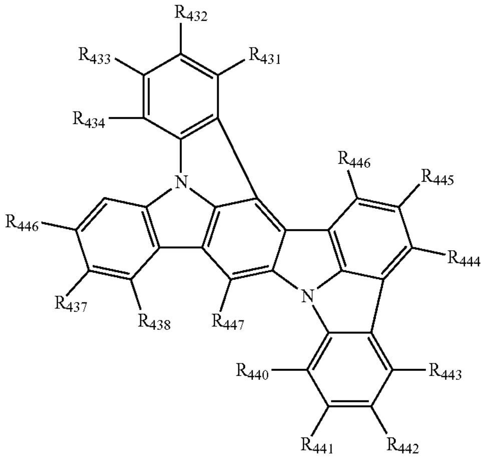

In the formulae (461), (462), (463), (464), (465), (466), and (467):

$R_{421}$ to $R_{427}$ each independently represent the same as $R_{421}$ to $R_{427}$ in the formula (4-1);

$R_{431}$ to $R_{438}$ each independently represent the same as $R_{431}$ to $R_{438}$ in the formula (4-2);

$R_{440}$ to $R_{448}$ and $R_{451}$ to $R_{454}$ each independently represent the same as $R_{401}$ to $R_{411}$ in the formula (42);

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, in the compound represented by the formula (42), at least one combination of adjacent two or more of $R_{401}$ to $R_{411}$ are mutually bonded to form a substituted or unsubstituted monocyclic ring or a substituted or unsubstituted fused ring. The compound represented by the formula (42) in the exemplary embodiment is described in detail as a compound represented by a formula (45).

Compound Represented by Formula (45)

The compound represented by the formula (45) will be described.

[Formula 152]

(45)

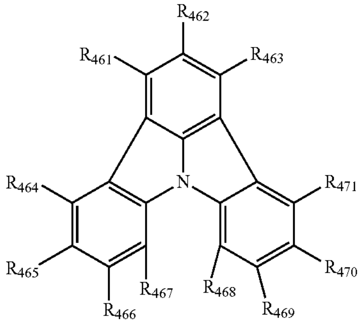

In the formula (45), two or more of combinations selected from the group consisting of a combination of $R_{461}$ and $R_{462}$, a combination of $R_{462}$ and $R_{463}$, a combination of $R_{464}$ and $R_{465}$, a combination of $R_{465}$ and $R_{466}$, a combination of $R_{466}$ and $R_{467}$, a combination of $R_{468}$ and $R_{469}$, a combination of $R_{469}$ and $R_{470}$, and a combination of $R_{470}$ and $R_{471}$ are mutually bonded to form a substituted or unsubstituted monocyclic ring or a substituted or unsubstituted fused ring.

However, the combination of $R_{461}$ and $R_{462}$ and the combination of $R_{462}$ and $R_{463}$, the combination of $R_{464}$ and $R_{465}$ and the combination of $R_{465}$ and $R_{466}$, the combination of $R_{465}$ and $R_{466}$ and the combination of $R_{466}$ and $R_{467}$, the combination of $R_{468}$ and $R_{469}$ and the combination of $R_{469}$ and $R_{470}$, and the combination of $R_{469}$ and $R_{470}$ and the combination of $R_{470}$ and $R_{471}$ do not form a ring at the same time.

At least two rings formed by $R_{461}$ to $R_{471}$ are mutually the same or different.

$R_{461}$ to $R_{471}$ neither forming the monocyclic ring nor forming the fused ring each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In the formula (45), $R_n$ and $R_{n+1}$ (n being an integer selected from 461, 462, 464 to 466, and 468 to 470) are mutually bonded to form a substituted or unsubstituted monocyclic ring or fused ring together with two ring-forming carbon atoms bonded with $R_n$ and $R_{n+1}$. The ring is preferably formed of atoms selected from the group consisting of a carbon atom, an oxygen atom, a sulfur atom, and a nitrogen atom, and is made of 3 to 7, more preferably 5 or 6 atoms.

The number of the above cyclic structures in the compound represented by the formula (45) is, for instance, 2, 3, or 4. The two or more of the cyclic structures may be present on the same benzene ring on the basic skeleton represented by the formula (45) or may be present on different benzene rings. For instance, when three cyclic structures are present, each of the cyclic structures may be present on corresponding one of the three benzene rings of the formula (45).

Examples of the above cyclic structures in the compound represented by the formula (45) include structures represented by formulae (451) to (460) below.

[Formula 153]

(451)

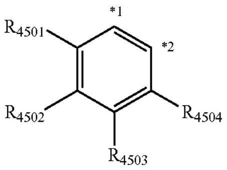

(452)

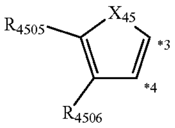

(453)

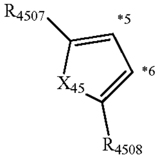

(454)

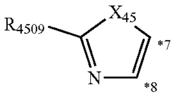

(455)

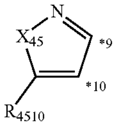

(456)

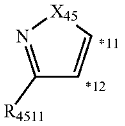

(457)

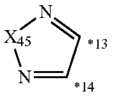

In the formulae (451) to (457):

each combination of *1 and *2, *3 and *4, *5 and *6, *7 and *8, *9 and *10, *11 and *12, and *13 and *14 represent the two ring-forming carbon atoms respectively bonded with $R_n$ and $R_{n+1}$; the ring-forming carbon atom bonded with $R_n$ may be any one of the two ring-forming carbon atoms represented by *1 and *2, *3 and *4, *5 and *6, *7 and *8, *9 and *10, *11 and *12, and *13 and *14;

$X_{45}$ is $C(R_{4512})(R_{4513})$, $NR_{4514}$, an oxygen atom, or a sulfur atom;

at least one combination of adjacent two or more of $R_{4501}$ to $R_{4506}$ and $R_{4512}$ to $R_{4513}$ are mutually bonded to form a substituted or unsubstituted monocyclic ring, mutually bonded to form a substituted or unsubstituted fused ring, or not mutually bonded; and $R_{4501}$ to $R_{4514}$ neither forming the monocyclic ring nor the fused ring each independently represent the same as $R_{461}$ to $R_{471}$ in the formula (45).

[Formula 154]

(458)

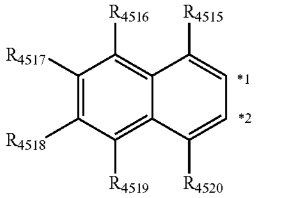

(459)

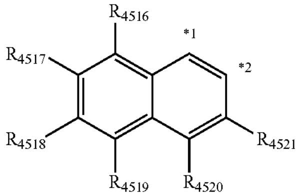

(460)

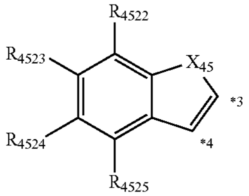

In the formulae (458) to (460):

each combination of *1 and *2, and *3 and *4 represent the two ring-forming carbon atoms each bonded with $R_n$ and $R_{n+1}$;

the ring-forming carbon atom bonded with $R_n$ may be any one of the two ring-forming carbon atoms represented by *1 and *2, or *3 and *4;

$X_{45}$ is $C(R_{4512})(R_{4513})$, $NR_{4514}$, an oxygen atom, or a sulfur atom;

at least one combination of adjacent two or more of $R_{4512}$ to $R_{4513}$ and $R_{4515}$ to $R_{4525}$ are mutually bonded to form a substituted or unsubstituted monocyclic ring, mutually bonded to form a substituted or unsubstituted fused ring, or not mutually bonded; and $R_{4512}$ to $R_{4513}$, $R_{4515}$ to $R_{4521}$, $R_{4522}$ to $R_{4525}$, and $R_{4514}$ $R_{4514}$ neither forming the monocyclic ring nor the fused ring each independently represent the same as $R_{461}$ to $R_{471}$ in the formula (45).

In the formula (45), it is preferable that at least one of $R_{462}$, $R_{464}$, $R_{465}$, $R_{470}$ or $R_{471}$ (preferably, at least one of $R_{462}$, $R_{465}$ or $R_{470}$, more preferably $R_{462}$) is a group not forming the cyclic structure.

(i) A substituent, if present, of the cyclic structure formed by $R_n$ and $R_{n+1}$ of the formula (45), (ii) $R_{461}$ to $R_{471}$ not forming the cyclic structure in the formula (45), and (iii) $R_{4501}$ to $R_{4514}$, $R_{4515}$ to $R_{4525}$ in the formulae (451) to (460) are preferably each independently one selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, a substituted or unsubstituted aryl group having 6 to 50 ring carbon atoms, a substituted or unsubstituted heterocyclic group having 5 to 50 ring atoms, or groups represented by formulae (461) to (464) below.

[Formula 155]

(461)

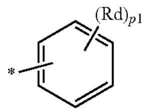

(462)

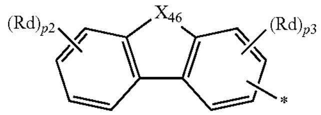

(463)

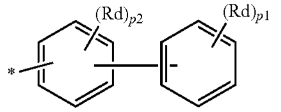

(464)

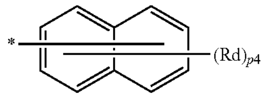

In the formulae (461) to (464): Rd each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_{46}$ represents $C(R_{801})(R_{802})$, $NR_{803}$, an oxygen atom or a sulfur atom;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different;

when a plurality of $R_{803}$ are present, the plurality of $R_{803}$ are mutually the same or different;

p1 is 5;

p2 is 4;

p3 is 3;

p4 is 7; and

* in the formulae (461) to (464) each independently represents a bonding position to a cyclic structure.

In the third compound and the fourth compound, $R_{901}$ to $R_{907}$ are as defined above.

In an exemplary embodiment, the compound represented by the formula (45) is represented by one of formulae (45-1) to (45-6) below.

[Formula 156]

(45-1)

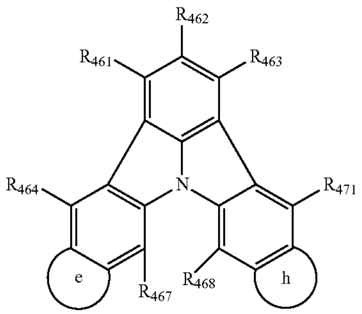

(45-2)

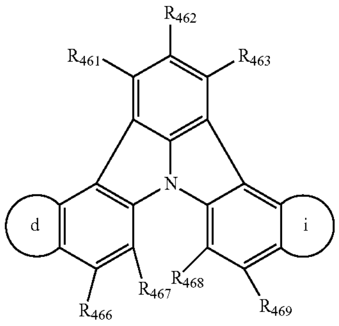

(45-3)

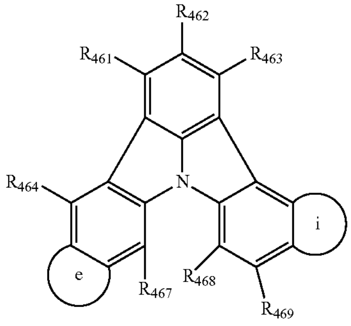

[Formula 157]

(45-4)

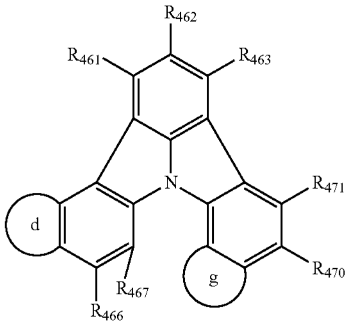

-continued (45-5)

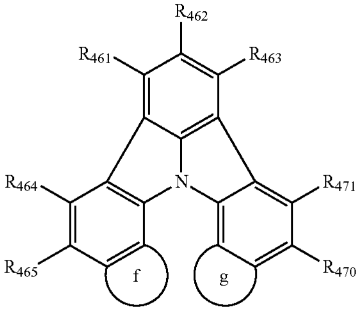

(45-6)

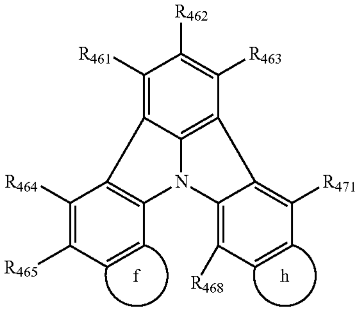

In the formulae (45-1) to (45-6):

rings d to i are each dependently a substituted or unsubstituted monocyclic ring or a substituted or unsubstituted fused ring; and $R_{461}$ to $R_{471}$ respectively independently represent the same as $R_{461}$ to $R_{471}$ in the formula (45).

In an exemplary embodiment, the compound represented by the formula (45) is represented by one of formulae (45-7) to (45-12) below.

[Formula 158]

(45-7)

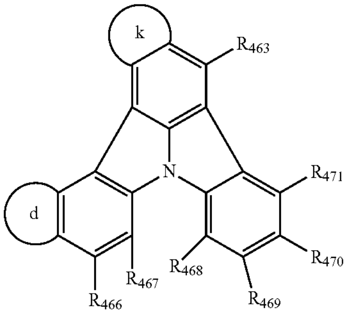

(45-8)

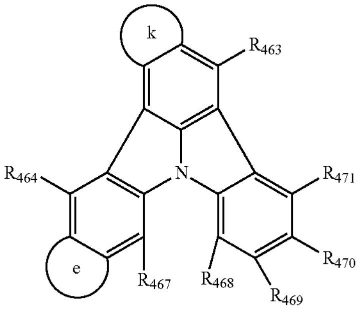

-continued (45-9)

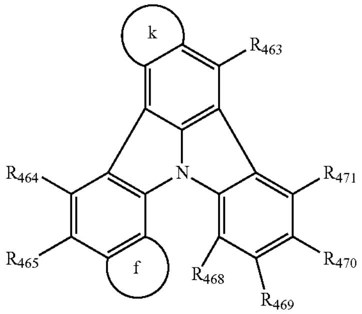

[Formula 159]

(45-10)

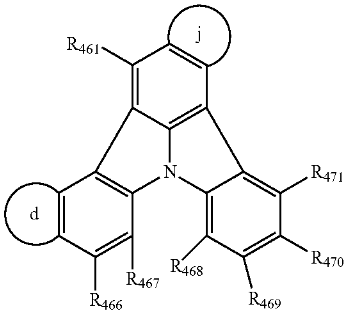

(45-11)

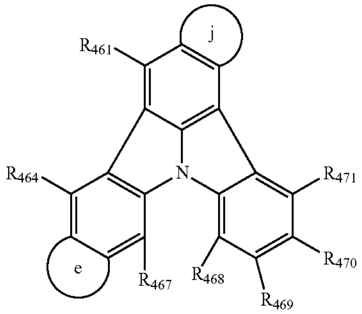

(45-12)

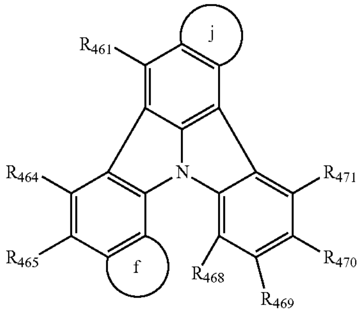

In the formulae (45-7) to (45-12):

rings d to f, k and j are each dependently a substituted or unsubstituted monocyclic ring or a substituted or unsubstituted fused ring; and $R_{461}$ to $R_{471}$ respectively independently represent the same as $R_{461}$ to $R_{471}$ in the formula (45).

In an exemplary embodiment, a compound represented by the formula (45) is represented by one of formulae (45-13) to (45-21) below.

[Formula 160]

(45-13)

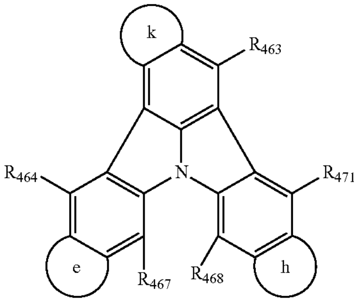

(45-14)

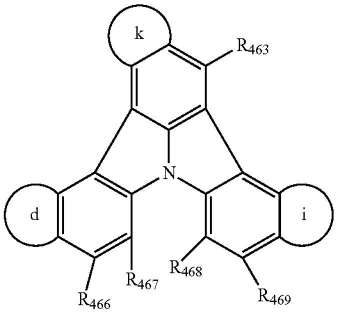

(45-15)

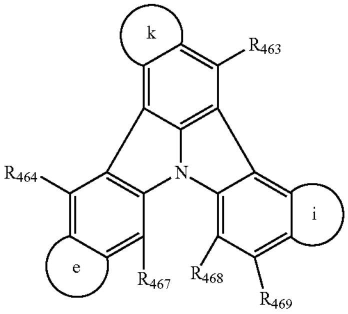

[Formula 161]

(45-16)

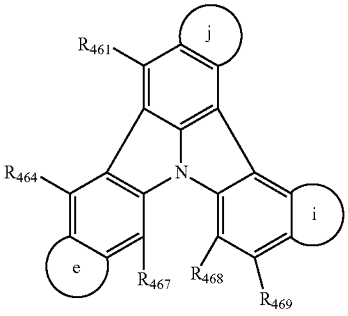

-continued (45-17)

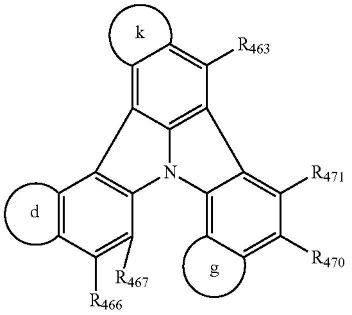

(45-18)

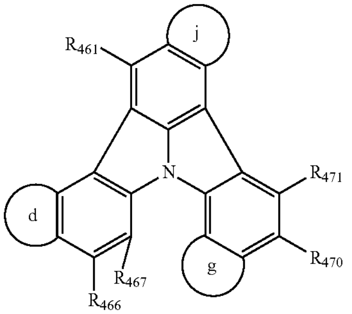

[Formula 162]

(45-19)

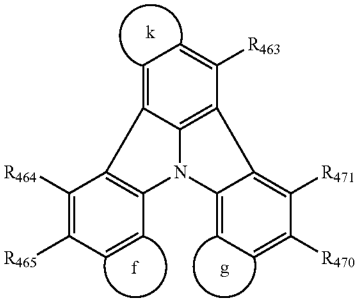

(45-20)

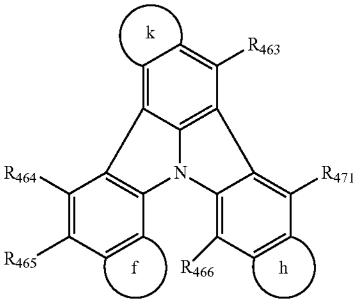

(45-21)

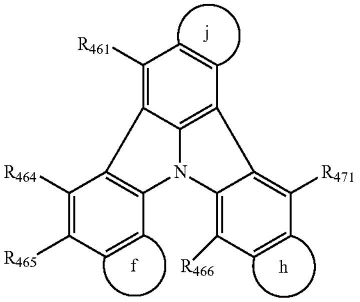

In the formulae (45-13) to (45-21):

rings d to k are each dependently a substituted or unsubstituted monocyclic ring or a substituted or unsubstituted fused ring; and $R_{461}$ to $R_{471}$ respectively independently represent the same as $R_{461}$ to $R_{471}$ in the formula (45).

When the ring g or the ring h further has a substituent, examples of the substituent include a substituted or unsubstituted alkyl group having 1 to 50 carbon atoms, a substituted or unsubstituted aryl group having 6 to 50 ring carbon atoms, a group represented by the formula (461), a group represented by the formula (463), and a group represented by the formula (464).

In an exemplary embodiment, a compound represented by the formula (45) is represented by one of formulae (45-22) to (45-25) below.

[Formula 163]

(45-22)

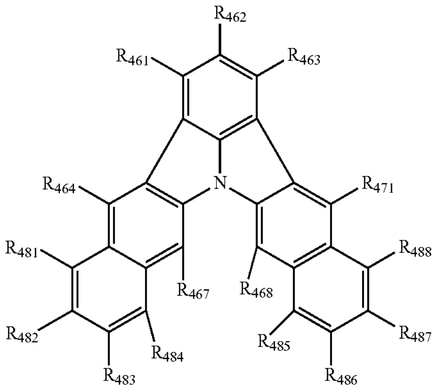

(45-23)

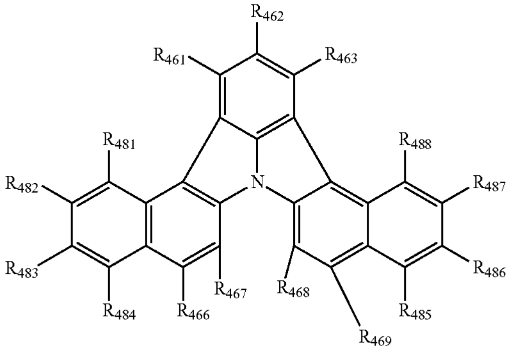

(45-24)

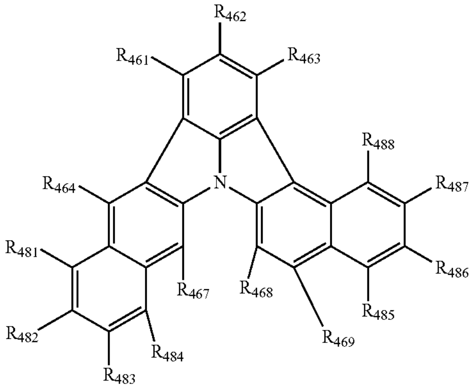

-continued (45-25)

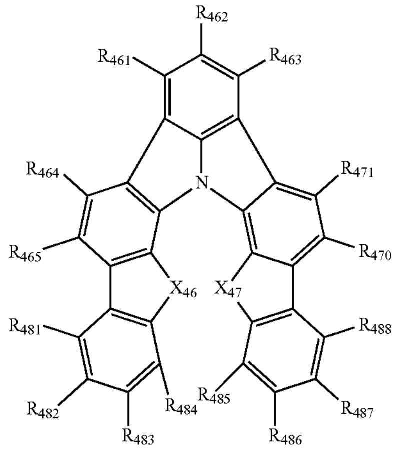

In the formulae (45-22) to (45-25):

$X_{46}$ and $X_{47}$ are each independently $C(R_{801})(R_{802})$, $NR_{803}$, an oxygen atom or a sulfur atom;

$R_{461}$ to $R_{471}$ and $R_{481}$ to $R_{488}$ respectively represent the same as $R_{461}$ to $R_{471}$ of the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, a compound represented by the formula (45) is represented by a formula (45-26) below.

[Formula 164]

(45-26)

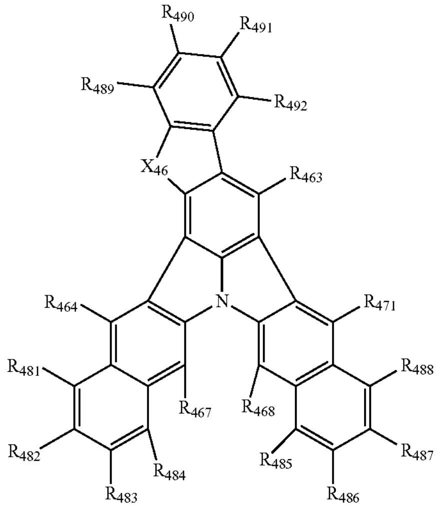

In the formula (45-26): $X_{46}$ represents $C(R_{801})(R_{802})$, $NR_{803}$, an oxygen atom or a sulfur atom;

$R_{463}$, $R_{464}$, $R_{467}$, $R_{468}$, $R_{471}$, and $R_{481}$ to $R_{492}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

Specific Examples of Compound Represented by Formula (4)

Specific examples of a compound represented by the formula (4) include compounds shown below. In the specific examples below, Ph represents a phenyl group, and D represents a deuterium atom.

[Formula 165]
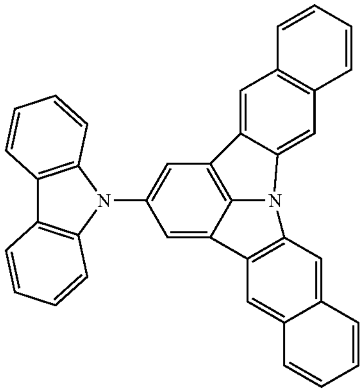
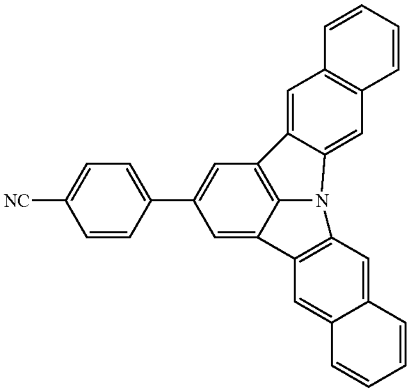
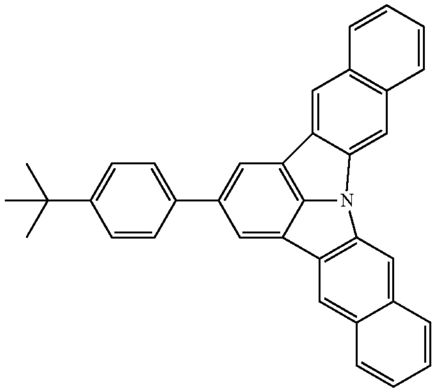
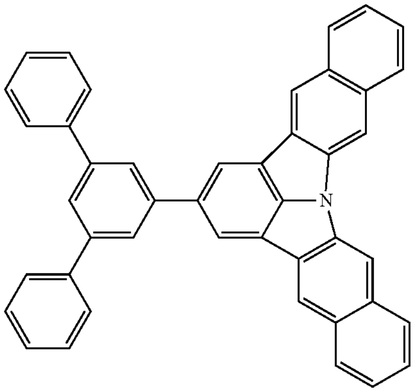
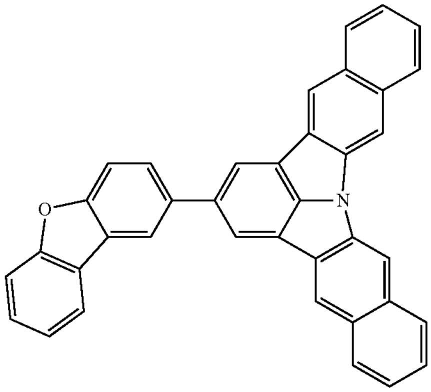
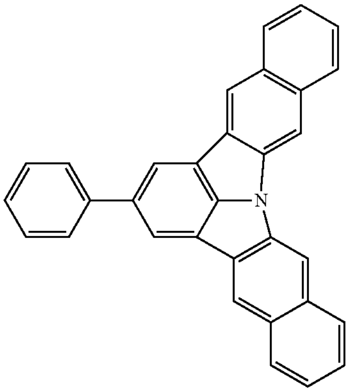
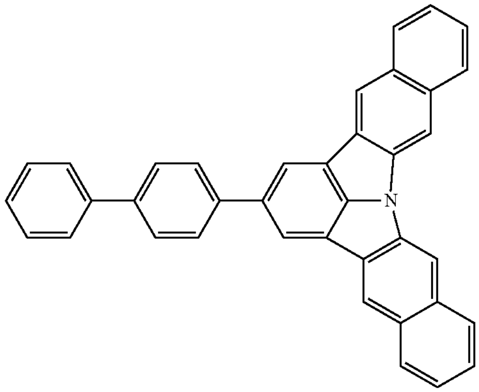
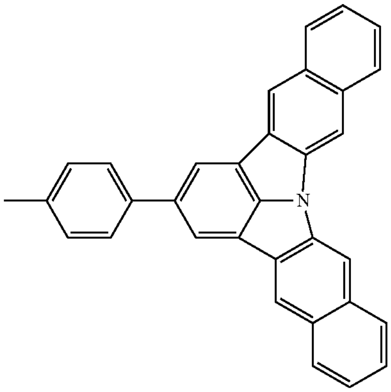

-continued
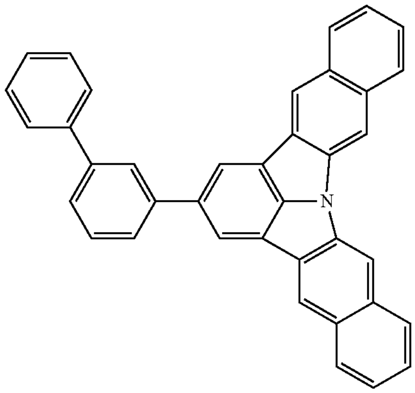
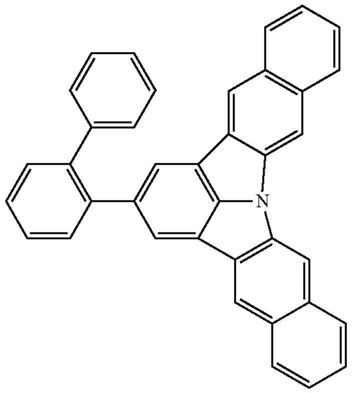
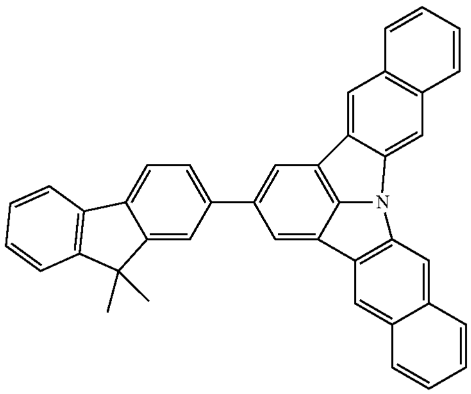
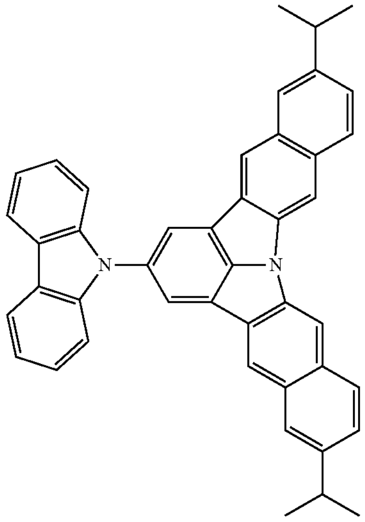
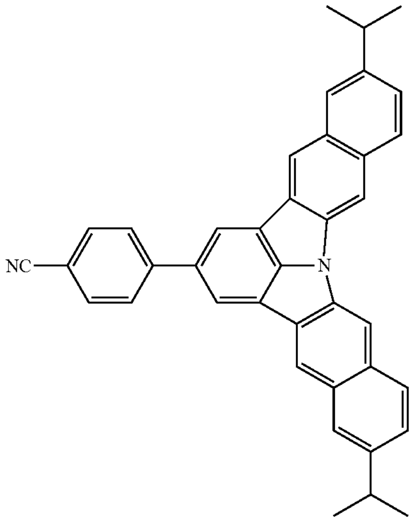
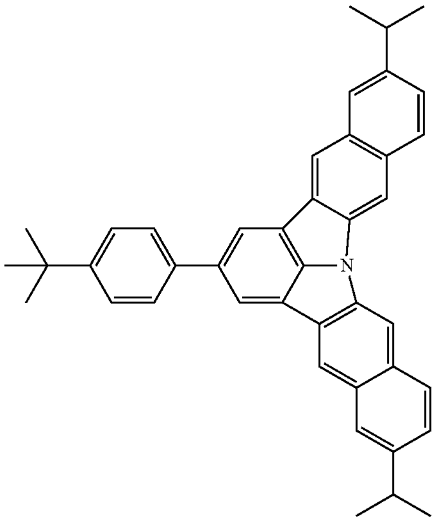

-continued
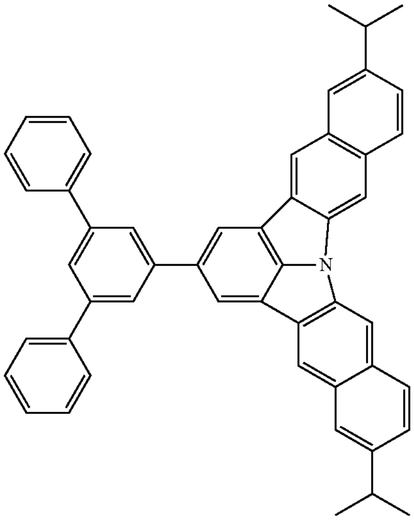
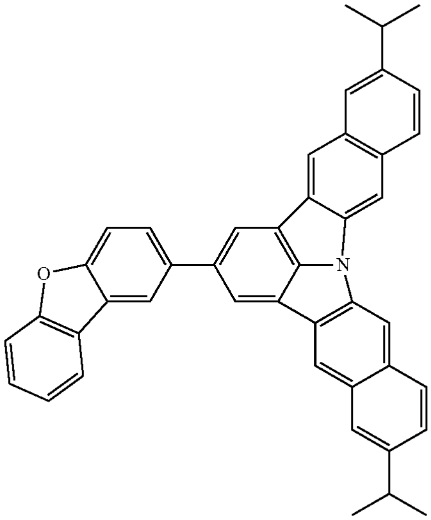
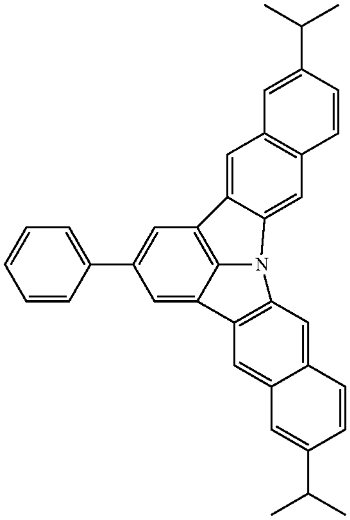
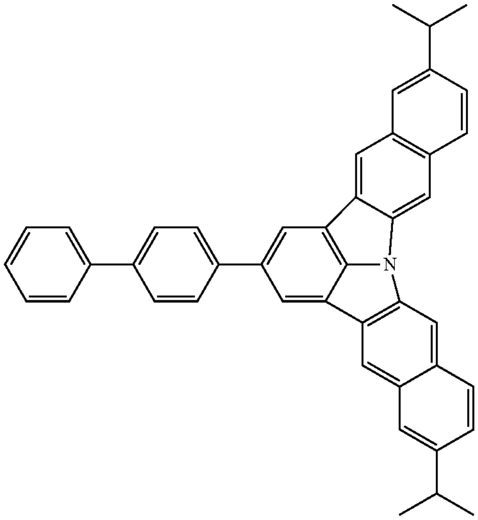
[Formula 166]
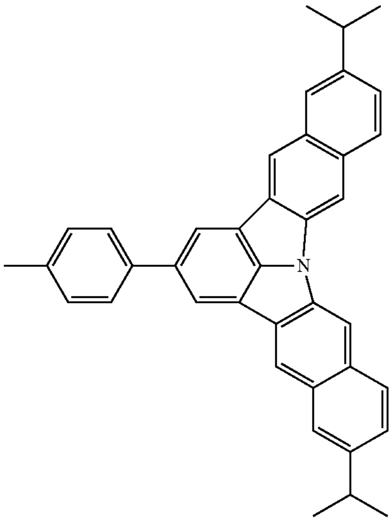
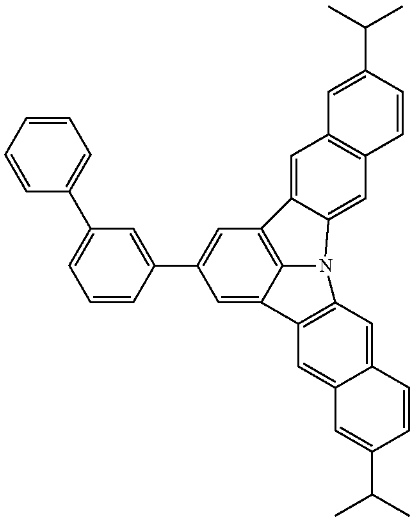

-continued
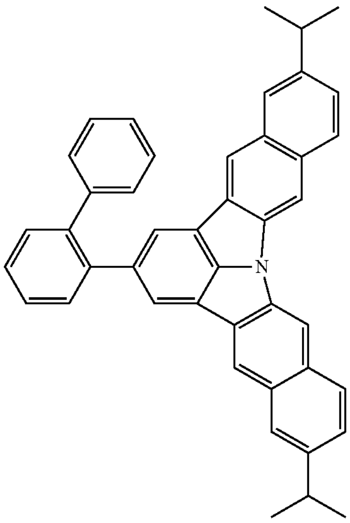 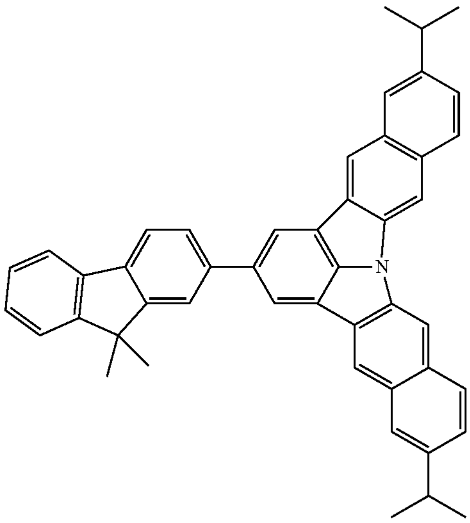
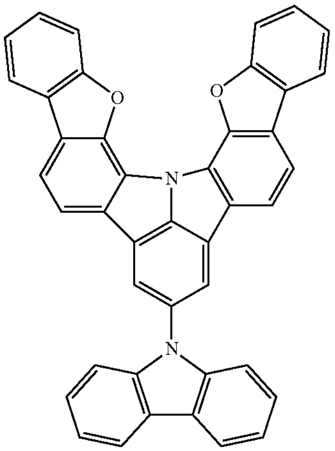 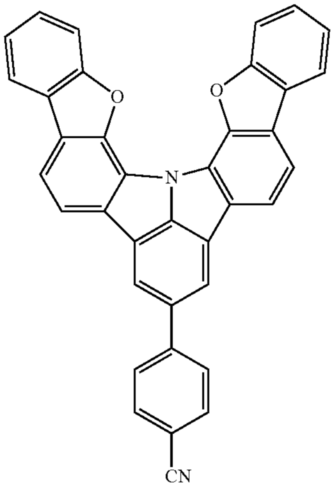 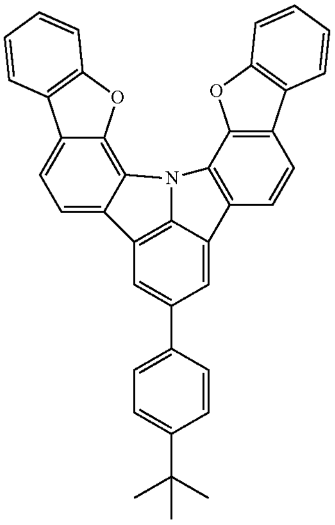
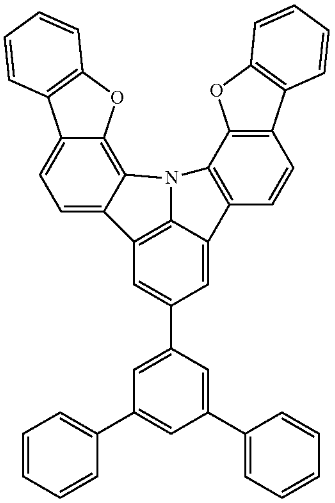 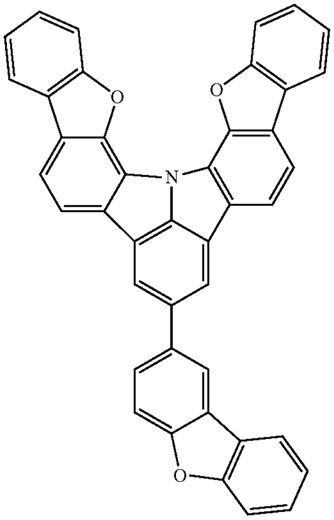 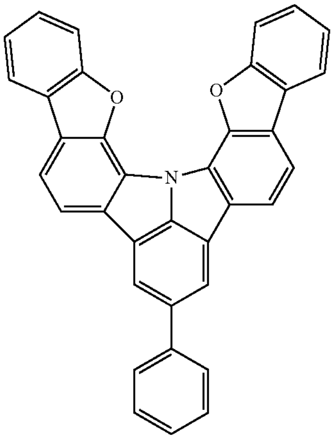

-continued
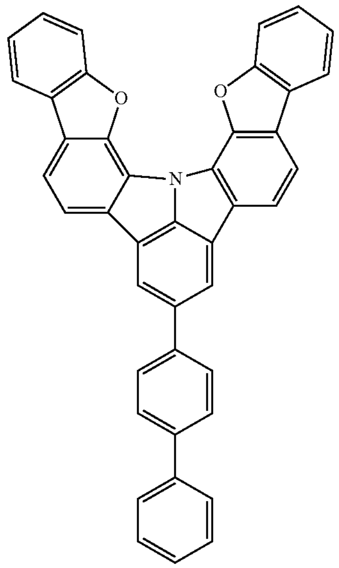
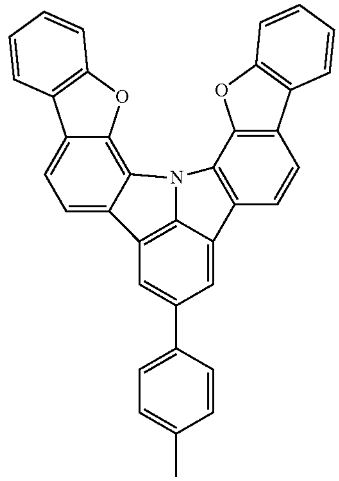
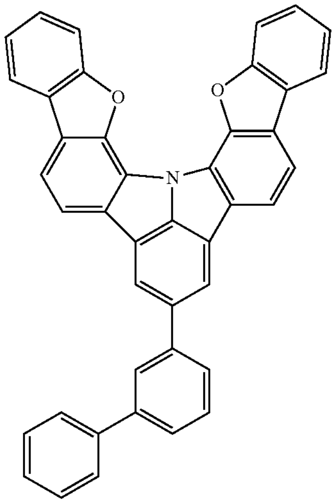
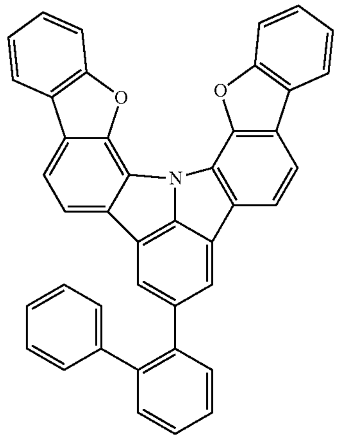
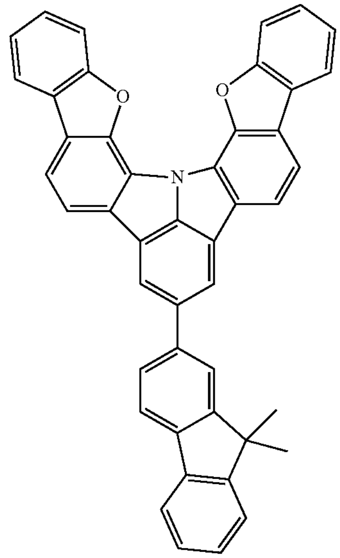
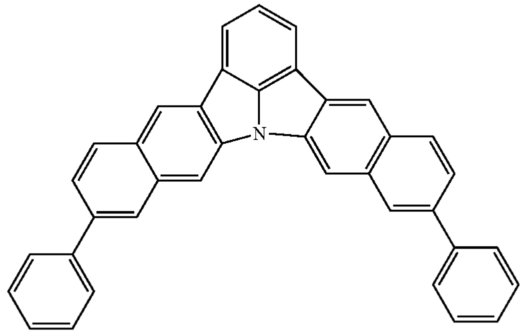
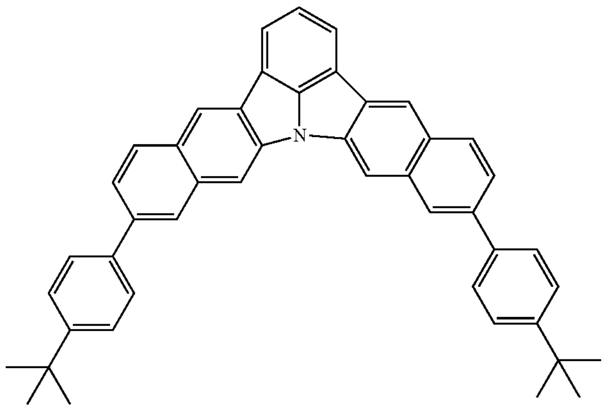

-continued
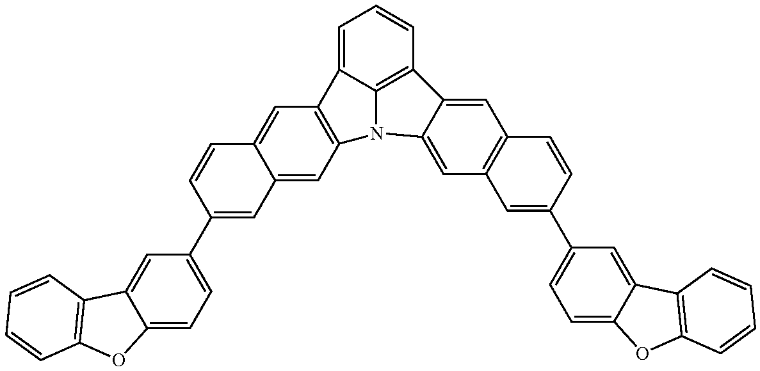
[Formula 167]
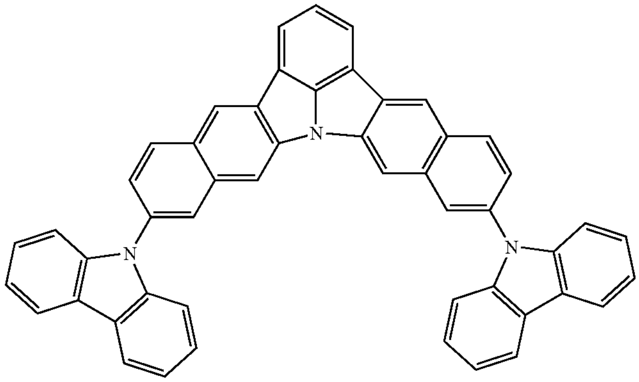
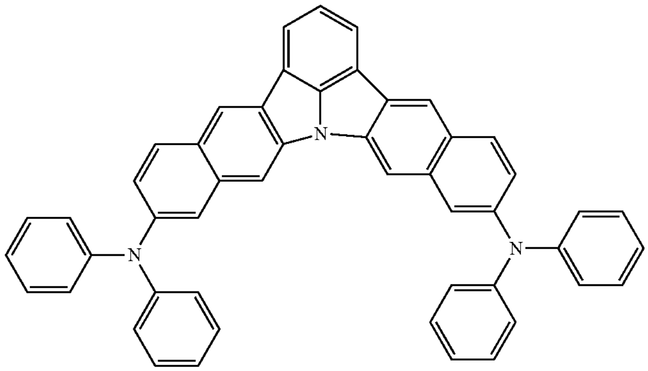
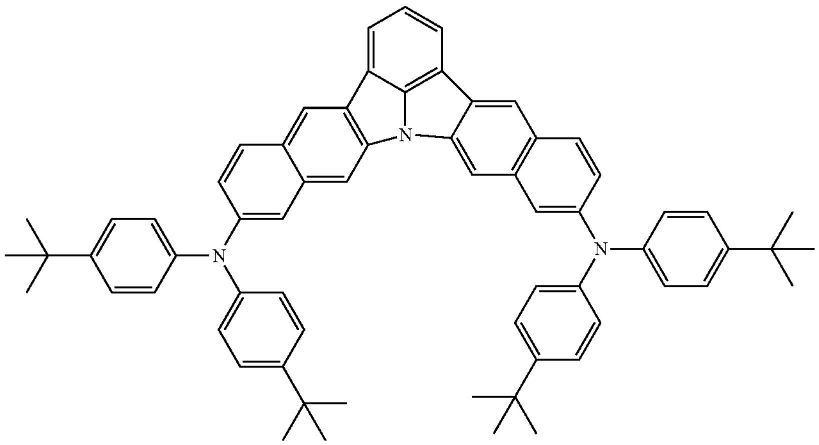

-continued
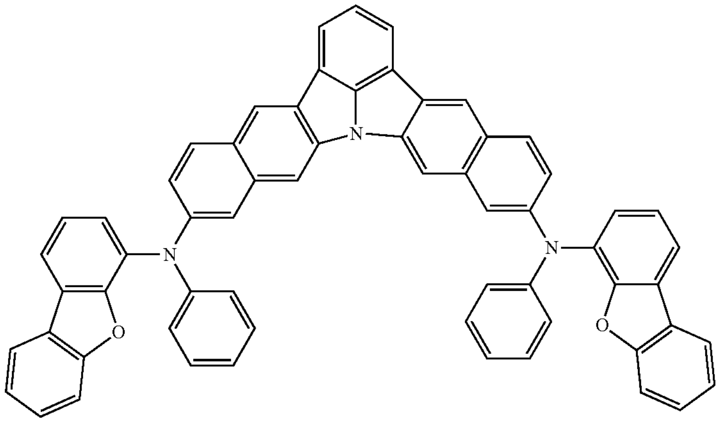
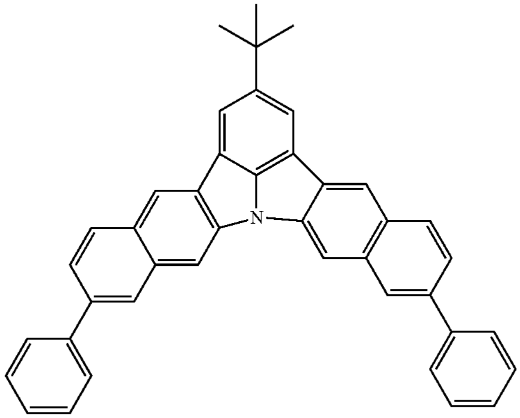
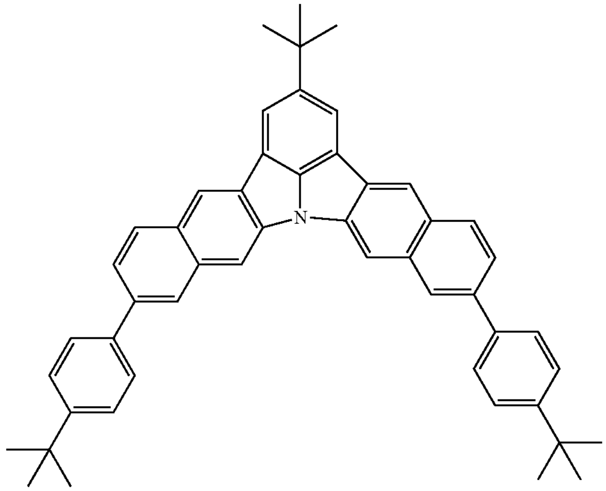
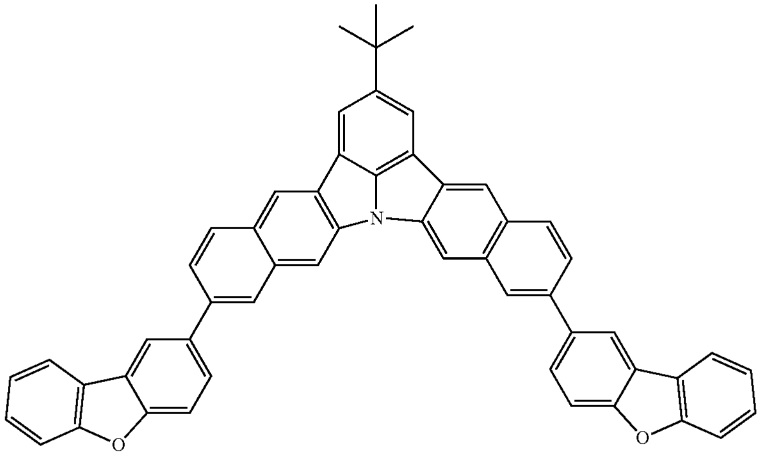

-continued
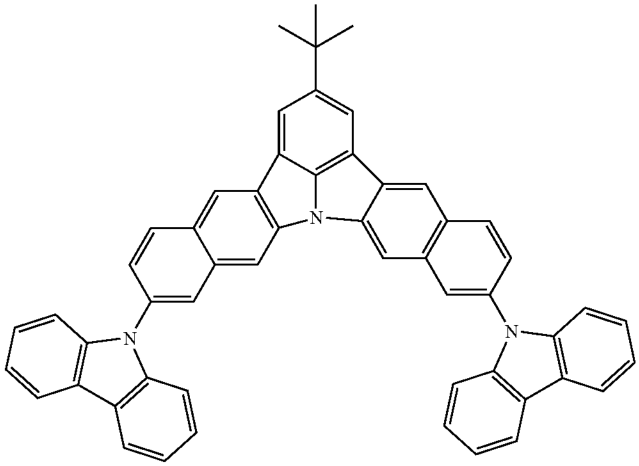
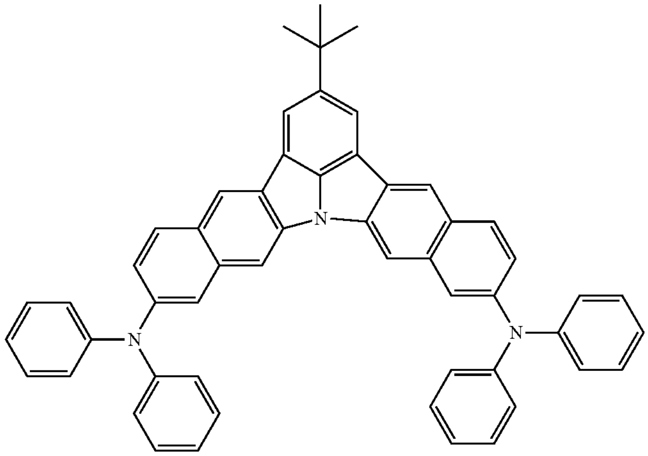
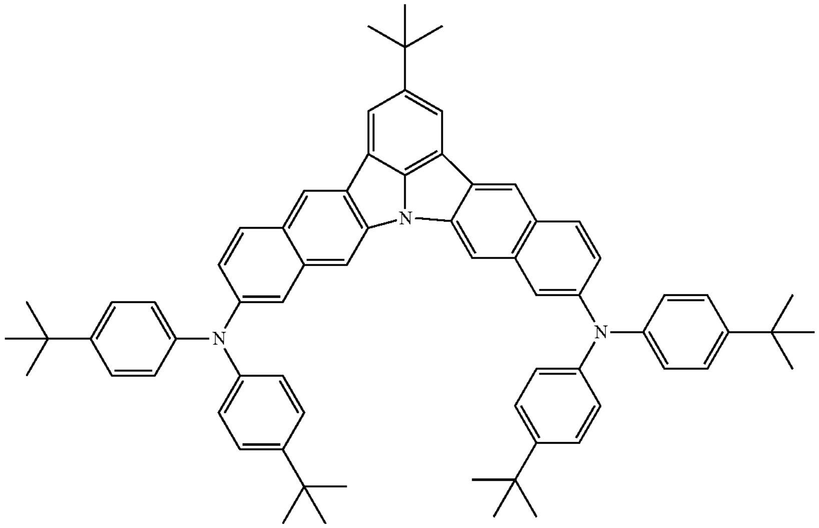

-continued
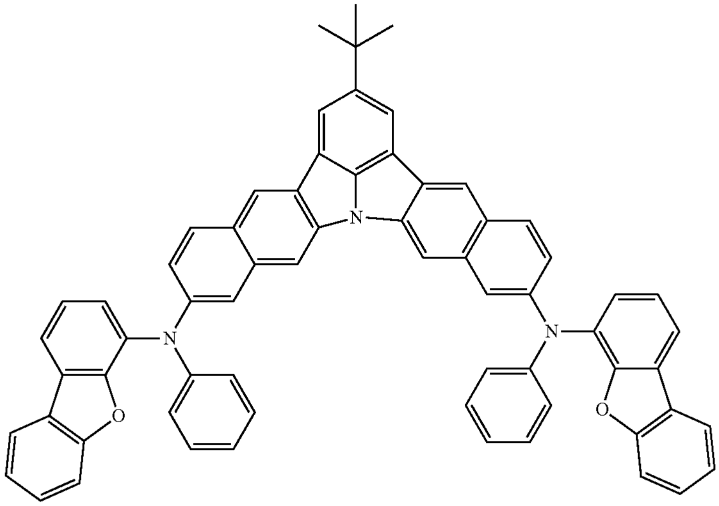
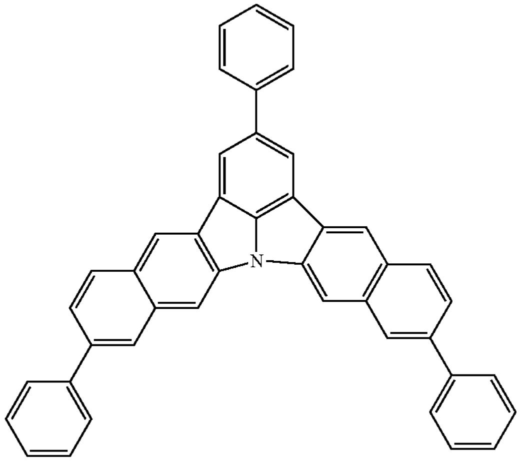
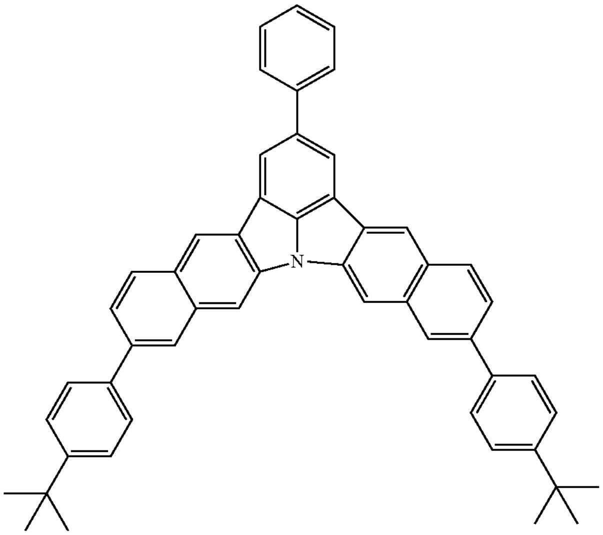
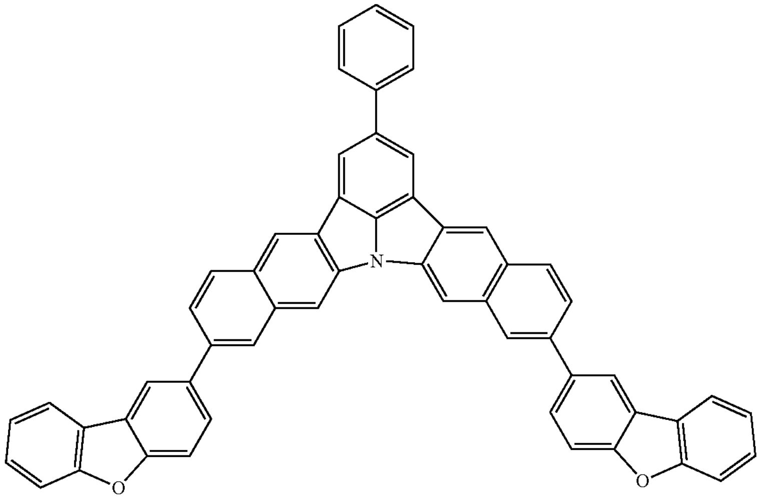

-continued
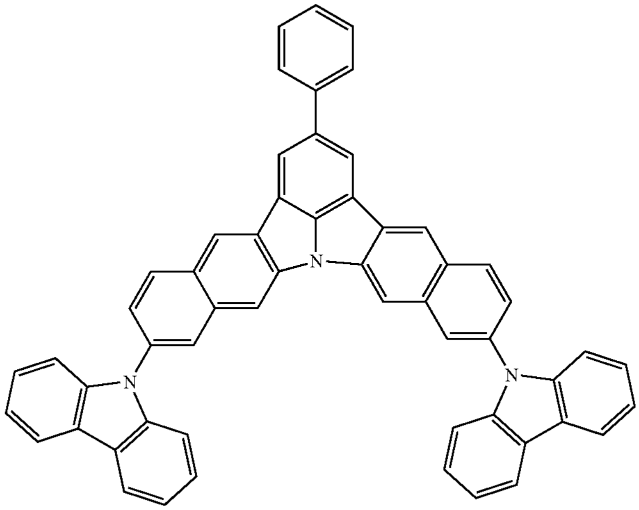
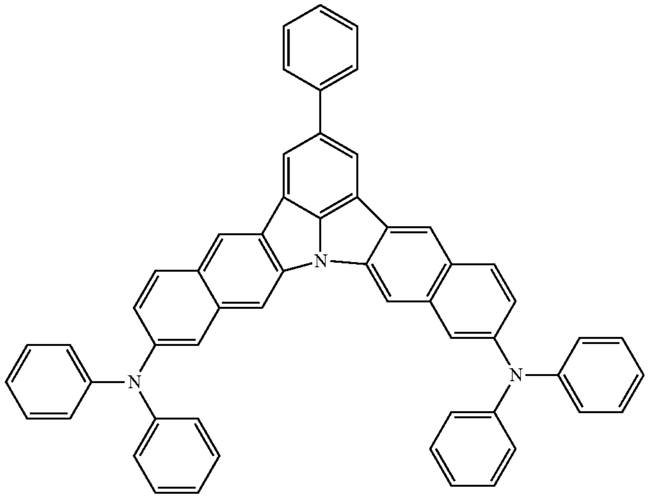
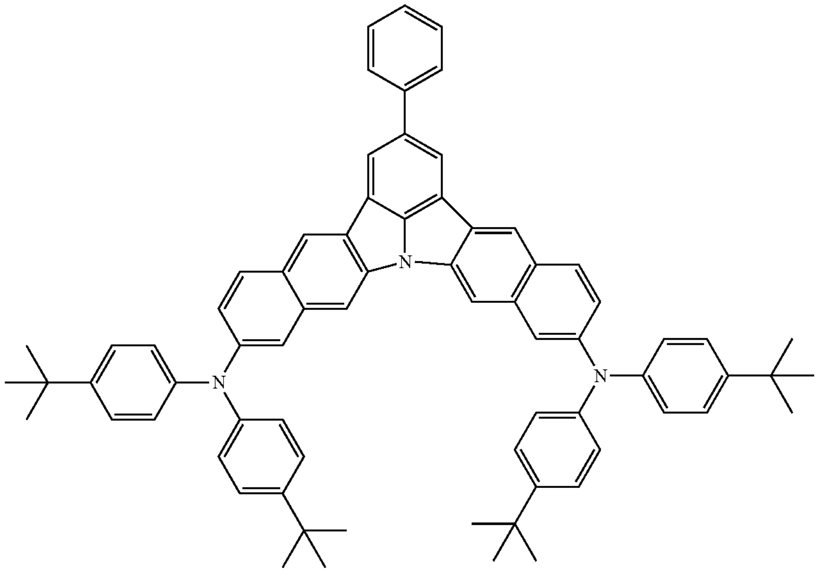

-continued
[Formula 168]
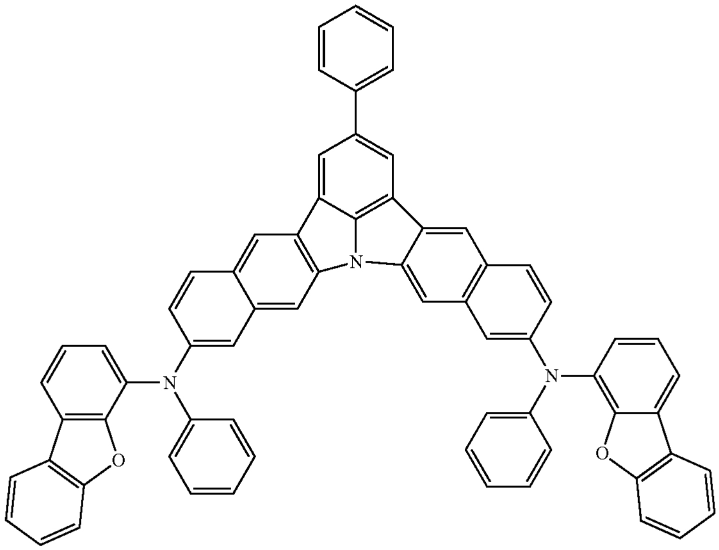
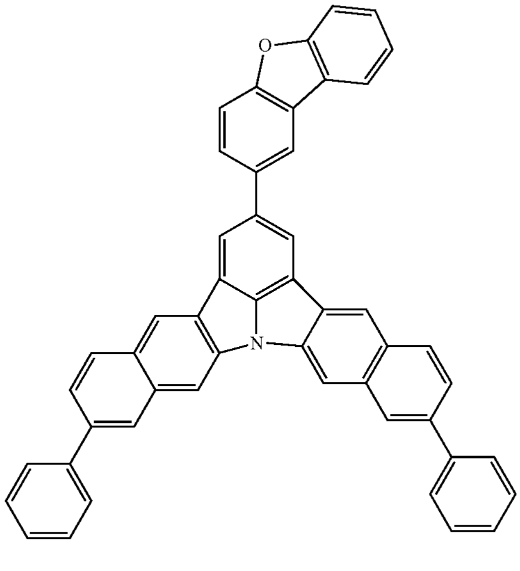
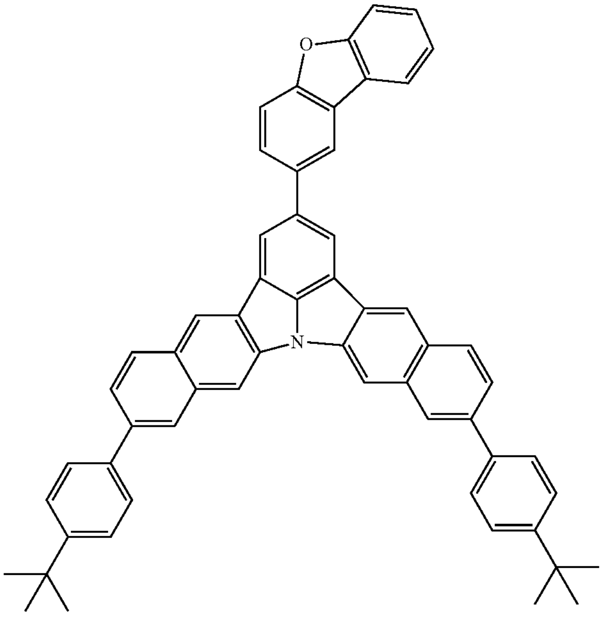

-continued
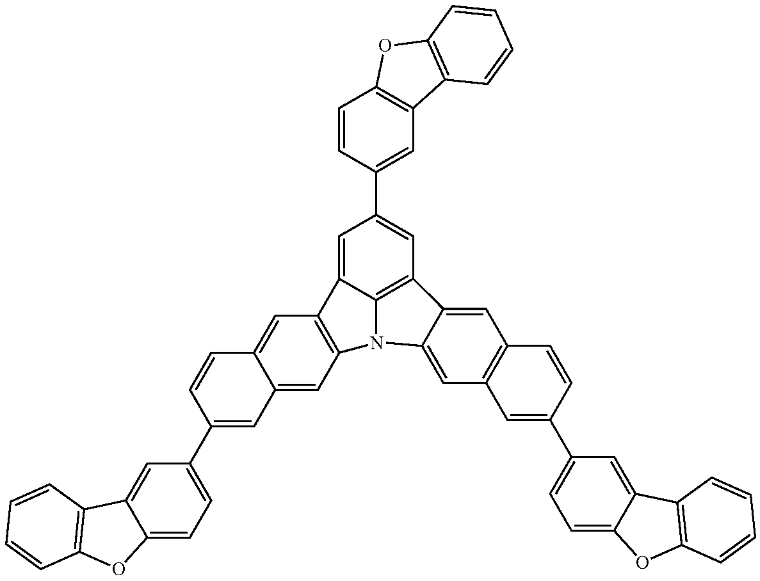
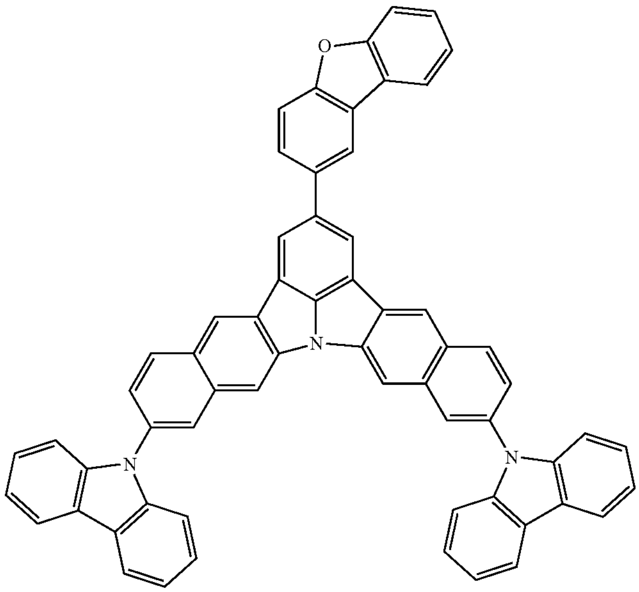

-continued
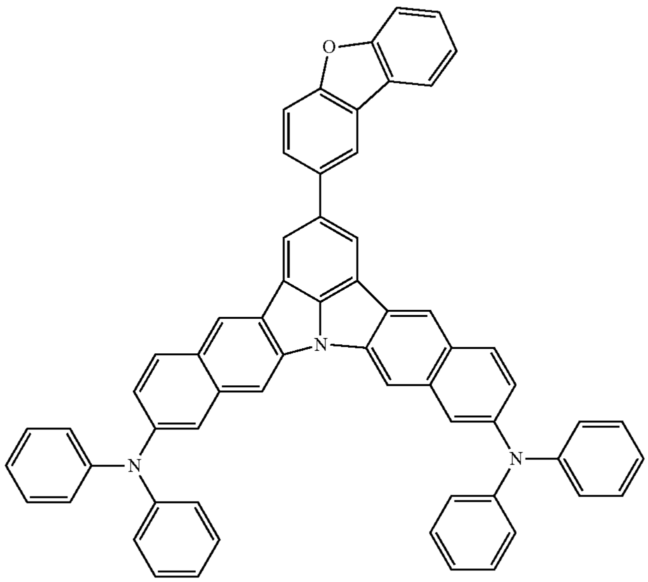
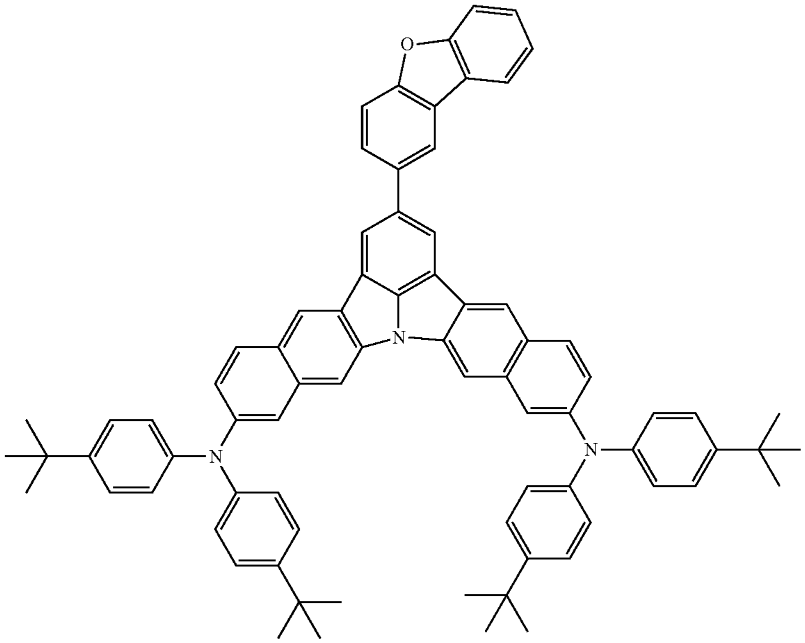

-continued
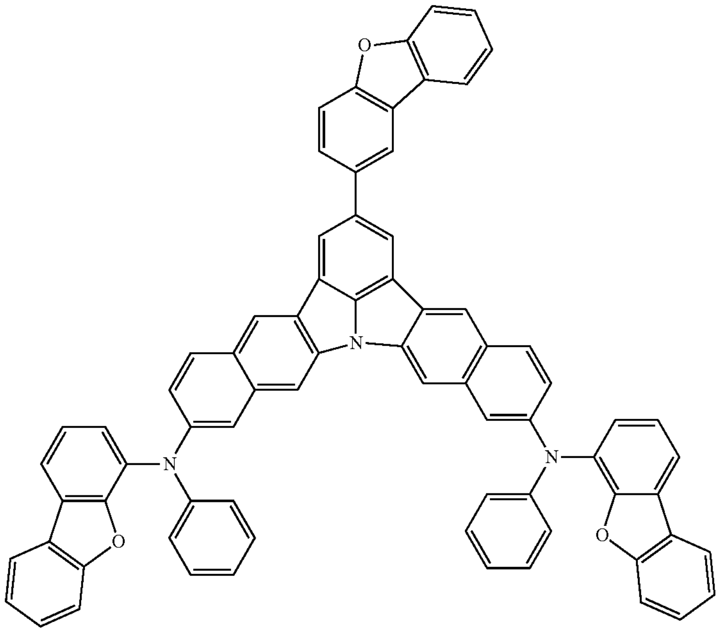
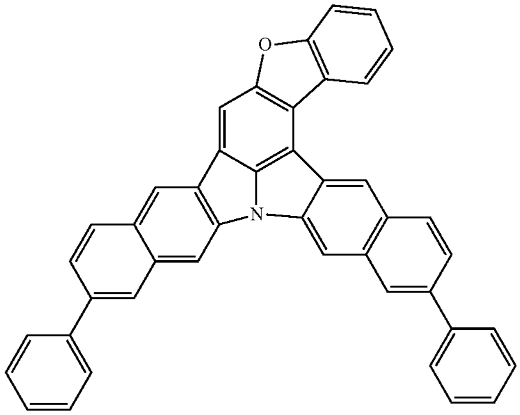
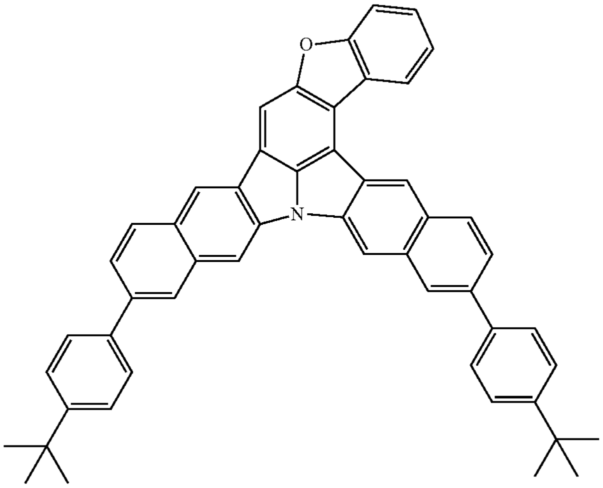
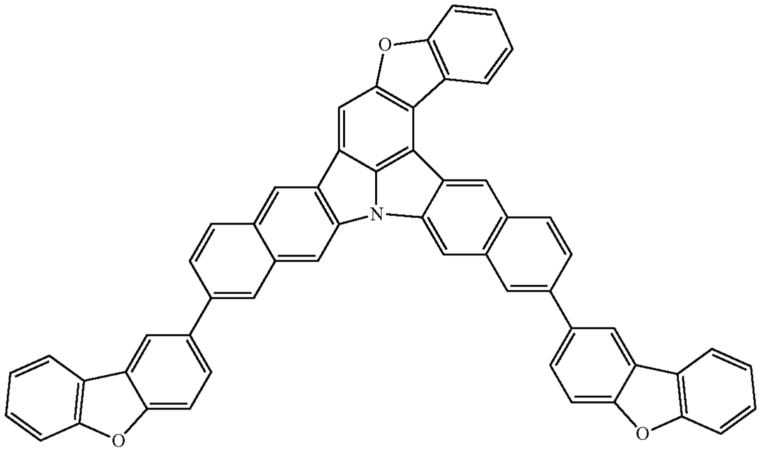

-continued
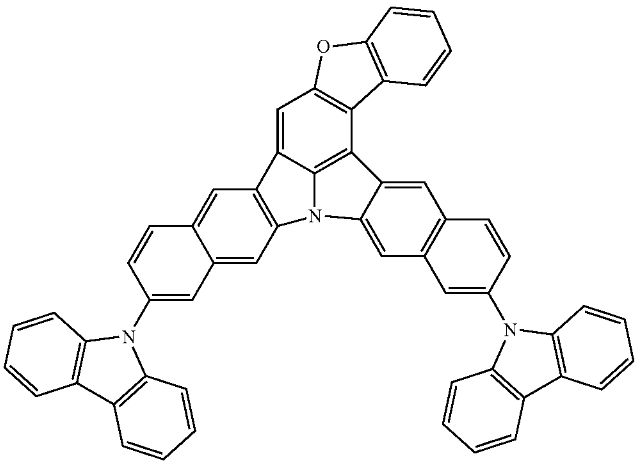
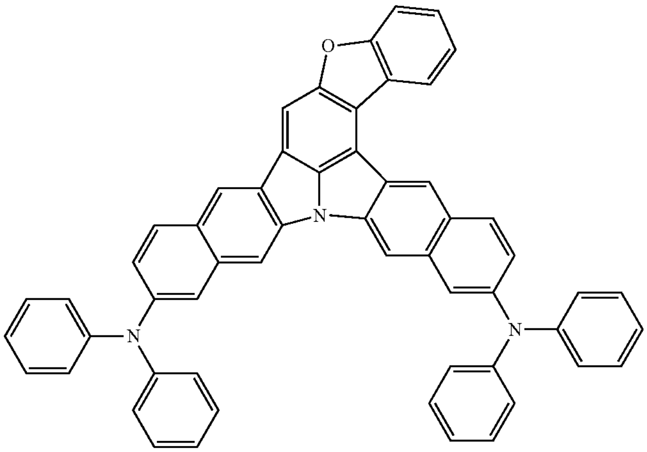
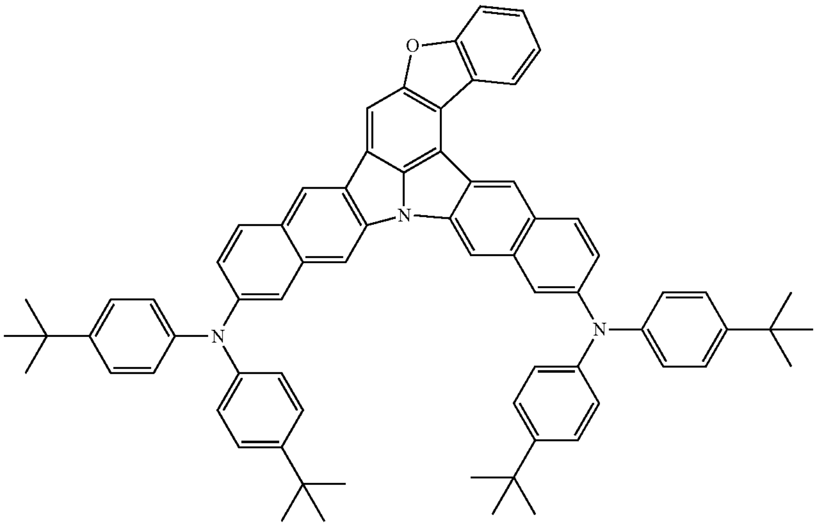

-continued
[Formula 169]
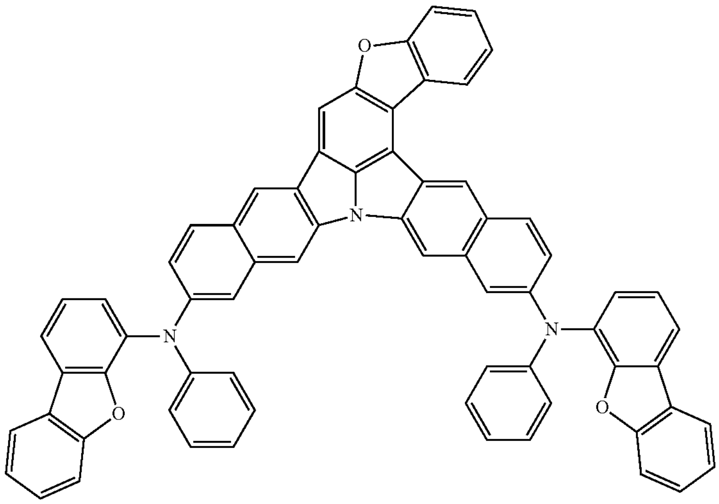
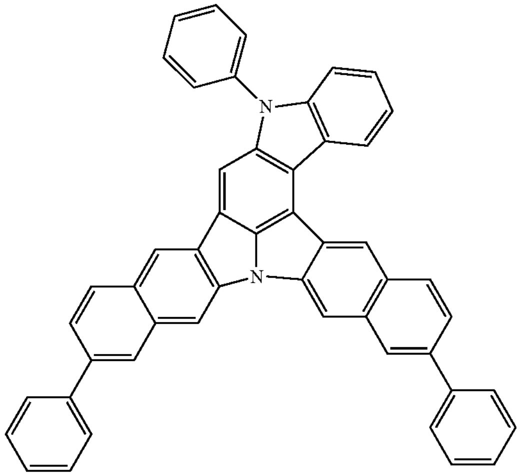
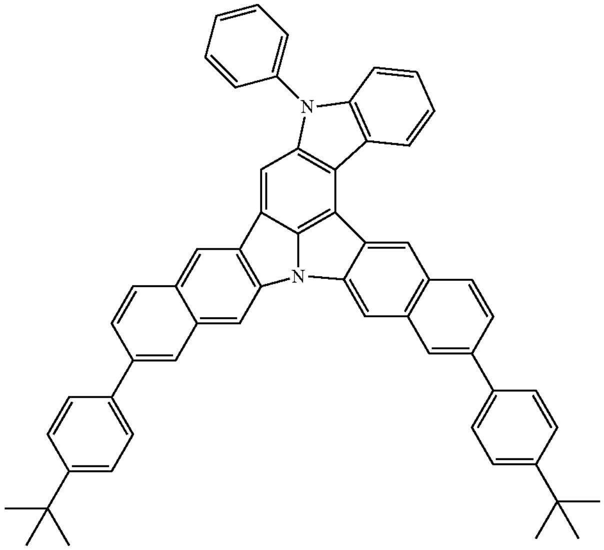
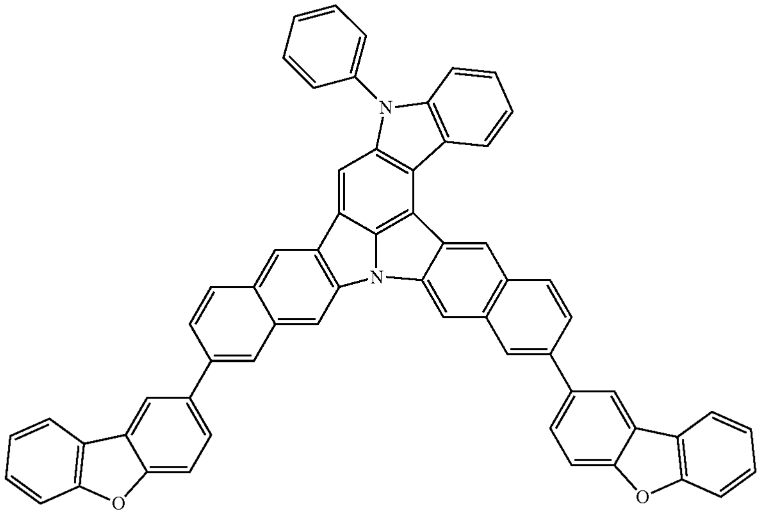

-continued
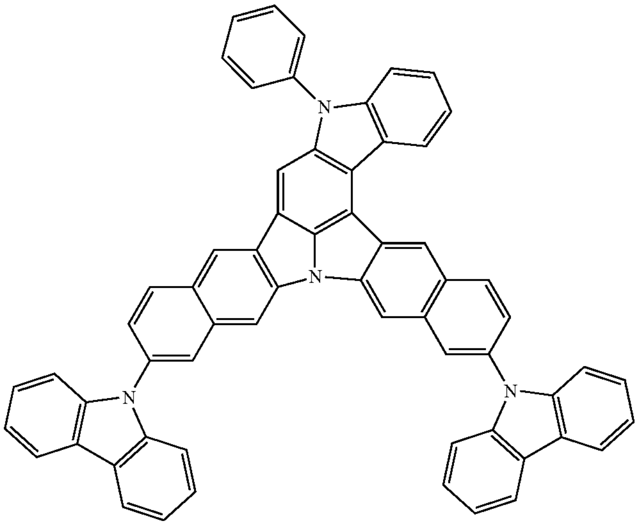
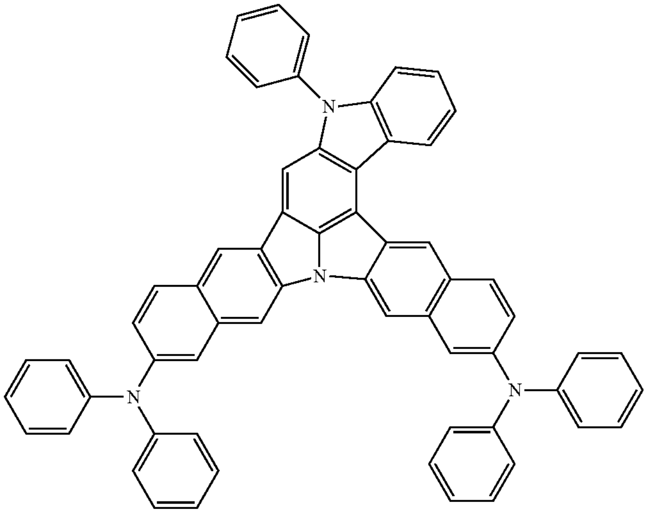
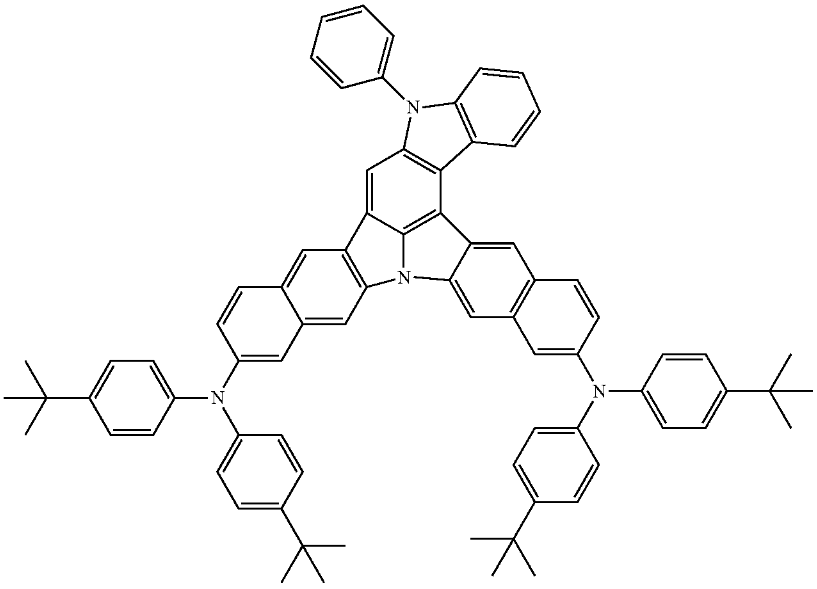

-continued
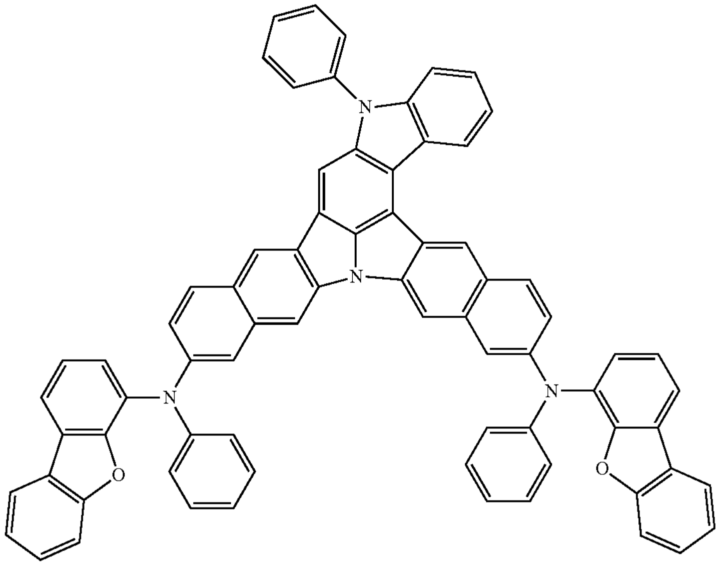
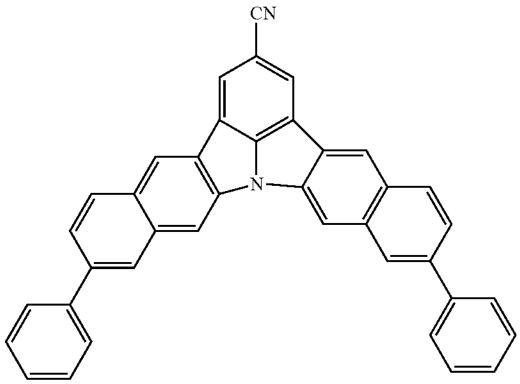
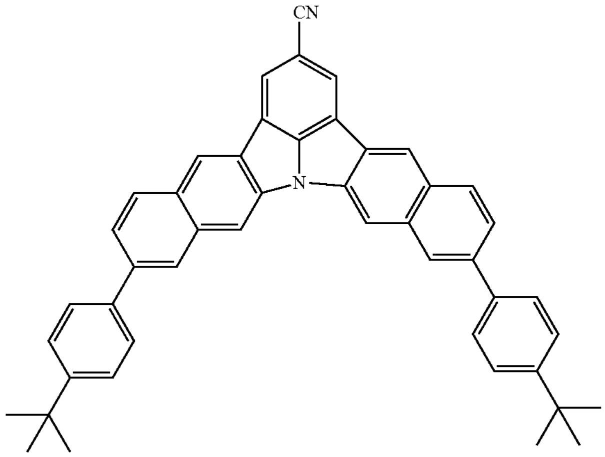
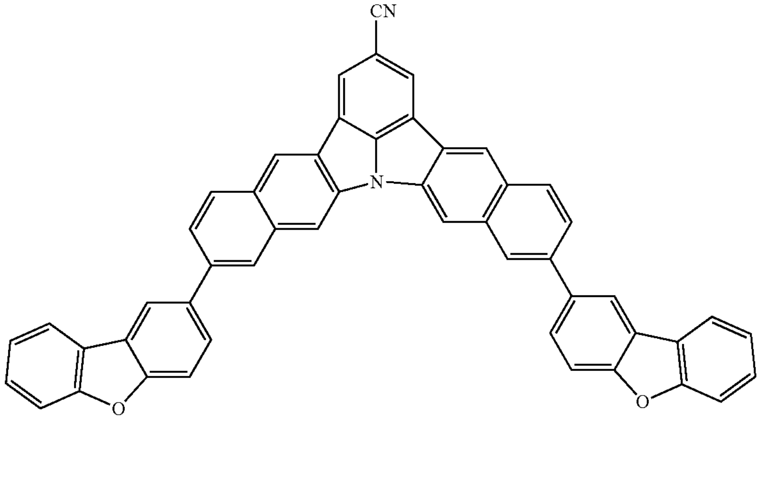

-continued
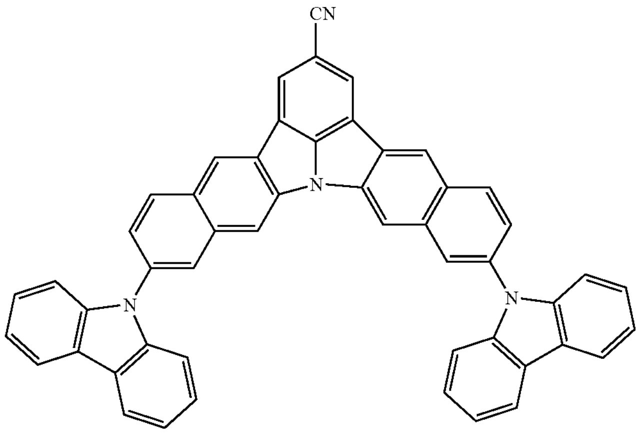
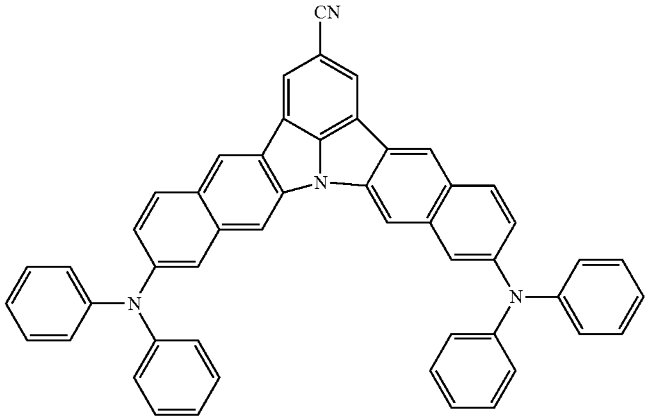
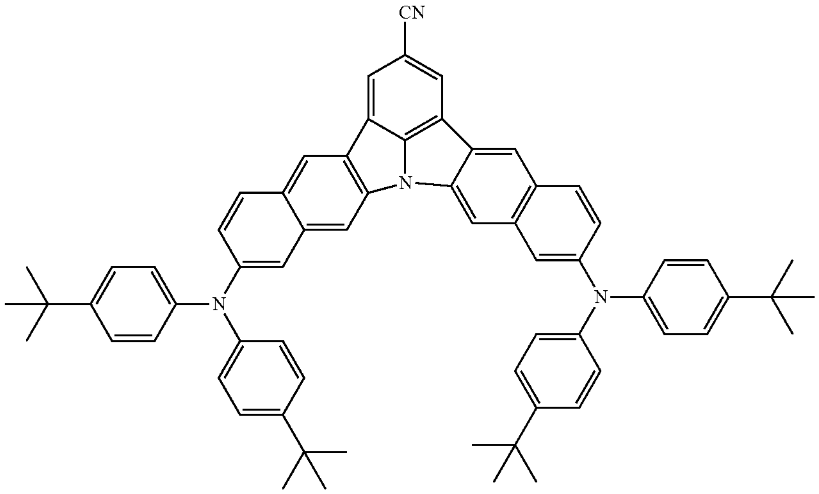

-continued
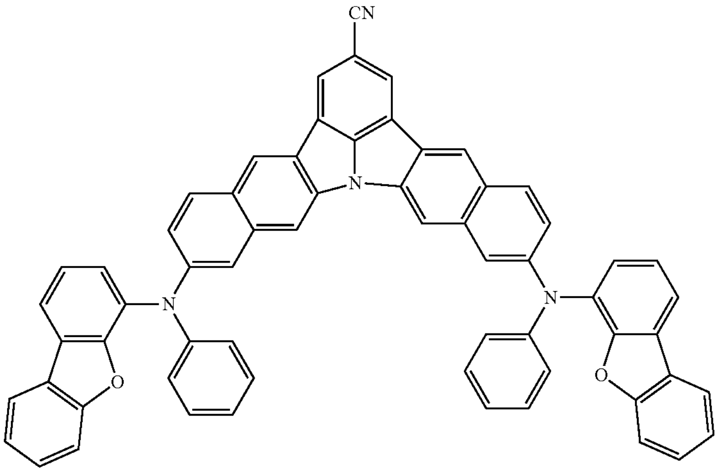
[Formula 170]
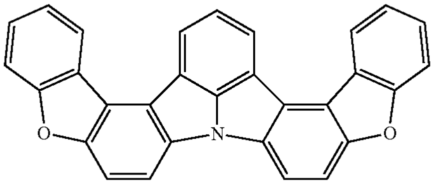
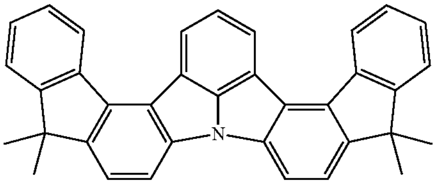
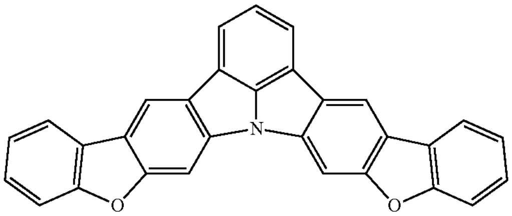
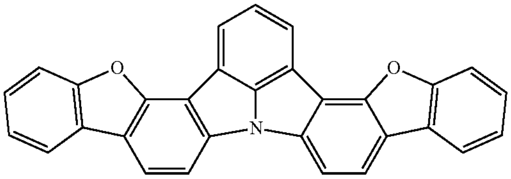
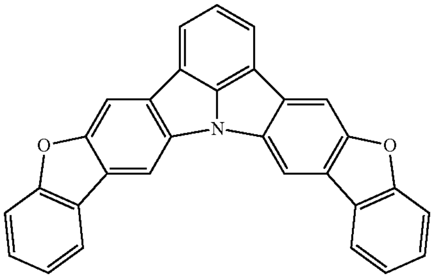
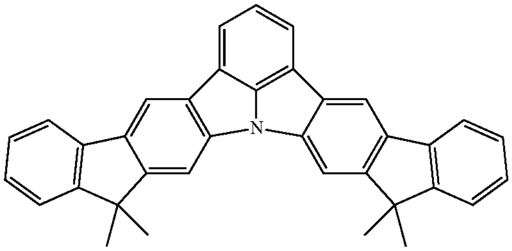
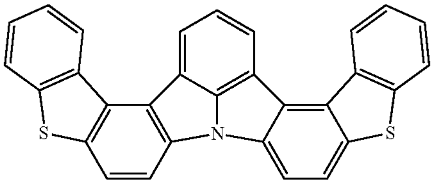
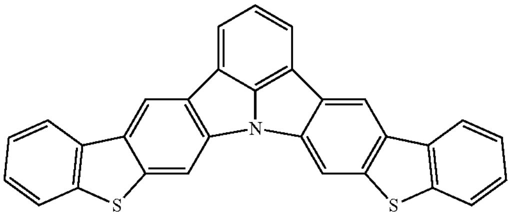
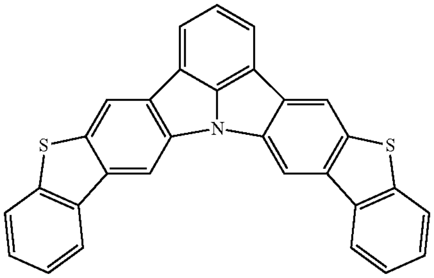
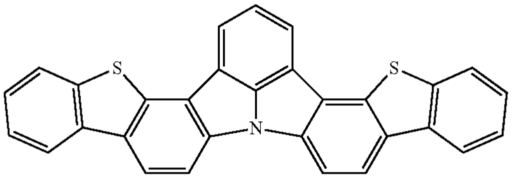

-continued
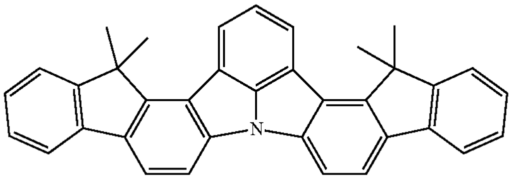
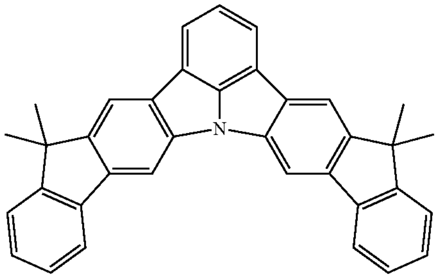
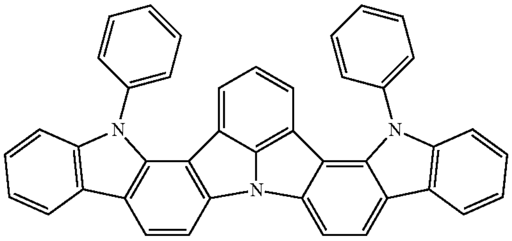
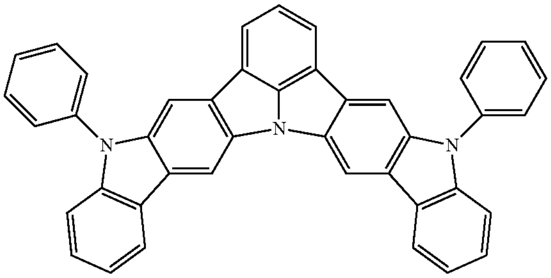
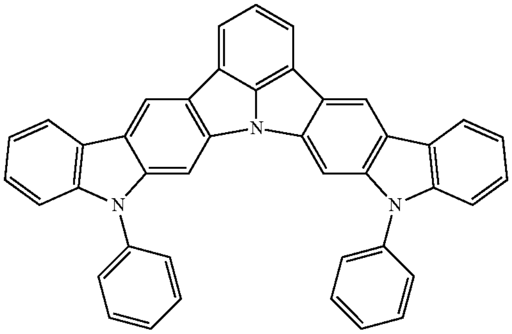
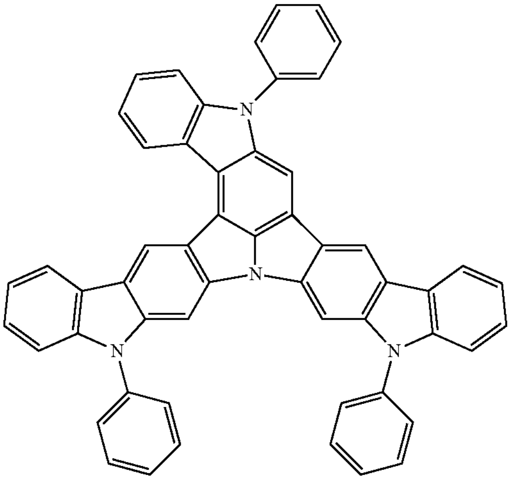
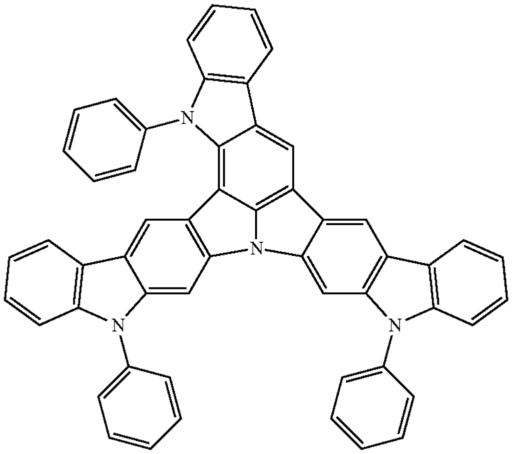
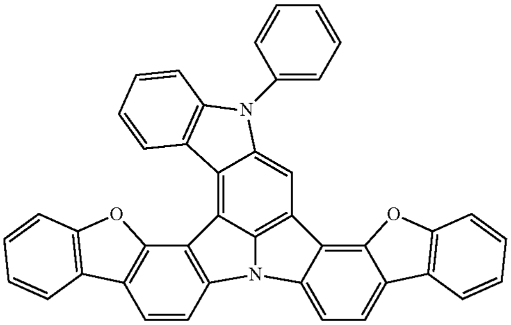

-continued
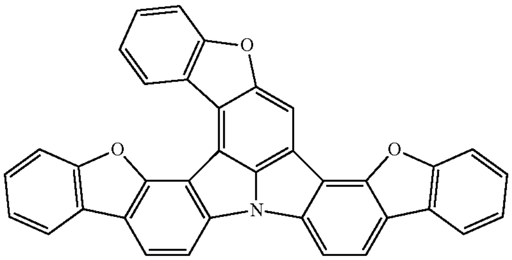
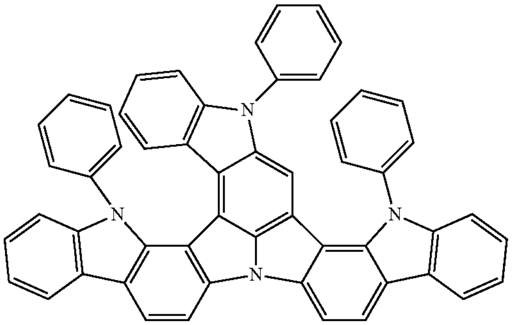
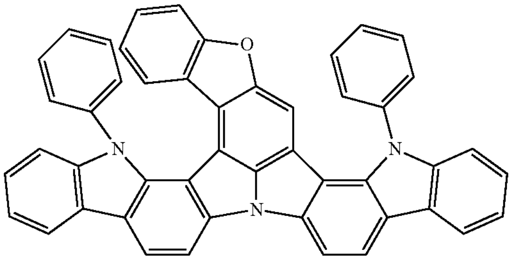
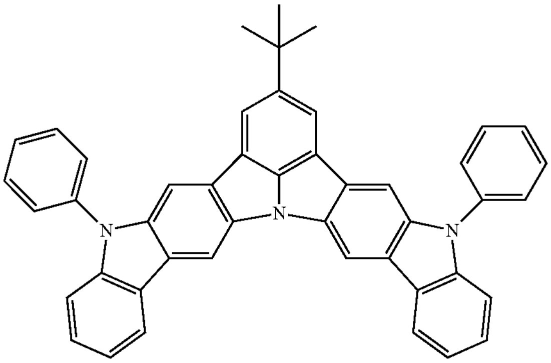
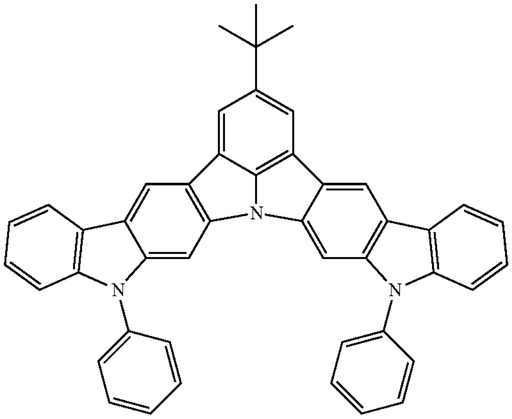
[Formula 171]
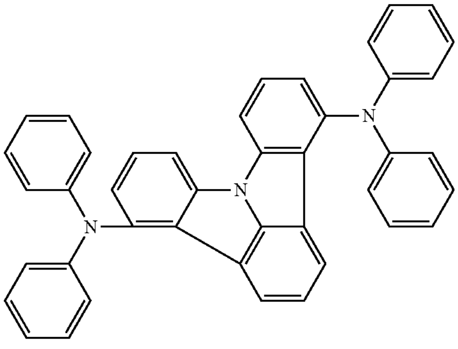
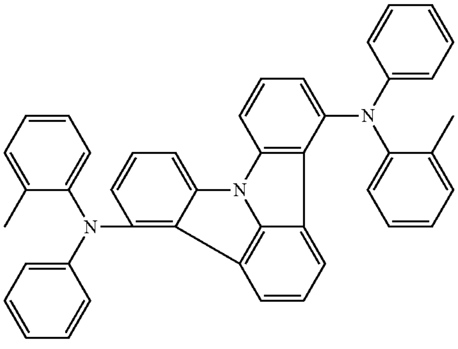

-continued
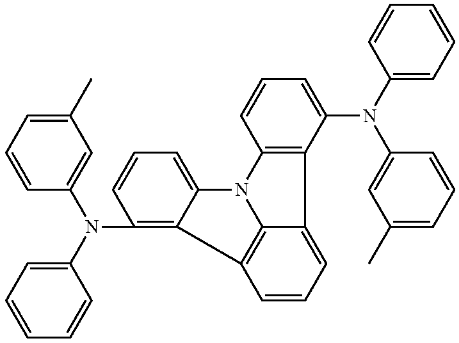
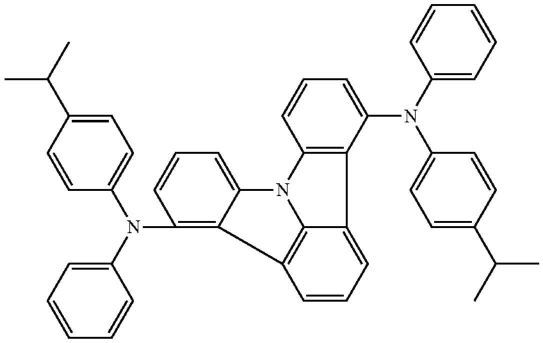
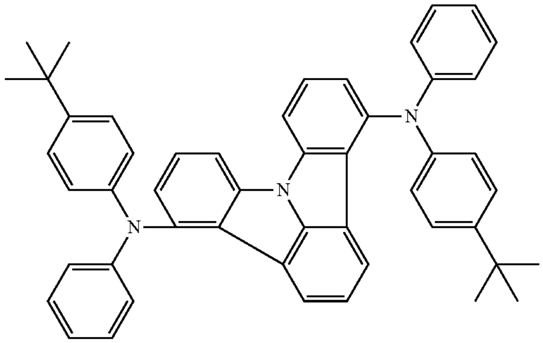
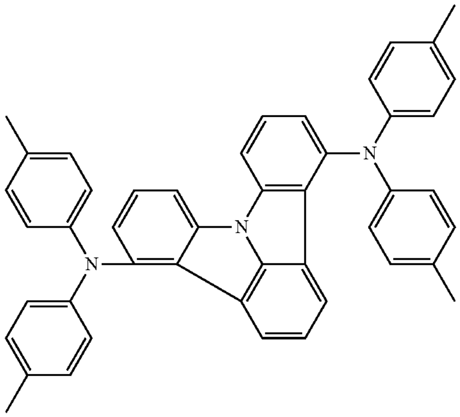
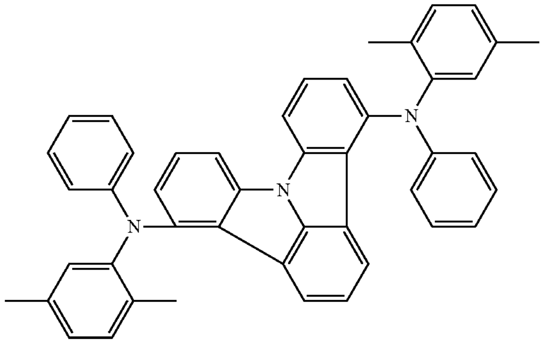
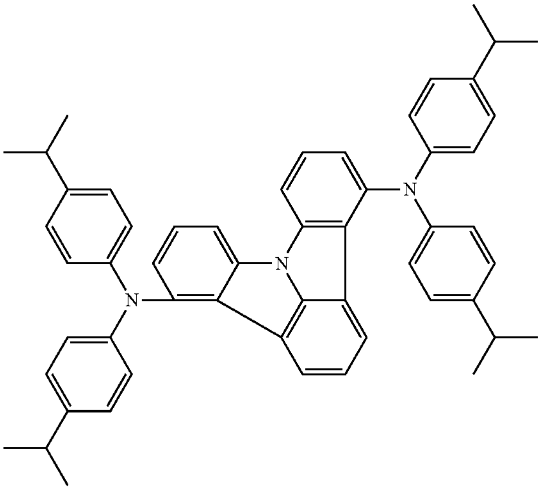

-continued
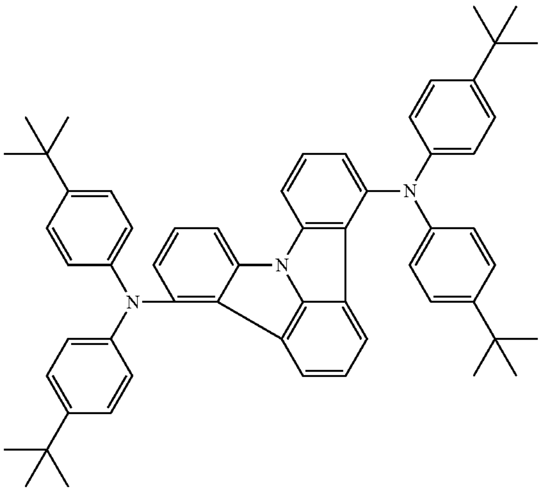
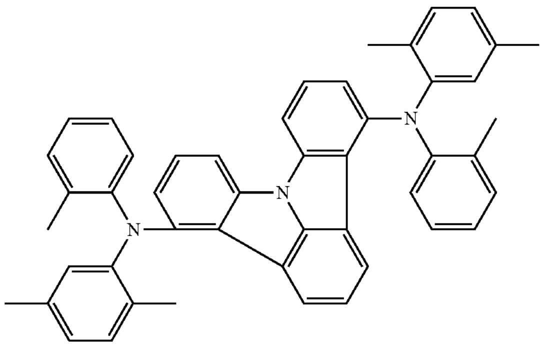
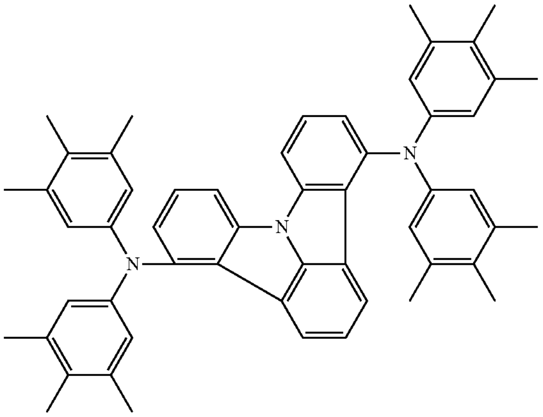
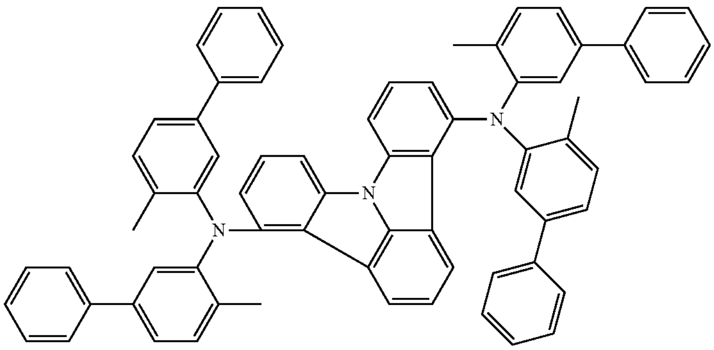
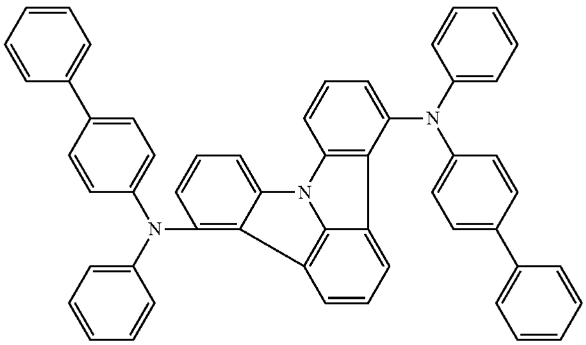
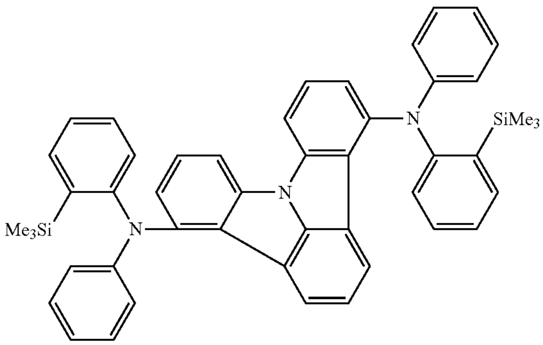

-continued
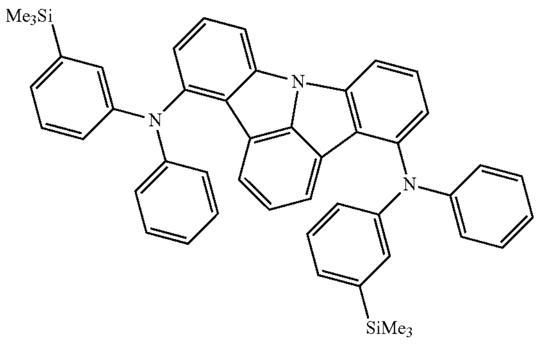
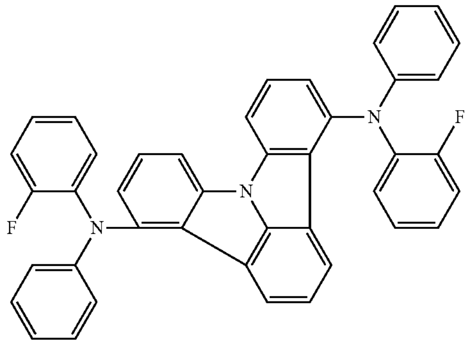
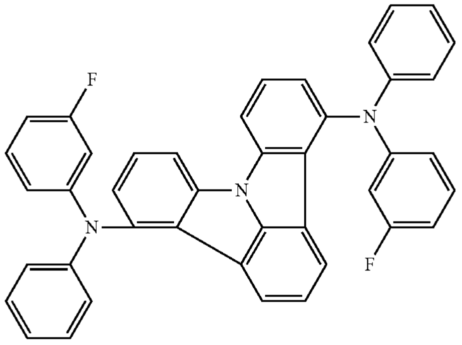
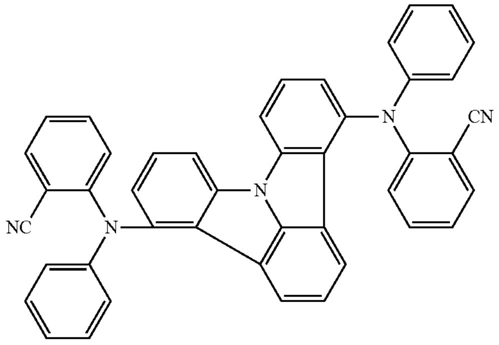
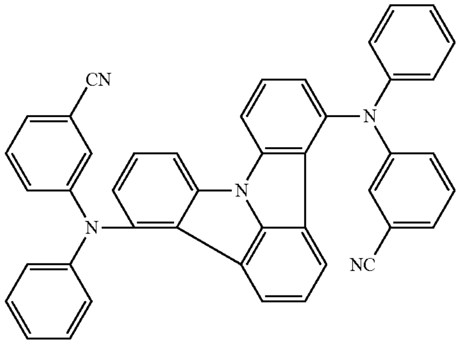
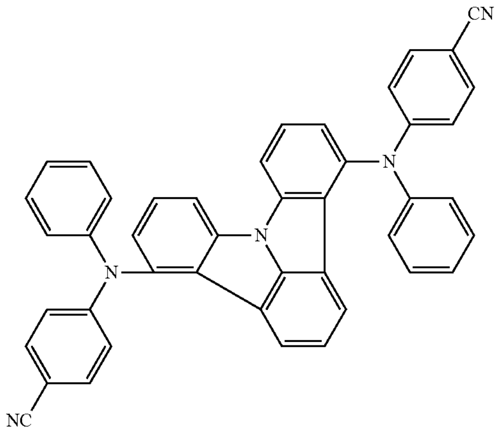
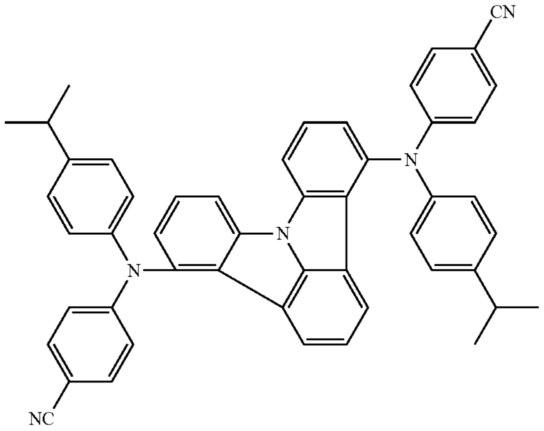

-continued
[Formula 172]
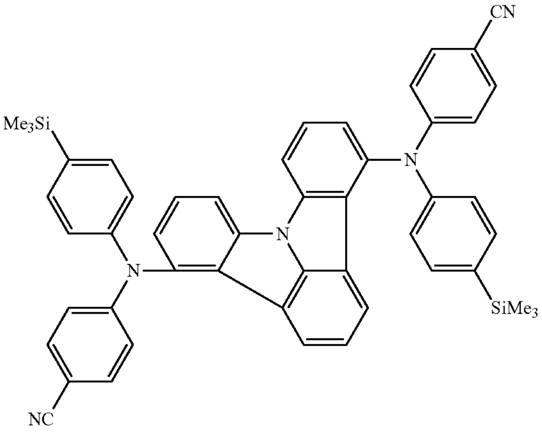
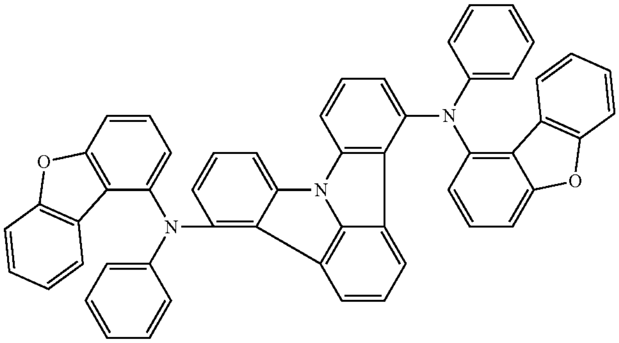
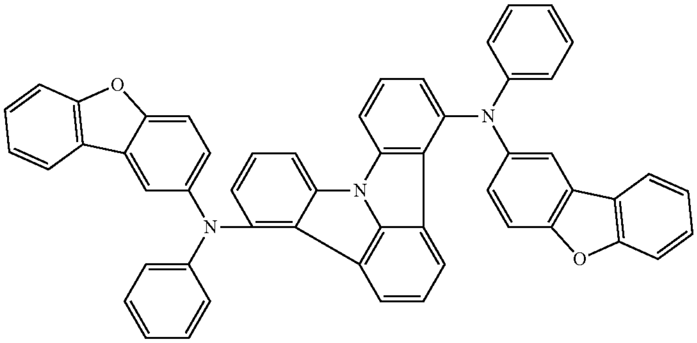
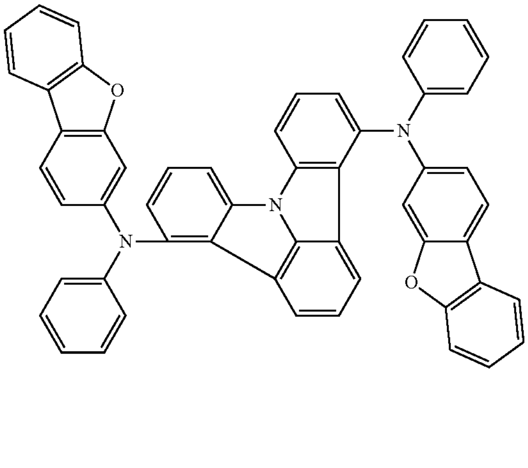

-continued
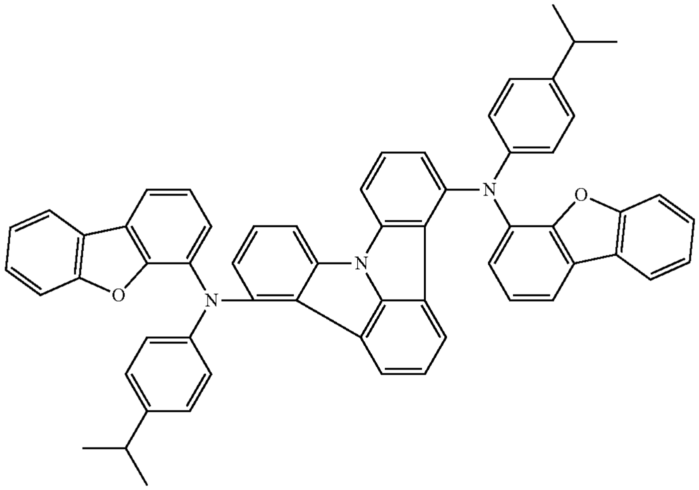
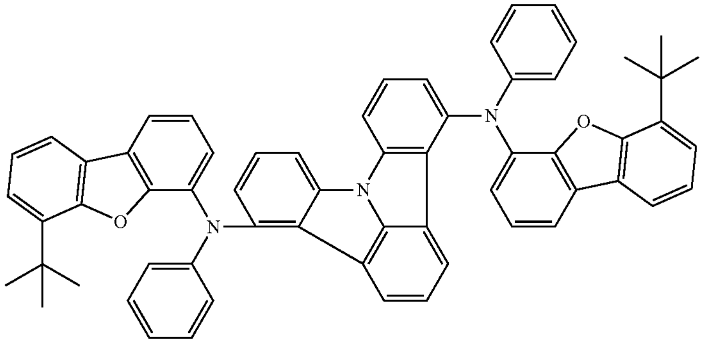
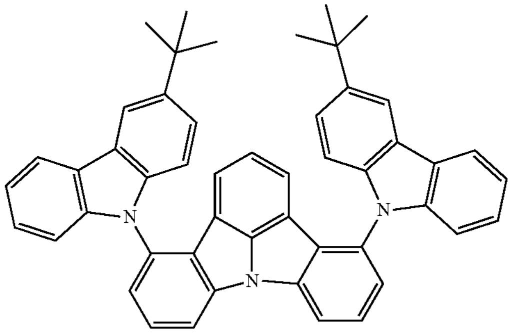
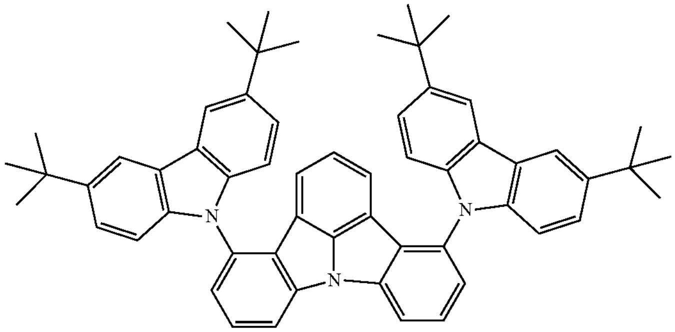

-continued
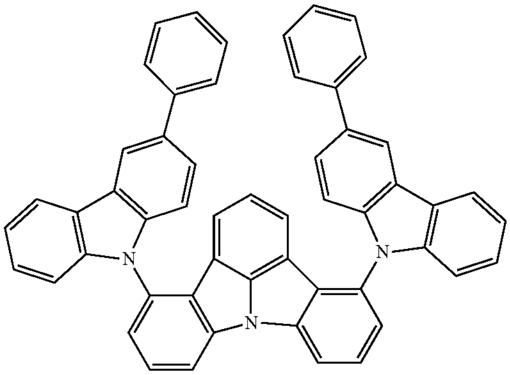
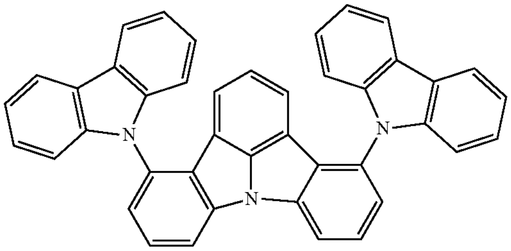
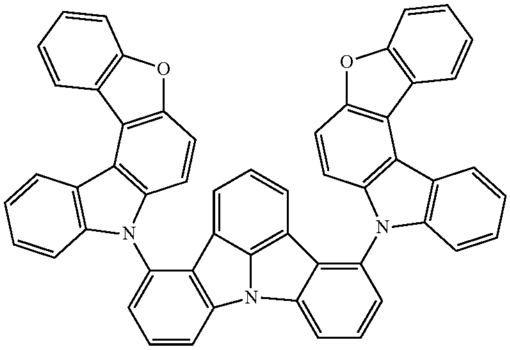
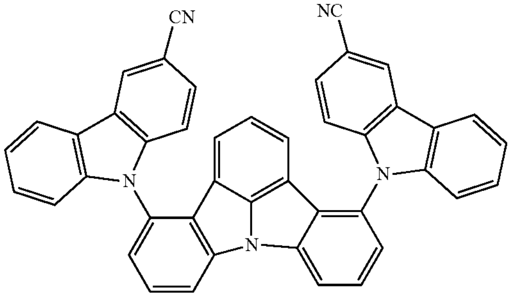
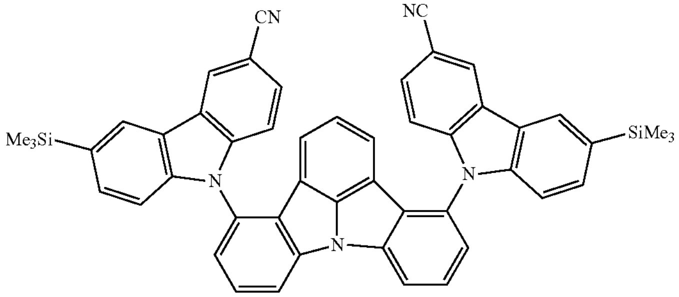
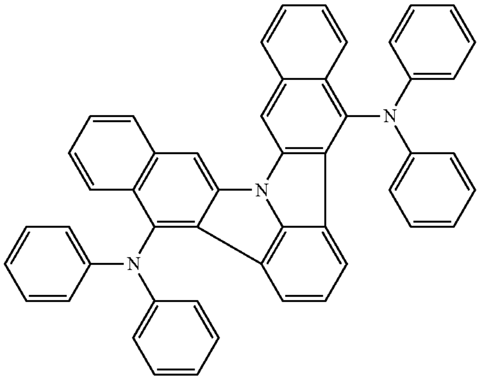
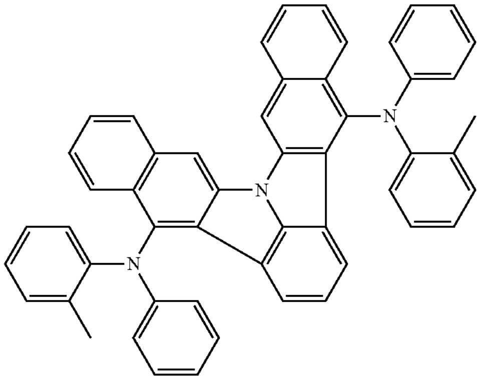

-continued
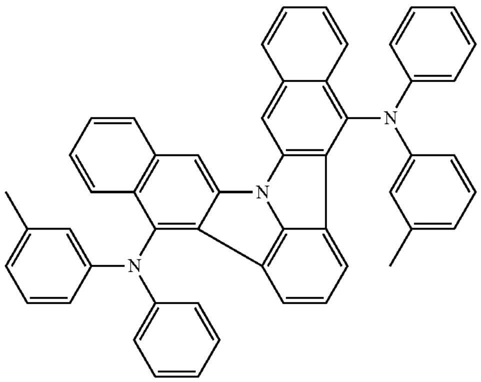
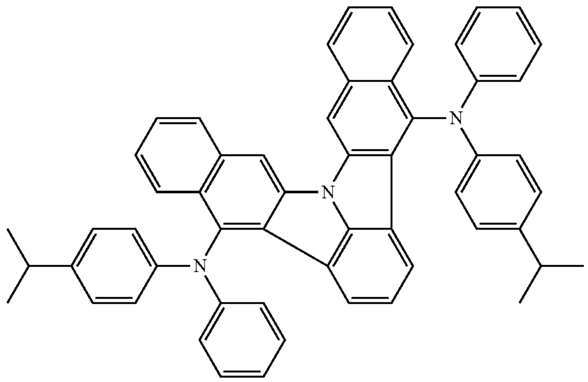
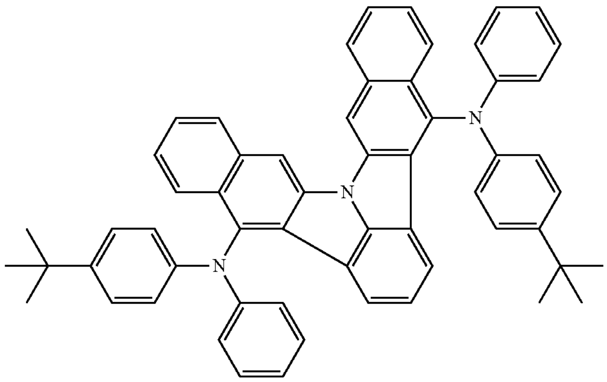
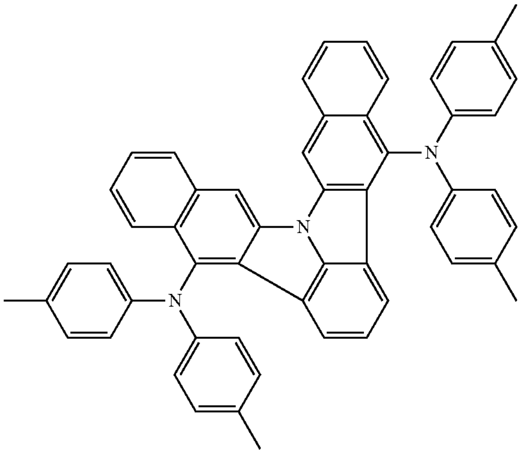
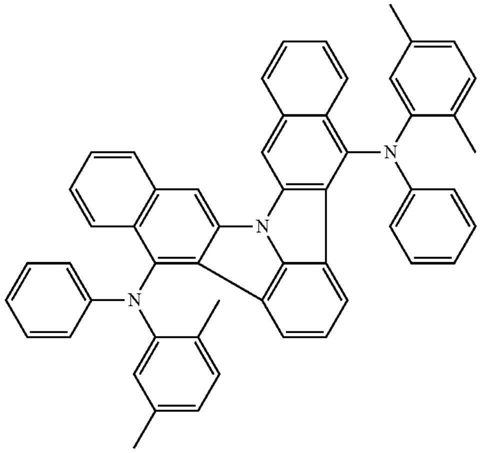
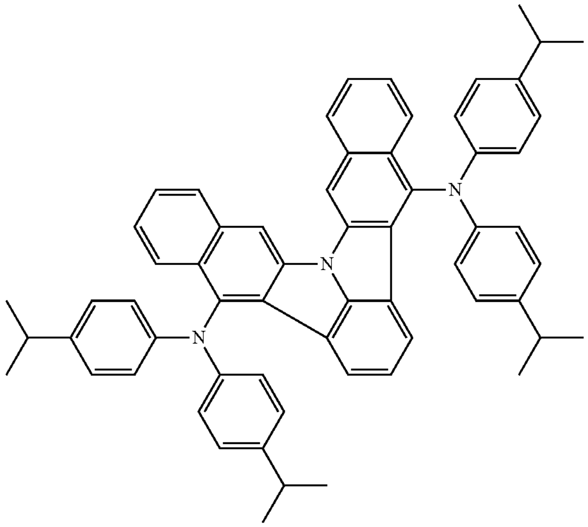

-continued
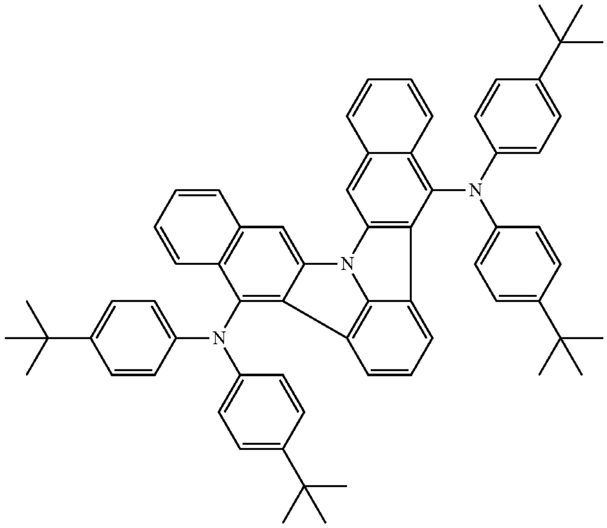
[Formula 173]
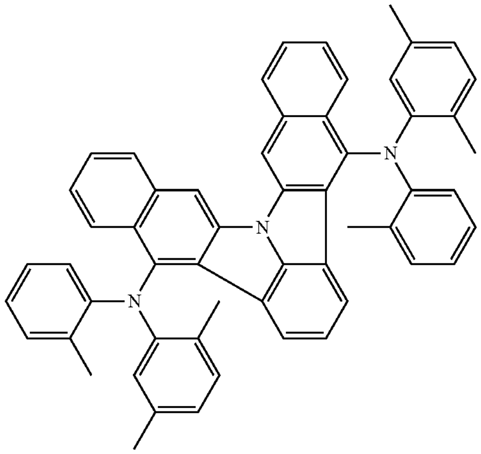
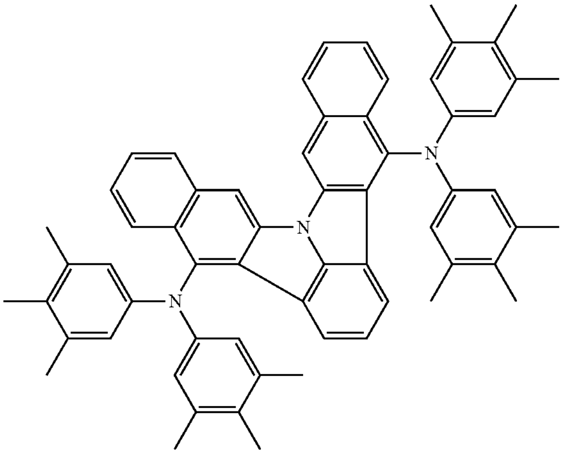
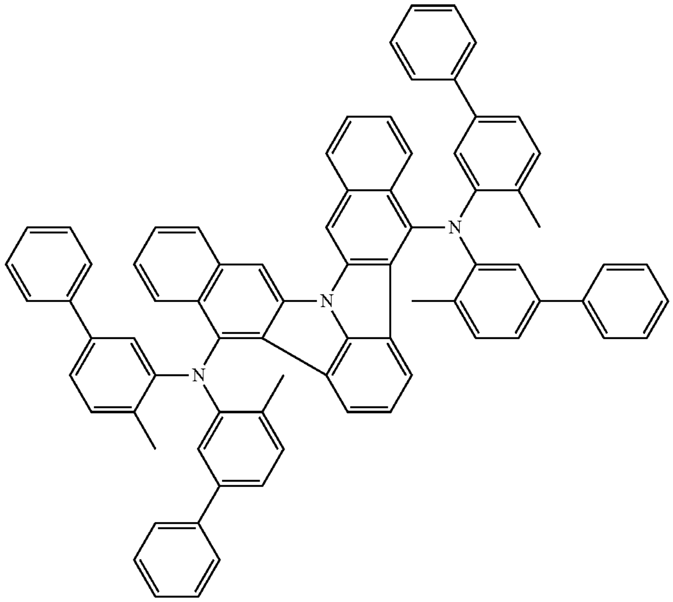

-continued
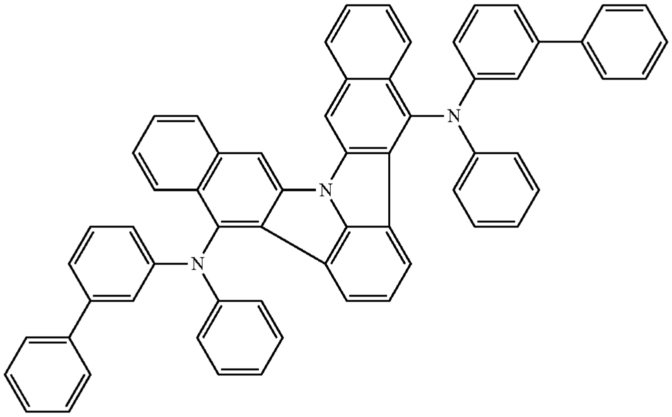
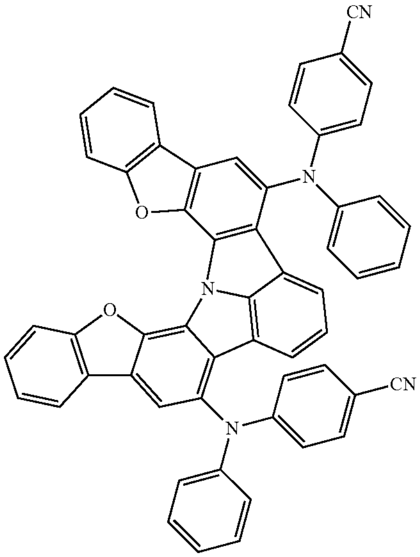
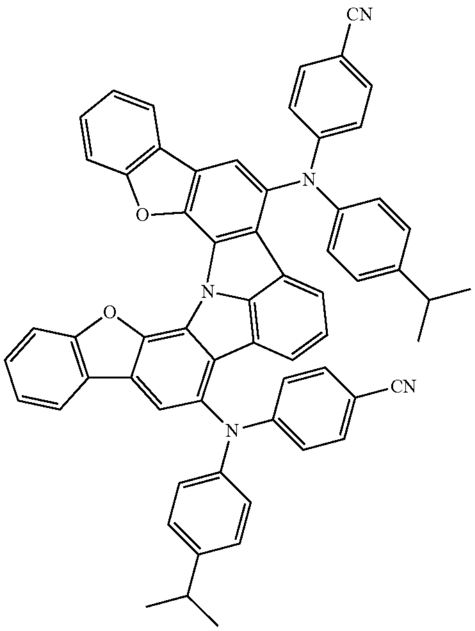
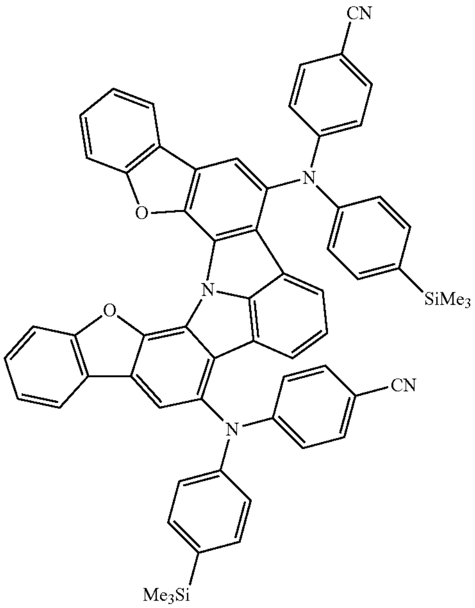

-continued
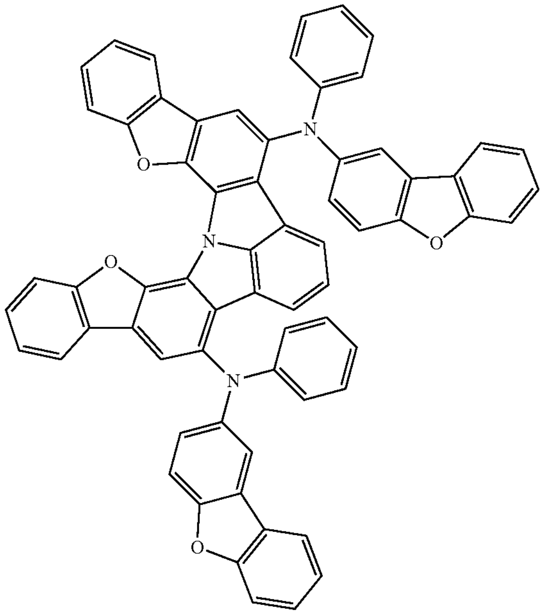
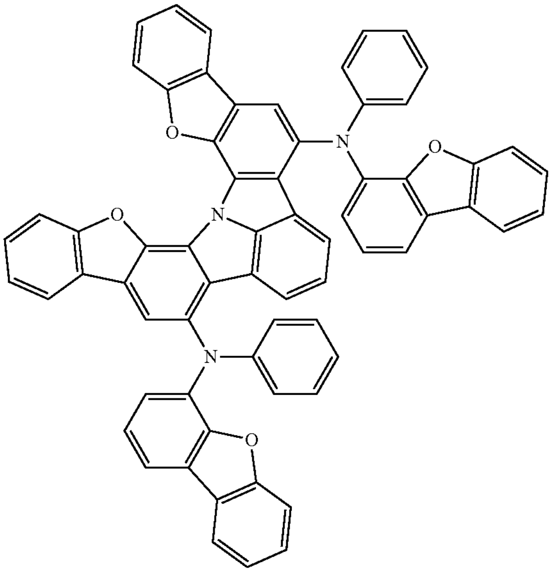
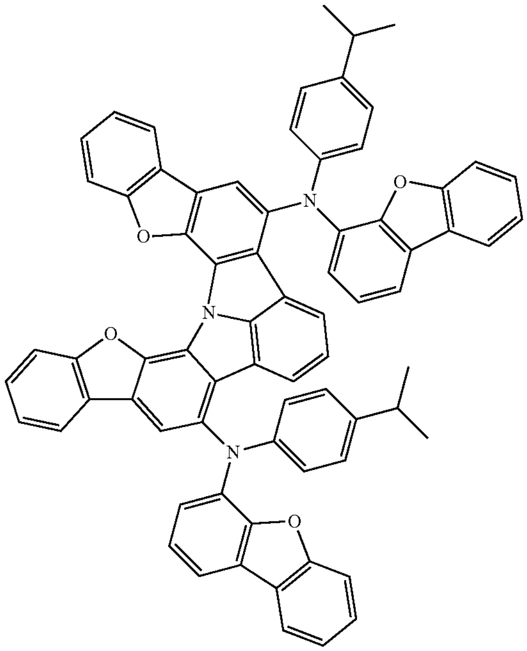
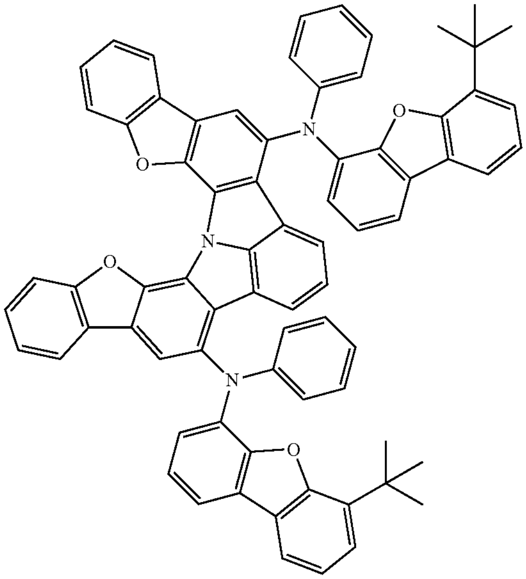

-continued
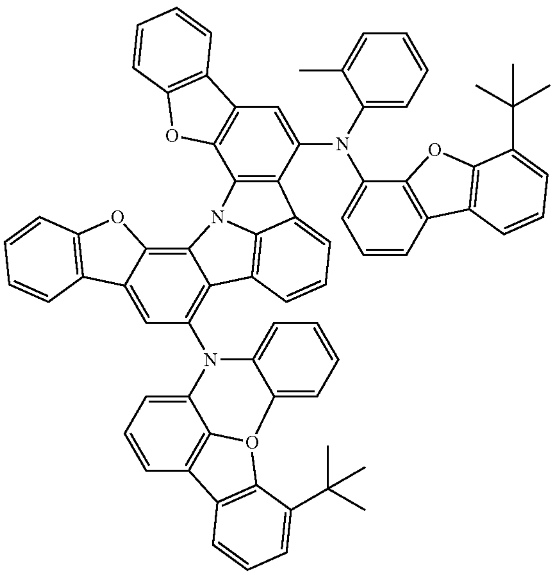
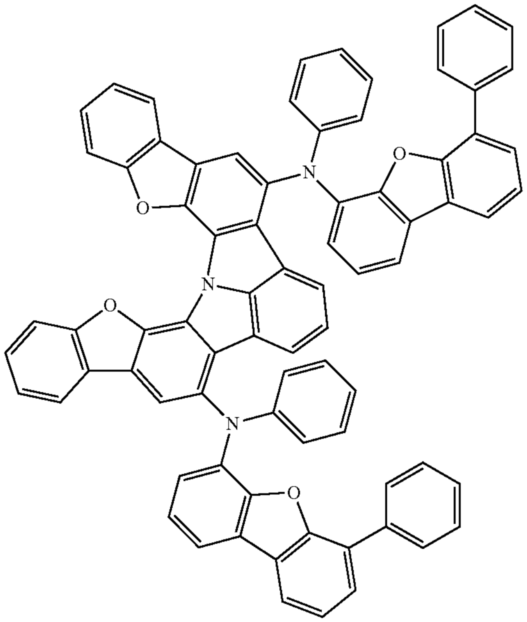
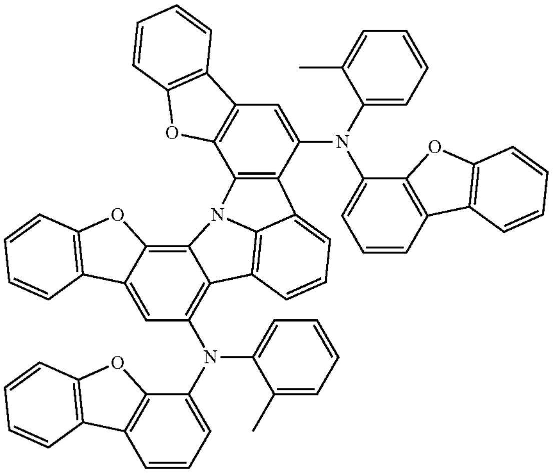
[Formula 174]
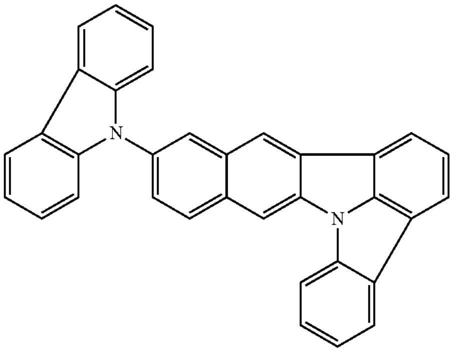
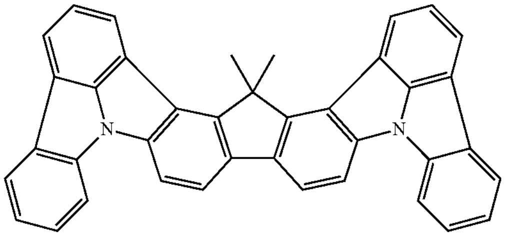

-continued
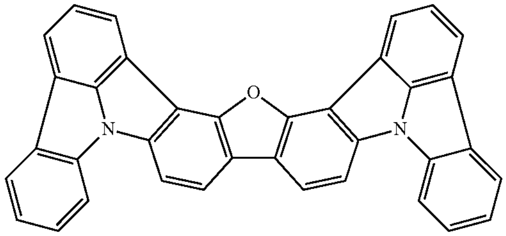
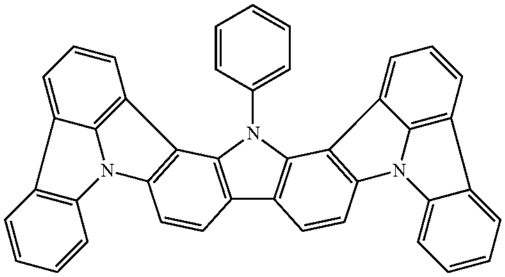
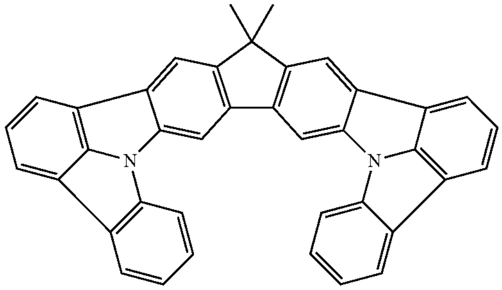
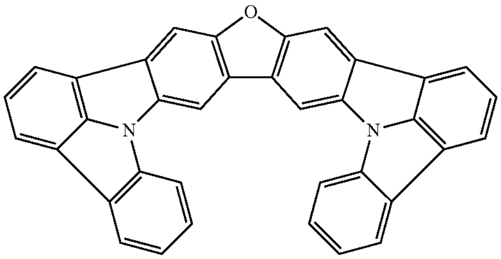
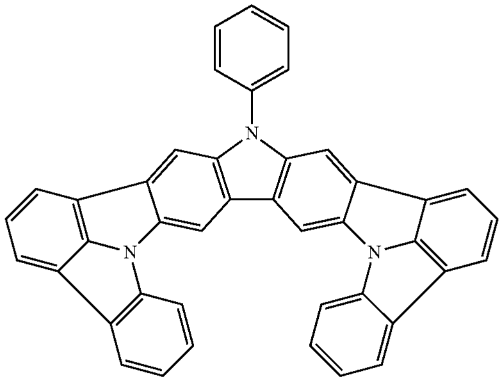
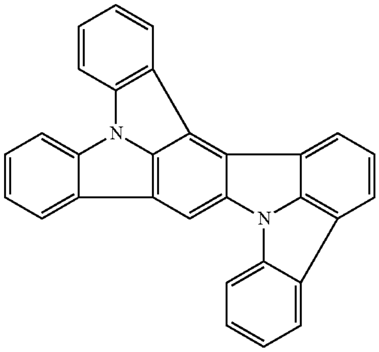
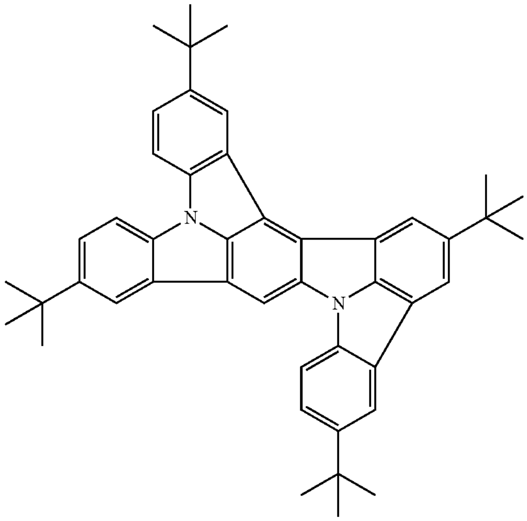

-continued

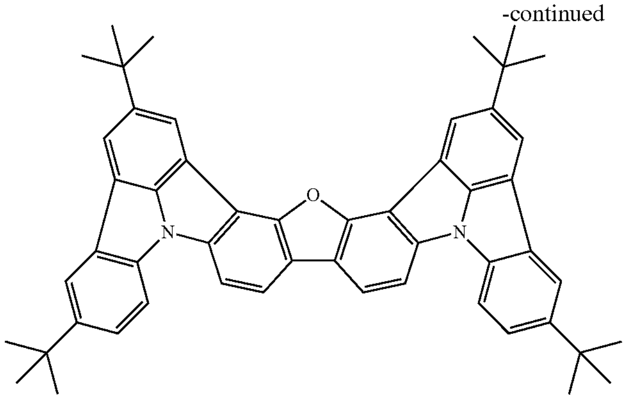

Compound Represented by Formula (5)

A compound represented by the formula (5) will be described below. A compound represented by the formula (5) corresponds to a compound represented by the above-described formula (41-3).

[Formula 175]

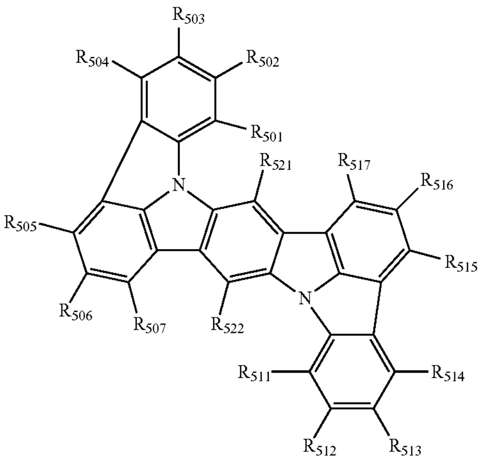

(5)

In the formula (5): at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded;

$R_{501}$ to $R_{507}$ and $R_{511}$ to $R_{517}$ neither forming the monocyclic ring nor forming the fused ring each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{521}$ and $R_{522}$ each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

"A combination of adjacent two or more of $R_{501}$ to $R_{507}$ and $R_{511}$ to $R_{517}$" refers to, for instance, a combination of $R_{501}$ and $R_{502}$, a combination of $R_{502}$ and $R_{503}$, a combination of $R_{503}$ and $R_{504}$, a combination of $R_{505}$ and $R_{506}$, a combination of $R_{506}$ and $R_{507}$, and a combination of $R_{501}$, $R_{502}$, and $R_{503}$.

In an exemplary embodiment, at least one, preferably two of $R_{501}$ to $R_{507}$ and $R_{511}$ to $R_{517}$ are groups represented by —N($R_{906}$)($R_{907}$).

In an exemplary embodiment, $R_{501}$ to $R_{507}$ and $R_{511}$ to $R_{517}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (52).

[Formula 176]

(52)

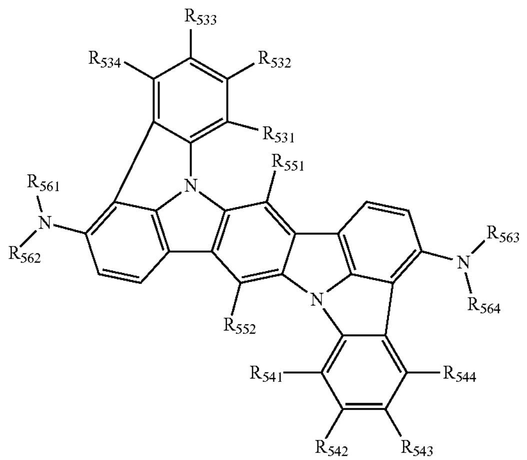

In the formula (52): at least one combination of adjacent two or more of $R_{531}$ to $R_{534}$ and $R_{541}$ to $R_{544}$ are mutually bonded to form a substituted or unsubstituted monocyclic ring, mutually bonded to form a substituted or unsubstituted fused ring, or not mutually bonded;

$R_{531}$ to $R_{534}$ and $R_{541}$ to $R_{544}$ neither forming the monocyclic ring nor forming the fused ring, and $R_{551}$ and $R_{552}$ each independently represent a hydrogen atom, a substituted or unsubstituted aryl group having 6 to 50 ring carbon atoms, or a substituted or unsubstituted heterocyclic group having 5 to 50 ring atoms; and $R_{561}$ to $R_{564}$ are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (53).

[Formula 177]

(53)

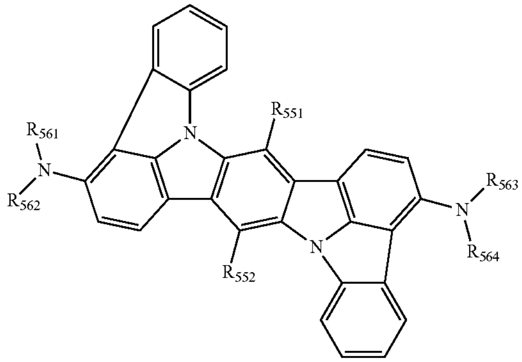

In the formula (53), $R_{551}$, $R_{552}$ and $R_{561}$ to $R_{564}$ respectively independently represent the same as $R_{551}$, $R_{552}$ and $R_{561}$ to $R_{564}$ in the formula (52).

In an exemplary embodiment, $R_{561}$ to $R_{564}$ in the formulae (52) and (53) are each independently a substituted or unsubstituted aryl group having 6 to 50 ring carbon atoms (preferably a phenyl group).

In an exemplary embodiment, $R_{521}$ and $R_{522}$ in the formula (5) and $R_{551}$ and $R_{552}$ in the formulae (52) and (53) are hydrogen atoms.

In an exemplary embodiment, the substituent for "substituted or unsubstituted" in the formulae (5), (52) and (53) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Specific Examples of Compound Represented by Formula (5)

Specific examples of the compound represented by the formula (5) include compounds shown below.

[Formula 178]

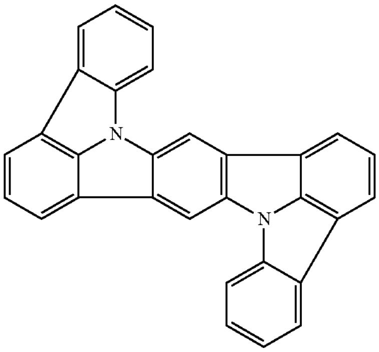

-continued
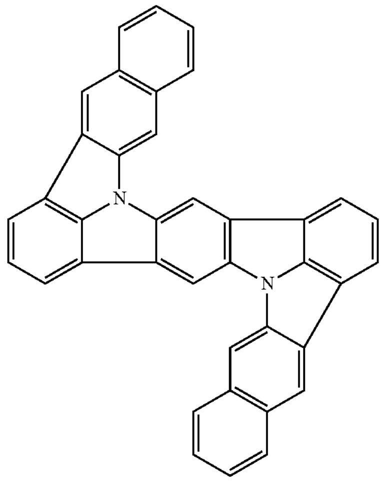
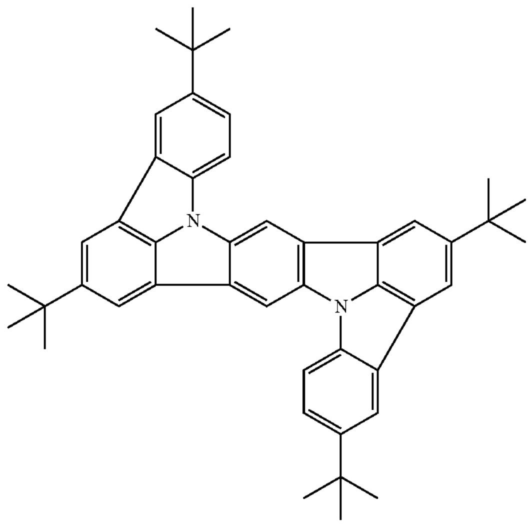
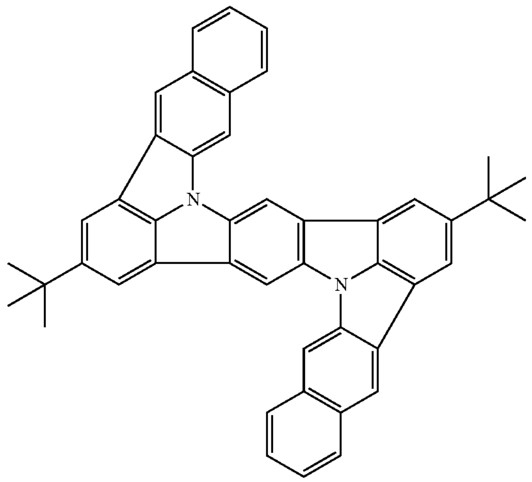

-continued
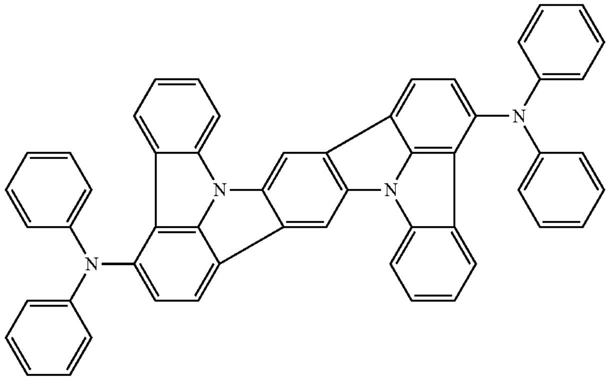
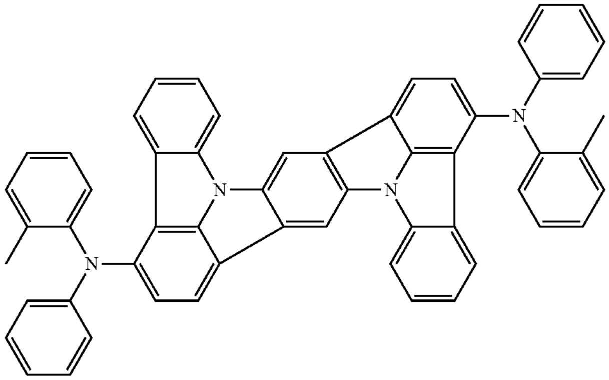
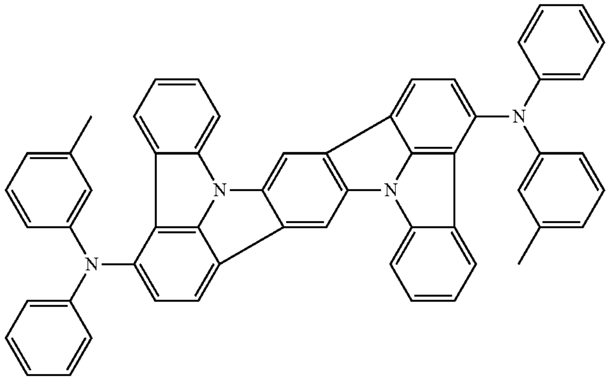
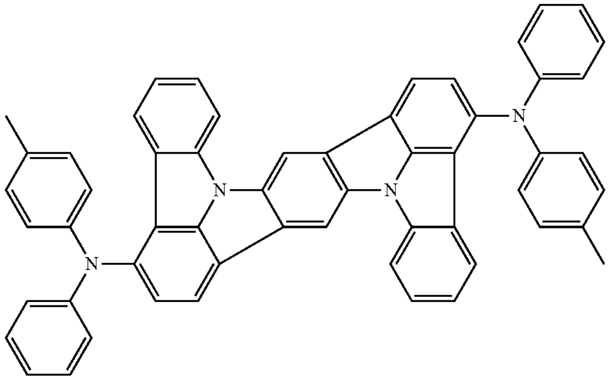

-continued
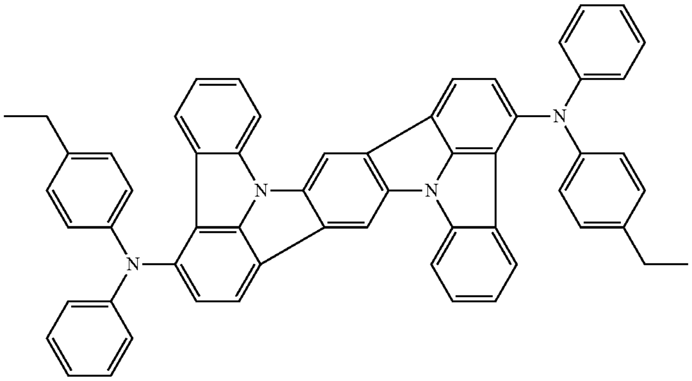
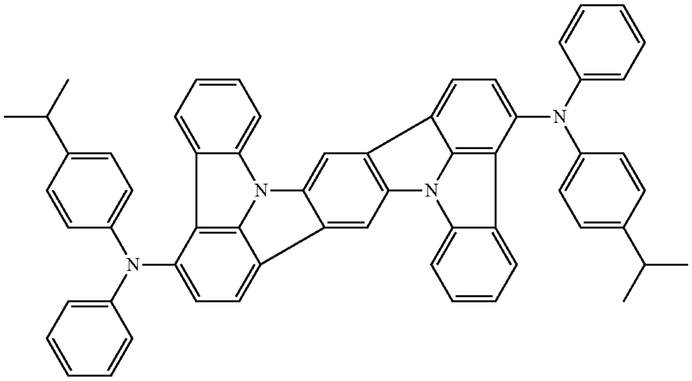
[Formula 179]
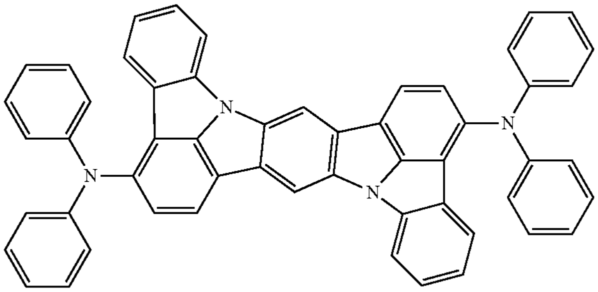
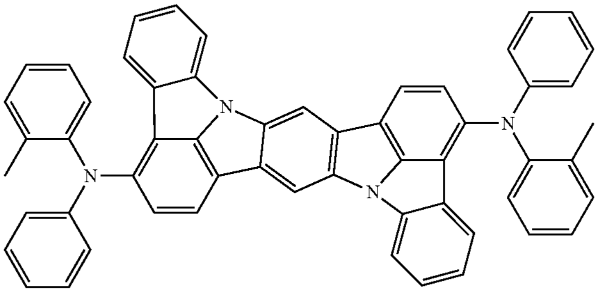
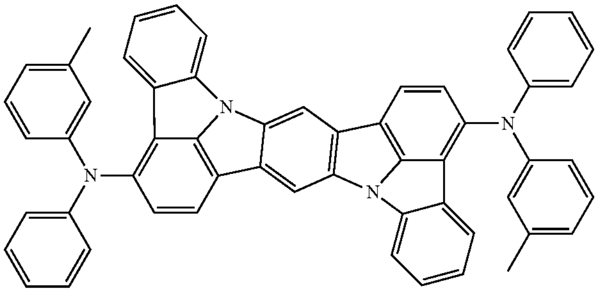

-continued
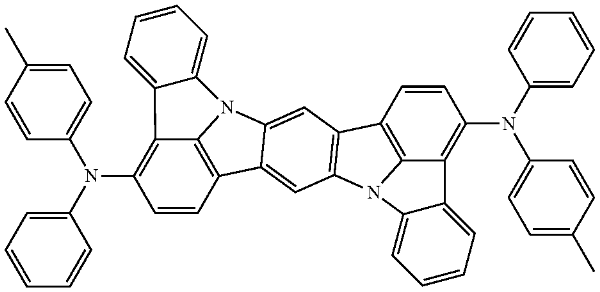
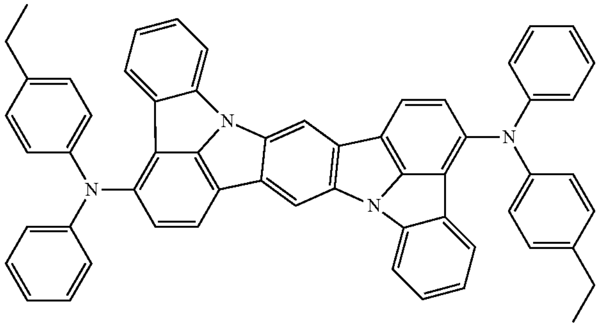
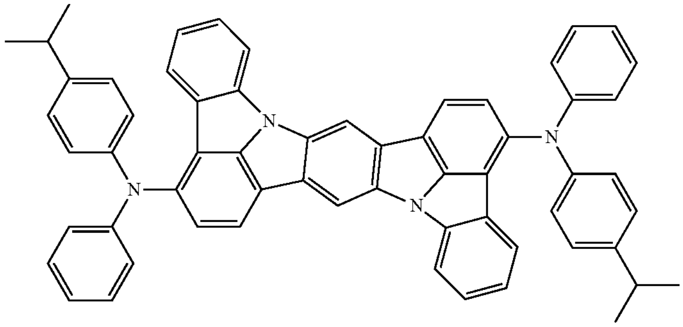
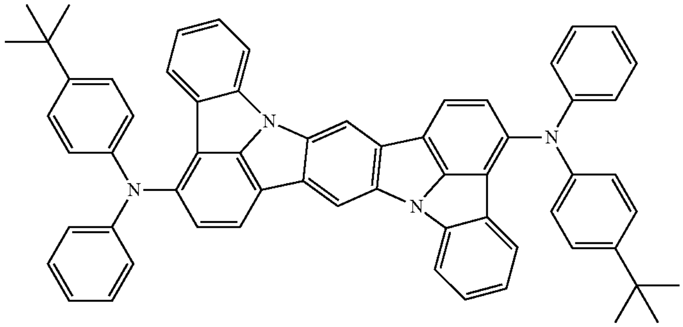
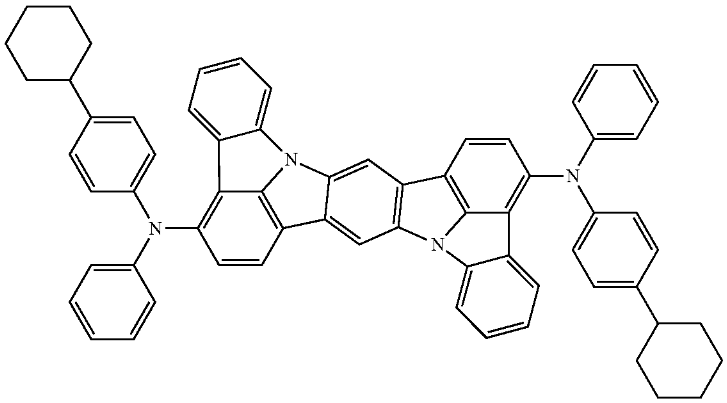

-continued
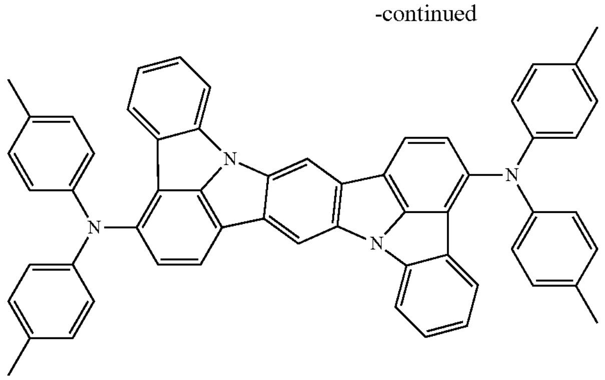
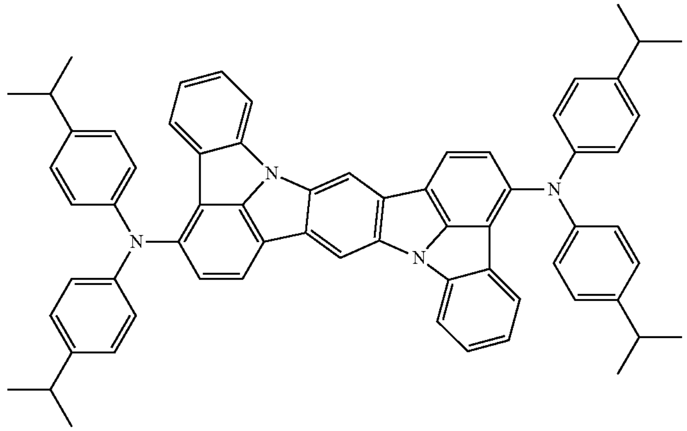
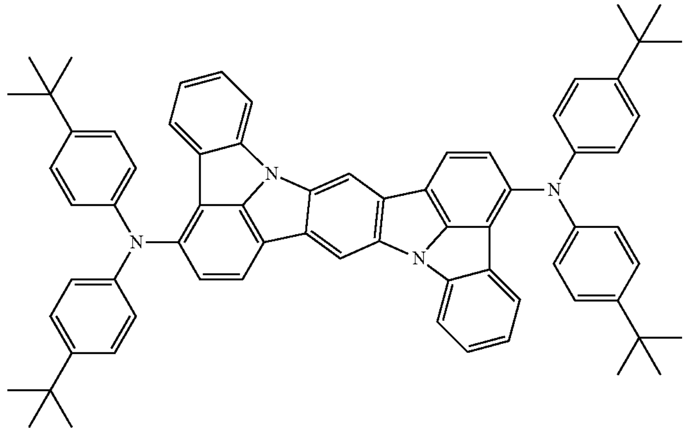 [SMILES: CC(C)(C)c1ccc(N(c2ccc(C(C)(C)C)cc2)c2ccc3c4cc5c(cc4n4c6ccccc6c2c34)c2ccc(N(c3ccc(C(C)(C)C)cc3)c3ccc(C(C)(C)C)cc3)c3c4ccccc4n5c23)cc1]
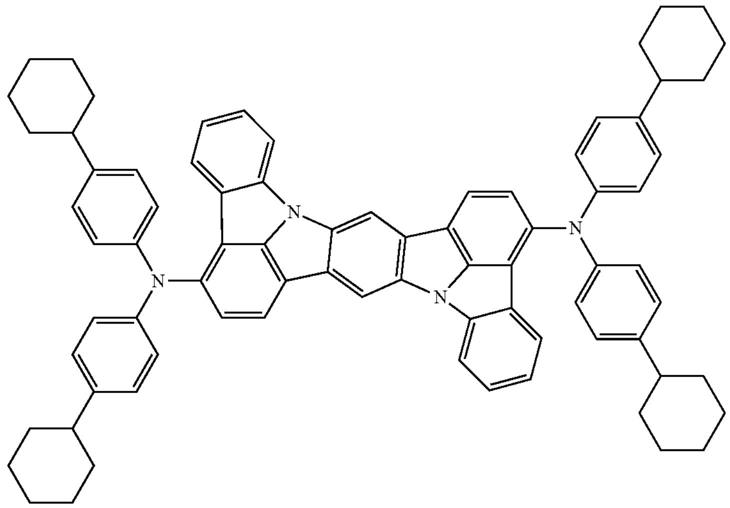

-continued
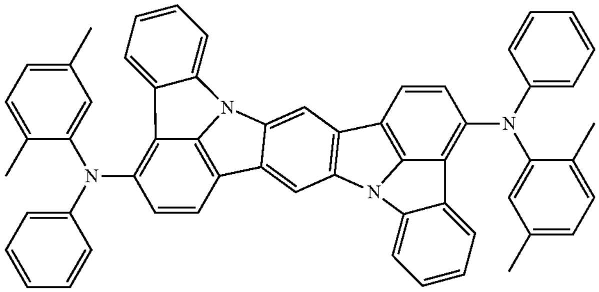
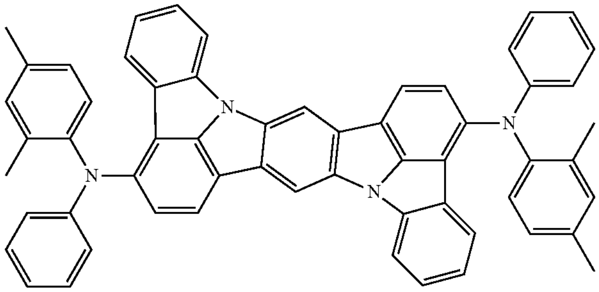
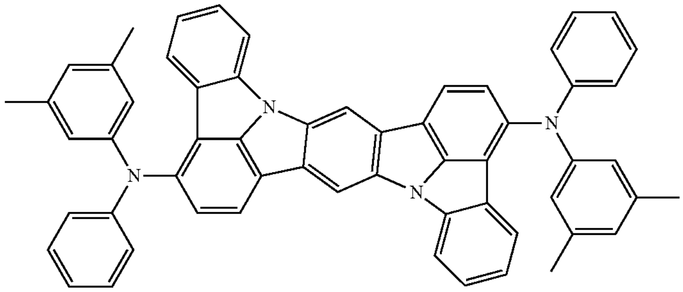
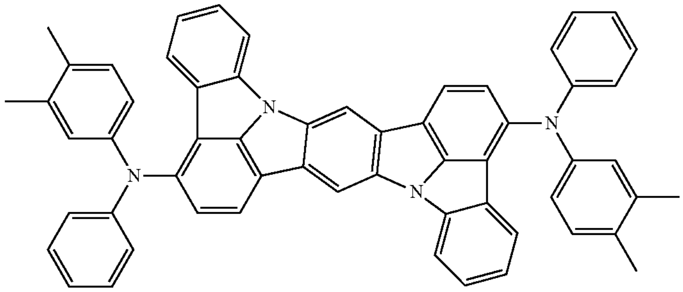
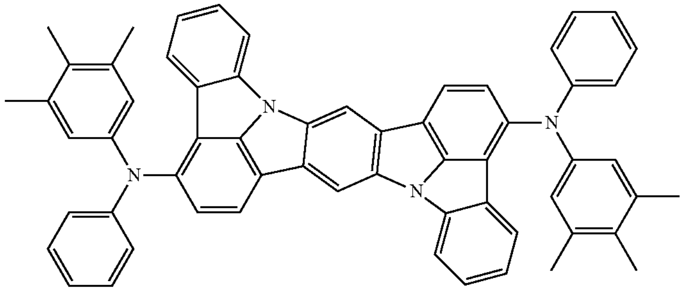

-continued
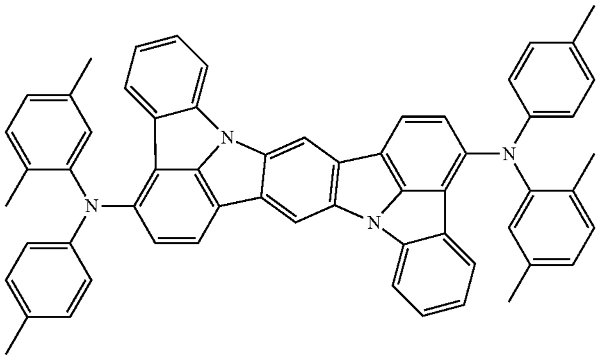
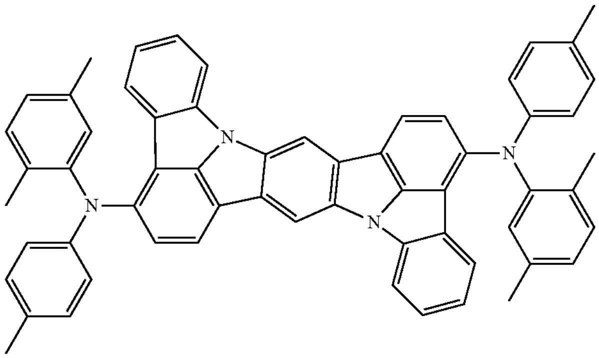
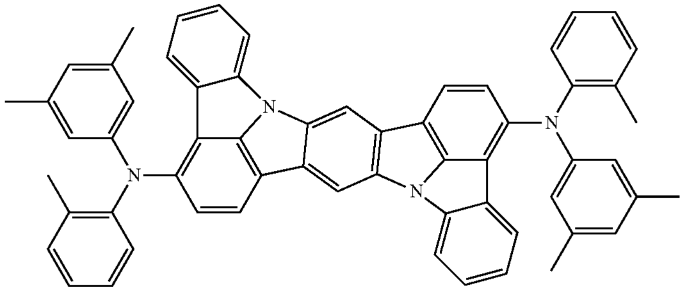
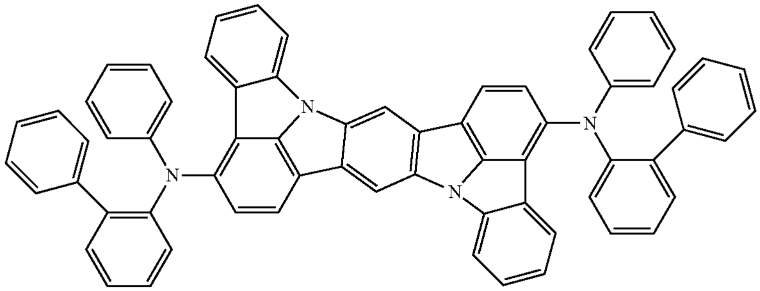
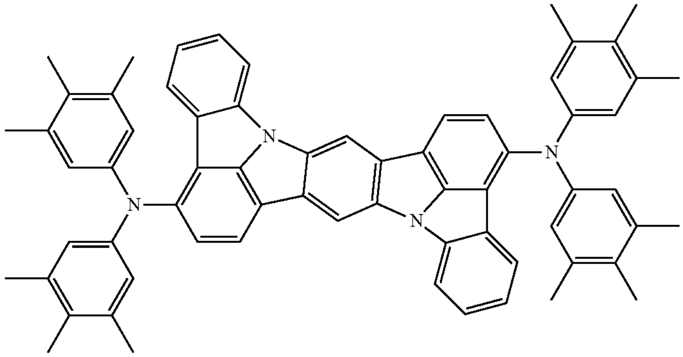

-continued
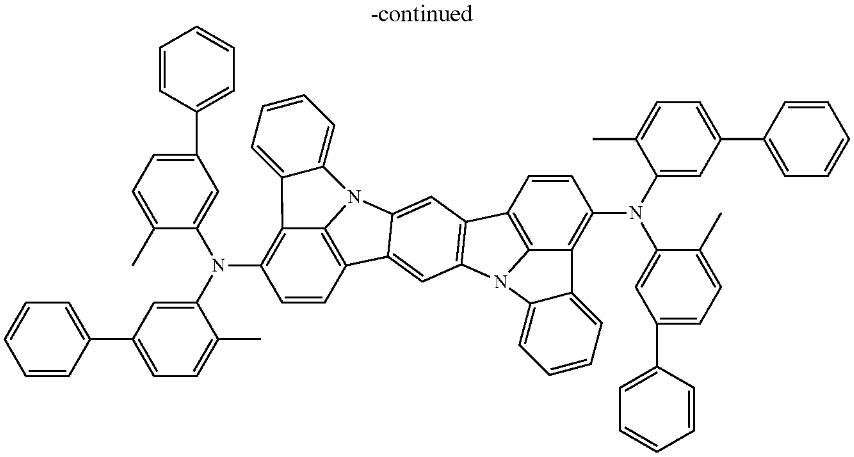
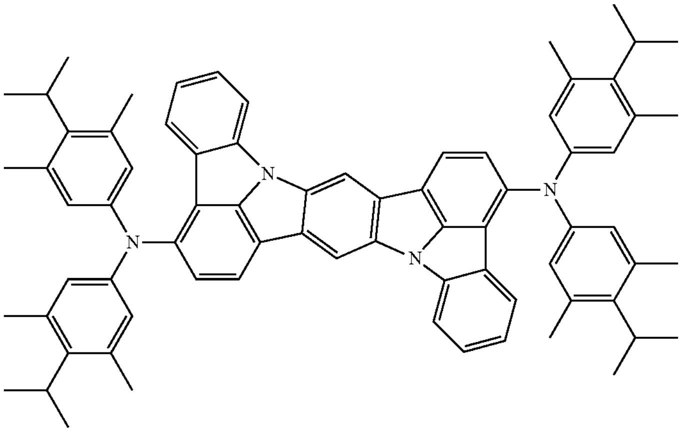
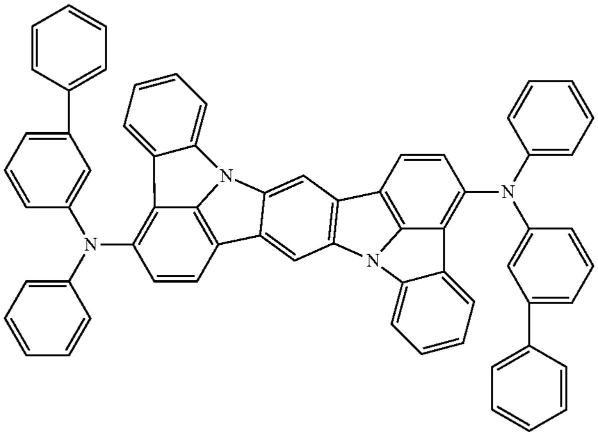
[Formula 180]
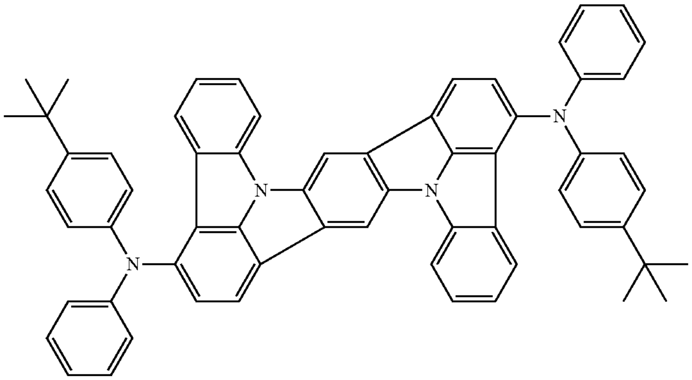

-continued
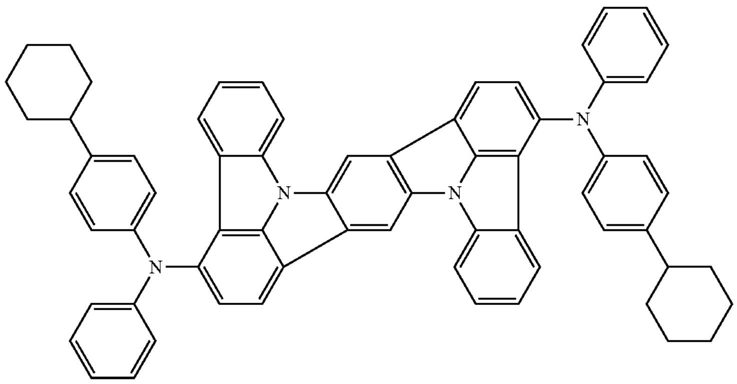
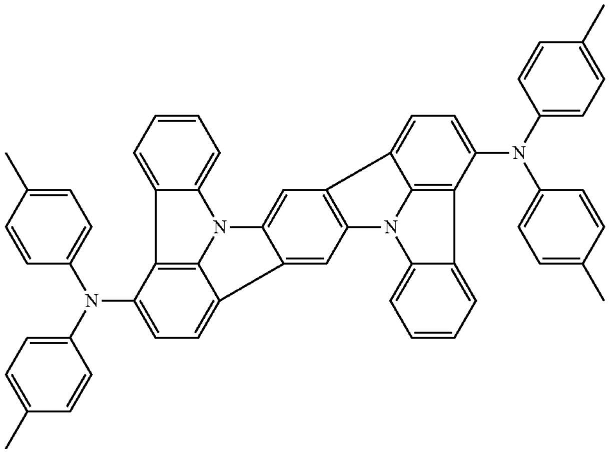
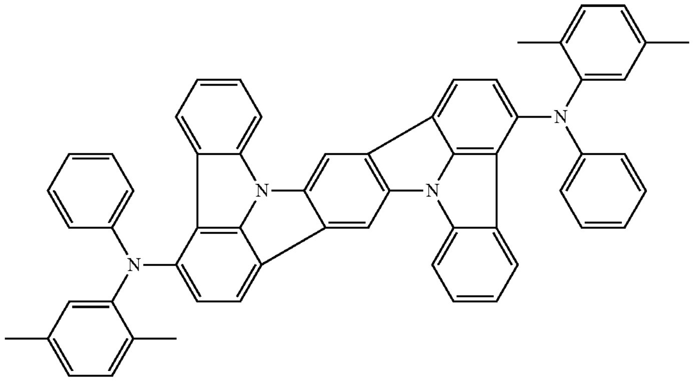
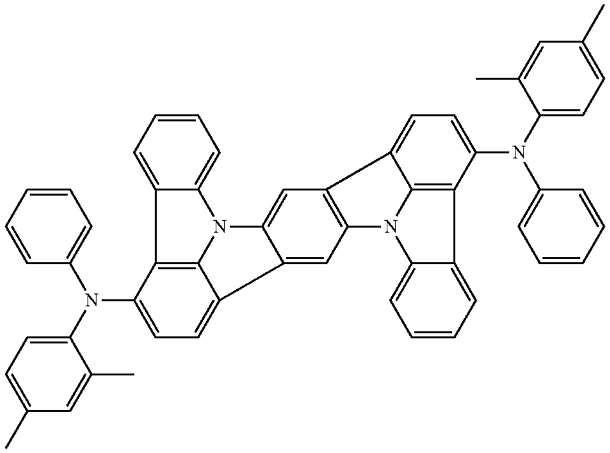

-continued
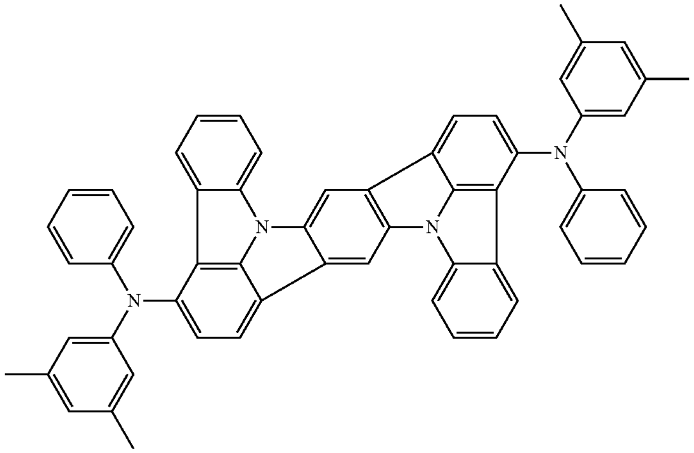
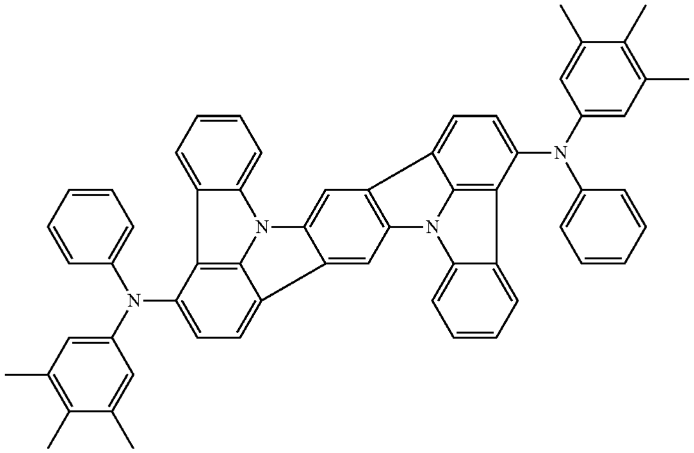
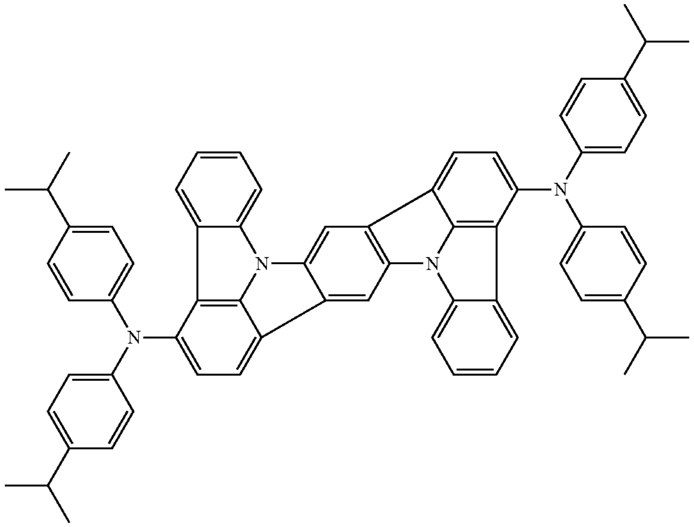

-continued
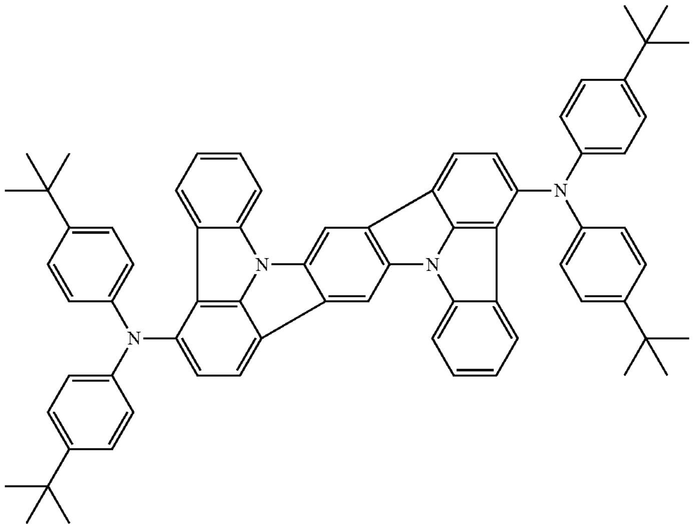
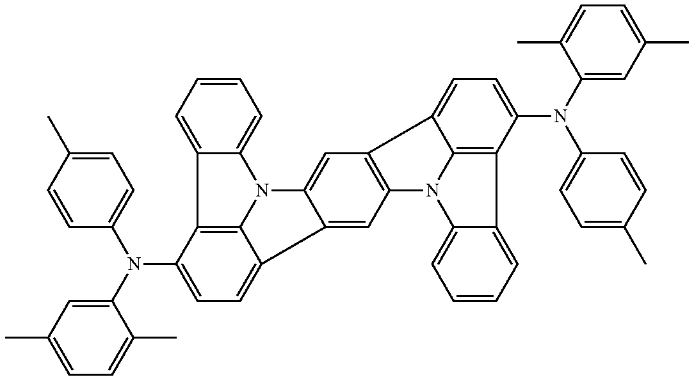
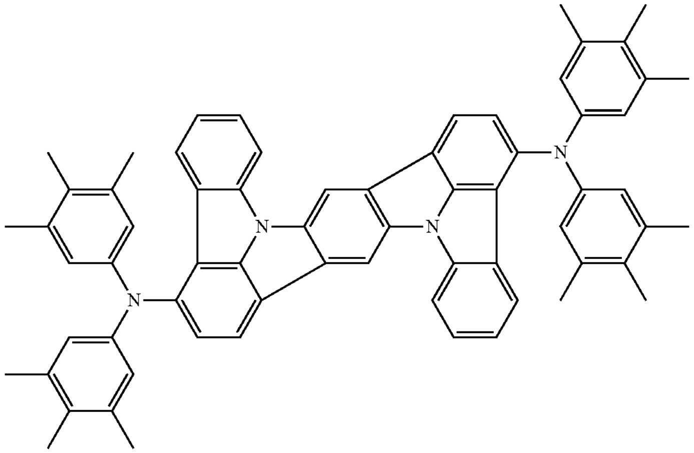
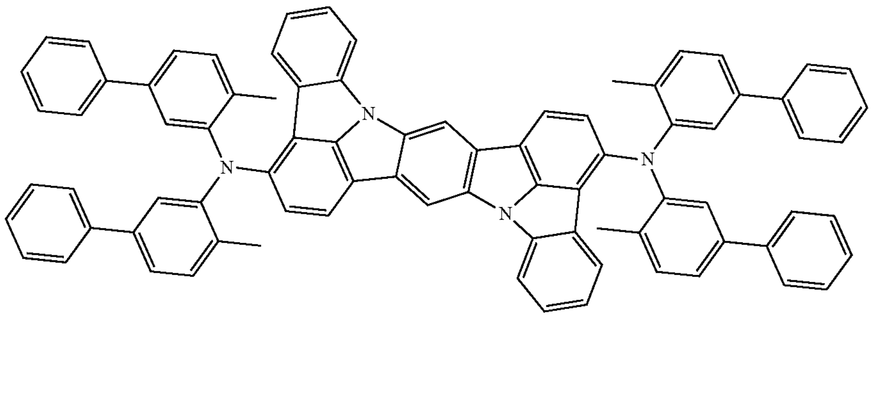

-continued
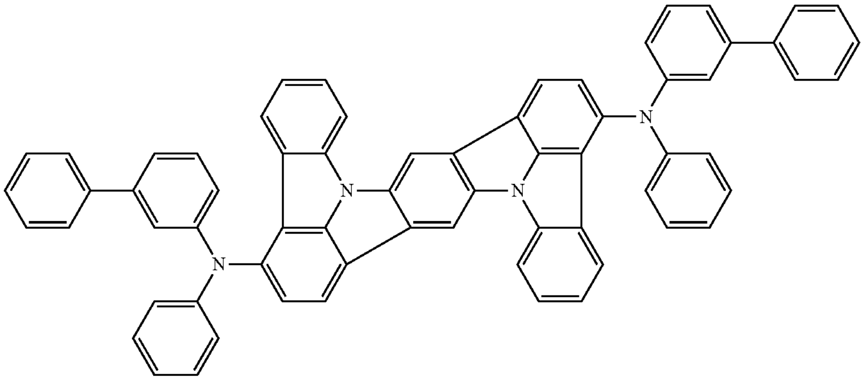
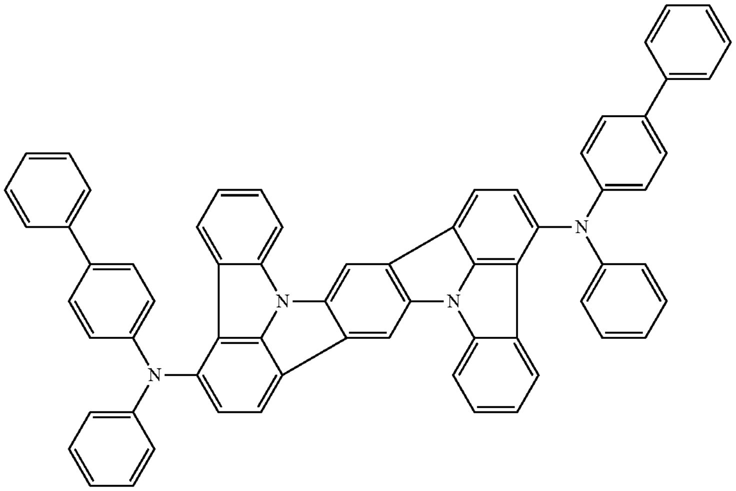
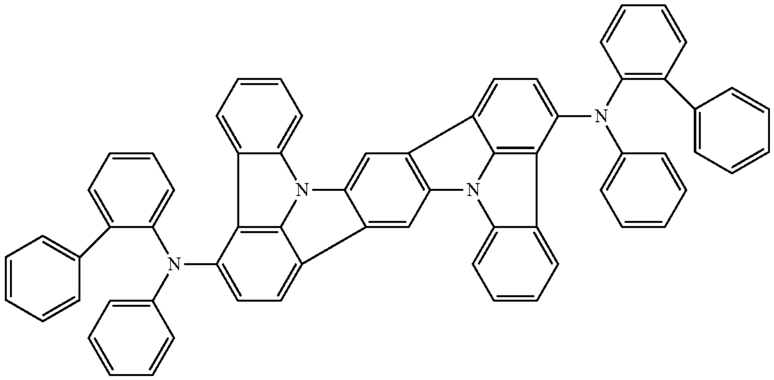
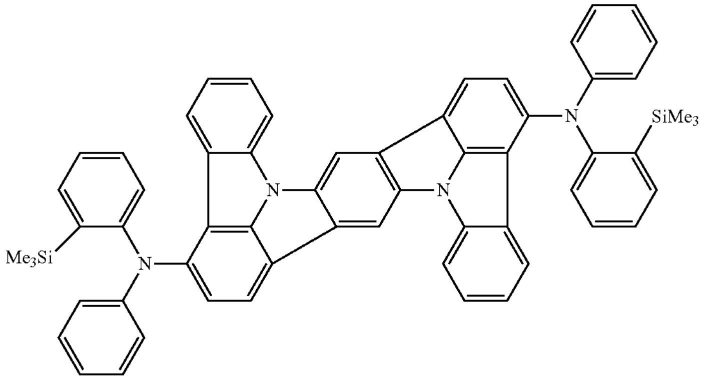

-continued
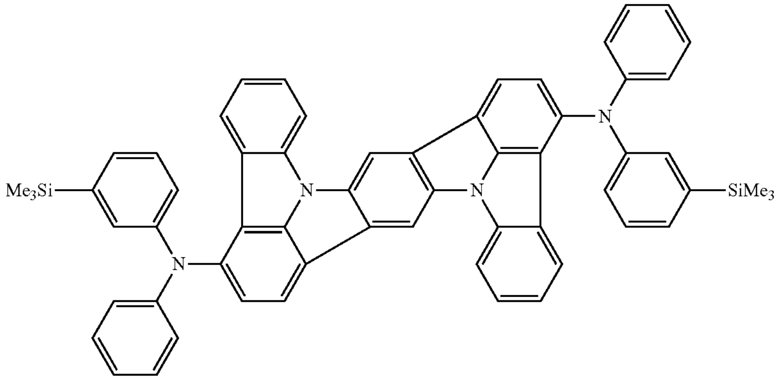
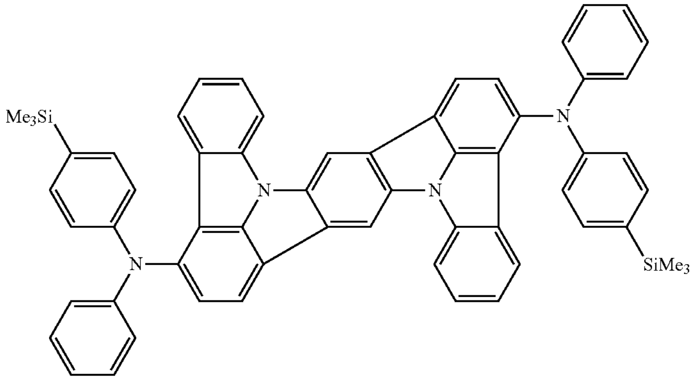
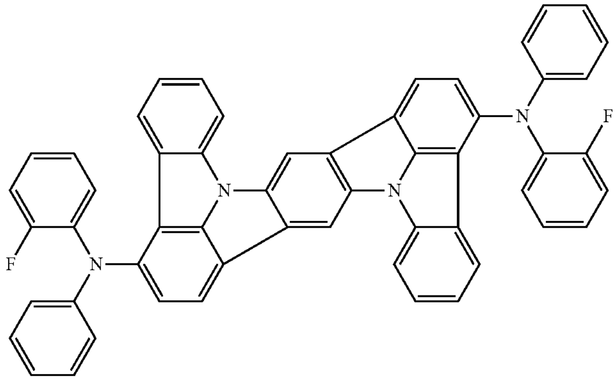
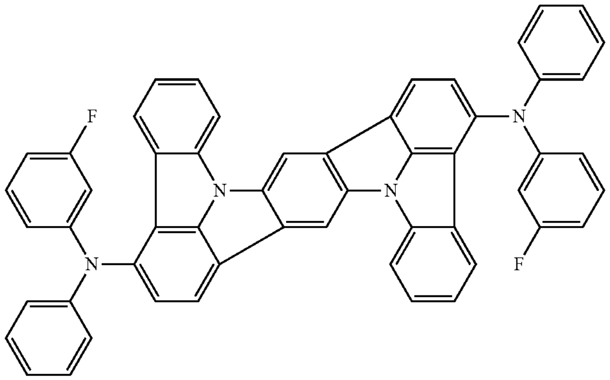

-continued
[Formula 181]
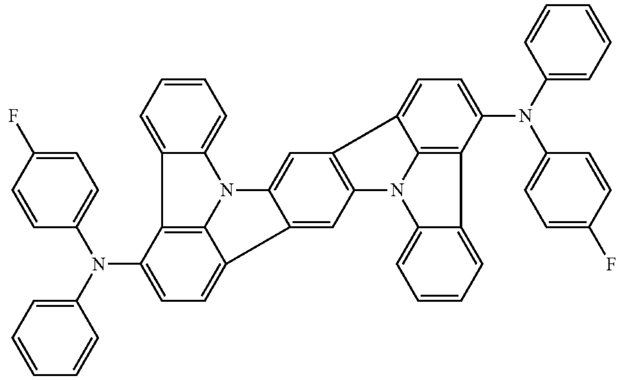
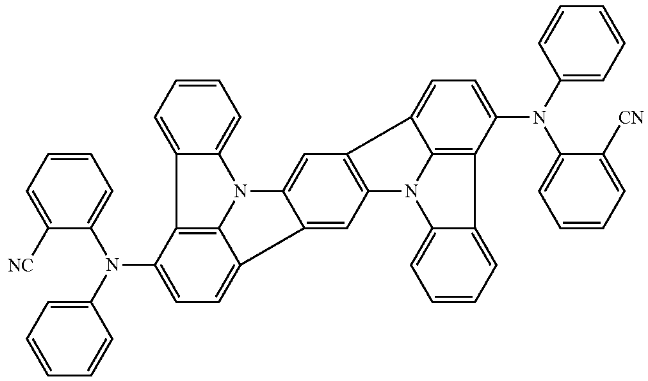
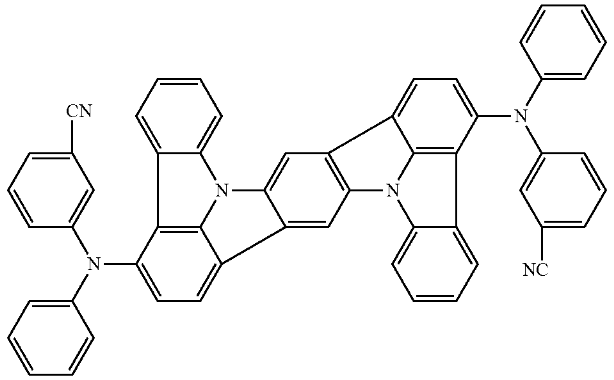
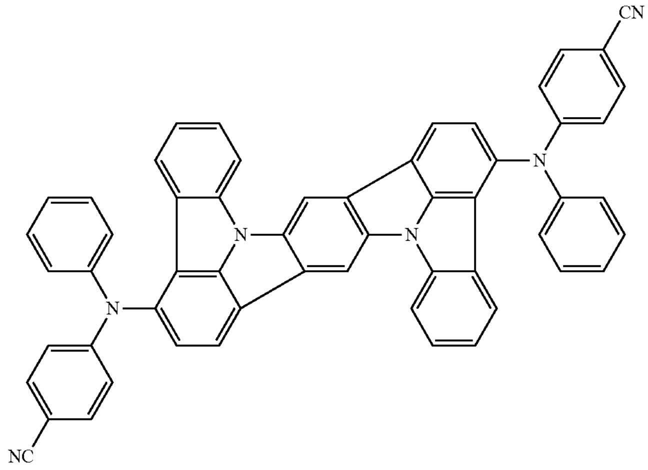

-continued
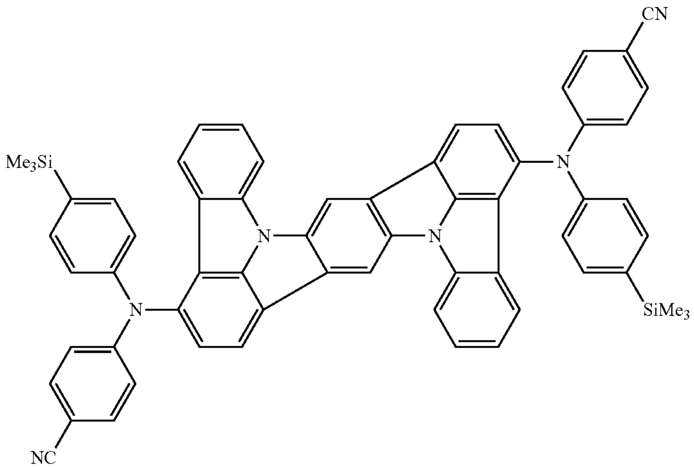
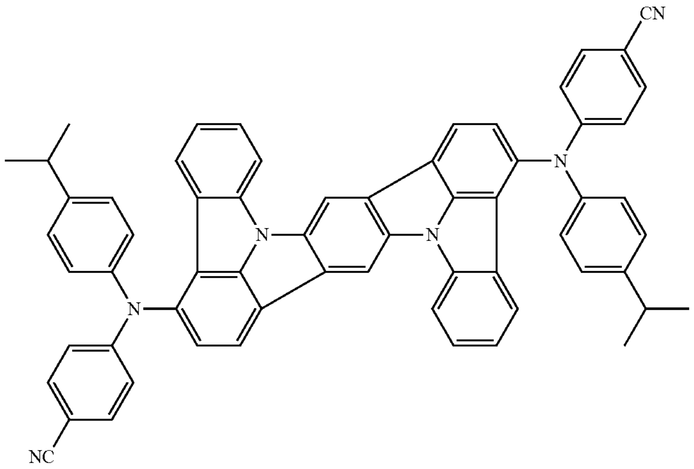
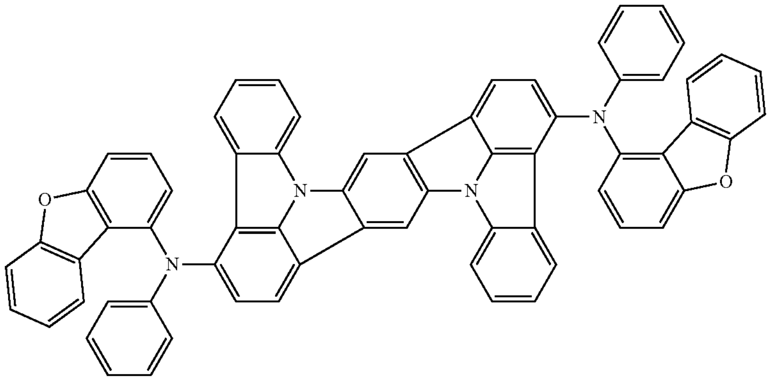
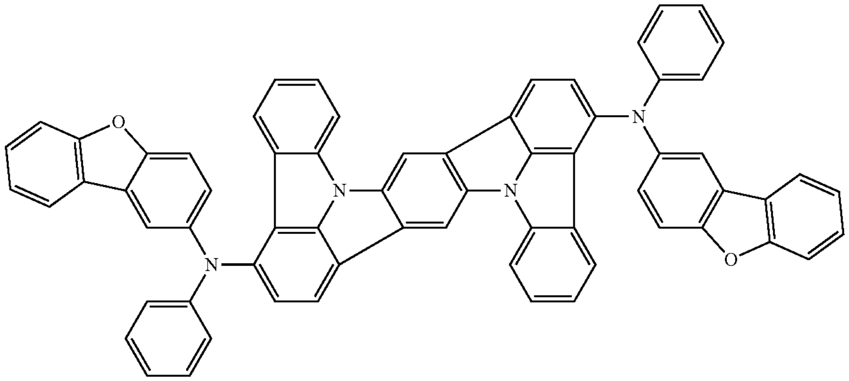

-continued
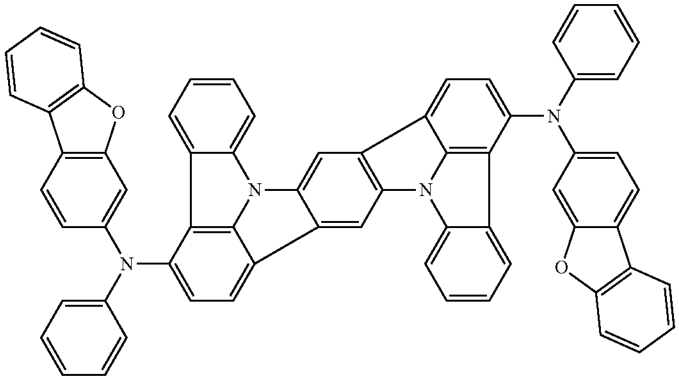
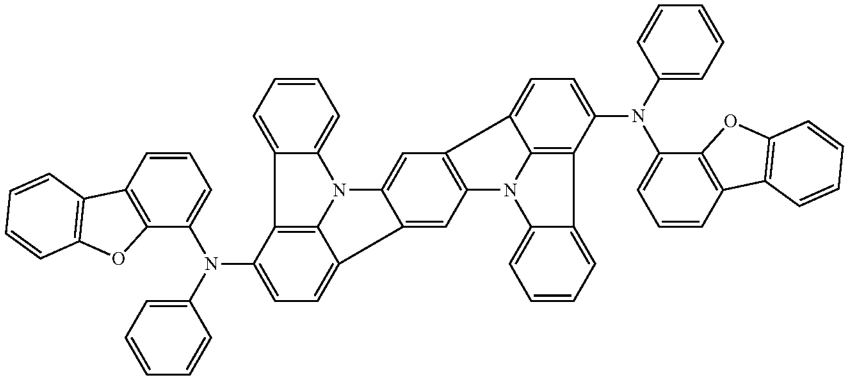
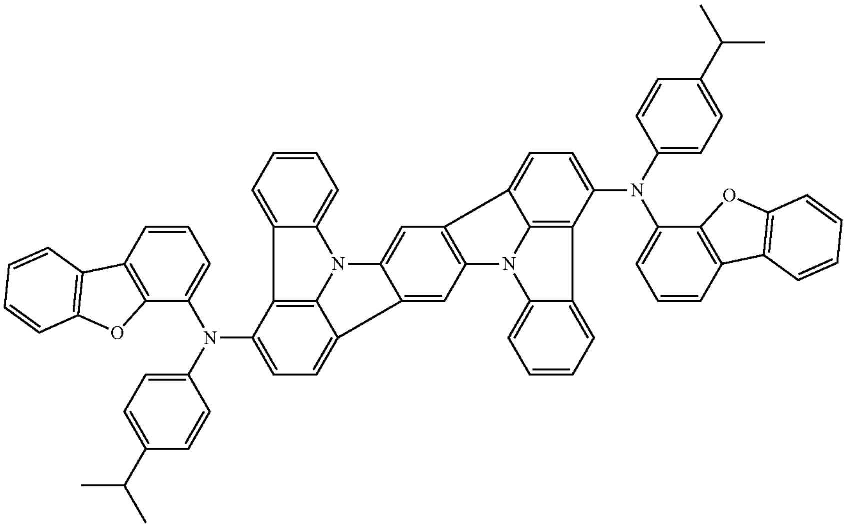
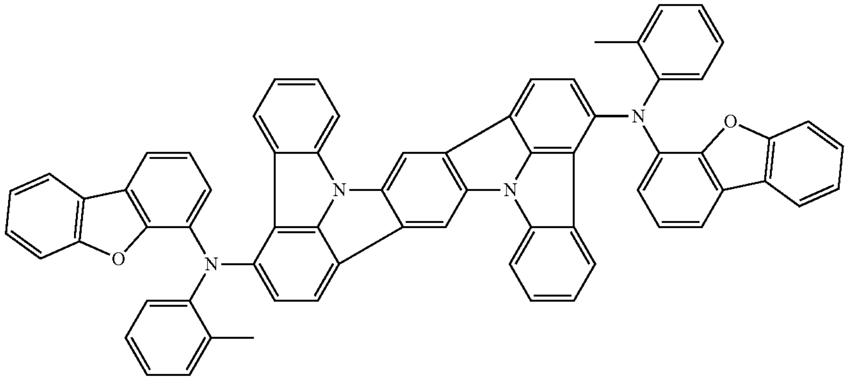

-continued
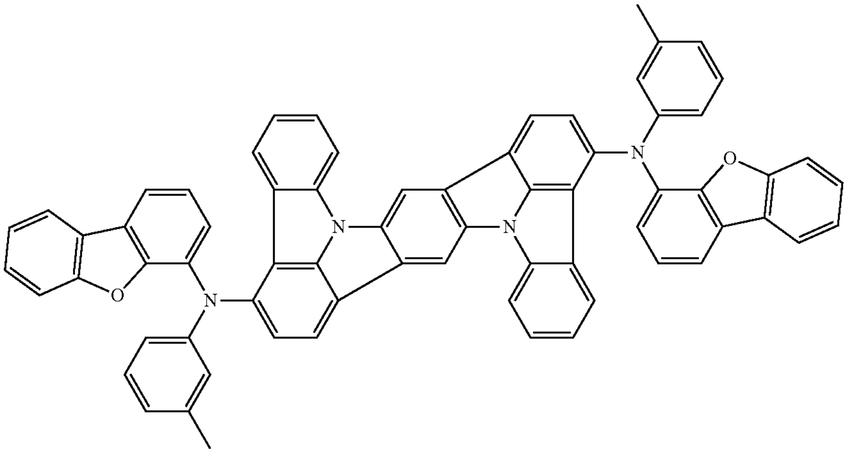
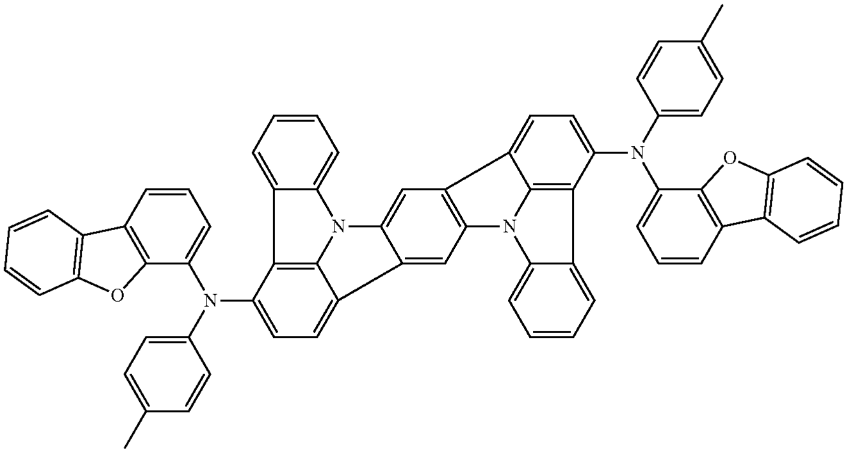
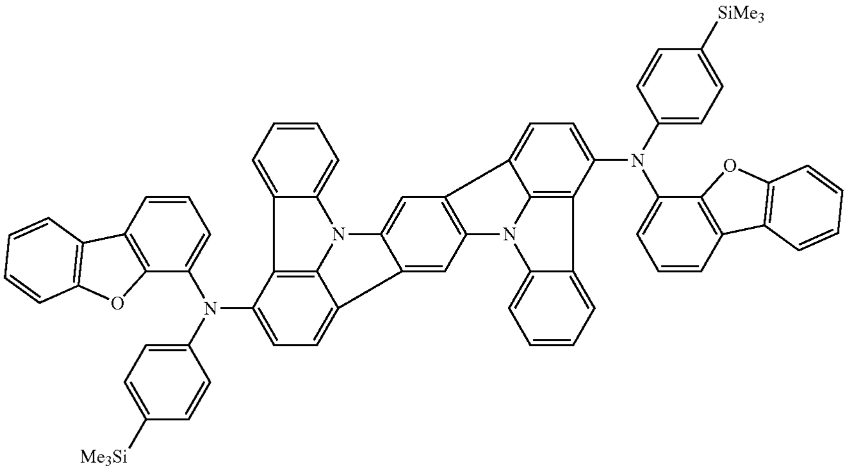

-continued
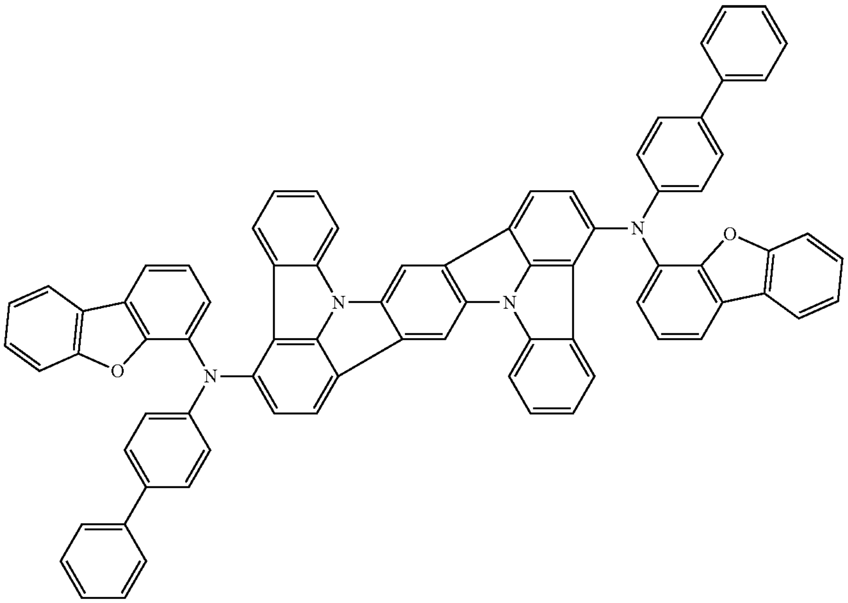
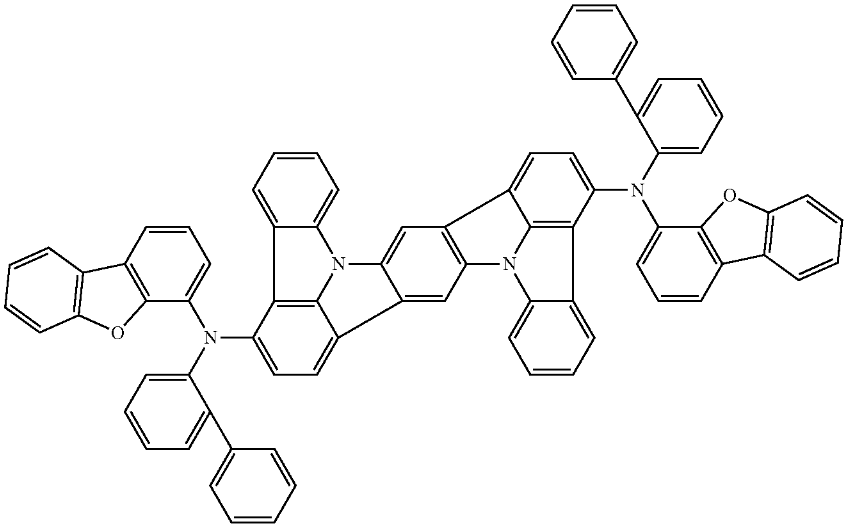
[Formula 182]
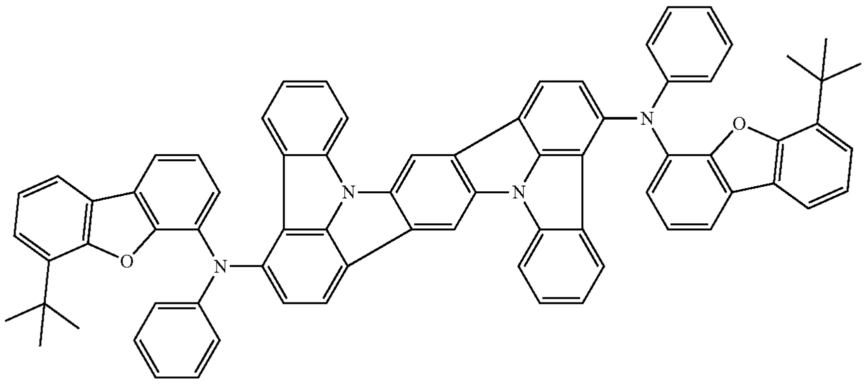

-continued
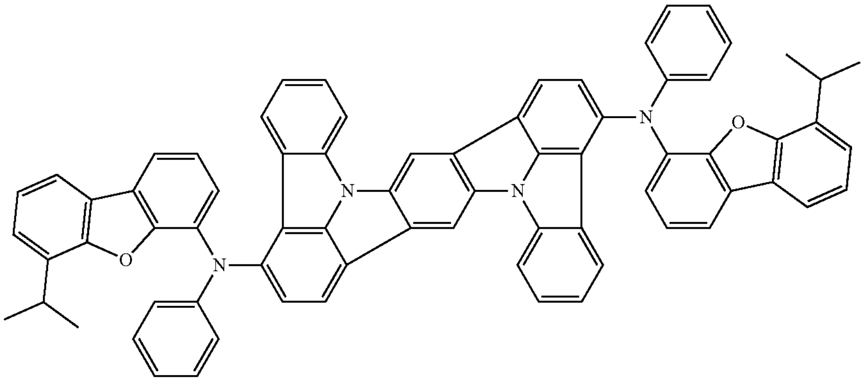
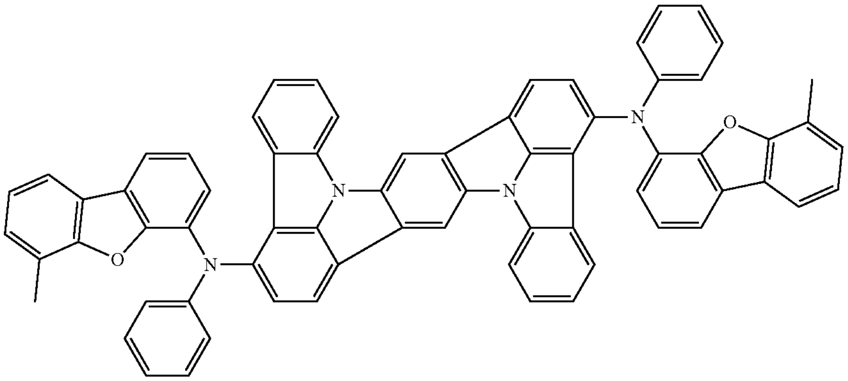
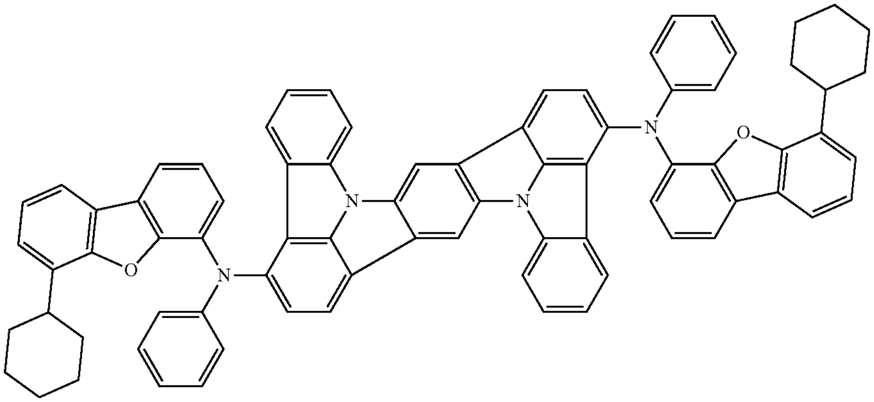
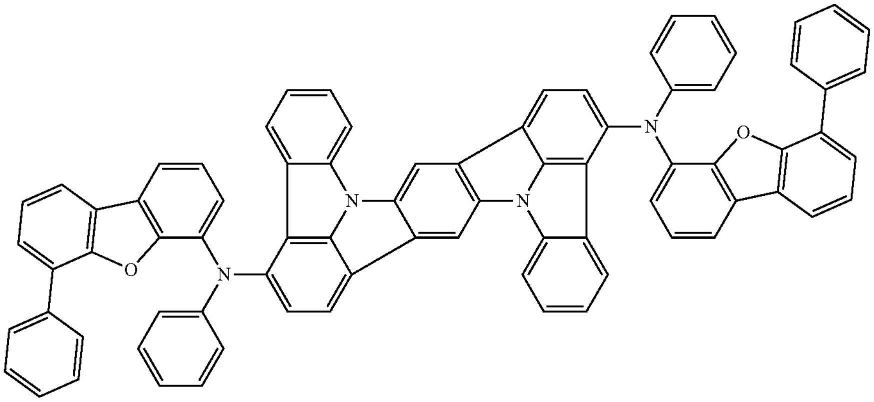

-continued
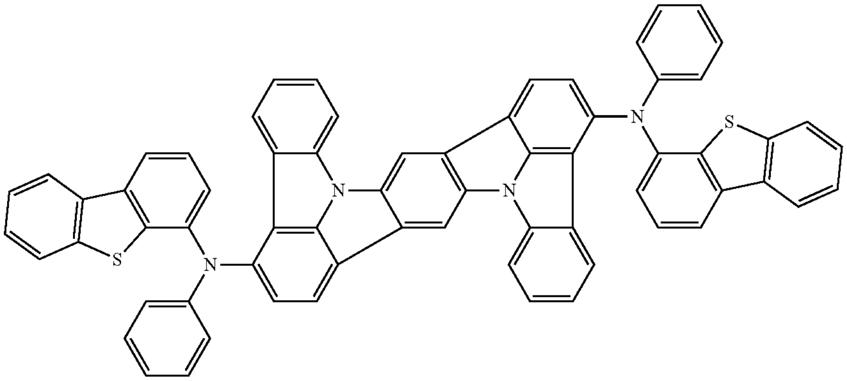
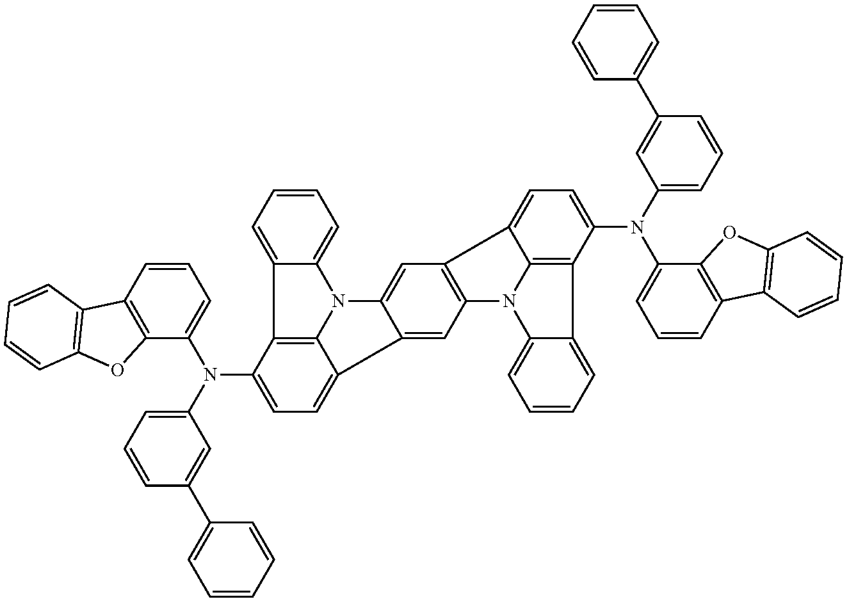
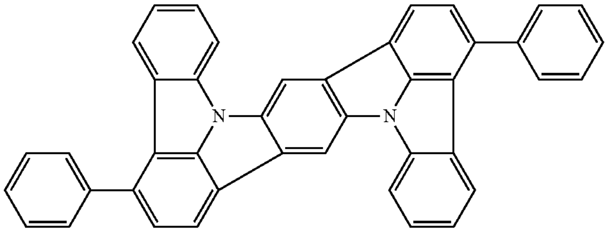
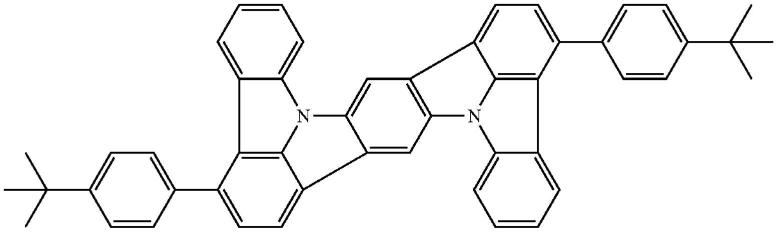
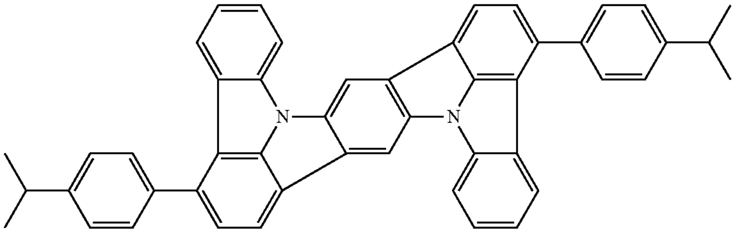

-continued
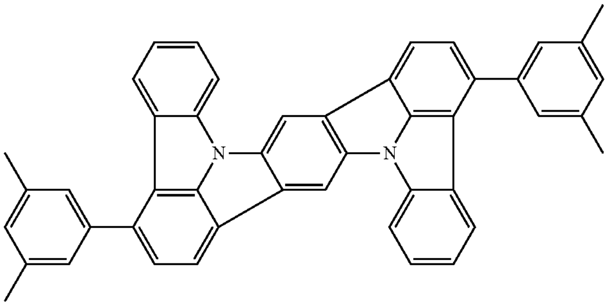
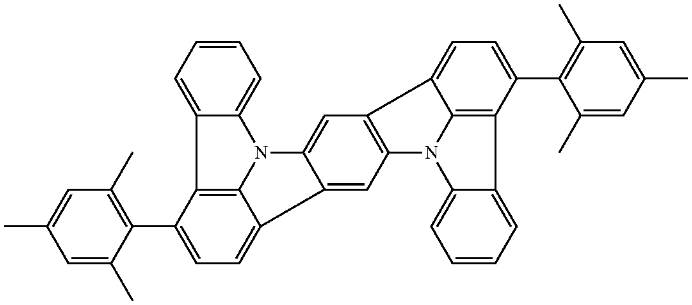
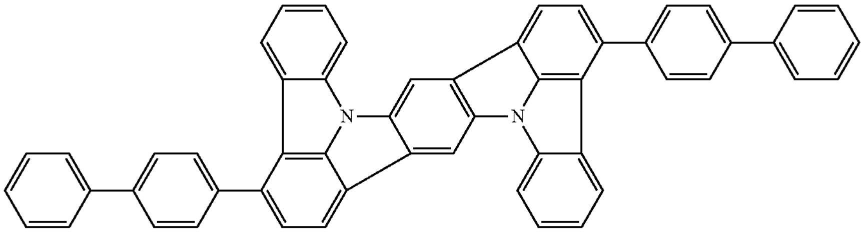
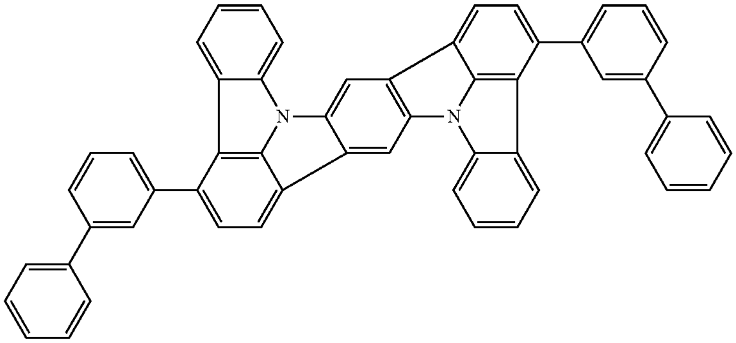
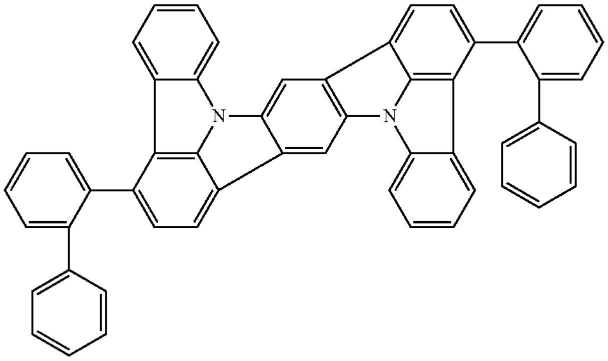

-continued
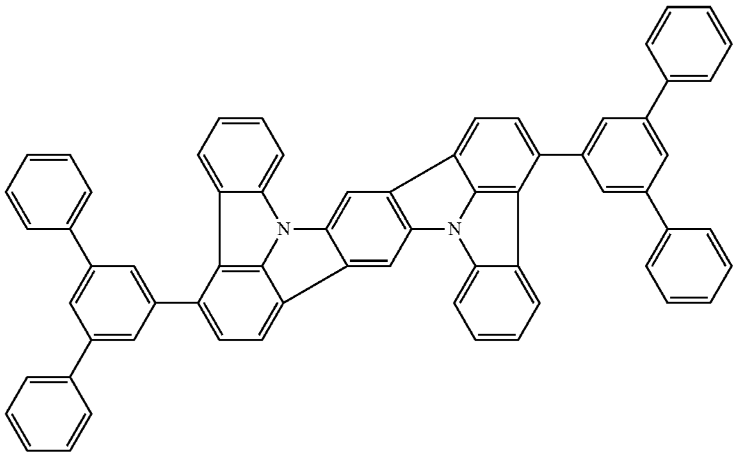
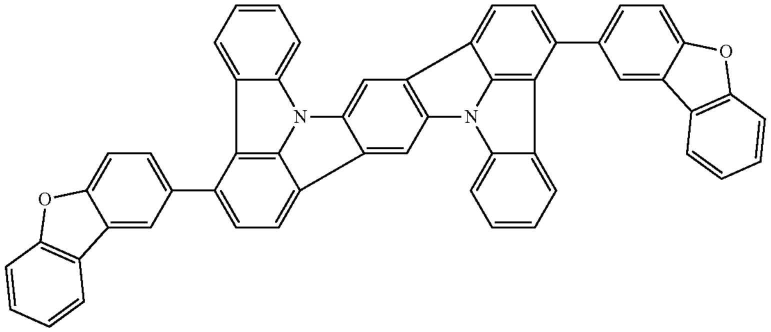
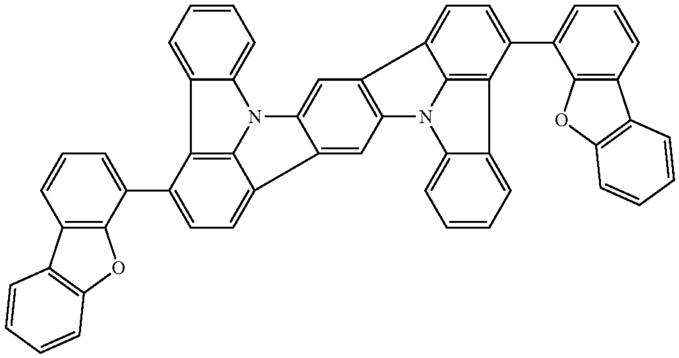
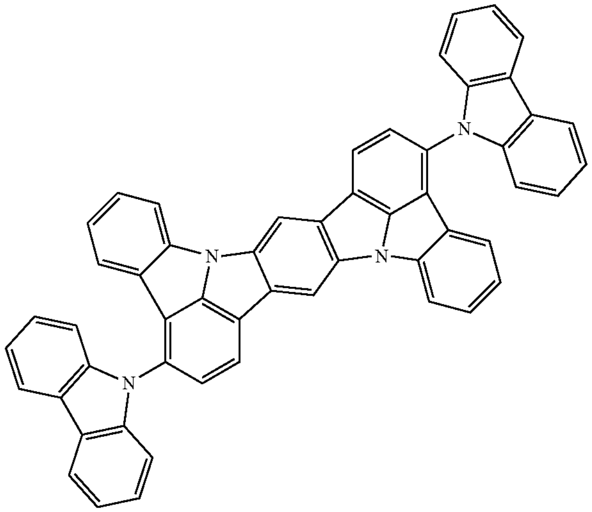

[Formula 183]
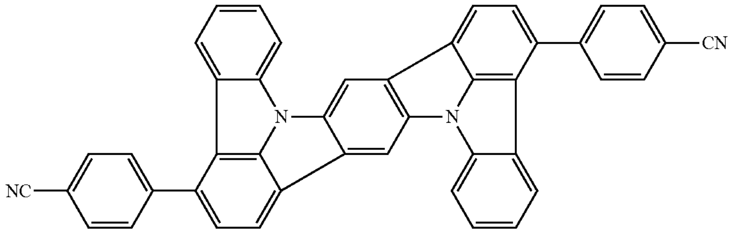
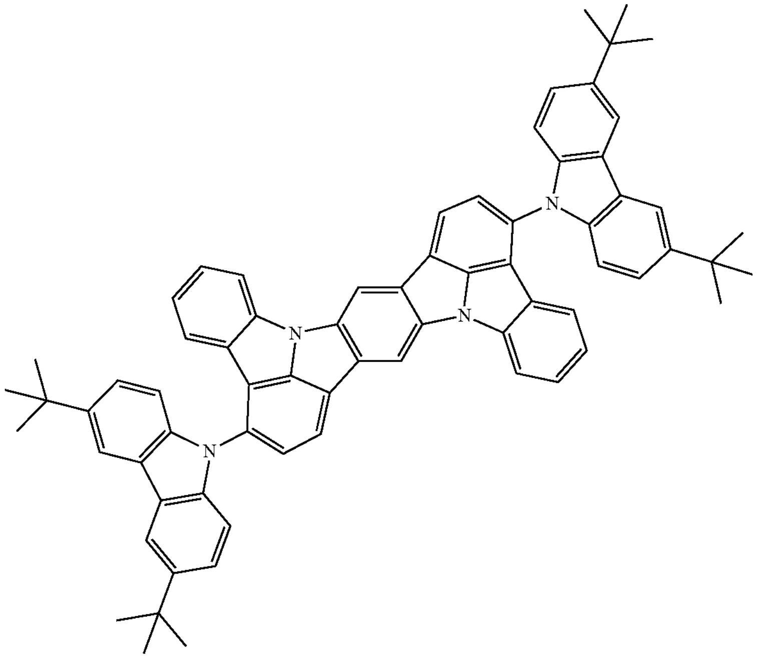
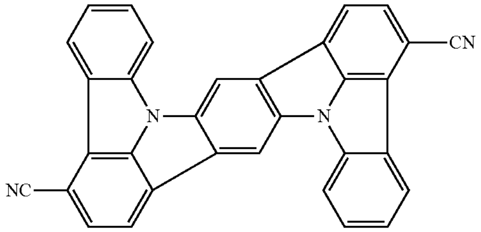
[Formula 184]
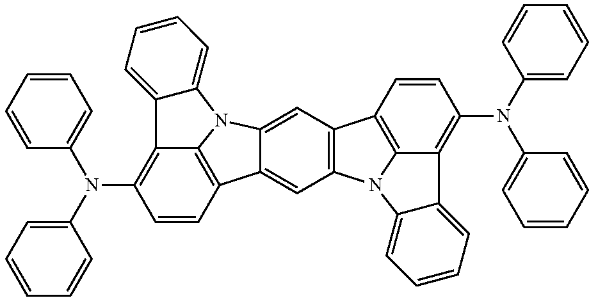

-continued
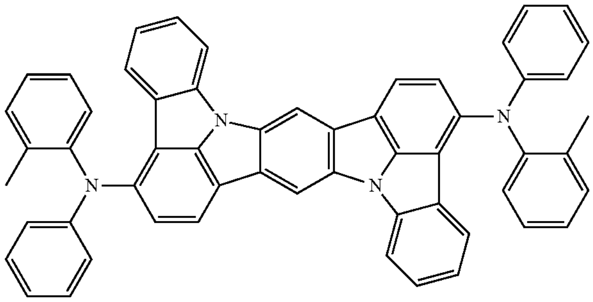
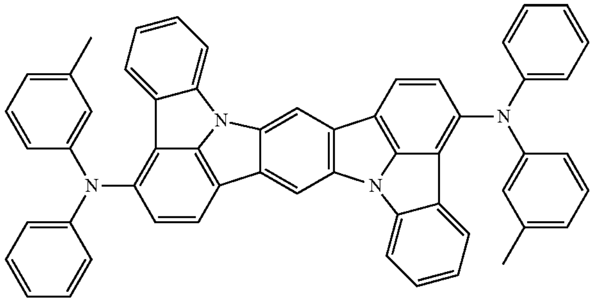
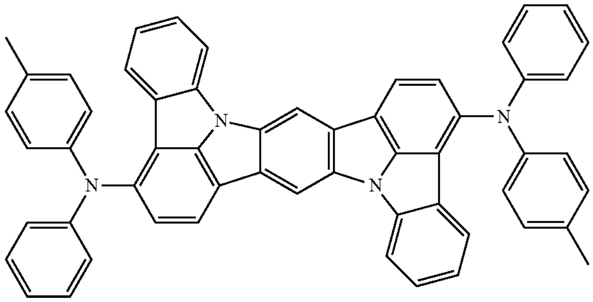
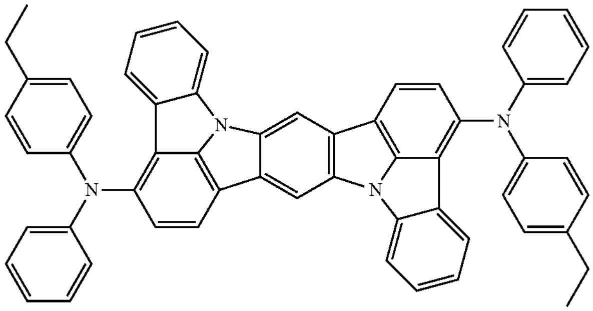
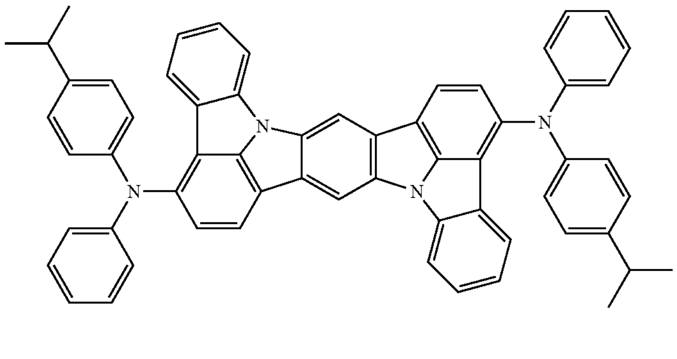

-continued
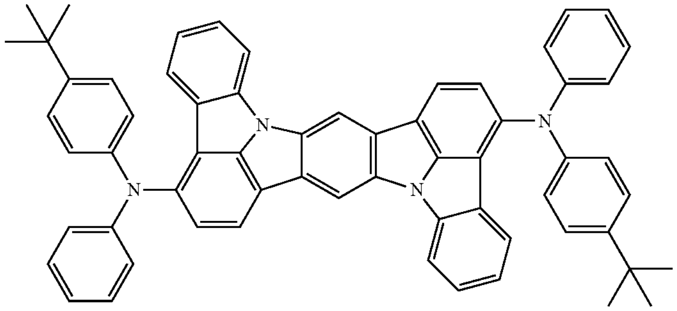
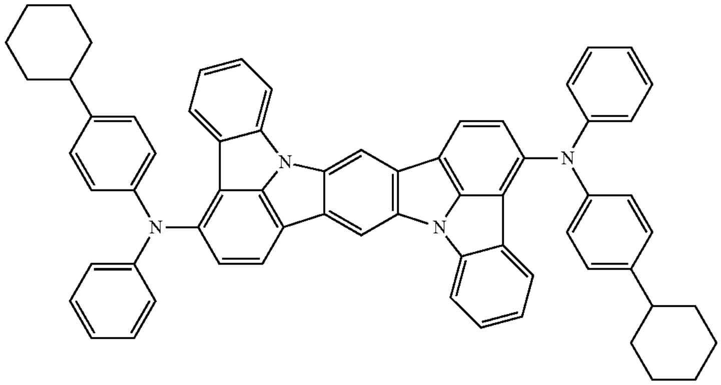
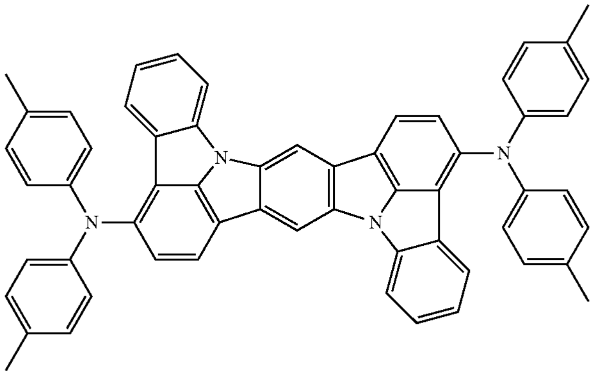
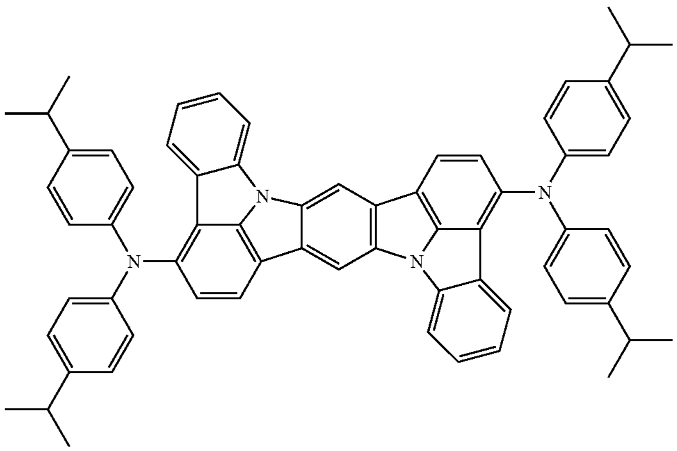

-continued
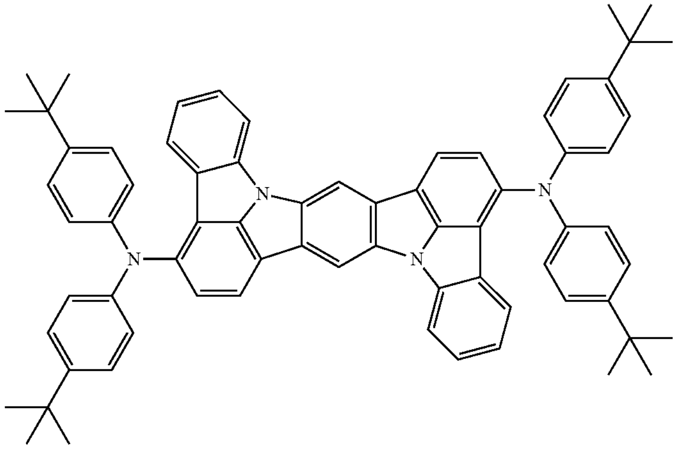
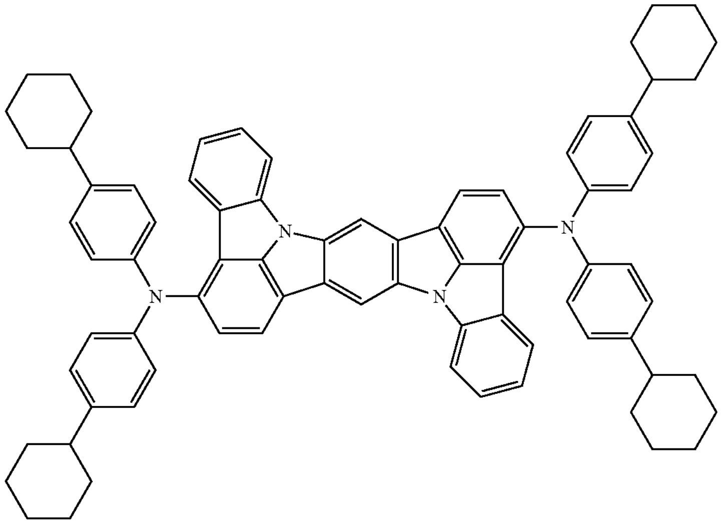
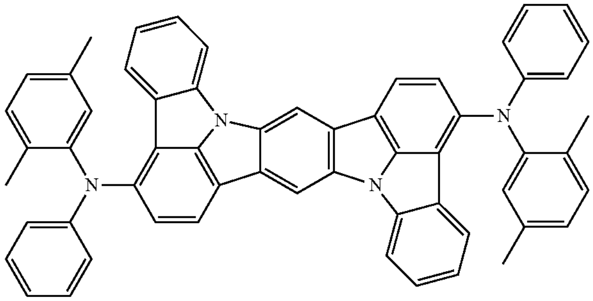
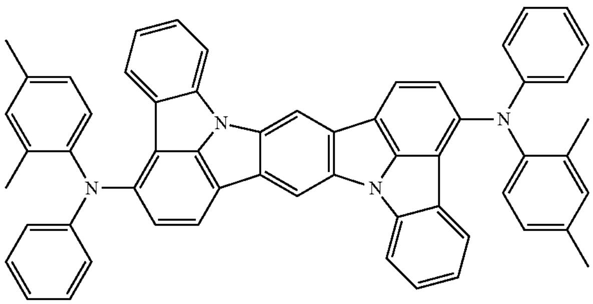

-continued
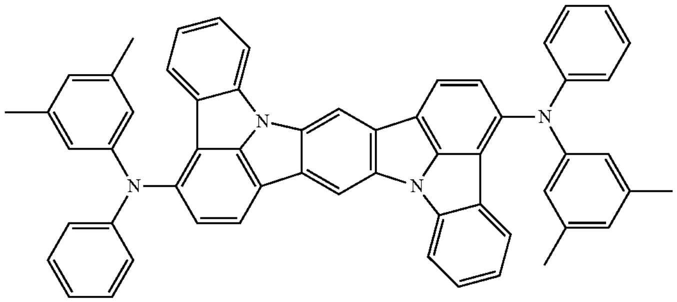
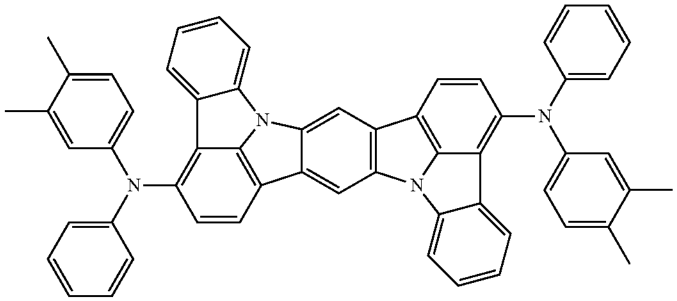
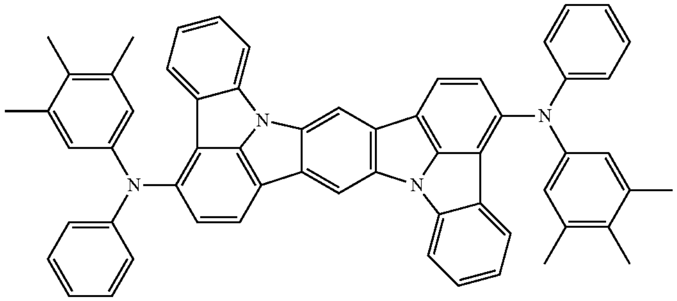
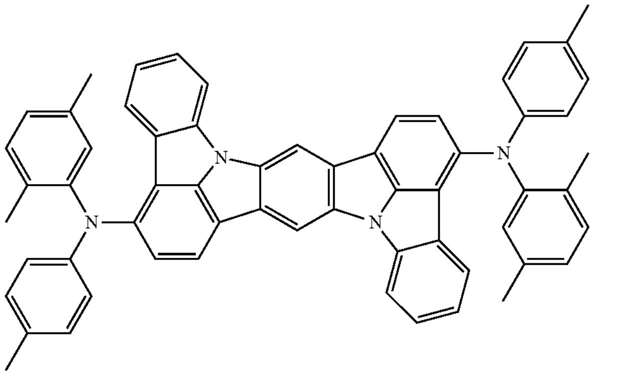
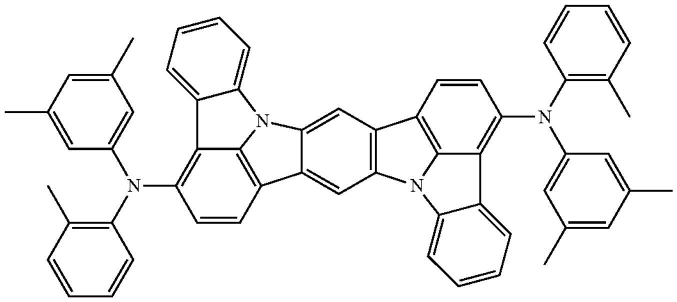

-continued
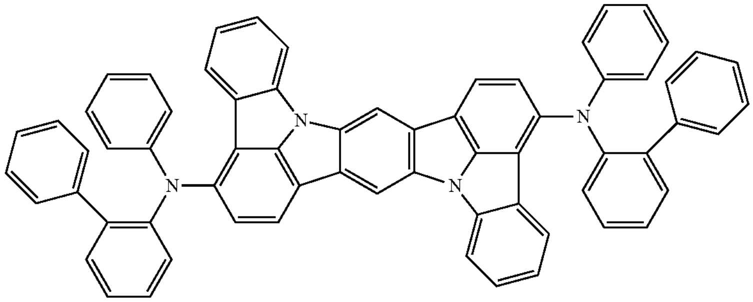
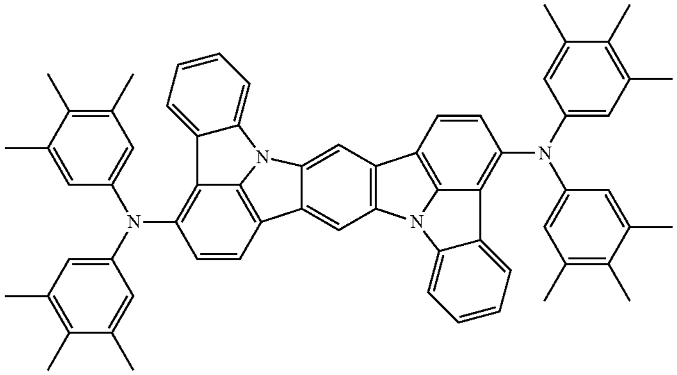
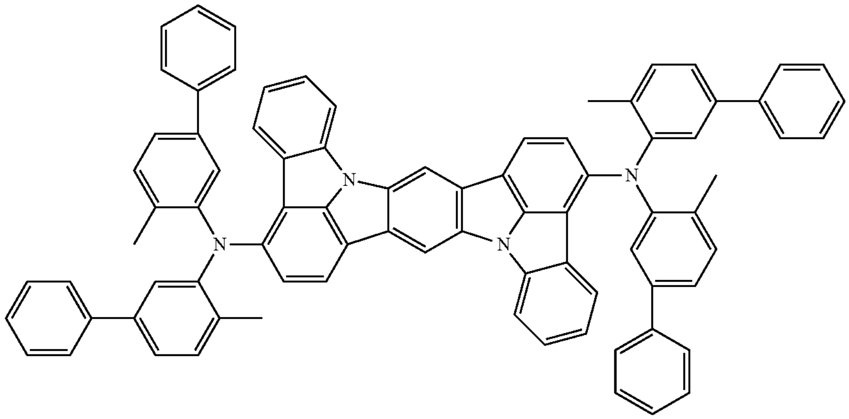
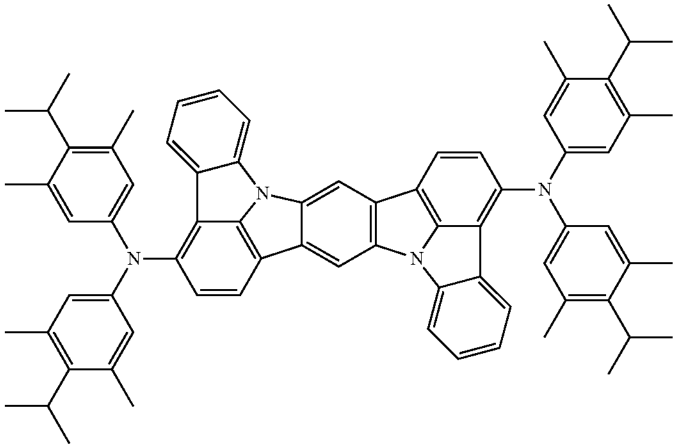

-continued
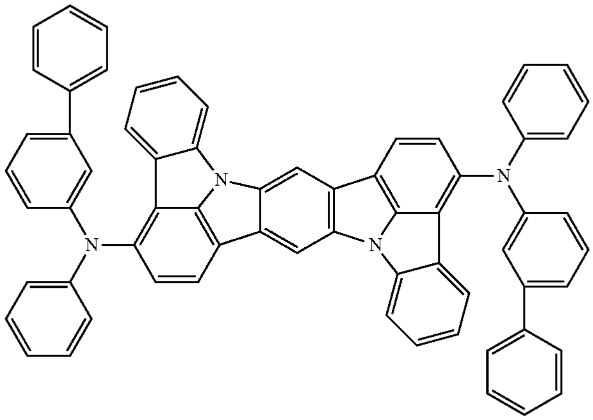
[Formula 185]
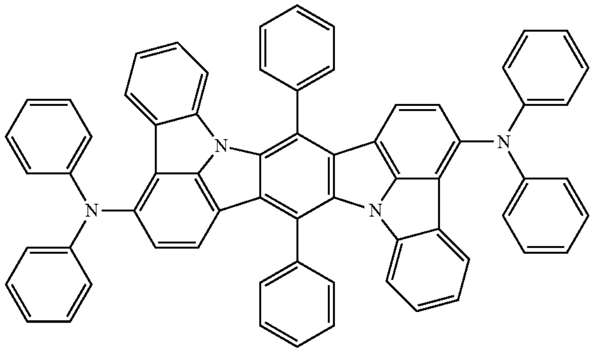
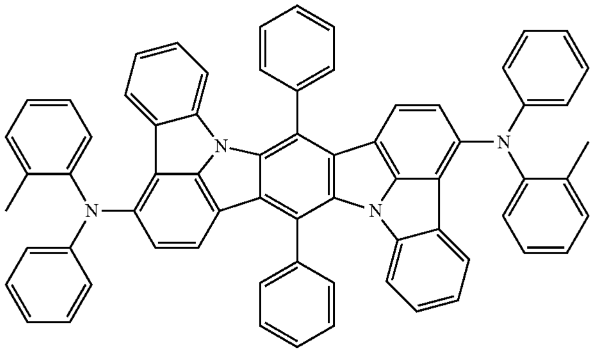
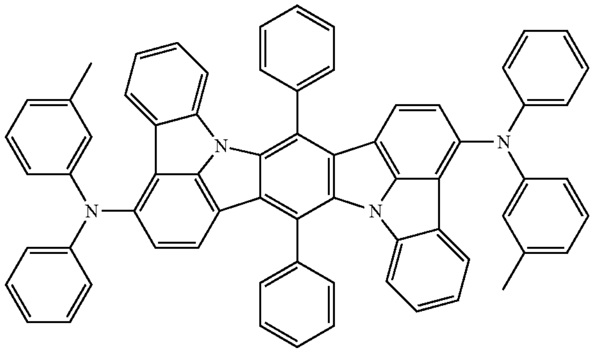

-continued
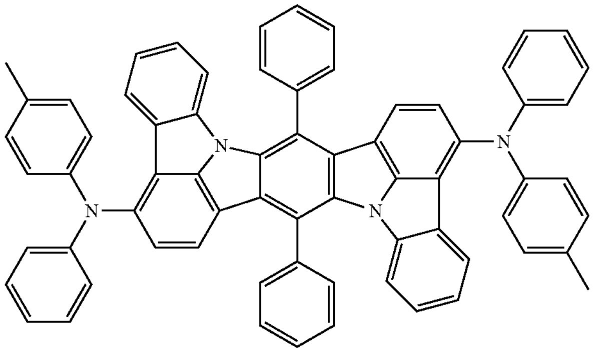
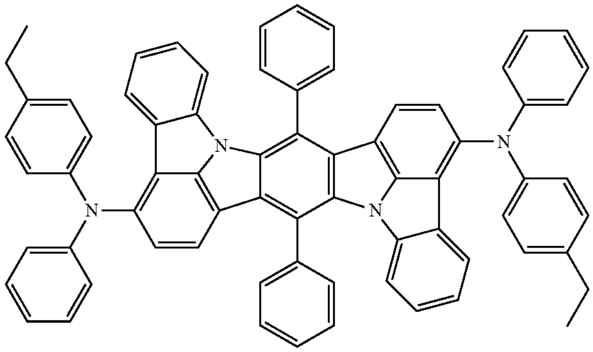
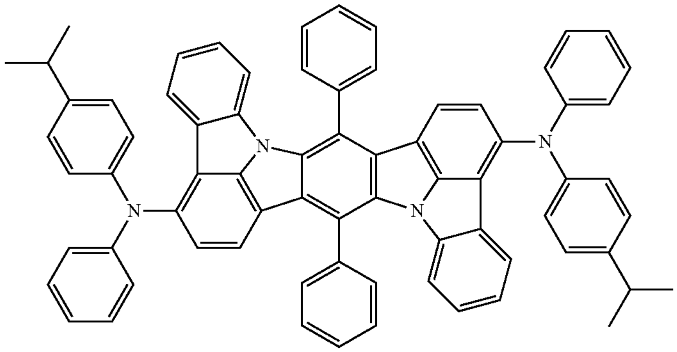
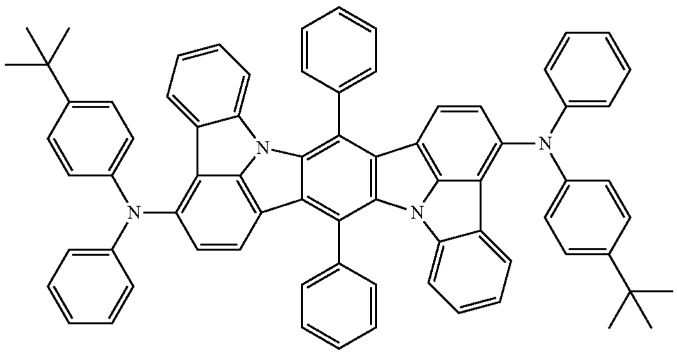

-continued
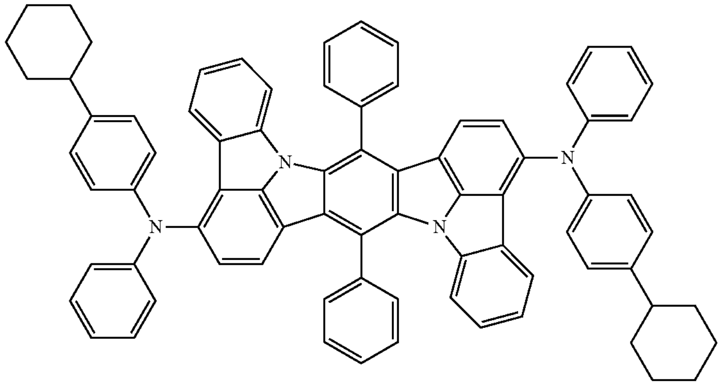
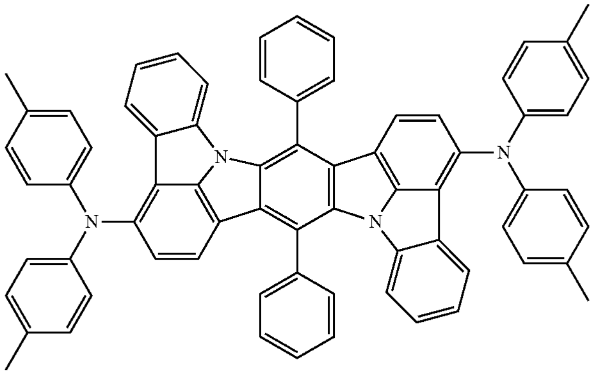
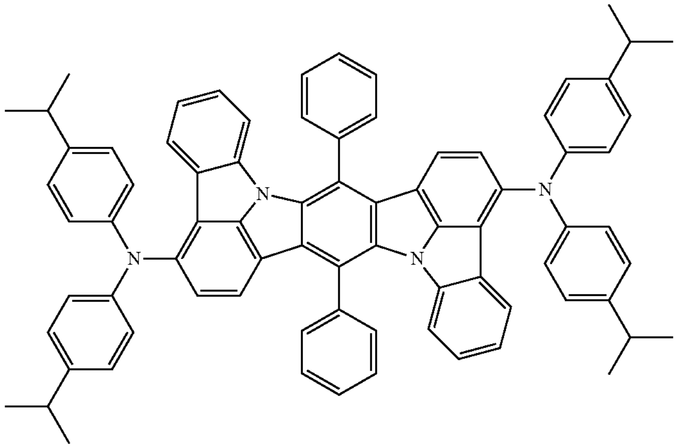
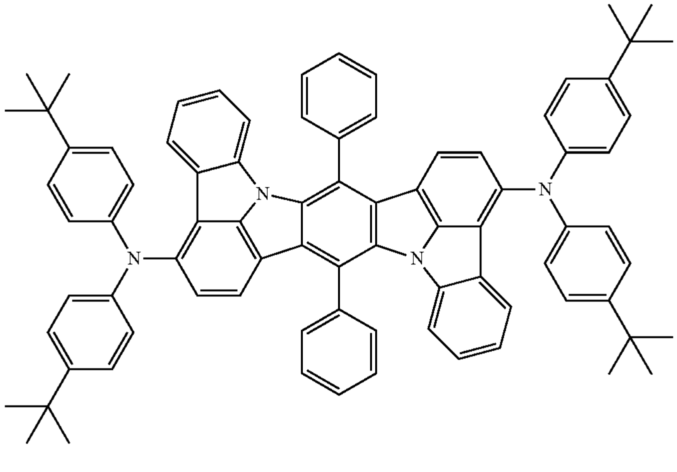

-continued
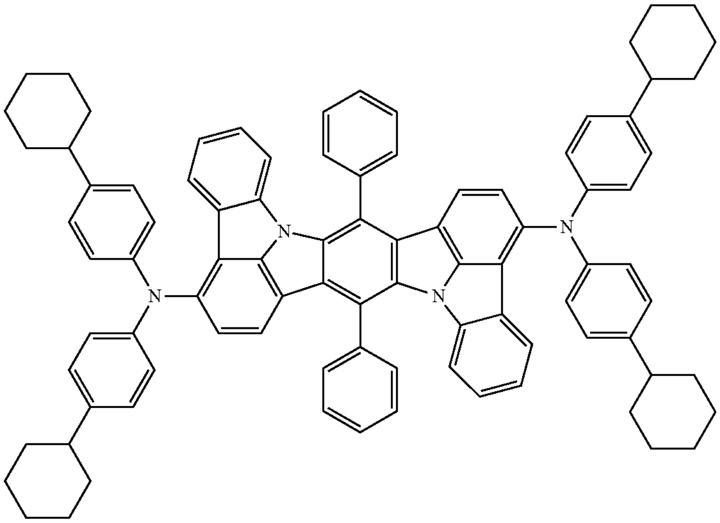
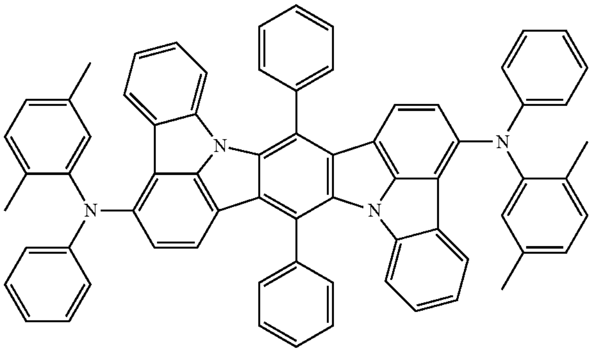
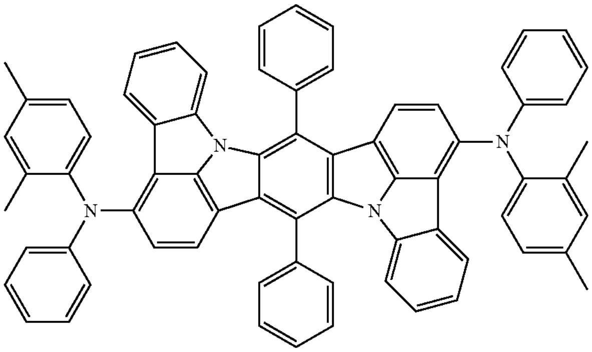
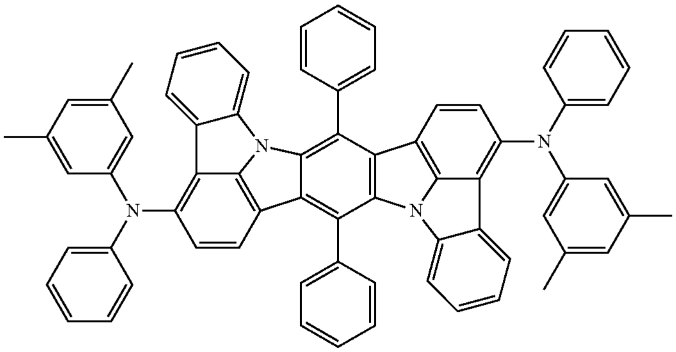

-continued
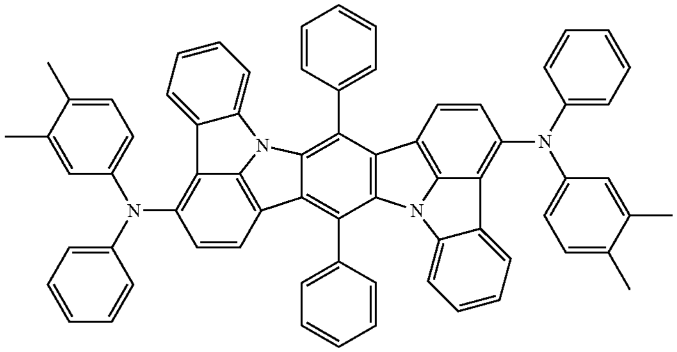
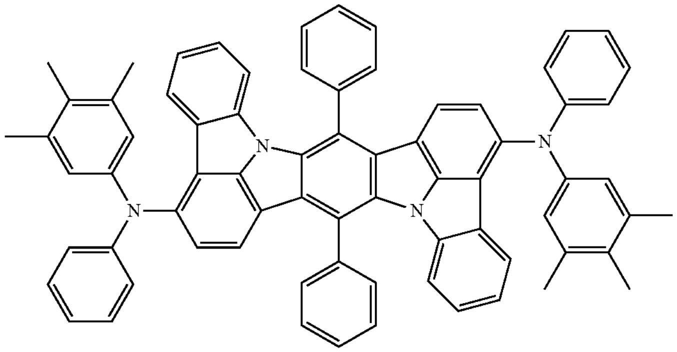
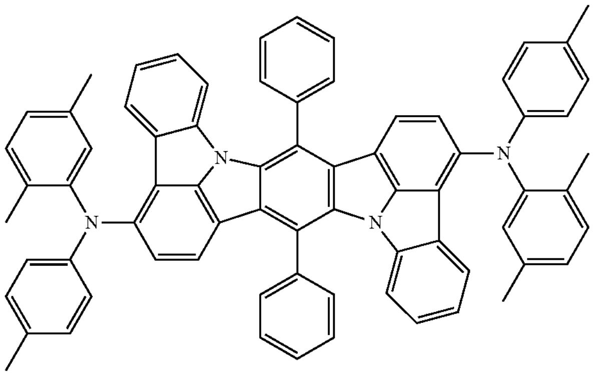
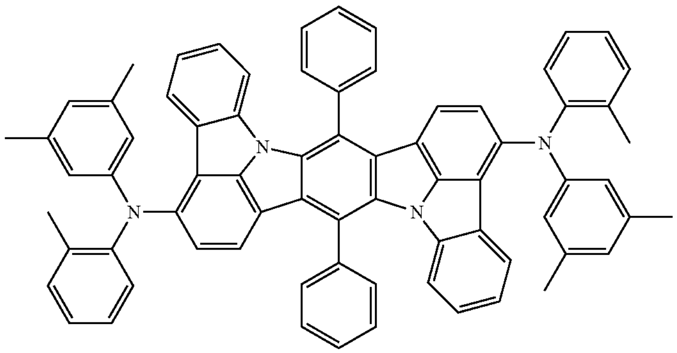

-continued
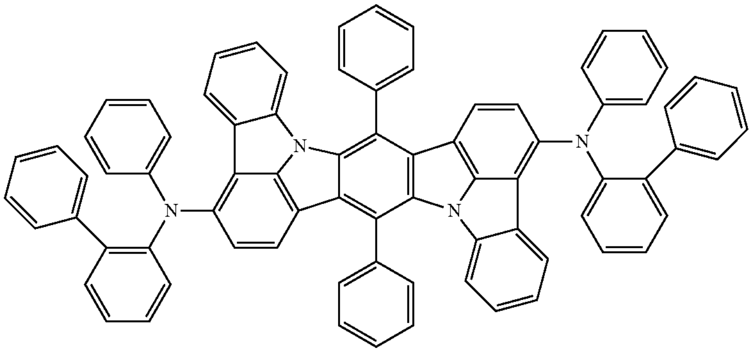
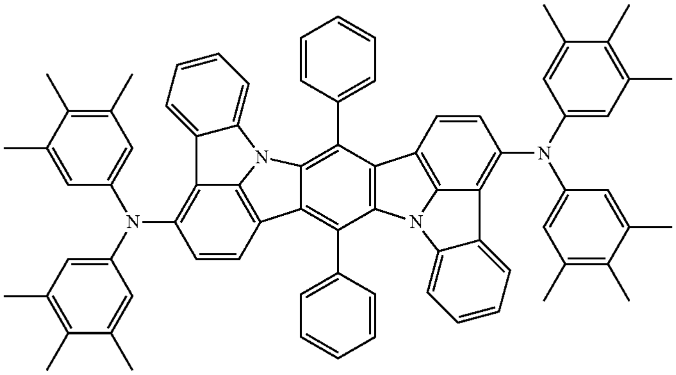
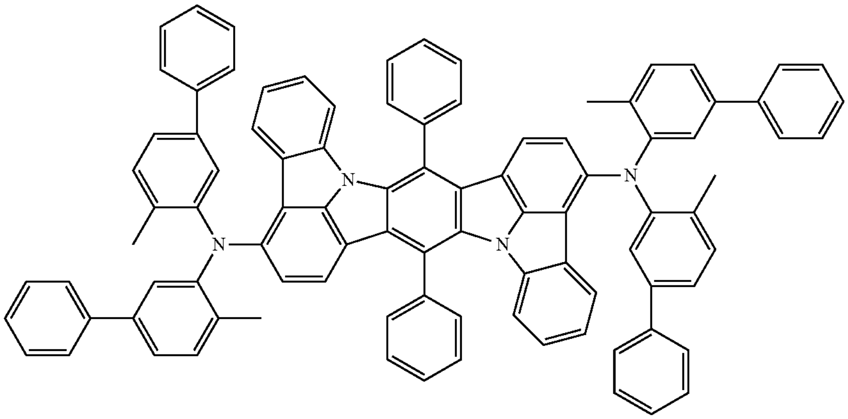
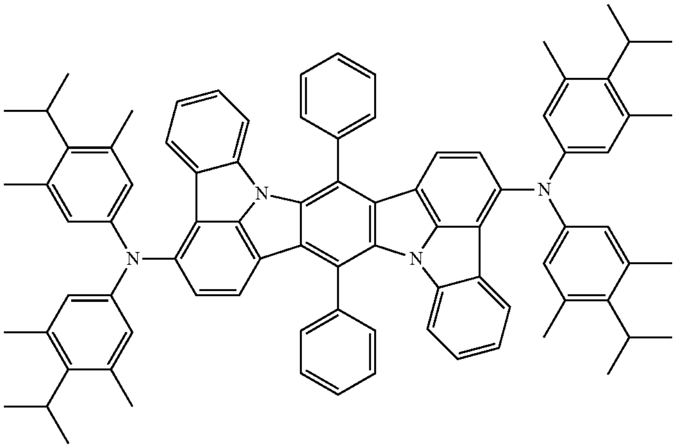

-continued
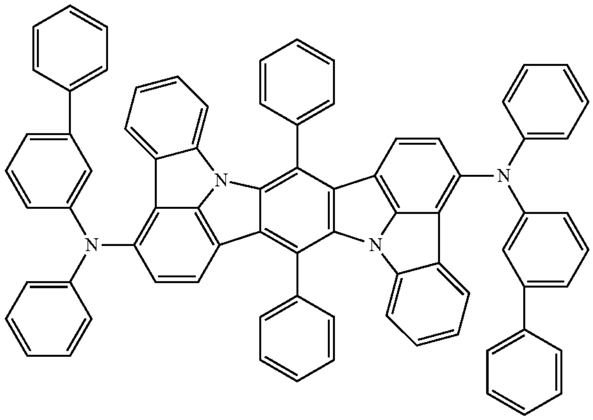
[Formula 186]
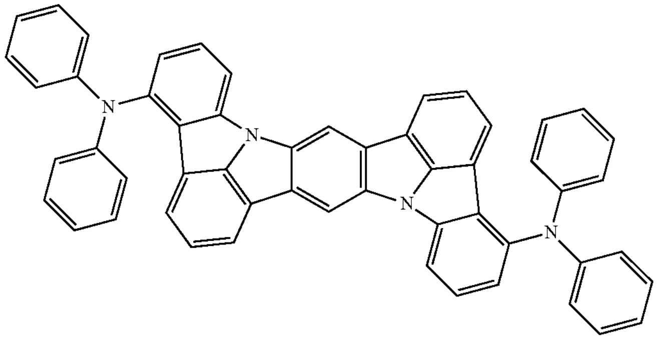
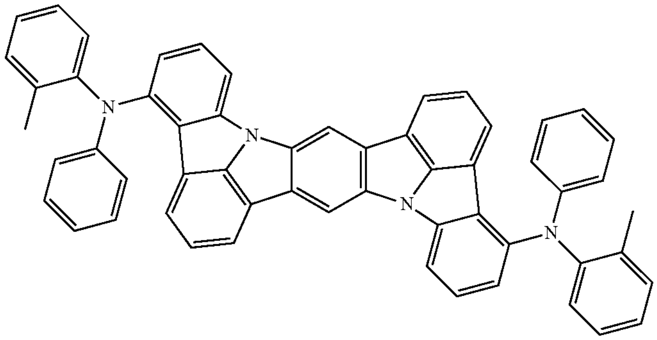
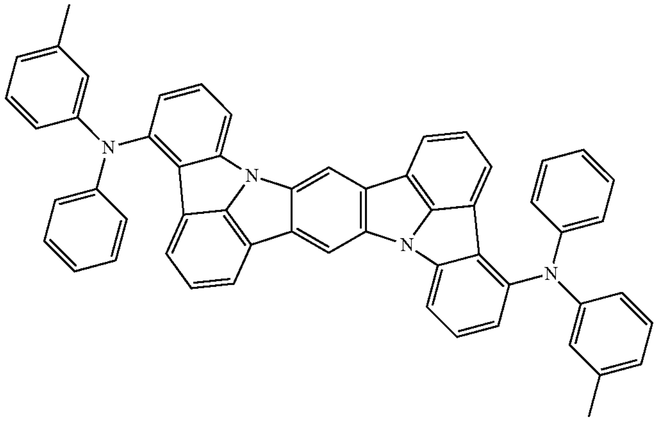

-continued
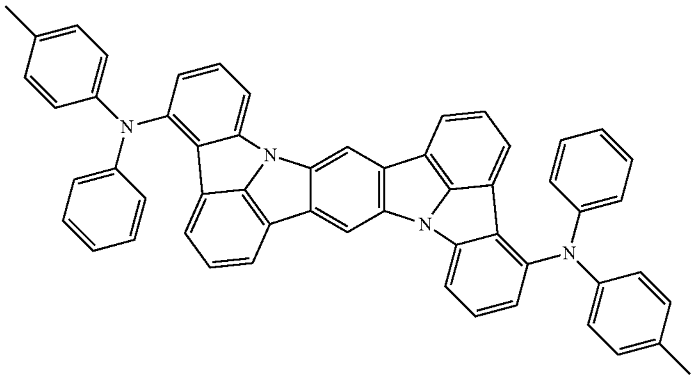
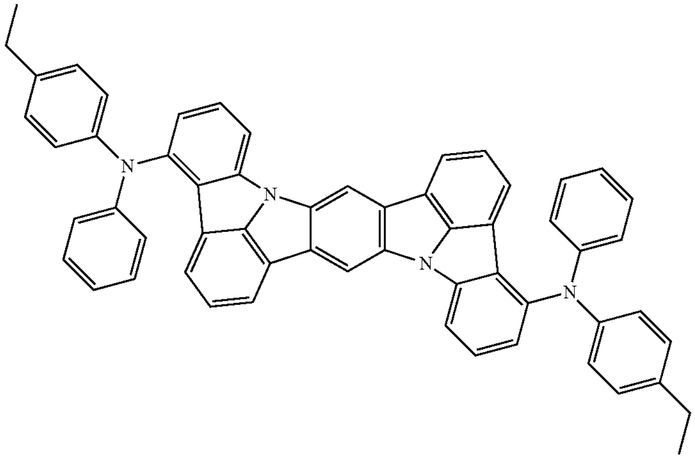
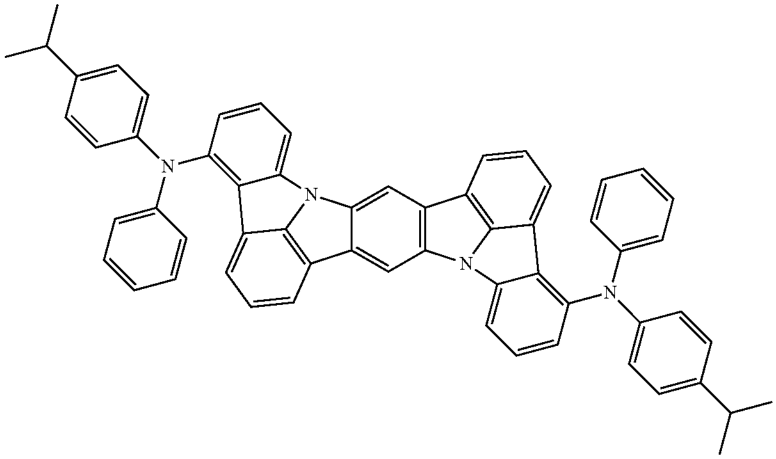

-continued
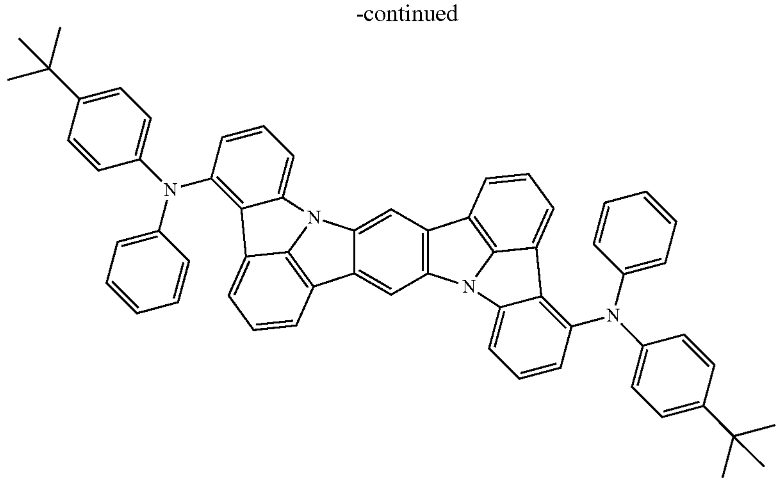
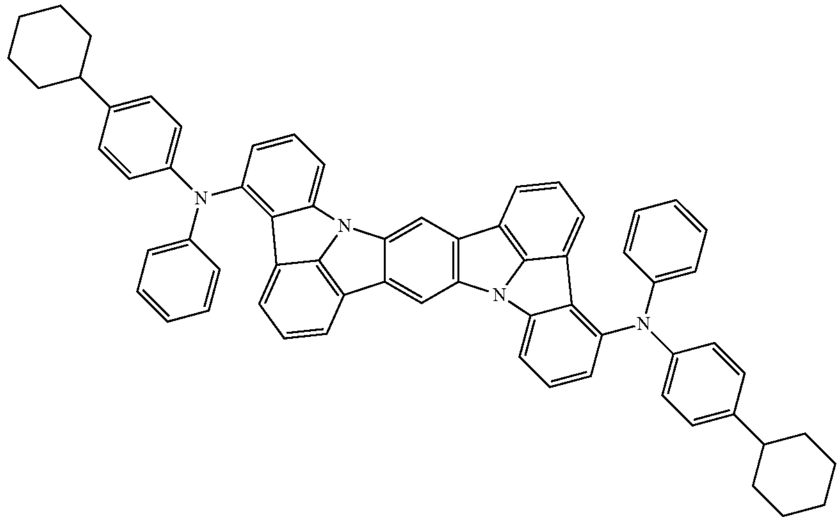
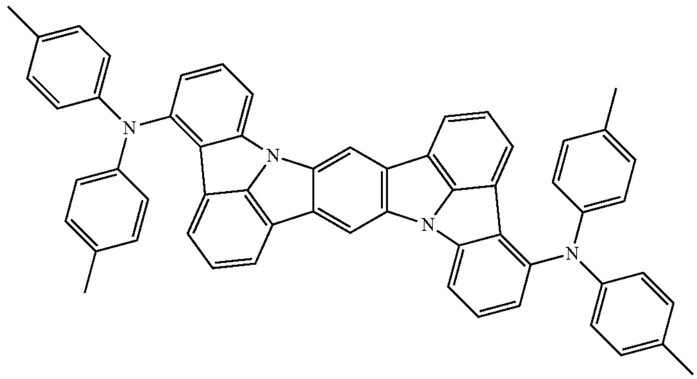

-continued
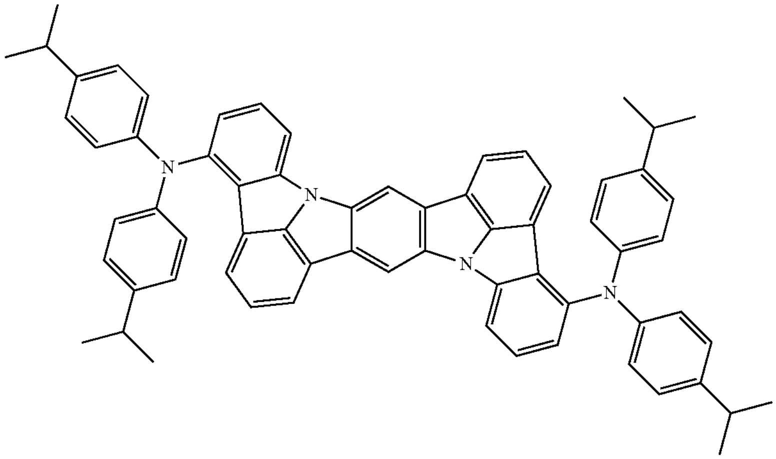
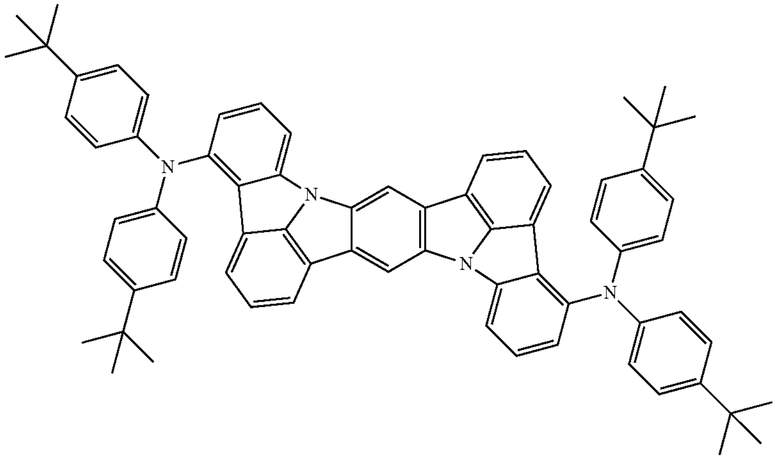
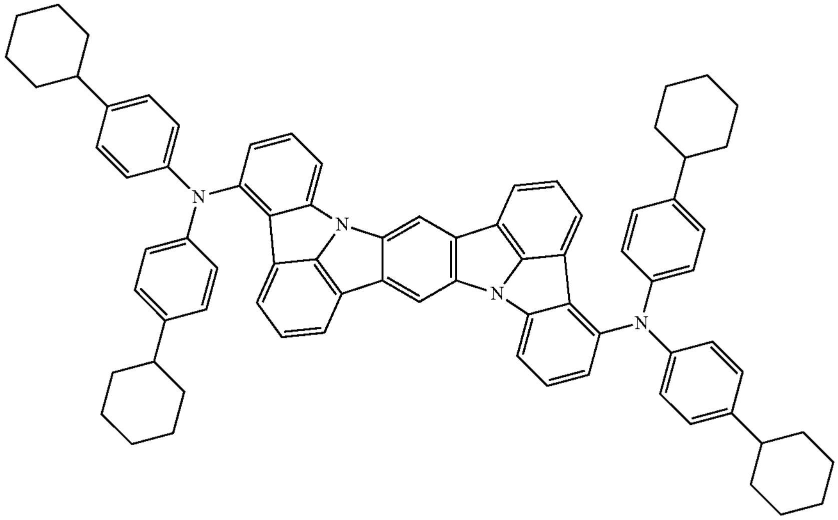

-continued
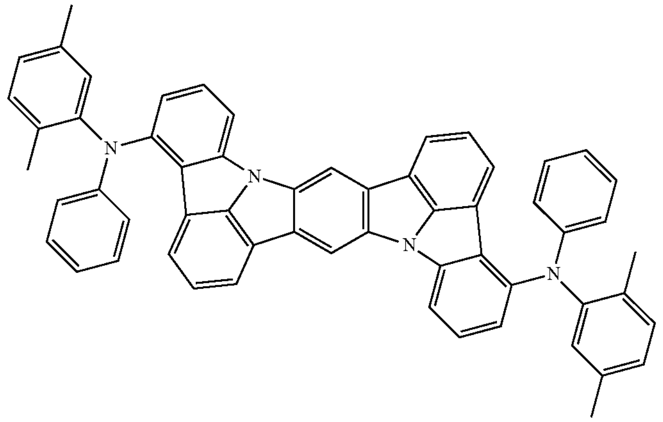
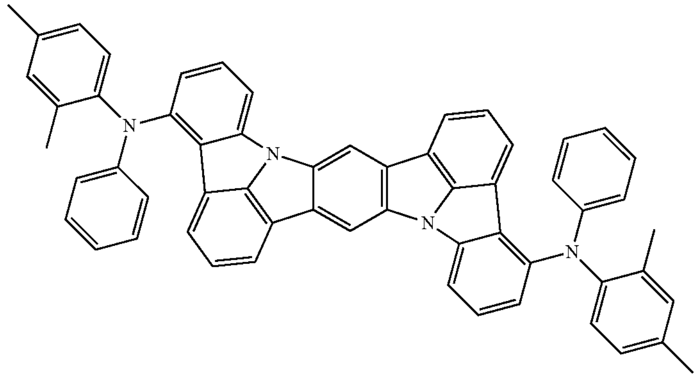
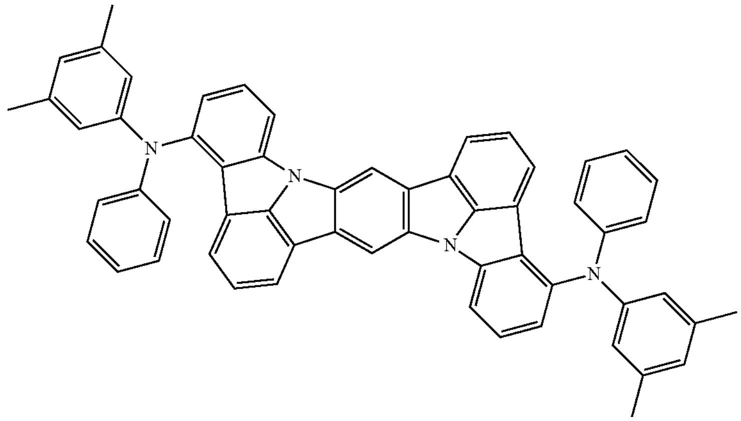
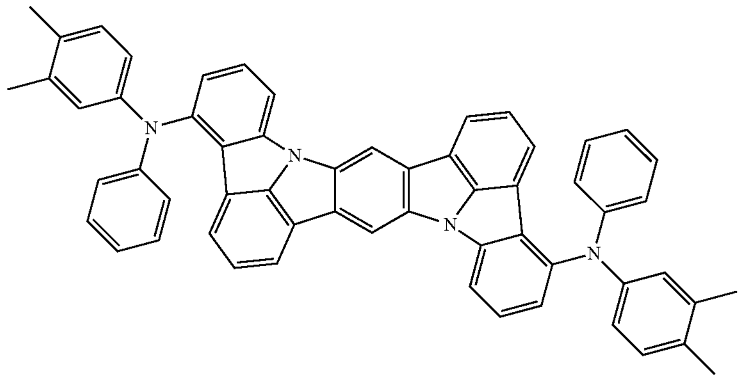

-continued
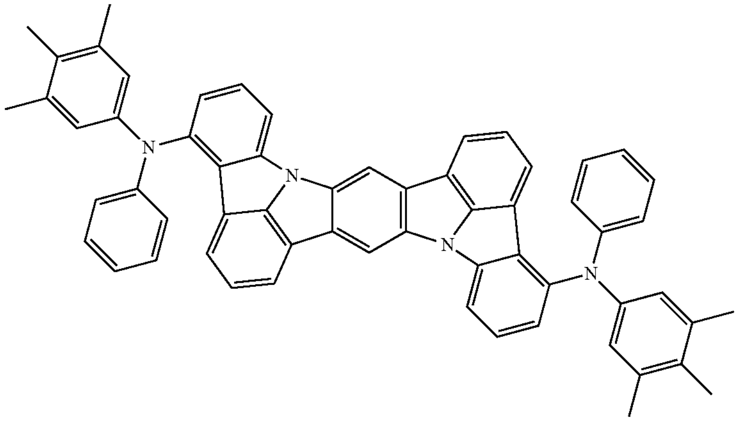
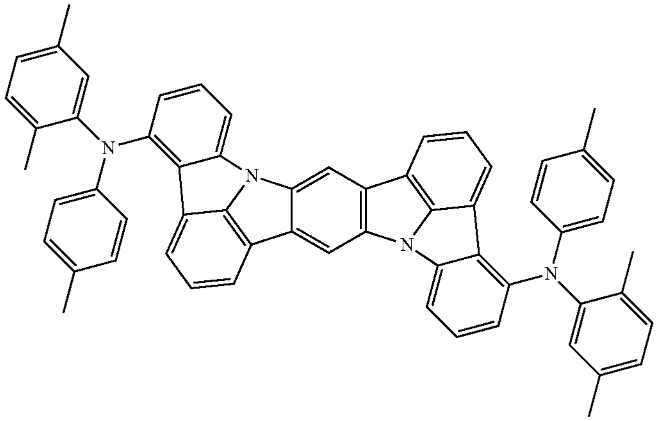
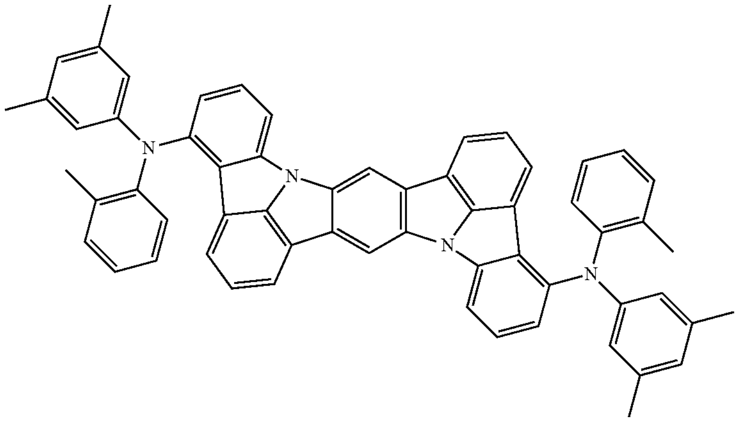
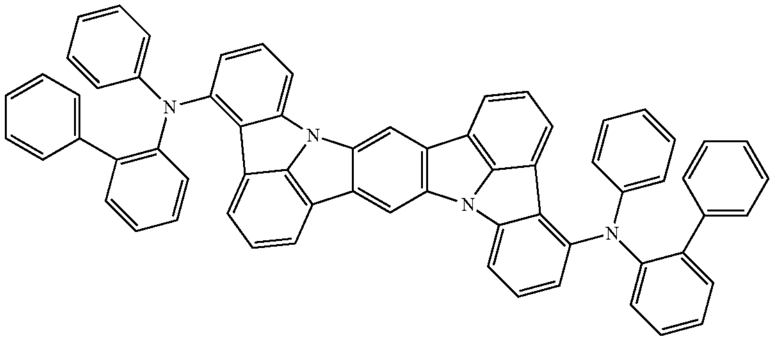

-continued
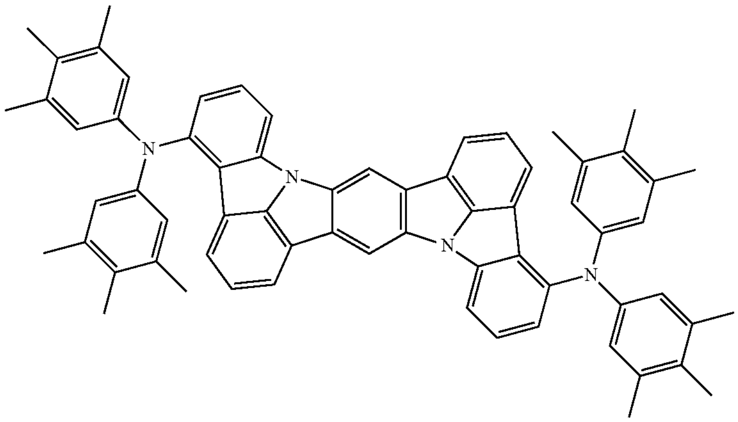
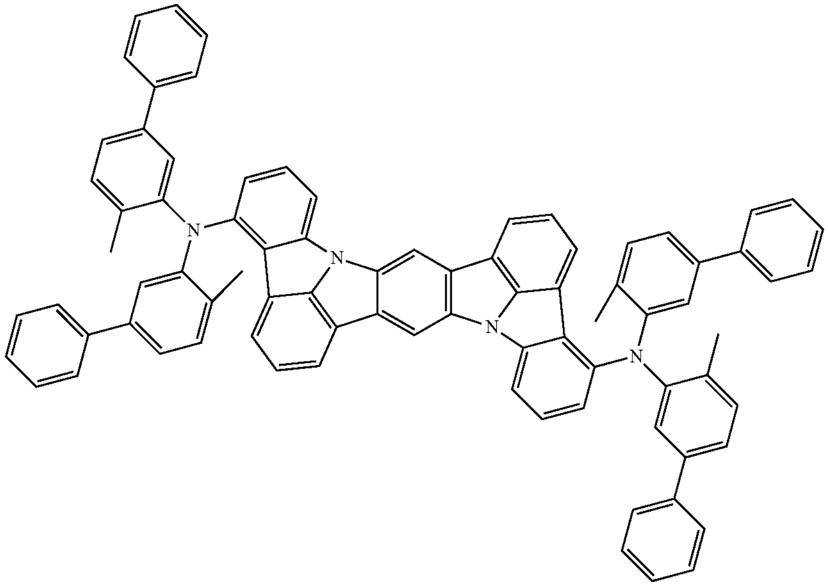
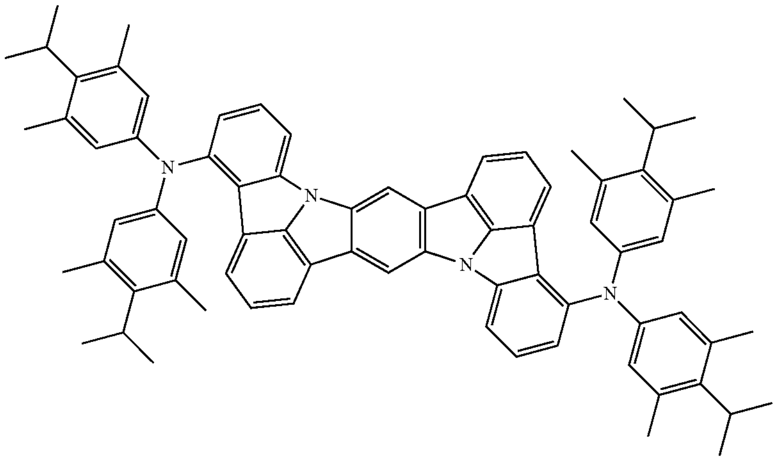

-continued
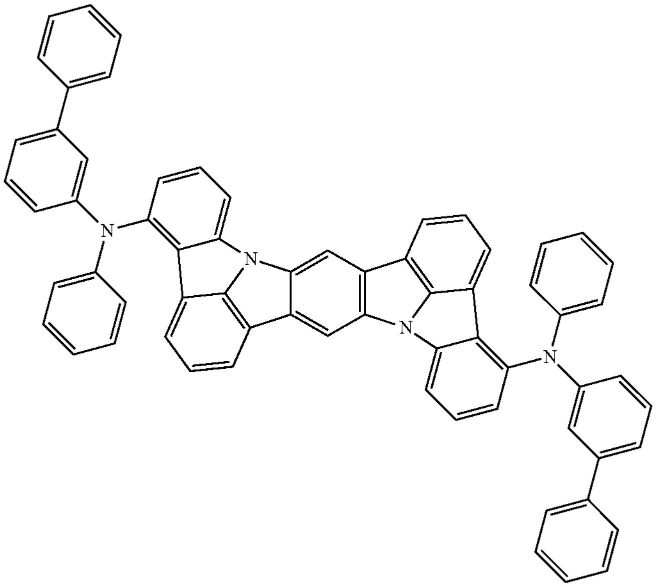
[Formula 187]
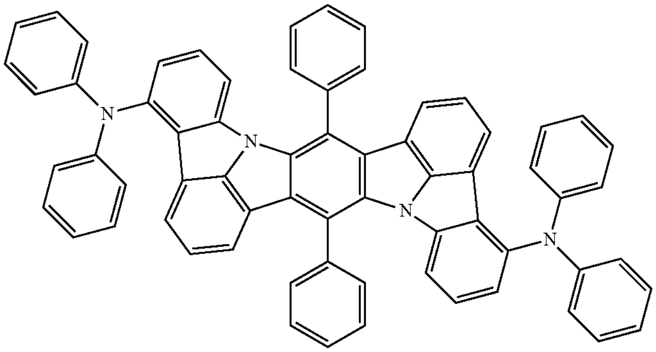
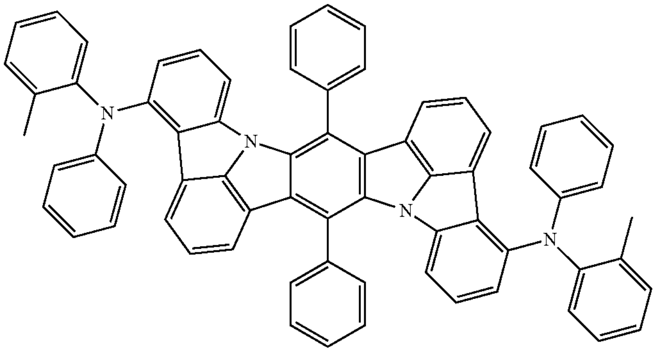

-continued
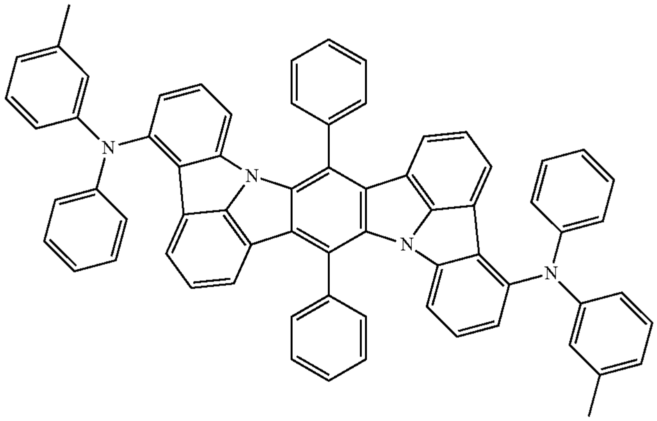
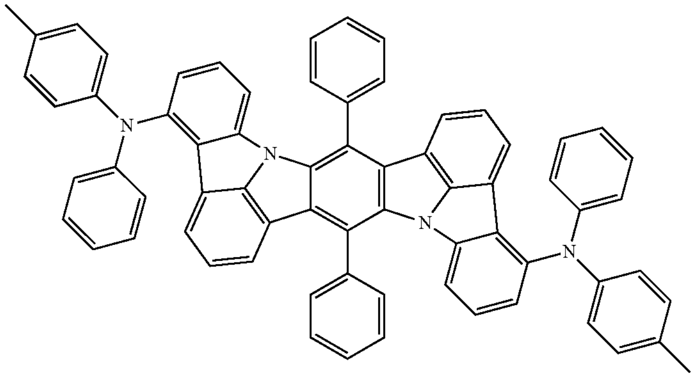
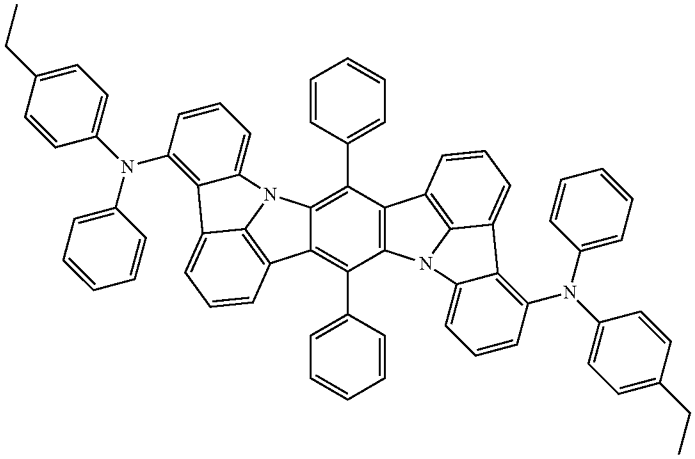
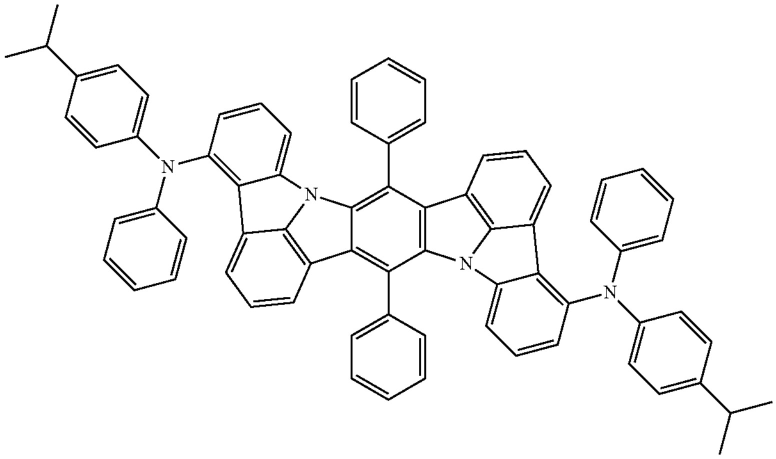

-continued
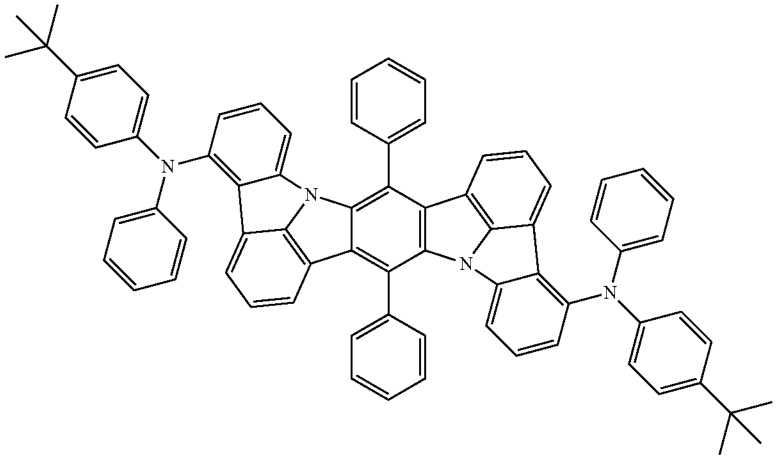
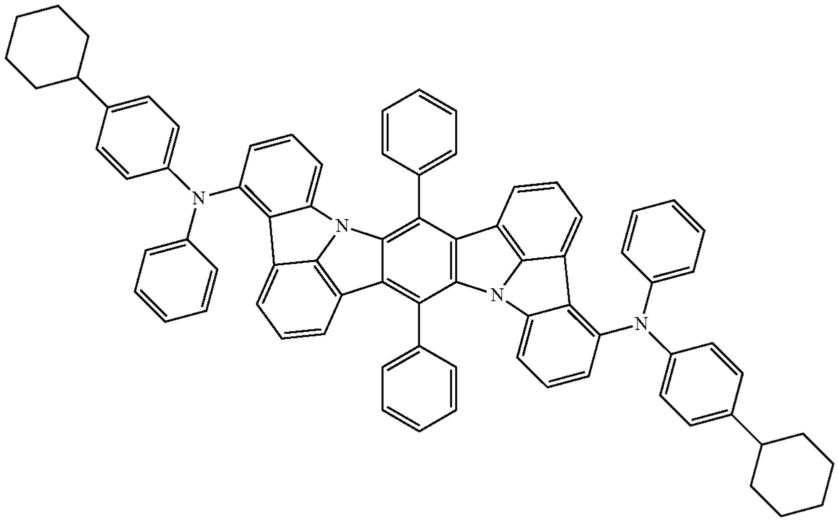
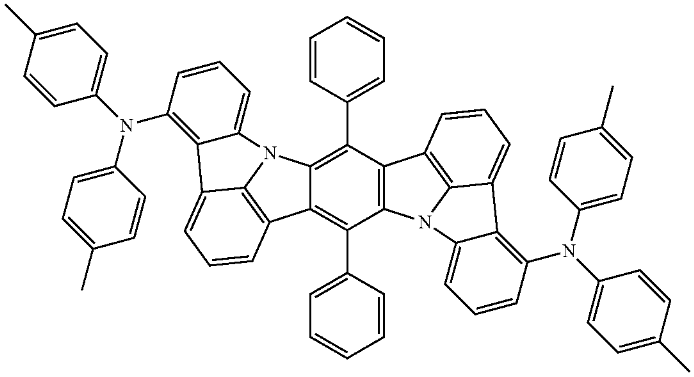

-continued
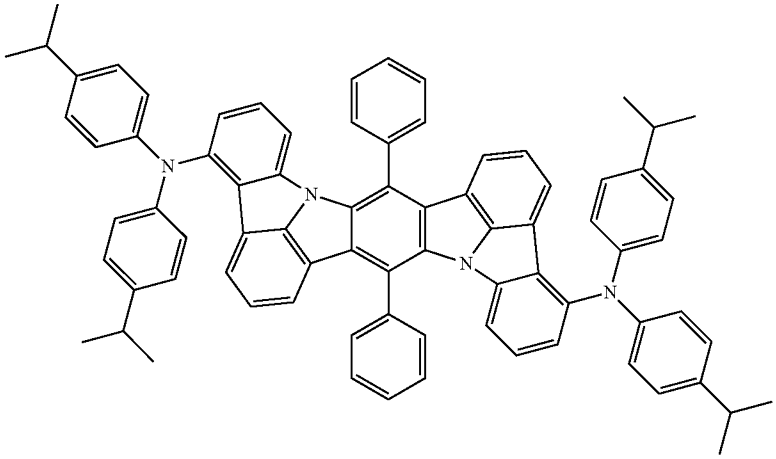
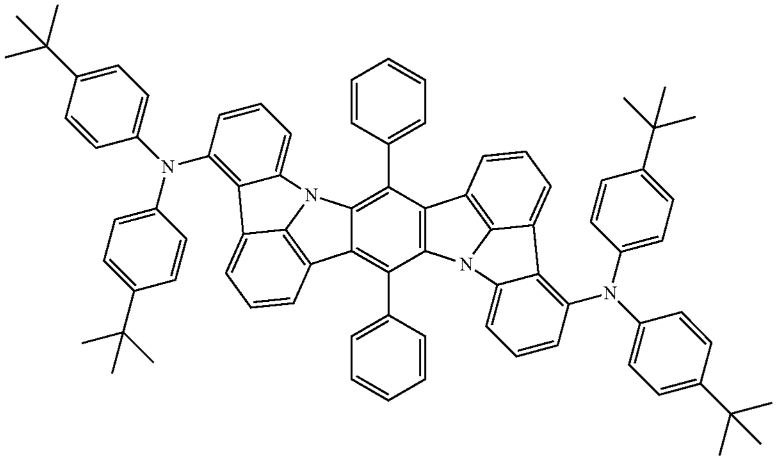
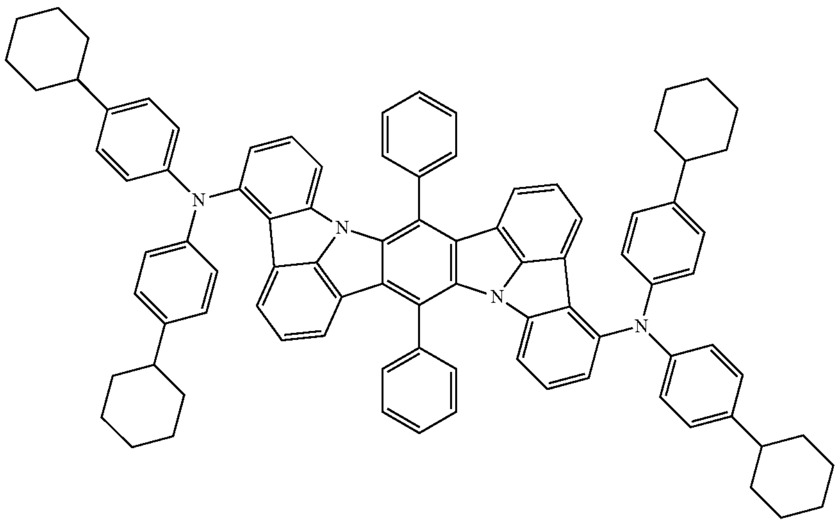

-continued
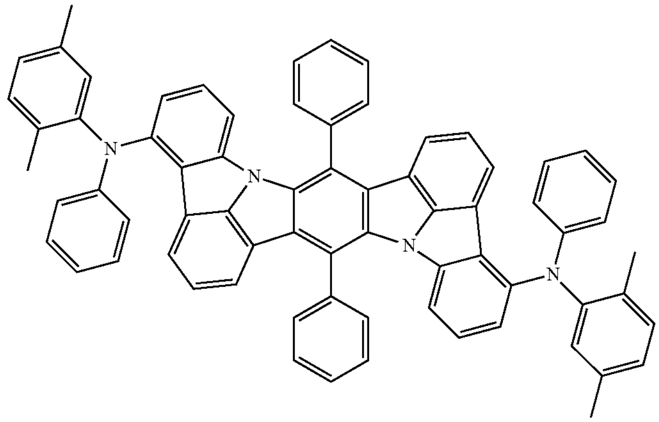
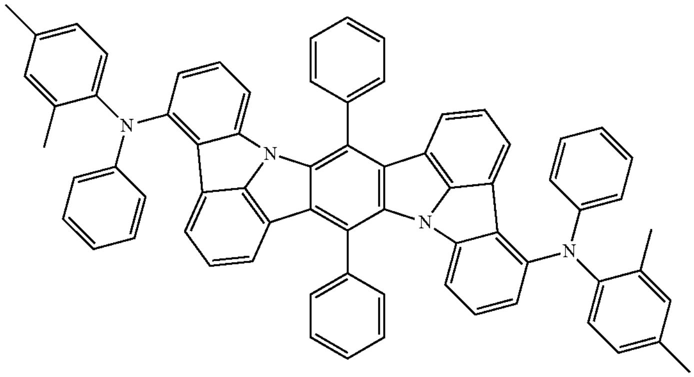
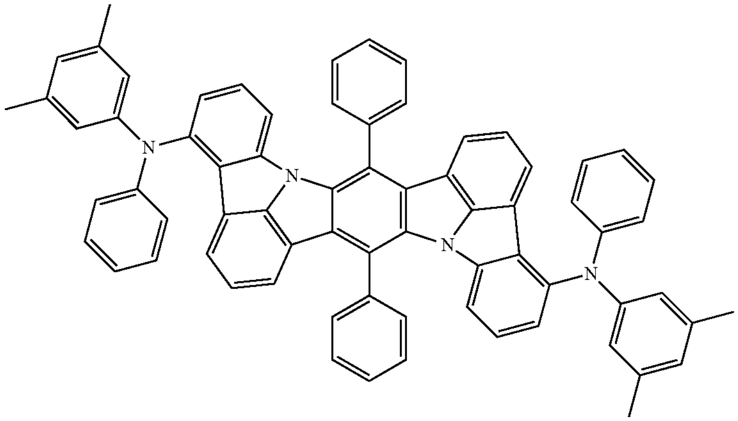
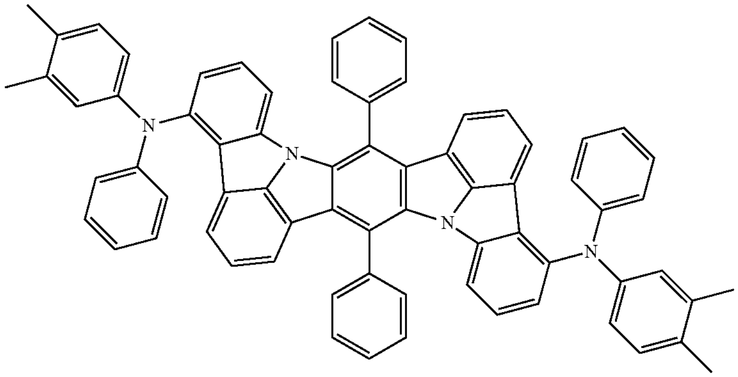

-continued
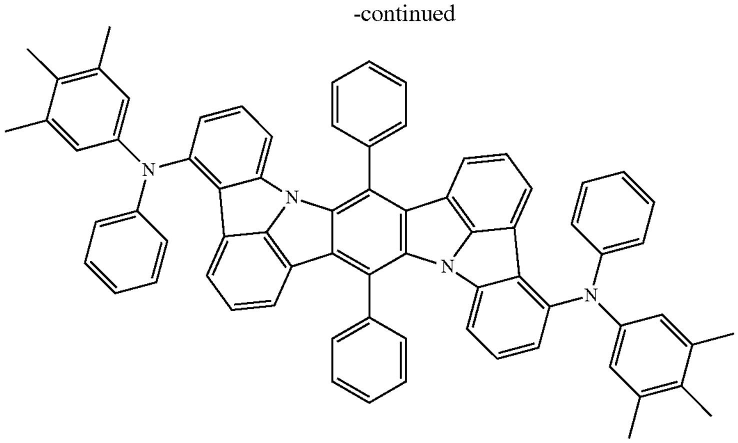
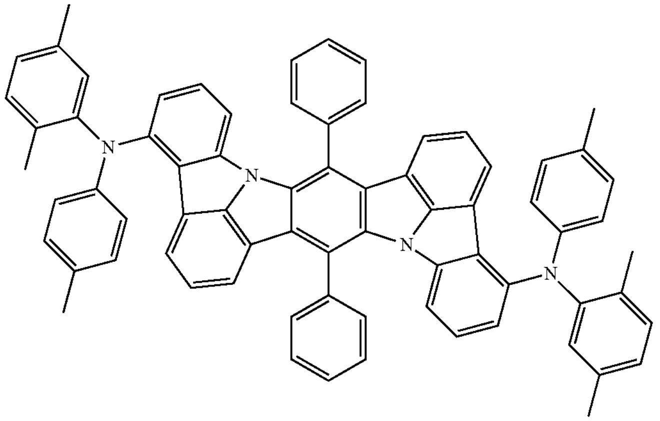
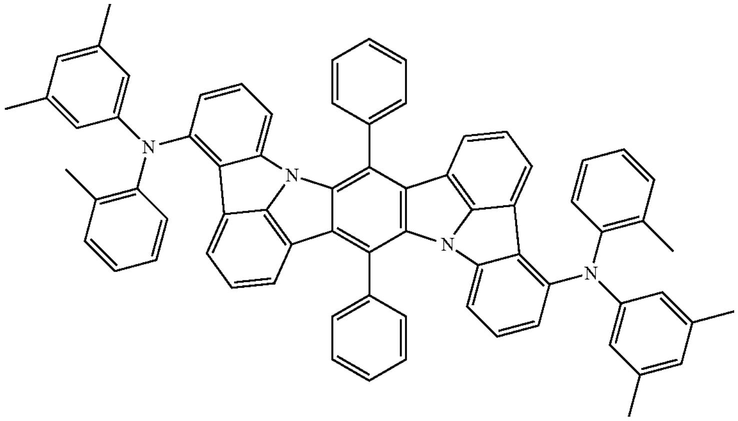
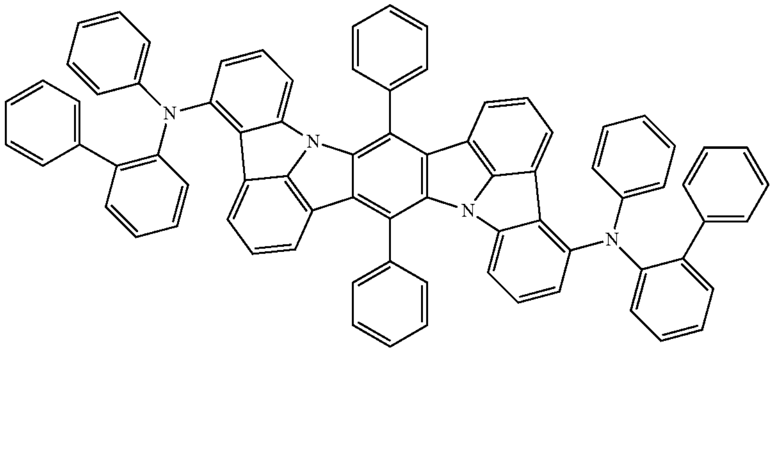

-continued
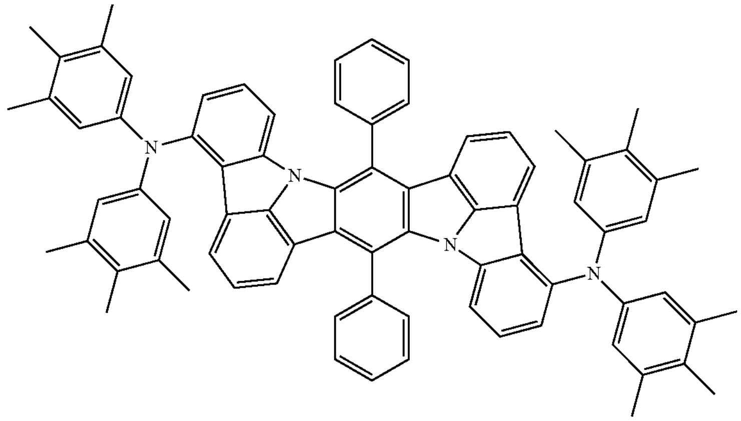
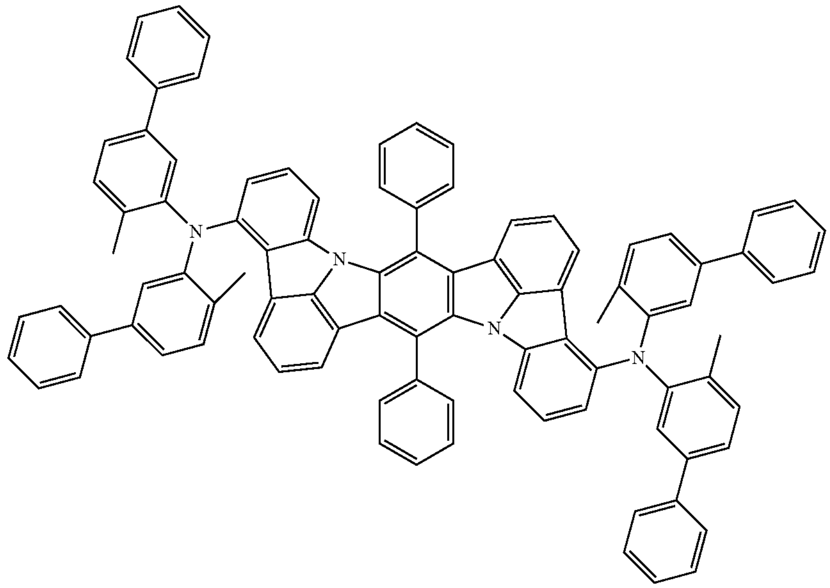
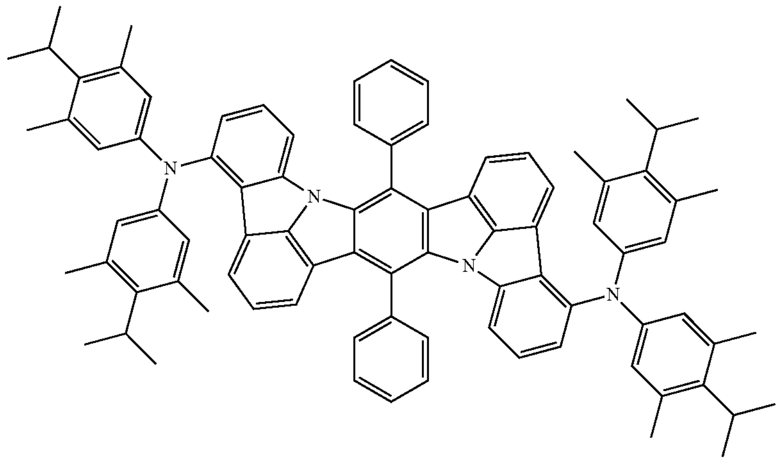

-continued
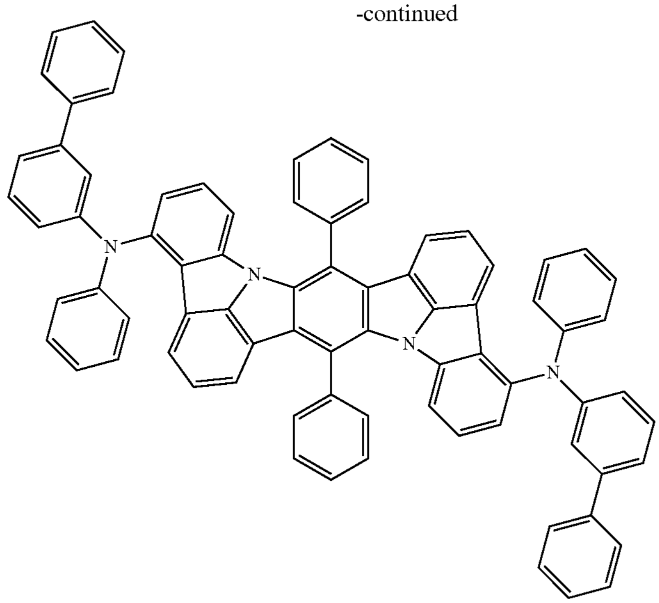
25
[Formula 188]
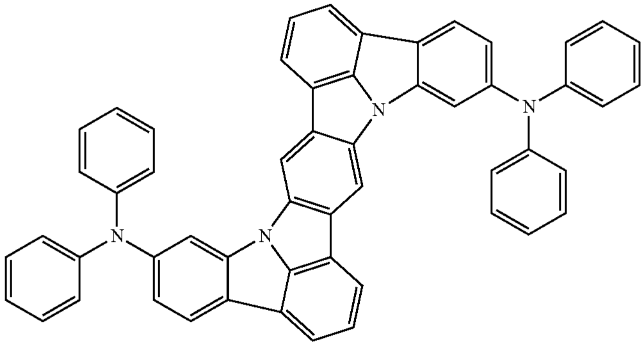
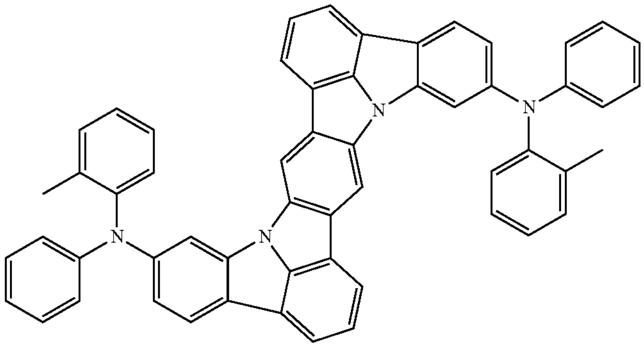

-continued
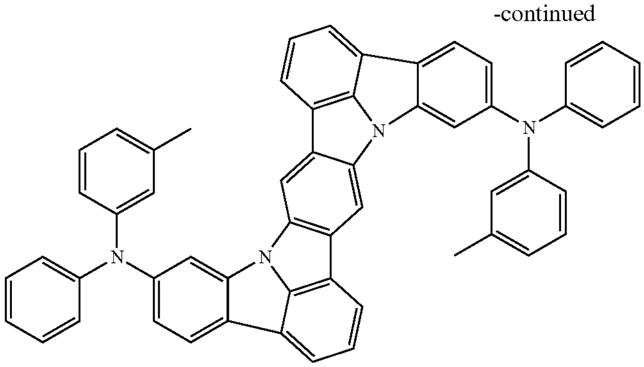
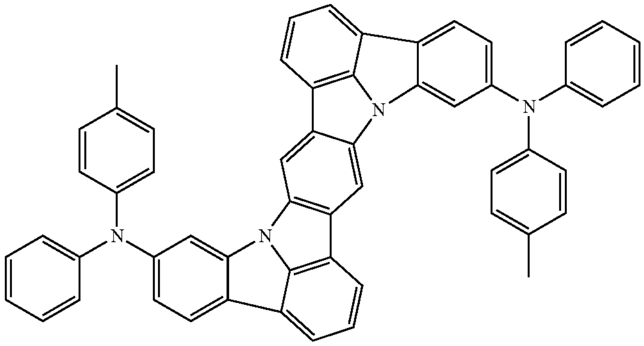
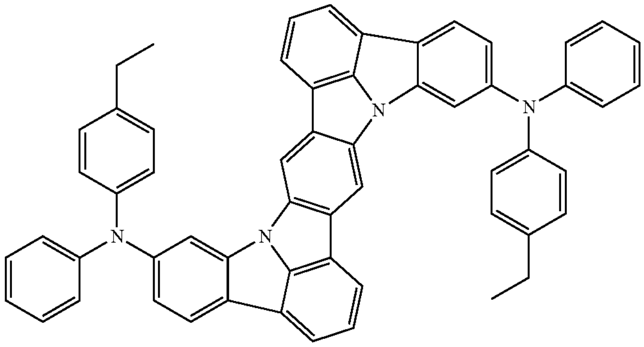
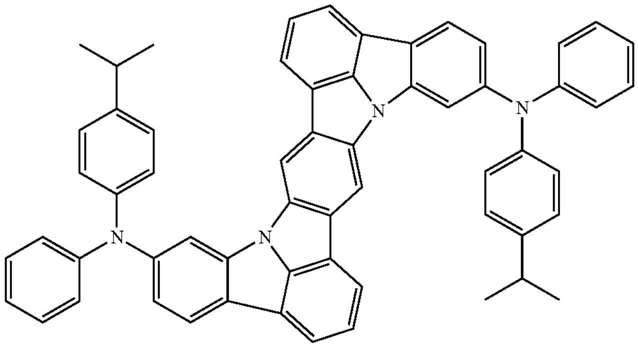
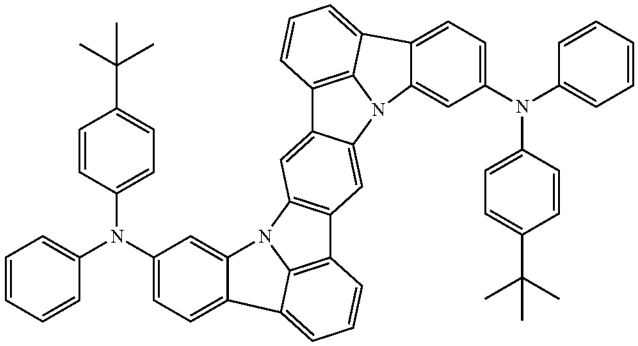

-continued
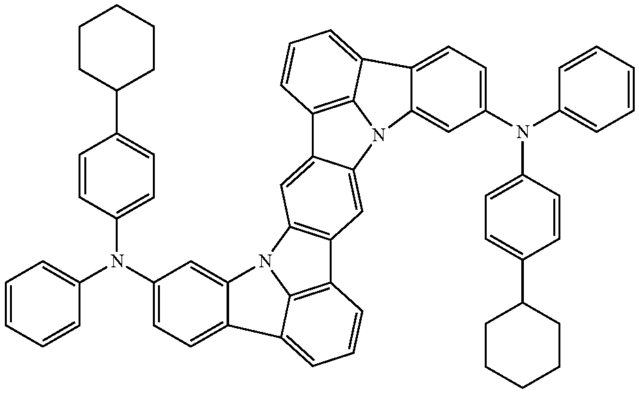
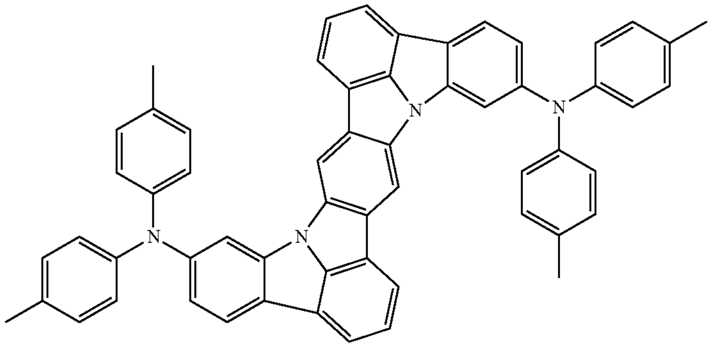
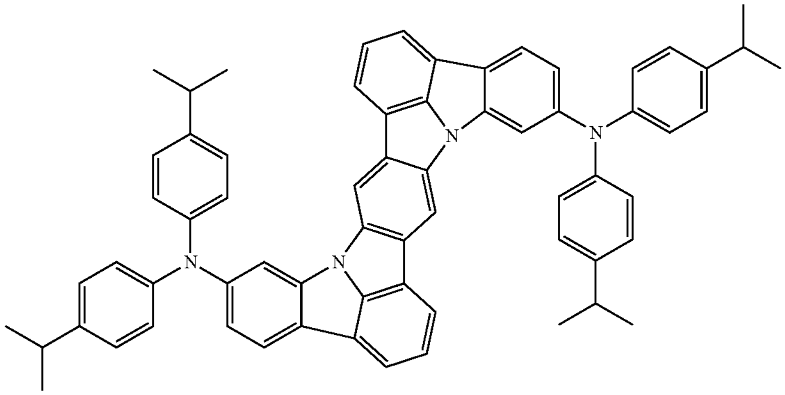
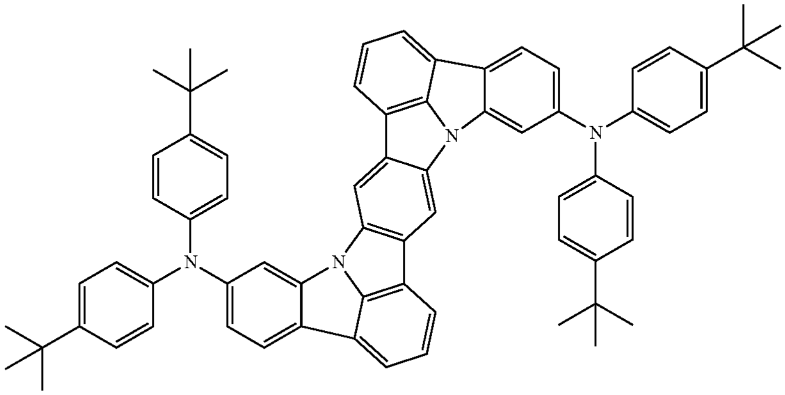 [SMILES: CC(C)(C)c1ccc(N(c2ccc(C(C)(C)C)cc2)c2ccc3c4cccc5c6cc7c(cc6n(c3c2)c45)c2cccc3c4ccc(N(c5ccc(C(C)(C)C)cc5)c5ccc(C(C)(C)C)cc5)cc4n7c32)cc1]

-continued
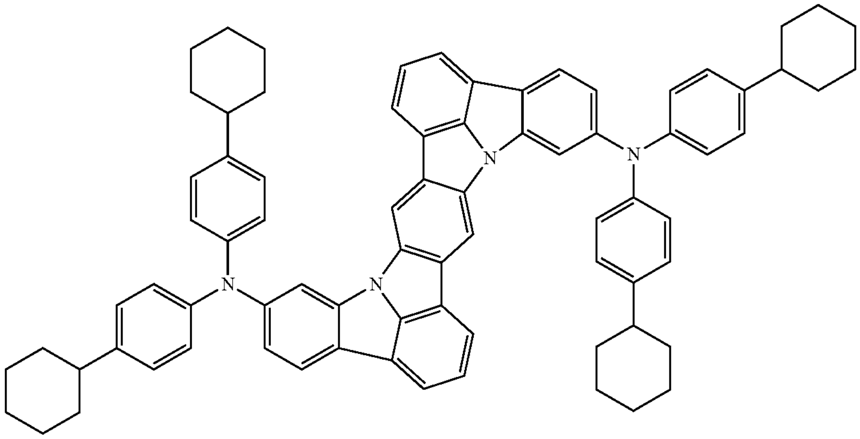
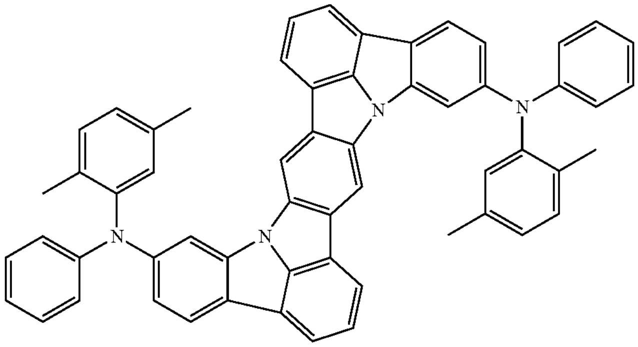
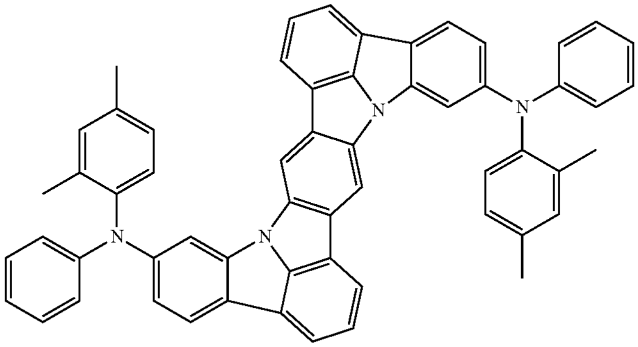
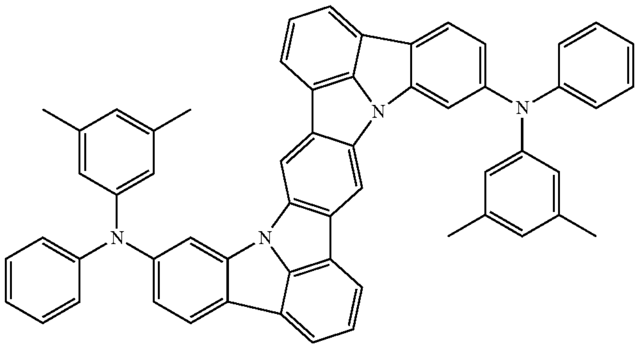

-continued
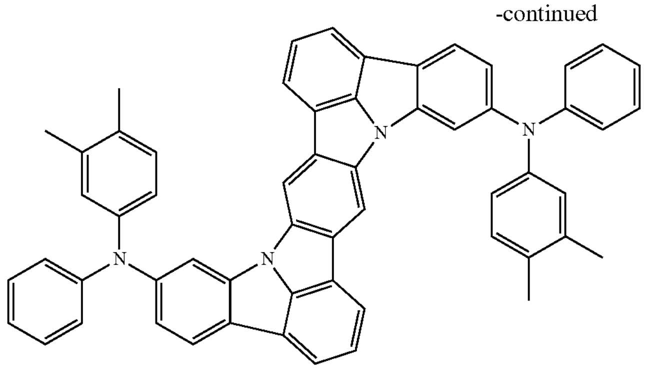
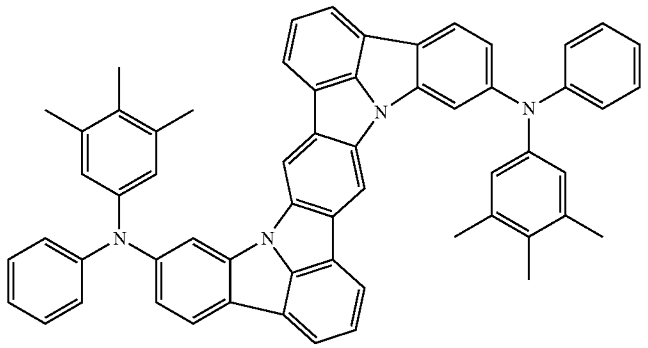
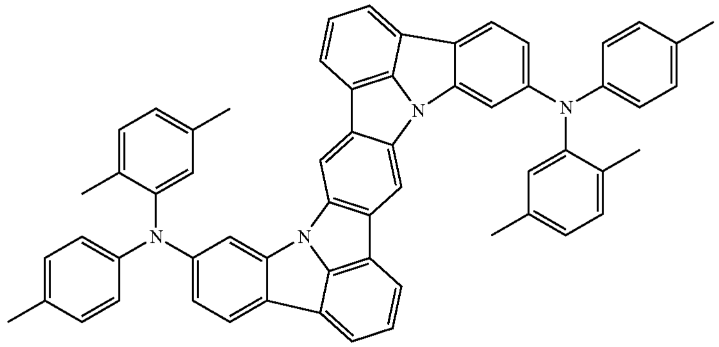
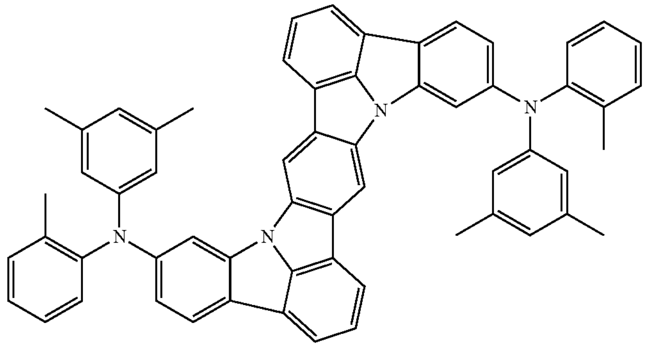
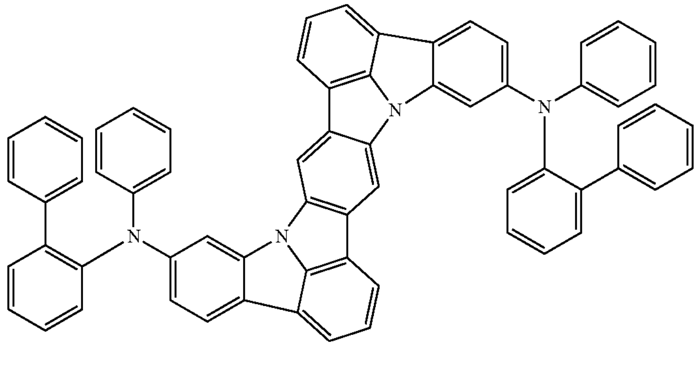

-continued
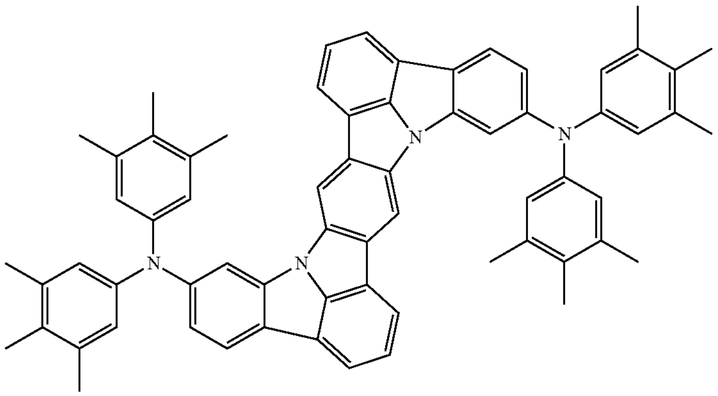
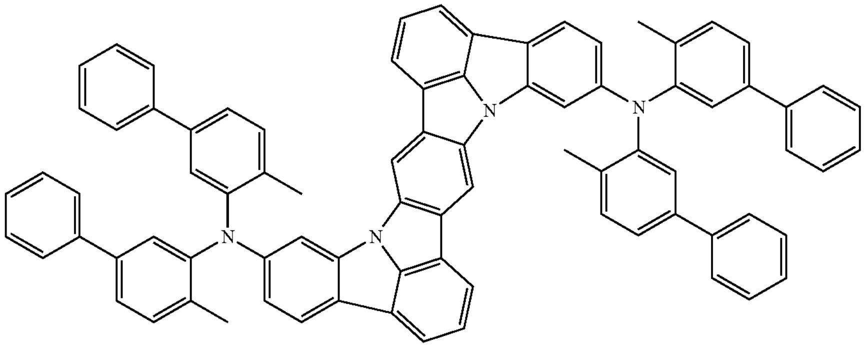
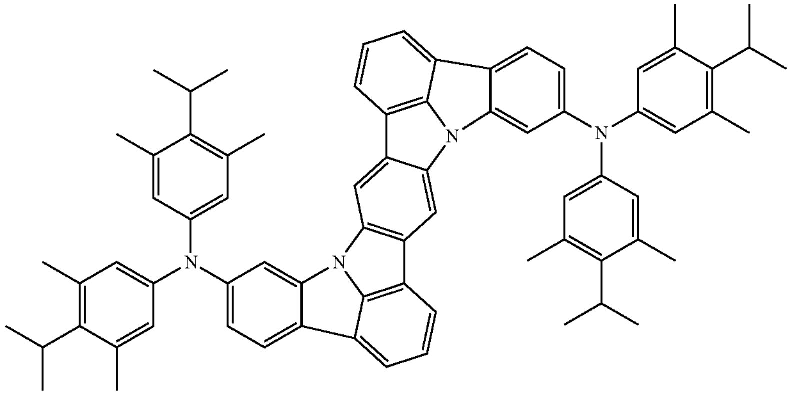
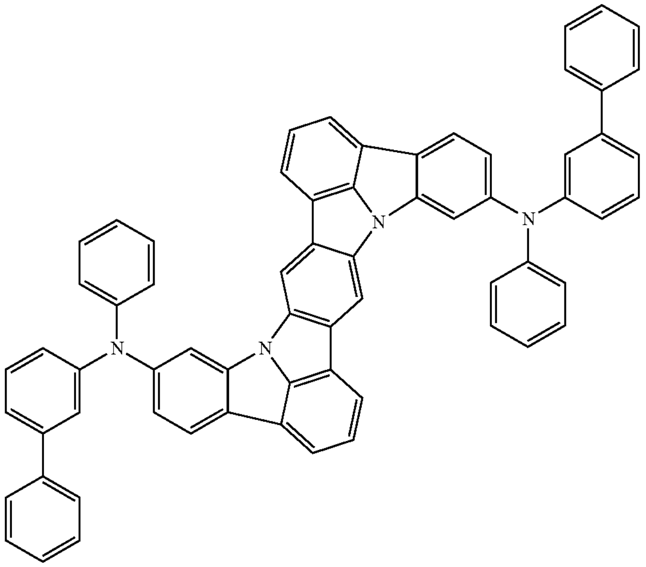

-continued
[Formula 189]
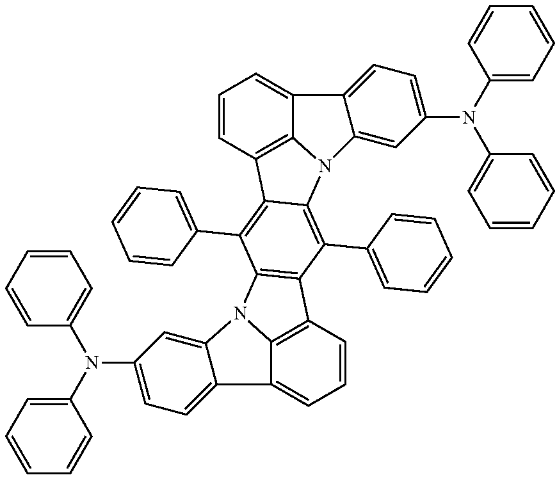
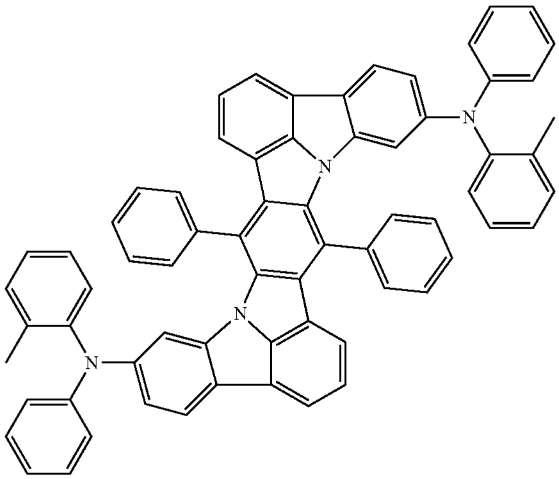
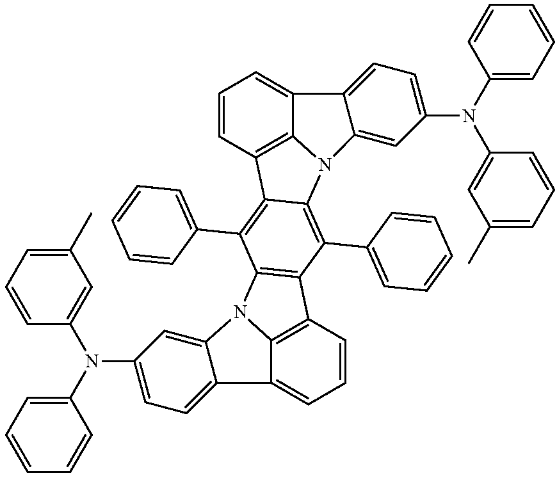

-continued
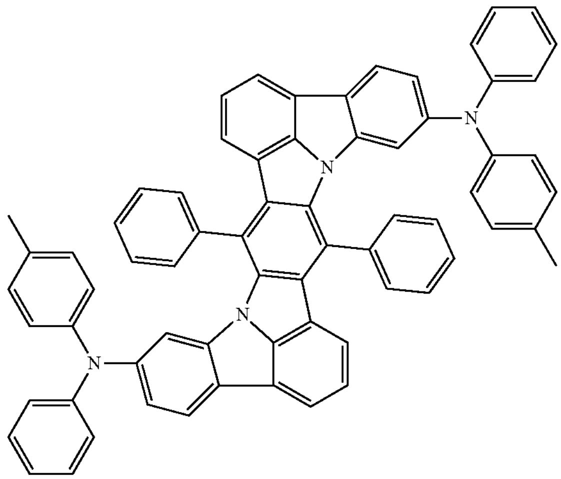
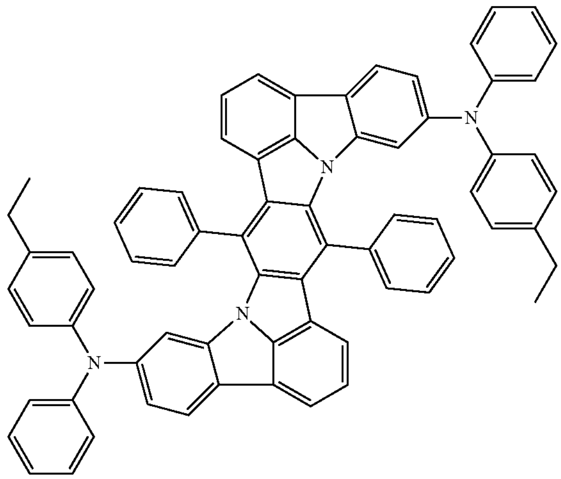
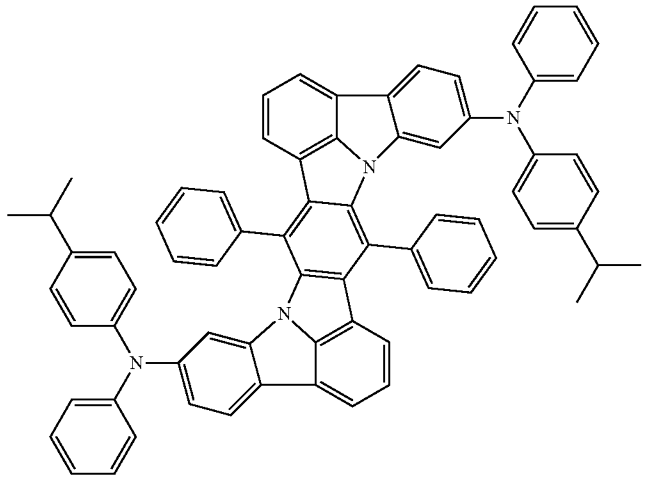

-continued
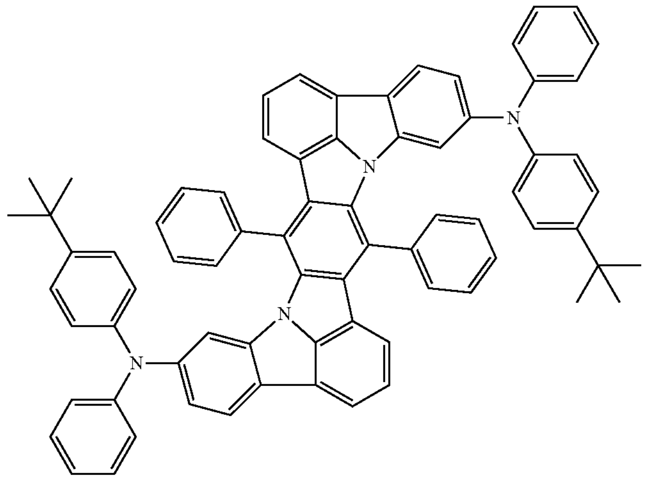
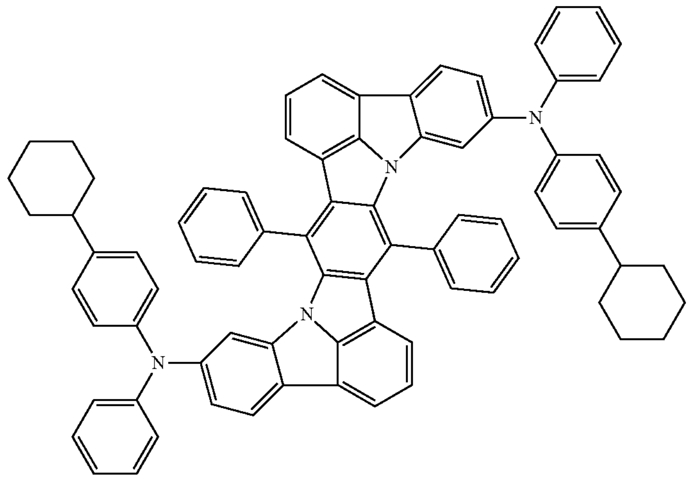
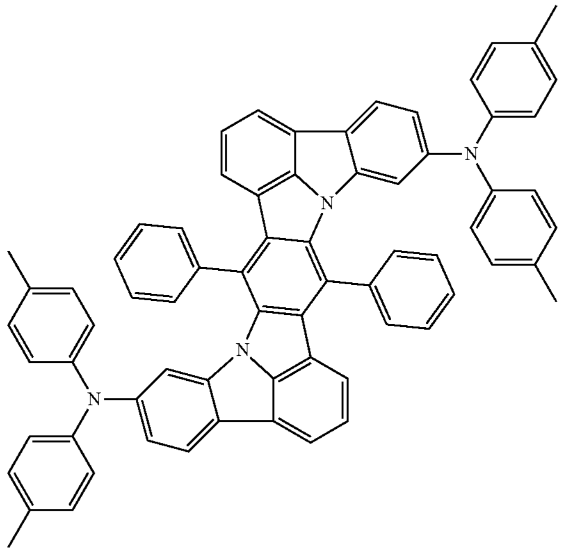

-continued
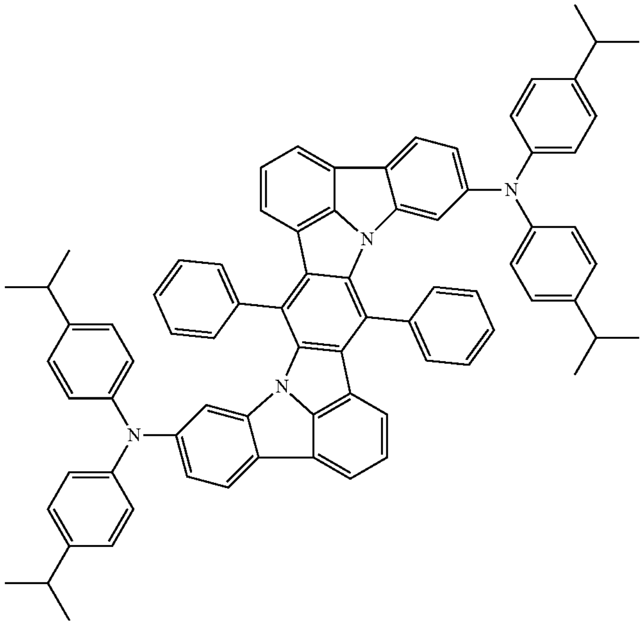
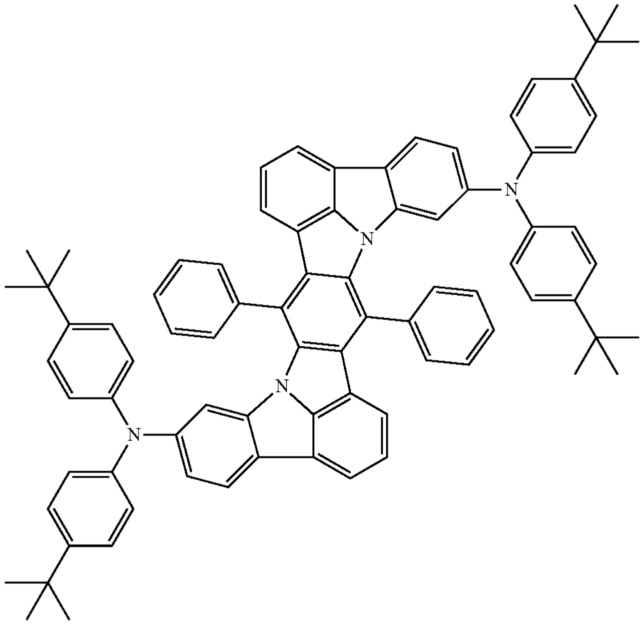

-continued
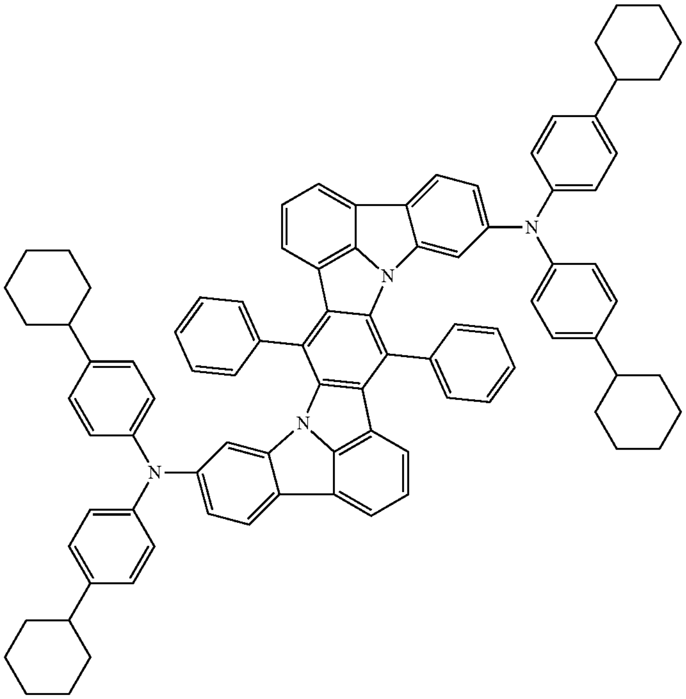
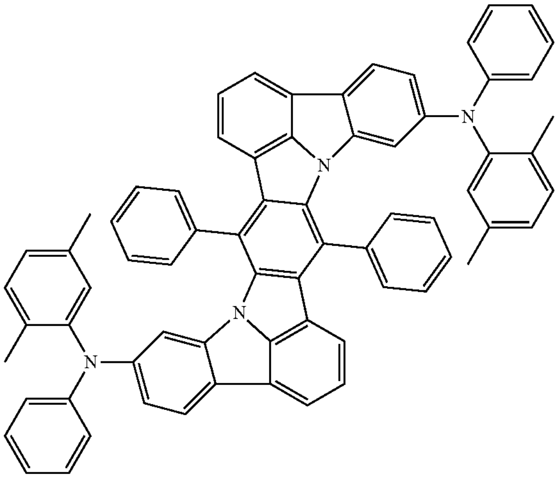
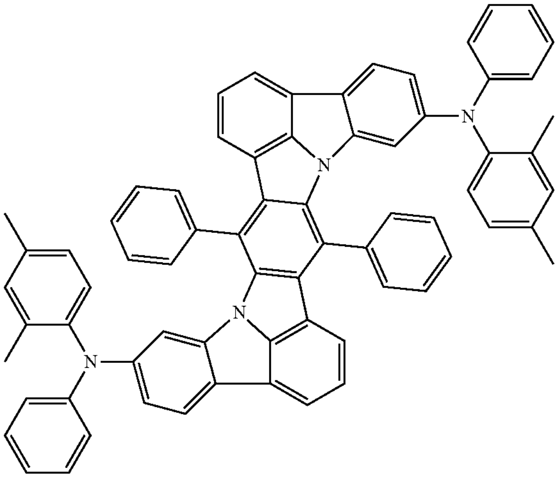

-continued
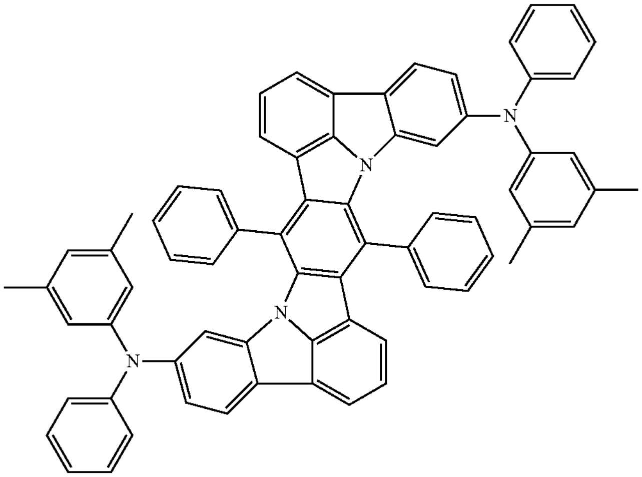
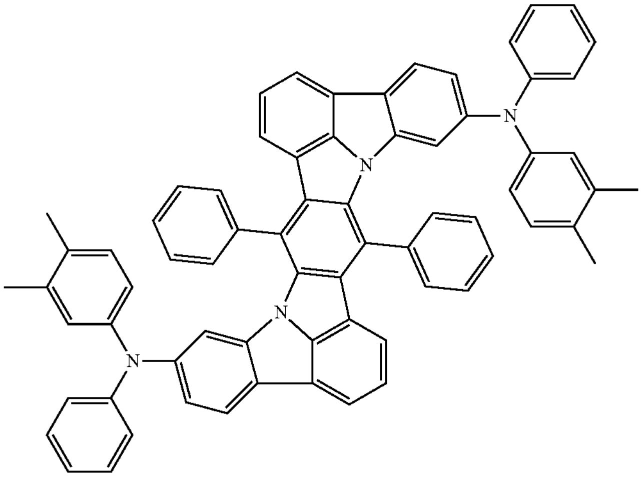
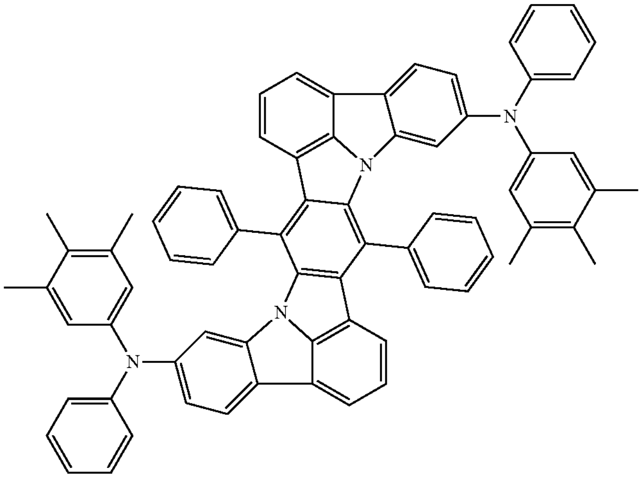

-continued
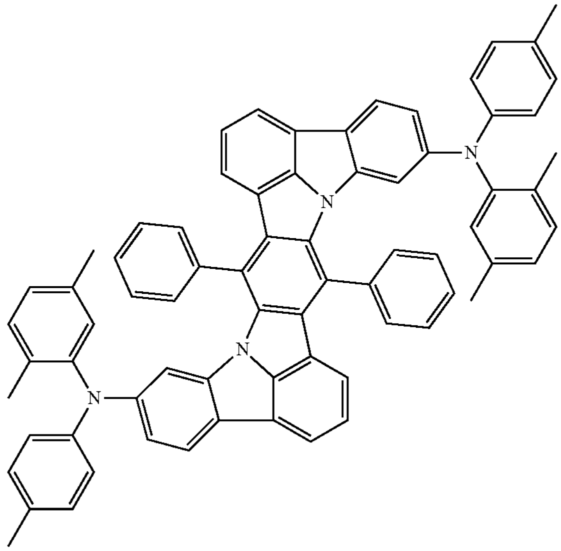
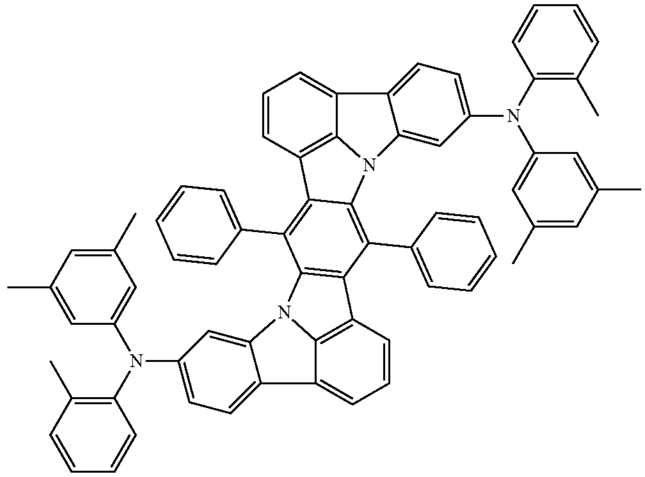
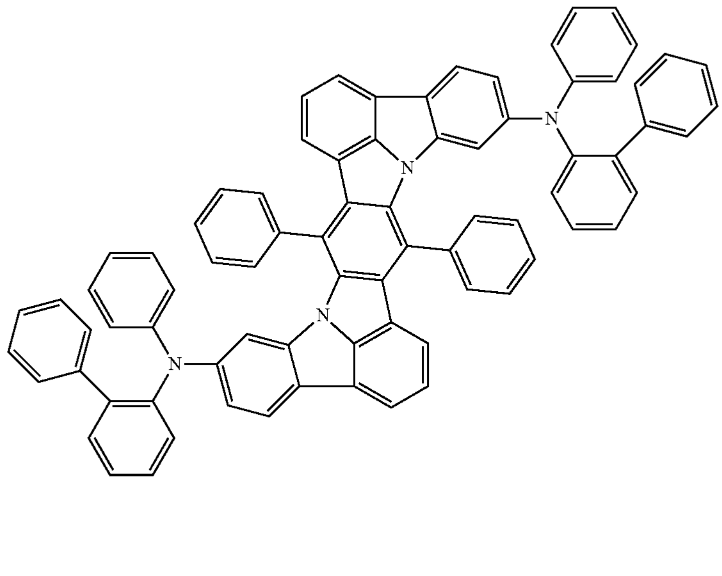

-continued
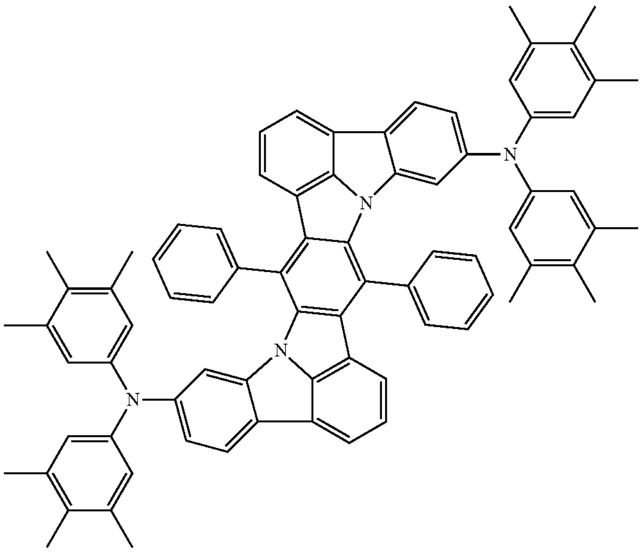
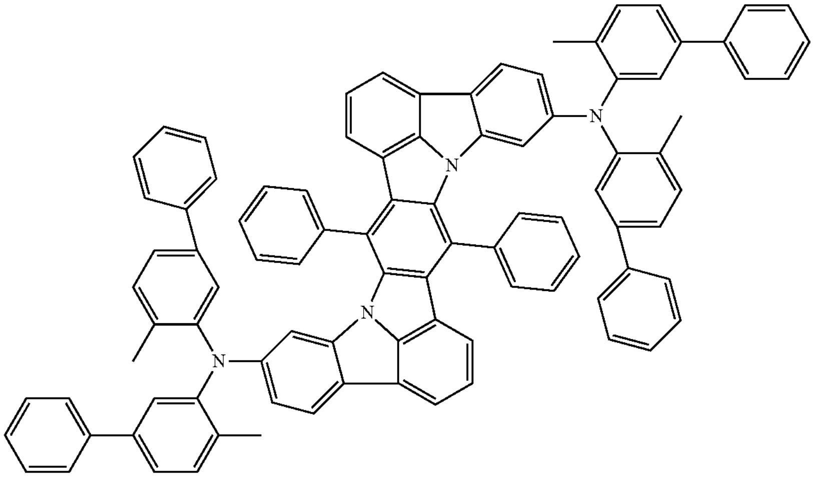
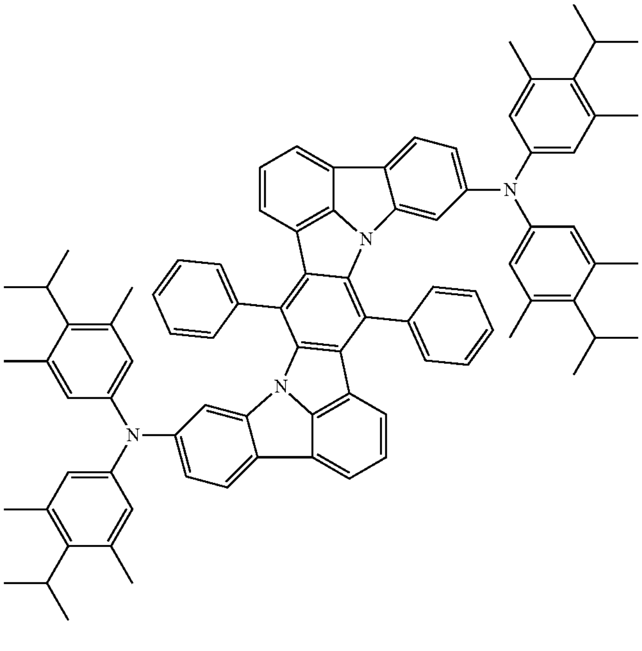

-continued
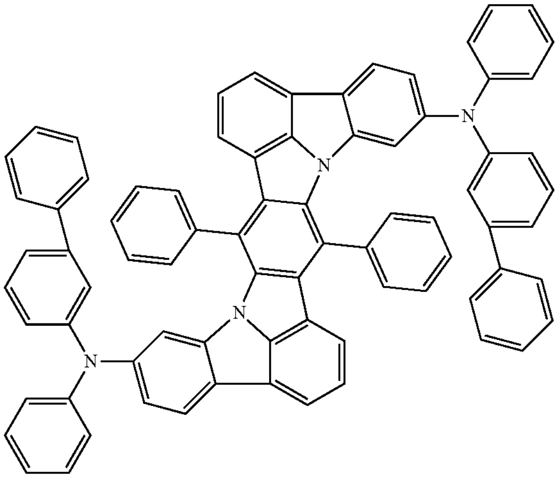
[Formula 190]
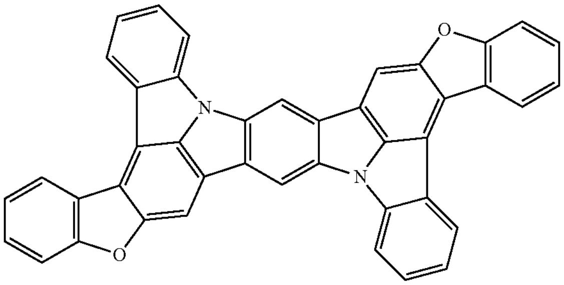
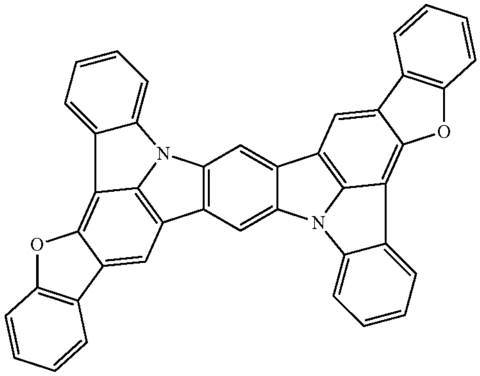
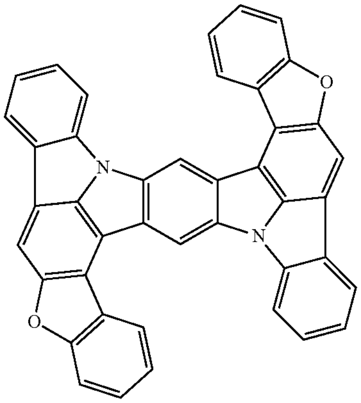
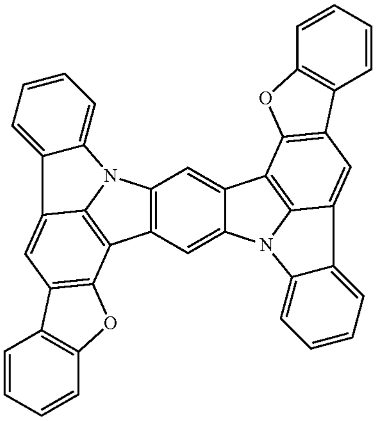
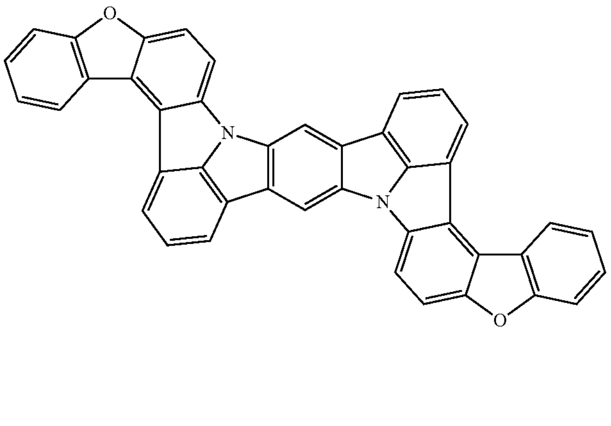

-continued
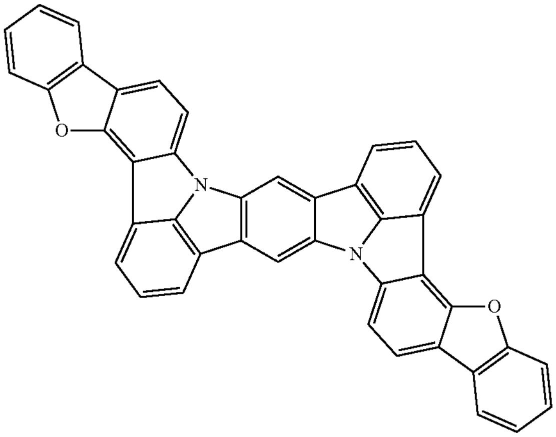
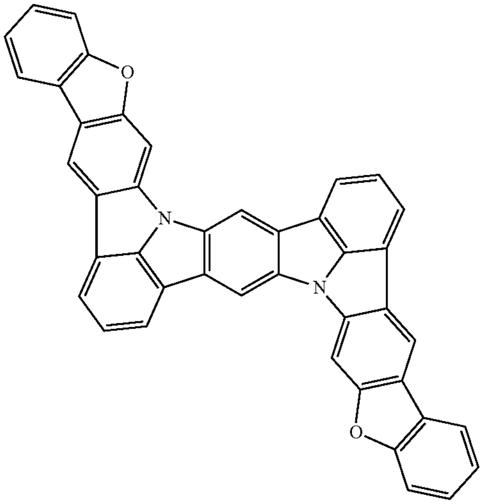
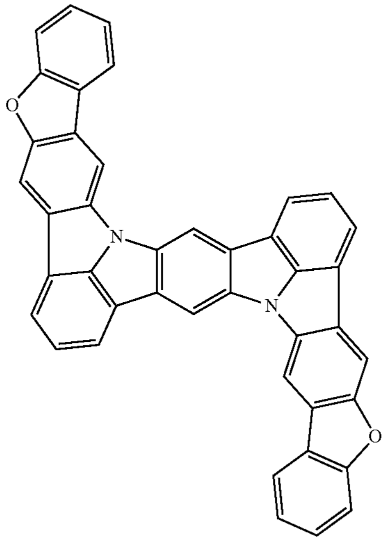
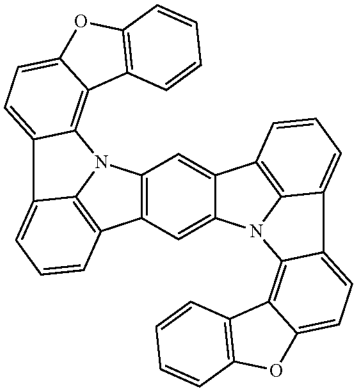
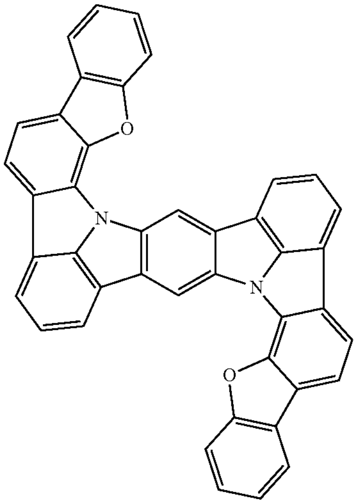
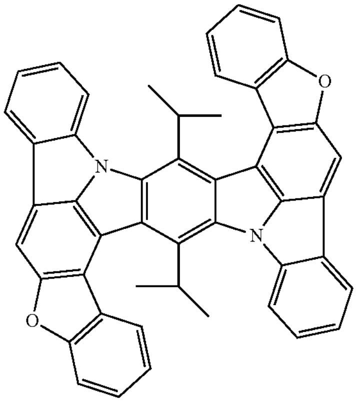
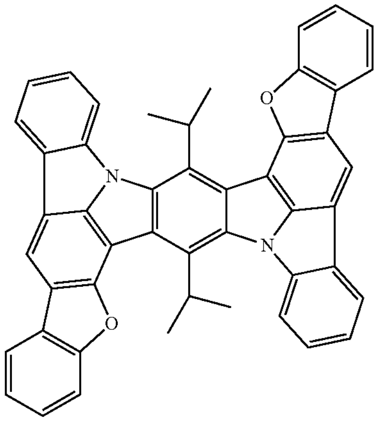

-continued
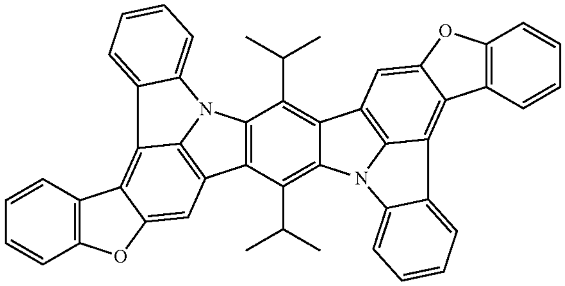
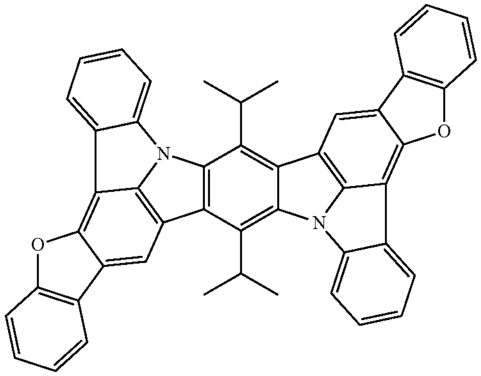
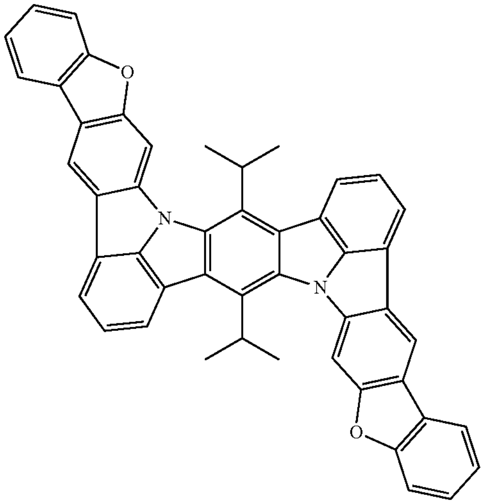
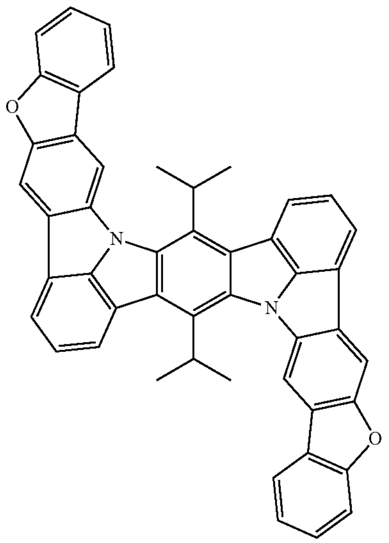
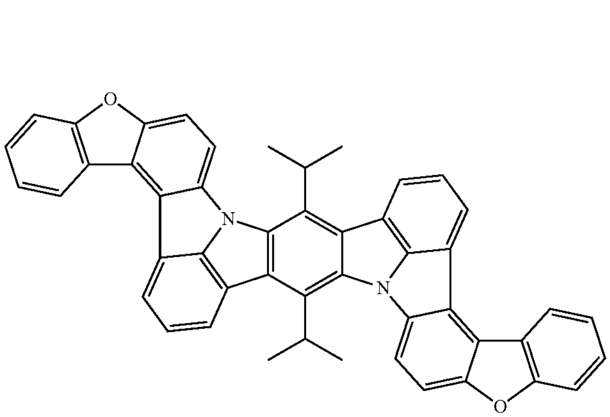

-continued
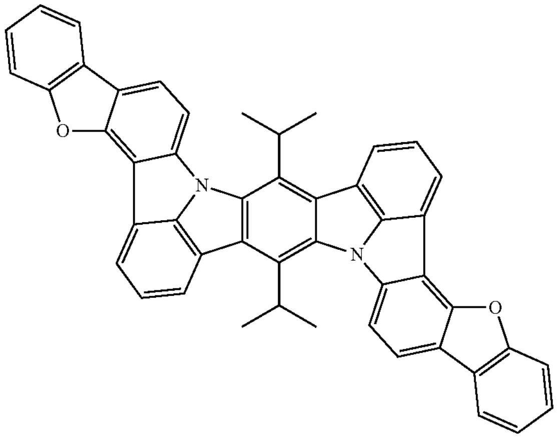
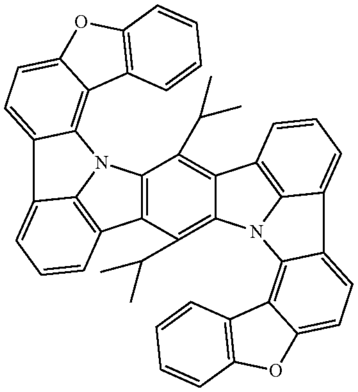
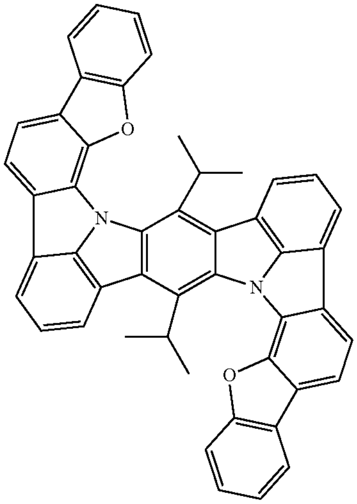
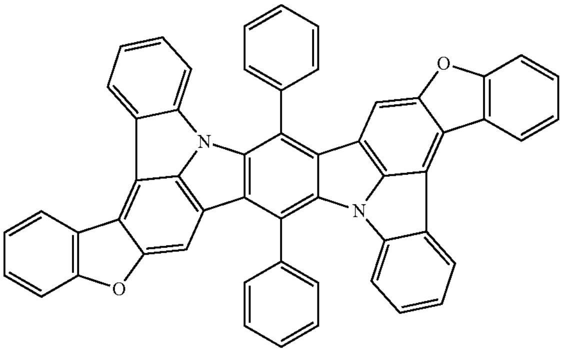
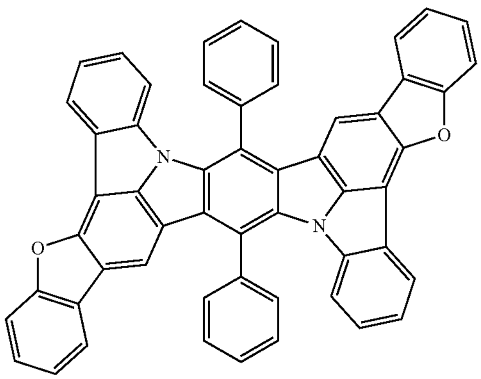
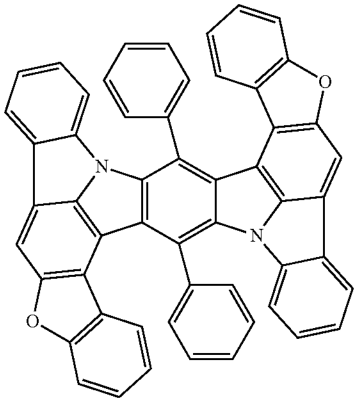

-continued
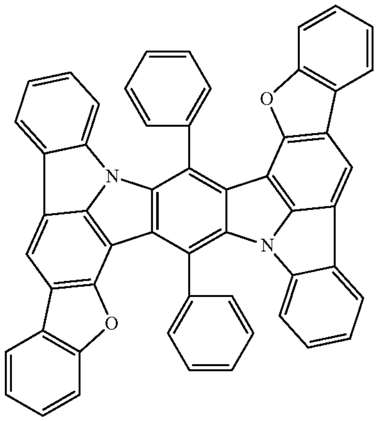
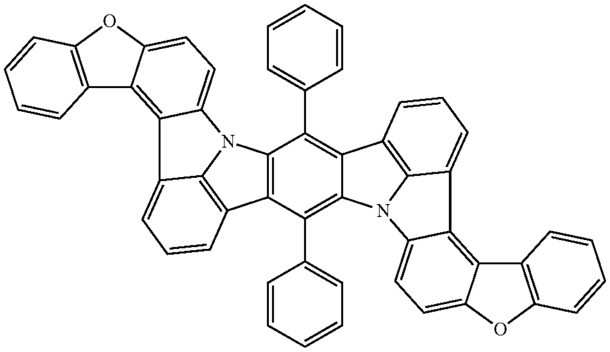
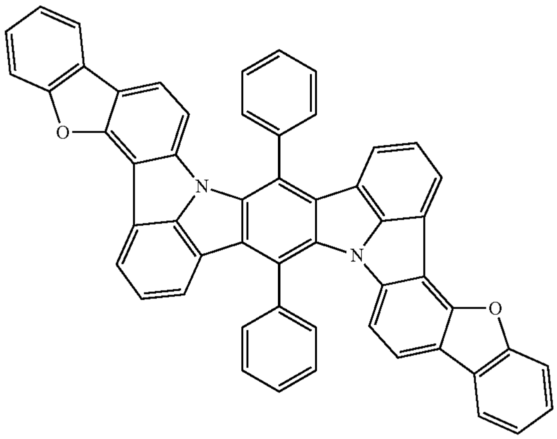
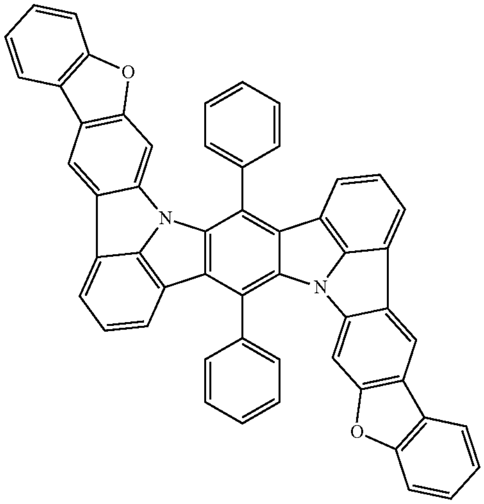
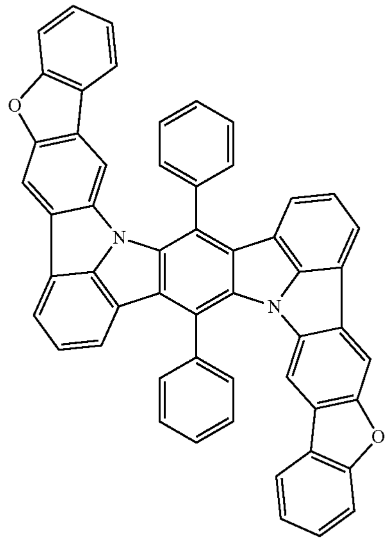

-continued
[Formula 191]
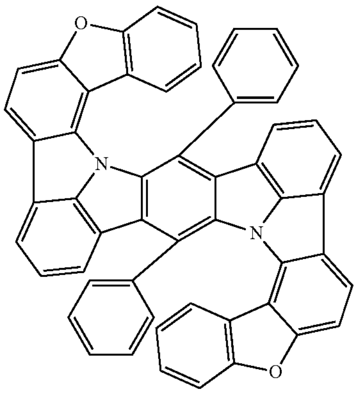
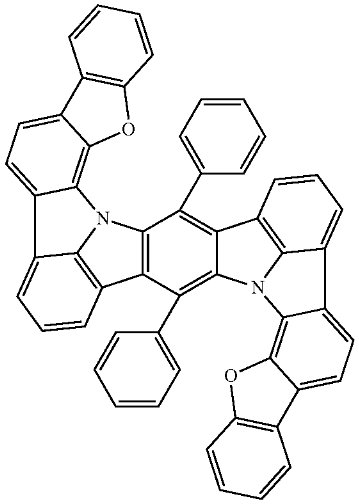
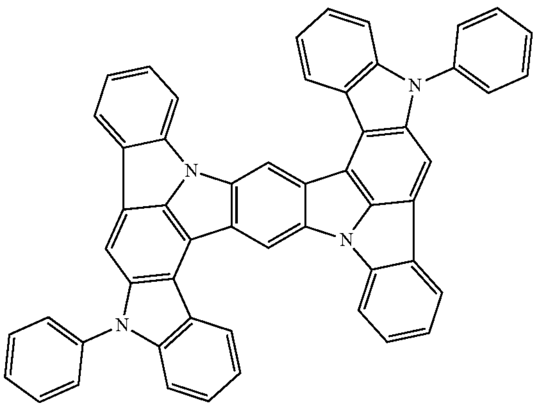
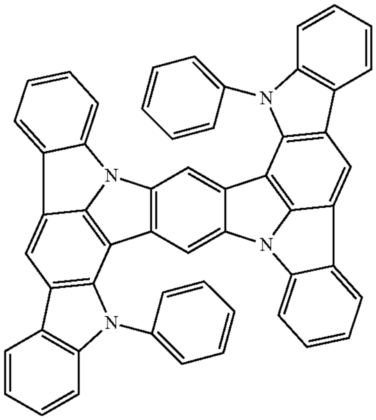
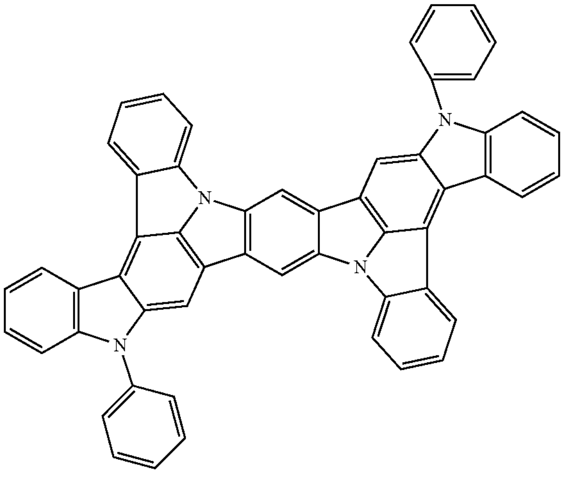

-continued
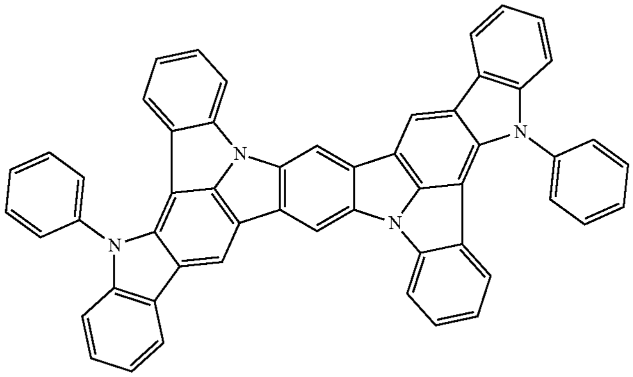
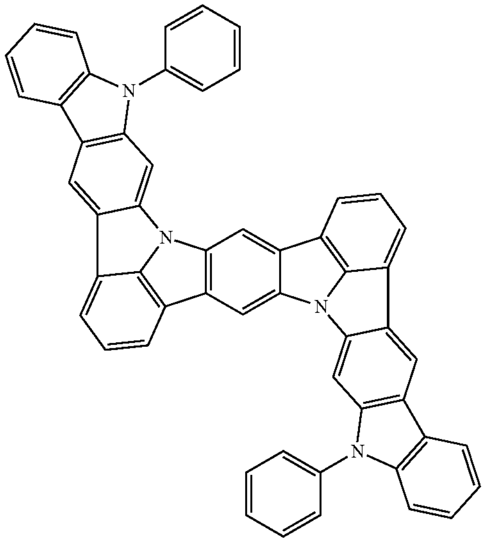
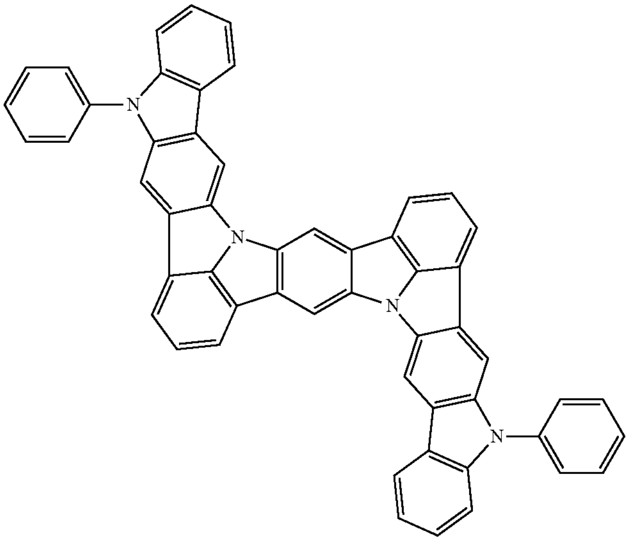
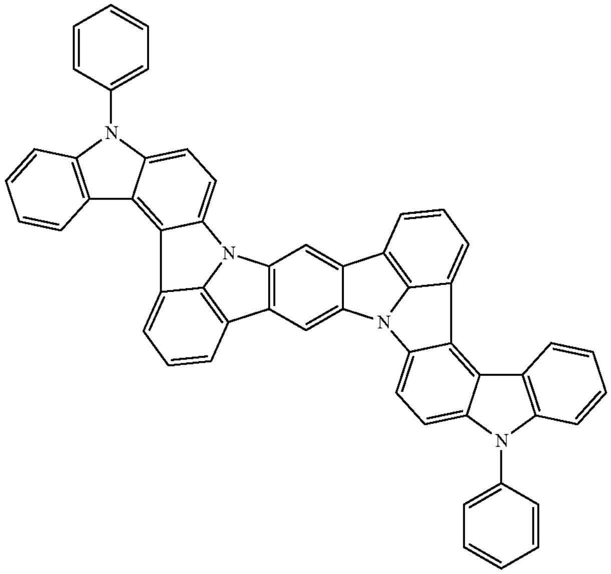

-continued
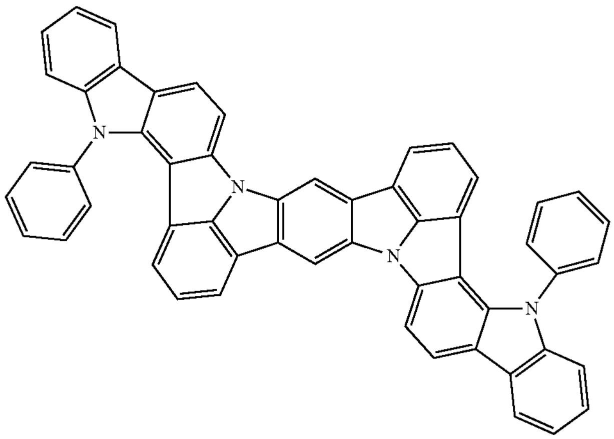
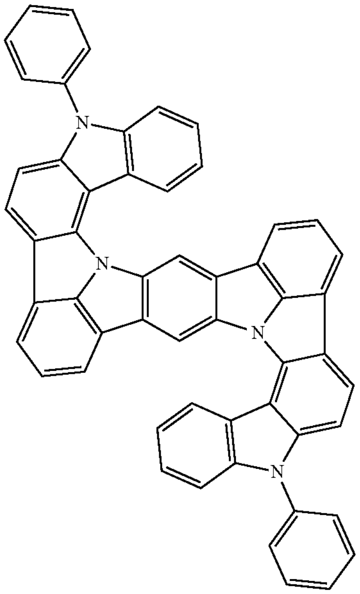
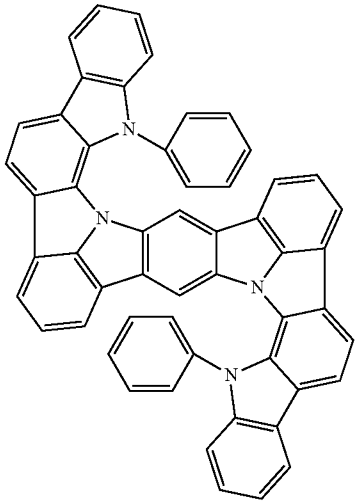
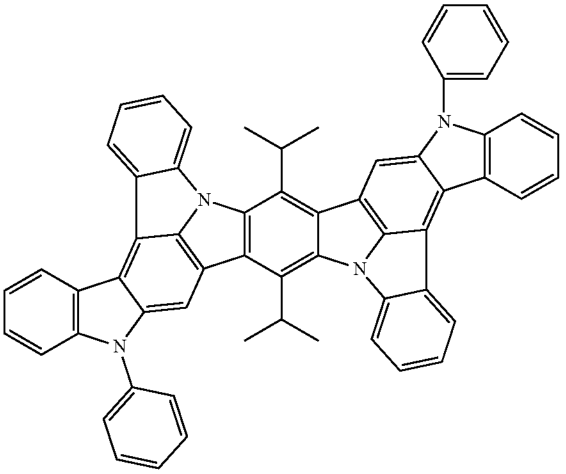
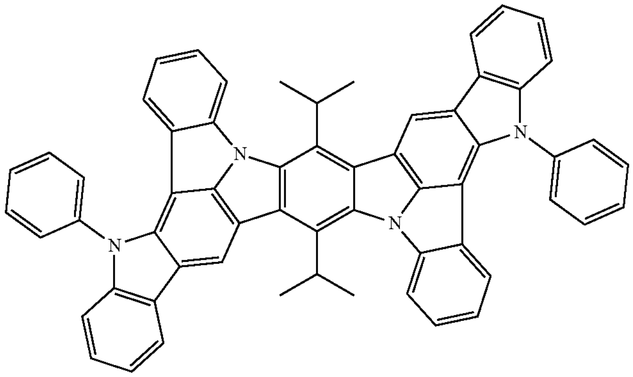

-continued
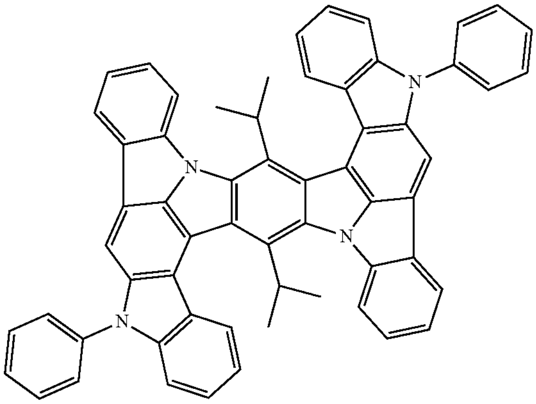
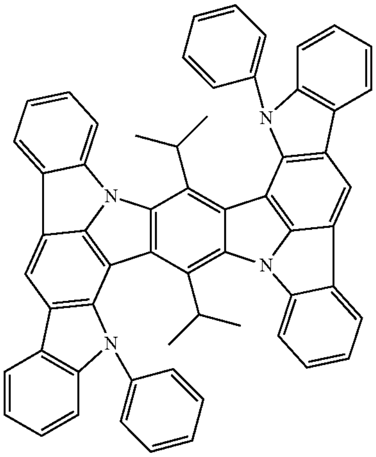
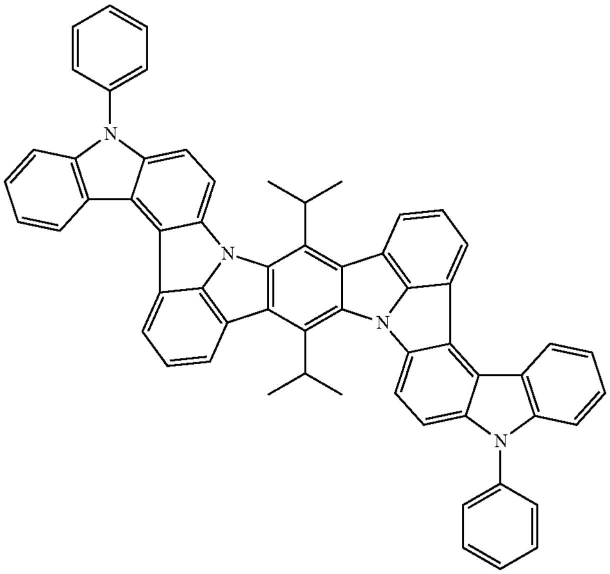
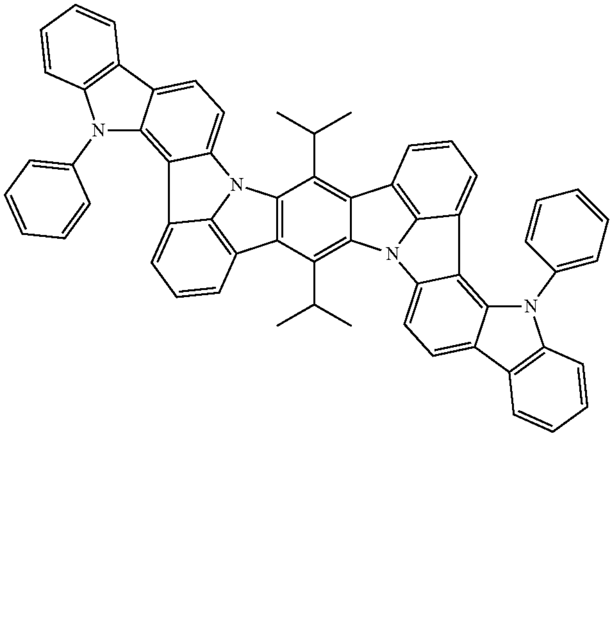

-continued
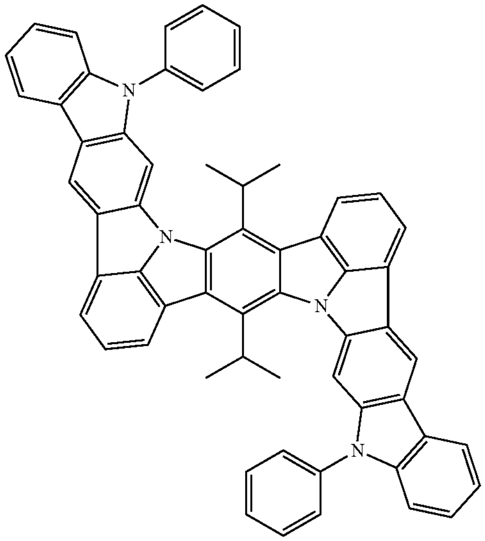
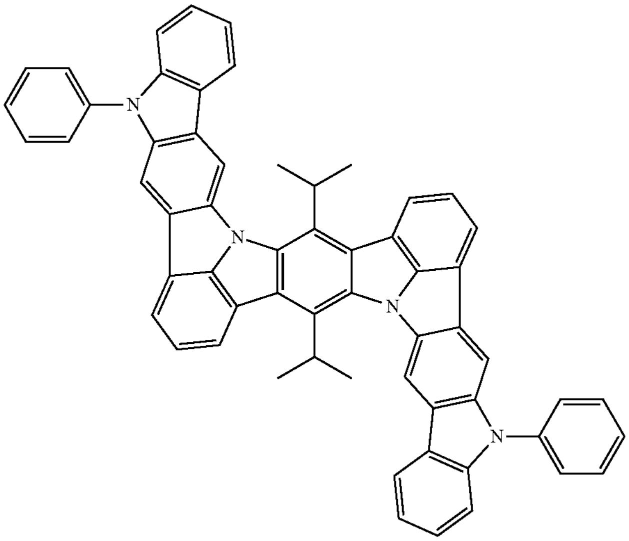
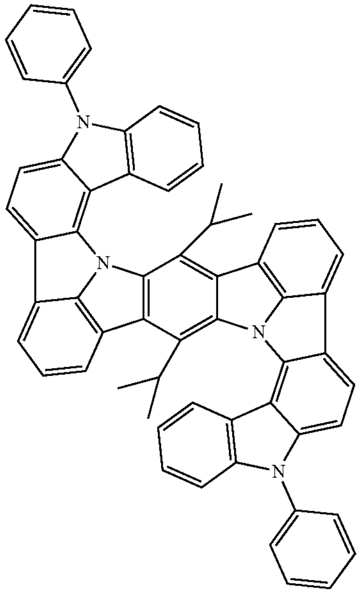
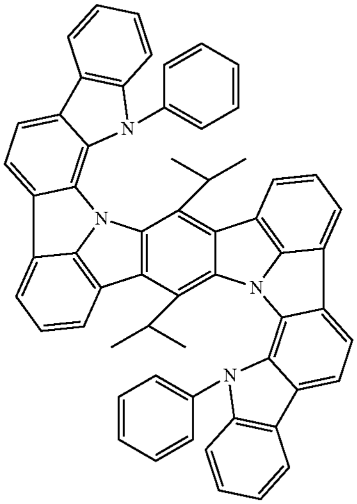

-continued
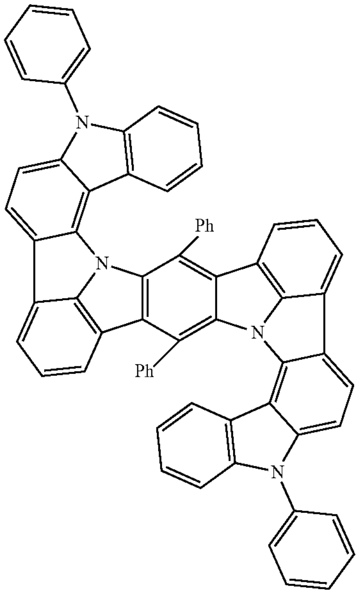
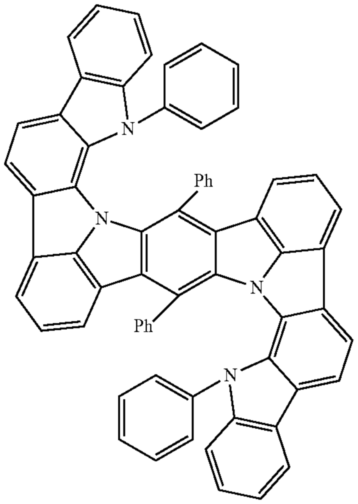
In the formulae, Ph represents a phenyl group.
[Formula 192]
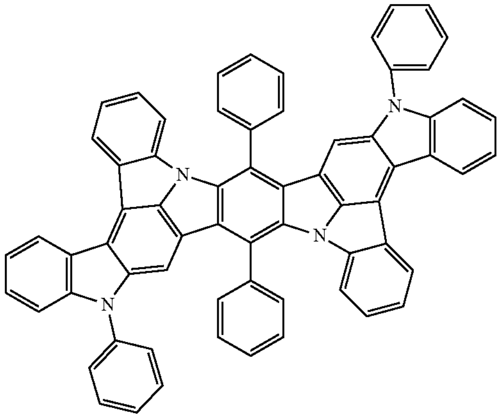
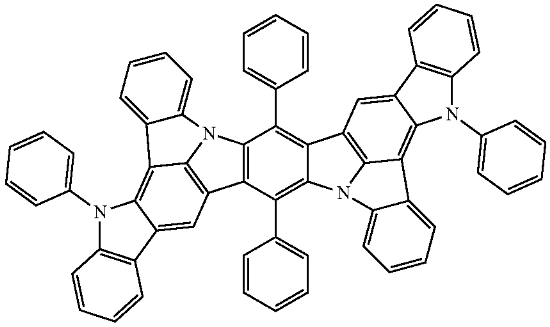
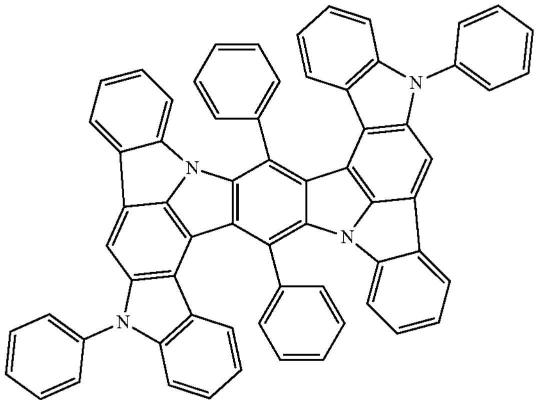
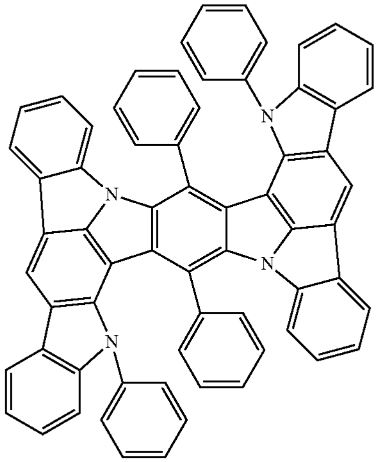

-continued
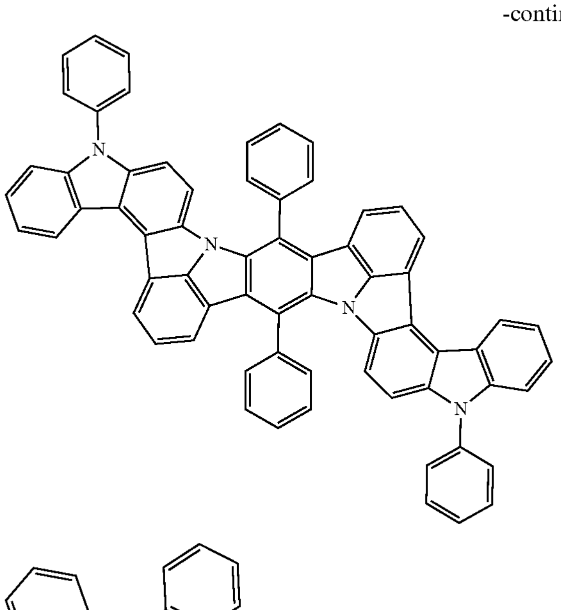
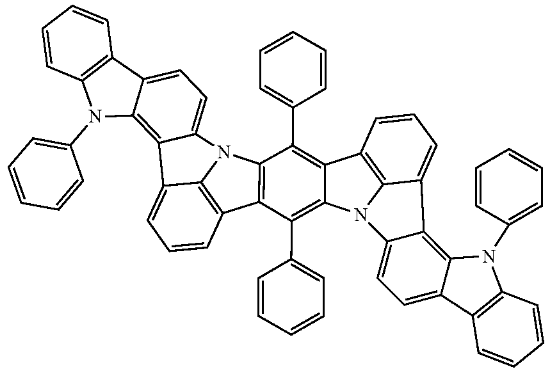
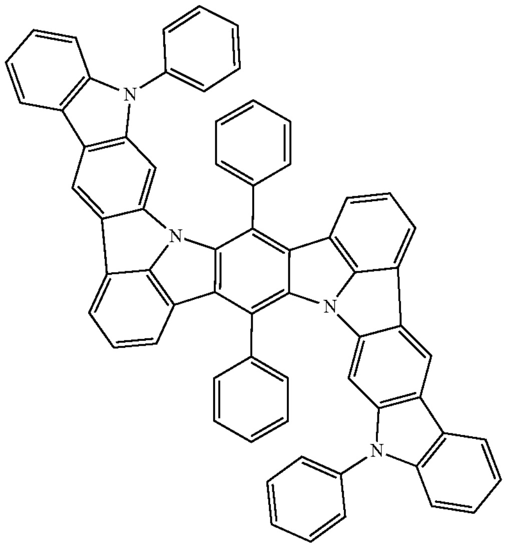
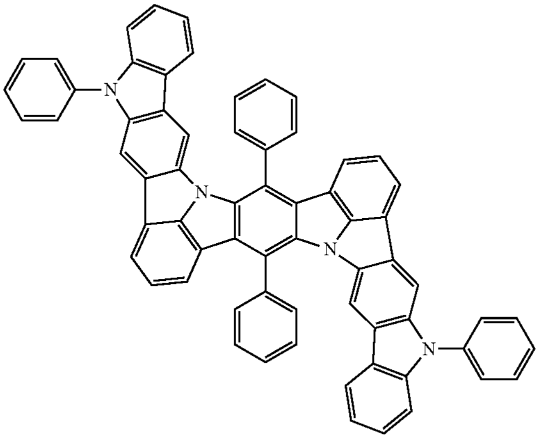
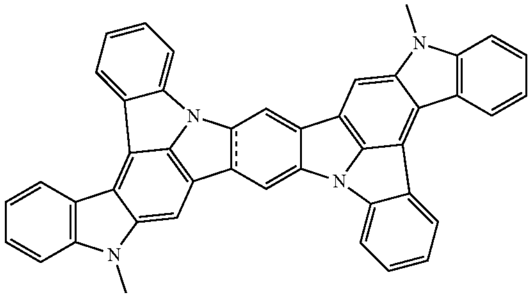
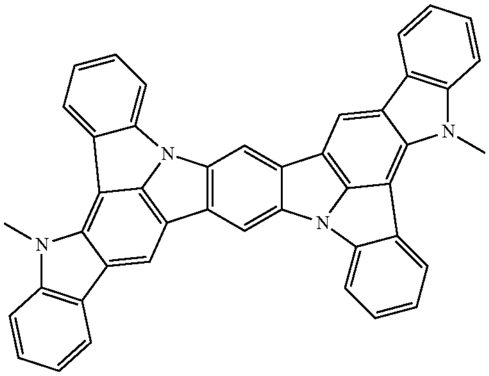

-continued
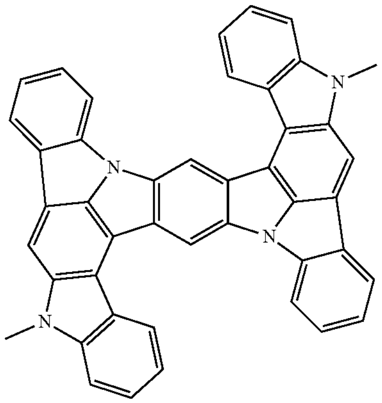
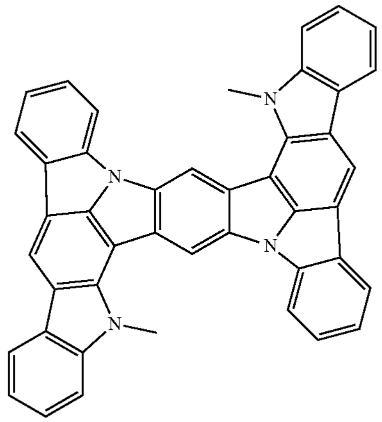
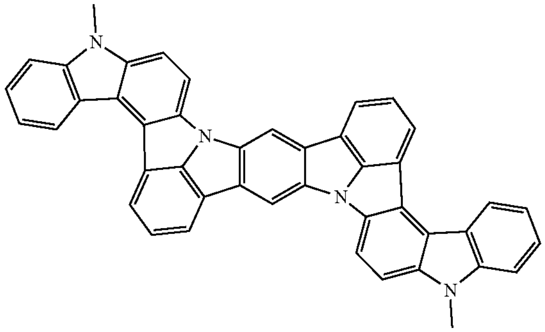
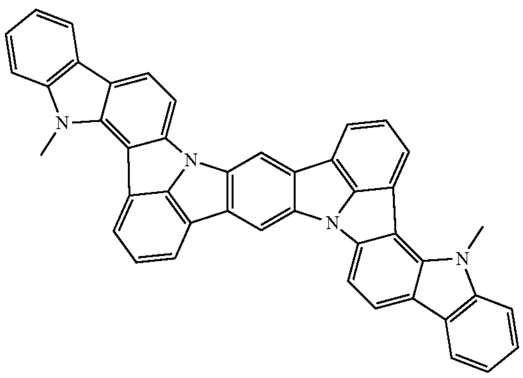
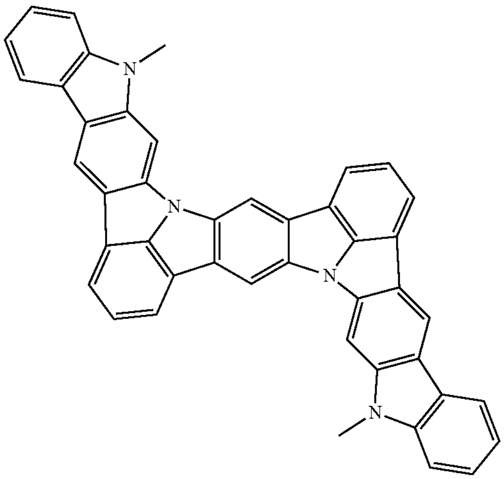
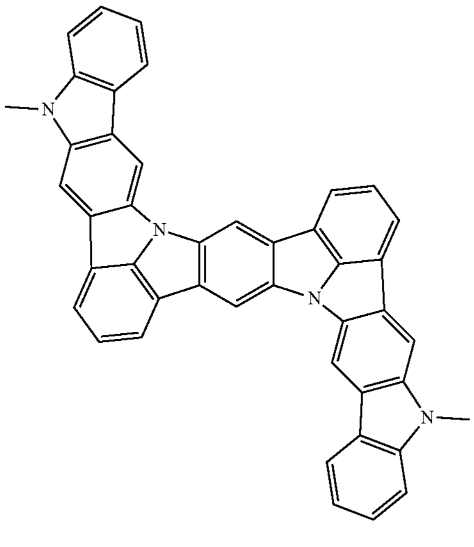

-continued
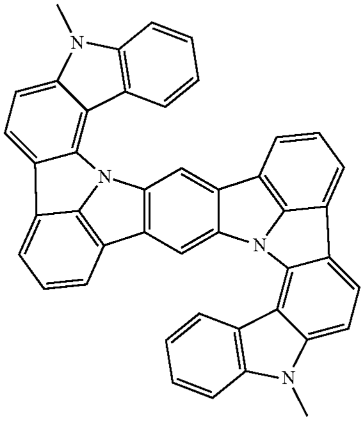
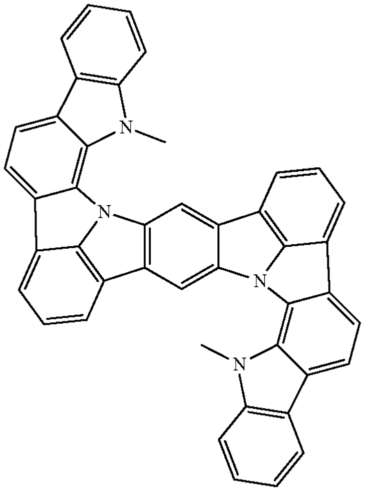
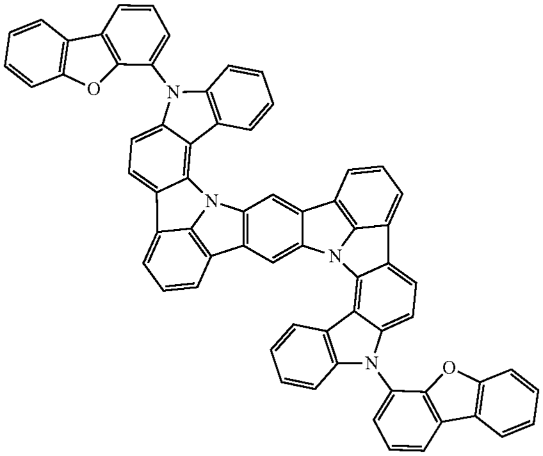
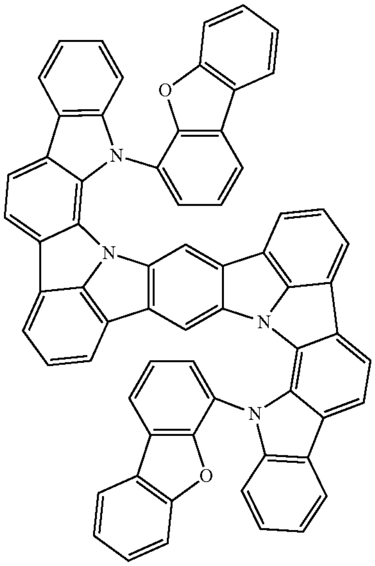
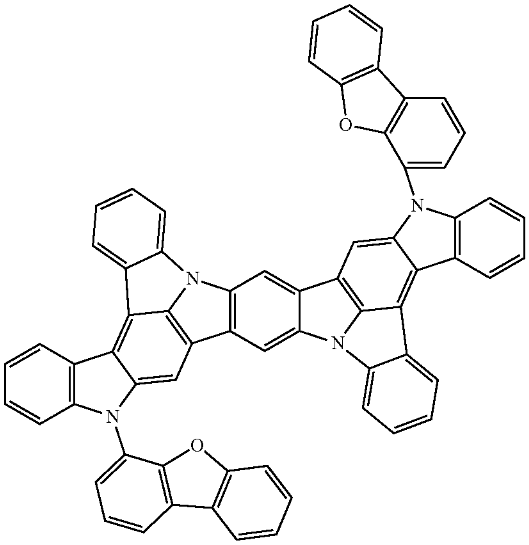

-continued
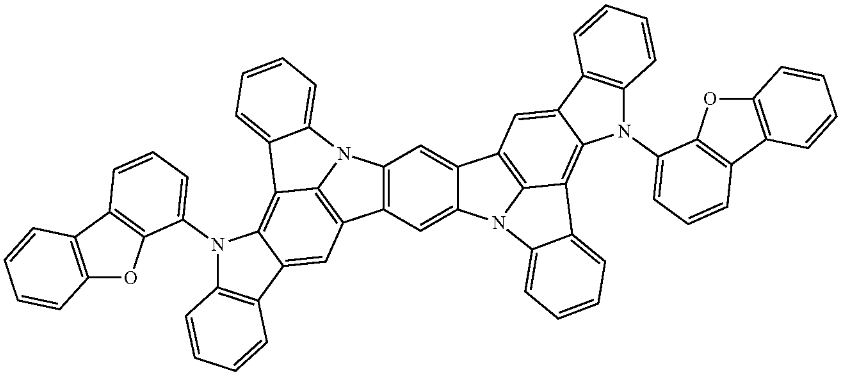
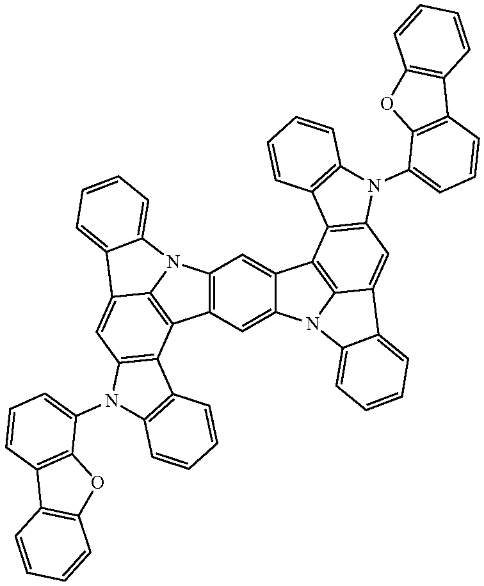
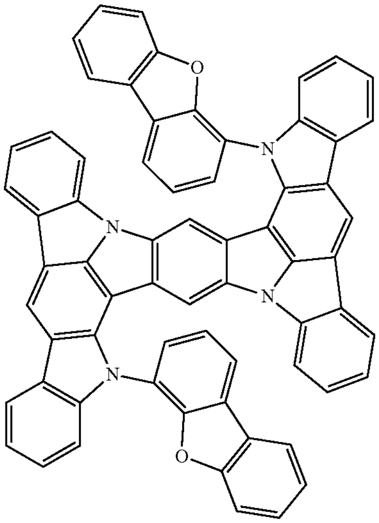
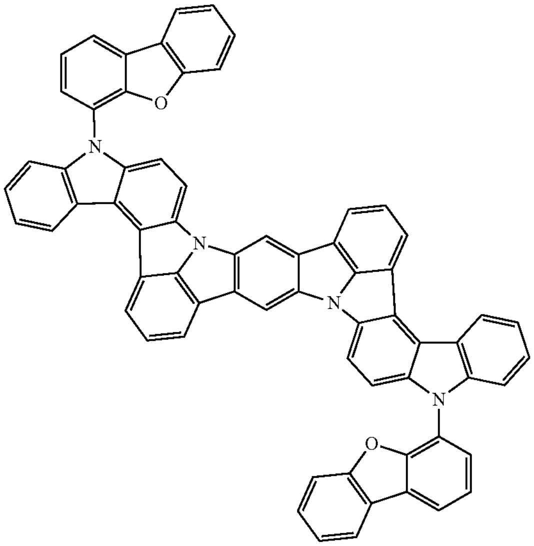

-continued
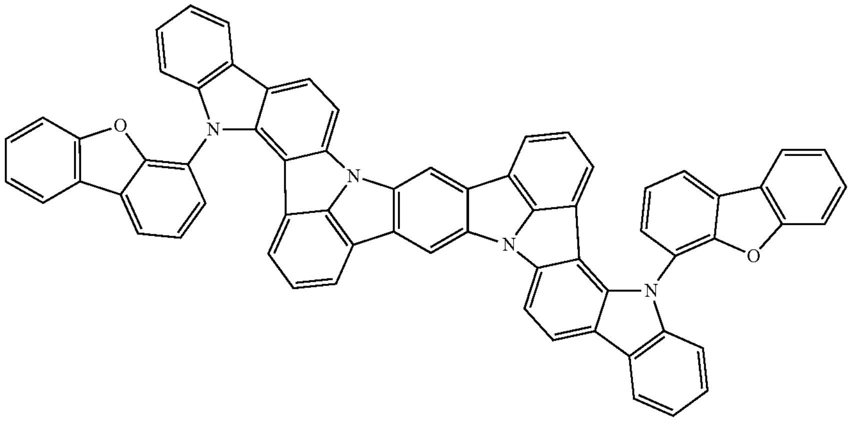
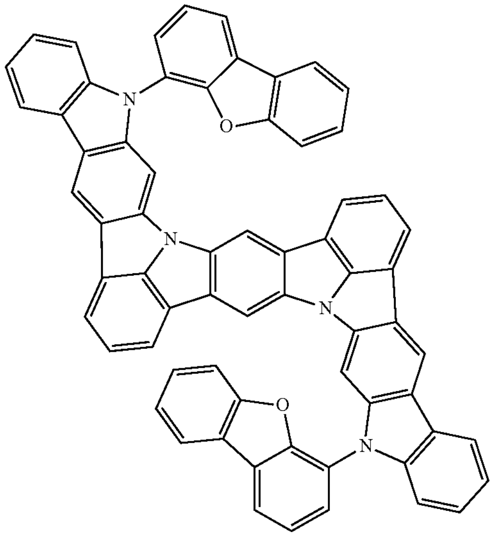
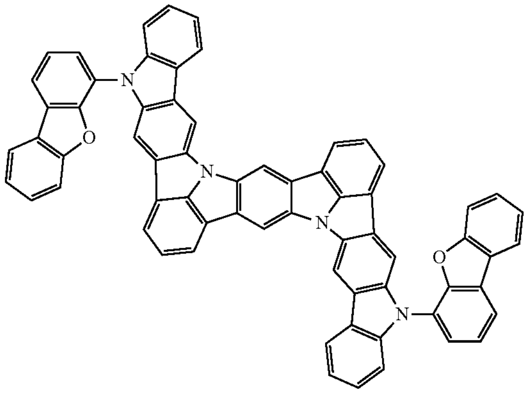
[Formula 193]
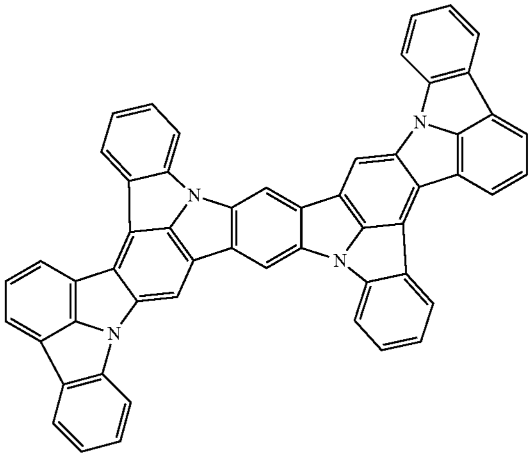
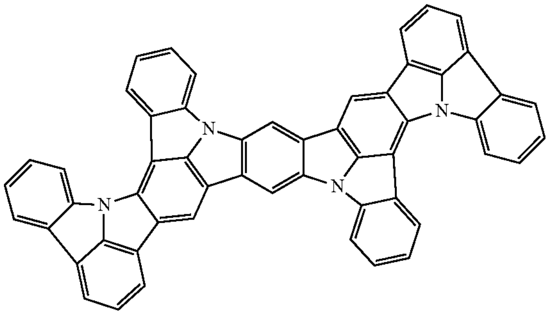

-continued
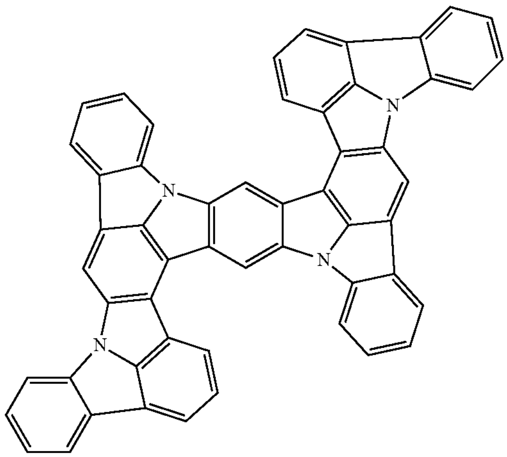
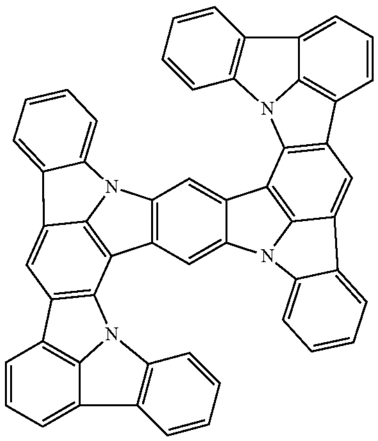
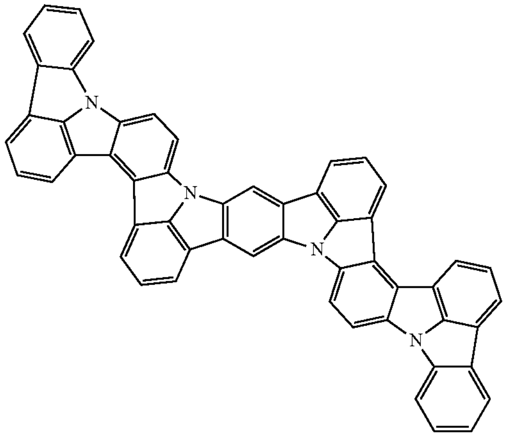
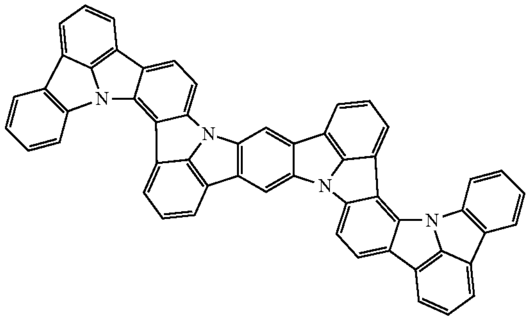
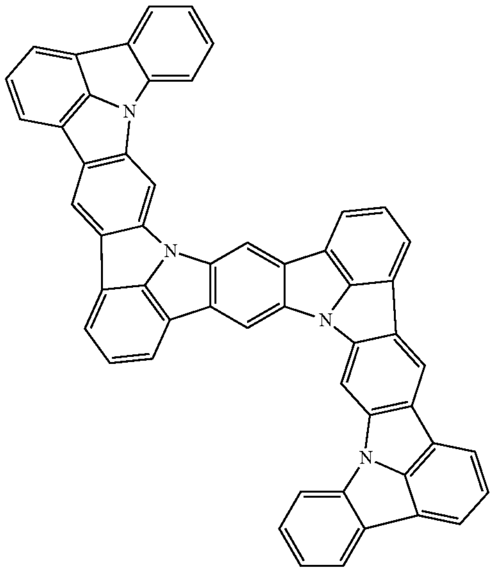
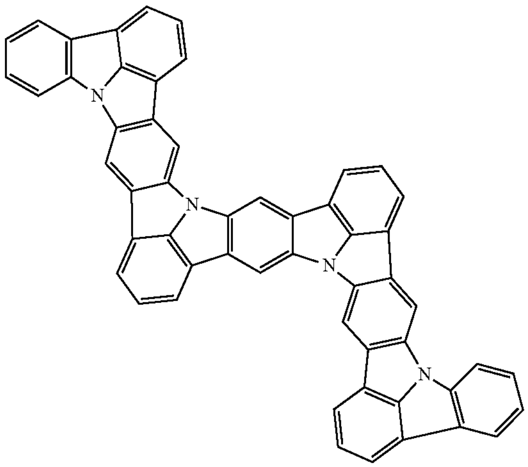

-continued
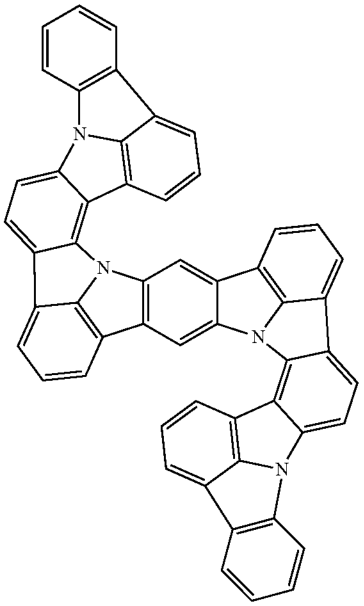
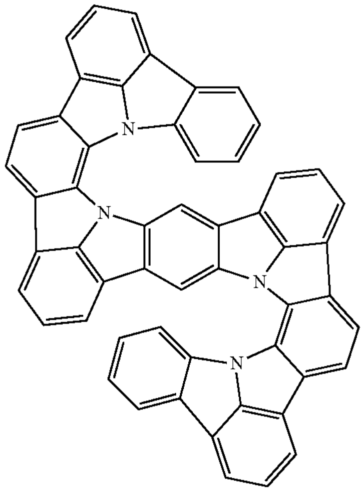
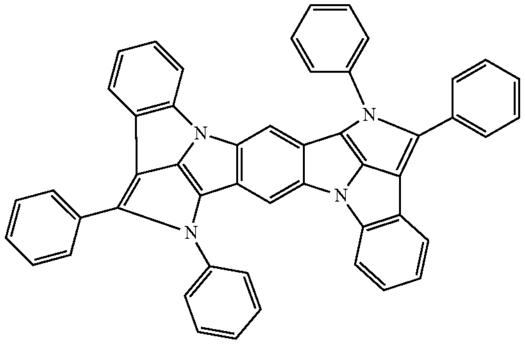
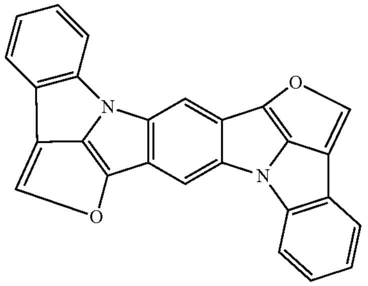
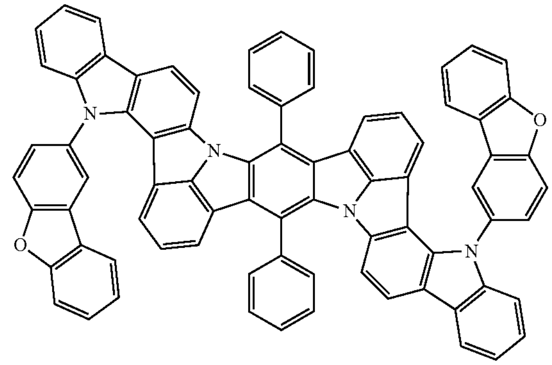
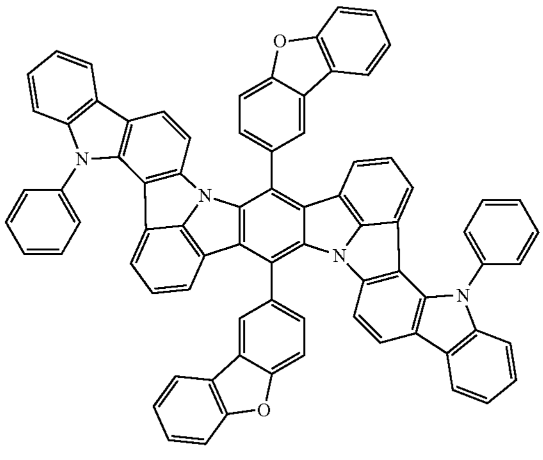

-continued
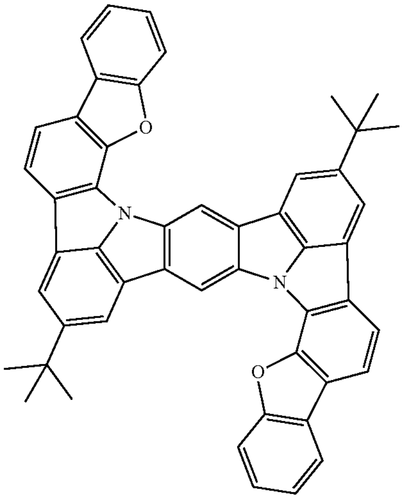
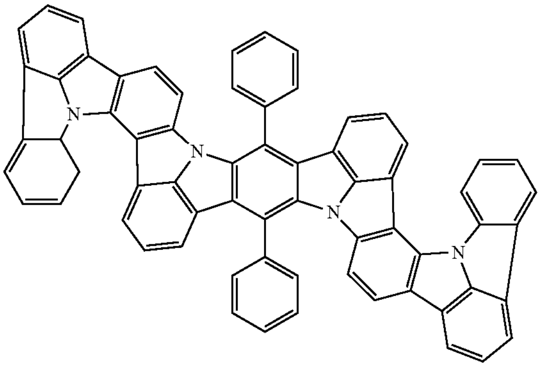
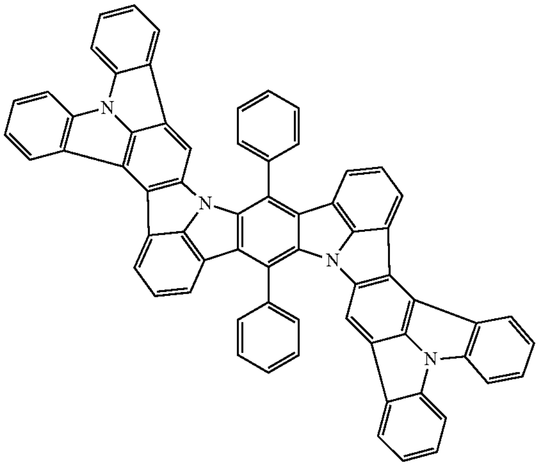
[Formula 194]
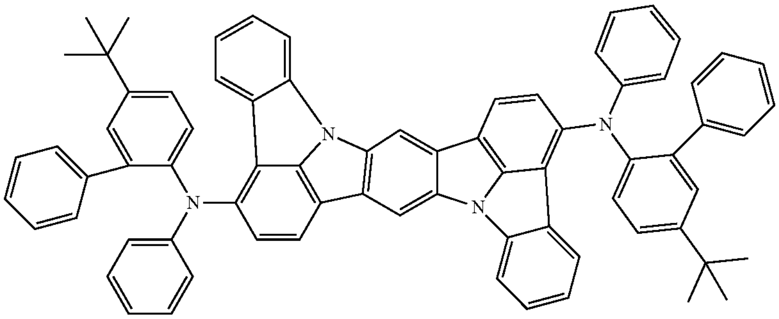
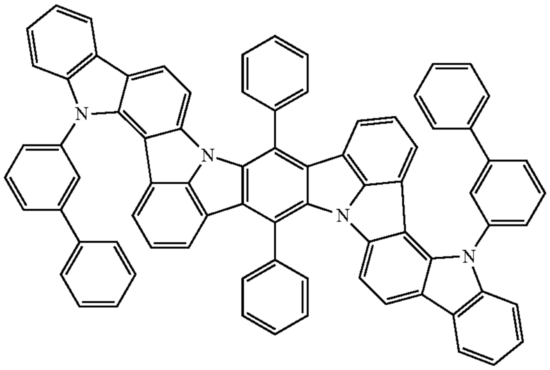

Compound Represented by Formula (6)

The compound represented by the formula (6) will be described below.

[Formula 195]

(6)

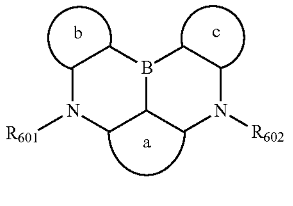

In the formula (6): a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{601}$ and $R_{602}$ are each independently bonded with the a ring, b ring, or a c ring to form a substituted or unsubstituted heterocycle or to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The a ring, b ring and c ring are each a ring (a substituted or unsubstituted aromatic hydrocarbon ring having 6 to 50 ring carbon atoms, or a substituted or unsubstituted heterocycle having 5 to 50 ring atoms) fused with the fused bicyclic moiety formed of a boron atom and two nitrogen atoms at the center of the formula (6).

The "aromatic hydrocarbon ring" for the a, b, and c rings has the same structure as the compound formed by introducing a hydrogen atom to the "aryl group" described above.

Ring atoms of the "aromatic hydrocarbon ring" for the a ring include three carbon atoms on the fused bicyclic structure at the center of the formula (6).

Ring atoms of the "aromatic hydrocarbon ring" for the b ring and the c ring include two carbon atoms on a fused bicyclic structure at the center of the formula (6).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the a, b, and c rings has the same structure as the compound formed by introducing a hydrogen atom to the "heterocyclic group" described above.

Ring atoms of the "heterocycle" for the a ring include three carbon atoms on the fused bicyclic structure at the center of the formula (6). Ring atoms of the "heterocycle" for the b ring and the c ring include two carbon atoms on a fused bicyclic structure at the center of the formula (6). Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ are optionally each independently bonded with the a ring, b ring, or c ring to form a substituted or unsubstituted heterocycle. The "heterocycle" in this arrangement includes the nitrogen atom on the fused bicyclic structure at the center of the formula (6). The heterocycle in the above arrangement optionally include a hetero atom other than the nitrogen atom. $R_{601}$ and $R_{602}$ bonded with the a ring, b ring, or c ring specifically means that atoms forming $R_{601}$ and $R_{602}$ are bonded with atoms forming the a ring, b ring, or c ring. For instance, $R_{601}$ may be optionally bonded to the a ring to form a bicyclic (or tri-or-more cyclic) fused nitrogen-containing heterocycle, in which the ring including $R_{601}$ and the a ring are fused. Specific examples of the nitrogen-containing heterocycle include a compound corresponding to the nitrogen-containing bi(or-more)cyclic heterocyclic group in the specific example group G2.

The same applies to $R_{601}$ bonded with the b ring, $R_{602}$ bonded with the a ring, and $R_{602}$ bonded with the c ring.

In an exemplary embodiment, the a ring, b ring and c ring in the formula (6) are each independently a substituted or unsubstituted aromatic hydrocarbon ring having 6 to 50 ring carbon atoms.

In an exemplary embodiment, the a ring, b ring and c ring in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms, preferably a substituted or unsubstituted aryl group having 6 to 50 ring carbon atoms.

In an exemplary embodiment, the compound represented by the formula (6) is represented by a formula (62) below.

[Formula 196]

(62)

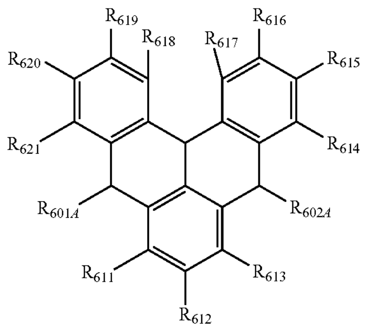

In the formula (62): $R_{601A}$ is bonded with at least one of $R_{611}$ or $R_{621}$ to form a substituted or unsubstituted heterocycle or to form no substituted or unsubstituted heterocycle;

$R_{602A}$ is bonded with at least one of $R_{613}$ or $R_{614}$A to form a substituted or unsubstituted heterocycle or to form no substituted or unsubstituted heterocycle; and $R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

At least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded;

$R_{611}$ to $R_{621}$ neither forming the substituted or unsubstituted heterocycle, forming the monocyclic ring, nor forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

$R_{601A}$ and $R_{602A}$ in the formula (62) are groups corresponding to $R_{601}$ and $R_{602}$ in the formula (6), respectively.

For instance, $R_{601A}$ and $R_{611}$ are optionally bonded with each other to form a bicyclic (or tri-or-more cyclic) nitrogen-containing heterocycle, in which the ring including $R_{601A}$ and $R_{611}$ and a benzene ring corresponding to the a ring are fused. Specific examples of the nitrogen-containing heterocycle include a compound corresponding to the nitrogen-containing bi(or-more)cyclic heterocyclic group in the specific example group G2. The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ may be mutually bonded to form a substituted or unsubstituted monocyclic ring, or mutually bonded to form a substituted or unsubstituted monocyclic ring, For instance, $R_{611}$ and $R_{612}$ are mutually bonded to form a structure in which a benzene ring, indole ring, pyrrole ring, benzofuran ring, benzothiophene ring or the like is bonded to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, or a substituted or unsubstituted alkyl group having 1 to 50 carbon atoms.

In an exemplary embodiment, $R_{611}$ to $R_{621}$ not contributing to ring formation are each independently a hydrogen atom, or a substituted or unsubstituted alkyl group having 1 to 50 carbon atoms, and at least one of $R_{611}$ to $R_{621}$ is a substituted or unsubstituted alkyl group having 1 to 50 carbon atoms.

In an exemplary embodiment, the compound represented by the formula (62) is represented by a formula (63) below.

[Formula 197]

(63)

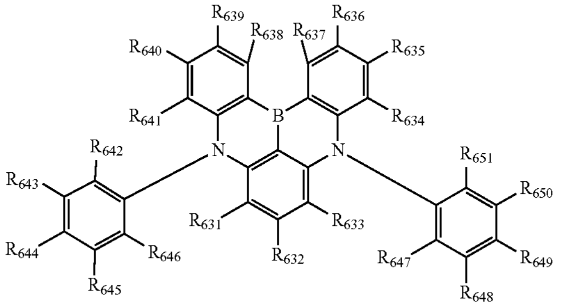

In the formula (63): $R_{631}$ is bonded with $R_{646}$ to form a substituted or unsubstituted heterocycle or to form no substituted or unsubstituted heterocycle;

$R_{633}$ is bonded with $R_{647}$ to form a substituted or unsubstituted heterocycle or to form no substituted or unsubstituted heterocycle;

$R_{634}$ is bonded with $R_{651}$ to form a substituted or unsubstituted heterocycle or to form no substituted or unsubstituted heterocycle;

$R_{641}$ is bonded with $R_{642}$ to form a substituted or unsubstituted heterocycle or to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded; and $R_{631}$ to $R_{651}$ neither forming the substituted or unsubstituted heterocycle, forming the monocyclic ring, nor forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

$R_{631}$ are optionally mutually bonded with $R_{646}$ to form a substituted or unsubstituted heterocycle. For instance, $R_{631}$ and $R_{646}$ are optionally bonded with each other to form a tri-or-more cyclic nitrogen-containing heterocycle, in which a benzene ring bonded with $R_{646}$, a ring including a nitrogen atom, and a benzene ring corresponding to the a ring are fused. Specific examples of the nitrogen-containing heterocycle include a compound corresponding to the nitrogen-containing tri(-or-more)cyclic heterocyclic group in the specific example group G2. The same applies to $R_{633}$ bonded with $R_{647}$, $R_{634}$ bonded with $R_{651}$, and $R_{641}$ bonded with $R_{642}$.

In an exemplary embodiment, $R_{631}$ to $R_{651}$ that do not contribute to ring formation, are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ that do not contribute to ring formation, are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ that do not contribute to ring formation, are each independently a hydrogen atom, or a substituted or unsubstituted alkyl group having 1 to 50 carbon atoms.

In an exemplary embodiment, $R_{631}$ to $R_{651}$ that do not contribute to ring formation, are each independently a hydrogen atom, or a substituted or unsubstituted alkyl group having 1 to 50 carbon atoms, and at least one of $R_{631}$ to $R_{651}$ is a substituted or unsubstituted alkyl group having 1 to 50 carbon atoms.

In an exemplary embodiment, the compound represented by the formula (63) is represented by a formula (63A) below.

[Formula 198]

(63A)

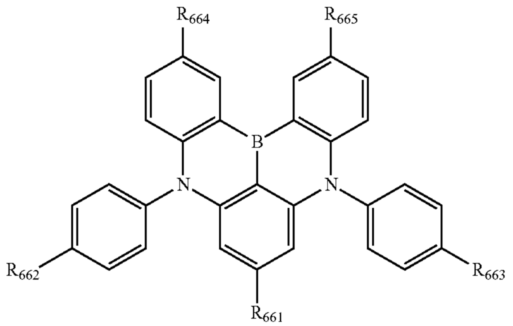

In the formula (63A): $R_{661}$ is a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{662}$ to $R_{665}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms, or a substituted or unsubstituted aryl group having 6 to 50 ring carbon atoms; and In an exemplary embodiment, $R_{661}$ to $R_{665}$ are each independently a substituted or unsubstituted alkyl group having 1 to 50 carbon atoms.

In an exemplary embodiment, the compound represented by the formula (63) is represented by a formula (63B) below.

[Formula 199]

(63B)

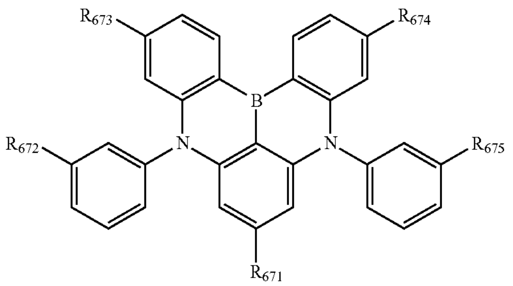

In the formula (63B): $R_{671}$ and $R_{672}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-N(R_{906})(R_{907})$, or a substituted or unsubstituted aryl group having 6 to 50 ring carbon atoms; and $R_{673}$ to $R_{675}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-N(R_{906})(R_{907})$, or a substituted or unsubstituted aryl group having 6 to 50 ring carbon atoms.

In an exemplary embodiment, the compound represented by the formula (63) is represented by a formula (63B') below.

[Formula 200]

(63B')

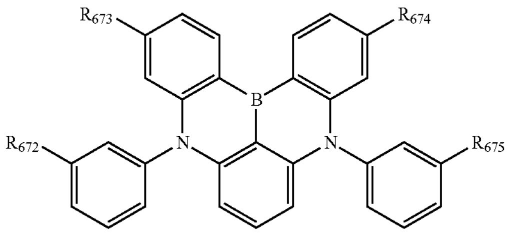

In the formula (63B'), $R_{672}$ to $R_{675}$ respectively represent the same as $R_{672}$ to $R_{675}$ in the formula (63B).

In an exemplary embodiment, at least one of $R_{671}$ to $R_{675}$ is: a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-N(R_{906})(R_{907})$, or a substituted or unsubstituted aryl group having 6 to 50 ring carbon atoms.

In an exemplary embodiment: $R_{672}$ is a hydrogen atom, a substituted or unsubstituted alkyl group having 1 to 50 carbon atoms, a group represented by $-N(R_{906})(R_{907})$, or a substituted or unsubstituted aryl group having 6 to 50 ring carbon atoms;

$R_{671}$ and $R_{673}$ to $R_{675}$ are each independently a substituted or unsubstituted alkyl group having 1 to 50 carbon atoms, a group represented by $-N(R_{906})(R_{907})$, or a substituted or unsubstituted aryl group having 6 to 50 ring carbon atoms.

In an exemplary embodiment, the compound represented by the formula (63) is represented by a formula (63C) below.

[Formula 201]

(63C)

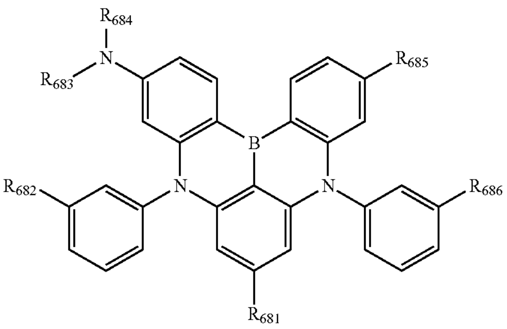

In the formula (63C): $R_{681}$ and $R_{682}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{683}$ to $R_{686}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, the compound represented by the formula (63) is represented by a formula (63C') below.

[Formula 202]

(63C')

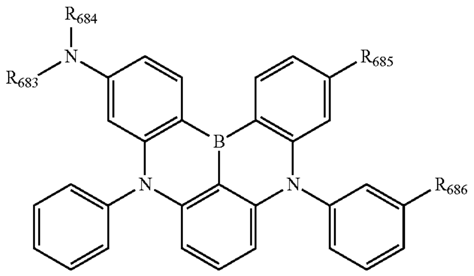

In the formula (63C'), $R_{683}$ to $R_{686}$ each independently represent the same as $R_{683}$ to $R_{686}$ in the formula (63C).

In an exemplary embodiment, $R_{681}$ to $R_{686}$ are each independently a substituted or unsubstituted alkyl group having 1 to 50 carbon atoms, or a substituted or unsubstituted aryl group having 6 to 50 ring carbon atoms.

In an exemplary embodiment, $R_{681}$ to $R_{686}$ are each independently a substituted or unsubstituted aryl group having 6 to 50 ring carbon atoms.

The compound represented by the formula (6) is producible by initially bonding the a ring, b ring and c ring with linking groups (a group including $N-R_{601}$ and a group including $N-R_{602}$) to form an intermediate (first reaction), and bonding the a ring, b ring and c ring with a linking group (a group including a boron atom) to form a final product (second reaction). In the first reaction, an amination reaction (e.g. Buchwald-Hartwig reaction) is applicable. In the second reaction, Tandem Hetero-Friedel-Crafts Reactions or the like is applicable.

Specific Examples of Compound Represented by Formula (6)

Specific examples of the compound represented by the formula (6) are shown below. It should however be noted that these specific examples are merely exemplary and do not limit the compound represented by the formula (6).

[Formula 203]

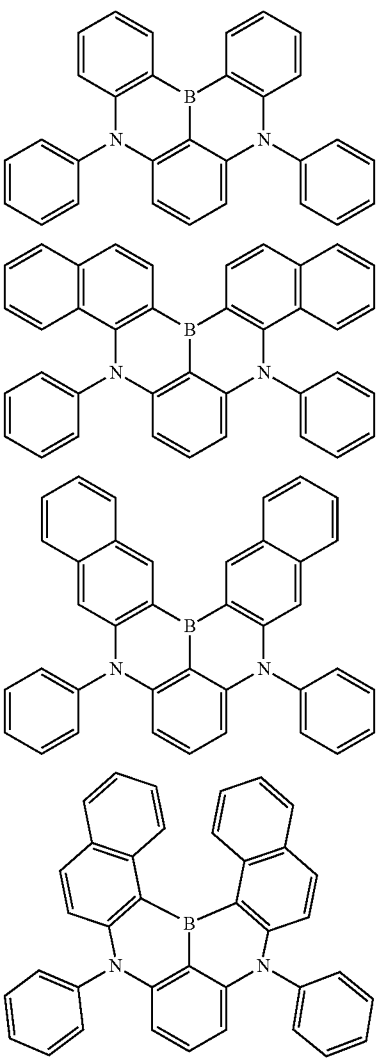

-continued
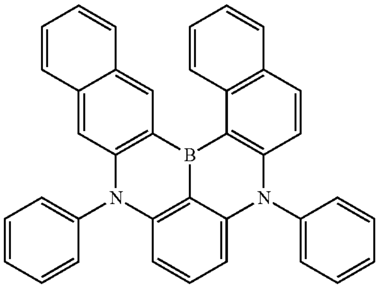
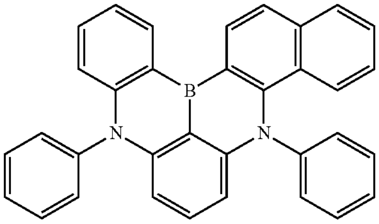
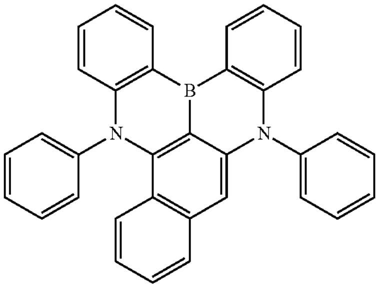
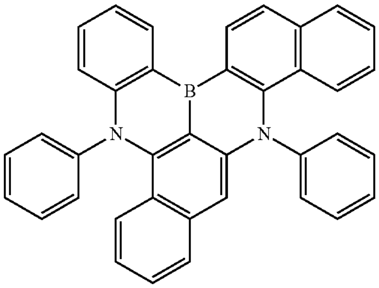
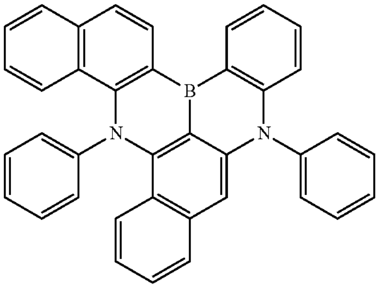
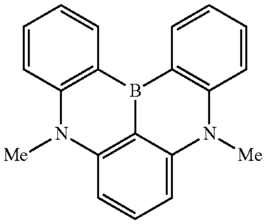
-continued
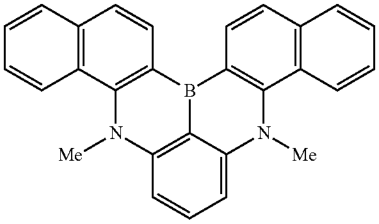
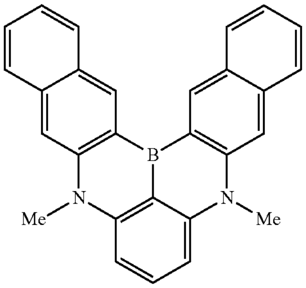
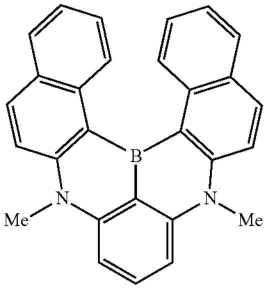
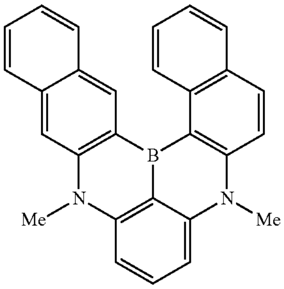
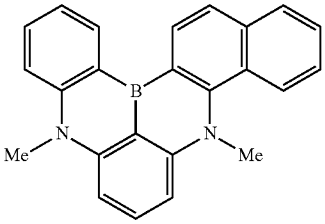
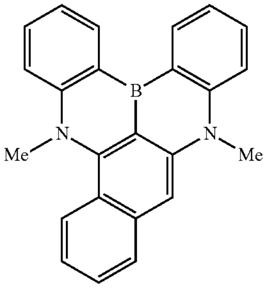

-continued
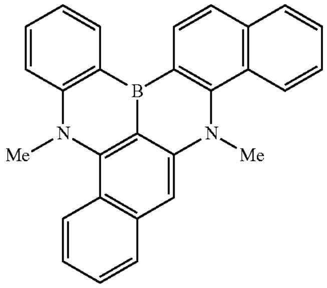
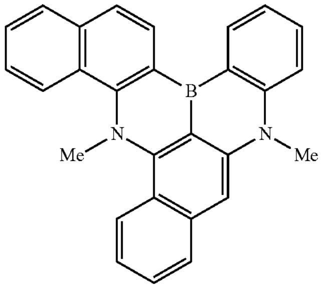
[Formula 204]
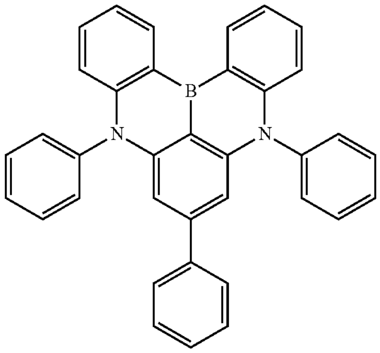
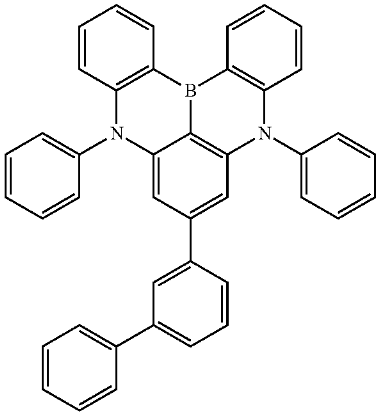
-continued
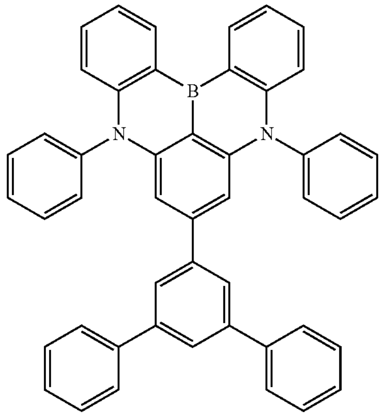
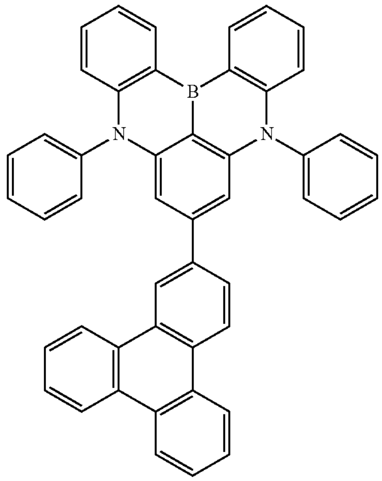
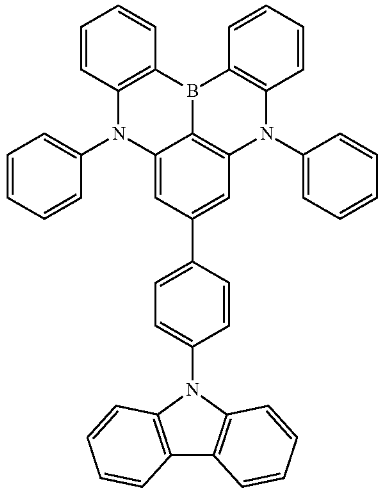

-continued
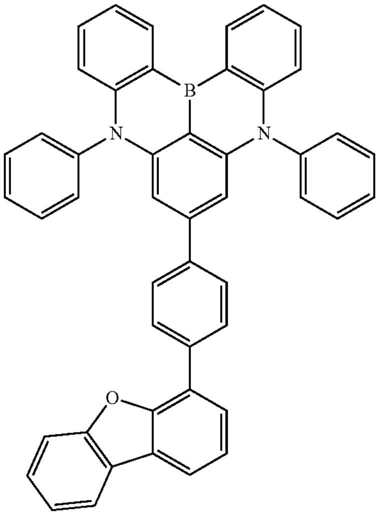
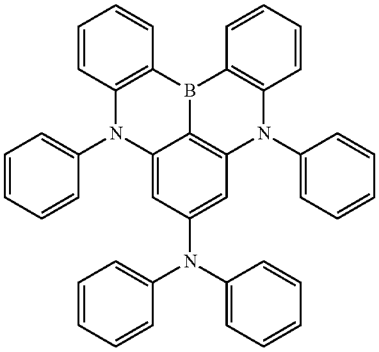
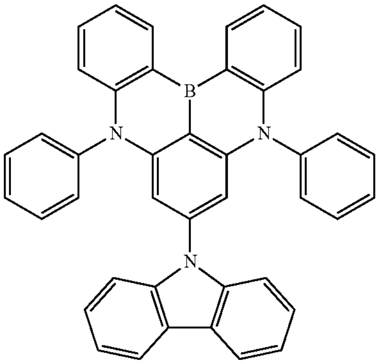
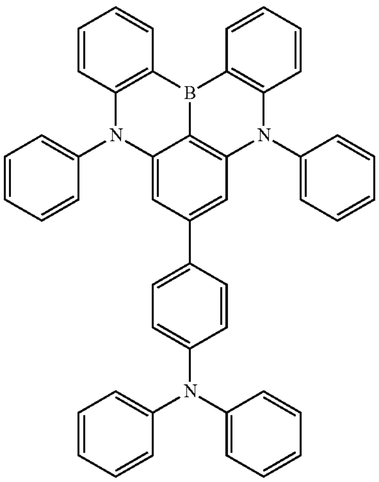
-continued
[Formula 205]
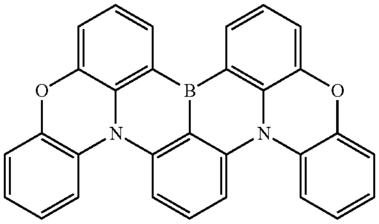
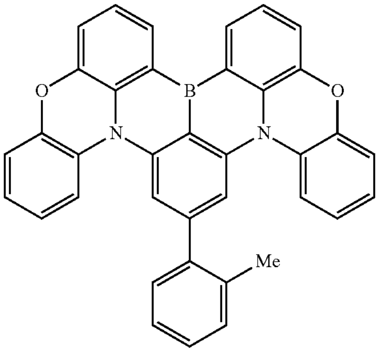
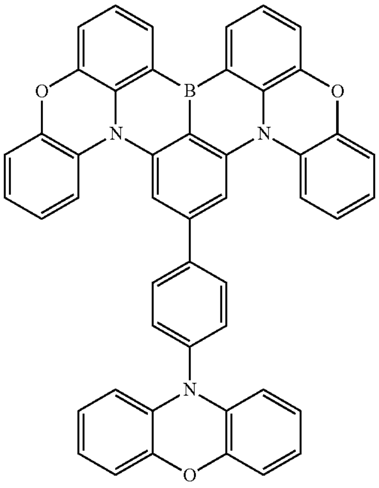
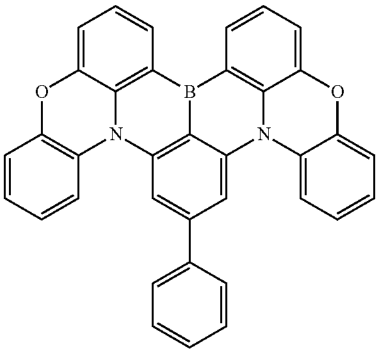

-continued
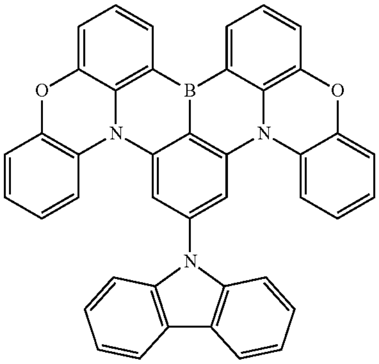
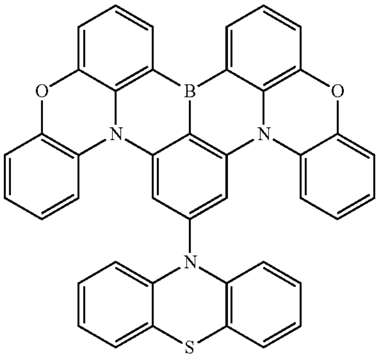
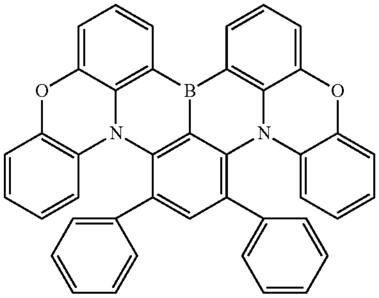
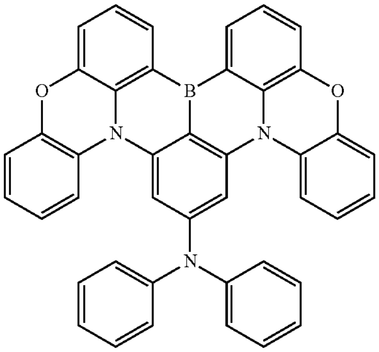
-continued
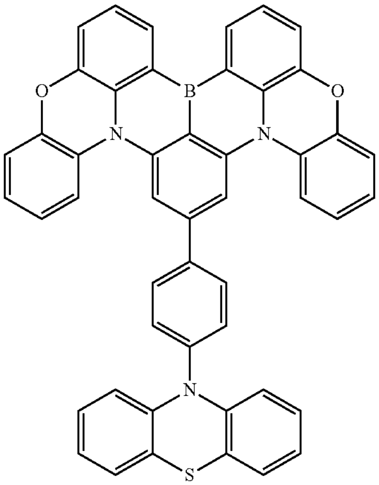
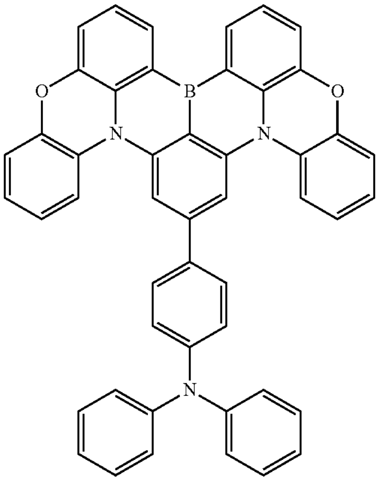
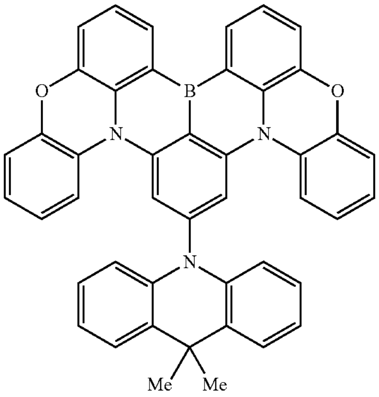

-continued
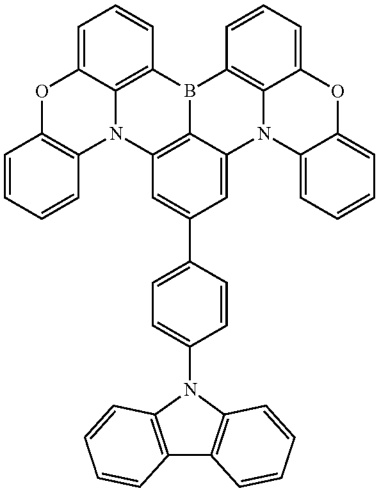
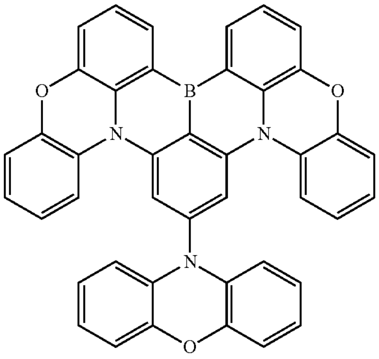
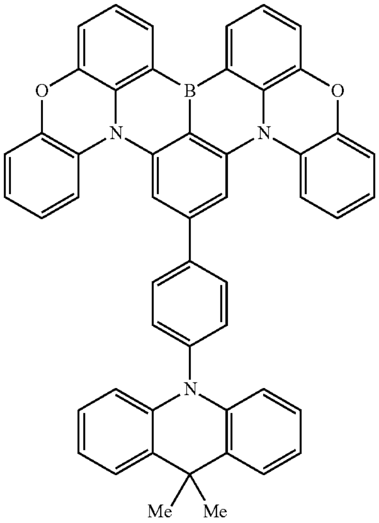
[Formula 206]
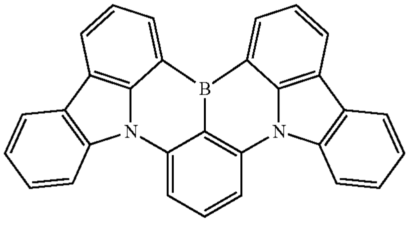
-continued
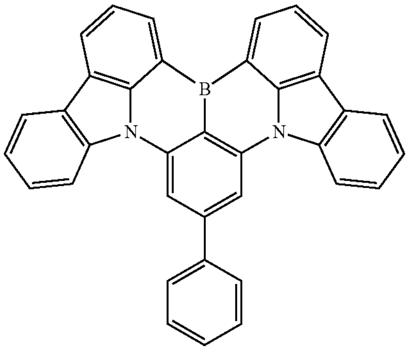
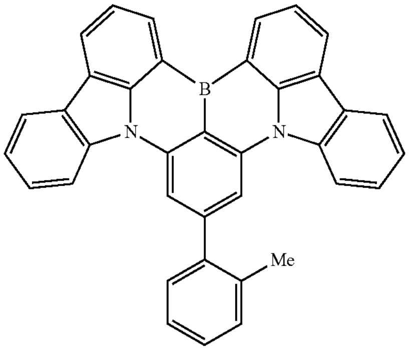
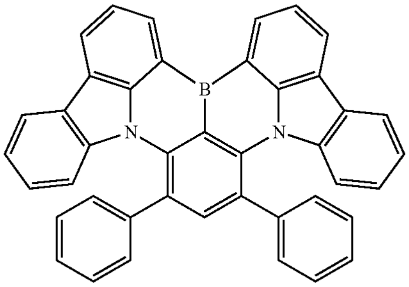
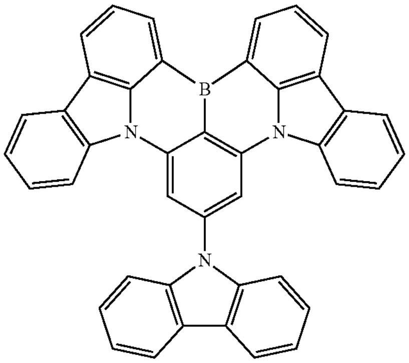
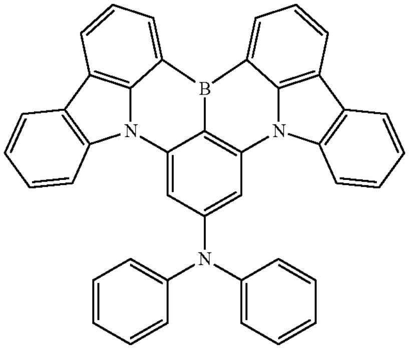

-continued
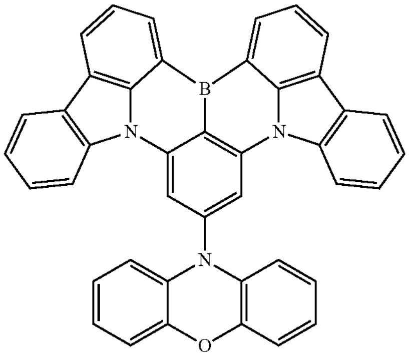
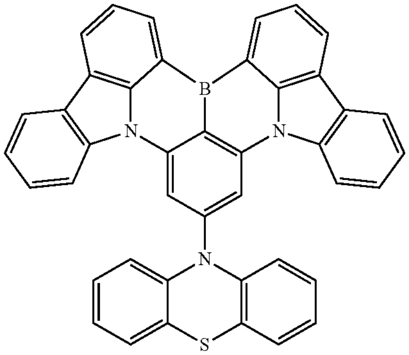
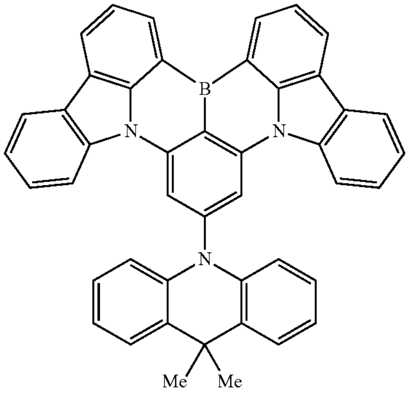
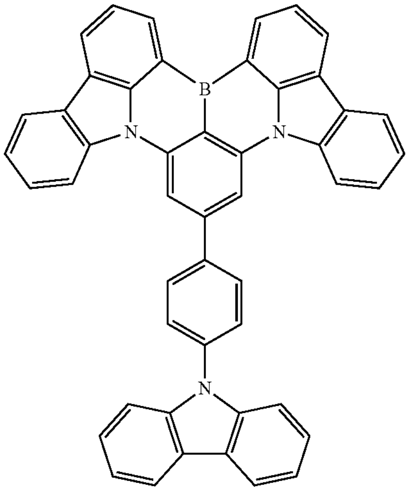
-continued
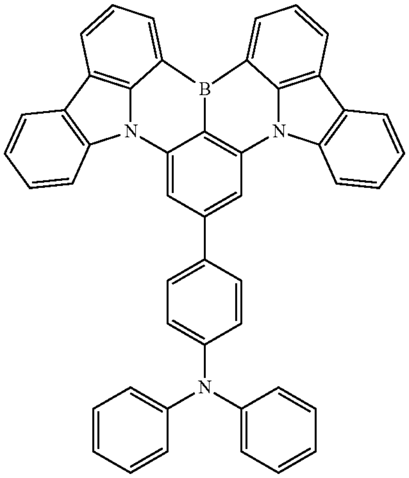
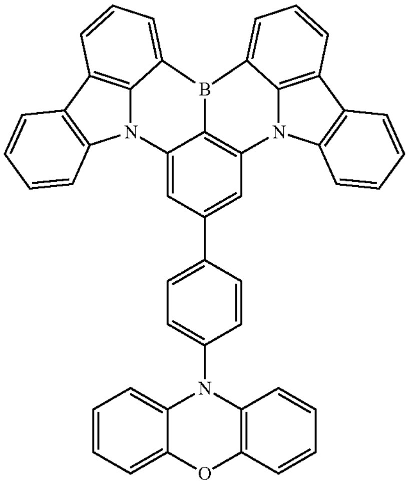
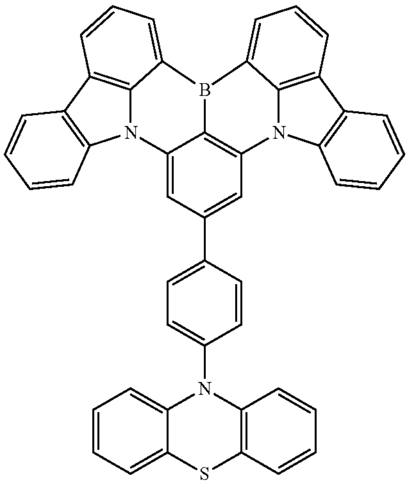

-continued
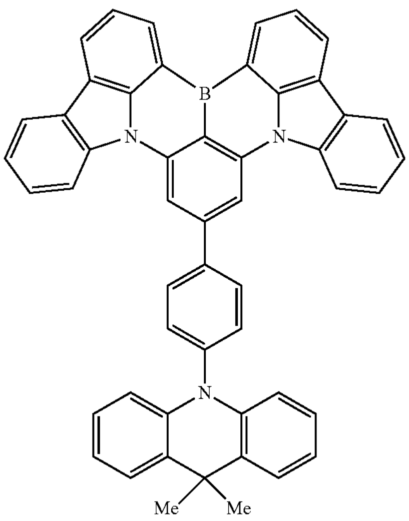
[Formula 207]
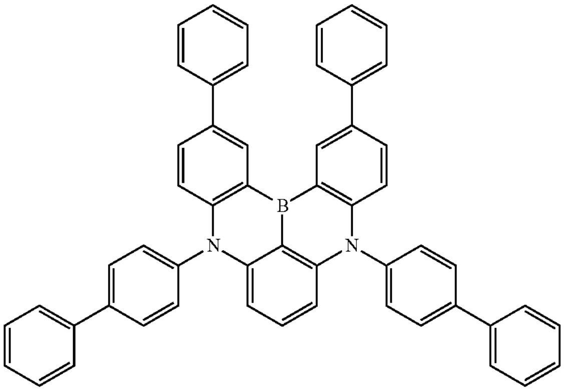
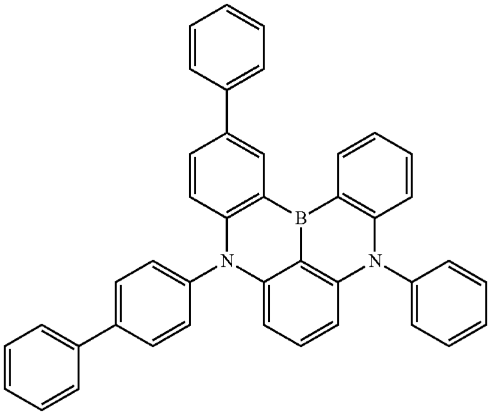
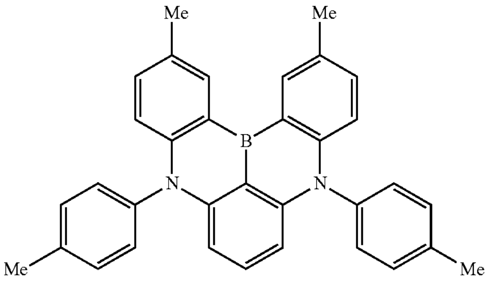
-continued
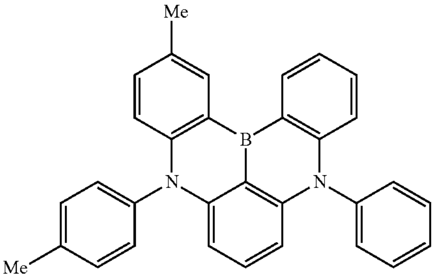
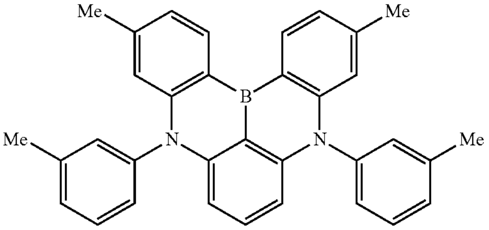
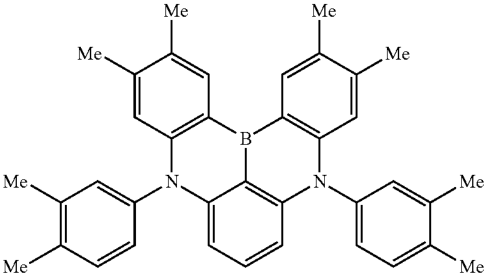
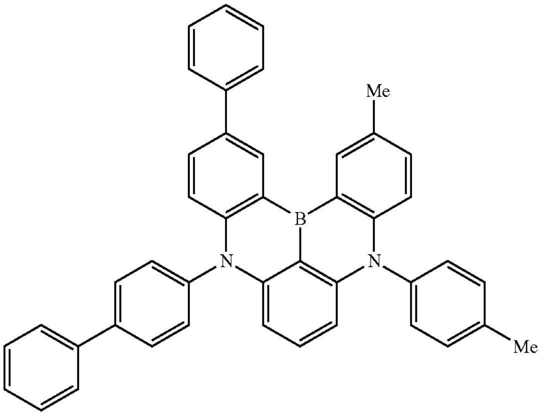
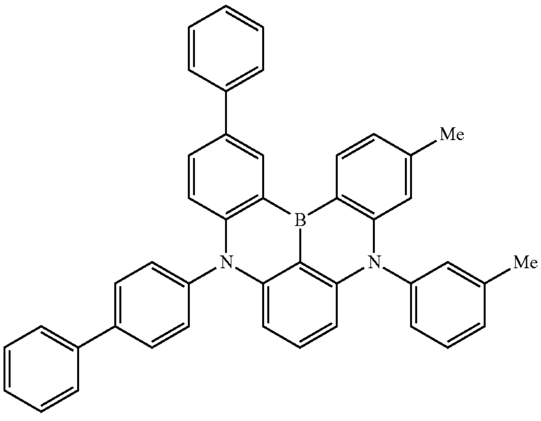

-continued
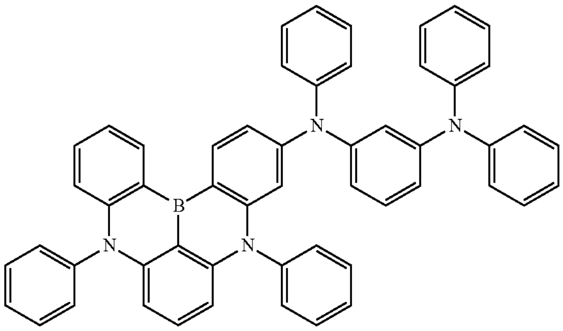
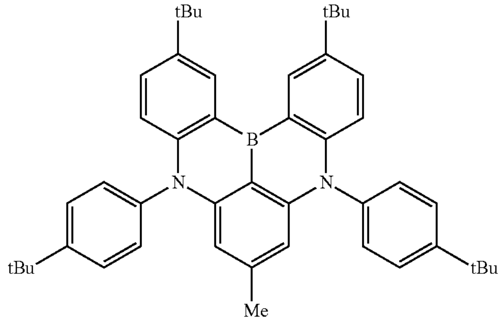
[Formula 208]
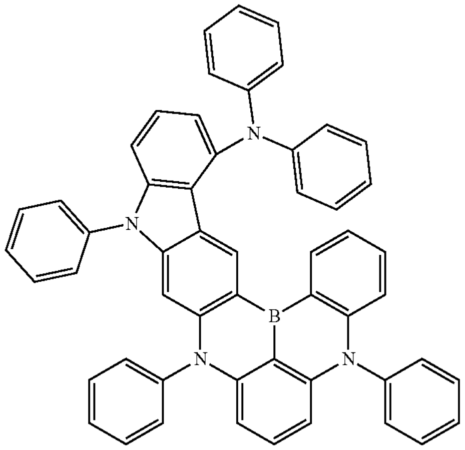
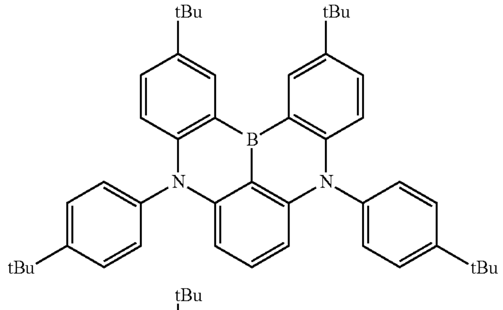
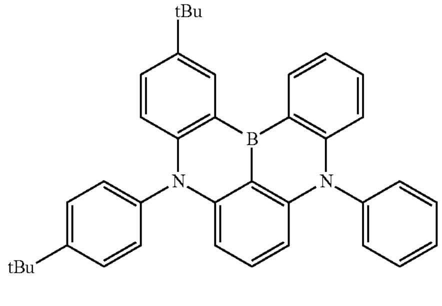
-continued
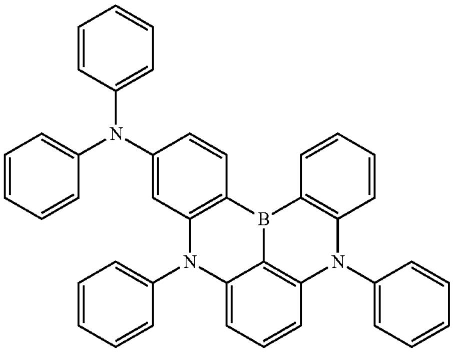
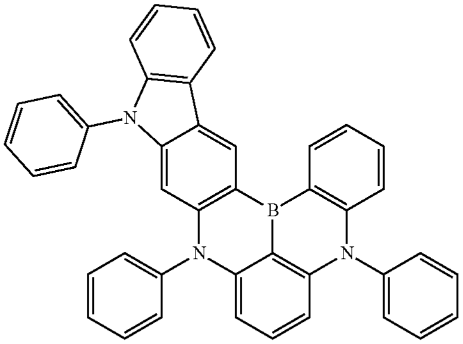
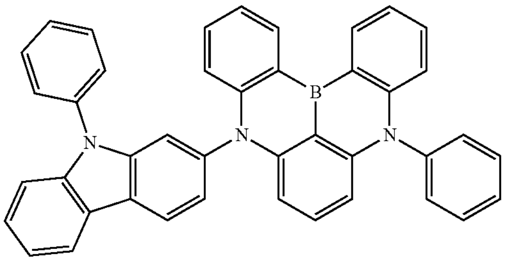
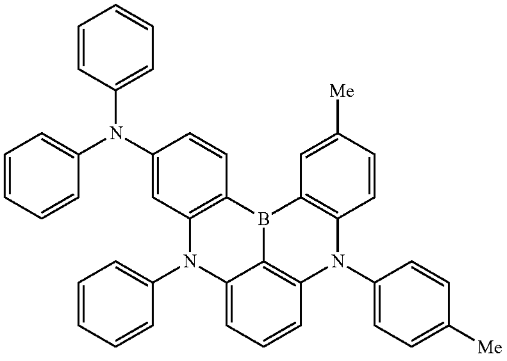
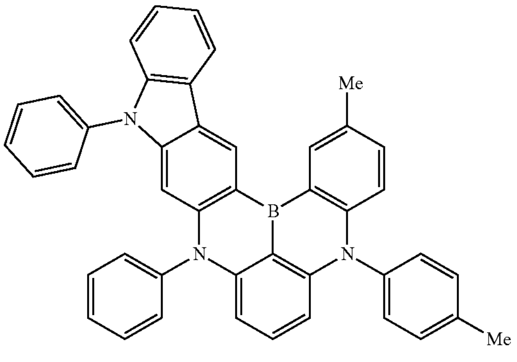

-continued
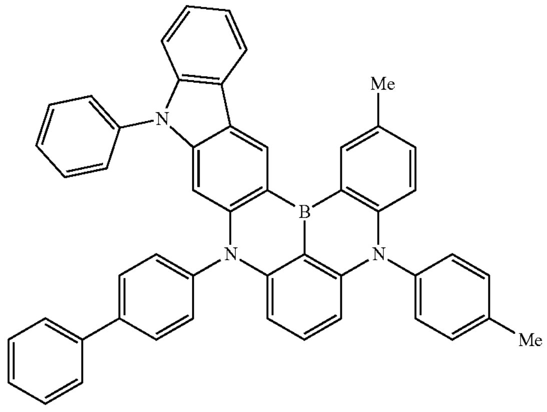
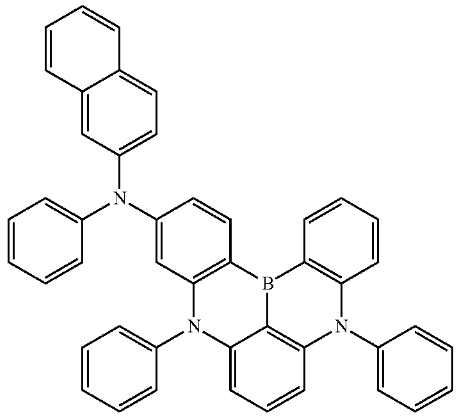
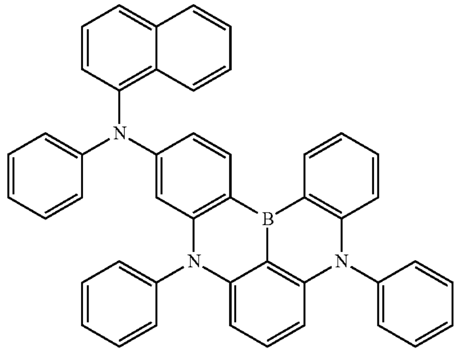
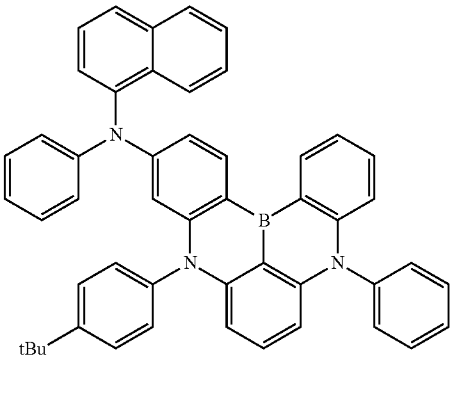
-continued
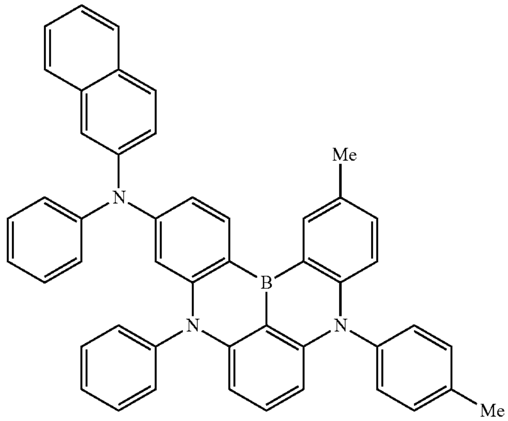
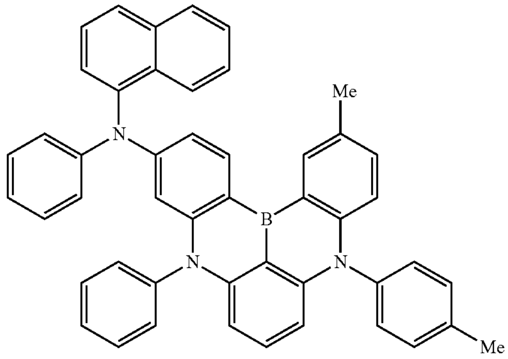
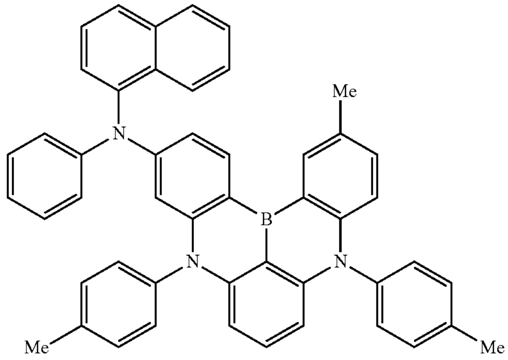
[Formula 209]
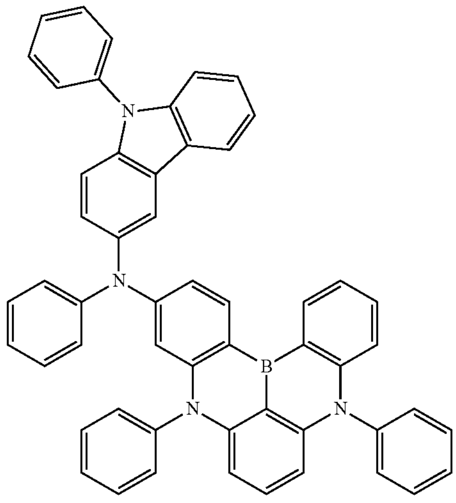

-continued
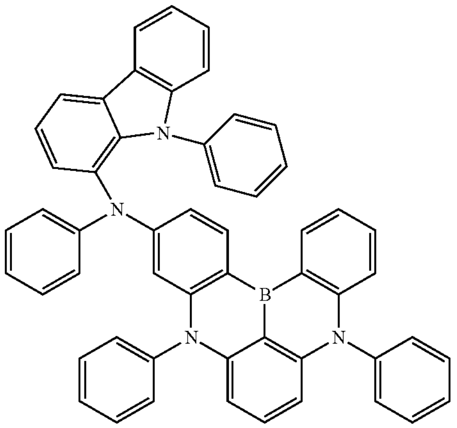
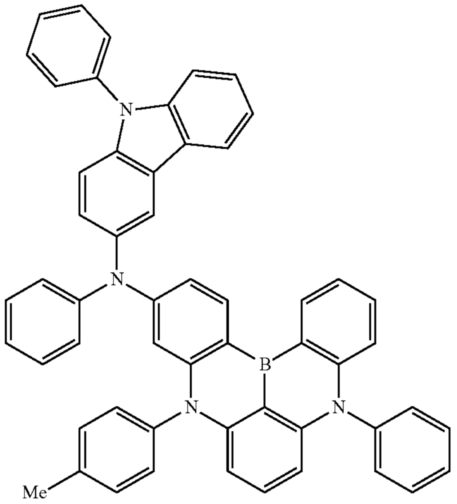
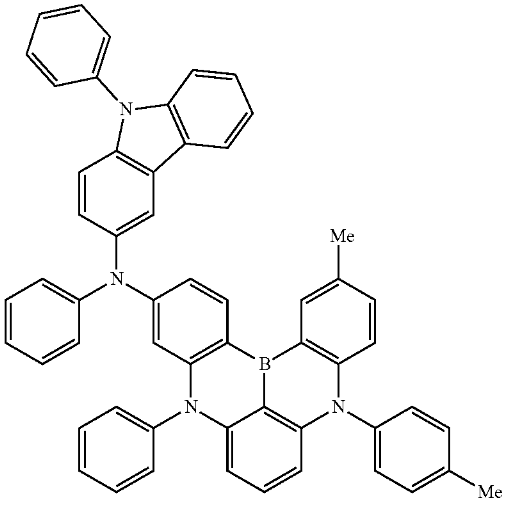
-continued
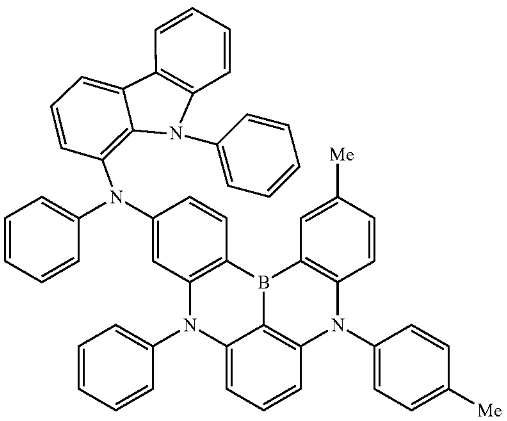
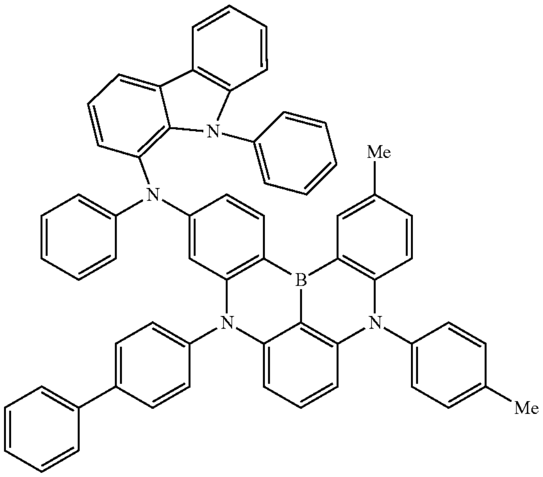
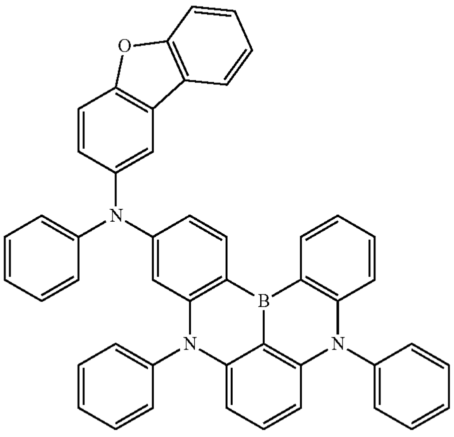

-continued
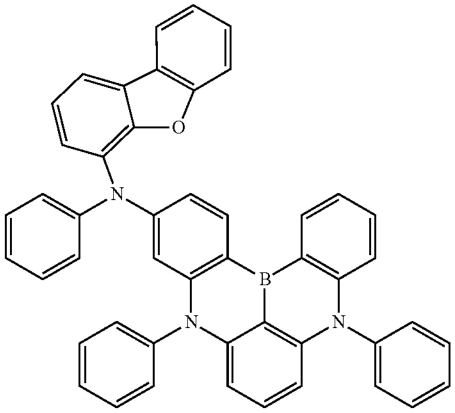
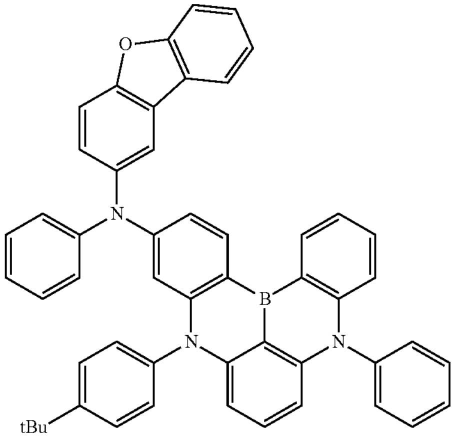
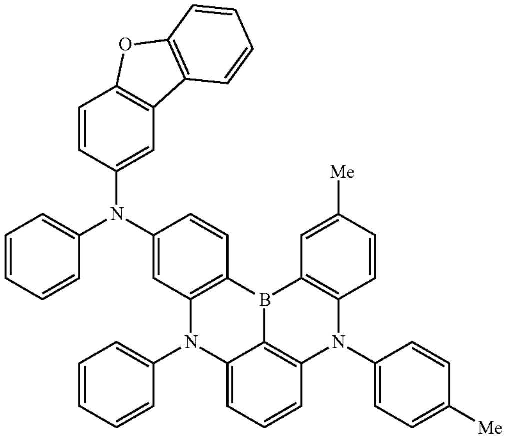
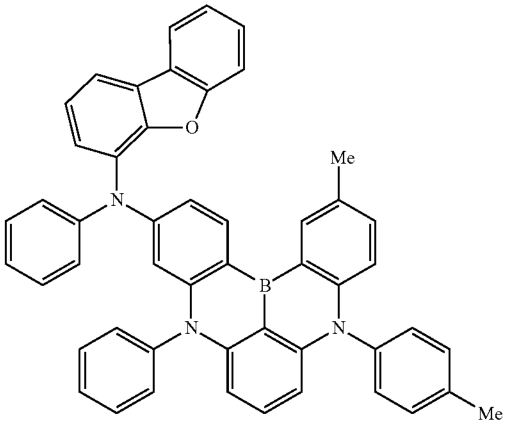
-continued
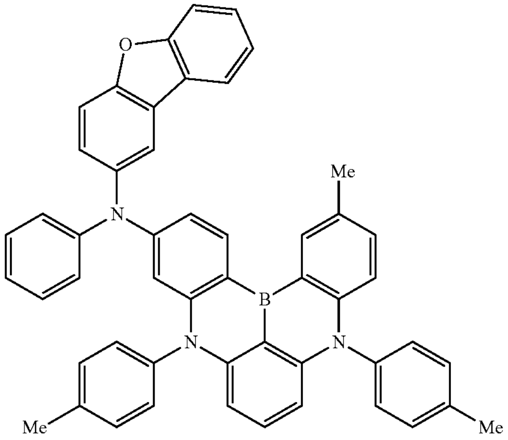
[Formula 210]
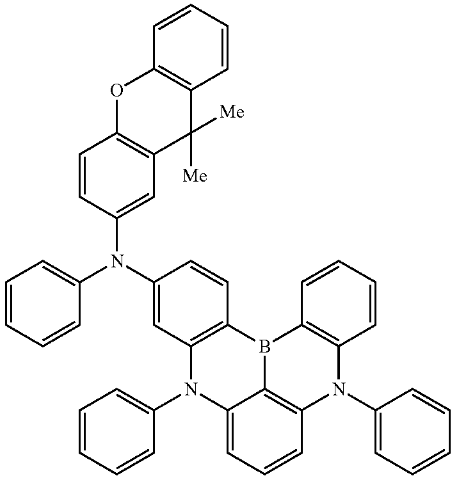
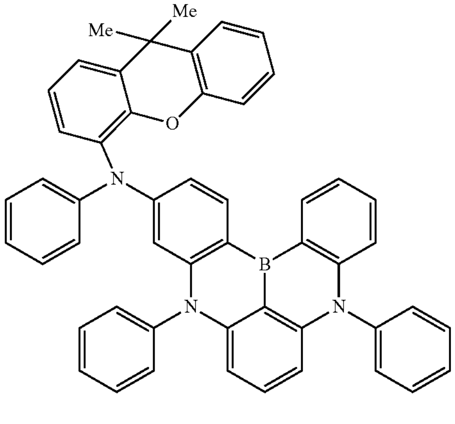

-continued
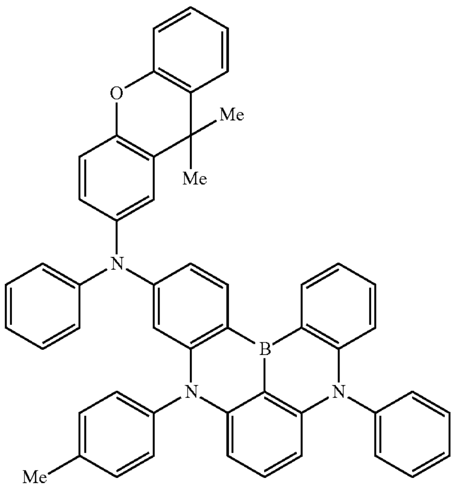
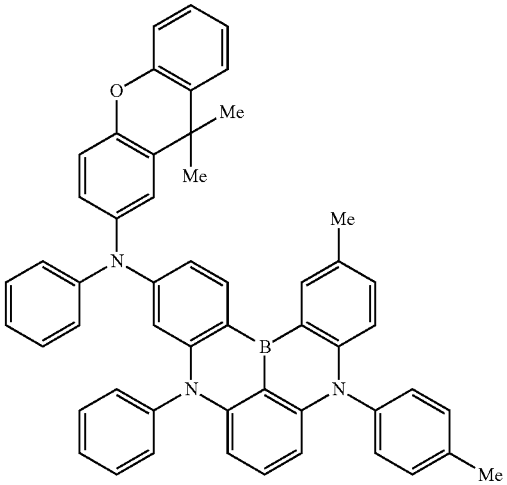
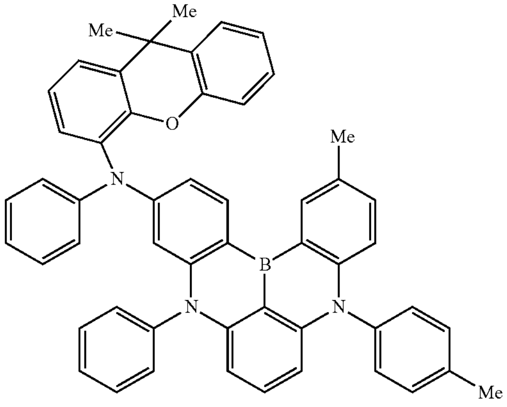
-continued
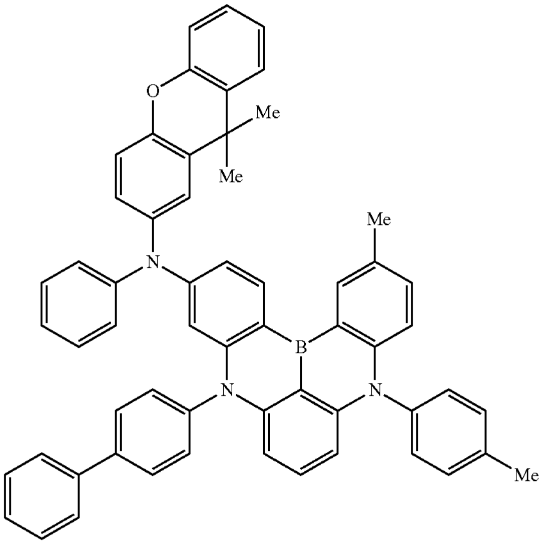
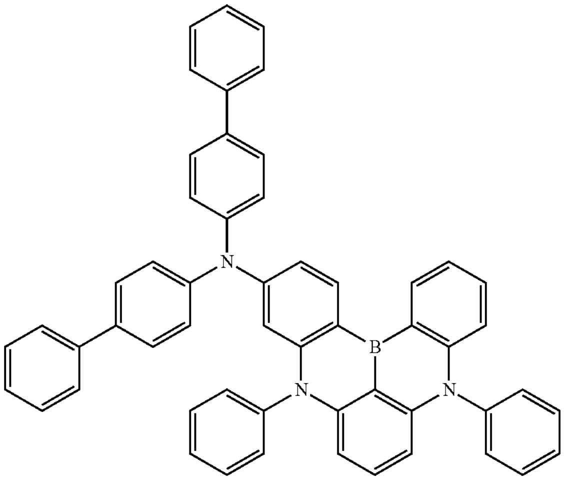
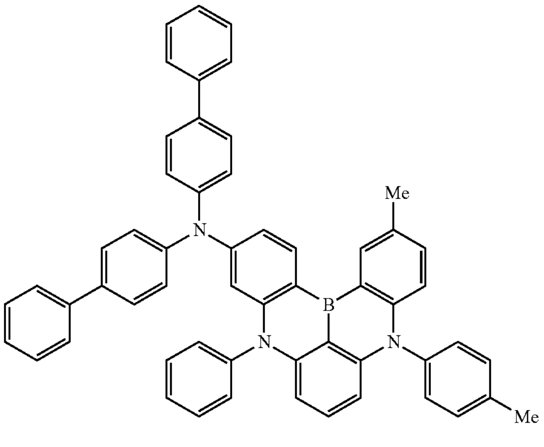

-continued
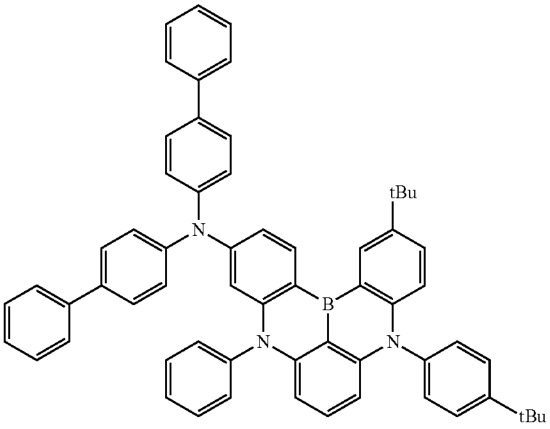
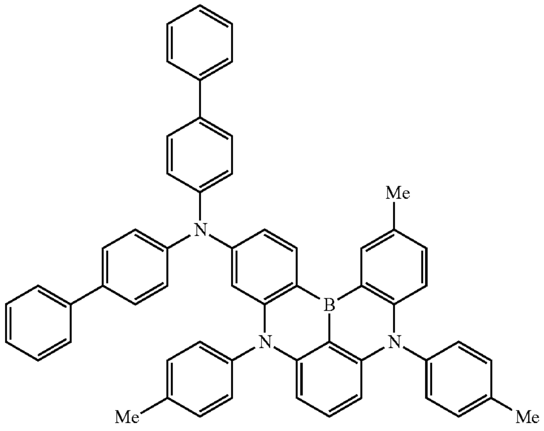
[Formula 211]
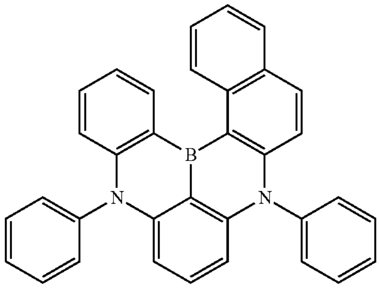
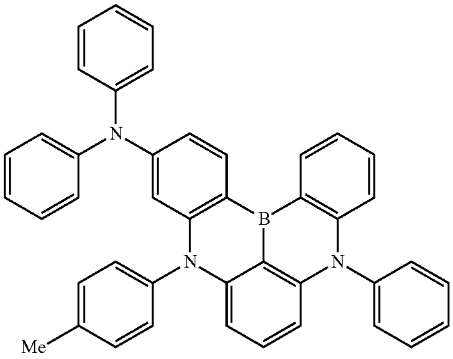
-continued
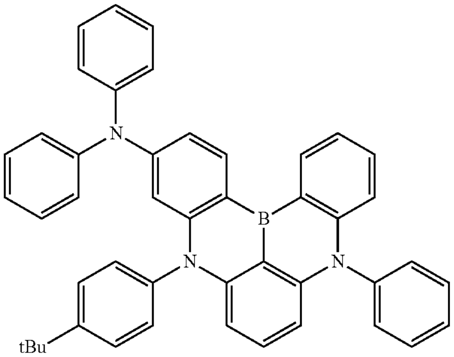
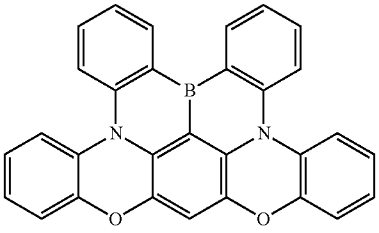
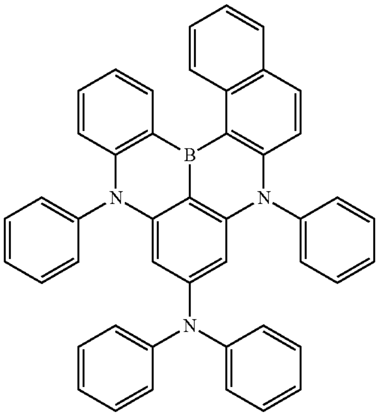
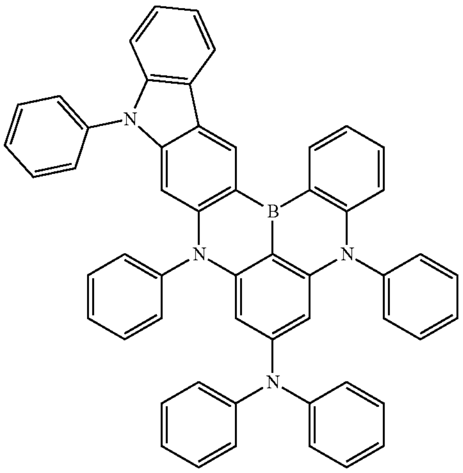

-continued
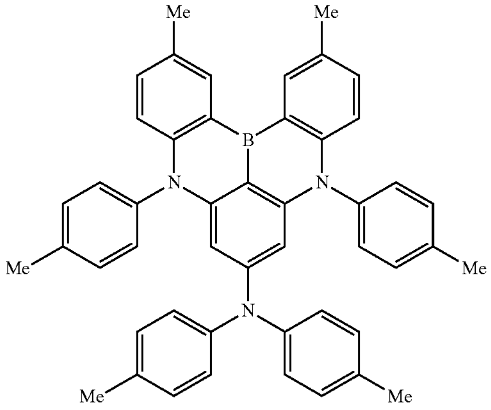
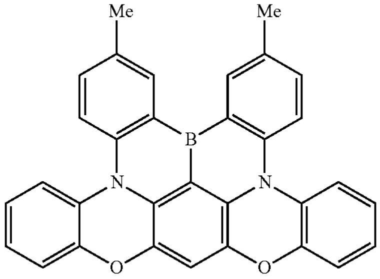
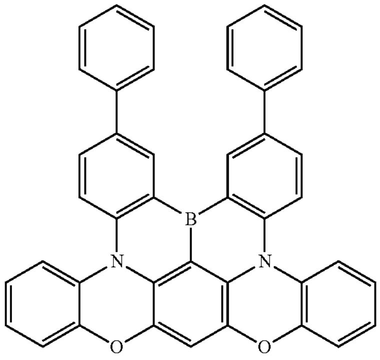
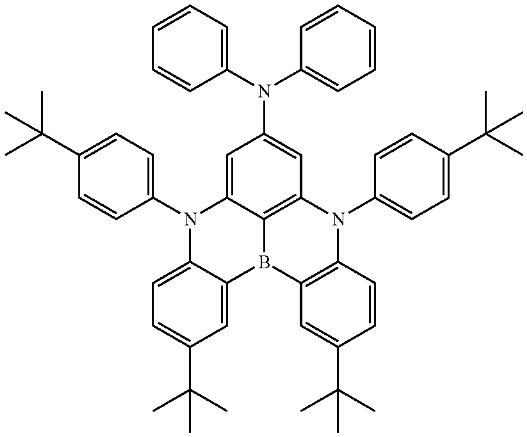
-continued
[Formula 212]
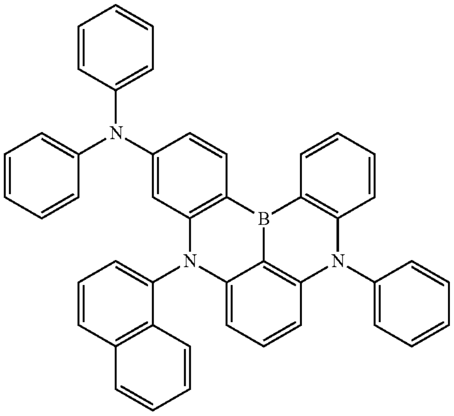
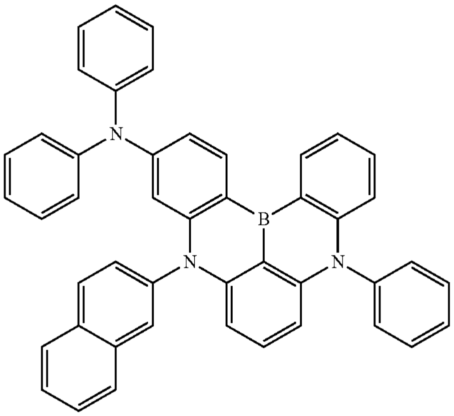
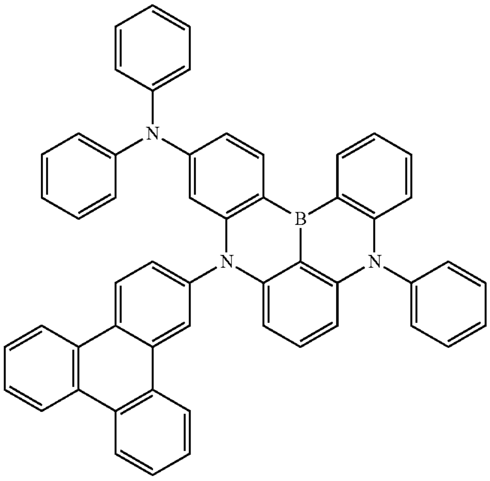

-continued
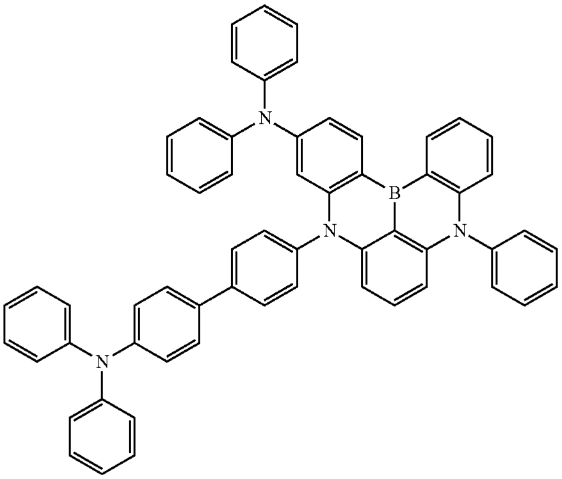
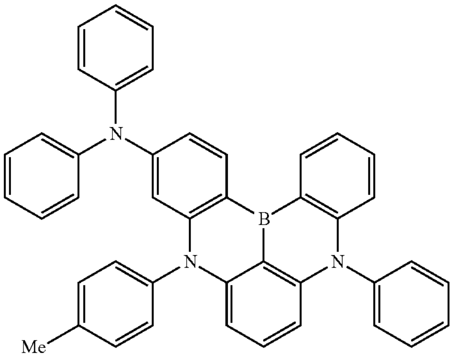
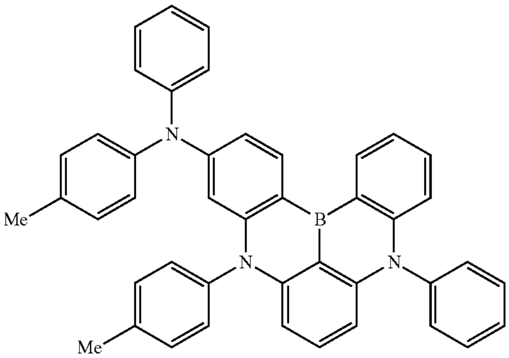
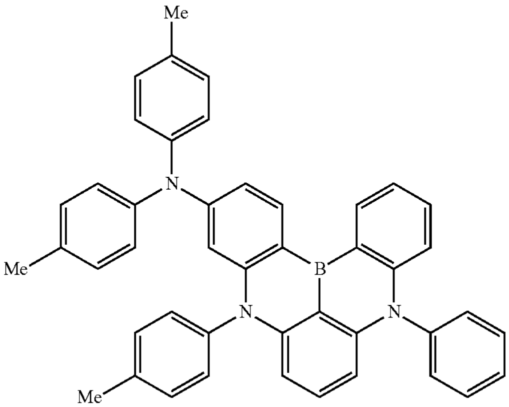
-continued
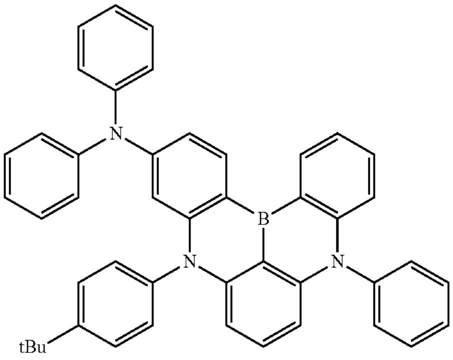
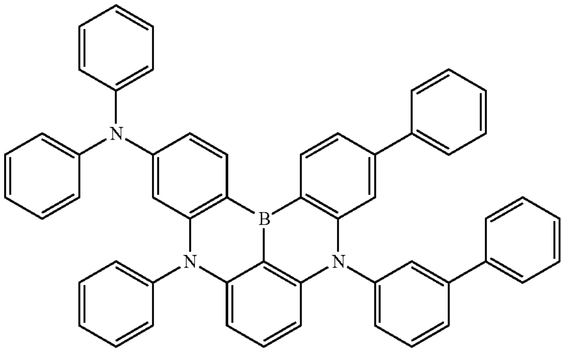
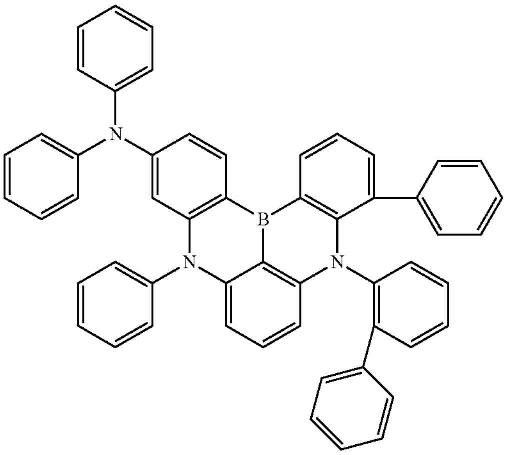
[Formula 213]
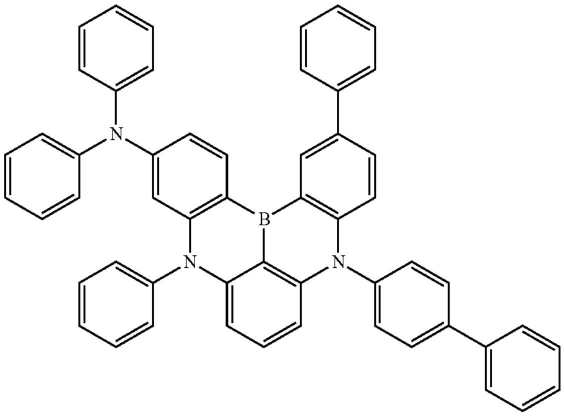

-continued
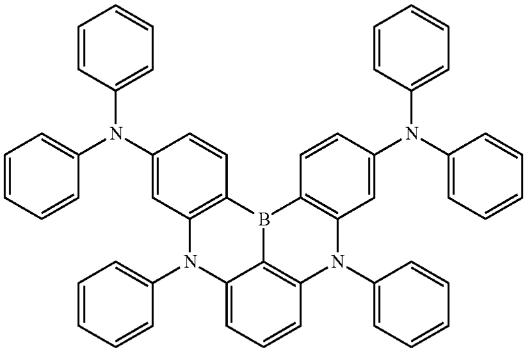
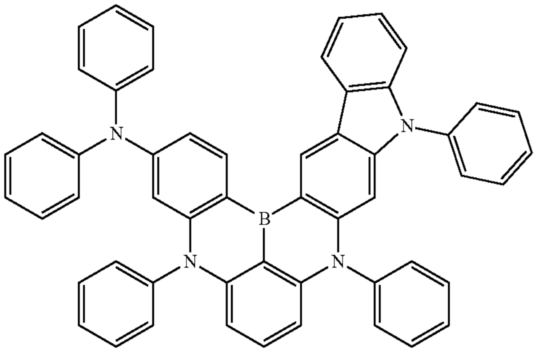
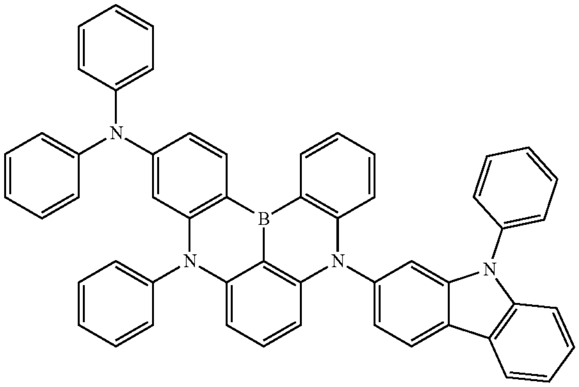
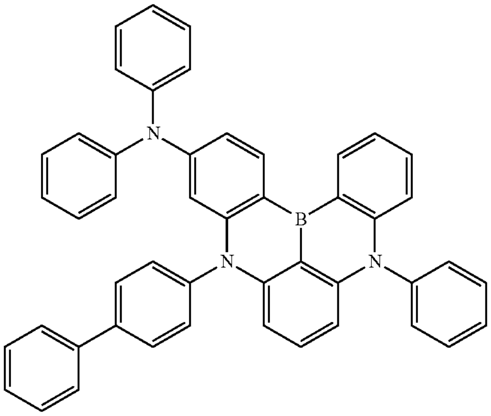
-continued
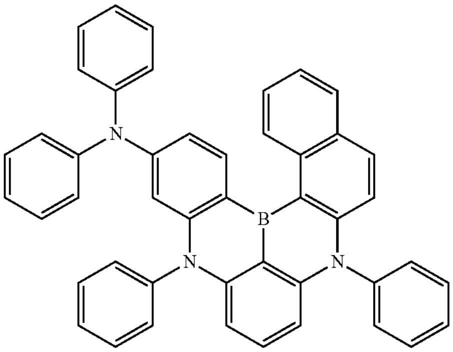
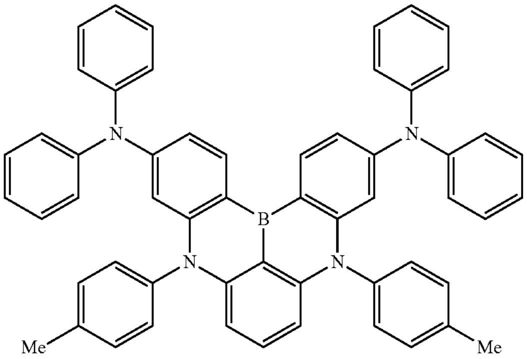
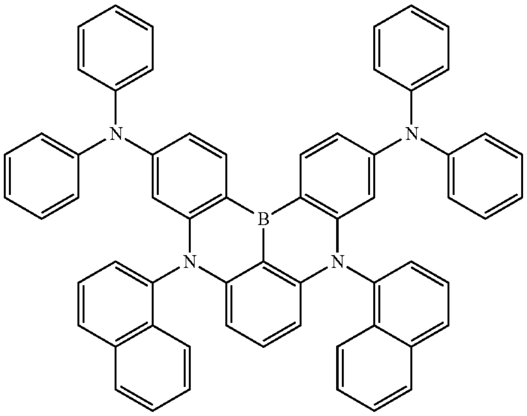
[Formula 214]
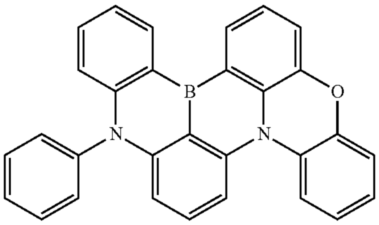

-continued
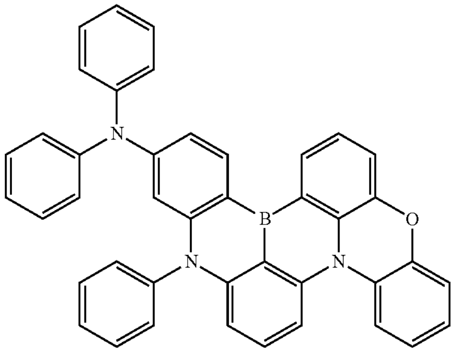
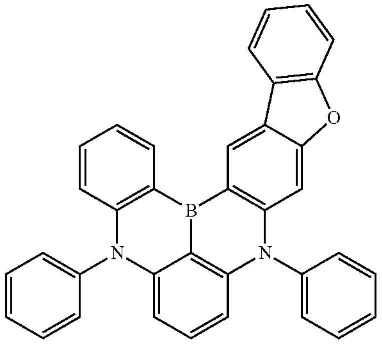
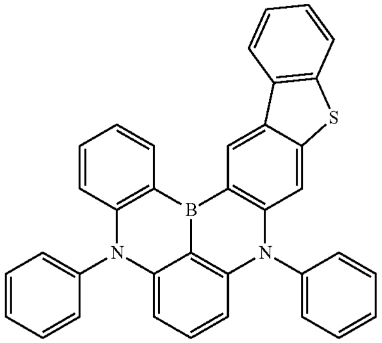
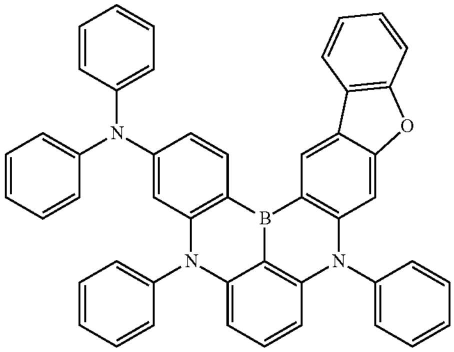
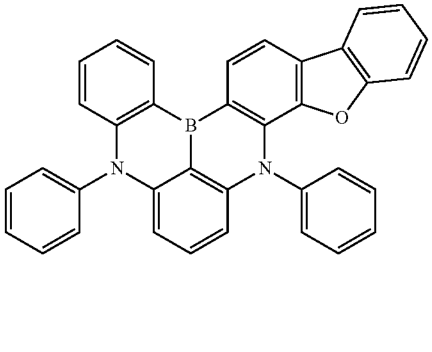
-continued
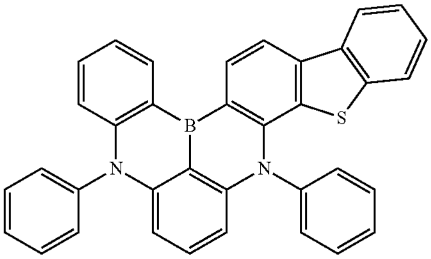
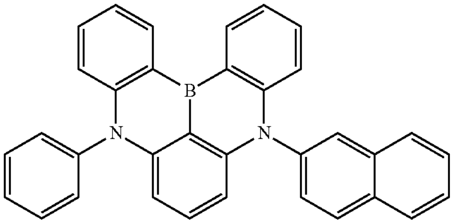
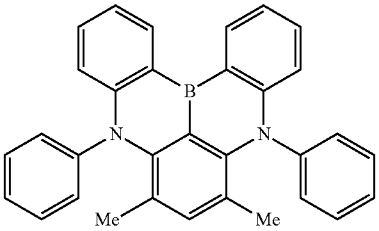
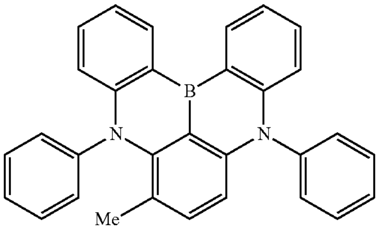
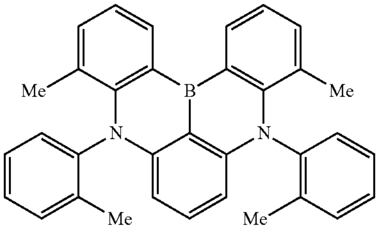
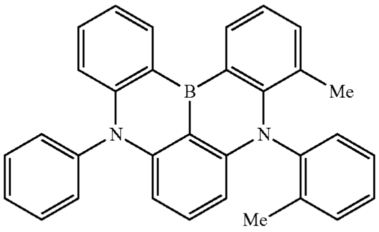
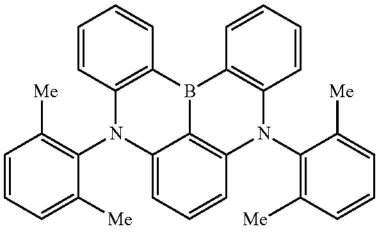

-continued

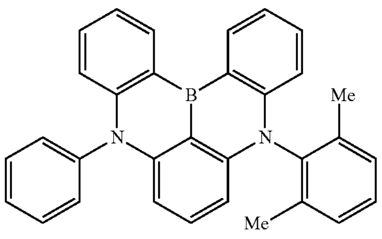

Compound Represented by Formula (7)

The compound represented by the formula (7) will be described below.

[Formula 215]

(7)

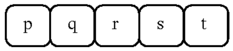

[Formula 216]

(72)

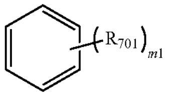

(73)

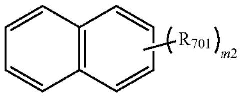

(74)

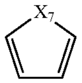

(75)

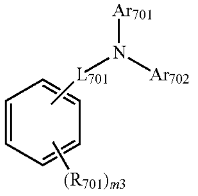

(76)

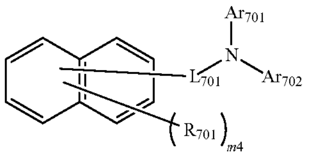

In the formula (7): r ring is a ring represented by the formula (72) or the formula (73), the r ring being fused with at any position(s) of respective adjacent rings;

q ring and s ring are each independently a ring represented by the formula (74) and fused with any position(s) of respective adjacent rings;

p ring and t ring are each independently a moiety represented by the formula (75) or the formula (76) and fused with any position(s) of respective adjacent rings;

$X_7$ is an oxygen atom, a sulfur atom, or $NR_{702}$;

when a plurality of $R_{701}$ are present, adjacent ones of the plurality of $R_{701}$ are mutually bonded to form a substituted or unsubstituted monocyclic ring, mutually bonded to form a substituted or unsubstituted fused ring, or not mutually bonded;

$R_{701}$ and $R_{702}$ neither forming the monocyclic ring nor forming the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$Ar_{701}$ and $Ar_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$L_{701}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms;

m1 is 0, 1, or 2;

m2 is 0, 1, 2, 3, or 4;

m3 is each independently 0, 1, 2, 3 or 3;

m4 is each independently 0, 1, 2, 3, 4, or 5;

when a plurality of $R_{701}$ are present, the plurality of $R_{701}$ are mutually the same or different;

when a plurality of $X_7$ are present, the plurality of $X_7$ are mutually the same or different;

when a plurality of $R_{702}$ are present, the plurality of $R_{702}$ are mutually the same or different;

when a plurality of $Ar_{701}$ are present, the plurality of $Ar_{701}$ are mutually the same or different;

when a plurality of $Ar_{702}$ are present, the plurality of $Ar_{702}$ are mutually the same or different; and when a plurality of $L_{701}$ are present, the plurality of $L_{701}$ are mutually the same or different.

In the formula (7), each of the p ring, q ring, r ring, s ring, and t ring is fused with an adjacent ring(s) sharing two carbon atoms. The fused position and orientation are not limited but may be defined as required.

In an exemplary embodiment, in the formula (72) or the formula (73) representing the r ring, m1=0 or m2=0.

In an exemplary embodiment, the compound represented by the formula (7) is represented by any one of formulae (71-1) to (71-6) below.

-continued

[Formula 217]

(71-1)

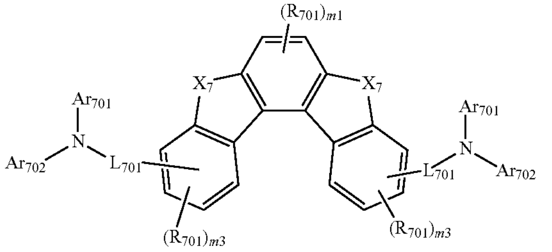

[Formula 218]

(71-2)

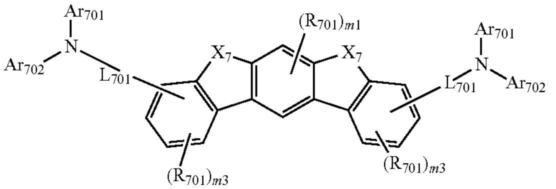

[Formula 219]

(71-3)

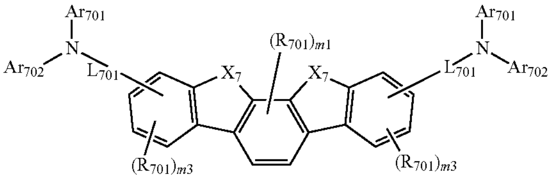

[Formula 220]

(71-4)

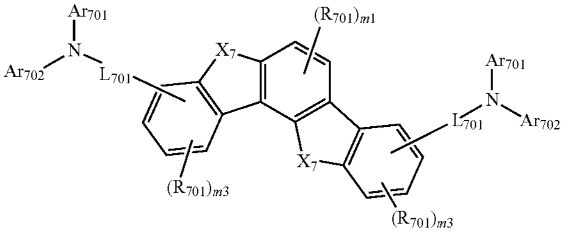

[Formula 221]

(71-5)

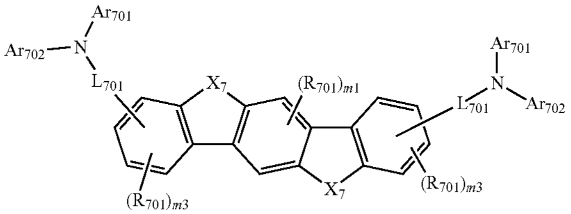

[Formula 222]

(71-6)

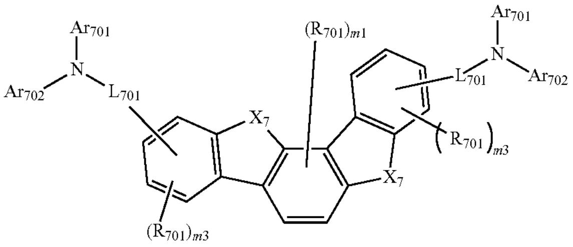

In the formulae (71-1) to (71-6), $R_{701}$, $X_7$, $Ar_{701}$, $Ar_{702}$, $L_{701}$, m1 and m3 represent the same as $R_{701}$, $X_7$, $Ar_{701}$, $Ar_{702}$, $L_{701}$, m1 and m3, respectively, in the formula (7).

In an exemplary embodiment, the compound represented by the formula (7) is represented by any one of formulae (71-11) to (71-13) below.

[Formula 223]

(71-11)

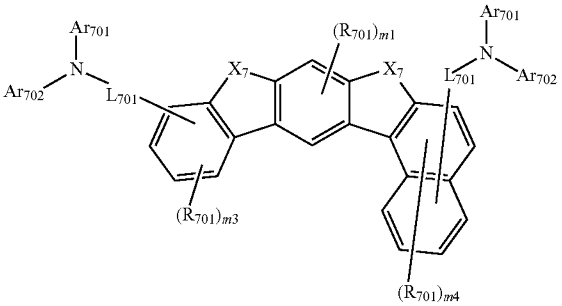

[Formula 224]

(71-12)

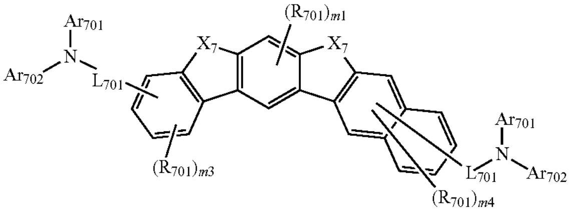

[Formula 225]

(71-13)

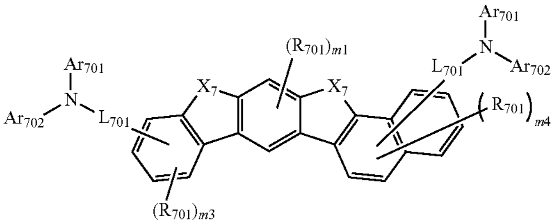

In the formulae (71-11) to (71-13), $R_{701}$, $X_7$, $Ar_{701}$, $Ar_{702}$, $L_{701}$, m1, m3 and m4 represent the same as $R_{701}$, $X_7$, $Ar_{701}$, $Ar_{702}$, $L_{701}$, m1, m3 and m4, respectively, in the formula (7).

In an exemplary embodiment, the compound represented by the formula (7) is represented by any one of formulae (71-21) to (71-25) below.

[Formula 226]
(71-21)
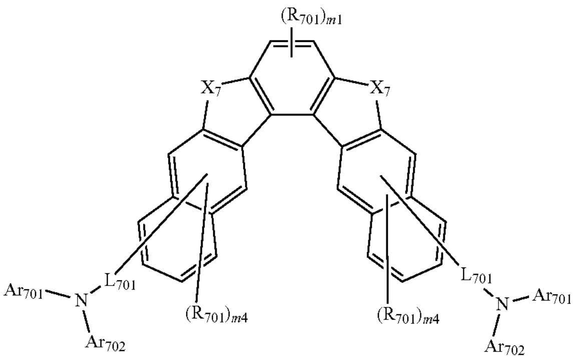
[Formula 227]
(71-22)
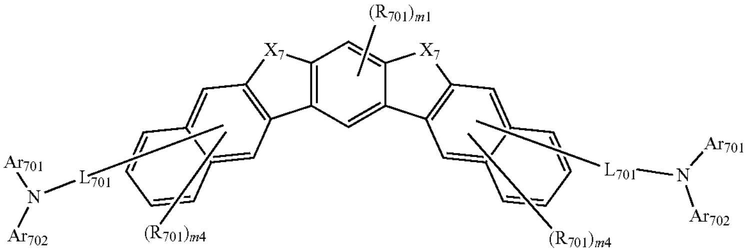
[Formula 228]
(71-23)
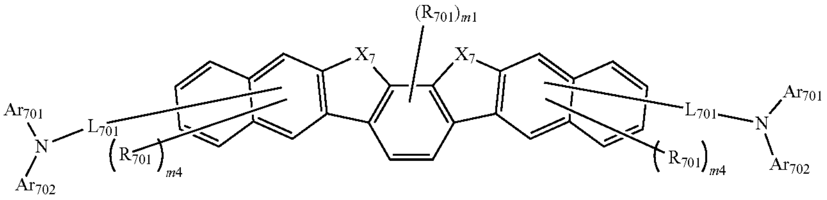
[Formula 229]
(71-24)
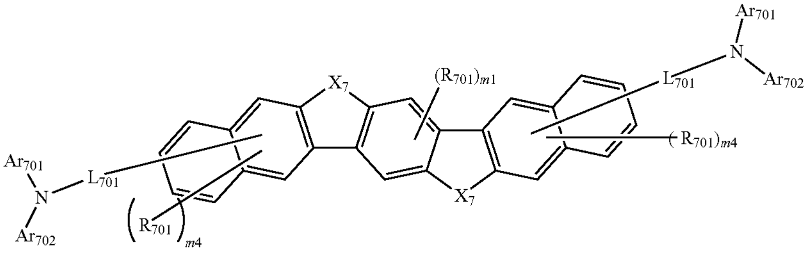

-continued
[Formula 230]
(71-25)
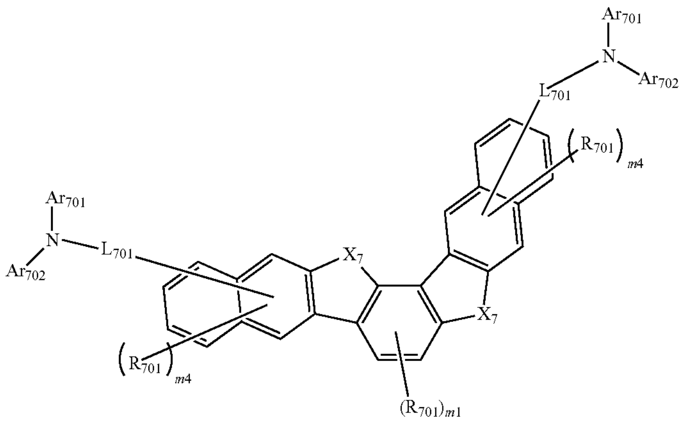
In the formulae (71-21) to (71-25), $R_{701}$, $X_7$, $Ar_{701}$, $Ar_{702}$, $L_{701}$, m1 and m4 represent the same as $R_{701}$, $X_7$, $Ar_{701}$, $Ar_{702}$, $L_{701}$, m1 and m4, respectively, in the formula (7).
In an exemplary embodiment, the compound represented by the formula (7) is represented by any one of formulae (71-31) to (71-33) below.
[Formula 231]
(71-31)
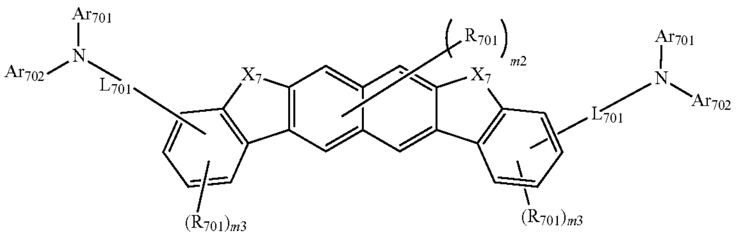
[Formula 232]
(71-32)
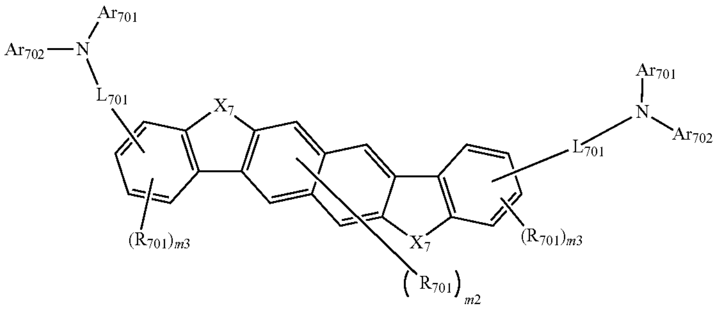
[Formula 233]
(71-33)
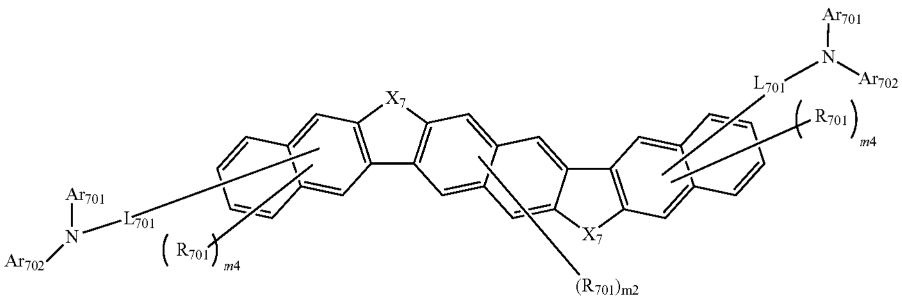

In the formulae (71-31) to (71-33), $R_{701}$, $X_7$, $Ar_{701}$, $Ar_{702}$, $L_{701}$, and m2 to m4 represent the same as $R_{701}$, $X_7$, $Ar_{701}$, $Ar_{702}$, $L_{701}$, and m2 to m4, respectively, in the formula (7).

In an exemplary embodiment, $Ar_{701}$ and $Ar_{702}$ are each independently a substituted or unsubstituted aryl group having 6 to 50 ring carbon atoms.

In an exemplary embodiment, one of $Ar_{701}$ and $Ar_{702}$ is a substituted or unsubstituted aryl group having 6 to 50 ring carbon atoms, and the other of $Ar_{701}$ and $Ar_{702}$ is a substituted or unsubstituted heterocyclic group having 5 to 50 ring atoms.

Specific Examples of Compound Represented by Formula (7)

Specific examples of the compound represented by the formula (7) include compounds shown below.

[Formula 234]

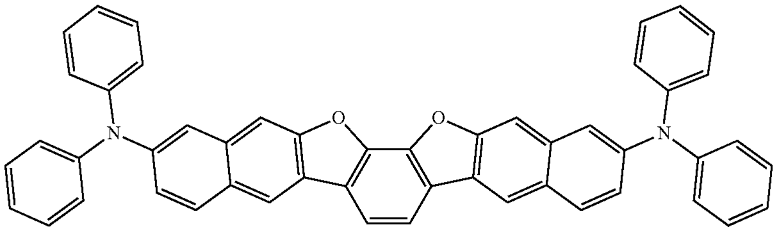

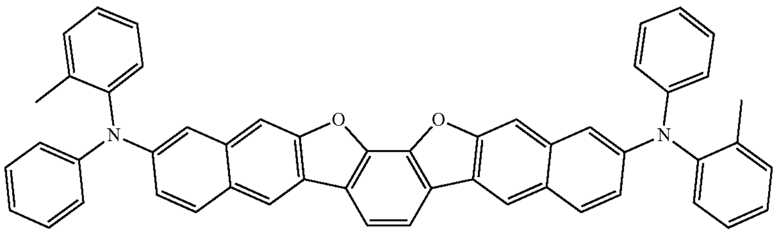

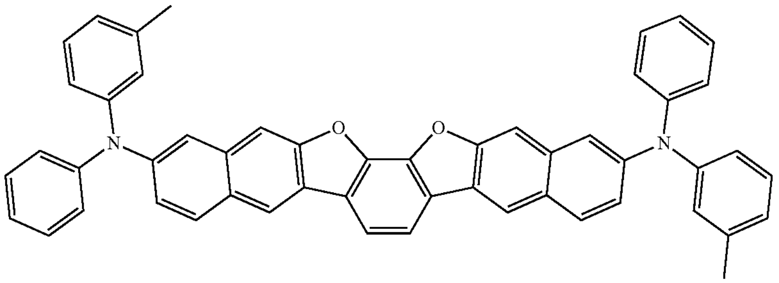

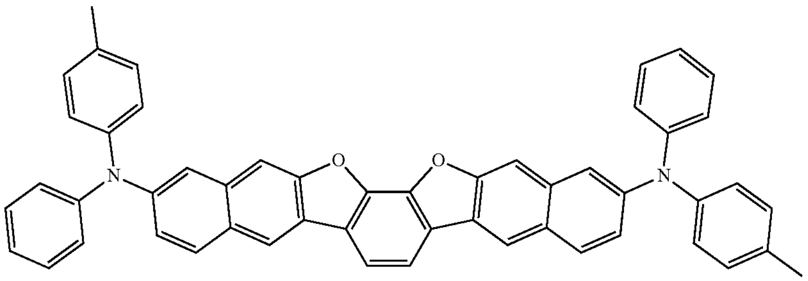

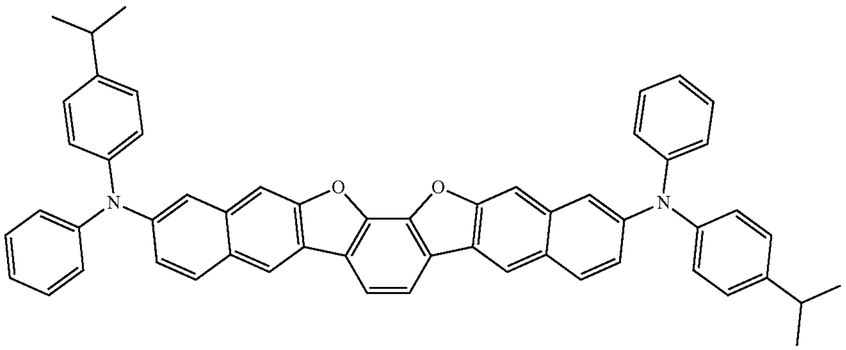

-continued
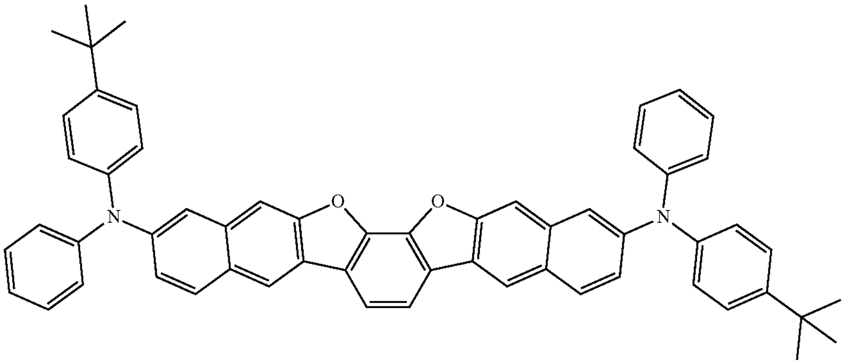
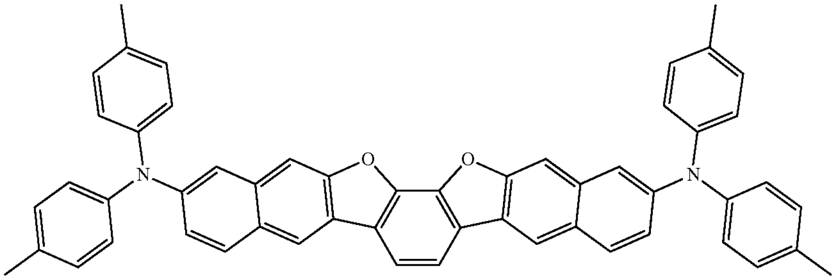
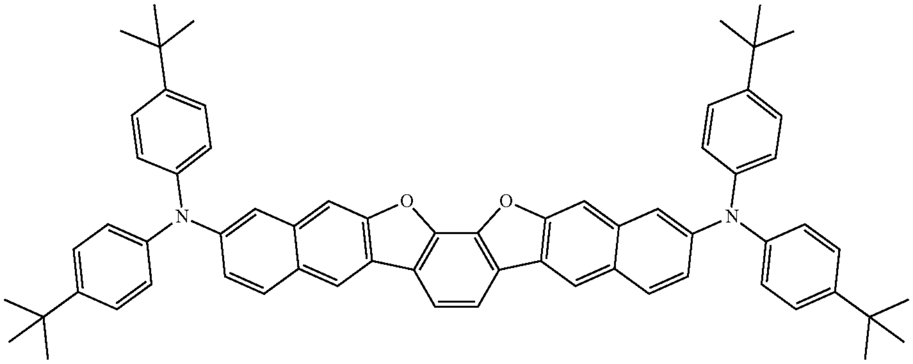
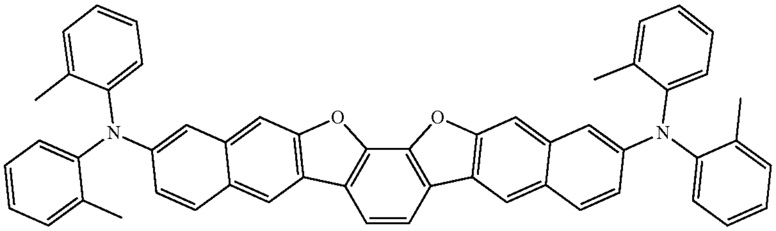
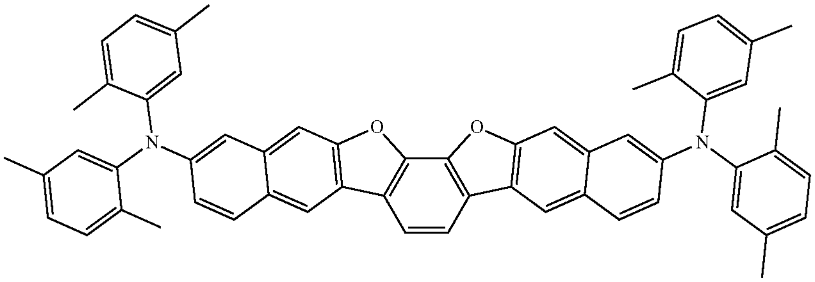

-continued
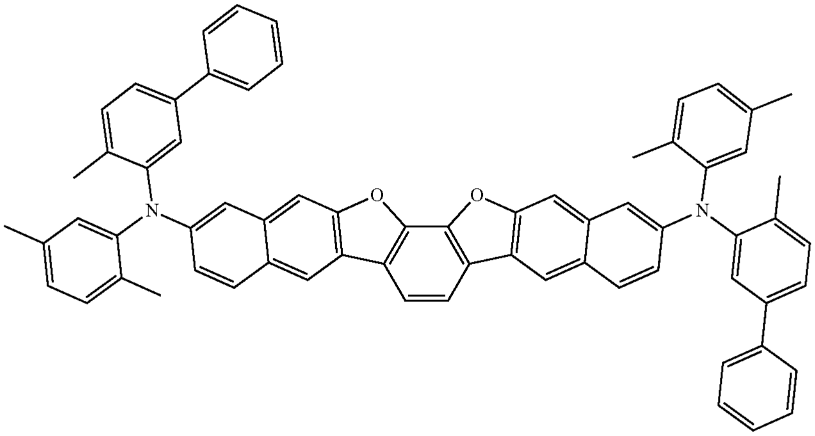
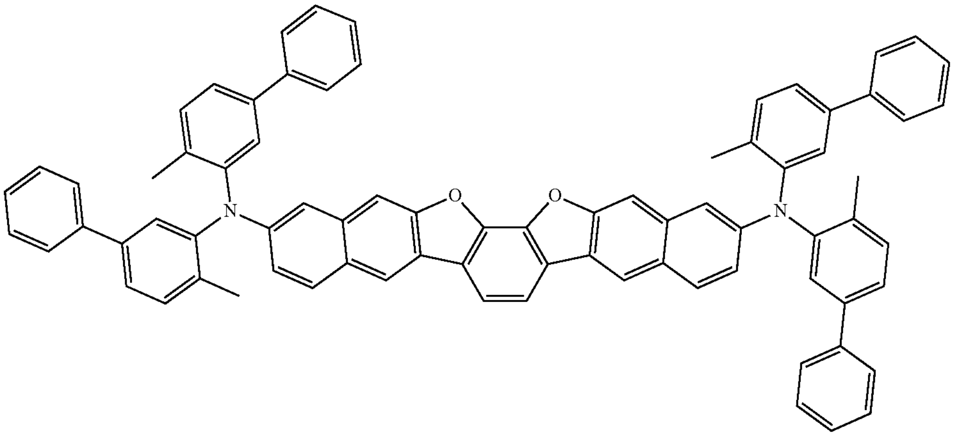
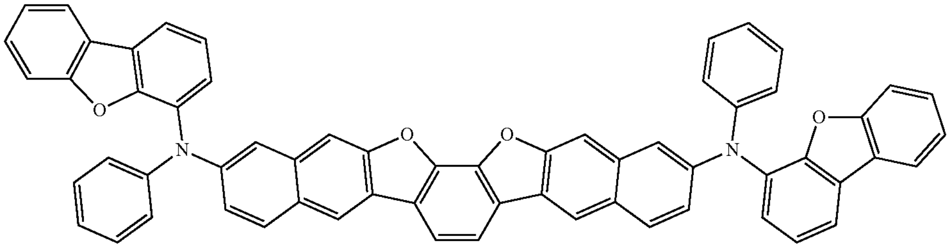
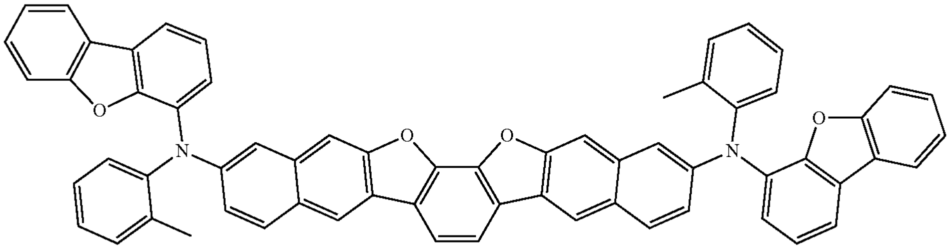
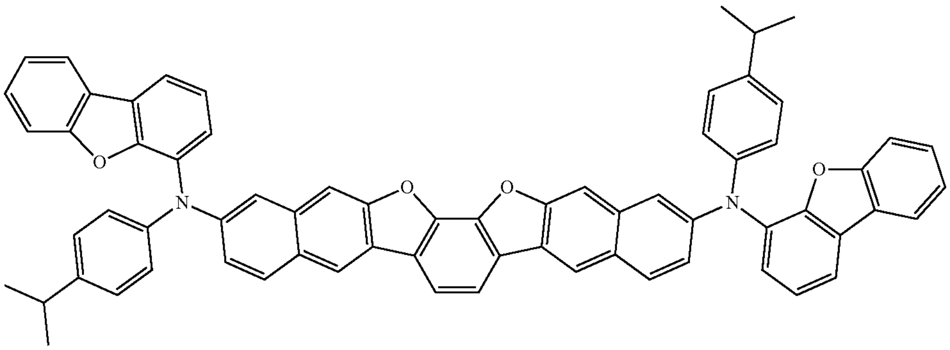

-continued
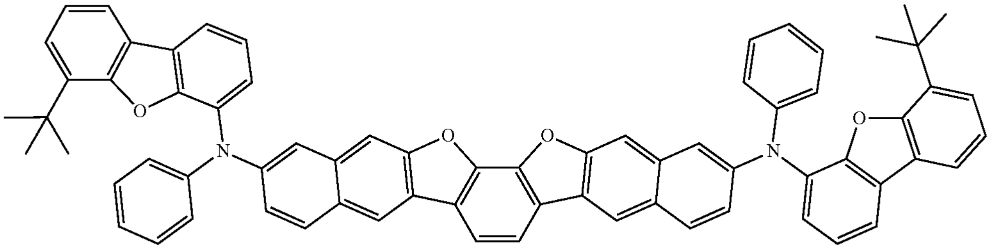
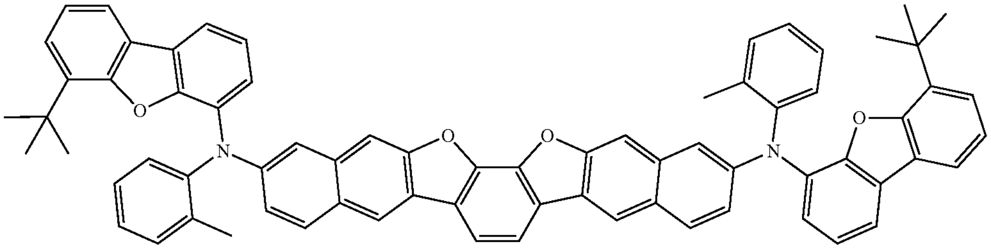
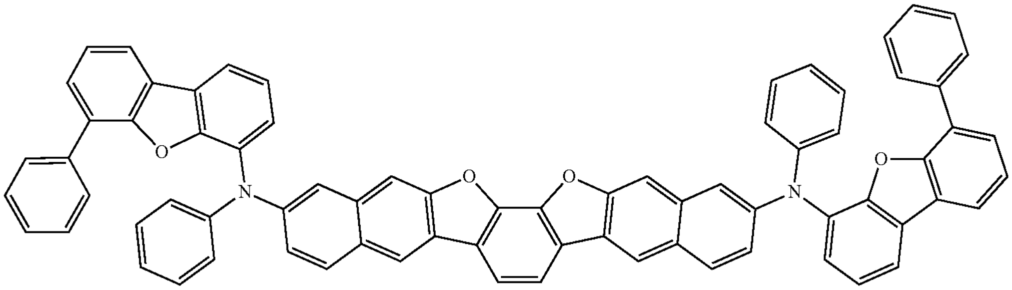
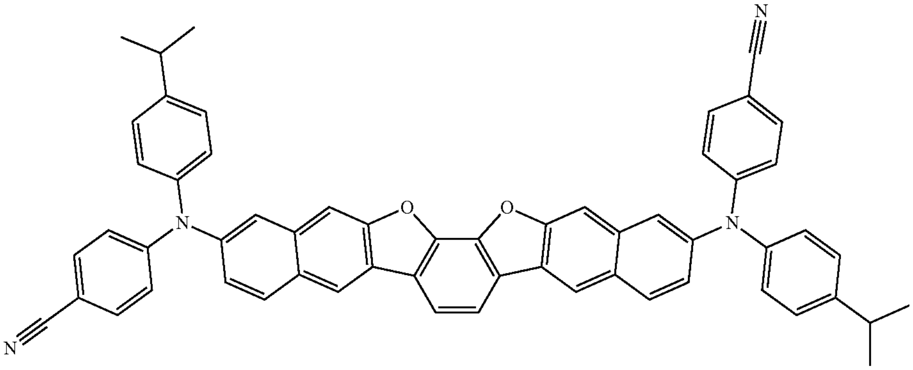
[Formula 235]
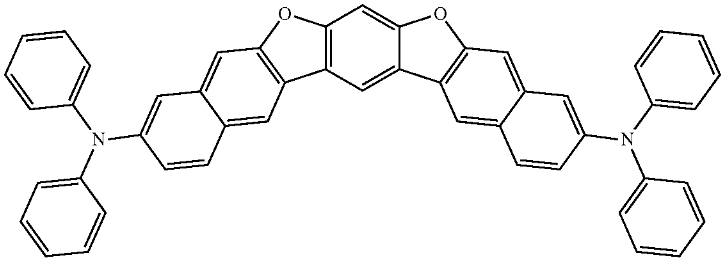
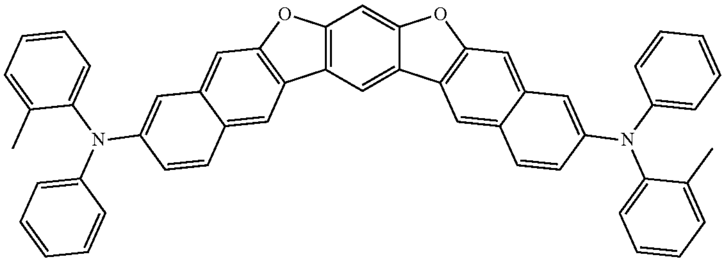

-continued
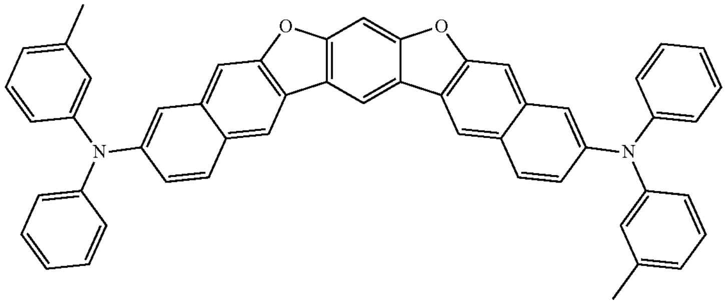
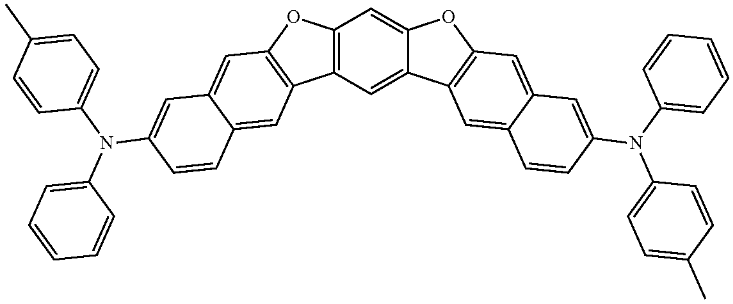
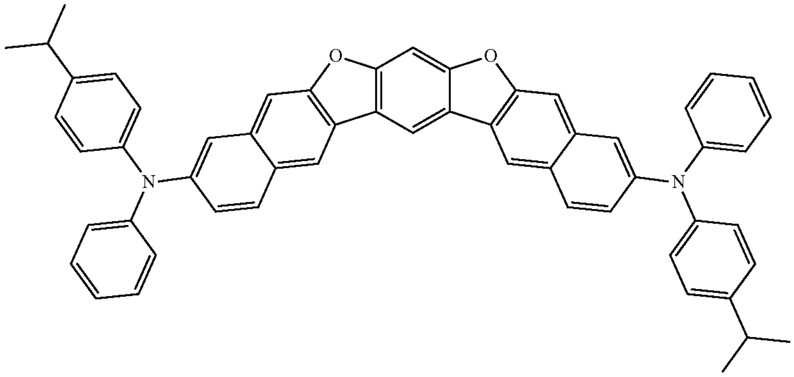
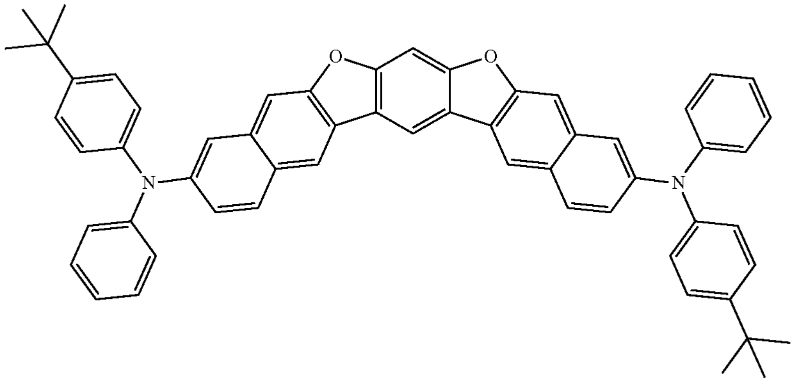
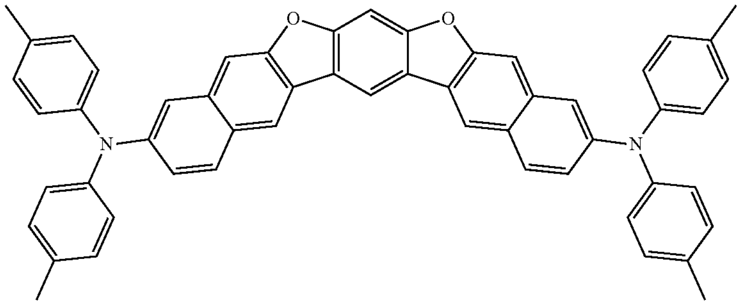

-continued
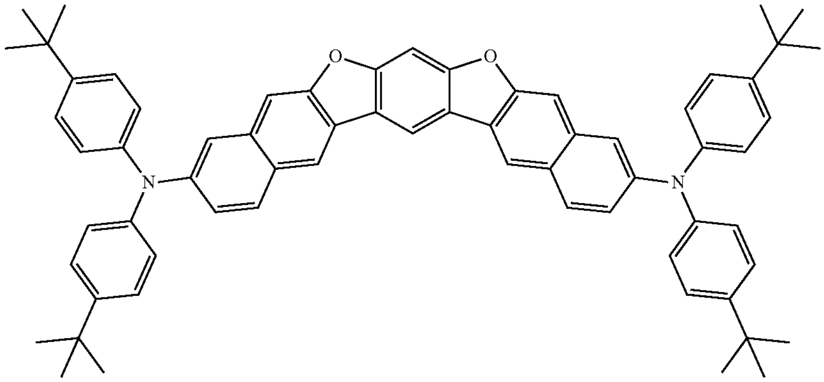
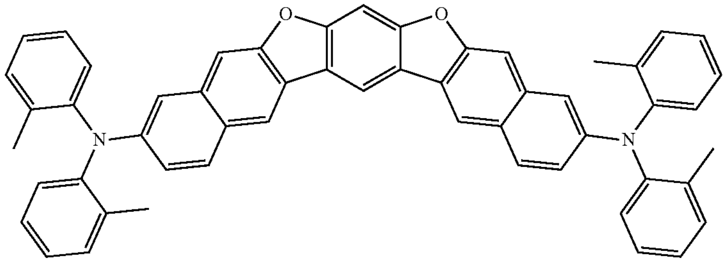
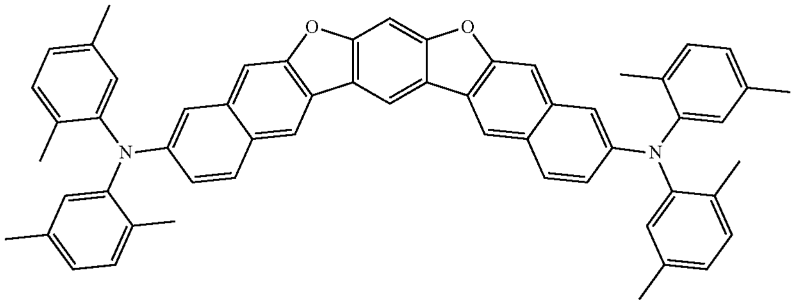
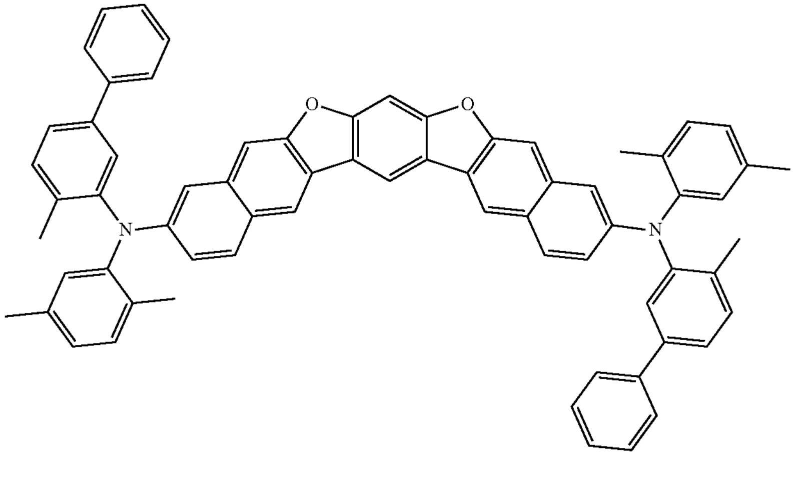

-continued
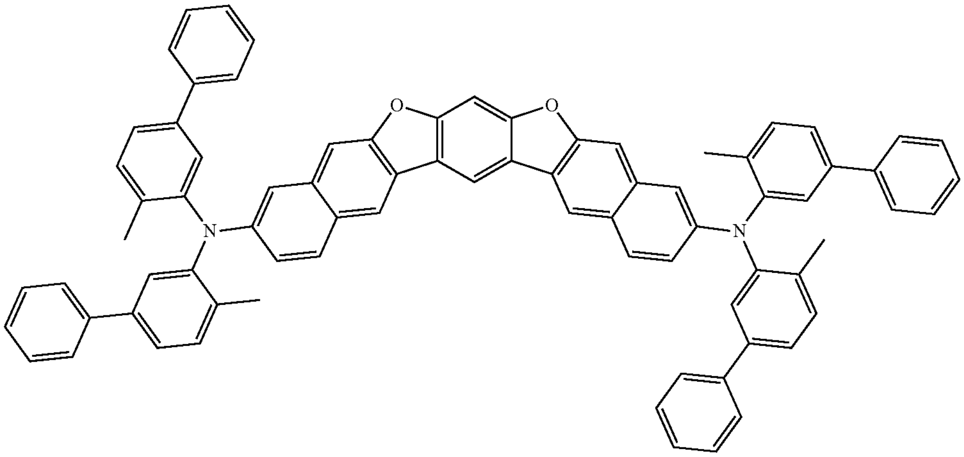
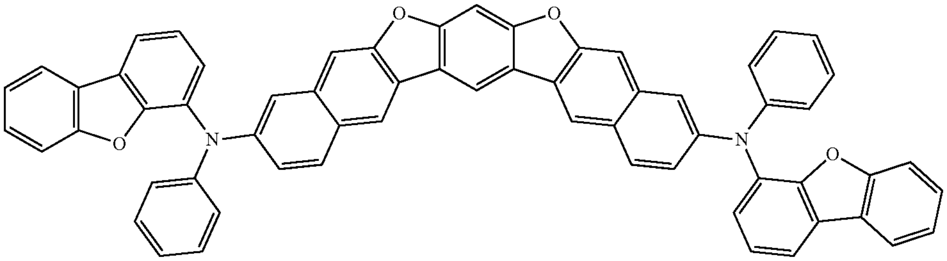
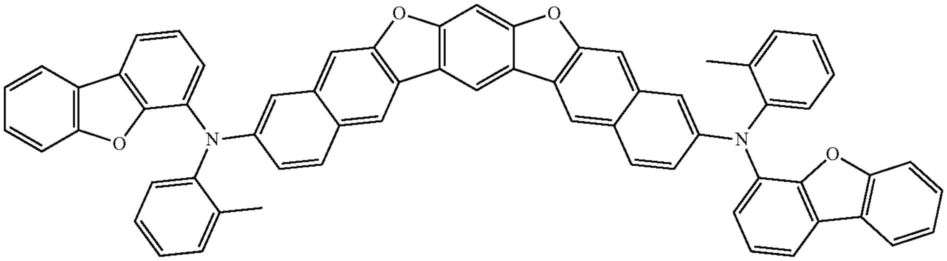
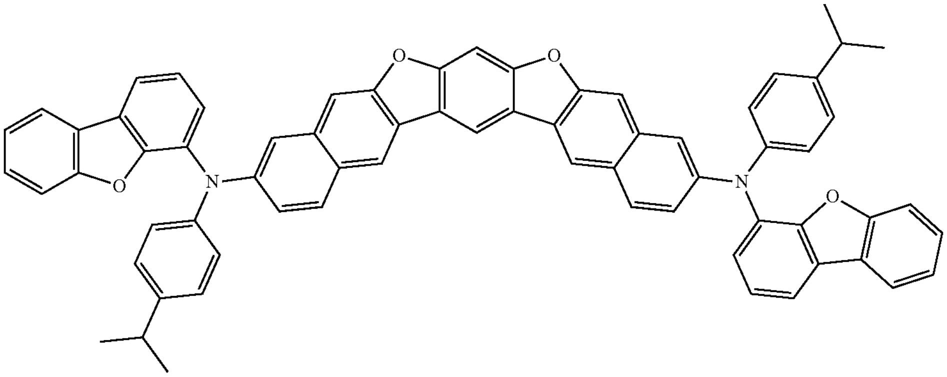
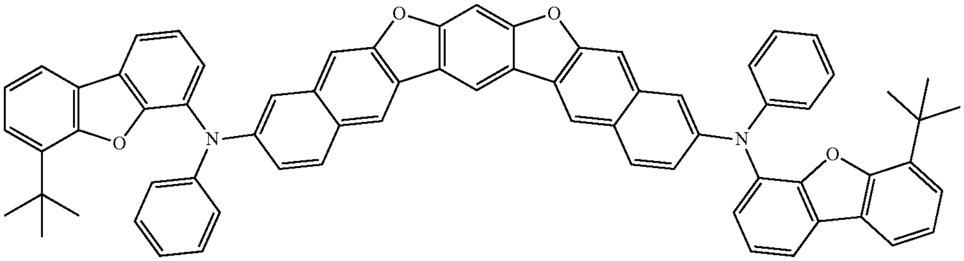

-continued
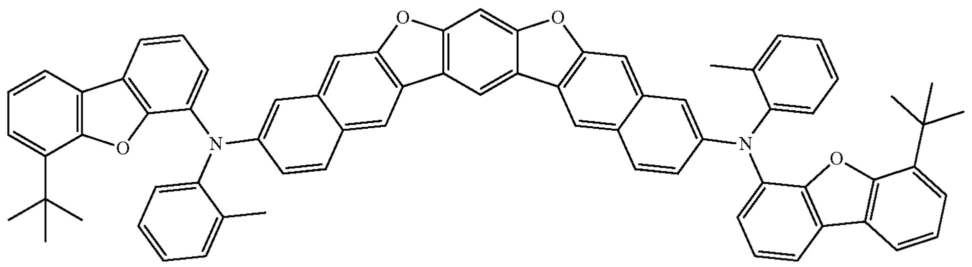
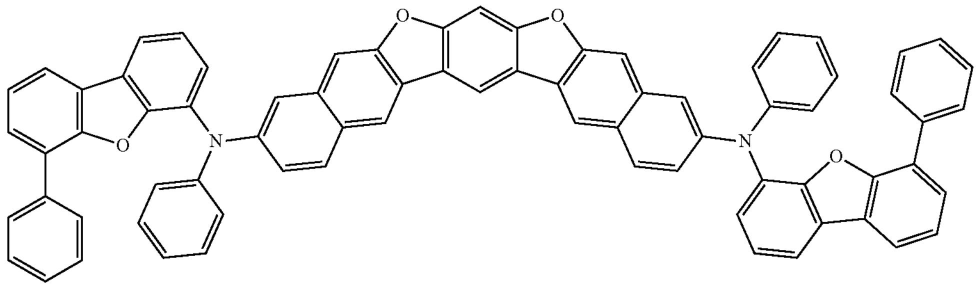
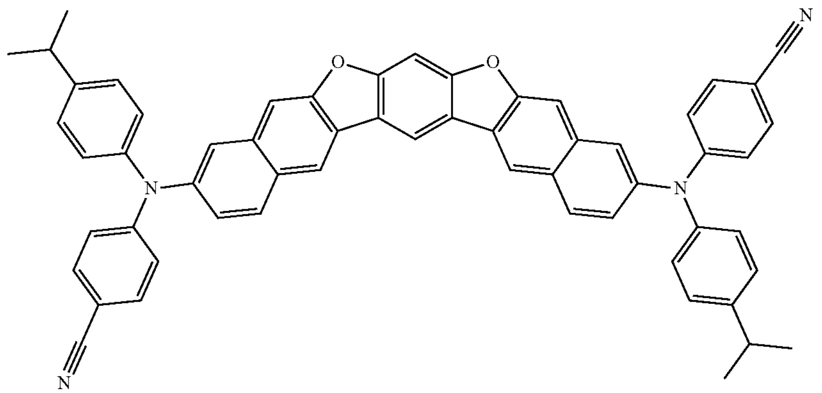
[Formula 236]
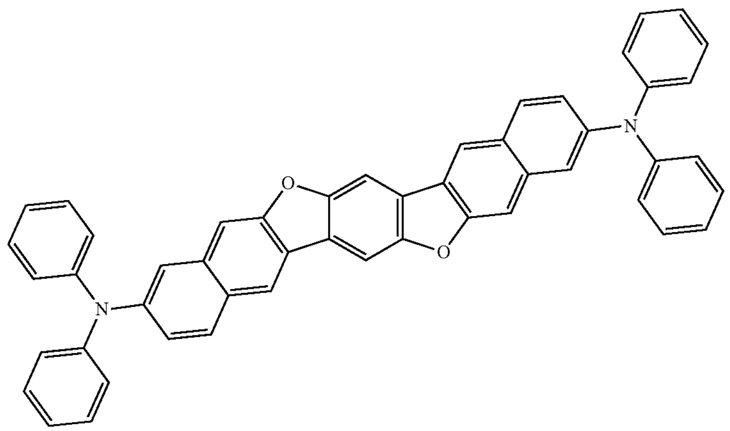

-continued
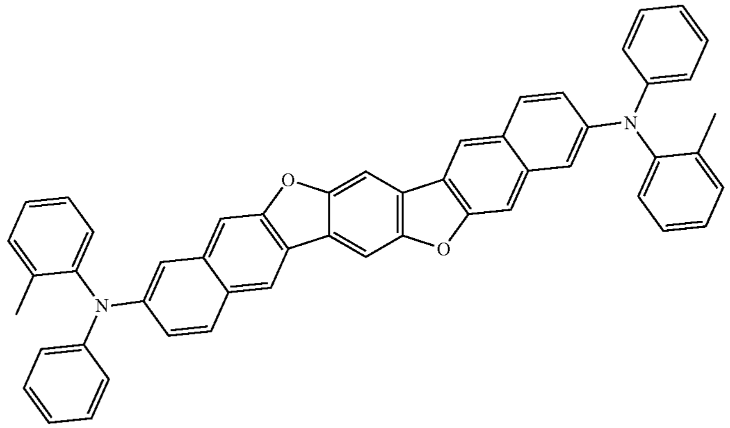
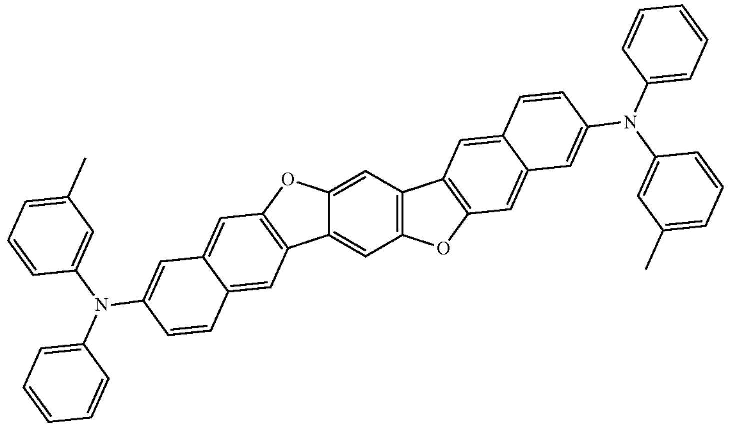
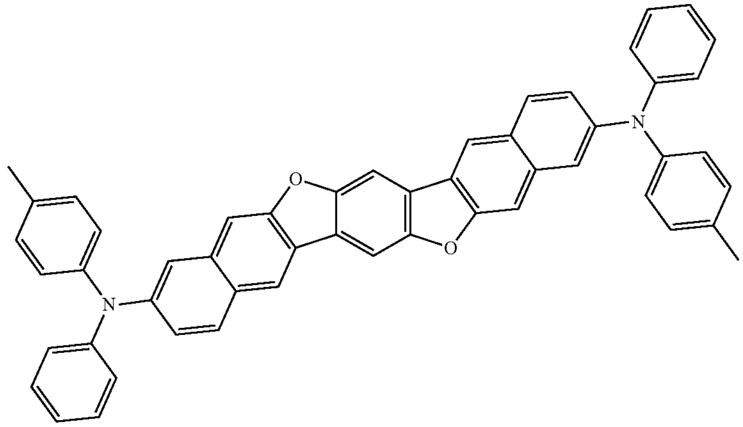
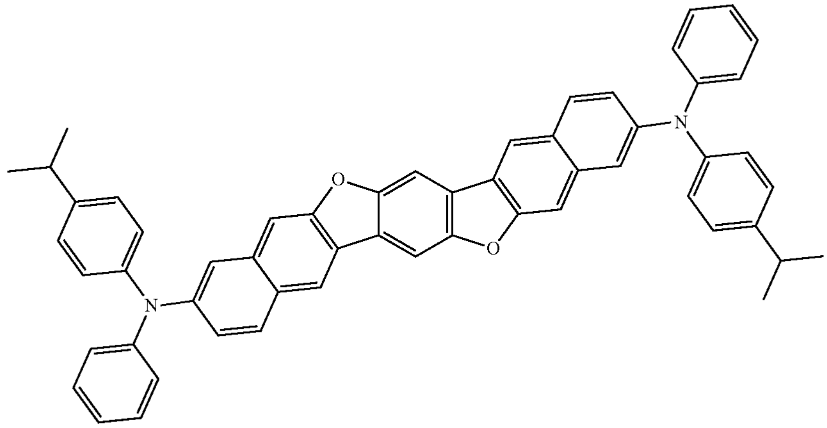

-continued
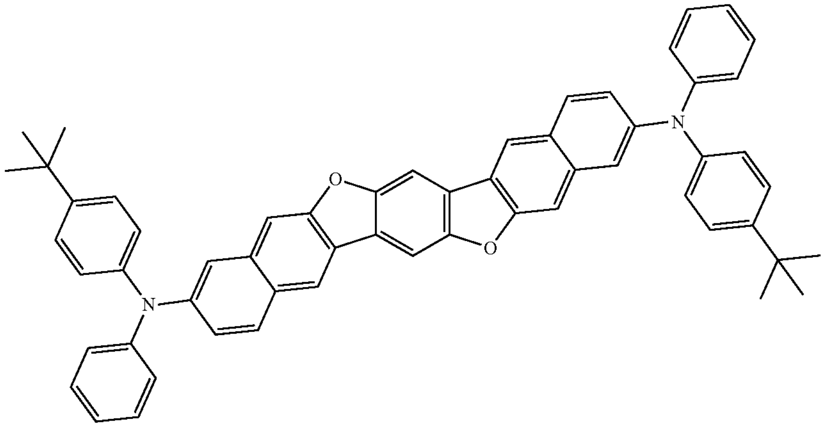
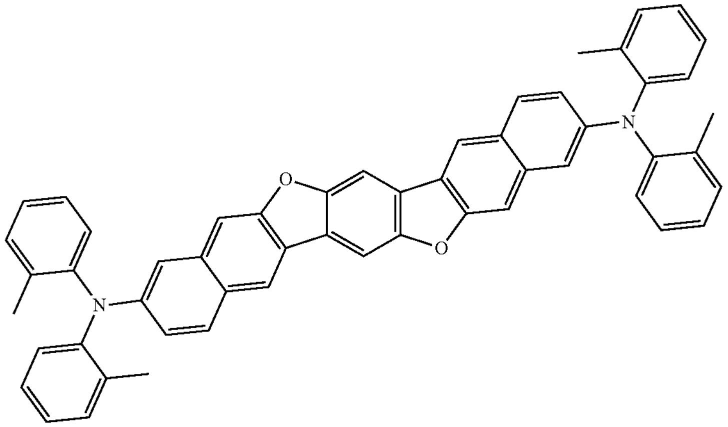
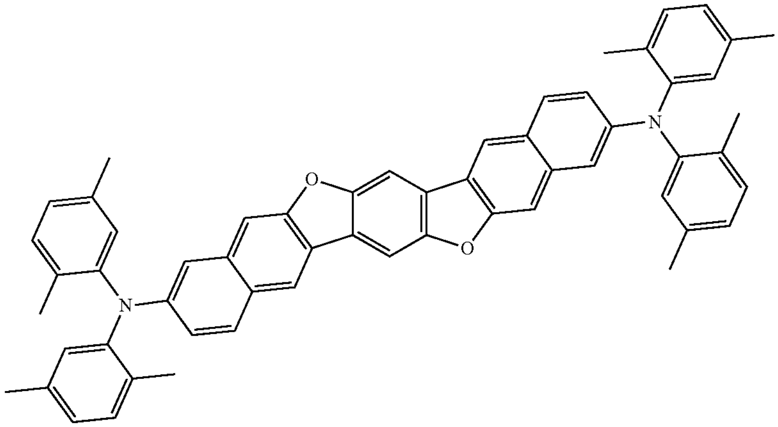
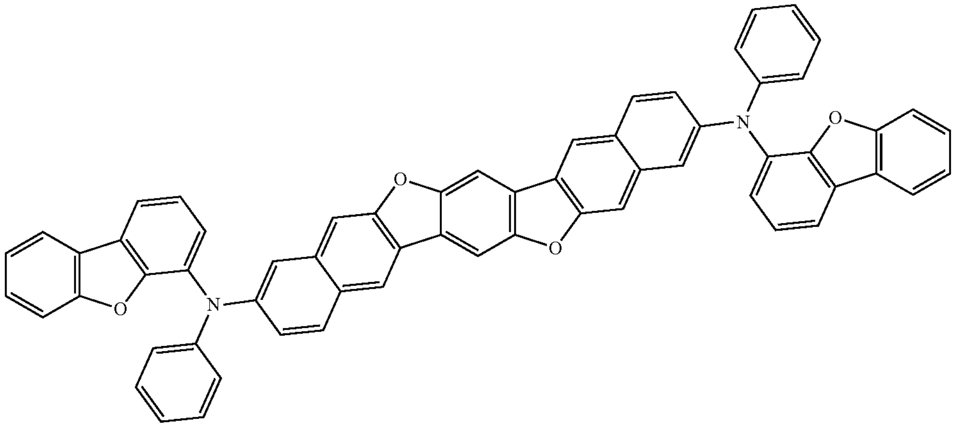

-continued
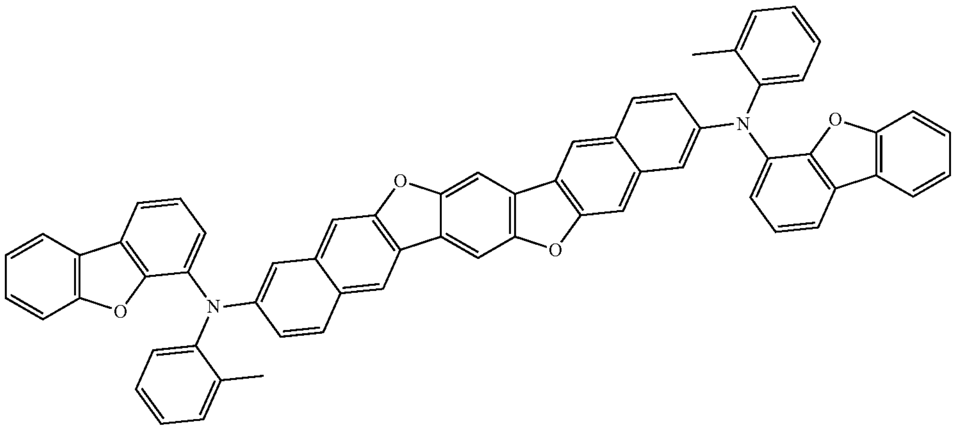
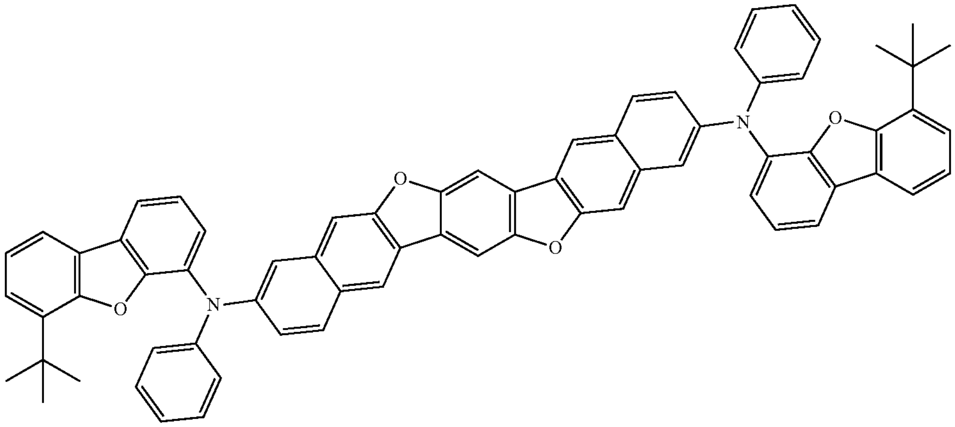
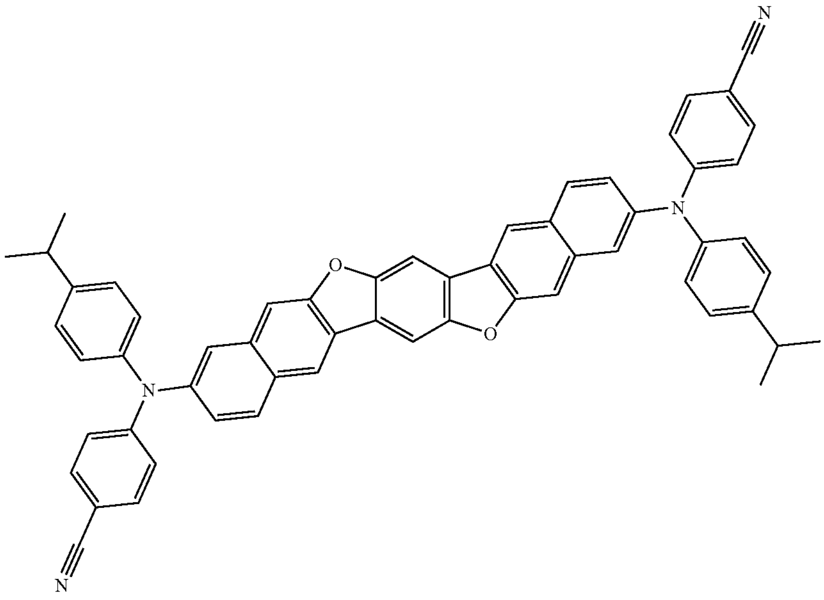

-continued
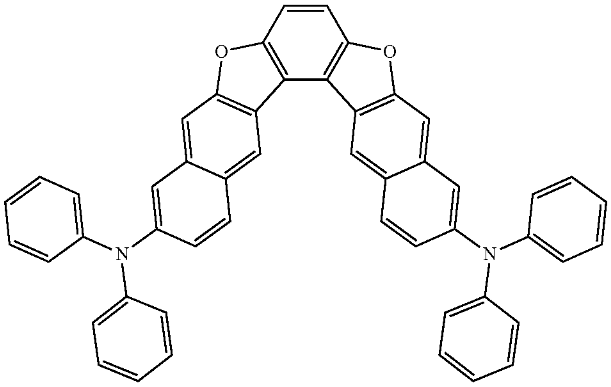
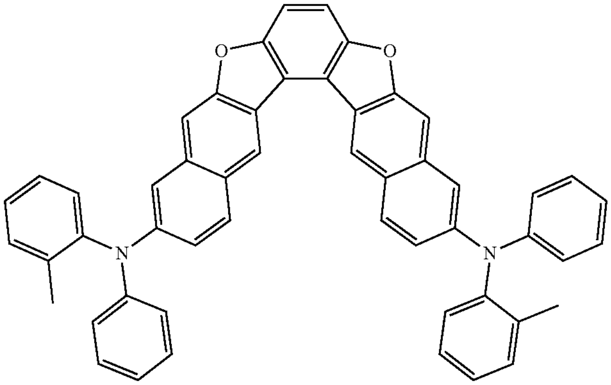
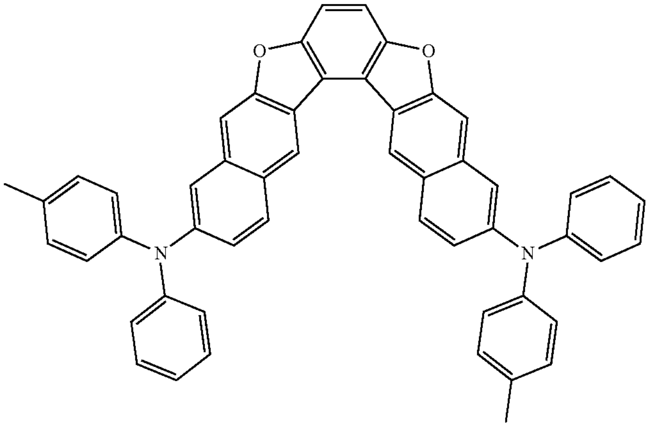
[Formula 237]
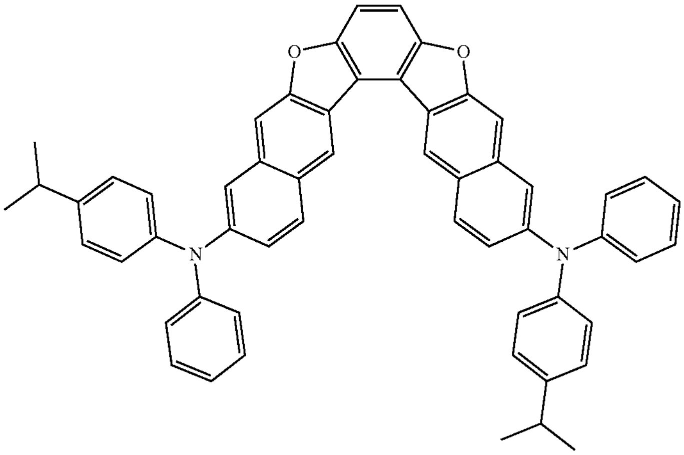

-continued
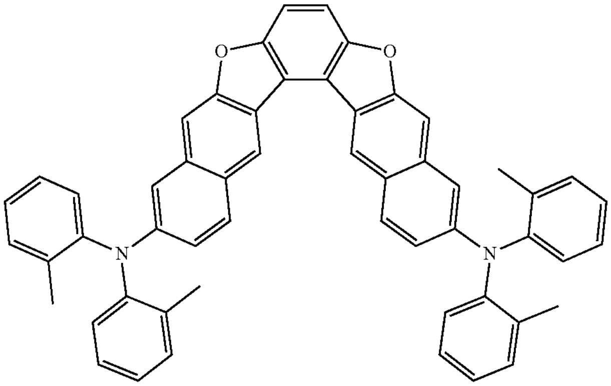
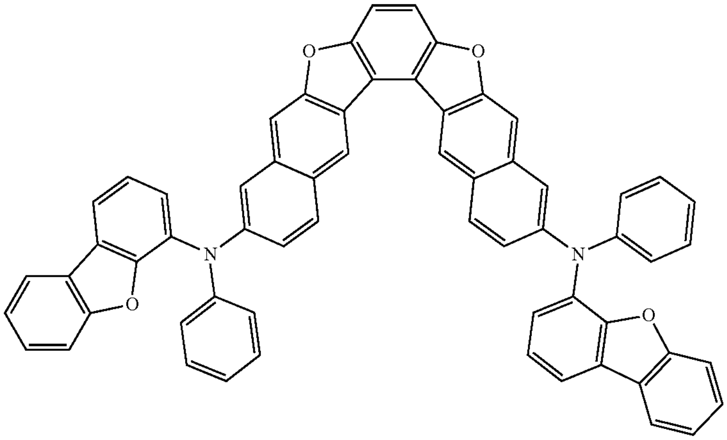
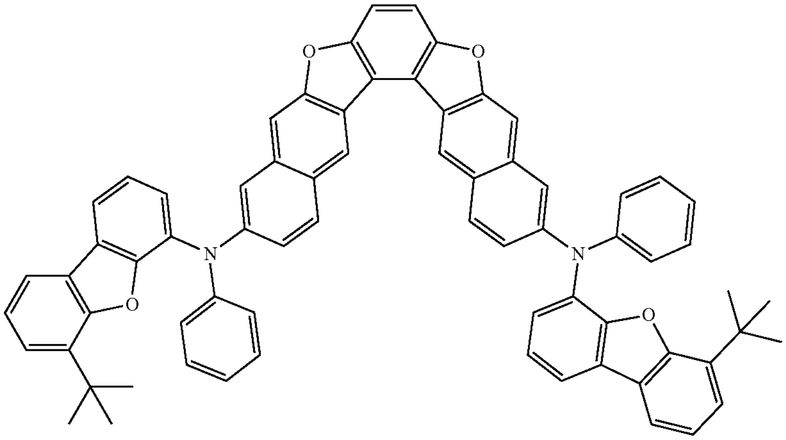
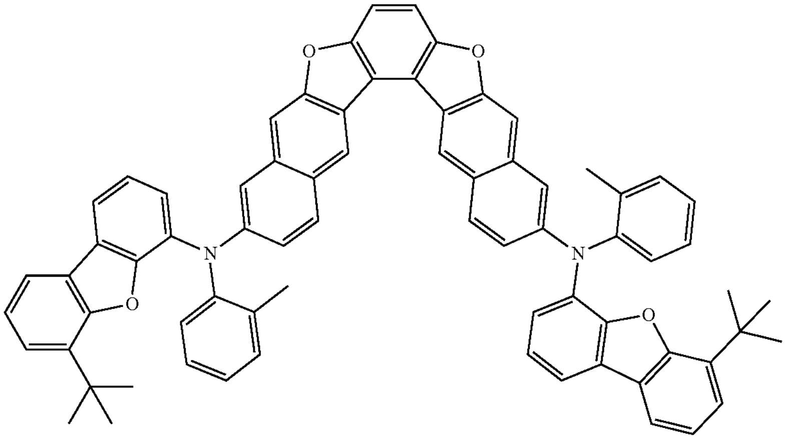

-continued
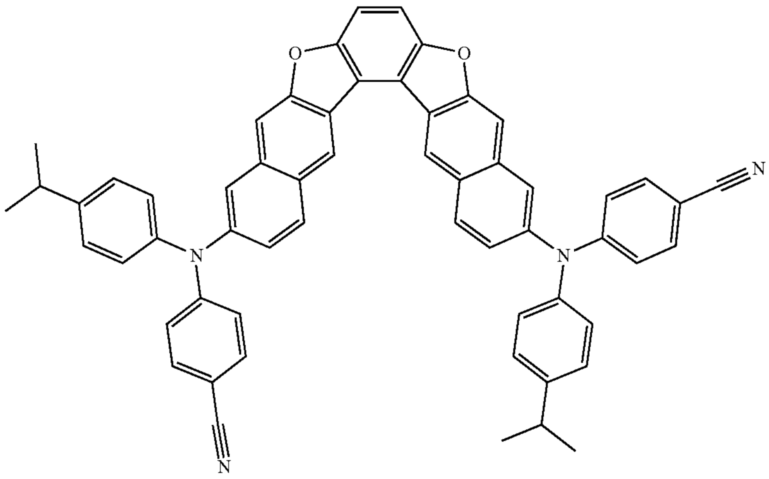
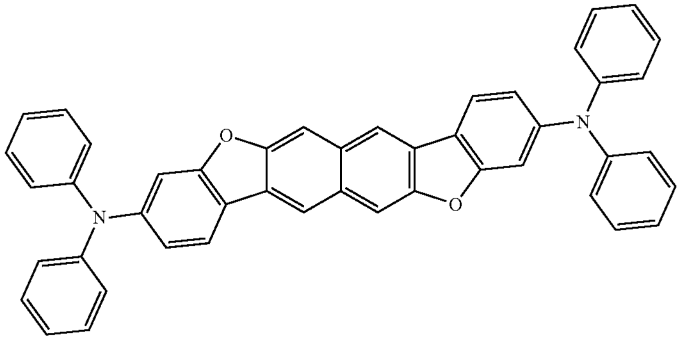
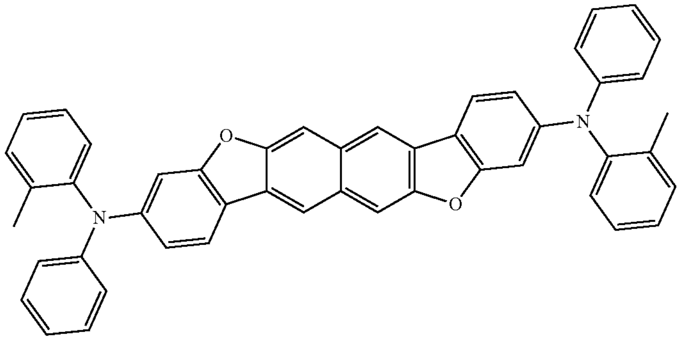
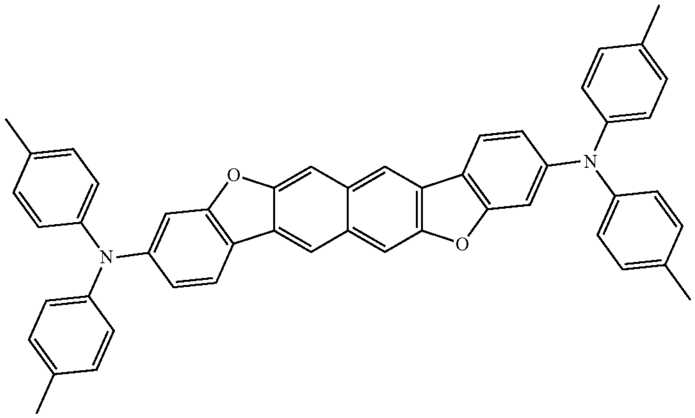

-continued
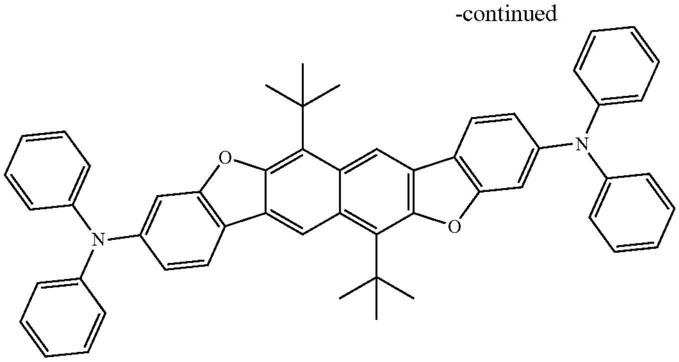
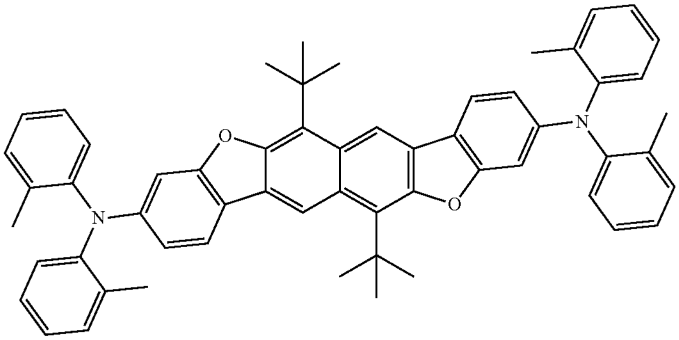
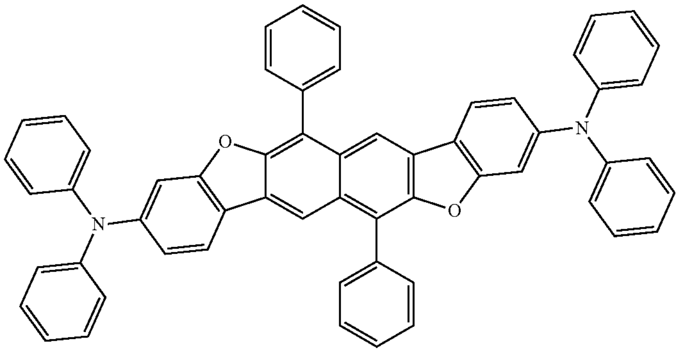
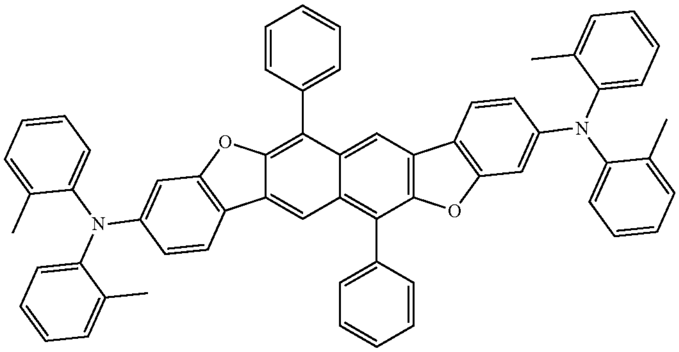
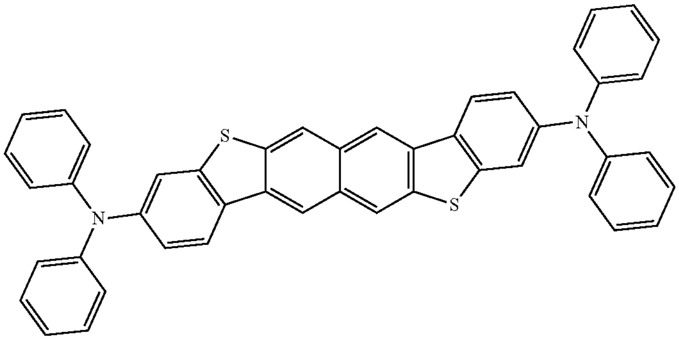

-continued
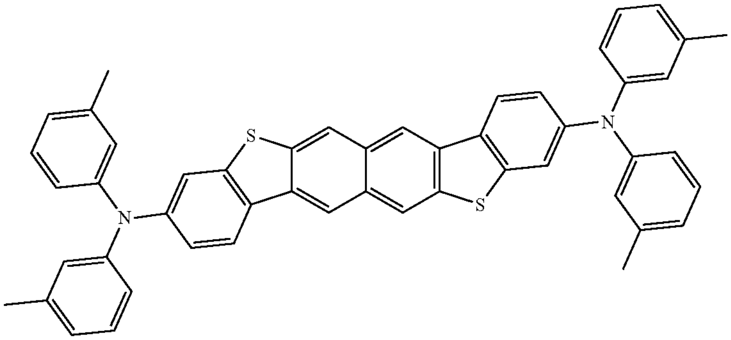
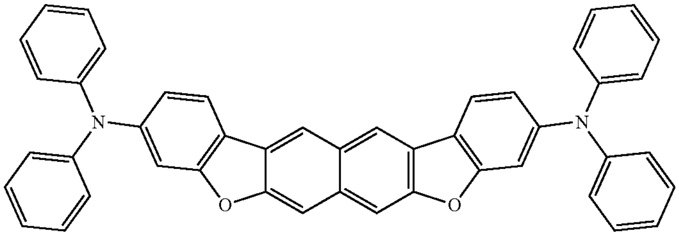
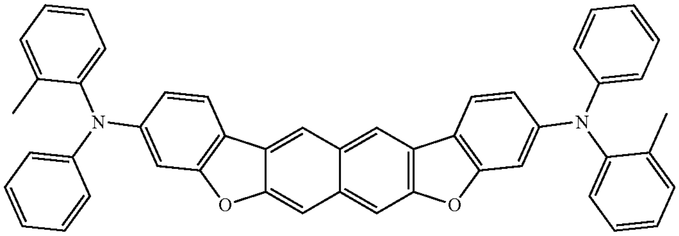
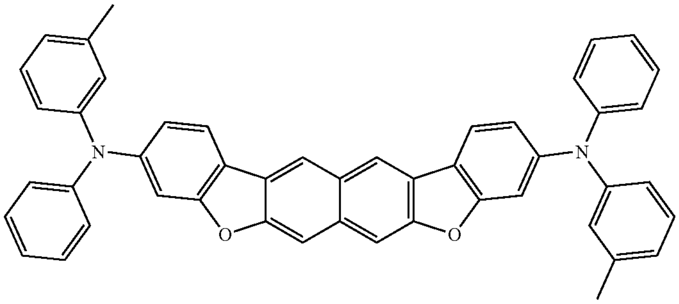
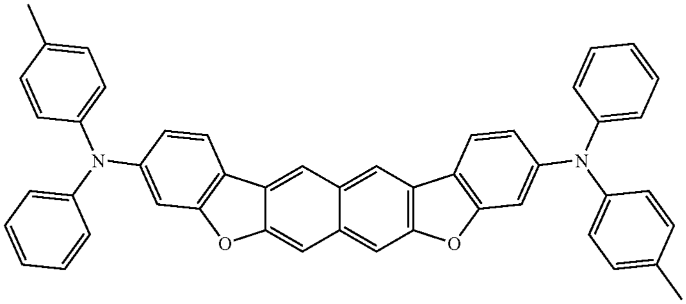

-continued
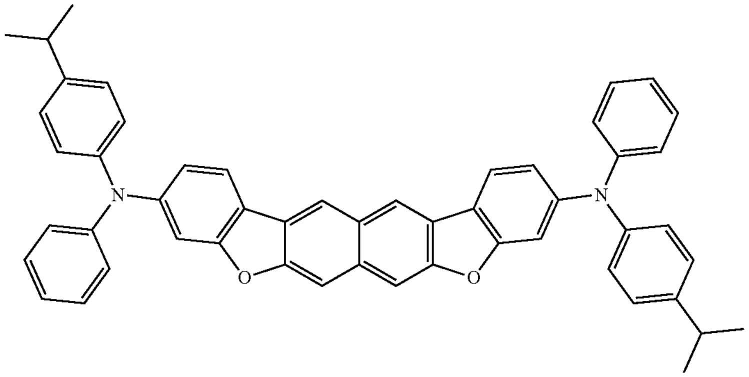
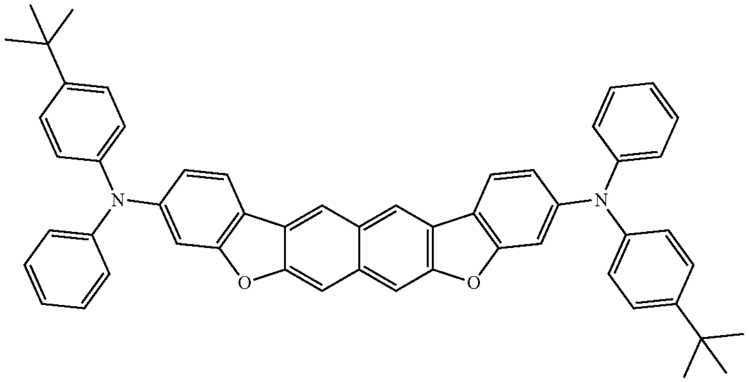
[Formula 238]
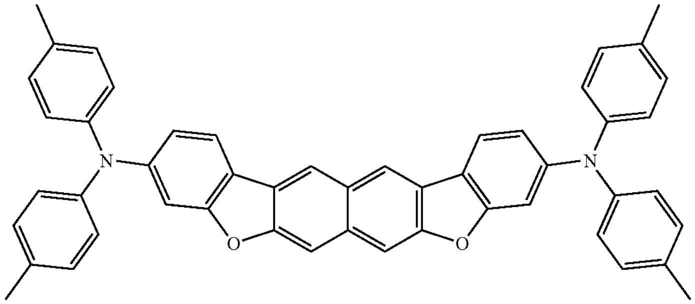
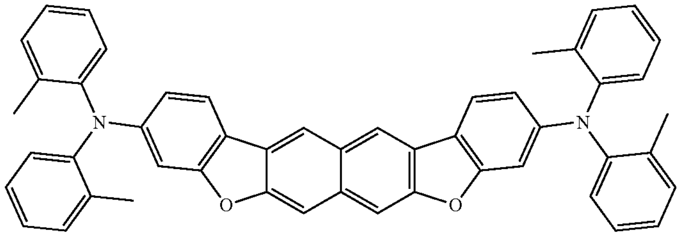
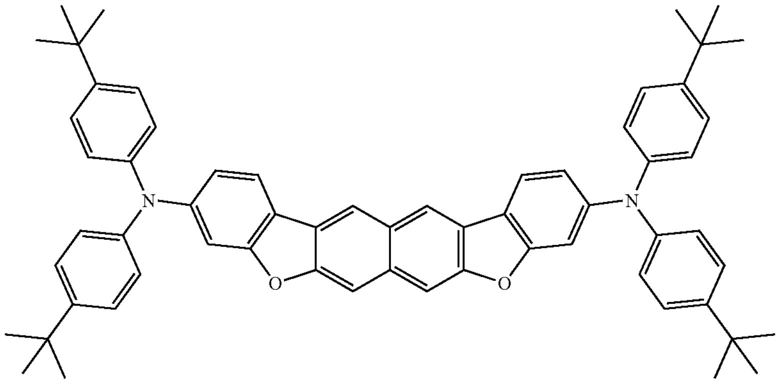

-continued
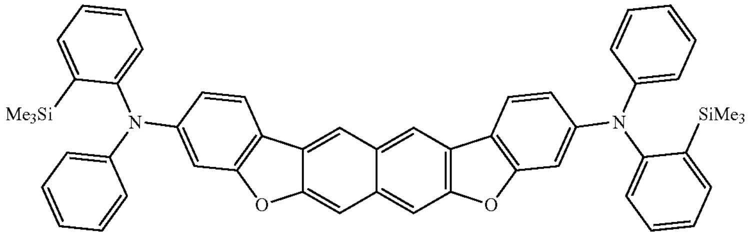
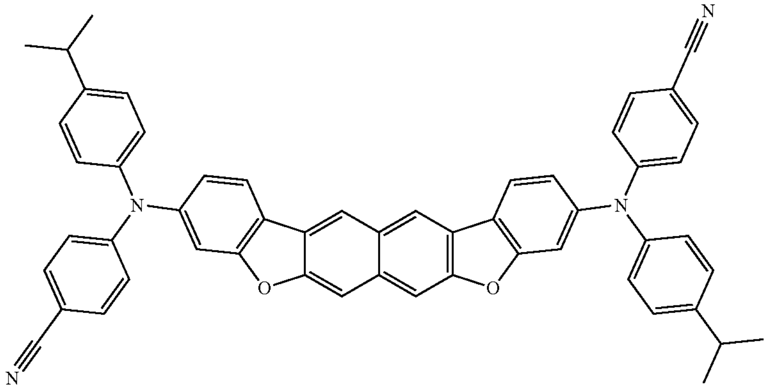
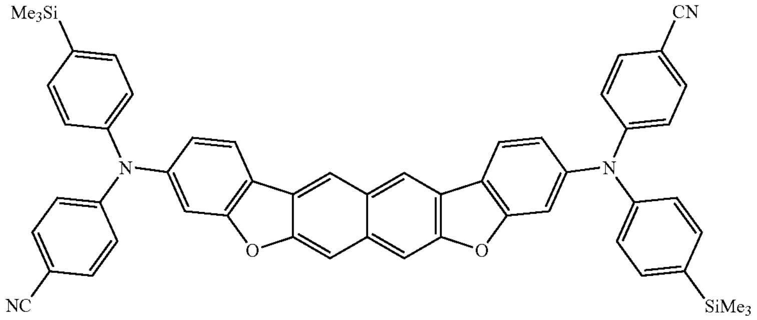
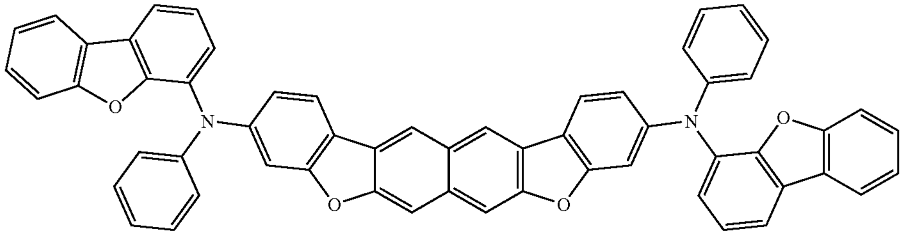
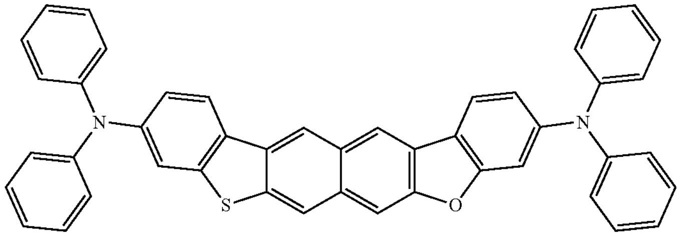

-continued
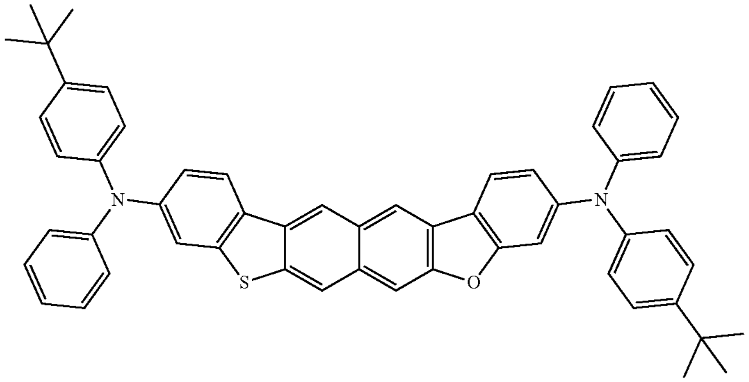
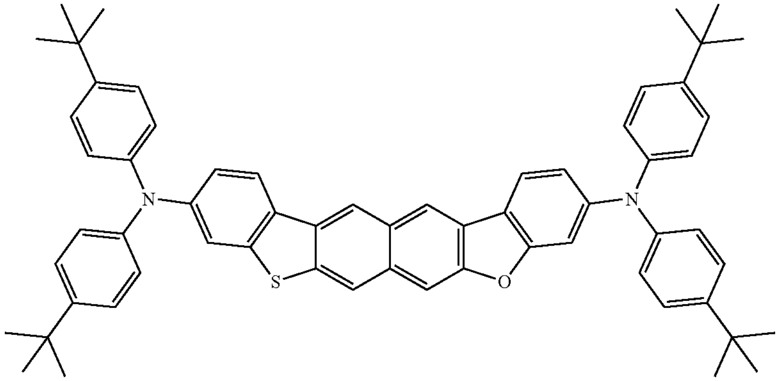
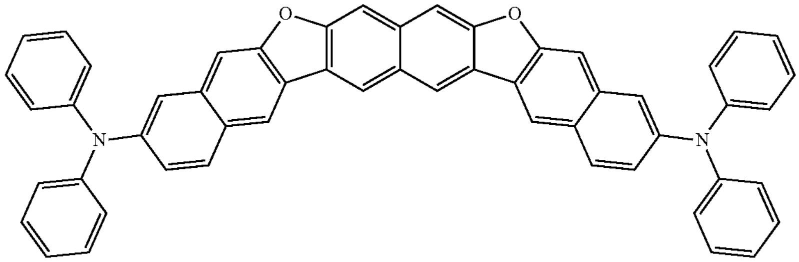
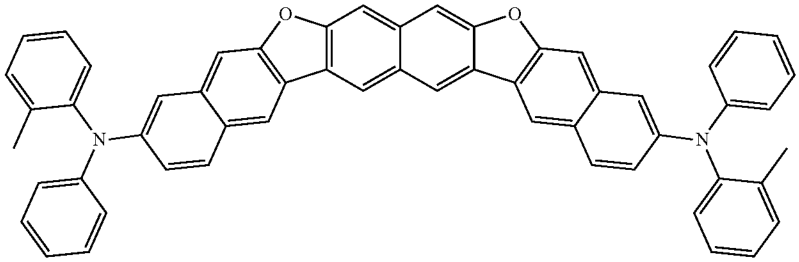
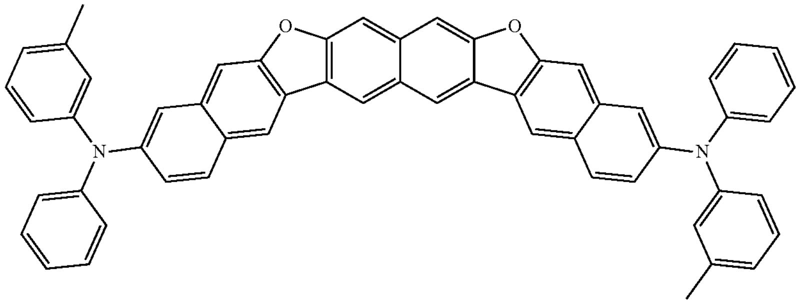

-continued
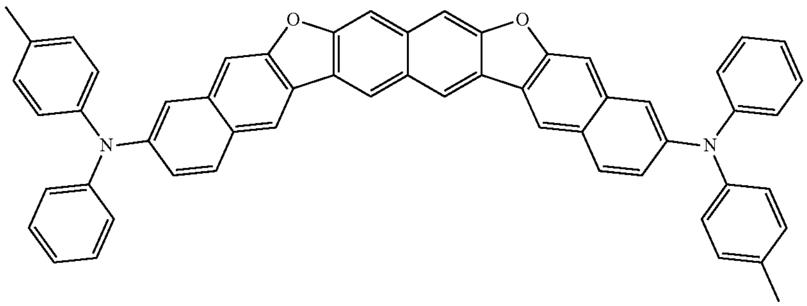
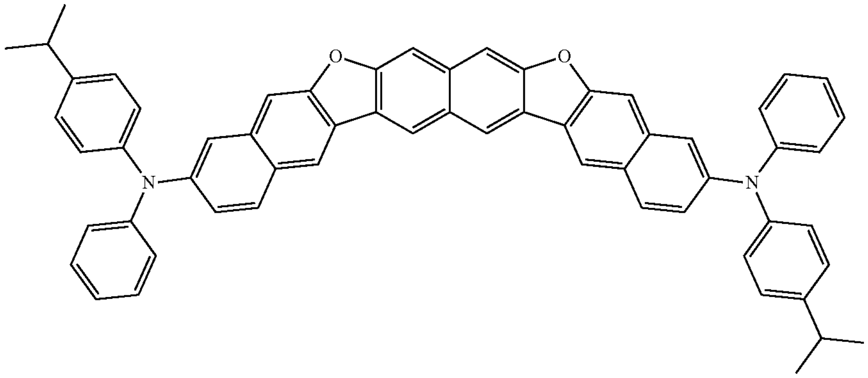
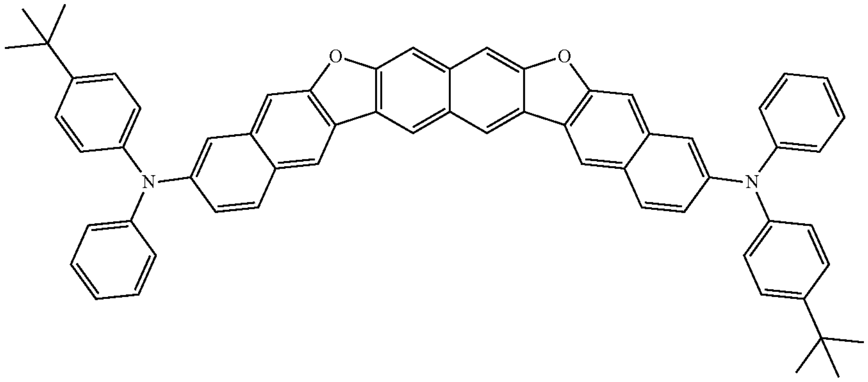
[Formula 239]
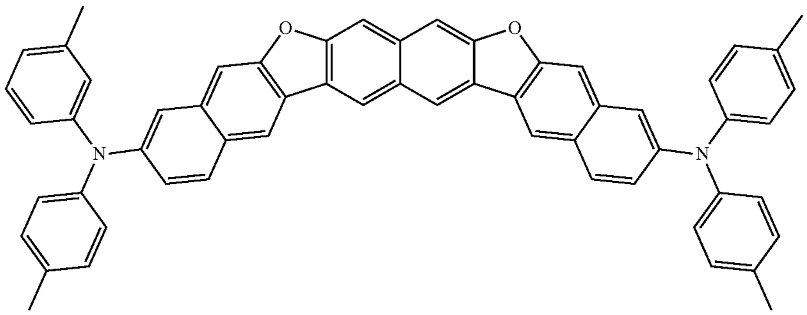
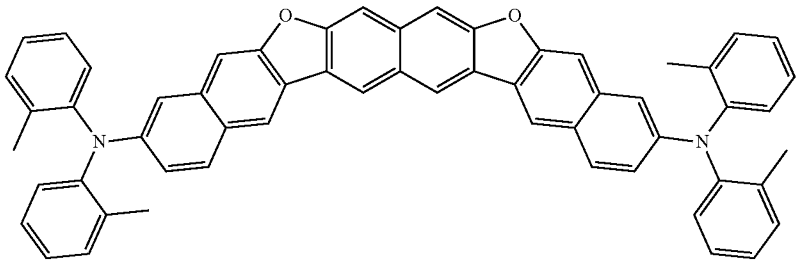

-continued
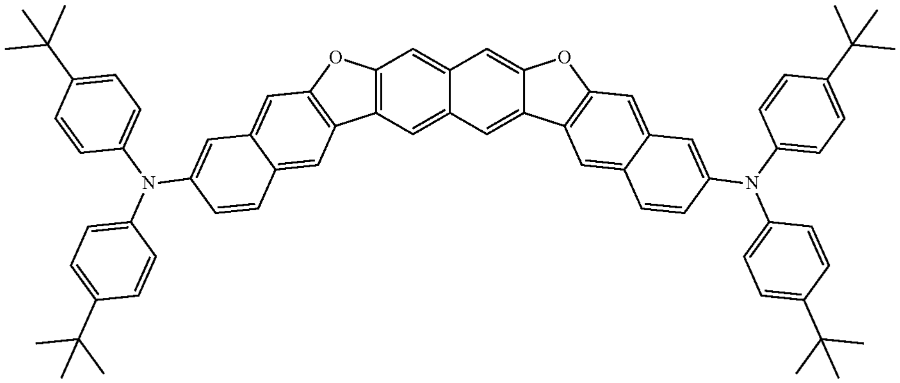
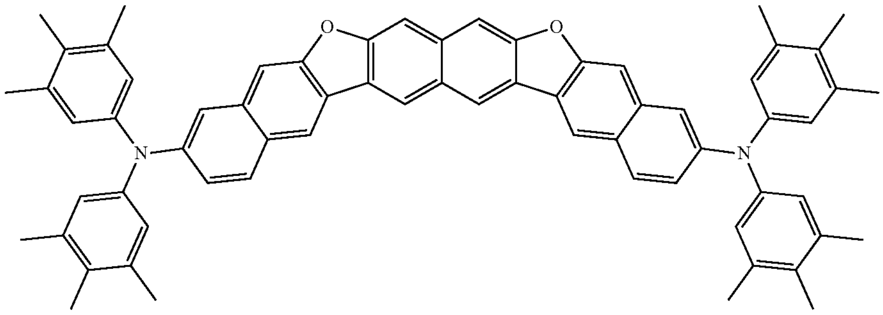
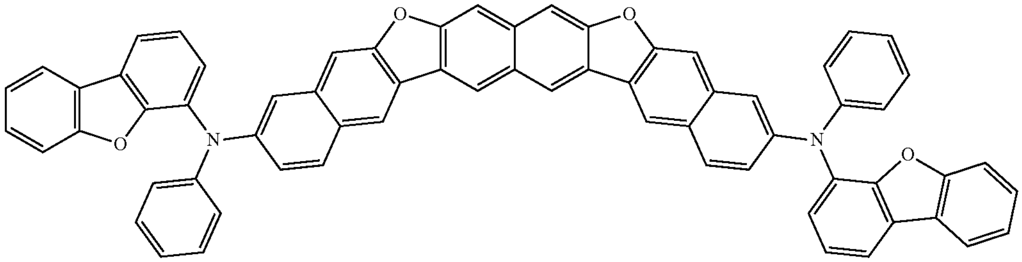
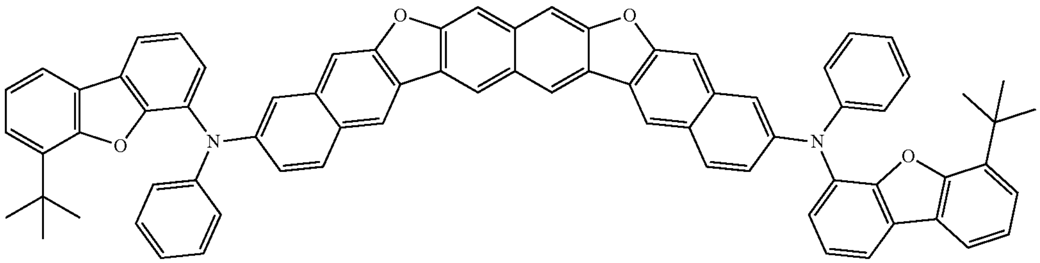

Compound Represented by Formula (8)

The compound represented by the formula (8) will be described below.

[Formula 240]

(8)

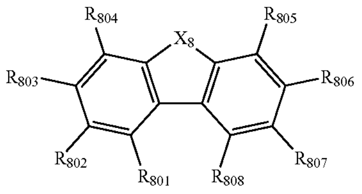

In the formula (8): at least one combination of a combination of $R_{801}$ and $R_{802}$, a combination of $R_{802}$ and $R_{803}$, or a combination of $R_{803}$ and $R_{804}$ are mutually bonded to form a divalent group represented by a formula (82) below; and at least one combination of a combination of $R_{805}$ and $R_{806}$, a combination of $R_{806}$ and $R_{807}$, or a combination of $R_{807}$ and $R_{808}$ are mutually bonded to form a divalent group represented by a formula (83) below.

[Formula 241]

(82)

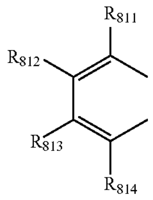

(83)

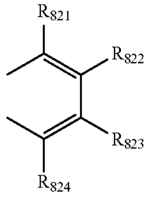

At least one of $R_{801}$ to $R_{804}$ not forming the divalent group represented by the formula (82) or $R_{811}$ to $R_{814}$ is a monovalent group represented by a formula (84) below.

At least one of $R_{805}$ to $R_{808}$ not forming the divalent group represented by the formula (83) or $R_{821}$ to $R_{824}$ is a monovalent group represented by the formula (84) below.

$X_8$ is an oxygen atom, a sulfur atom, or $NR_{809}$.

$R_{801}$ to $R_{808}$ neither forming the divalent groups represented by the formulae (82) and (83) nor being the monovalent group represented by the formula (84), $R_{811}$ to $R_{814}$ and $R_{821}$ to $R_{824}$ not being the monovalent group represented by the formula (84), and $R_{809}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 242]

(84)

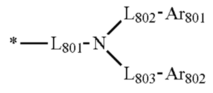

In the formula (84): $Ar_{801}$ and $Ar_{802}$ each independently represent a substituted or unsubstituted aryl group having 6 to 50 ring carbon atoms, or a substituted or unsubstituted heterocyclic group having 5 to 50 ring atoms;

$L_{801}$ to $L_{803}$ each independently represent a single bond, a substituted or unsubstituted arylene group having 6 to 30 ring carbon atoms, a substituted or unsubstituted heterocyclic group having 5 to 30 ring atoms, or a divalent linking group formed by bonding two, three or four groups selected from the group consisting of the substituted or unsubstituted arylene group having 6 to 30 ring carbon atoms and a substituted or unsubstituted divalent heterocyclic group having 5 to 30 ring atoms; and

* in the formula (84) represents a bonding position to the cyclic structure represented by the formula (8) or the group represented by the formula (82) or (83).

In the formula (8), the positions for the divalent group represented by the formula (82) and the divalent group represented by the formula (83) to be formed are not specifically limited but the divalent groups may be formed at any possible positions on $R_{801}$ to $R_{808}$.

In an exemplary embodiment, the compound represented by the formula (8) is represented by any one of formulae (81-1) to (81-6) below.

[Formula 243]

(81-1)

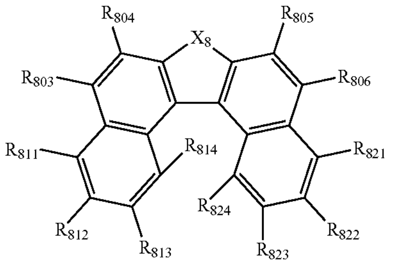

(81-2)

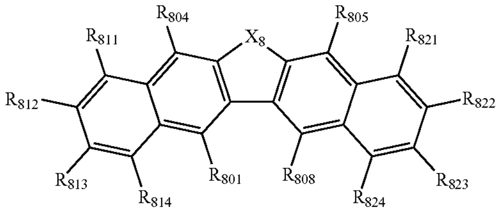

-continued

[Formula 244]

(81-3)

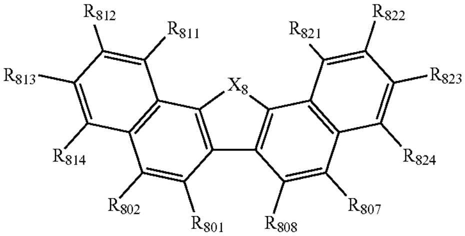

(81-4)

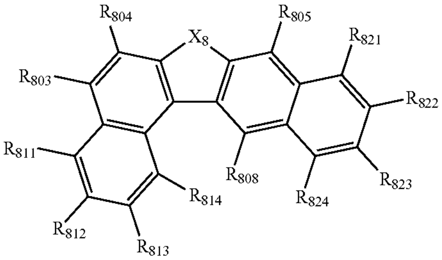

[Formula 245]

(81-5)

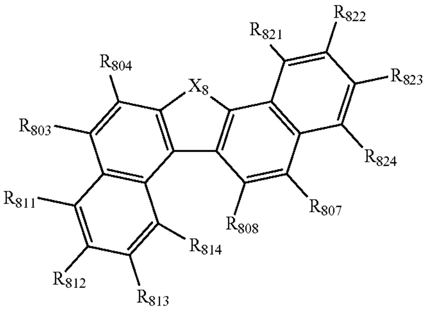

(81-6)

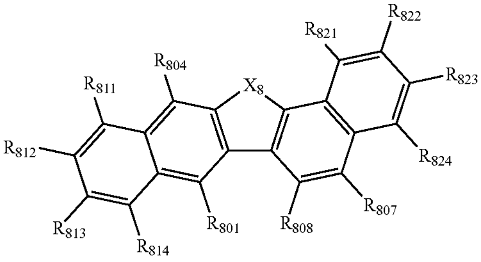

In the formulae (81-1) to (81-6):

$X_8$ represents the same as $X_8$ in the formula (8);

at least two of $R_{801}$ to $R_{824}$ are each a monovalent group represented by the formula (84); and $R_{801}$ to $R_{824}$ that are not the monovalent group represented by the formula (84) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (8) is represented by any one of formulae (81-7) to (81-18) below.

[Formula 246]

(81-7)

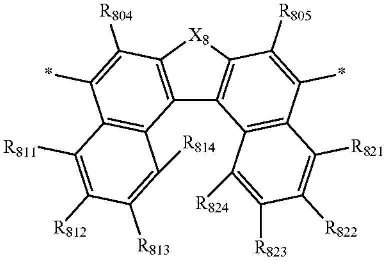

(81-8)

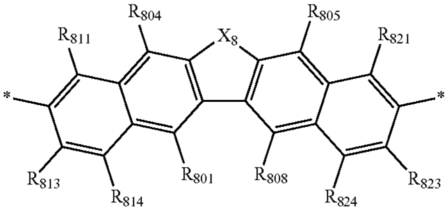

[Formula 247]

(81-9)

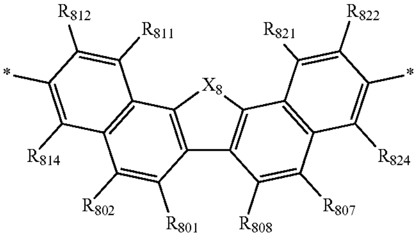

(81-10)

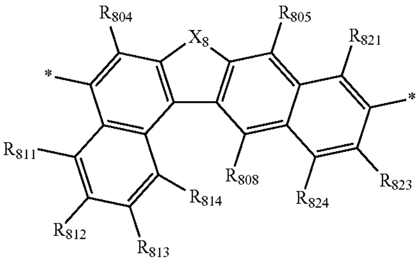

[Formula 248]

(81-11)

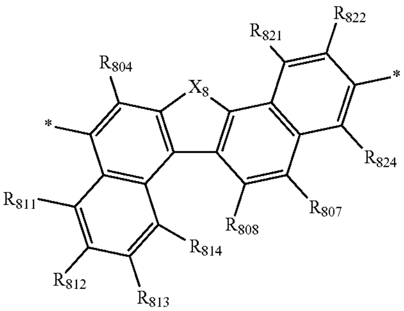

-continued (81-12)

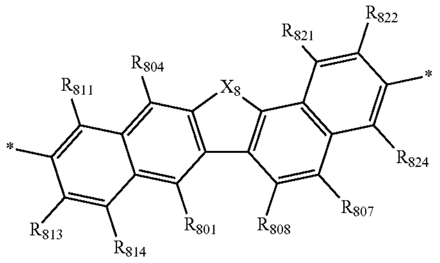

[Formula 249]

(81-13)

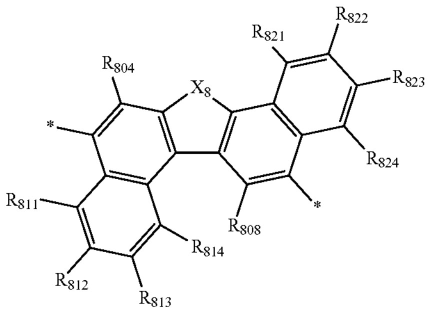

(81-14)

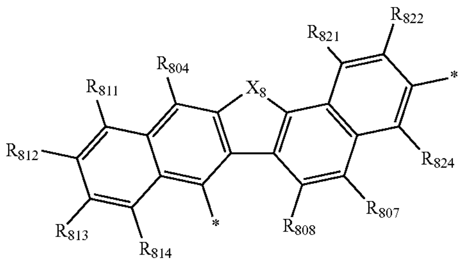

[Formula 250]

(81-15)

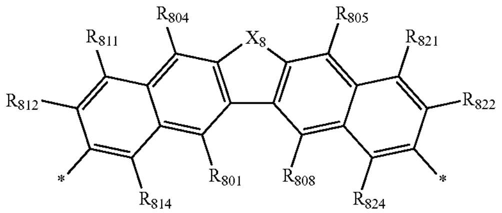

(81-16)

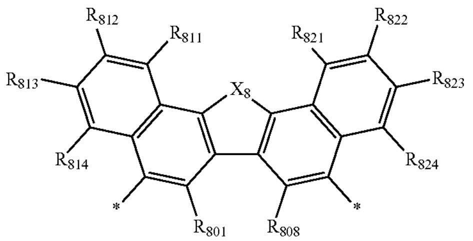

-continued

[Formula 251]

(81-17)

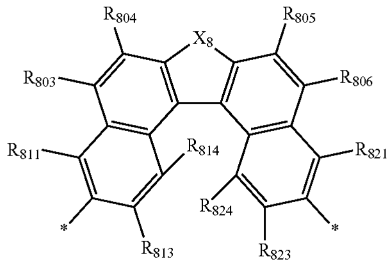

(81-18)

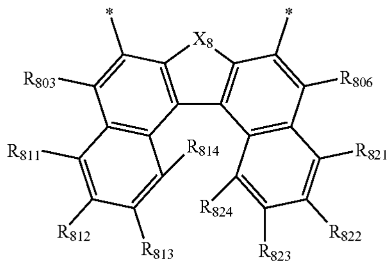

In the formulae (81-7) to (81-18):

$X_8$ represents the same as $X_8$ in the formula (8);

* is a single bond to be bonded with the monovalent group represented by the formula (84); and $R_{801}$ to $R_{824}$ respectively independently represent the same as $R_{801}$ to $R_{824}$ not being the monovalent group represented by the formula (84) in the formulae (81-1) to (81-6).

$R_{801}$ to $R_{808}$ neither forming the divalent group represented by the formula (82) or (83) nor being the monovalent group represented by the formula (84), and $R_{811}$ to $R_{814}$ and $R_{821}$ to $R_{824}$ not being the monovalent group represented by the formula (84) are preferably each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The monovalent group represented by the formula (84) is preferably represented by a formula (85) or (86) below.

[Formula 252]

(85)

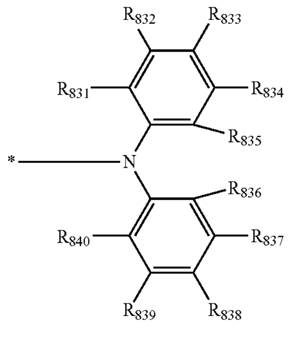

In the formula (85): $R_{831}$ to $R_{840}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formula (85) represents the same as * in the formula (84).

[Formula 253]

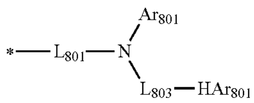

(86)

In the formula (86): $Ar_{801}$, $L_{801}$, and $L_{803}$ represent the same as $Ar_{801}$, $L_{801}$, and $L_{803}$ in the formula (84); and $HAr_{801}$ represents a structure represented by a formula (87) below.

[Formula 254]

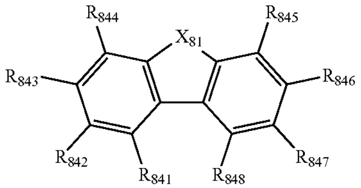

(87)

In the formula (87):

$X_{81}$ represents an oxygen atom or a sulfur atom;

one of $R_{841}$ to $R_{848}$ is a single bond with $L_{803}$; and $R_{841}$ to $R_{848}$ not being the single bond are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (8)

Specific examples of the compound represented by the formula (8) include compounds shown below as well as the compounds disclosed in International Publication No. WO 2014/104144.

[Formula 255]

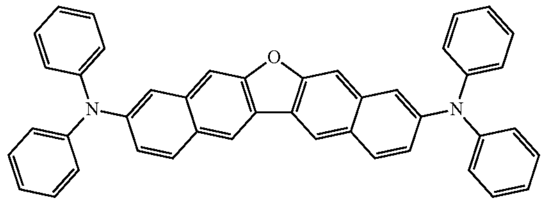

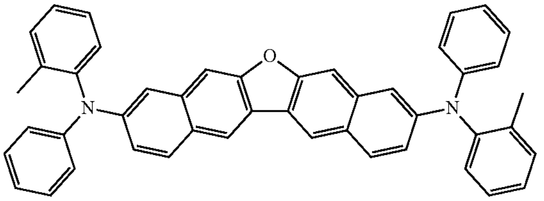

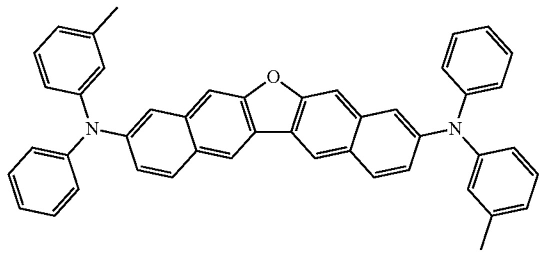

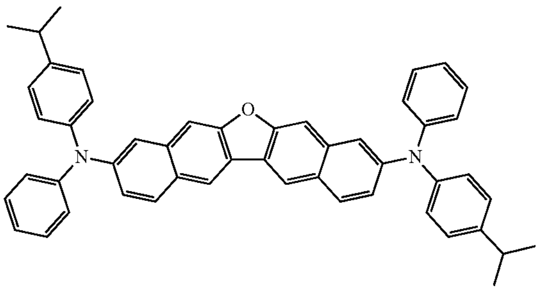

-continued
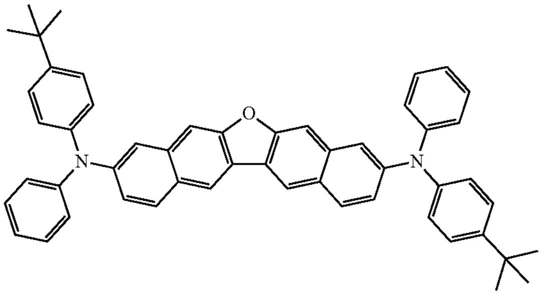
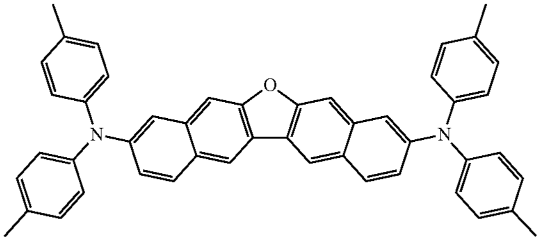
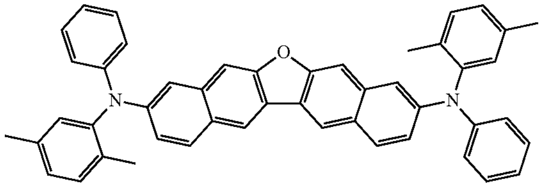
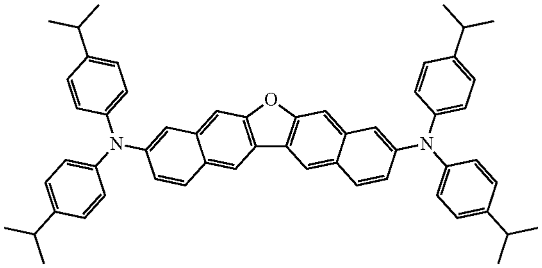
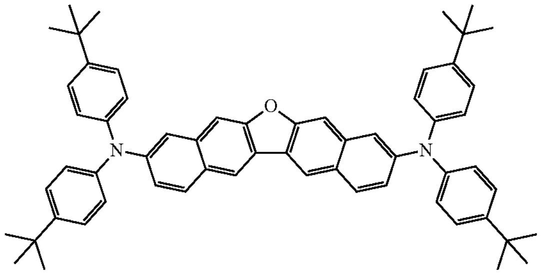
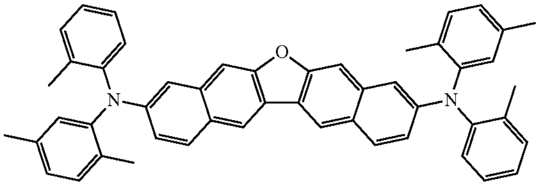
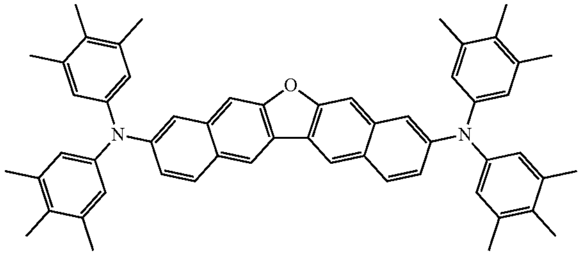
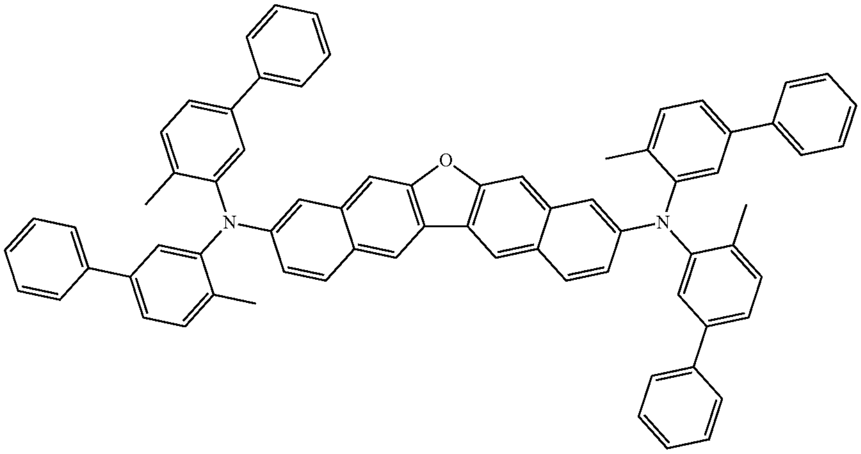

-continued
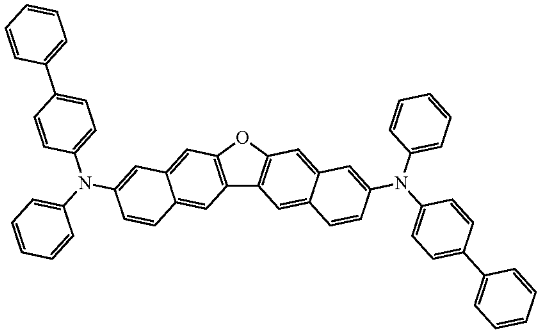
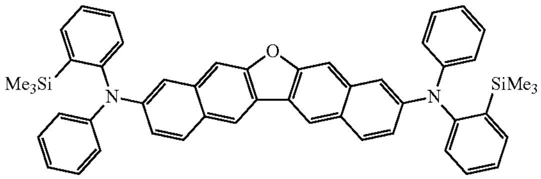
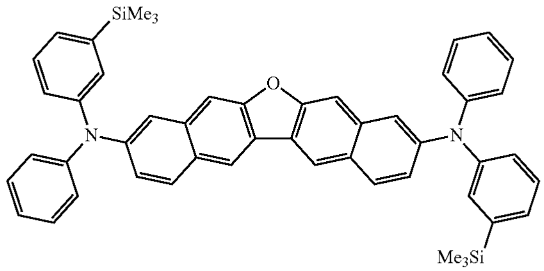
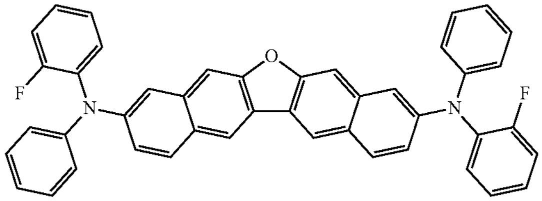
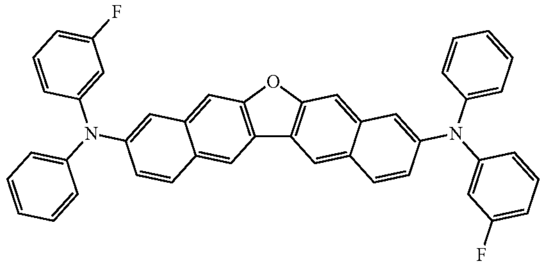
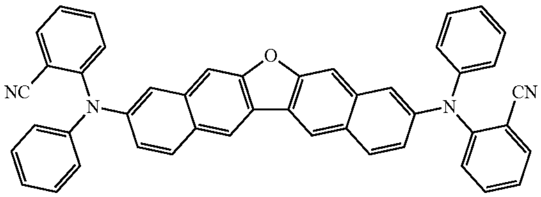
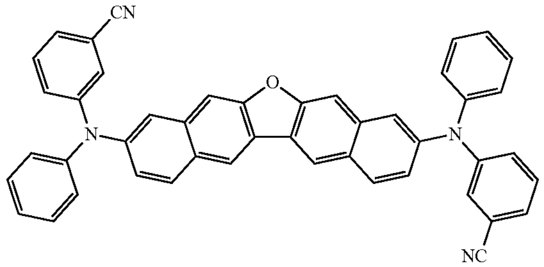
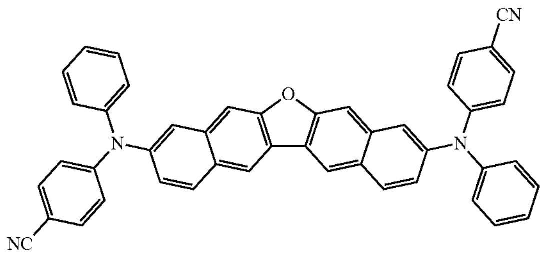
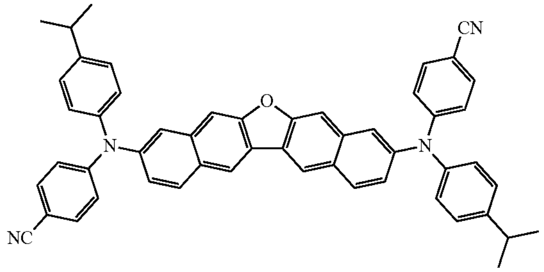
[Formula 256]
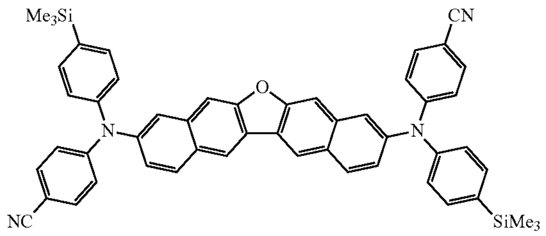

-continued
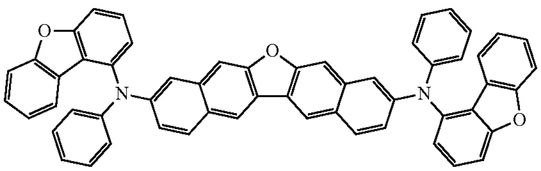
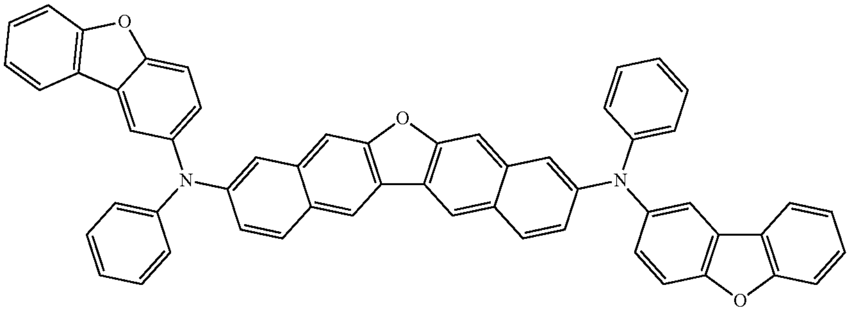
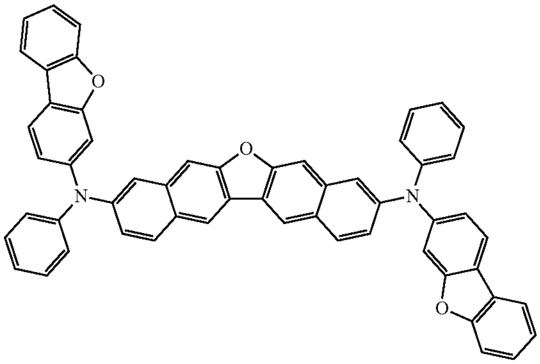
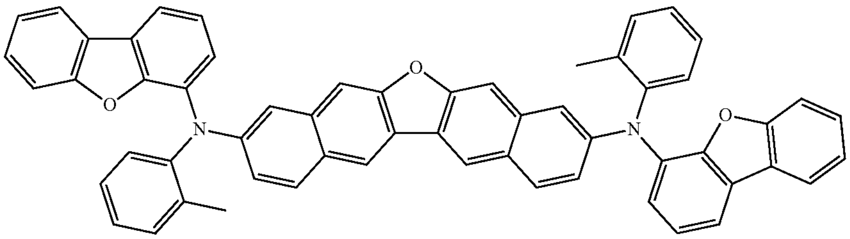
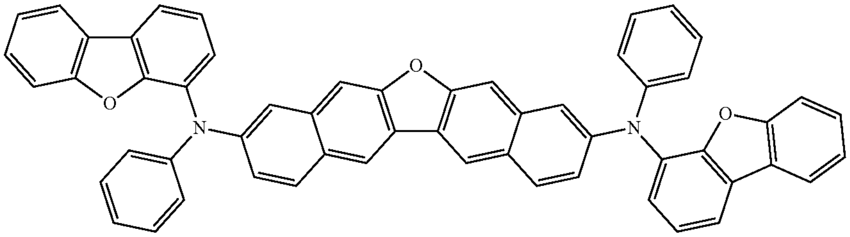
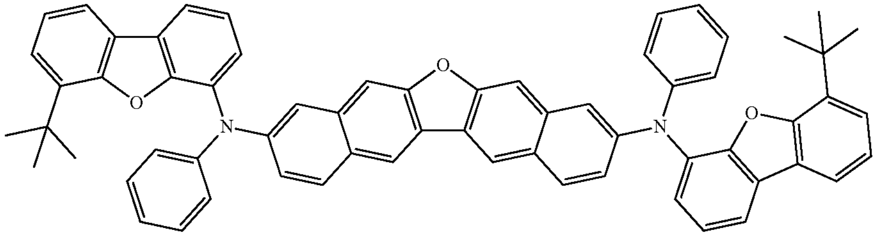

-continued
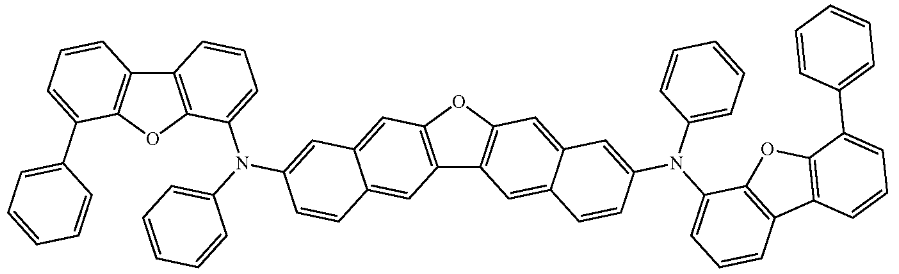
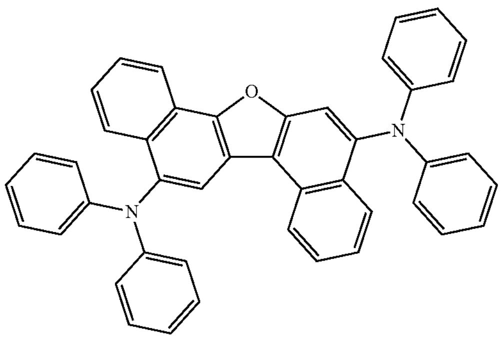
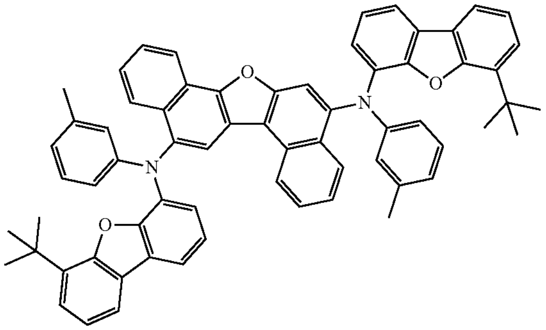
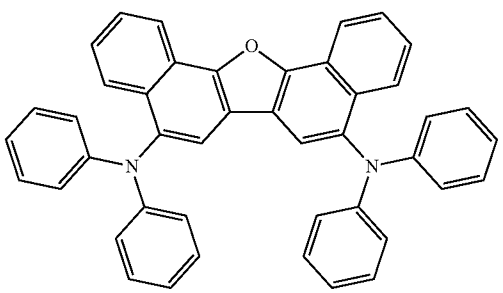
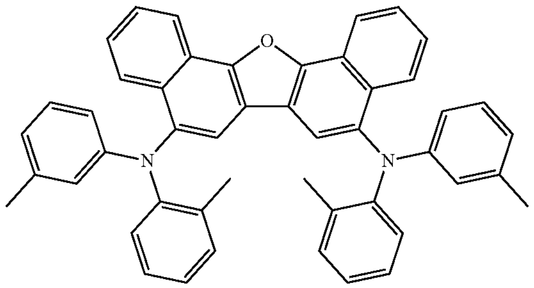
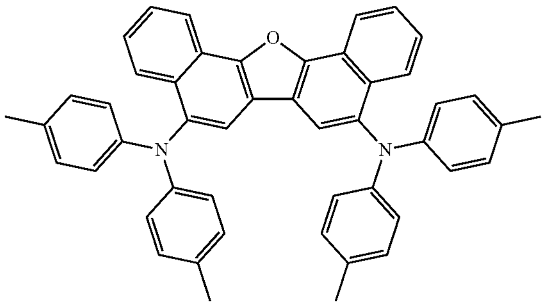
[Formula 257]
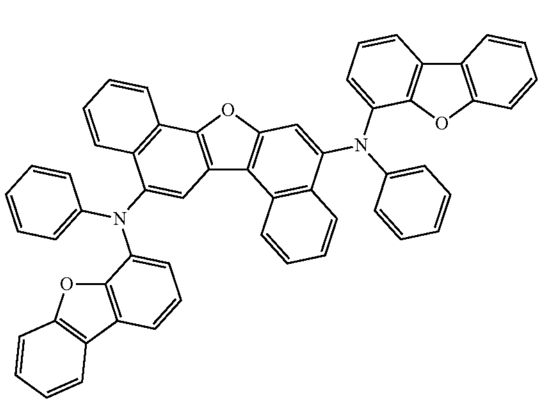
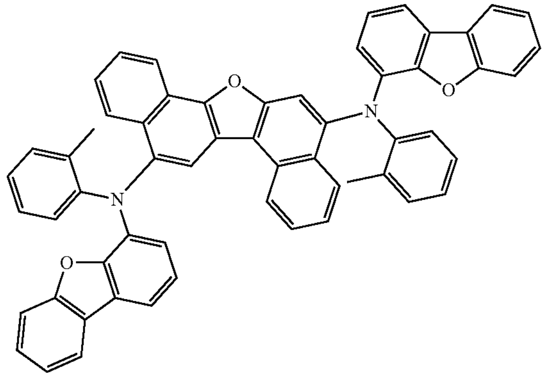

-continued
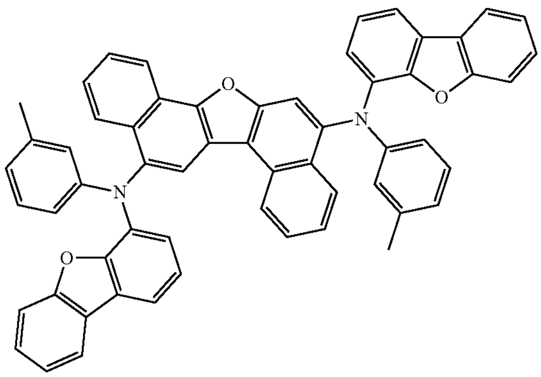
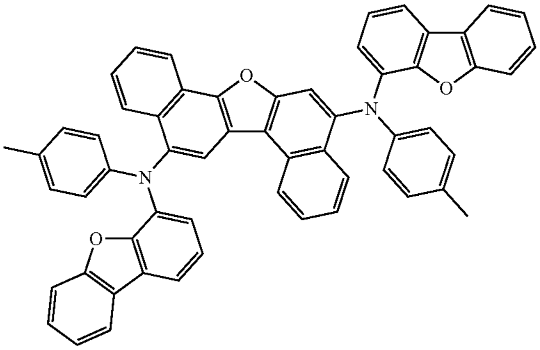
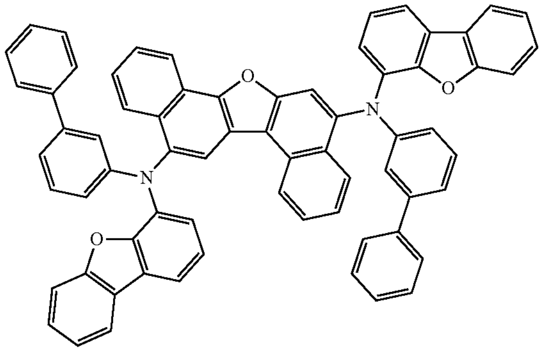
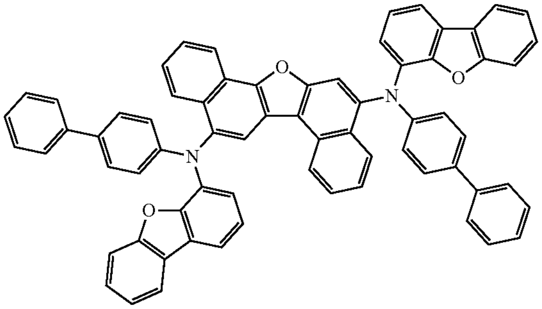
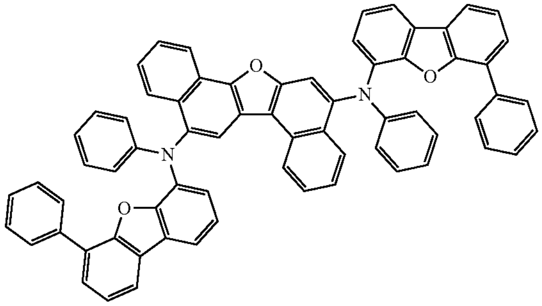
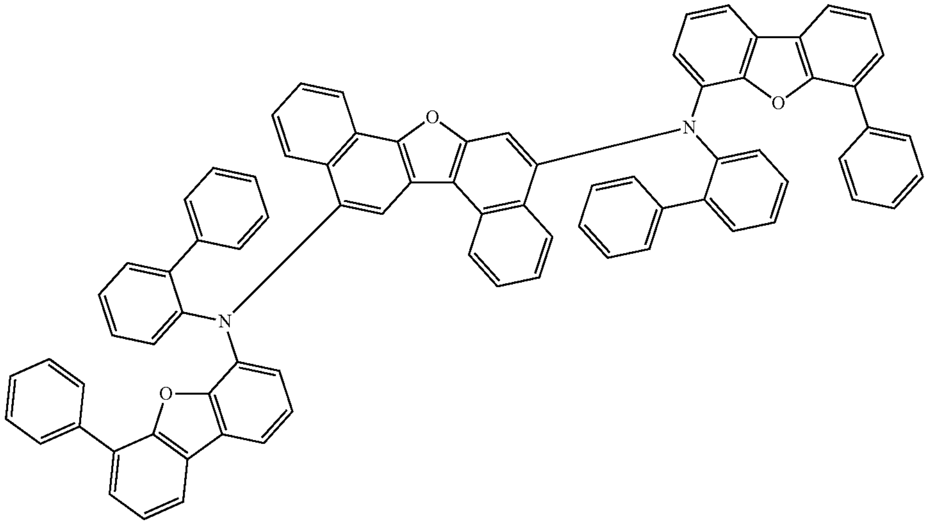

-continued
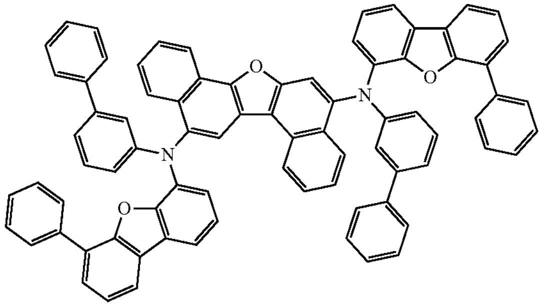
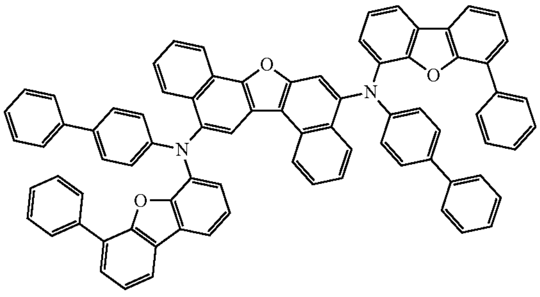
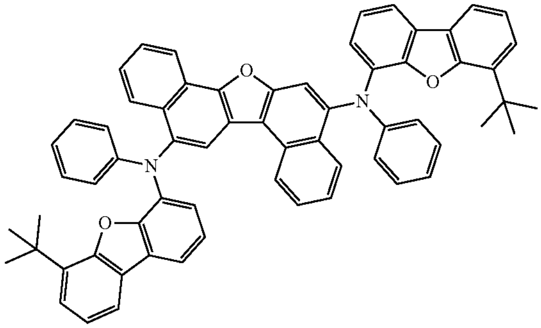
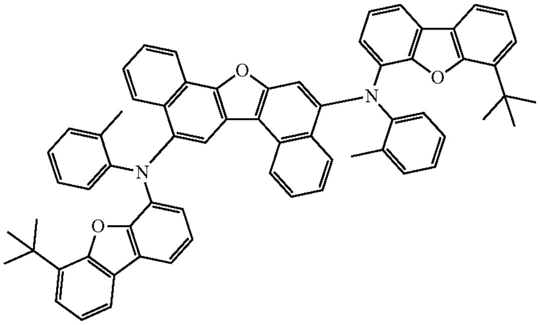
[Formula 258]
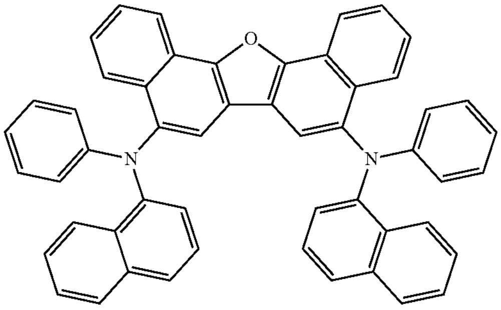
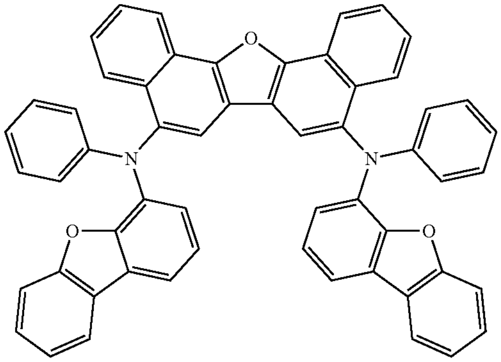
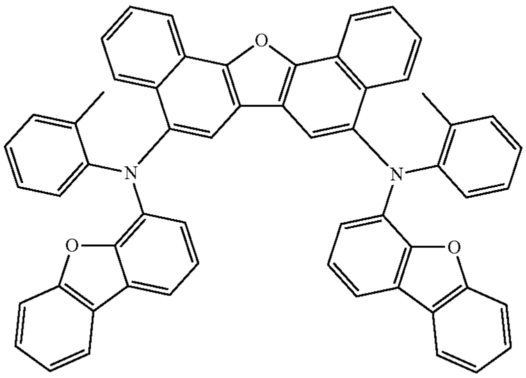
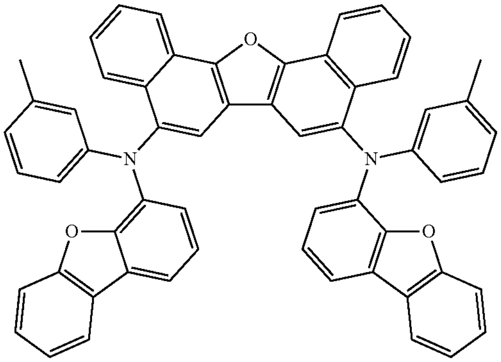

-continued
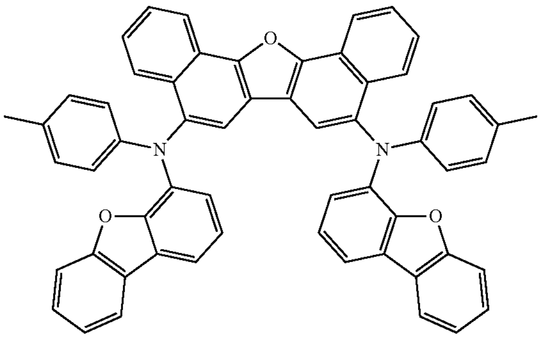
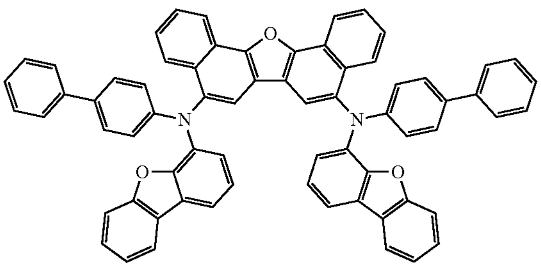
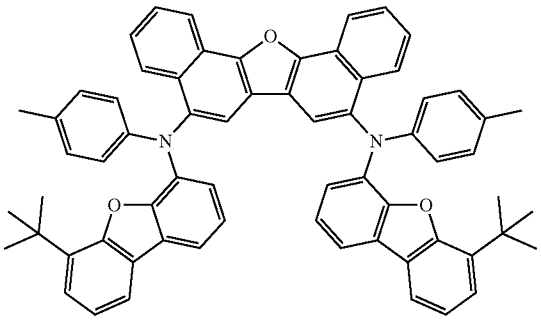
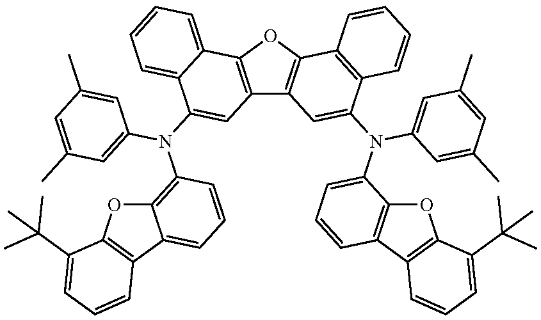
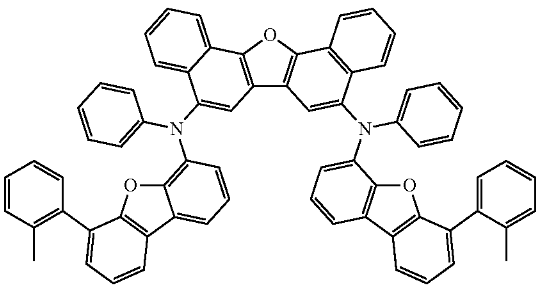
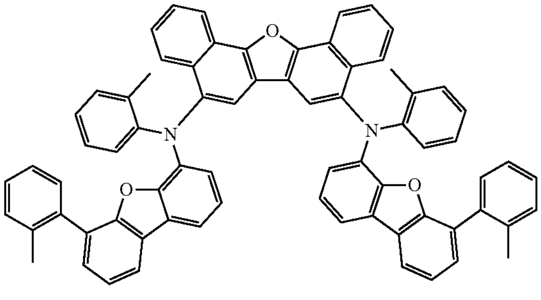
[Formula 259]
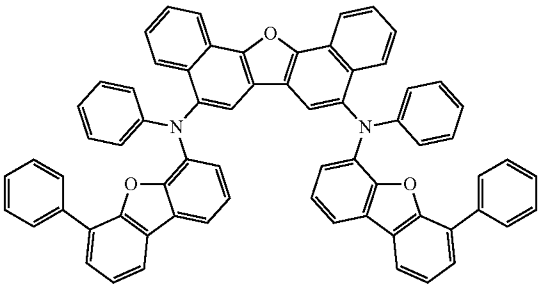
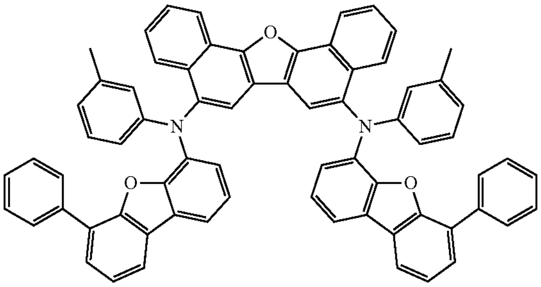
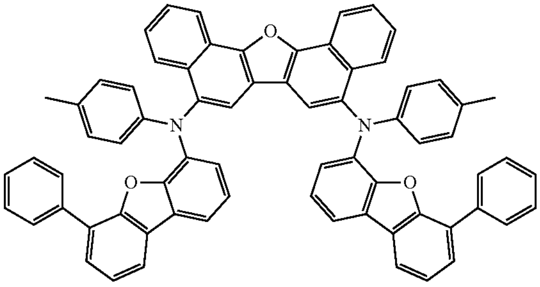
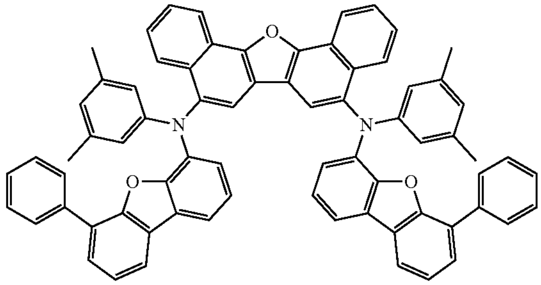

-continued
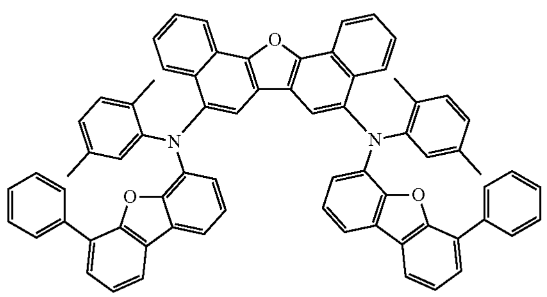
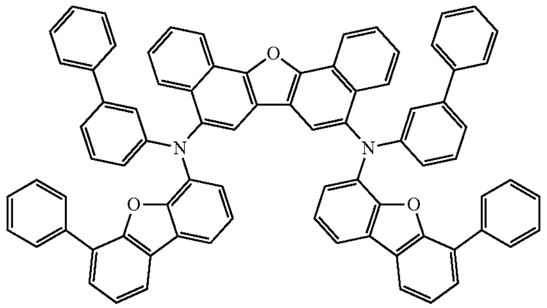
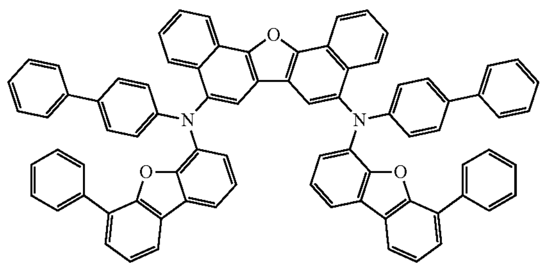
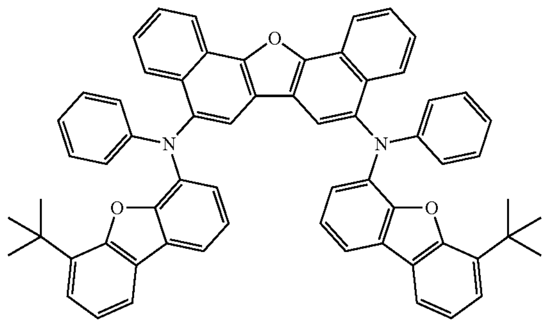
[Formula 260]
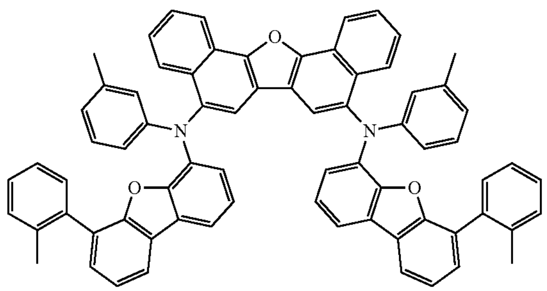
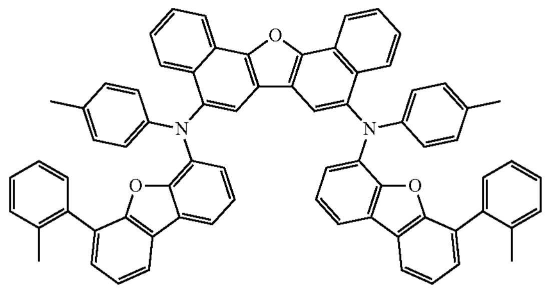
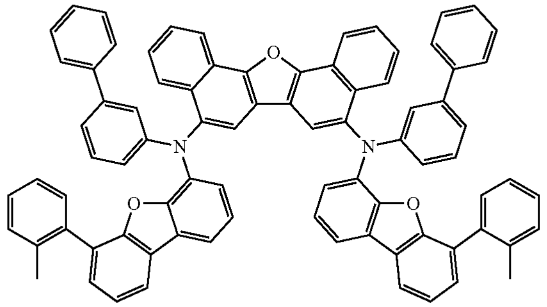
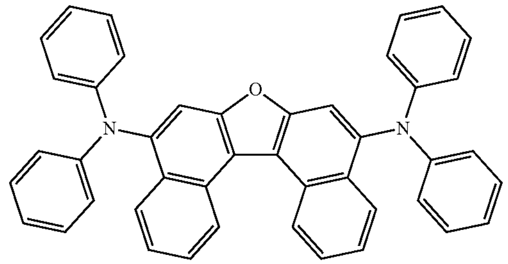
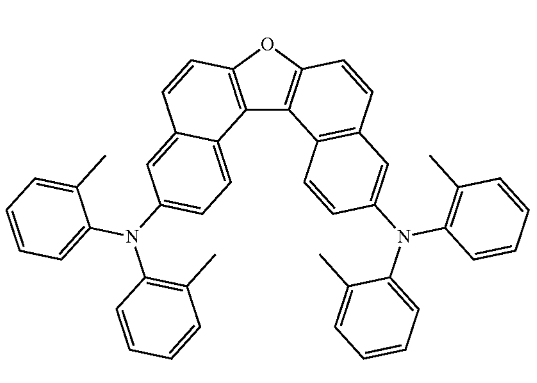
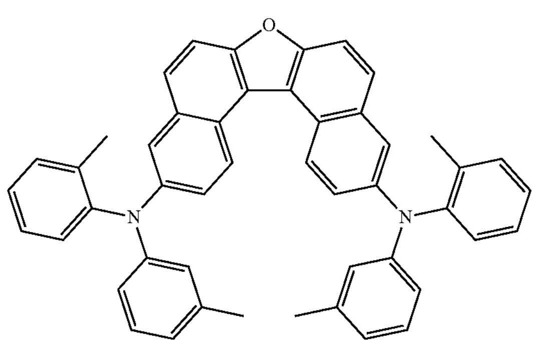

-continued
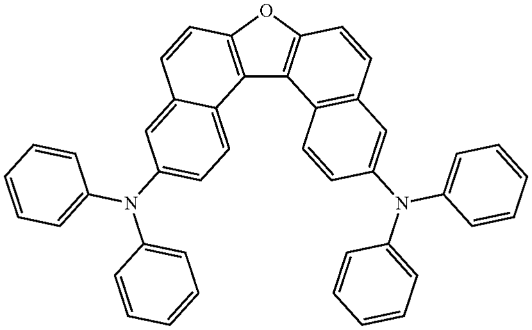
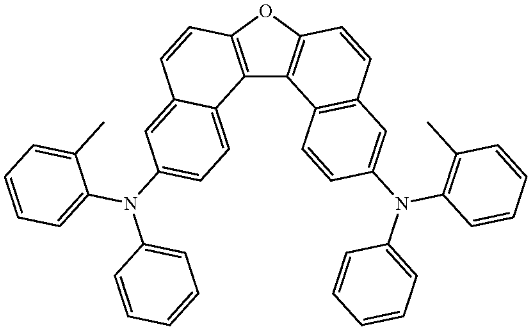
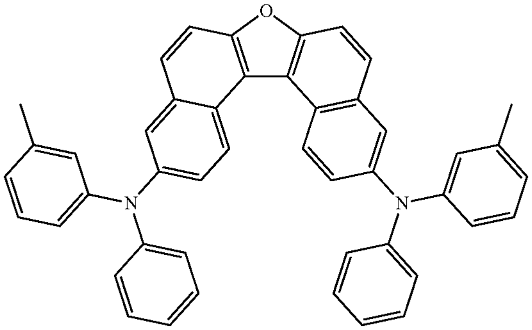
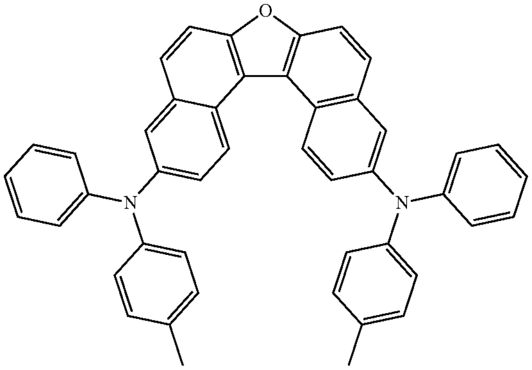
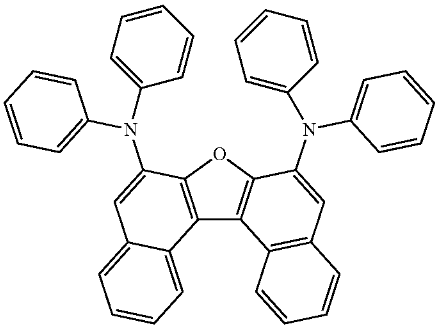
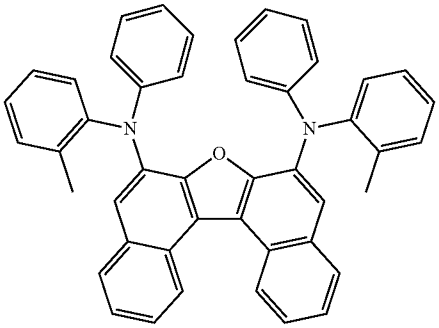
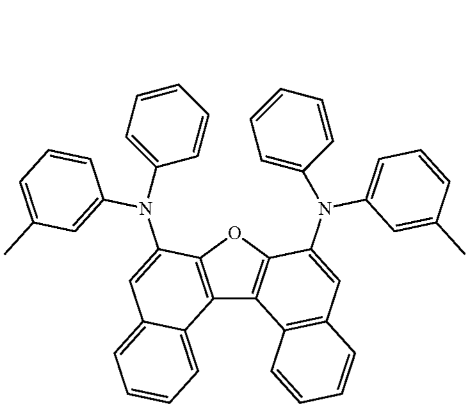
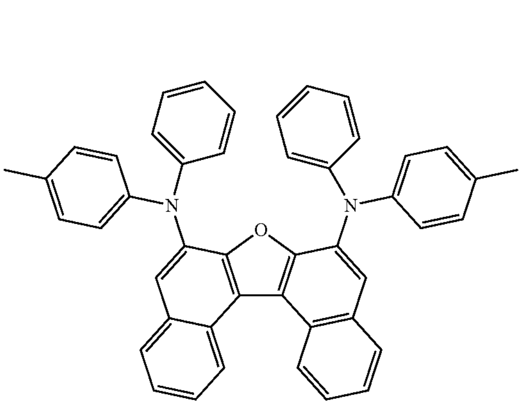

-continued

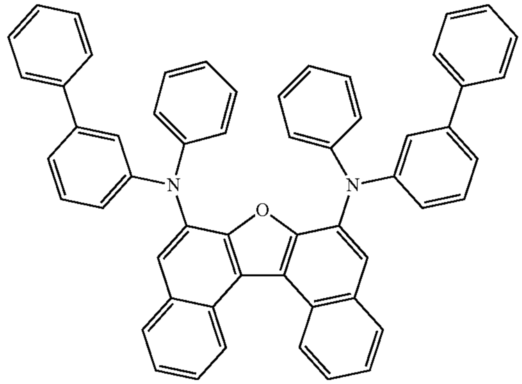

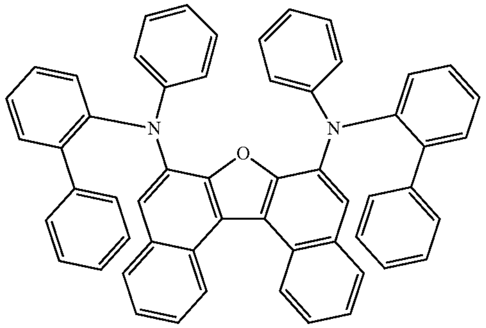

Compound Represented by Formula (9)

The compound represented by the formula (9) will be described below.

[Formula 261]

(9)

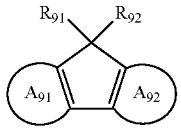

In the formula (9): $A_{91}$ ring and $A_{92}$ ring are each independently a substituted or unsubstituted aromatic hydrocarbon ring having 6 to 50 ring carbon atoms or a substituted or unsubstituted heterocycle having 5 to 50 ring atoms; and at least one of $A_{91}$ ring or $A_{92}$ ring is bonded to * in a structure represented by a formula (92) below.

[Formula 262]

(92)

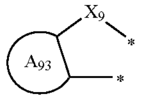

In the formula (92): $A_{93}$ ring is a substituted or unsubstituted aromatic hydrocarbon ring having 6 to 50 ring carbon atoms or a substituted or unsubstituted heterocycle having 5 to 50 ring atoms;

- $X_9$ is $NR_{93}$, $C(R_{94})(R_{95})$, $Si(R_{96})(R_{97})$, $Ge(R_{98})(R_{99})$, an oxygen atom, a sulfur atom, or a selenium atom;
- $R_{91}$ and $R_{92}$ are mutually bonded to form a substituted or unsubstituted monocyclic ring, mutually bonded to form a substituted or unsubstituted fused ring, or not mutually bonded; and
- $R_{91}$ and $R_{92}$ neither forming the monocyclic ring nor forming the fused ring, and $R_{93}$ to $R_{99}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one ring selected from the group consisting of $A_{91}$ ring and $A_{92}$ ring is bonded to a bond * of the moiety represented by the formula (92). In other words, the ring-forming carbon atoms of the aromatic hydrocarbon ring or the ring atoms of the heterocycle of the $A_{91}$ ring in an exemplary embodiment are bonded to the bonds * in the moiety represented by the formula (92). Further, the ring-forming carbon atoms of the aromatic hydrocarbon ring or the ring atoms of the heterocycle of the $A_{92}$ ring in an exemplary embodiment are bonded to the bonds * in the moiety represented by the formula (92).

In an exemplary embodiment, the group represented by a formula (93) below is bonded to one or both of the $A_{91}$ ring and $A_{92}$ ring.

[Formula 263]

(93)

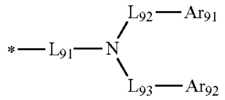

In the formula (93): $Ar_{91}$ and $Ar_{92}$ are each independently a substituted or unsubstituted aryl group having 6 to 50 ring carbon atoms, or a substituted or unsubstituted heterocyclic group having 5 to 50 ring atoms;

- $L_{91}$ to $L_{93}$ each independently represent a single bond, a substituted or unsubstituted arylene group having 6 to 30 ring carbon atoms, a substituted or unsubstituted heterocyclic group having 5 to 30 ring atoms, or a divalent linking group formed by bonding two, three or four groups selected from the group consisting of the substituted or unsubstituted arylene group having 6 to 30 ring carbon atoms and a substituted or unsubstituted divalent heterocyclic group having 5 to 30 ring atoms; and
- * in the formula (93) represents a bonding position to one of the $A_{91}$ ring and the $A_{92}$ ring.

In an exemplary embodiment, in addition to the $A_{91}$ ring, the ring-forming carbon atoms of the aromatic hydrocarbon ring or the ring atoms of the heterocycle of the $A_{92}$ ring are bonded to * in the moiety represented by the formula (92). In this case, the moieties represented by the formula (92) are mutually the same or different.

In an exemplary embodiment, $R_{91}$ and $R_{92}$ are each independently a substituted or unsubstituted aryl group having 6 to 50 ring carbon atoms.

In an exemplary embodiment, $R_{91}$ and $R_{92}$ are mutually bonded to form a fluorene structure.

In an exemplary embodiment, the rings $A_{91}$ and $A_{92}$ are each independently a substituted or unsubstituted aromatic hydrocarbon ring having 6 to 50 ring carbon atoms, example of which is a substituted or unsubstituted benzene ring.

In an exemplary embodiment, the ring $A_{93}$ is a substituted or unsubstituted aromatic hydrocarbon ring having 6 to 50 ring carbon atoms, example of which is a substituted or unsubstituted benzene ring.

In an exemplary embodiment, $X_9$ is an oxygen atom or a sulfur atom.

Specific Examples of Compound Represented by Formula (9)

Specific examples of the compound represented by the formula (9) include compounds shown below.

[Formula 264]

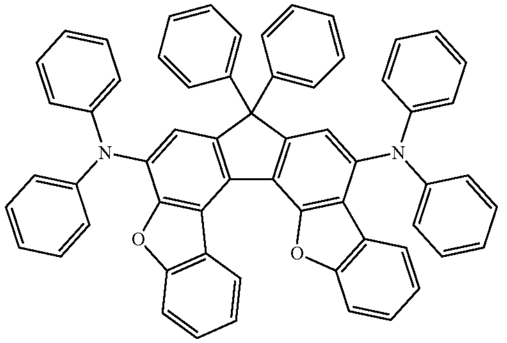

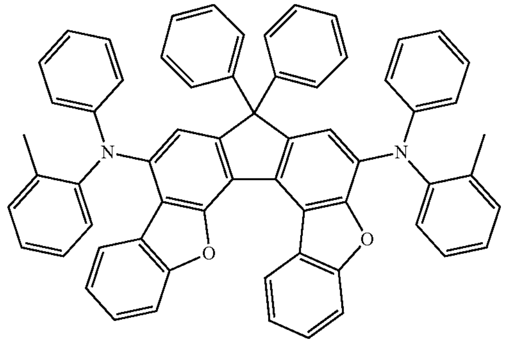

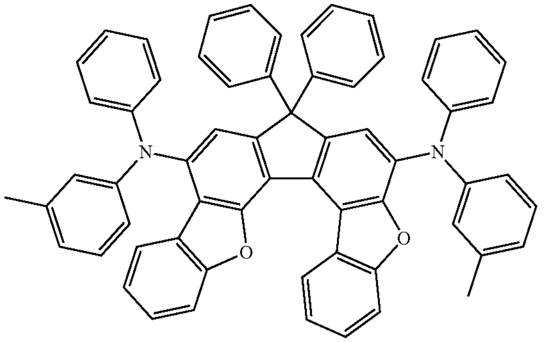

-continued

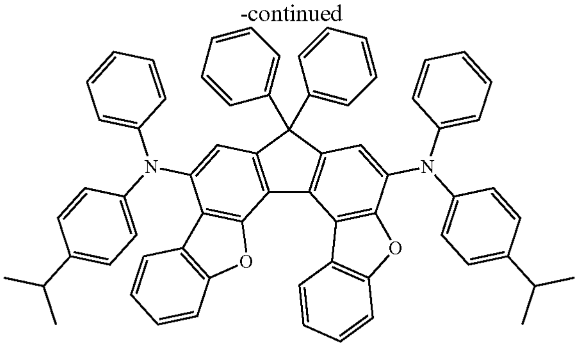

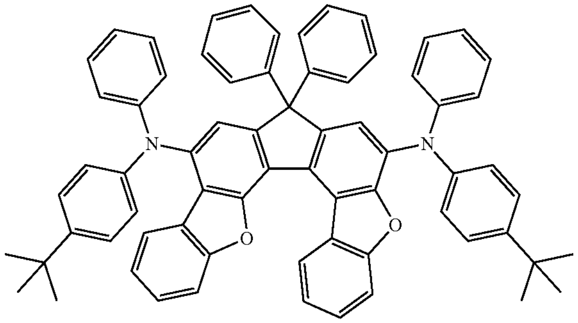

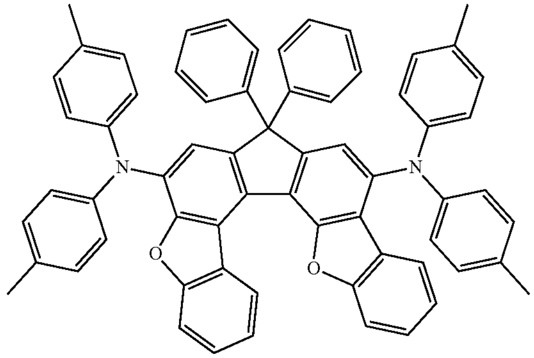

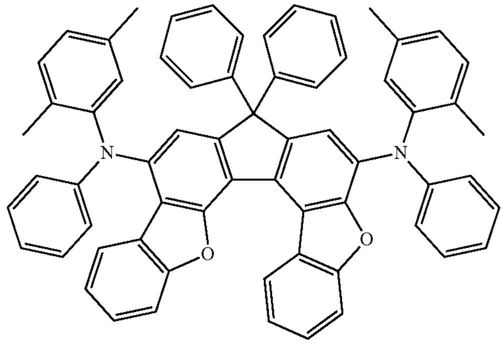

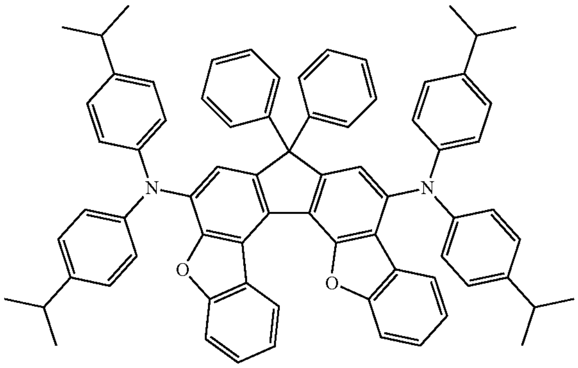

-continued
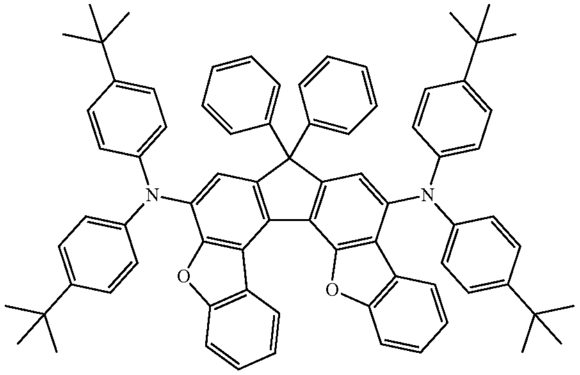
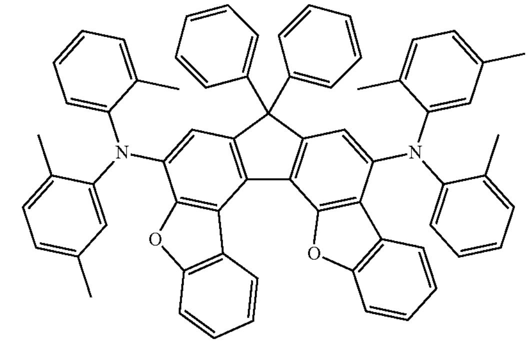
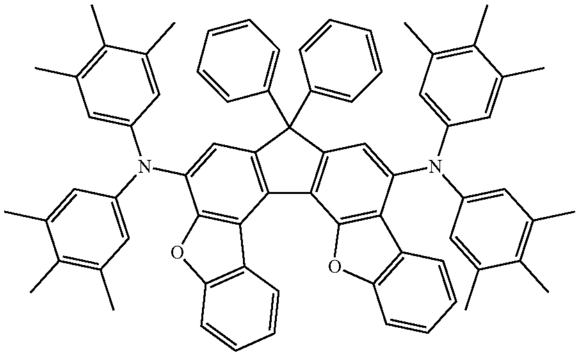
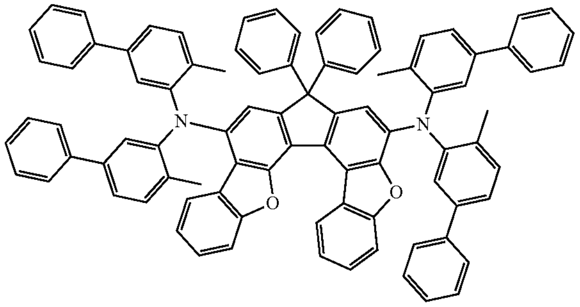
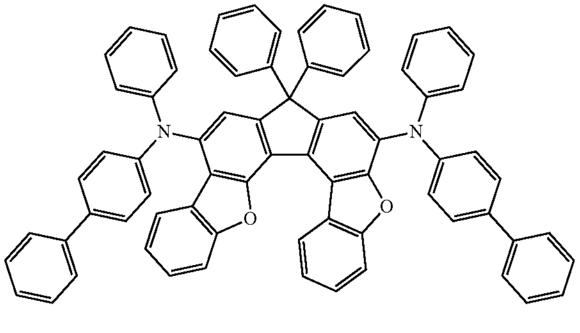
-continued
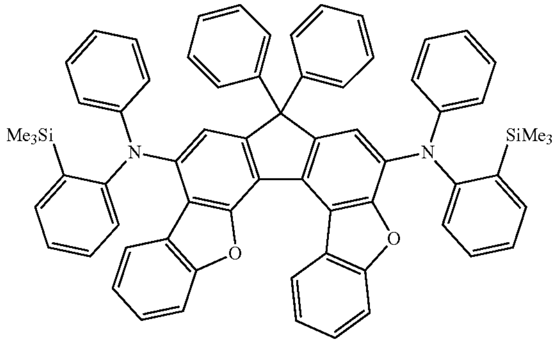
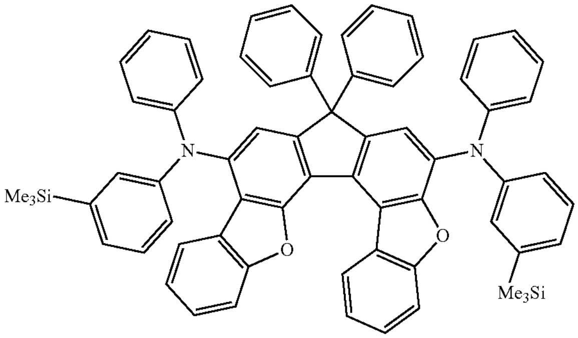
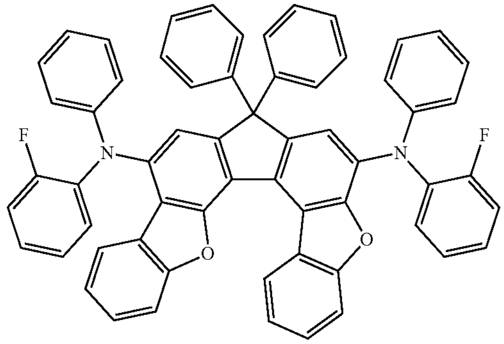
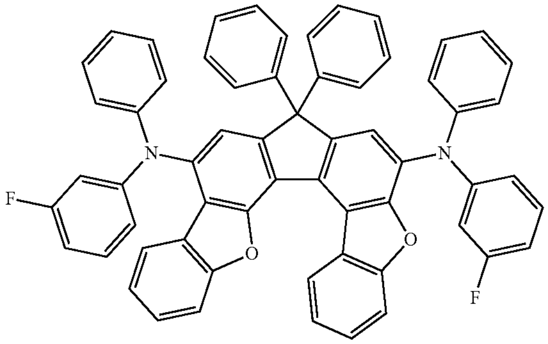
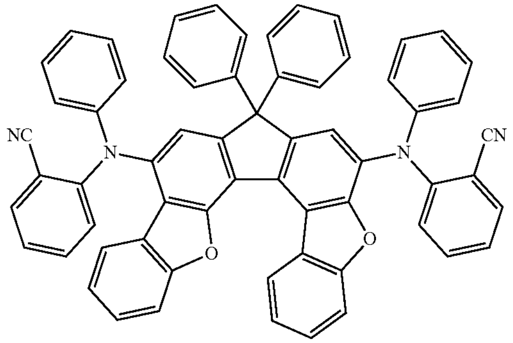

-continued
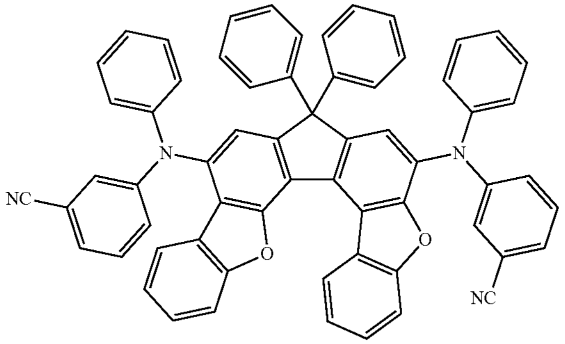
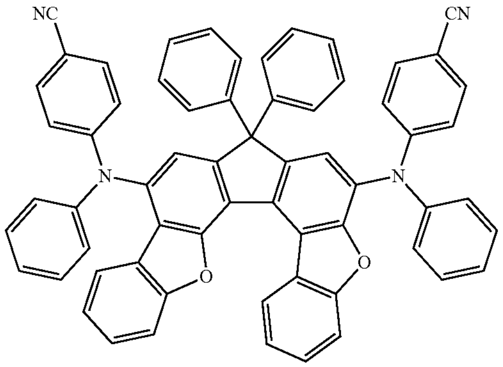
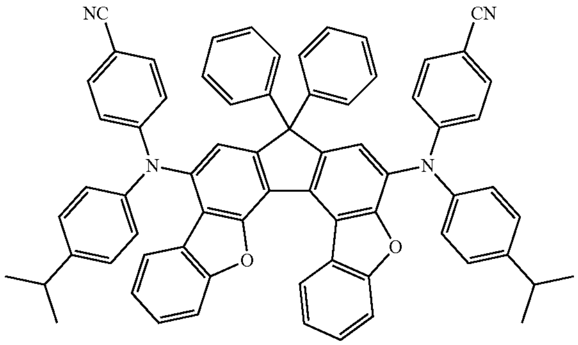
[Formula 265]
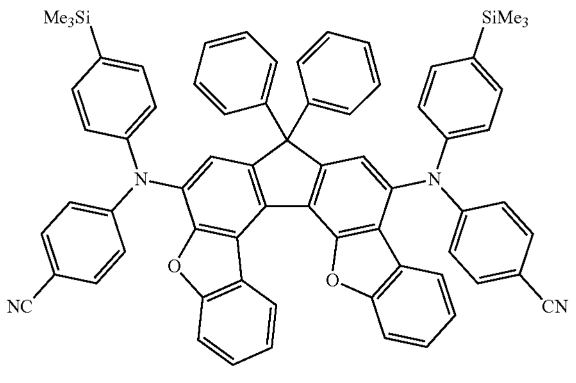
-continued
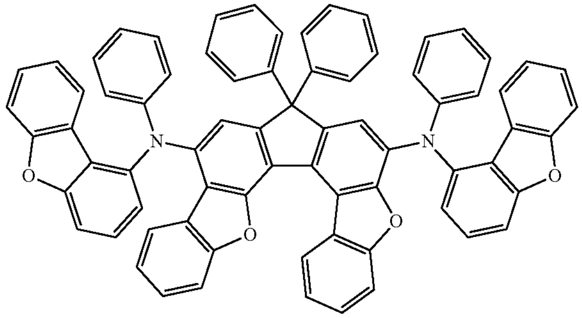
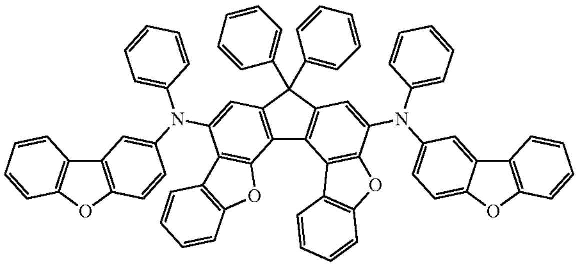
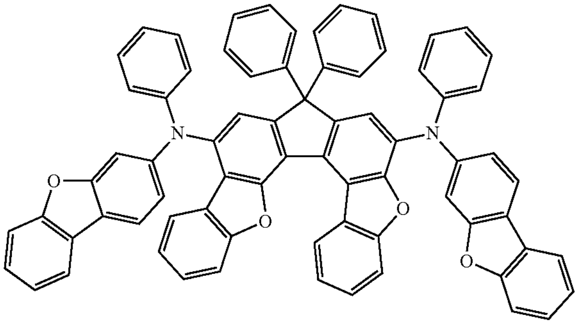
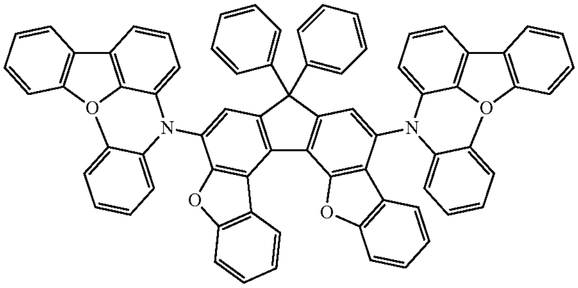
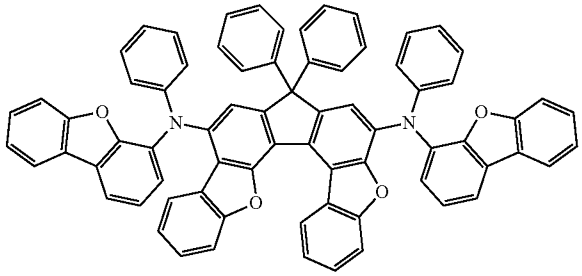

-continued
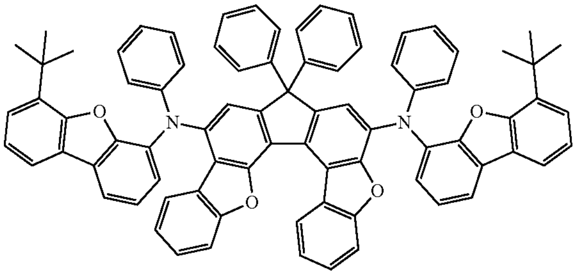
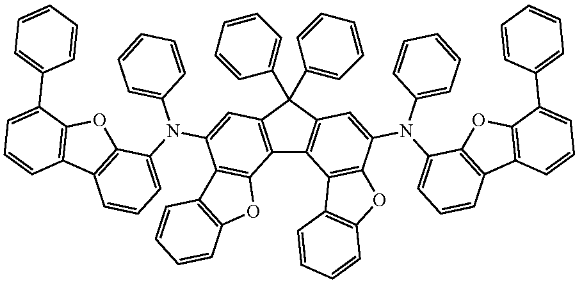
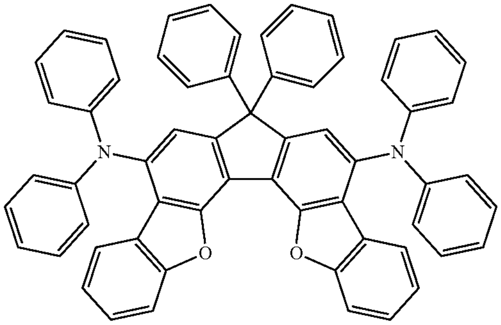
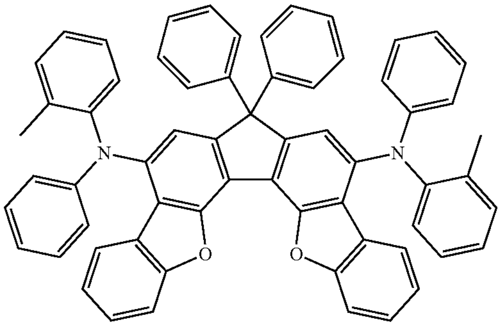
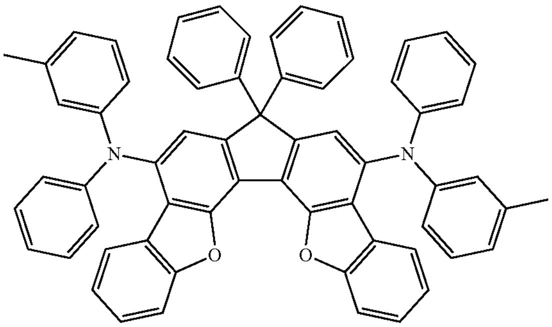
-continued
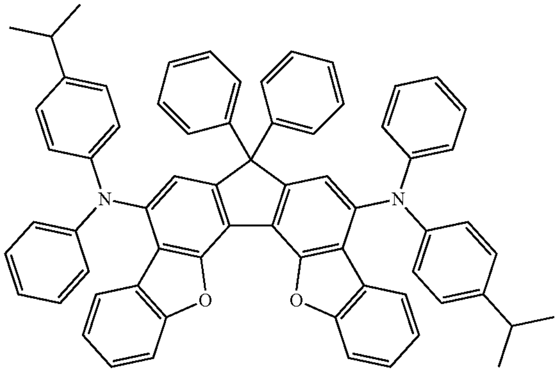
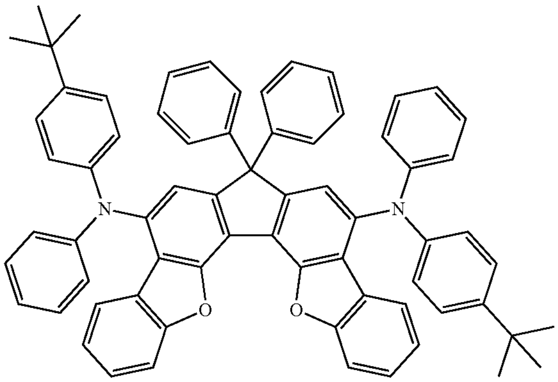
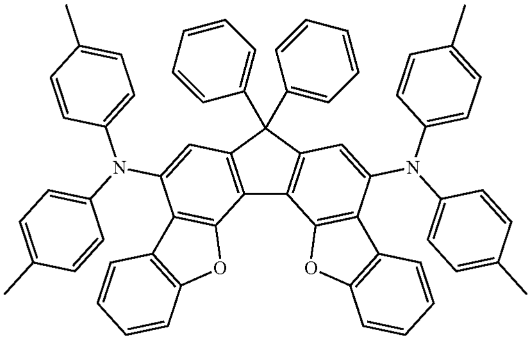
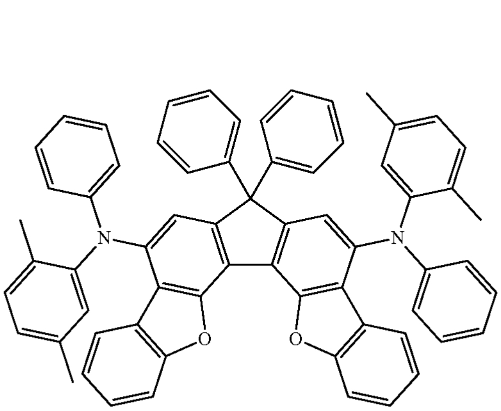

-continued
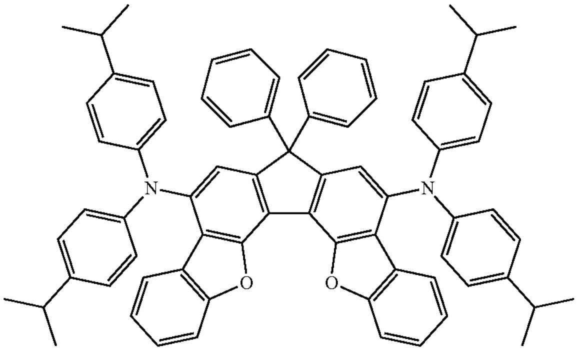
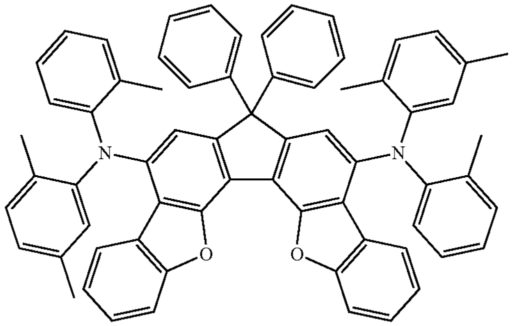
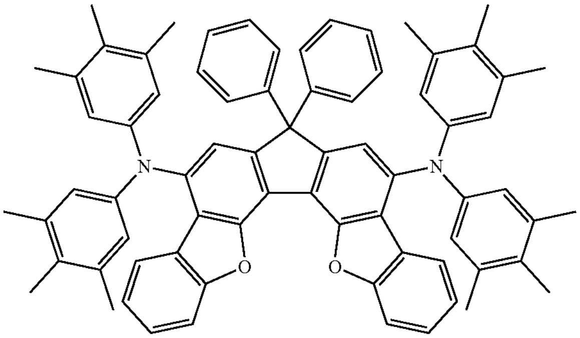
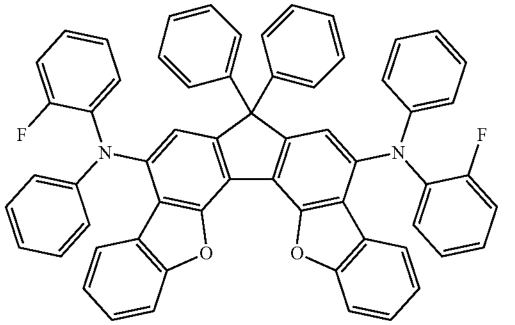
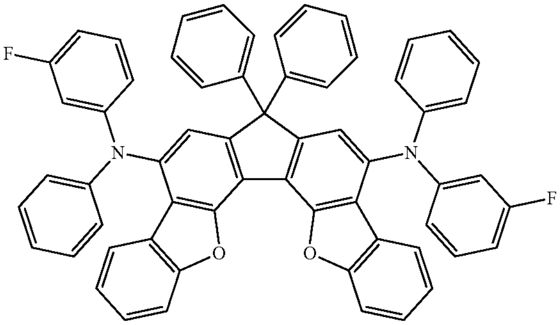
-continued
[Formula 266]
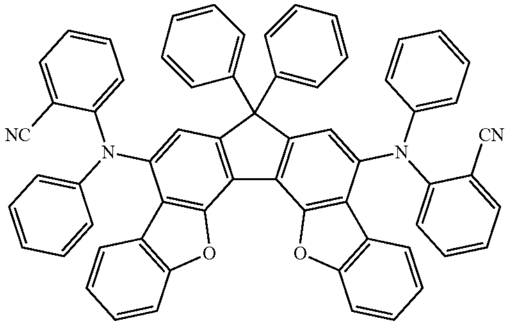
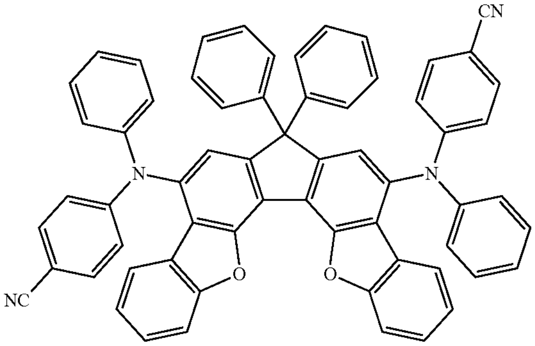
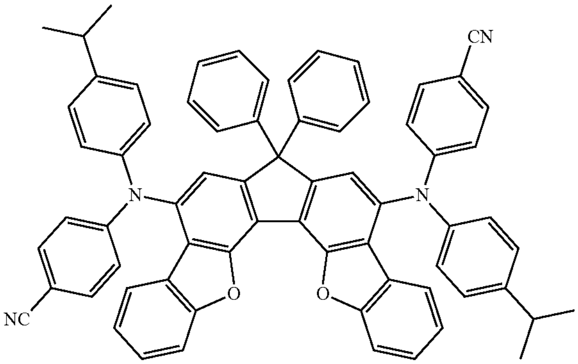
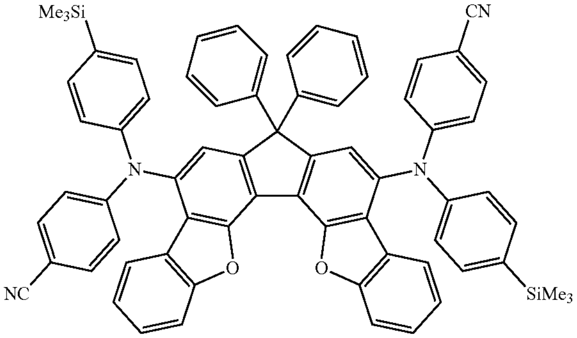
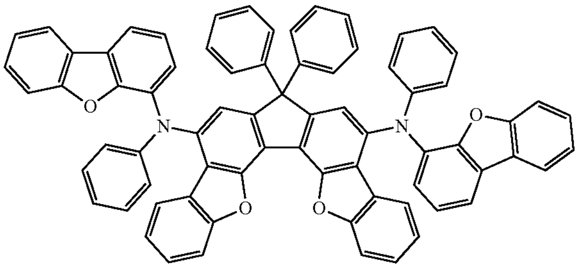

-continued
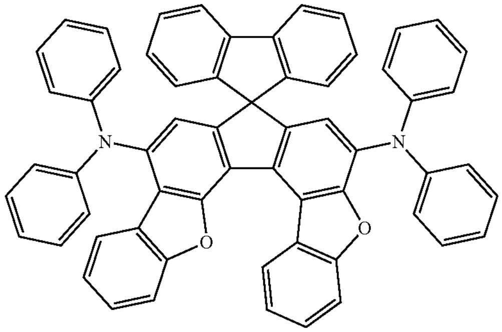
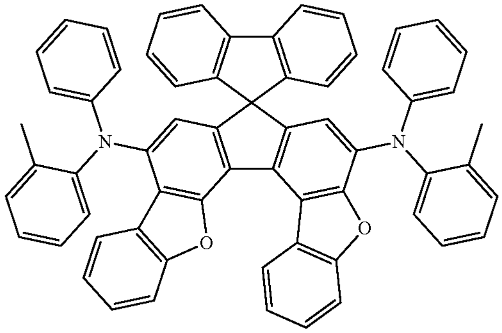
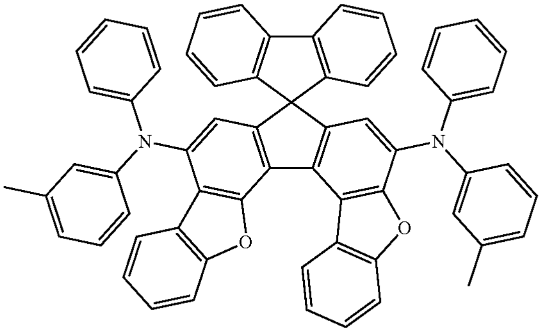
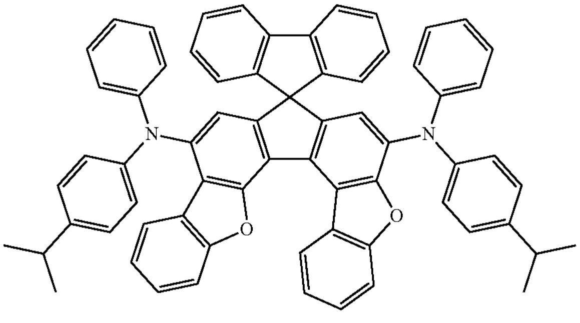
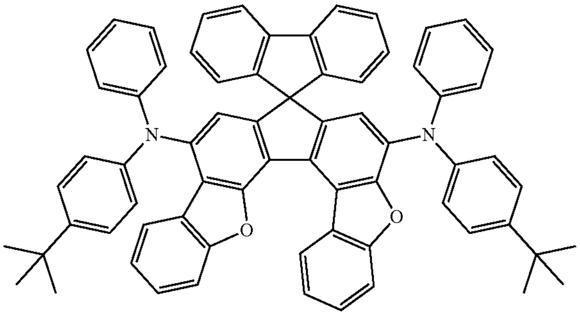
-continued
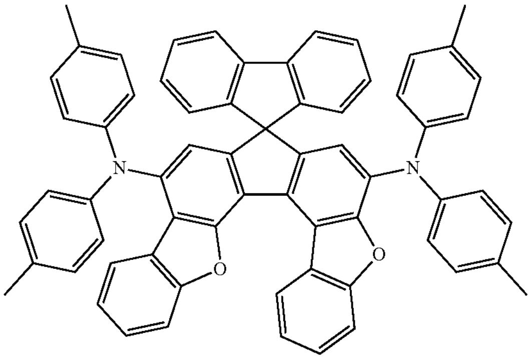
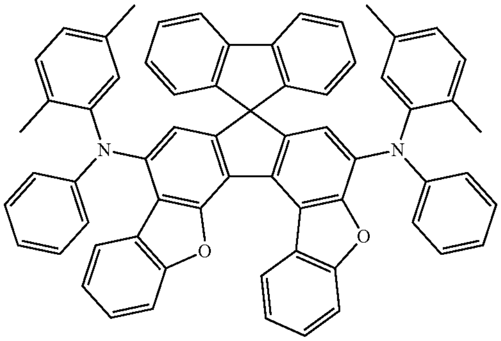
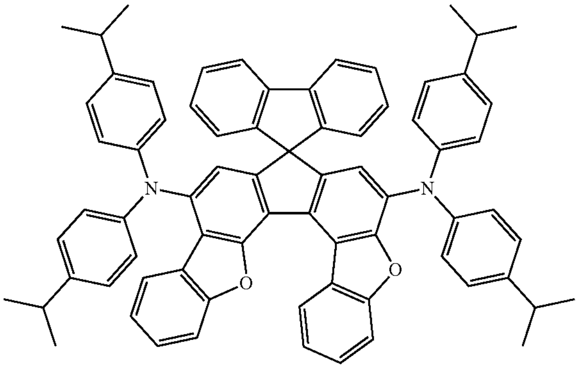
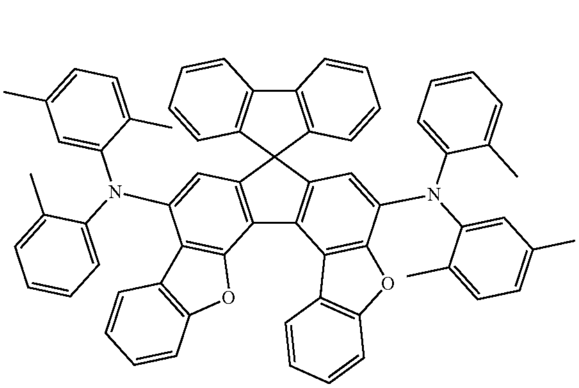

-continued
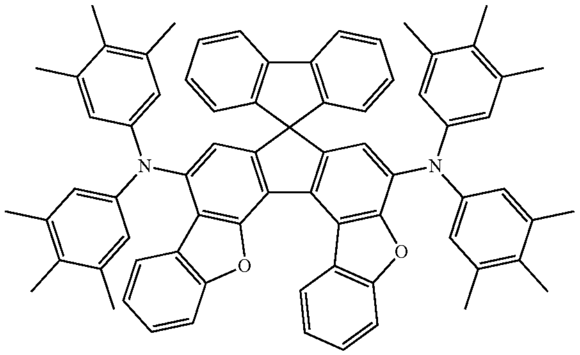
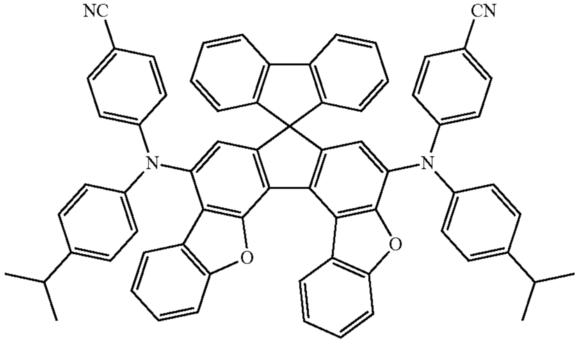
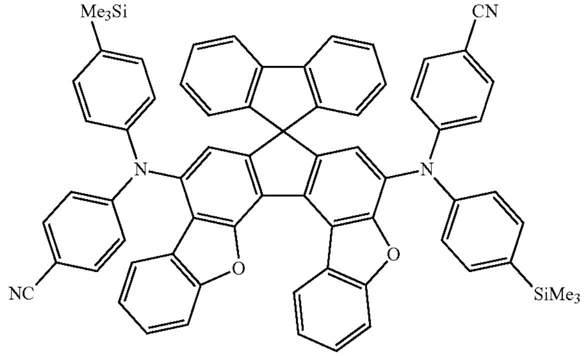
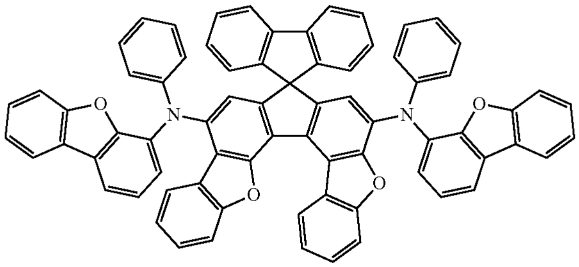
[Formula 267]
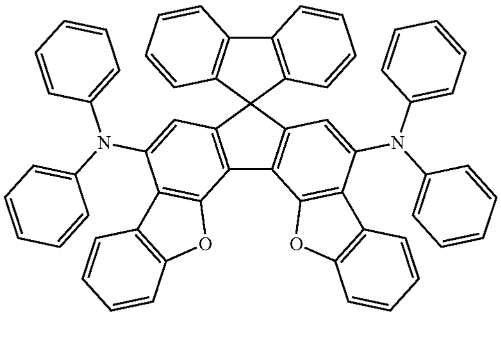
-continued
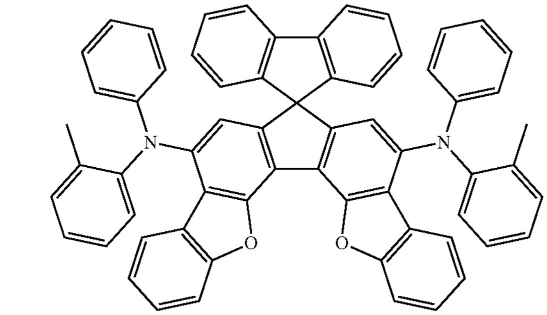
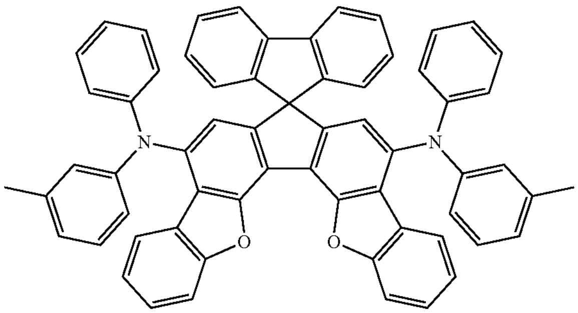
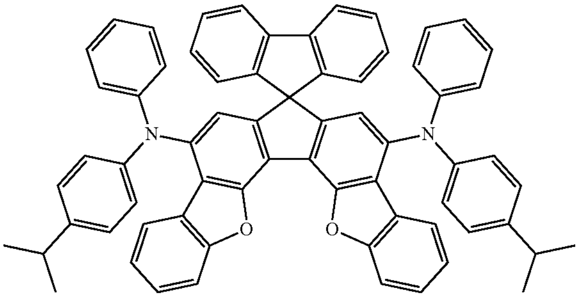
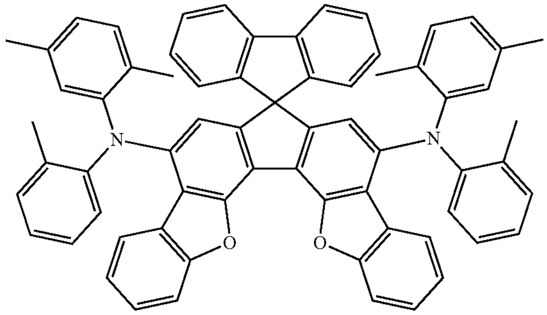
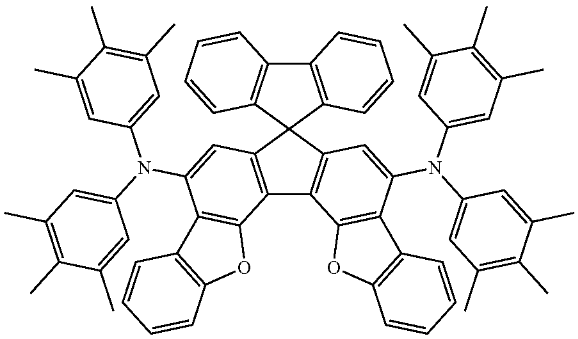

-continued

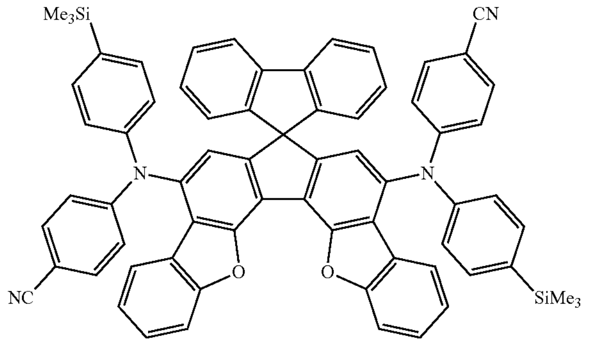

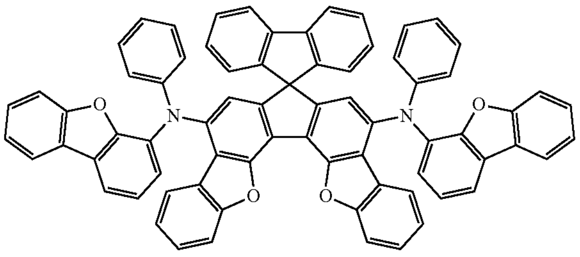

Compound Represented by Formula (10)

The compound represented by the formula (10) will be described below.

[Formula 268]

(10)

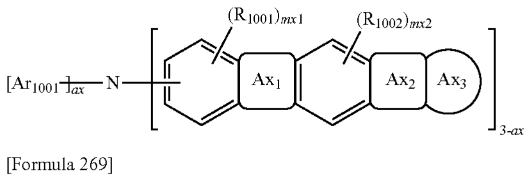

[Formula 269]

(10a)

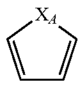

(10b)

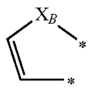

In the formula (10):

$Ax_1$ ring is a ring represented by the formula (10a) and fused with any positions of adjacent rings;

$Ax_2$ ring is a ring represented by the formula (10b) and fused with any positions of adjacent rings;

two * in the formula (10b) are bonded to any position of $Ax_3$ ring;

$X_A$ and $X_B$ are each independently $C(R_{1003})(R_{1004})$, $Si(R_{1005})(R_{1006})$, an oxygen atom or a sulfur atom;

$Ax_3$ ring is a substituted or unsubstituted aromatic hydrocarbon ring having 6 to 50 ring carbon atoms or a substituted or unsubstituted heterocycle having 5 to 50 ring atoms;

$Ar_{1001}$ is a substituted or unsubstituted aryl group having 6 to 50 ring carbon atoms, or a substituted or unsubstituted heterocyclic group having 5 to 50 ring atoms;

$R_{1001}$ to $R_{1006}$ each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

mx1 is 3, and mx2 is 2;

a plurality of $R_{1001}$ are mutually the same or different;

a plurality of $R_{1002}$ are mutually the same or different;

ax is 0, 1, or 2;

when ax is 0 or 1, the structures enclosed by brackets indicated by "3-ax" are mutually the same or different; and when ax is 2, a plurality of $Ar_{1001}$ are mutually the same or different.

In an exemplary embodiment, $Ar_{1001}$ is a substituted or unsubstituted aryl group having 6 to 50 ring carbon atoms.

In an exemplary embodiment, $Ax_3$ ring is a substituted or unsubstituted aromatic hydrocarbon ring having 6 to 50 ring carbon atoms, example of which is a substituted or unsubstituted benzene ring, a substituted or unsubstituted naphthalene ring, or a substituted or unsubstituted anthracene ring.

In an exemplary embodiment, $R_{1003}$ and $R_{1004}$ are each independently a substituted or unsubstituted alkyl group having 1 to 50 carbon atoms.

In an exemplary embodiment, ax is 1.

Specific Examples of Compound Represented by Formula (10)

Specific examples of the compound represented by the formula (10) include compounds shown below.

[Formula 270]
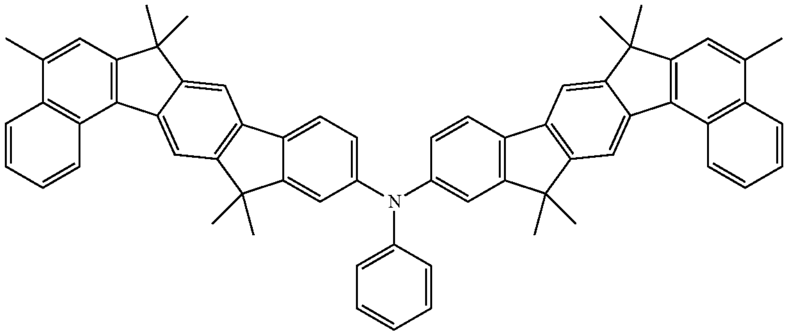
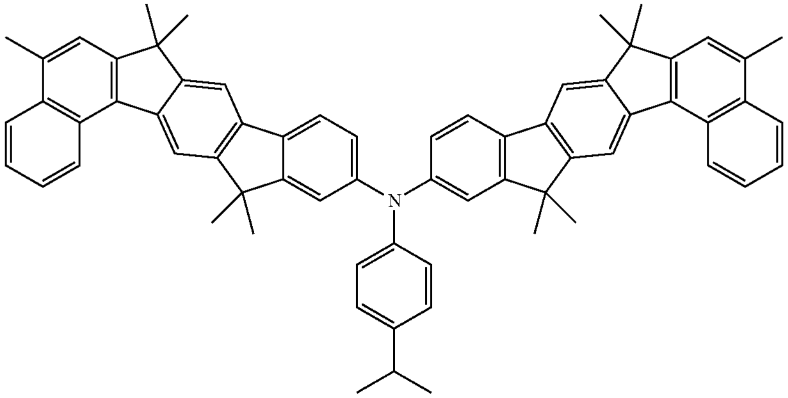
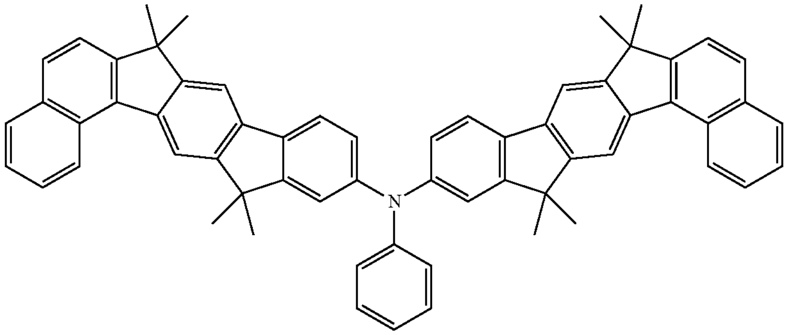
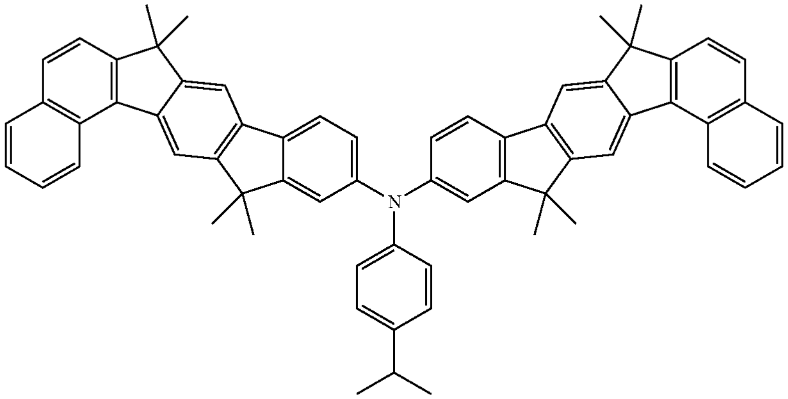

-continued
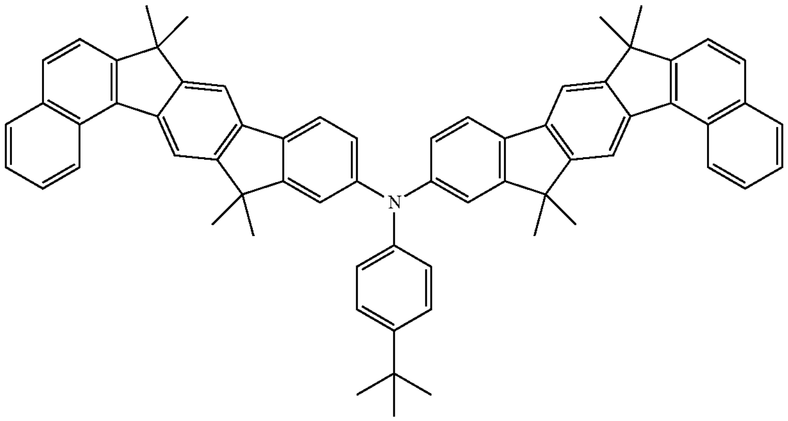
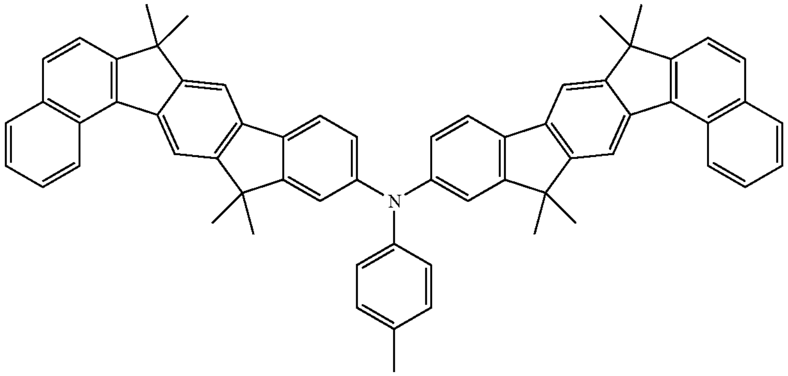
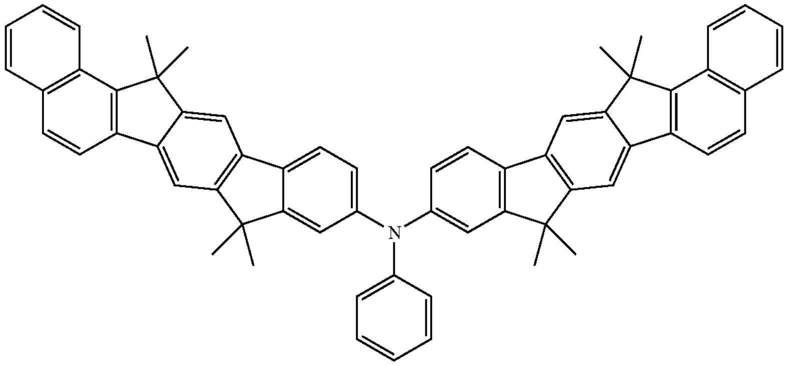
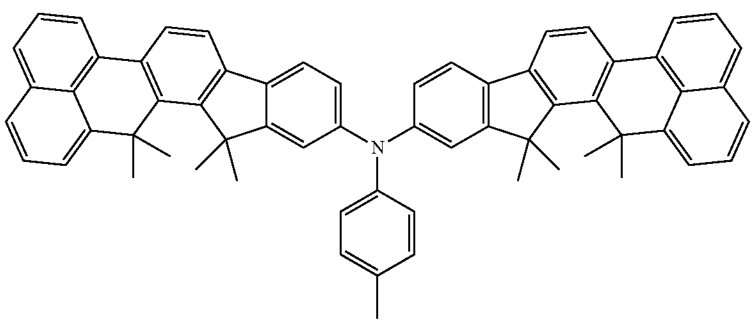

-continued
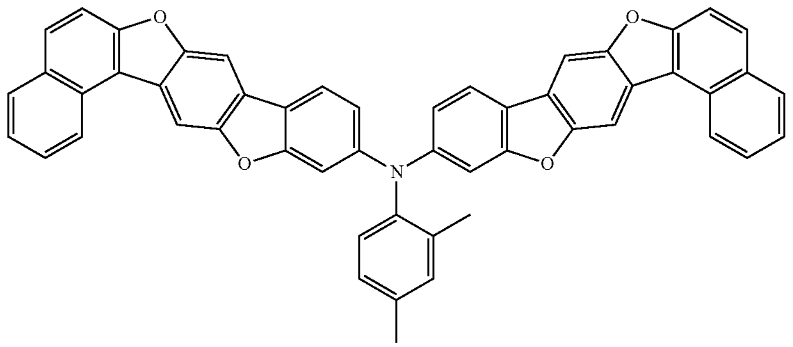
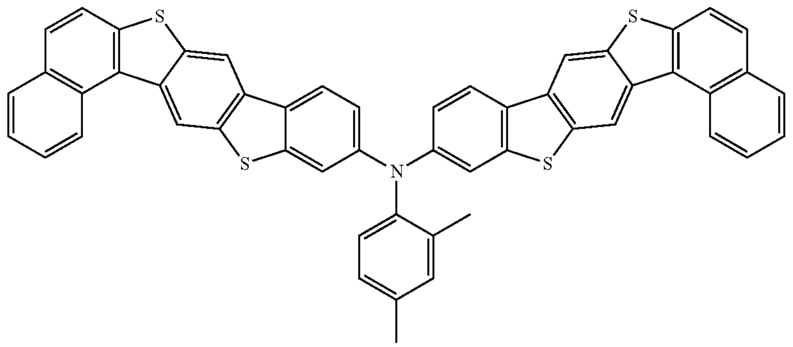
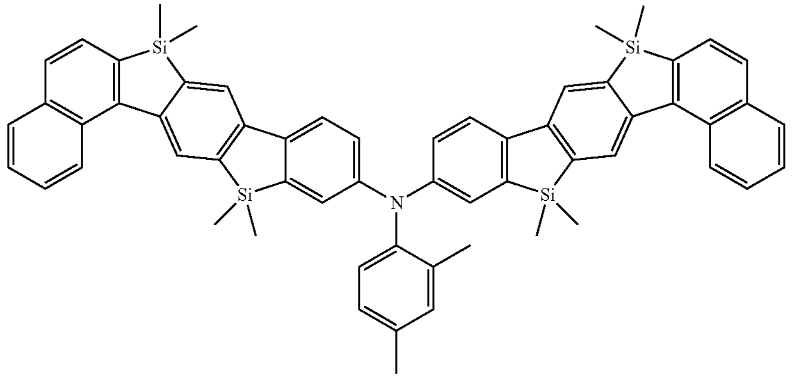

In an exemplary embodiment preferably, the emitting layer includes, as at least one of the third compound or the fourth compound, at least one compound selected from the group consisting of the compound represented by the formula (4) below, the compound represented by the formula (5) below, the compound represented by the formula (7) below, the compound represented by the formula (8) below, the compound represented by the formula (9) below, and a compound represented by a formula (63a) below.

[Formula 271]

(63a)

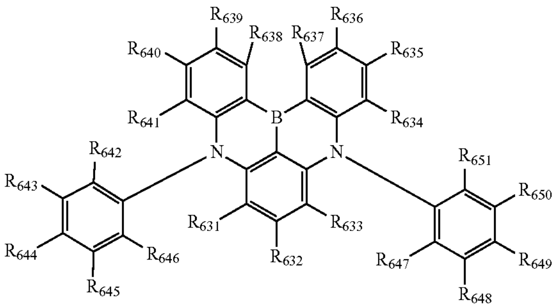

In the formula (63a):

$R_{631}$ is bonded with $R_{646}$ to form a substituted or unsubstituted heterocycle or to form no substituted or unsubstituted heterocycle;

$R_{633}$ is bonded with $R_{647}$ to form a substituted or unsubstituted heterocycle or to form no substituted or unsubstituted heterocycle;

$R_{634}$ is bonded with $R_{651}$ to form a substituted or unsubstituted heterocycle or to form no substituted or unsubstituted heterocycle;

$R_{641}$ is bonded with $R_{642}$ to form a substituted or unsubstituted heterocycle or to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded;

$R_{631}$ to $R_{651}$ neither forming the substituted or unsubstituted heterocycle, forming the monocyclic ring, nor forming the fused ring are each independently a hydrogen atom, a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aryl group having 6 to 50 ring carbon atoms, or a substituted or unsubstituted heterocyclic group having 5 to 50 ring atoms; and at least one of $R_{631}$ to $R_{651}$ neither forming the substituted or unsubstituted heterocycle, forming the monocyclic ring, nor forming the fused ring are a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is the compound represented by the formula (41-3), the formula (41-4) or the formula (41-5), the A1 ring in the formula (41-5) being a substituted or unsubstituted fused aromatic hydrocarbon ring having 10 to 50 ring carbon atoms, or a substituted or unsubstituted fused heterocycle having 8 to 50 ring atoms.

In an exemplary embodiment, the substituted or unsubstituted fused aromatic hydrocarbon ring having 10 to 50 ring carbon atoms in the formulae (41-3), (41-4) and (41-5) is a substituted or unsubstituted naphthalene ring, a substituted or unsubstituted anthracene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the substituted or unsubstituted fused aromatic hydrocarbon ring having 10 to 50 ring carbon atoms in the formula (41-3), (41-4) or (41-5) is a substituted or unsubstituted naphthalene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the compound represented by the formula (4) is selected from the group consisting of a compound represented by a formula (461) below, a compound represented by a formula (462) below, a compound represented by a formula (463) below, a compound represented by a formula (464) below, a compound represented by a formula (465) below, a compound represented by a formula (466) below, and a compound represented by a formula (467) below.

[Formula 272]

(461)

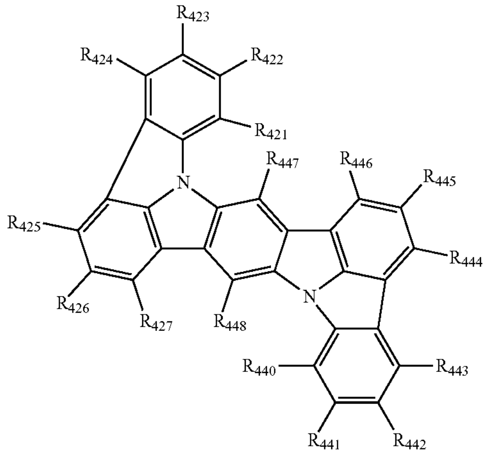

-continued (462)

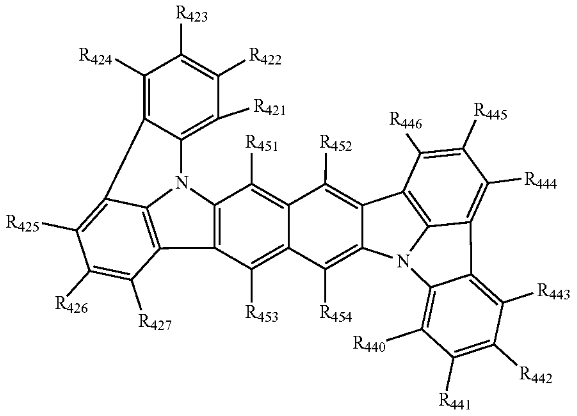

[Formula 273]

(463)

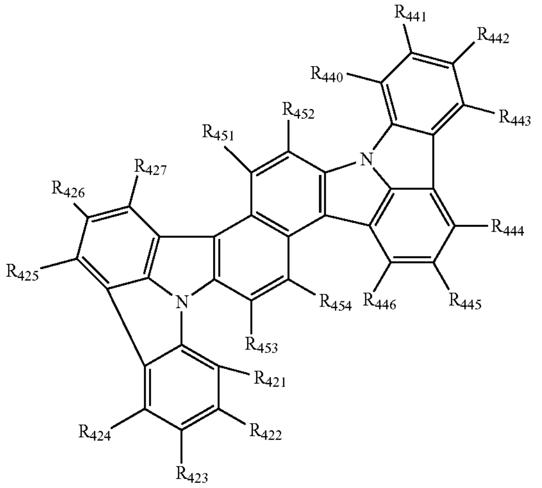

(464)

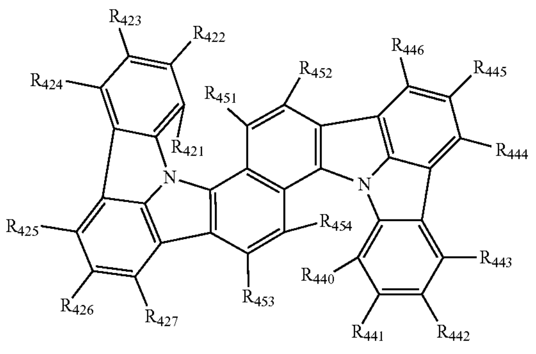

-continued

[Formula 274]

(465)

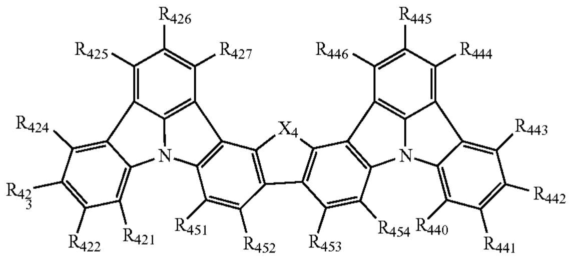

[Formula 275]

(466)

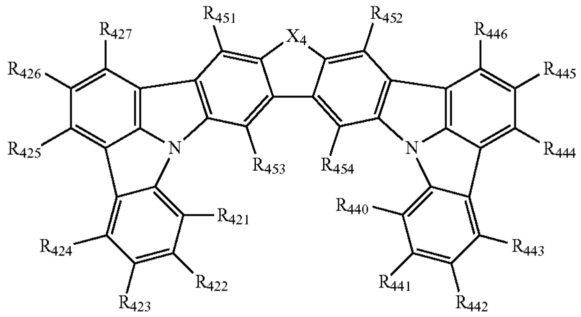

[Formula 276]

(467)

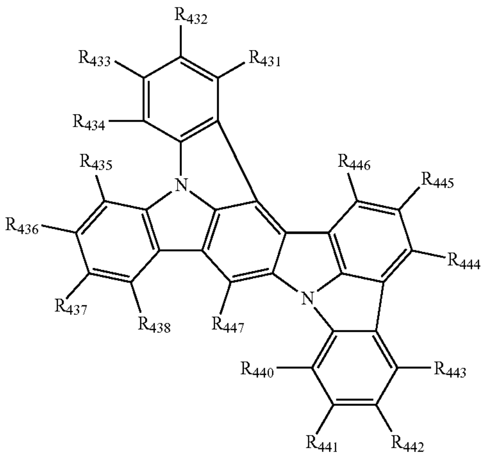

In the formulae (461) to (467): at least one combination of adjacent two or more of moieties selected from $R_{421}$ to $R_{427}$, $R_{431}$ to $R_{436}$, $R_{440}$ to $R_{448}$, and $R_{451}$ to $R_{454}$ are mutually bonded to form a substituted or unsubstituted monocyclic ring, mutually bonded to form a substituted or unsubstituted fused ring, or not mutually bonded;

$R_{421}$ to $R_{427}$, $R_{431}$ to $R_{436}$, $R_{440}$ to $R_{448}$, and $R_{451}$ to $R_{454}$ neither forming the monocyclic ring nor forming the fused ring, and $R_{437}$ and $R_{438}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, $R_{421}$ to $R_{427}$ and $R_{440}$ to $R_{448}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{421}$ to $R_{427}$ and $R_{440}$ to $R_{447}$ are each independently selected from the group consisting of a hydrogen atom, a substituted or unsubstituted aryl group having 6 to 18 ring carbon atoms, and a substituted or unsubstituted heterocyclic group having 5 to 18 ring atoms.

In an exemplary embodiment, the compound represented by the formula (41-3) is represented by a formula (41-3-1) below.

[Formula 277]

(41-3-1)

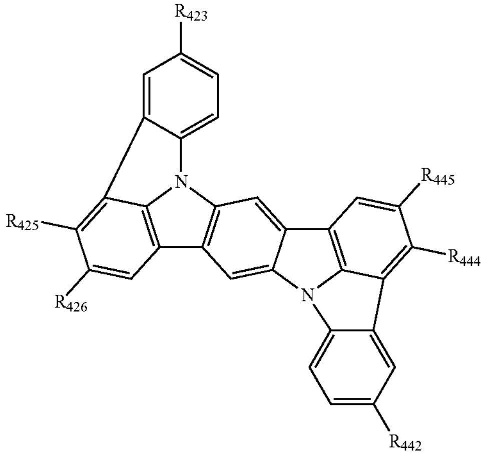

In the formula (41-3-1), $R_{423}$, $R_{425}$, $R_{426}$, $R_{442}$, $R_{444}$ and $R_{445}$ respectively represent the same as $R_{423}$, $R_{425}$, $R_{426}$, $R_{442}$, $R_{444}$ and $R_{445}$ in the formula (41-3).

In an exemplary embodiment, the compound represented by the formula (41-3) is a compound represented by a formula (41-3-2) below.

[Formula 278]

(41-3-2)

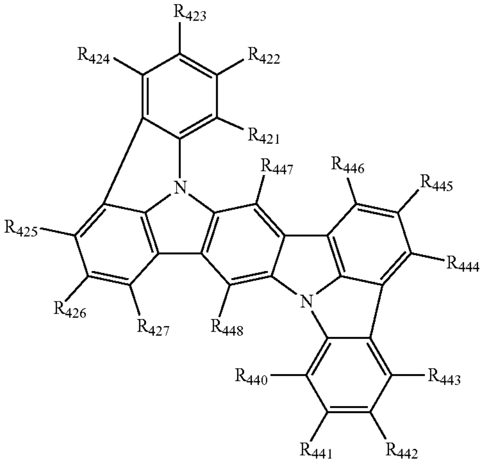

In the formula (41-3-2), $R_{421}$ to $R_{427}$ and $R_{440}$ to $R_{448}$ respectively independently represent the same as $R_{421}$ to $R_{427}$ and $R_{440}$ to $R_{448}$ in the formula (41-3); and at least one of $R_{421}$ to $R_{427}$ or $R_{440}$ to $R_{446}$ is a group represented by —N($R_{906}$)($R_{907}$).

In an exemplary embodiment, two of $R_{421}$ to $R_{427}$ and $R_{440}$ to $R_{446}$ in the formula (41-3-2) are groups represented by —N($R_{906}$)($R_{907}$).

In an exemplary embodiment, the compound represented by the formula (41-3-2) is represented by a formula (41-3-3) below.

[Formula 279]

(41-3-3)

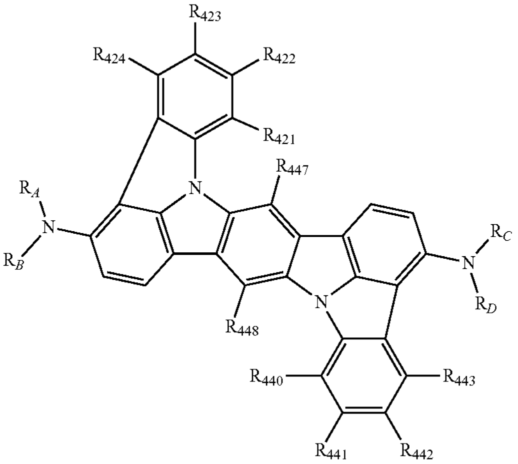

In the formula (41-3-3), $R_{421}$ to $R_{424}$, $R_{440}$ to $R_{443}$, $R_{447}$, and $R_{448}$ each independently represent the same as $R_{421}$ to $R_{424}$, $R_{440}$ to $R_{443}$, $R_{447}$, and $R_{448}$ in the formula (41-3); and $R_A$, $R_B$, $R_C$, and $R_D$ are each independently a substituted or unsubstituted aryl group having 6 to 18 ring carbon atoms, or a substituted or unsubstituted heterocyclic group having 5 to 18 ring atoms.

In an exemplary embodiment, the compound represented by the formula (41-3-3) is represented by a formula (41-3-4) below.

[Formula 280]

(41-3-4)

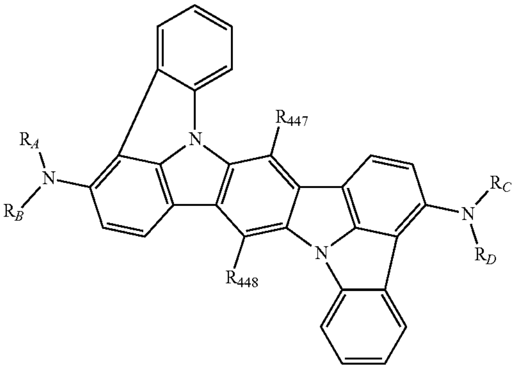

In the formula (41-3-4), $R_{447}$, $R_{448}$, $R_A$, $R_B$, $R_C$ and $R_D$ respectively represent the same as $R_{447}$, $R_{448}$, $R_A$, $R_B$, $R_C$ and $R_D$ in the formula (41-3-3).

In an exemplary embodiment, $R_A$, $R_B$, $R_C$, and $R_D$ are each independently a substituted or unsubstituted aryl group having 6 to 18 ring carbon atoms.

In an exemplary embodiment, $R_A$, $R_B$, $R_C$, and $R_D$ are each independently a substituted or unsubstituted phenyl group.

In an exemplary embodiment, $R_{447}$ and $R_{448}$ are each a hydrogen atom.

In an exemplary embodiment, the substituent for "substituted or unsubstituted" is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), —O—($R_{904a}$), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more $R_{904a}$ are present, the two or more $R_{904a}$ are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In an exemplary embodiment, the substituent for "substituted or unsubstituted" is an unsubstituted alkyl group having 1 to 50 carbon atoms, an unsubstituted aryl group having 6 to 50 ring carbon atoms, or an unsubstituted heterocyclic group having 5 to 50 ring atoms.

In an exemplary embodiment, the substituent for "substituted or unsubstituted" is an unsubstituted alkyl group having 1 to 18 carbon atoms, an unsubstituted aryl group having 6 to 18 ring carbon atoms, or an unsubstituted heterocyclic group having 5 to 18 ring atoms.

Second Exemplary Embodiment

Electronic Device

An electronic device according to a third exemplary embodiment is installed with any one of the organic EL devices according to the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited by the above-described exemplary embodiments but includes any modification and improvement as long as such modification and improvement are compatible with the invention.

For instance, the number of emitting layers is not limited to two, and more than two emitting layers may be layered. When the organic EL device includes more than two emitting layers, it is only necessary that at least two of the emitting layers should satisfy the requirements mentioned in the above exemplary embodiment. For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

For instance, a blocking layer may be provided adjacent to at least one of a side of the emitting layer close to the anode or a side of the emitting layer close to the cathode. The blocking layer is preferably provided in contact with the emitting layer to block at least any of holes, electrons, and excitons.

For instance, when the blocking layer is provided in contact with the side of the emitting layer close to the cathode, the blocking layer permits transport of electrons and blocks holes from reaching a layer provided closer to the cathode (e.g., the electron transporting layer) beyond the blocking layer. When the organic EL device includes the electron transporting layer, the blocking layer is preferably interposed between the emitting layer and the electron transporting layer.

When the blocking layer is provided in contact with the side of the emitting layer close to the anode, the blocking layer permits transport of holes and blocks electrons from reaching a layer provided closer to the anode (e.g., the hole transporting layer) beyond the blocking layer. When the organic EL device includes the hole transporting layer, the blocking layer is preferably interposed between the emitting layer and the hole transporting layer.

Alternatively, the blocking layer may be provided adjacent to the emitting layer so that excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The invention will be described in further detail with reference to Examples. It should be noted that the scope of the invention is by no means limited by Examples.

Compounds

Structures of compounds used as the first host material or the second host material used for manufacturing organic EL devices in Examples 1 to 170, and A2 to A4 are shown below.

[Formula 281]

BH1

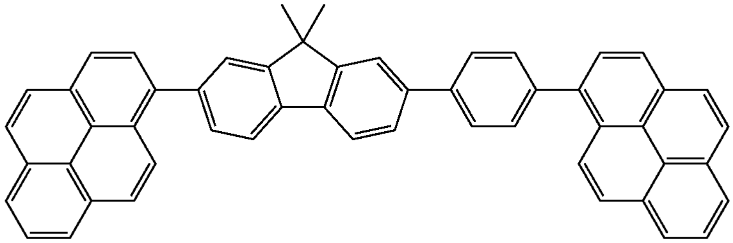

[Formula 282]

BH1-2

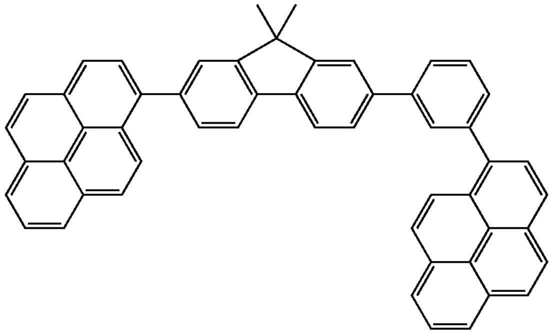

BH1-3

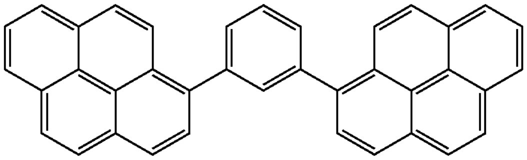

[Formula 283]

BH1-4

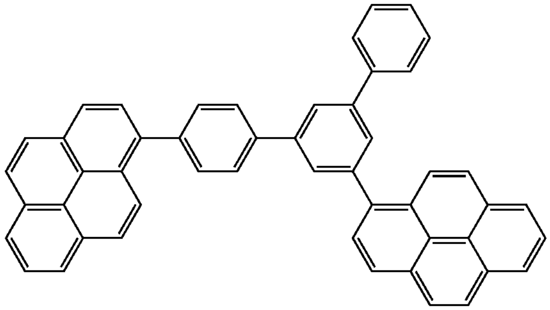

BH1-5

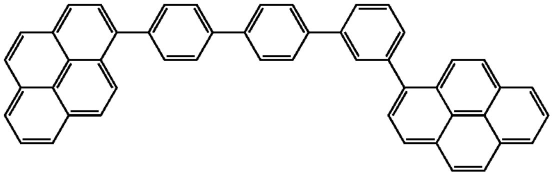

-continued
[Formula 284]
BH1-6
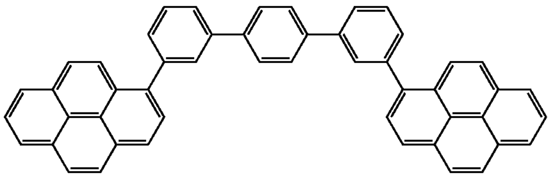
BH1-7
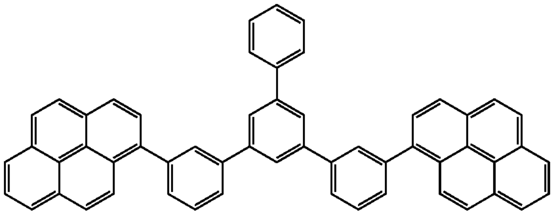
[Formula 285]
BH1-8
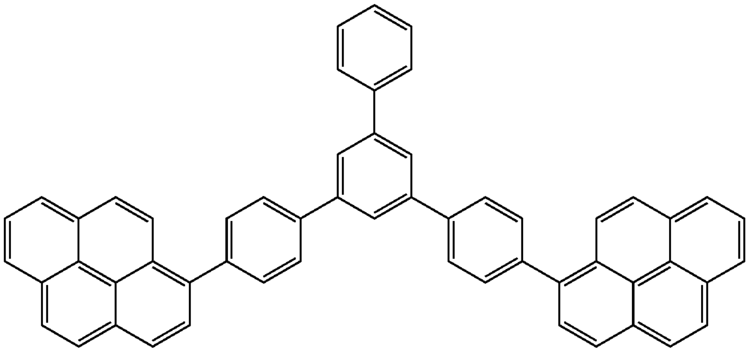
BH1-9
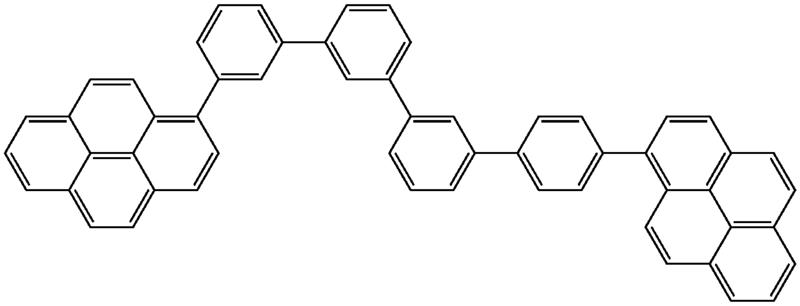
[Formula 286]
BH1-10
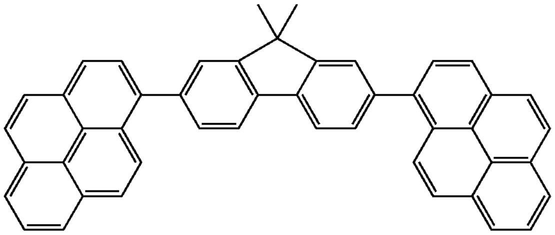
BH1-11
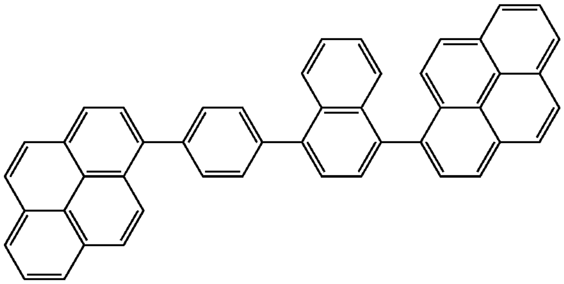

-continued
[Formula 287]
BH1-12
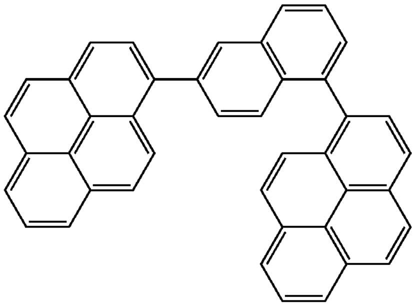
BH1-13
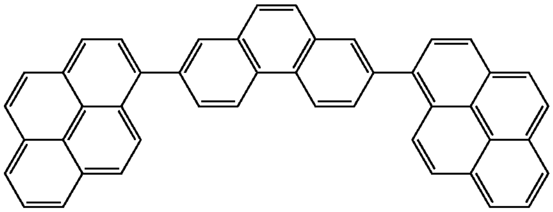
[Formula 288]
BH1-14
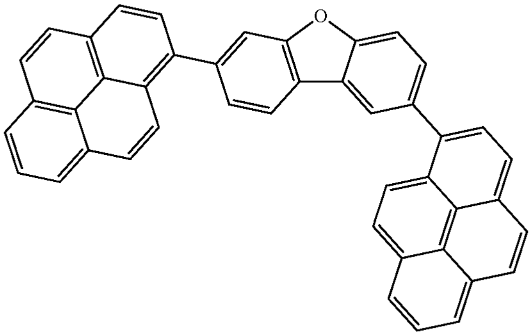
BH1-15
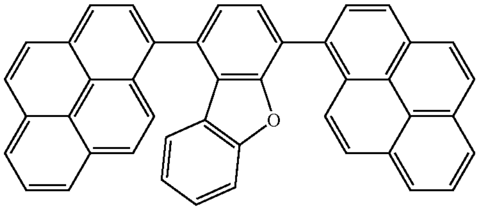
[Formula 289]
BH1-16
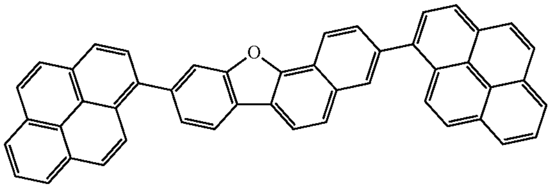
BH1-17
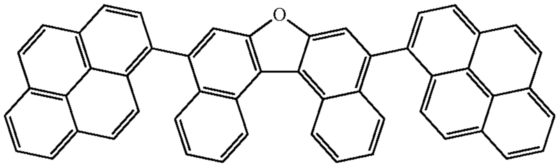
[Formula 290]
BH1-18
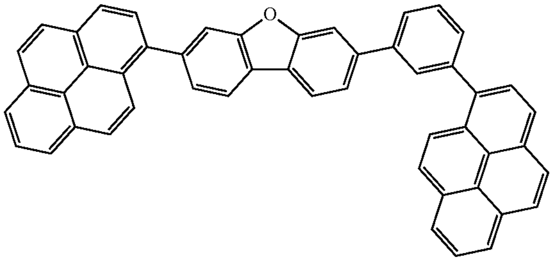
BH1-19
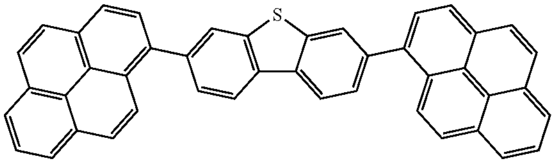

-continued
[Formula 291]
BH1-20
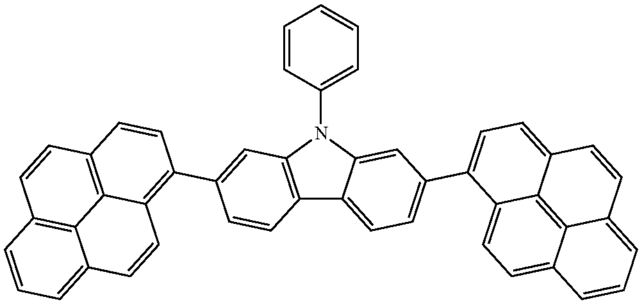
[Formula 292]
BH1-21
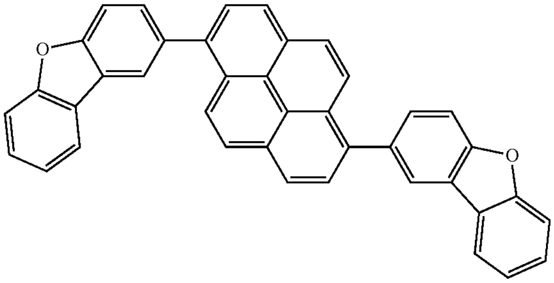
BH1-22
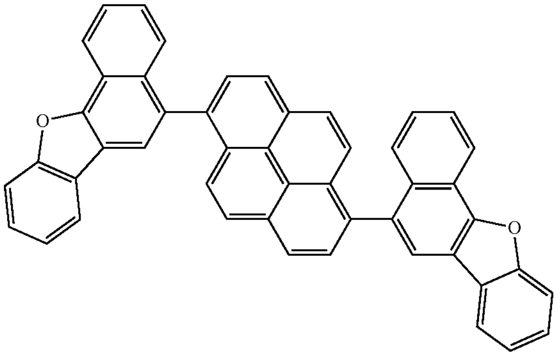
[Formula 293]
BH1-23
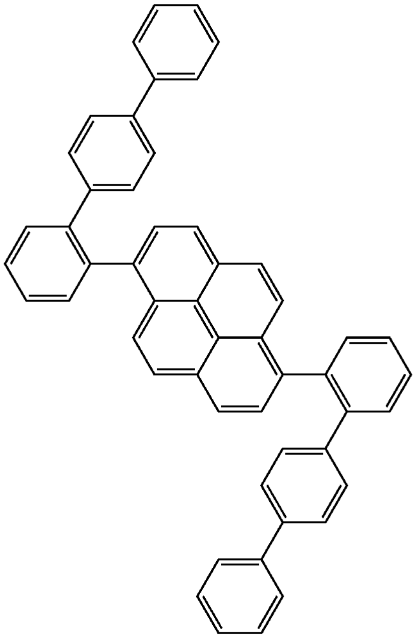
BH1-24
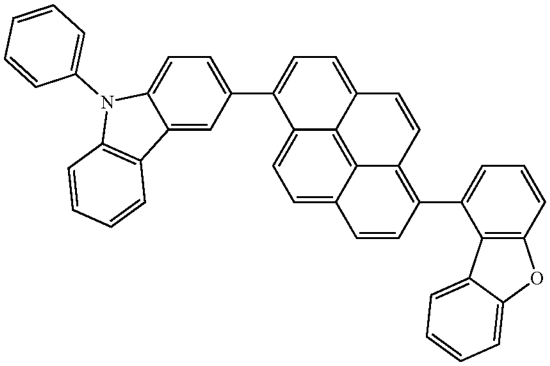

-continued
BH1-25
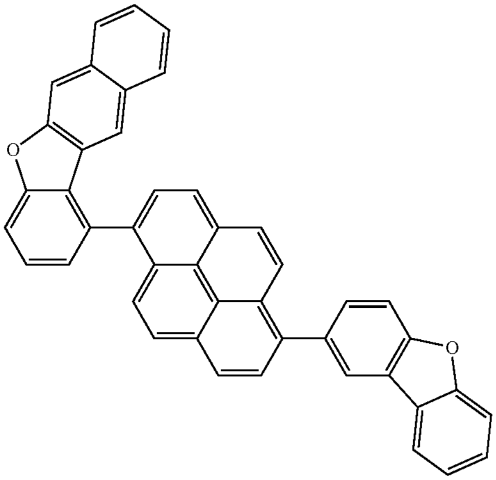
[Formula 294]
BH1-26
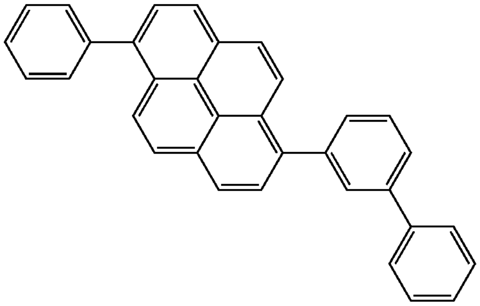
BH1-27
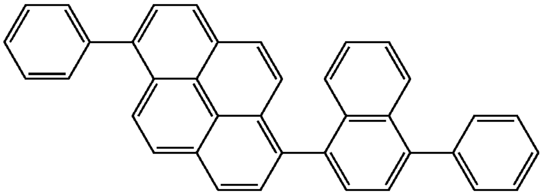
[Formula 295]
BH1-28
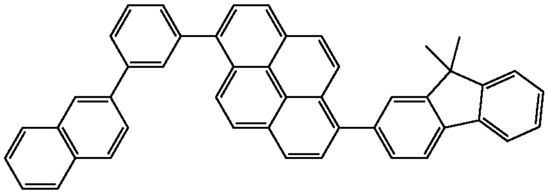
BH1-29
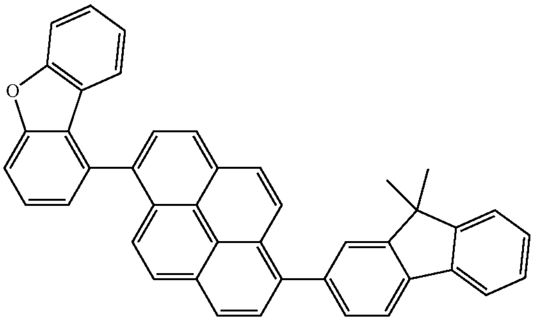
[Formula 296]
BH1-30
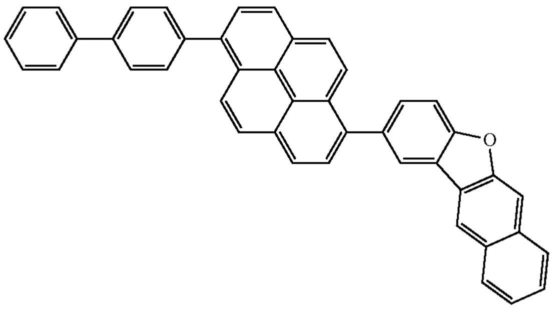
BH1-31
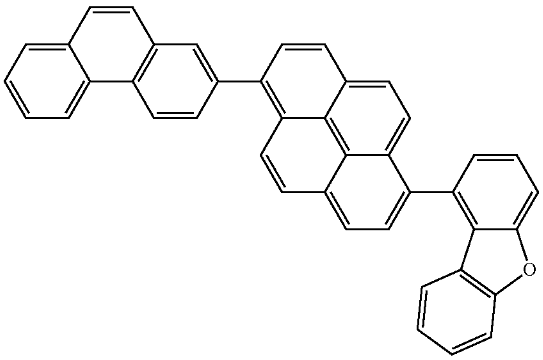

-continued
[Formula 297]
BH1-32
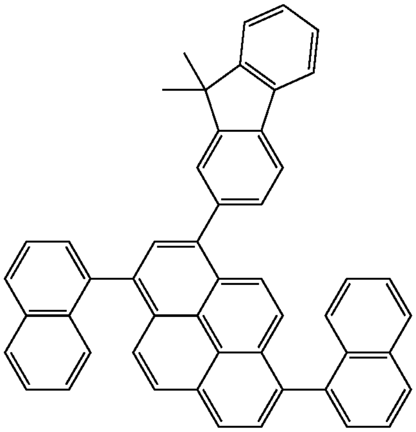
BH1-33
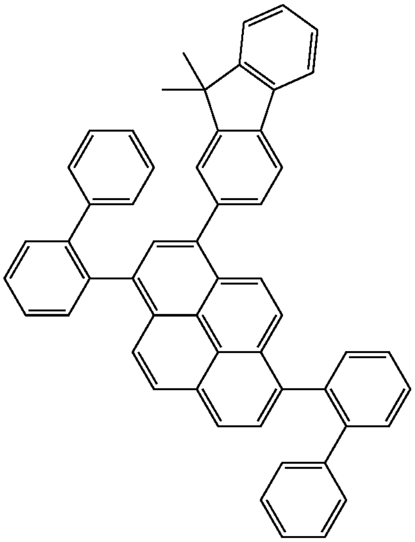
BH1-34
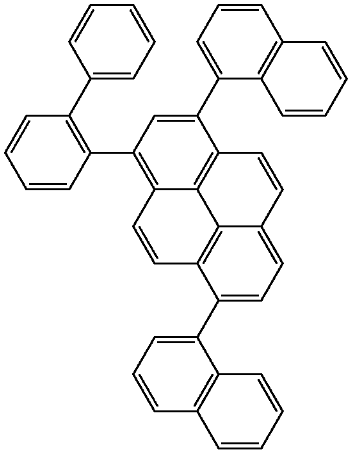
[Formula 298]
BH1-35
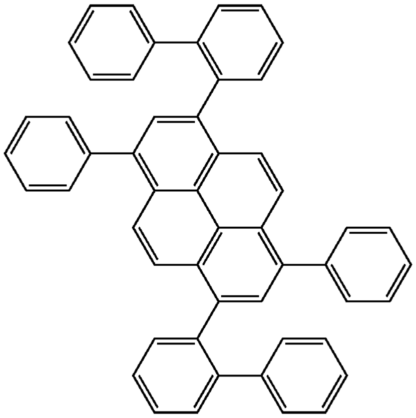
BH1-36
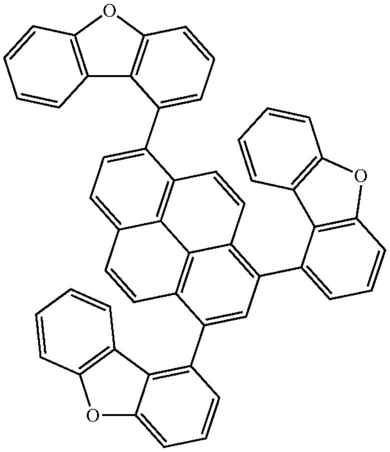

-continued
BH1-37
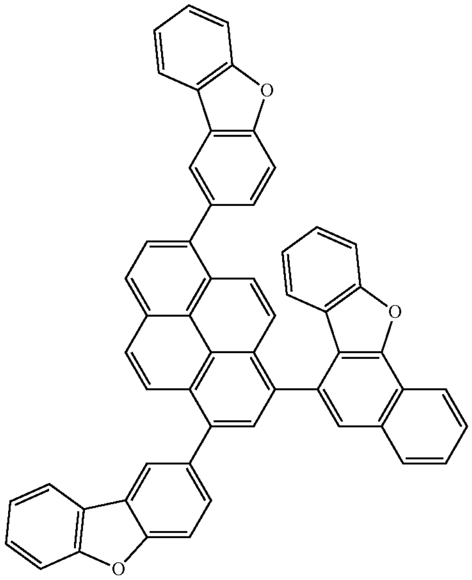
[Formula 299]
BH1-38
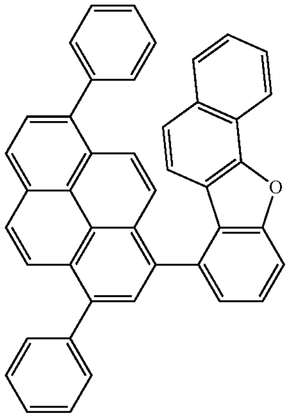
BH1-39
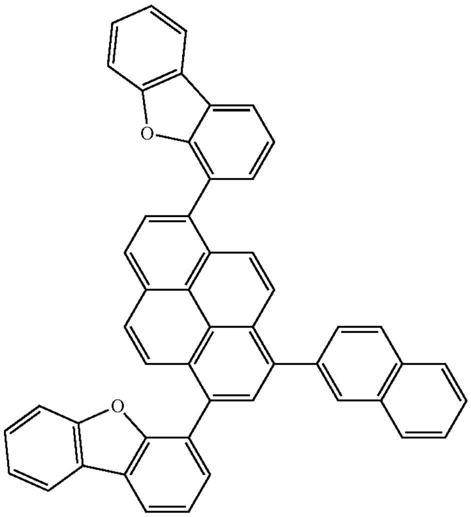
BH1-40
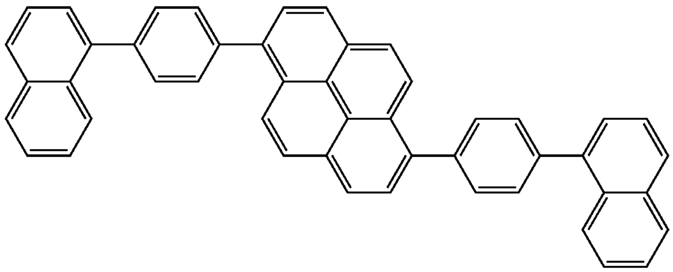

-continued
[Formula 300]
BH1-41
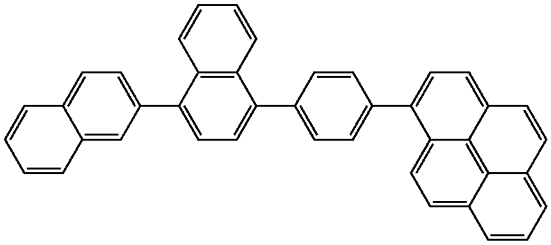
BH1-42
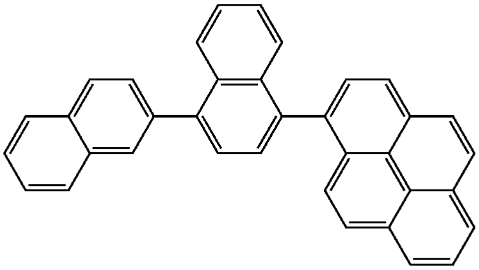
[Formula 301]
BH1-43
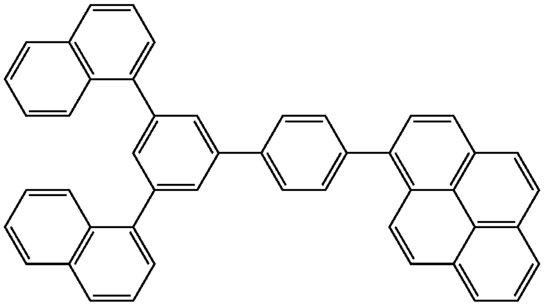
BH1-44
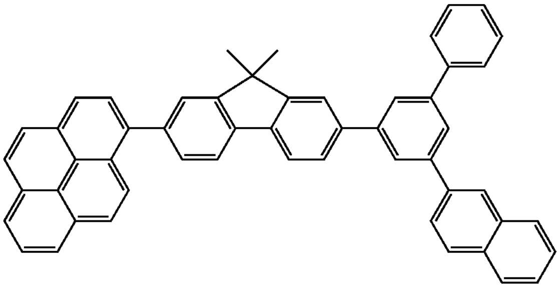
[Formula 302]
BH1-45
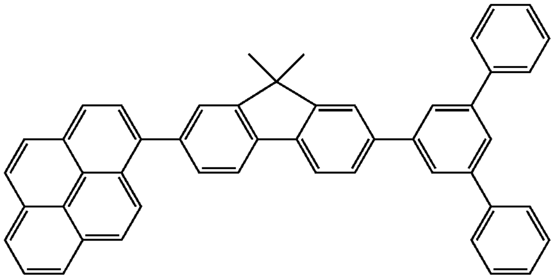
BH1-46
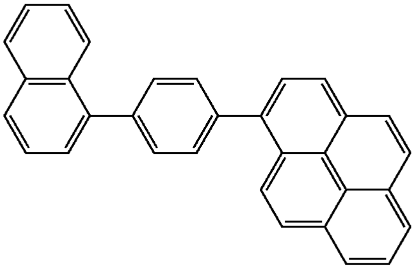
[Formula 303]
BH1-47
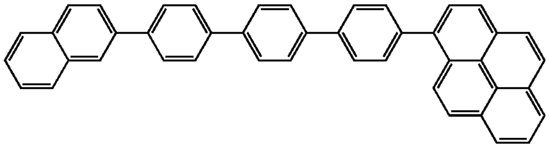
BH1-48
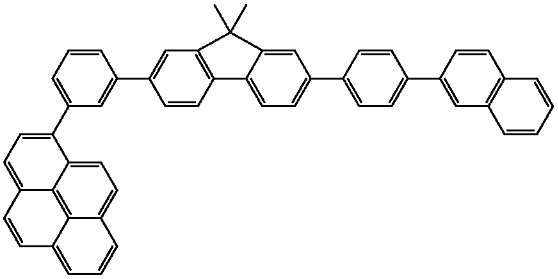

-continued
[Formula 304]
BH1-49
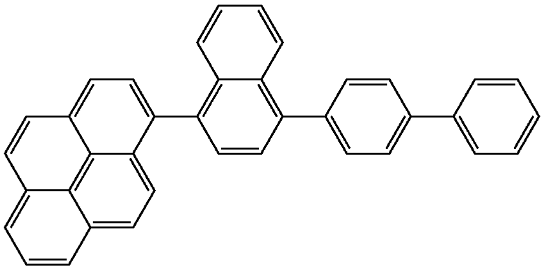
BH1-50
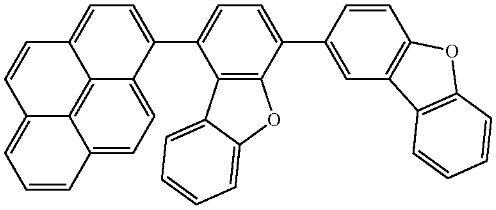
[Formula 305]
BH1-51
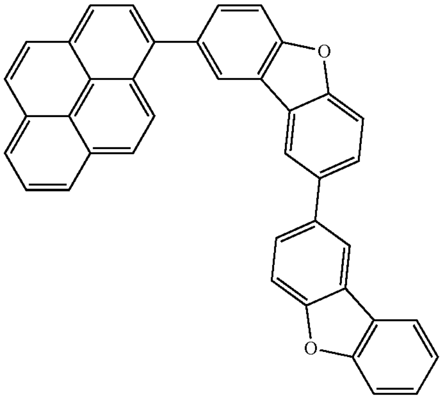
BH1-52
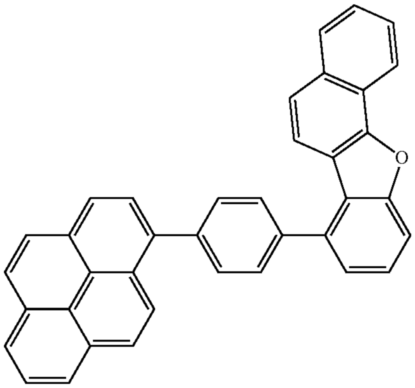
[Formula 306]
BH1-53
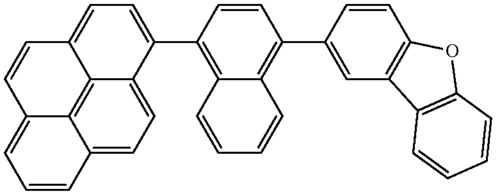
BH1-54
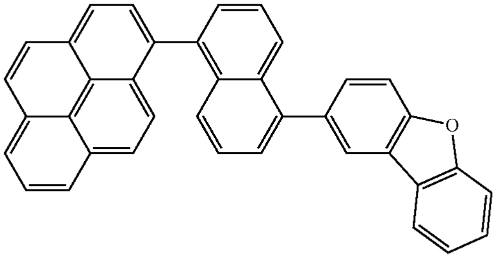
[Formula 307]
BH1-55
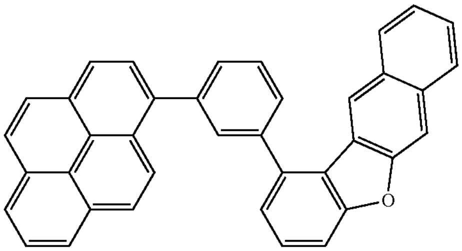
BH1-56
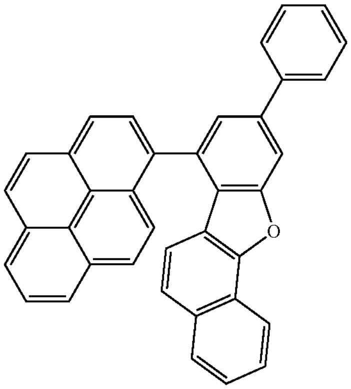

-continued
BH1-57
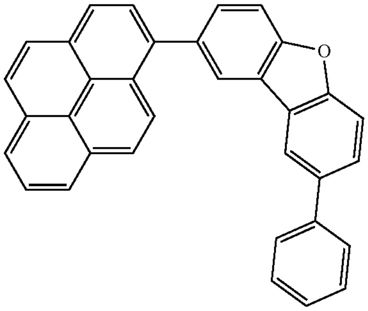
[Formula 308]
R-BH1
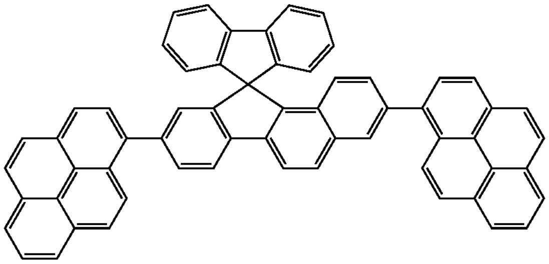
R-BH2
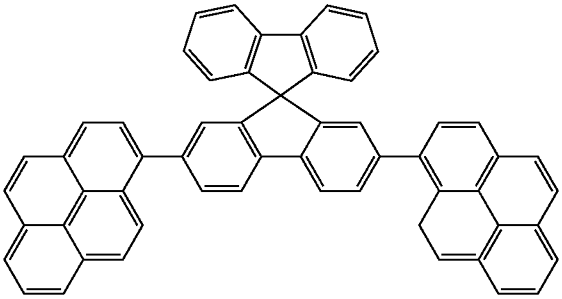
[Formula 309]
R-BH3
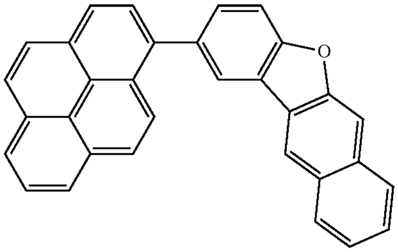
[Formula 310]
BH1-61
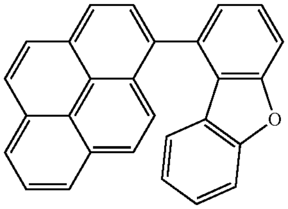
BH1-62
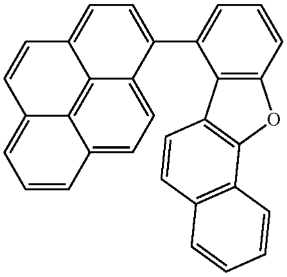
BH1-63
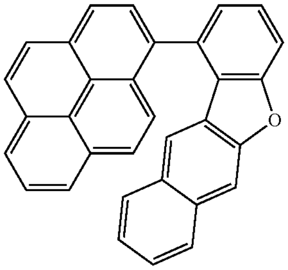

-continued
[Formula 311]
BH1-64
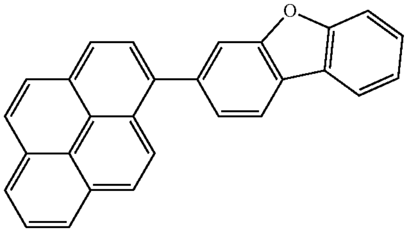
BH1-65
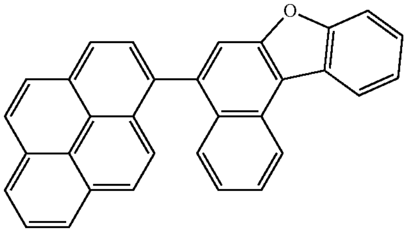
BH1-66
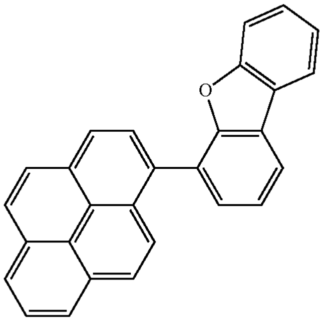
[Formula 312]
BH1-67
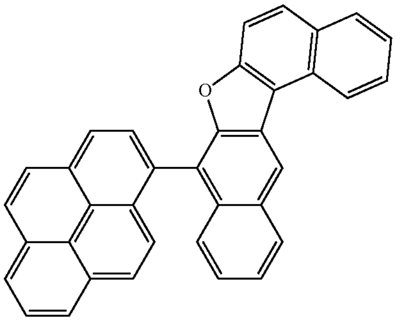
BH1-68
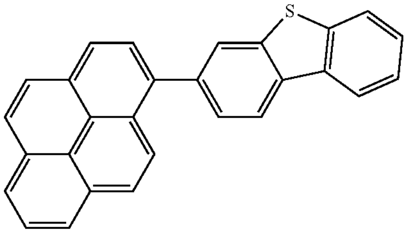
BH1-69
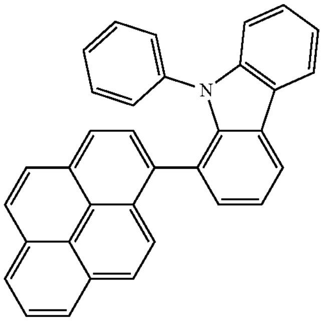
[Formula 313]
BH1-70
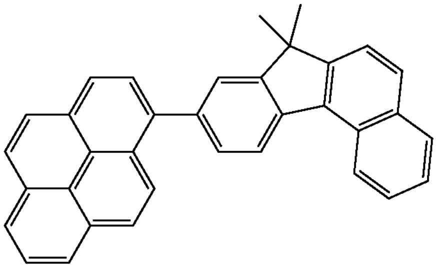
BH1-71
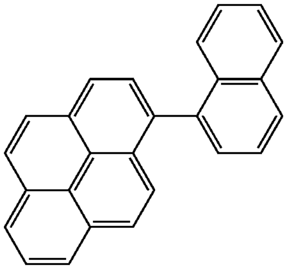

-continued
BH1-72
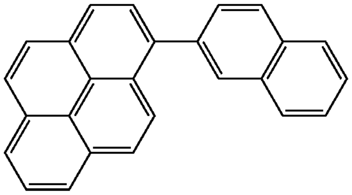
[Formula 314]
BH1-73
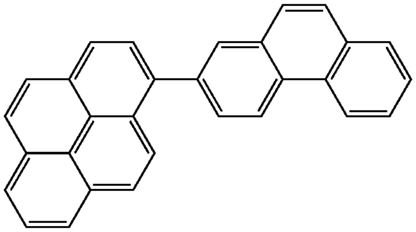
BH1-74
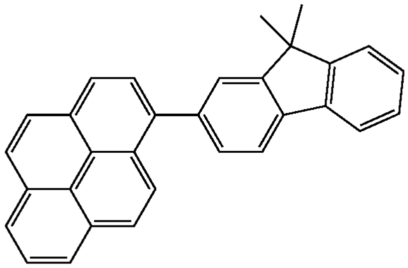
BH1-75
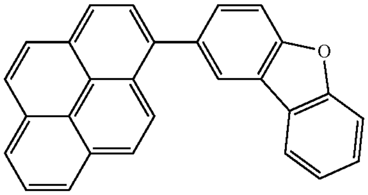
[Formula 315]
BH1-81
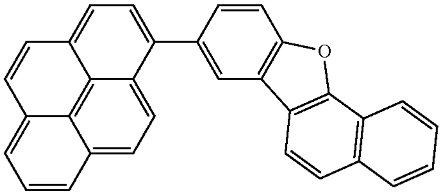
BH1-82
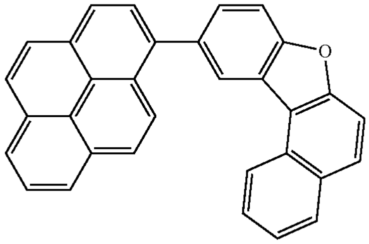
BH1-83
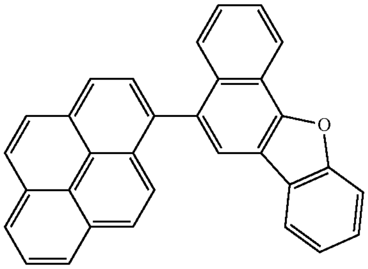
[Formula 316]
1BH-1
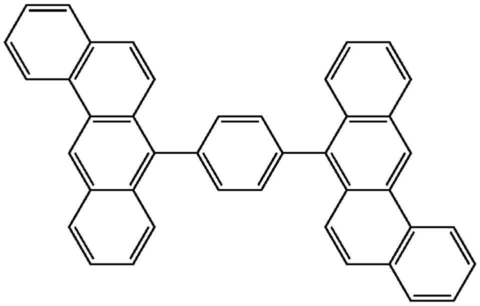

-continued
[Formula 317]
BH2
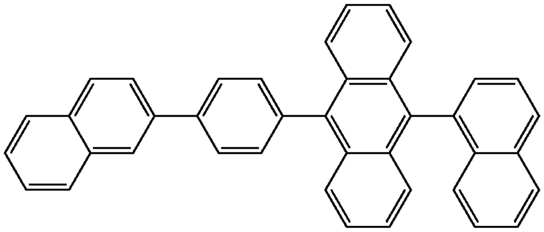
BH4
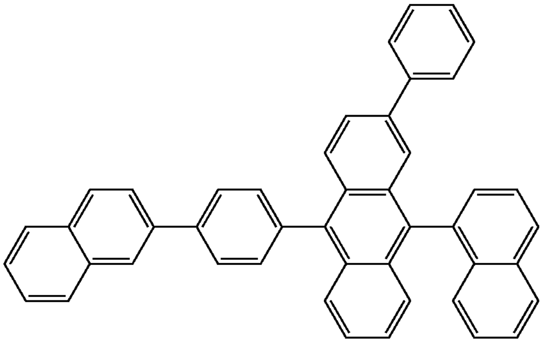
[Formula 318]
BH2-2
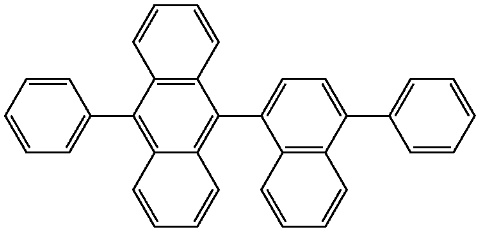
BH2-3
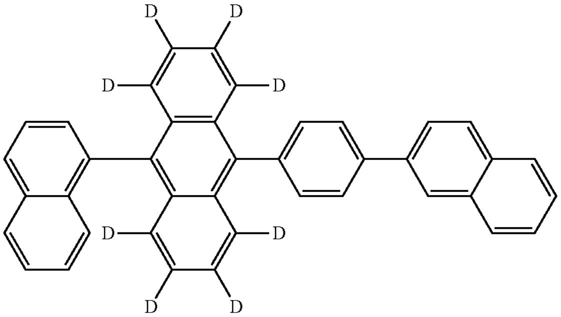
[Formula 319]
BH2-4
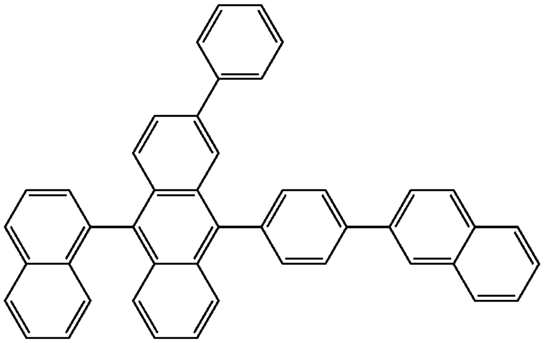
BH2-5
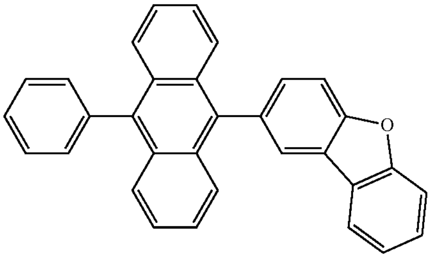
BH2-6
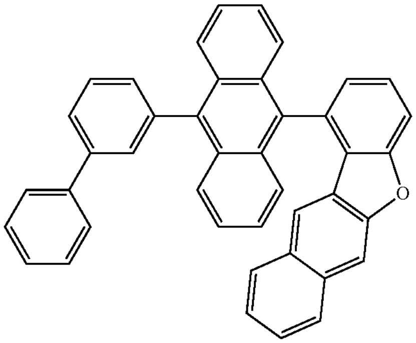

-continued
[Formula 320]
BH2-7
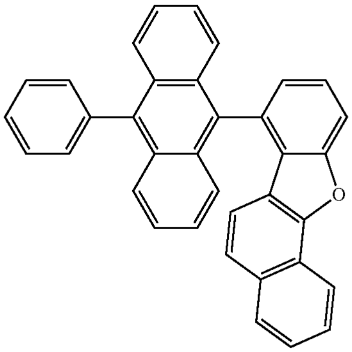
BH2-8
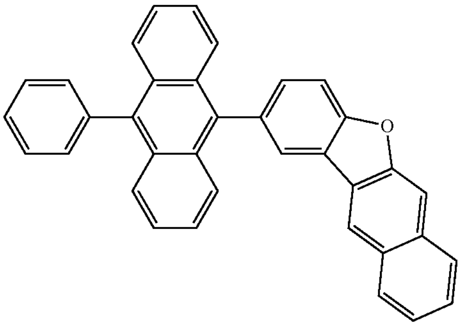
[Formula 321]
BH2-9
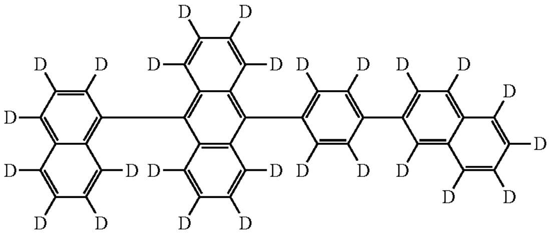
BH2-10
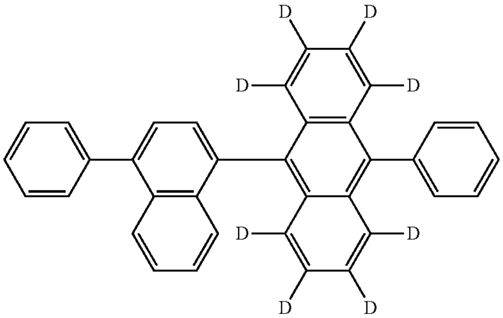
[Formula 322]
BH2-11
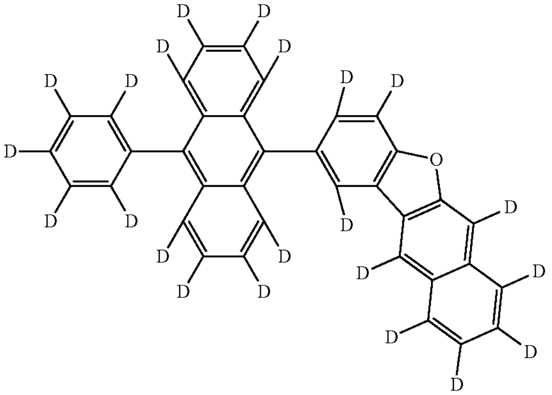
BH2-12
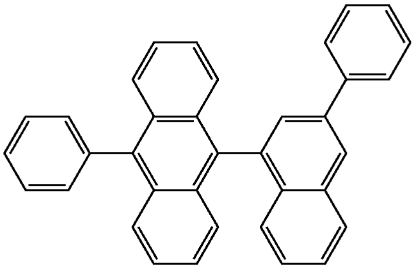
[Formula 323]
BH2-13
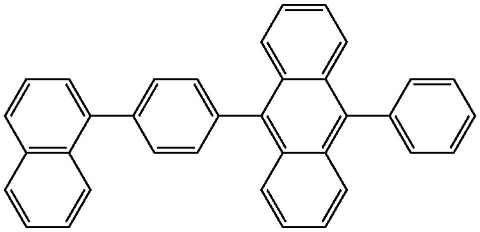
BH2-14
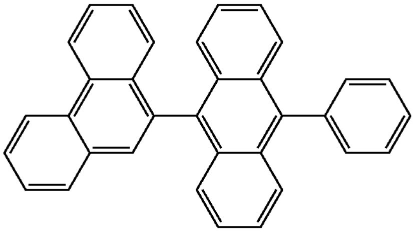

-continued
[Formula 324]
BH2-15
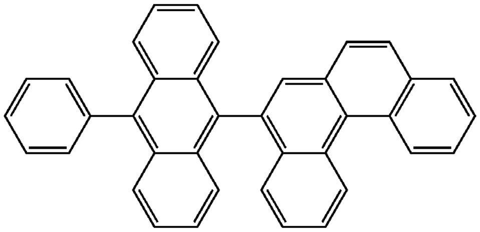
BH2-16
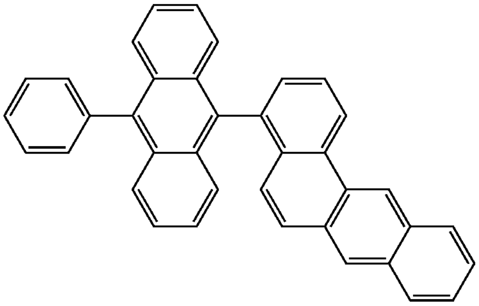
[Formula 325]
BH2-17
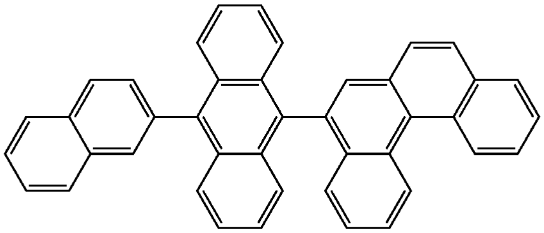
BH2-18
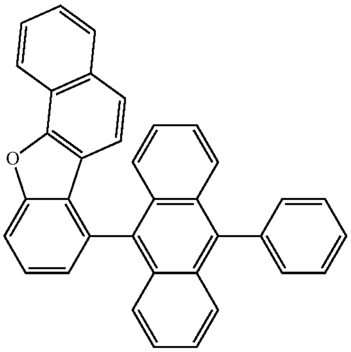
[Formula 326]
BH2-19
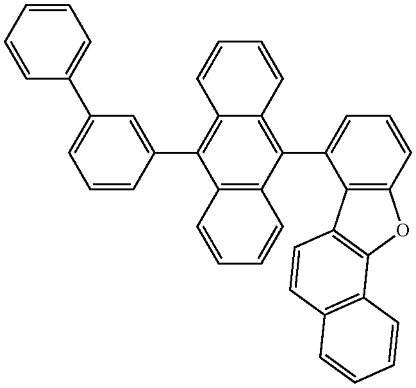
BH2-20
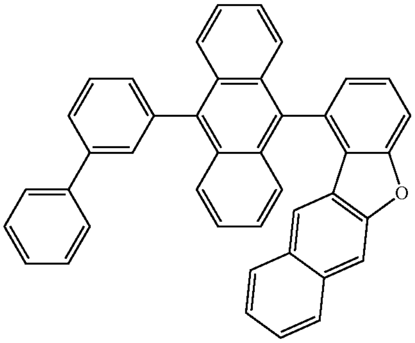
[Formula 327]
BH2-21
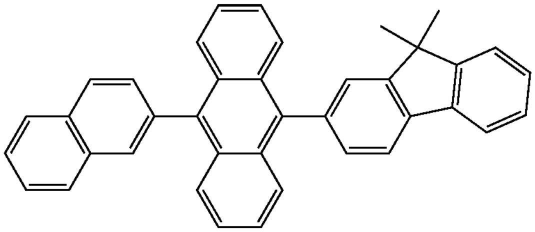
BH2-22
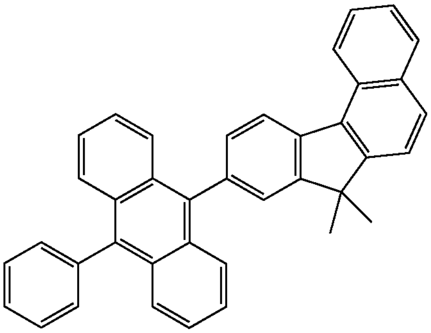

-continued
[Formula 328]
BH2-23
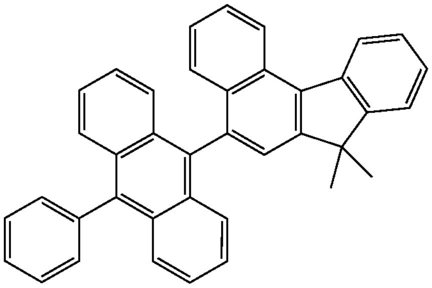
BH2-24
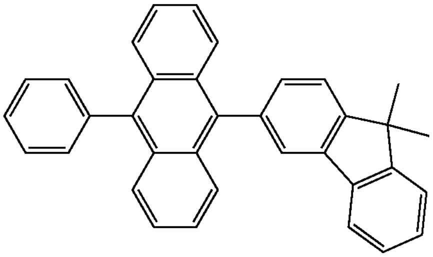
[Formula 329]
BH2-25
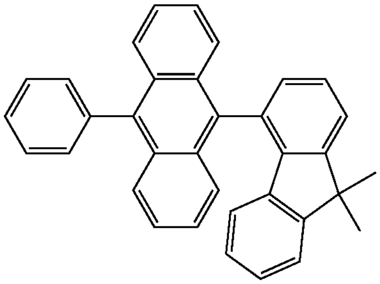
BH2-26
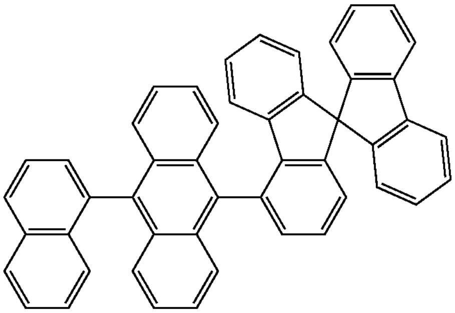
BH2-27
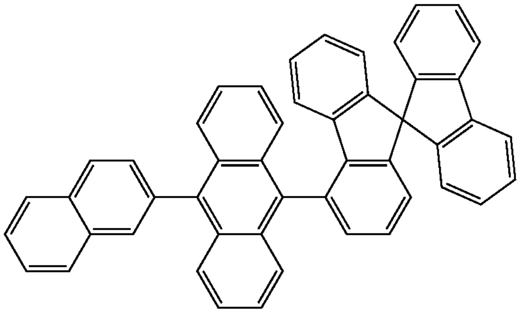
[Formula 330]
BH2-28
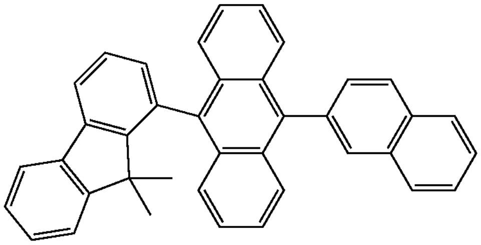
BH2-29
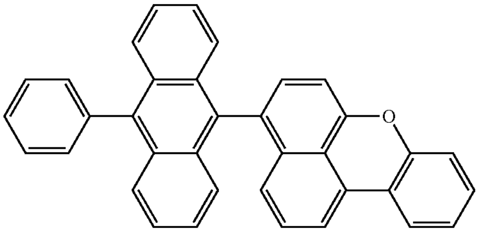

-continued
[Formula 331]
BH3-1
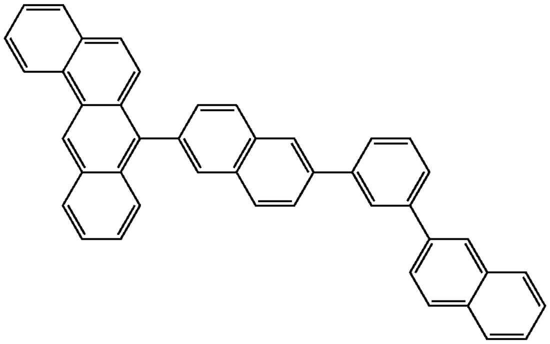
BH3-2
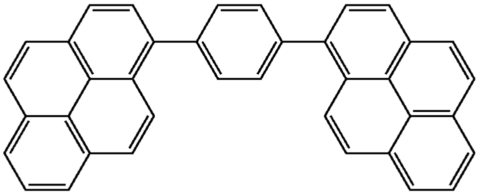
[Formula 332]
BH3-3
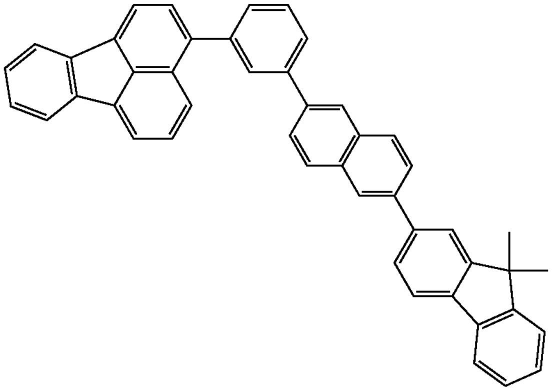
BH3-4
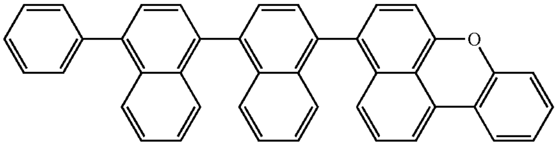
[Formula 333]
BH3-5
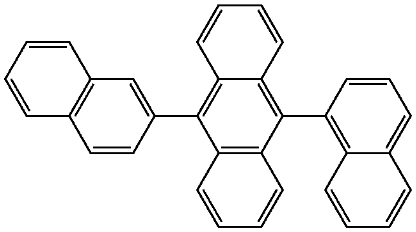
BH3-6
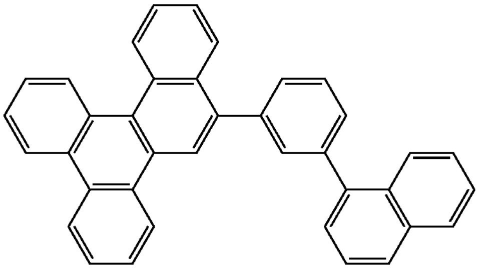
[Formula 334]
BH3-7
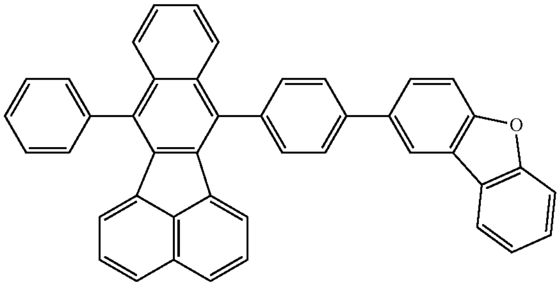

-continued
[Formula 335]
BH4-1
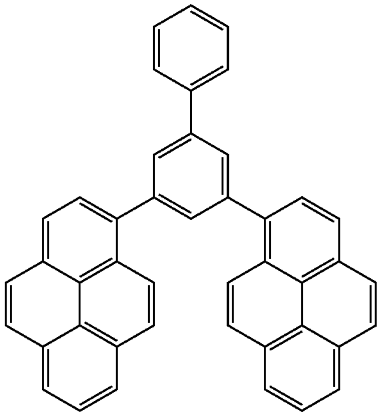
[Formula 336]
BH5
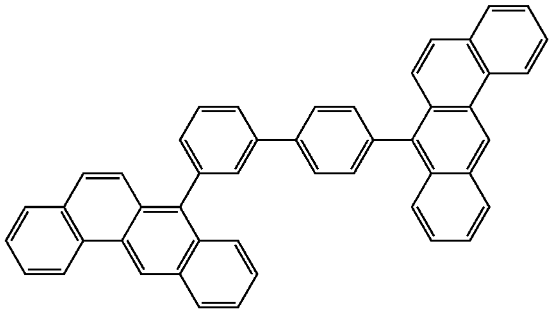
BH7
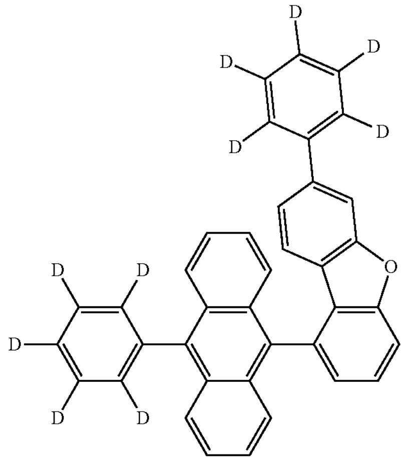
Structures of other compounds used for manufacturing organic EL devices in Examples 1, A2 to A4, and 2 to 170, Reference Examples 1 to 8, and Comparatives 1, 2, A3 to A5, and 3 to 135 are shown below.
[Formula 337]
HA1
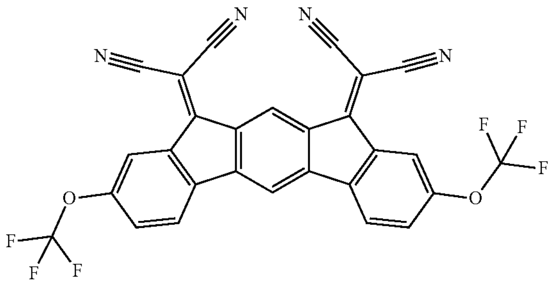
HT1
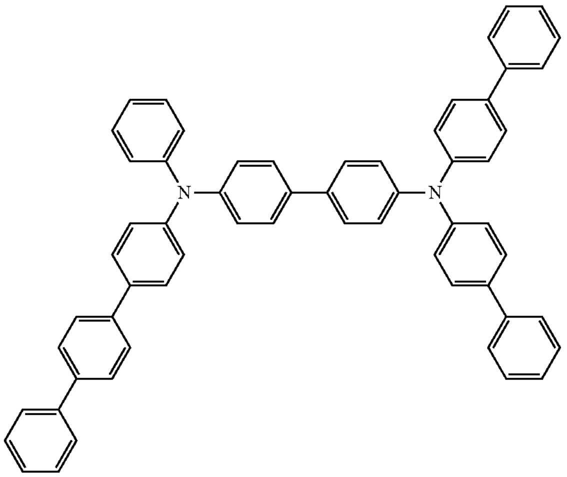

-continued
[Formula 338]
HT2
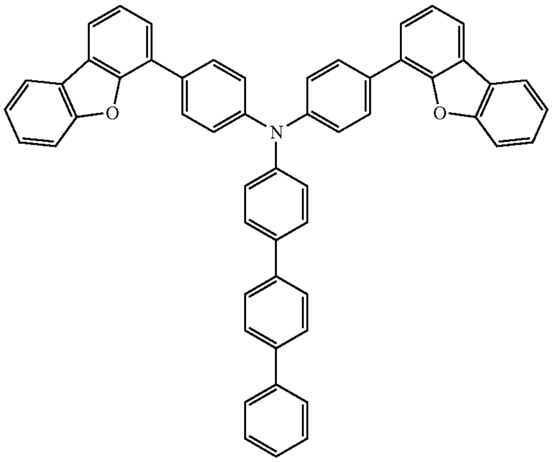
BD1
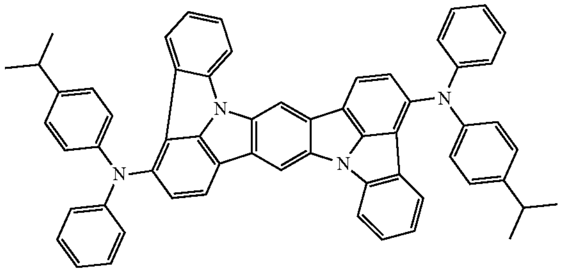
[Formula 339]
ET1
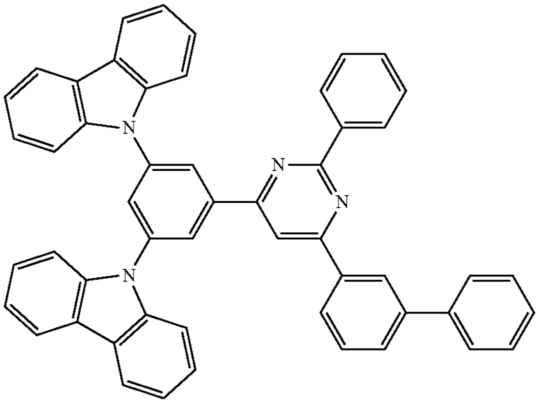
ET2
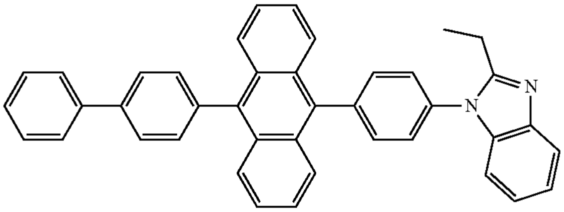
[Formula 340]
HA2-2
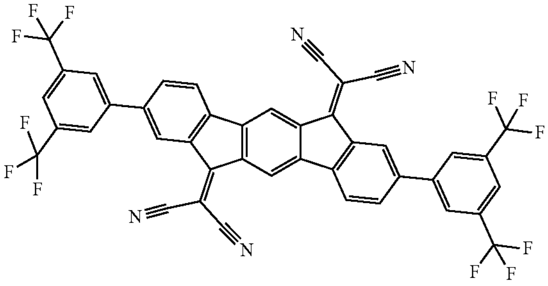
HT3-2
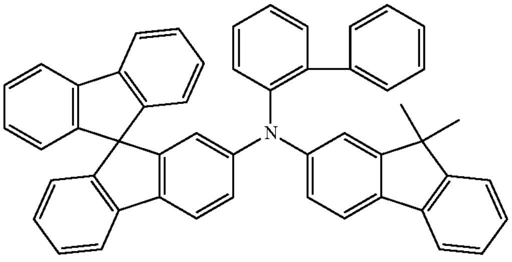

-continued
[Formula 341]
HT4-2
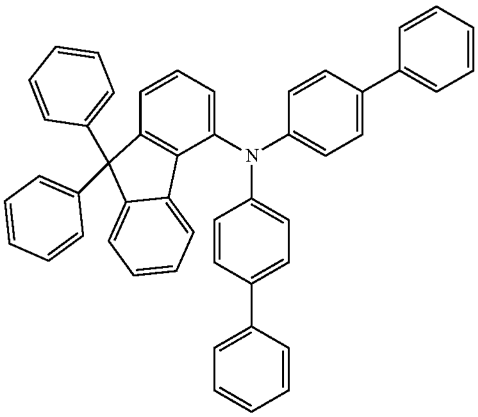
[Formula 342]
HT3
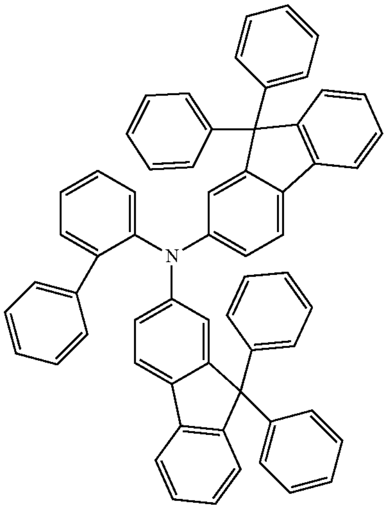
HT4
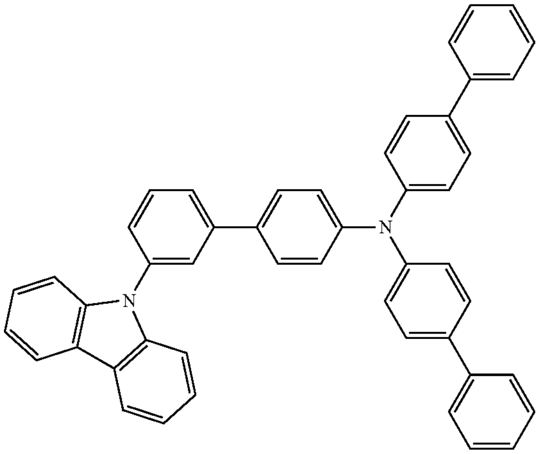
[Formula 343]
HT5
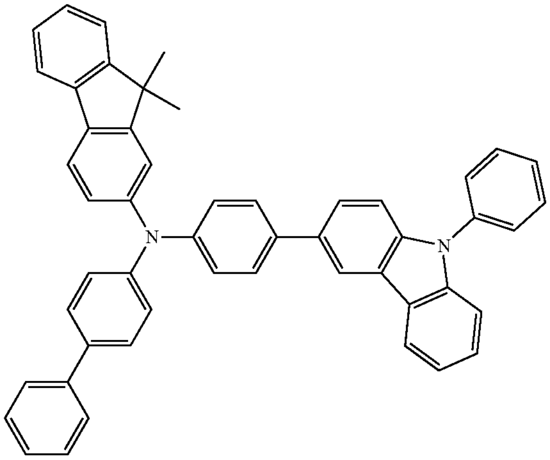
HA2
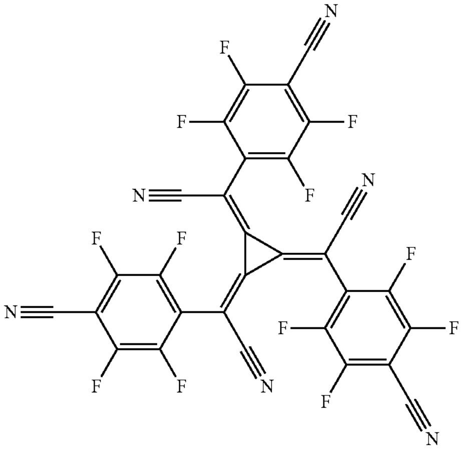

-continued
[Formula 344]
HT6
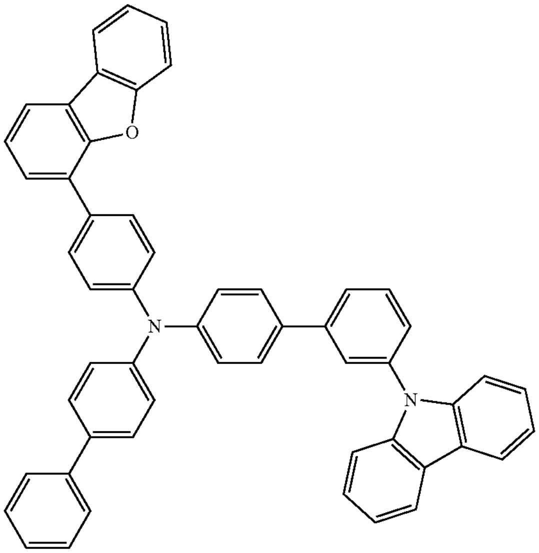
HT7
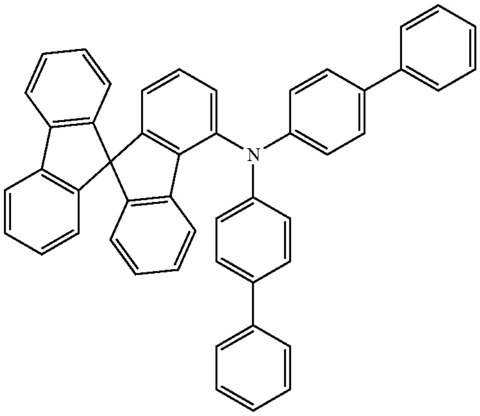
[Formula 345]
HT8
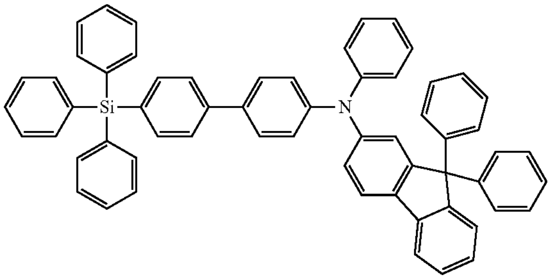
HT9
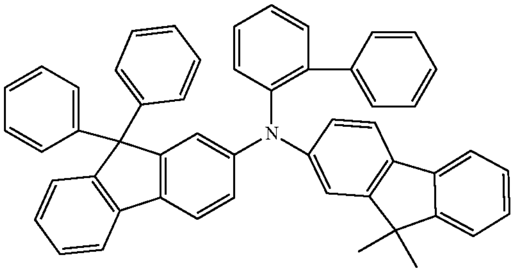
[Formula 346]
HT10
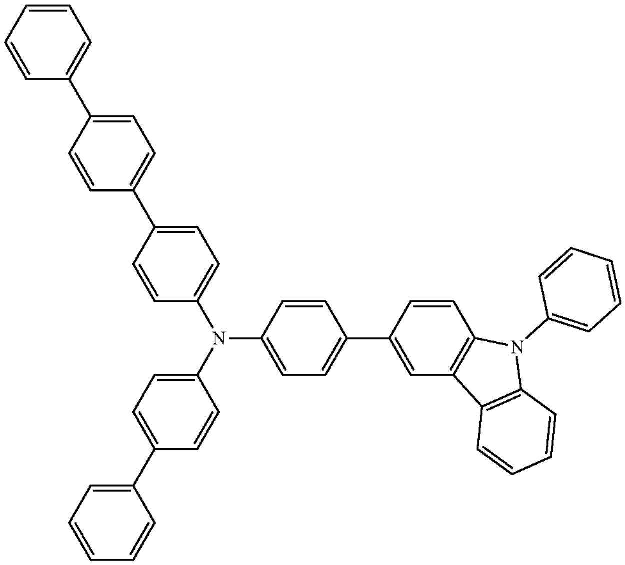

-continued
[Formula 347]
BD2
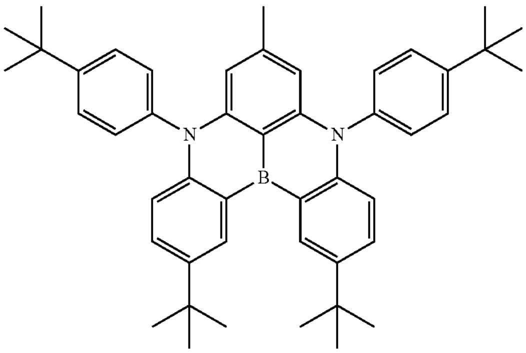
BD3
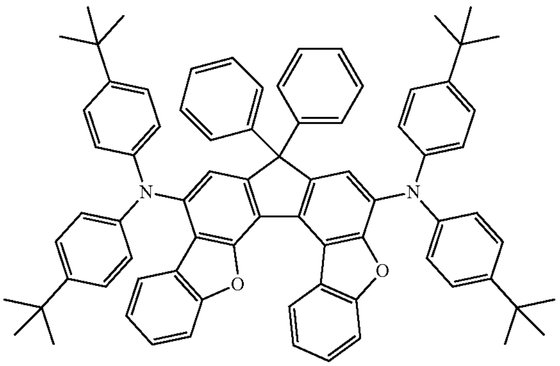
[Formula 348]
BD4
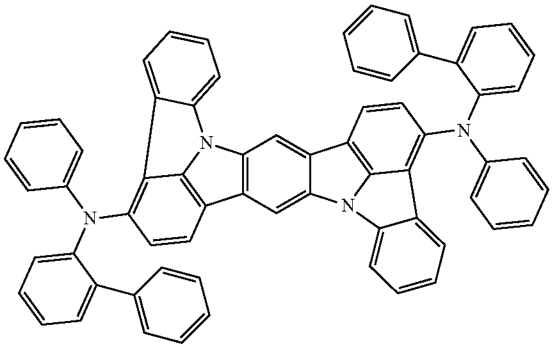
BD5
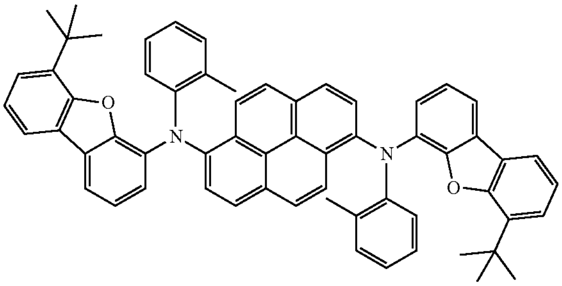
[Formula 349]
BD6
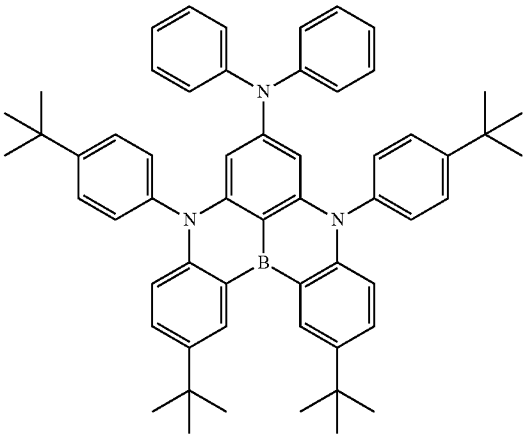
BD7
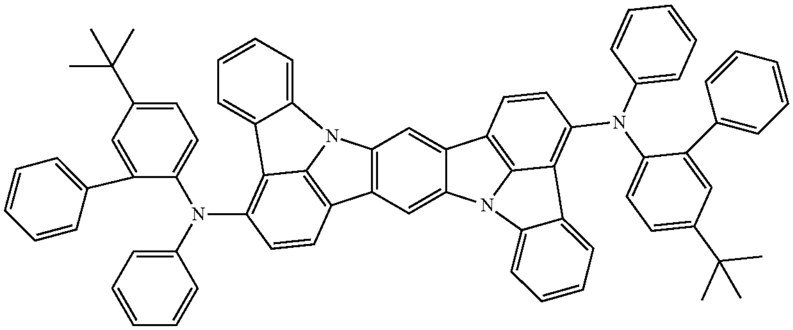

-continued
BD8
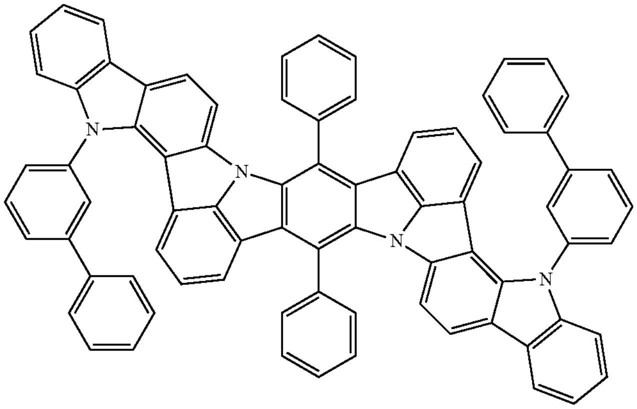
[Formula 350]
ET3
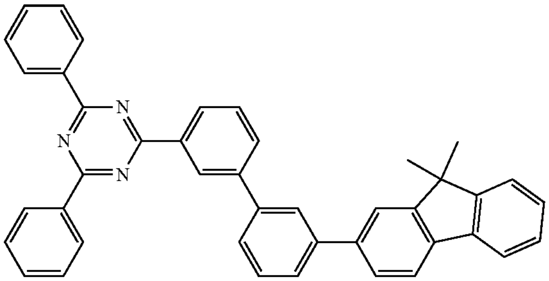
ET4
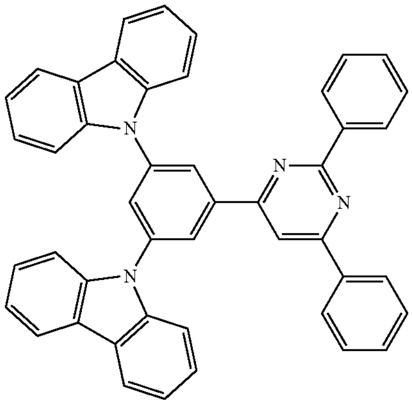
[Formula 351]
ET5
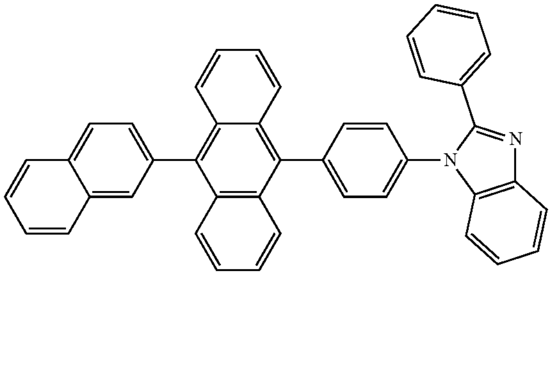
ET6
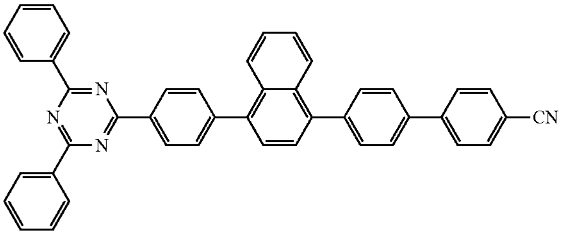

-continued

[Formula 352]

ET7

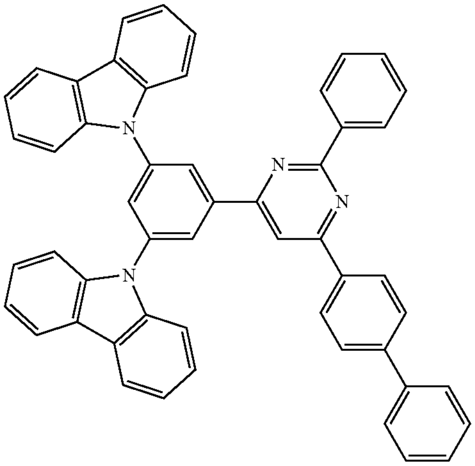

nCGL

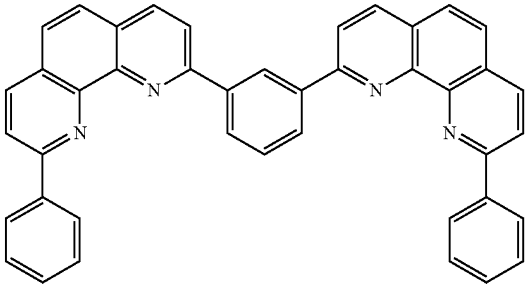

[Formula 353]

ET8

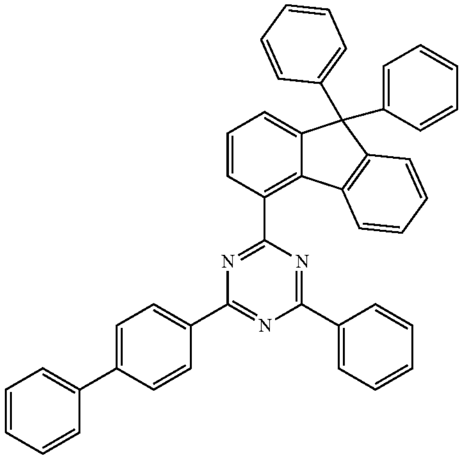

Liq

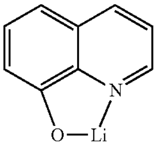

[Formula 354]

ET9

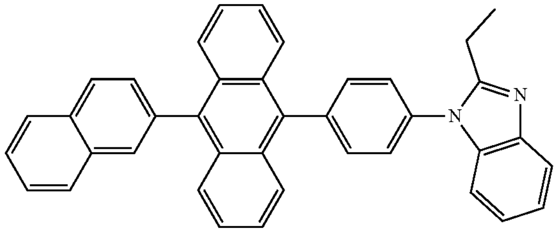

Manufacture 1 of Organic EL Device

Organic EL devices were manufactured and evaluated as follows.

Example 1

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT2 was vapor-deposited to form a 10-nm-thick second hole transporting layer (also referred to as an electron blocking layer (EBL)).

A compound BH1 (first host material (BH)) and a compound BD1 (first dopant material (BD)) were co-deposited on the second hole transporting layer so that a ratio of the compound BD1 accounted for 2 mass %, thereby forming a 5-nm-thick first emitting layer.

A compound BH2 (second host material (BH)) and the compound BD1 (second dopant material (BD)) were co-deposited on the first emitting layer so that a ratio of the compound BD1 accounted for 2 mass %, thereby forming a 20-nm-thick second emitting layer.

A compound ET1 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device in Example 1 is roughly shown as follows.

ITO (130)/HA1 (5)/HT1 (80)/HT2 (10)/BH1:BD1 (5, 98%:2%)/BH2:BD1 (20, 98%:2%)/ET1 (10)/ET2 (15)/LiF (1)/Al (80)

Numerals in parentheses represent a film thickness (unit: nm).

The numerals (98%:2%) represented by percentage in the same parentheses indicate a ratio (mass %) between the first host material or the second host material (compound BH1 or compound BH2) and the compound BD1 in the first emitting layer or the second emitting layer. Similar notations apply to the description below.

Comparative 1

The organic EL device of Comparative 1 was manufactured in the same manner as that of Example 1 except that only the first emitting layer was formed as the emitting layer as shown in Table 1.

Comparative 2

The organic EL device according to Comparative 2 was manufactured in the same manner as that of Example 1 except that only the second emitting layer was formed as the emitting layer as shown in Table 1.

Example A2

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA2-2 was vapor-deposited on a surface provided with the transparent electrode line to cover the transparent electrode, thereby forming a 5-nm-thick hole injecting layer (HI).

After the formation of the hole injecting layer, a compound HT3-2 was vapor-deposited to form an 80-nm-thick first hole transporting layer (HT).

After the formation of the first hole transporting layer, a compound HT4-2 was vapor-deposited to form a 10-nm-thick second hole transporting layer (also referred to as an electron blocking layer (EBL)).

The compound BH2 (first host material (BH)) and the compound BD1 (first dopant material (BD)) were co-deposited on the second hole transporting layer so that a ratio of the compound BD1 accounted for 2 mass %, thereby forming a 10-nm-thick first emitting layer.

The compound BH4 (second host material (BH)) and the compound BD1 (second dopant material (BD)) were co-deposited on the first emitting layer so that a ratio of the compound BD1 accounted for 2 mass %, thereby forming a 15-nm-thick second emitting layer.

A compound ET7 was vapor-deposited on the second emitting layer to form a 10-nm-thick electron transporting layer.

A compound nCGL and metal Li were co-deposited on the electron transporting layer so that a ratio of metal Li accounted for 4 mass %, thereby forming a 30-nm-thick electron injecting layer.

Metal (Al) was vapor-deposited on the electron injecting layer to form a 50-nm-thick cathode.

A device arrangement of the organic EL device of Example A2 is roughly shown as follows.

ITO (130)/HA2-2 (5)/HT3-2 (80)/HT4-2 (10)/BH2:BD1 (10, 98%:2%)/BH4:BD1 (15, 98%:2%)/ET7 (10)/nCGL:Li (30, 96%:4%)/Al (50)

Numerals in parentheses represent a film thickness (unit: nm).

The numerals (98%:2%) represented by percentage in the same parentheses indicate a ratio (mass %) between the first host material or the second host material (compound BH2 or compound BH4) and the compound BD1 in the first emitting layer or the second emitting layer. The numerals (96%:4%) represented by percentage in the same parentheses indicate a ratio (mass %) between the compound nCGL and metal Li in the electron injecting layer. Similar notations apply to the description below.

Example A3

The organic EL device of Example A3 was manufactured in the same manner as that of Example A2 except that the compounds and the film thicknesses in the first and second emitting layers of Example A2 were changed to those shown in Table 2.

Example A4

The organic EL device of Example A4 was manufactured in the same manner as that of Example A3 except that the film thicknesses in the first and second emitting layers of Example A3 were changed to those shown in Table 2.

Comparative A3

The organic EL device of Comparative A3 was manufactured in the same manner as that of Example A2 except that only the first emitting layer was formed as the emitting layer as shown in Table 2.

Comparative A4

The organic EL device of Comparative A4 was manufactured in the same manner as that of Example A2 except that only the second emitting layer was formed as the emitting layer as shown in Table 2.

Comparative A5

The organic EL device of Comparative A5 was manufactured in the same manner as that of Example A3 except that only the first emitting layer was formed as the emitting layer as shown in Table 2.

Evaluation of Organic EL Devices

The organic EL devices in Examples 1, A2 to A4, and 2 to 170, Reference Examples 1 to 8, and Comparatives 1, 2, A3 to A5, and 3 to 135 were evaluated as follows. Evaluation results are shown in Tables 1 to 64.

Drive Voltage

The voltage (unit: V) when electric current was applied between the anode and the cathode so that the current density was 10 mA/cm$^2$ was measured.

External Quantum Efficiency EQE

Voltage was applied on the organic EL devices so that a current density was 10 mA/cm$^2$, where spectral radiance spectrum was measured by a spectroradiometer (CS-2000 manufactured by Konica Minolta, Inc.). The external quantum efficiency EQE (unit: %) was calculated based on the obtained spectral-radiance spectra, assuming that the spectra was provided under a Lambertian radiation.

Lifetime LT90

Voltage was applied on the resultant organic EL devices so that a current density was 50 mA/cm$^2$, where a time (LT90 (unit: hr)) elapsed before a luminance intensity was reduced to 90% of the initial luminance intensity was measured.

Lifetime LT95

Voltage was applied on the obtained organic EL devices so that a current density was 50 mA/cm$^2$, where a time (LT95 (unit: hr)) elapsed before a luminance intensity was reduced to 95% of the initial luminance intensity was measured.

Maximum Peak Wavelength λp of Light Emitted from Device When Being Driven

Voltage was applied on the organic EL devices so that a current density of the organic EL device was 10 mA/cm$^2$, where spectral radiance spectrum was measured by a spectroradiometer CS-2000 (manufactured by Konica Minolta, Inc.). The maximum peak wavelength λp (unit: nm) was calculated from the measured spectral radiance spectrum.

Maximum Peak Wavelength λp of Light Emitted from Emitting Layer When Device Being Driven For the maximum peak wavelength $\lambda p_1$ of light emitted from the first emitting layer when the organic EL device was driven, the organic EL device was manufactured by using the same material as the first emitting layer for the second emitting layer, and voltage was applied on the organic EL device so that a current density became 10 mA/cm$^2$, where spectral radiance spectrum was measured by a spectroradiometer CS-2000 (manufactured by Konica Minolta, Inc.). The maximum peak wavelength $\lambda p_1$ (unit: nm) was calculated from the measured spectral radiance spectrum.

For the maximum peak wavelength $\lambda p_2$ of light emitted from the second emitting layer when the organic EL device was driven, the organic EL device was manufactured by using the same material as the second emitting layer for the first emitting layer, and voltage is applied on the organic EL device so that a current density became 10 mA/cm$^2$, where spectral radiance spectrum was measured by a spectroradiometer CS-2000 (manufactured by Konica Minolta, Inc.). The maximum peak wavelength $\lambda p_2$ (unit: nm) was calculated from the measured spectral radiance spectrum.

CIE1931 Chromaticity

Voltage was applied on the organic EL devices so that a current density was 10 mA/cm$^2$, where spectral radiance spectrum was measured by a spectroradiometer (CS-2000 manufactured by Konica Minolta, Inc.).

CIEx and CIEy were calculated from the measured spectral radiance spectrum.

TABLE 1

| | First Emitting Layer | | | | | Second Emitting Layer | | | | | | | |
|---|---|---|---|---|---|---|---|---|---|---|---|---|---|
| | First Host Material | | | First Dopant Material | Film | Second Host Material | | | Second Dopant Material | Film | | | |
| | Compound Name | $S_1$[ev] | $T_1$[ev] | Compound Name | Thickness | Compound Name | $S_1$[ev] | $T_1$[ev] | Compound Name | Thickness | EQE [%] | LT90 [hr] | λp [nm] |
| Ex. 1 | BH1 | 3.12 | 2.10 | BD1 | 5 | BH2 | 3.01 | 1.87 | BD1 | 20 | 10.6 | 600 | 461 |
| Comp. 1 | BH1 | 3.12 | 2.10 | BD1 | 25 | — | — | — | — | — | 7.6 | 360 | 462 |
| Comp. 2 | — | — | — | — | — | BH2 | 3.01 | 1.87 | BD1 | 25 | 9.9 | 363 | 460 |

TABLE 2

| | First Emitting Layer | | | | | Second Emitting Layer | | | | | | | |
|---|---|---|---|---|---|---|---|---|---|---|---|---|---|
| | First Host Material | | | First Dopant Material | Film Thickness | Second Host Material | | | Second Dopant Material | Film Thickness | Drive Voltage | | |
| | Compound Name | $S_1$ [ev] | $T_1$ [ev] | Compound Name | [nm] | Compound Name | $S_1$ [ev] | $T_1$ [ev] | Compound Name | [nm] | @10 mA [V] | λp [nm] | EQE [%] |
| Ex. A2 | BH2 | 3.01 | 1.87 | BD1 | 10 | BH4 | 2.93 | 1.82 | BD1 | 15 | 3.72 | 460 | 10.7 |
| Ex. A3 | BH2-3 | 3.01 | 1.87 | BD1 | 5 | BH4 | 2.93 | 1.82 | BD1 | 20 | 3.77 | 460 | 10.8 |
| Ex. A4 | BH2-3 | 3.01 | 1.87 | BD1 | 10 | BH4 | 2.93 | 1.82 | BD1 | 15 | 3.75 | 460 | 10.7 |
| Comp. A3 | BH2 | 3.01 | 1.87 | BD1 | 25 | — | — | — | — | — | 4.03 | 460 | 9.6 |
| Comp. A4 | — | — | — | — | — | BH4 | 2.93 | 1.82 | BD1 | 25 | 3.72 | 460 | 9.9 |
| Comp. A5 | BH2-3 | 3.01 | 1.87 | BD1 | 25 | — | — | — | — | — | 4.11 | 460 | 9.5 |

Since the organic EL devices in Examples 1 and A2 to A4 include the first emitting layer and the second emitting layer including the respective host materials satisfying the relationship of the numerical formula (Numerical Formula 1), the organic EL devices in Examples 1 and A2 to A4 improved EQE more than the organic EL devices in Comparatives 1, 2, and A3 to A5.

Examples 2 to 20

The organic EL devices of Examples 2 to 20 were manufactured in the same manner as that of Example 1 except that the compound BH1 (first host material) in the first emitting layer was replaced with the first compounds shown in Table 3.

Comparatives 3 to 21

The organic EL devices of Comparatives 3 to 21 were manufactured in the same manner as that of Comparative 1 except that the compound BH1 (first host material) in the first emitting layer was replaced with the first compounds shown in Table 4.

TABLE 3

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT95 [hr] |
| Ex. 1 | BH1 | BD1 | 5 | BH2 | BD1 | 20 | 3.47 | 10.6 | 255 |
| Ex. 2 | BH1-2 | BD1 | 5 | BH2 | BD1 | 20 | 3.47 | 10.2 | 205 |
| Ex. 3 | BH1-3 | BD1 | 5 | BH2 | BD1 | 20 | 3.56 | 10.5 | 268 |
| Ex. 4 | BH1-4 | BD1 | 5 | BH2 | BD1 | 20 | 3.56 | 10.7 | 222 |
| Ex. 5 | BH1-5 | BD1 | 5 | BH2 | BD1 | 20 | 3.64 | 10.7 | 251 |
| Ex. 6 | BH1-6 | BD1 | 5 | BH2 | BD1 | 20 | 3.65 | 10.6 | 224 |
| Ex. 7 | BH1-7 | BD1 | 5 | BH2 | BD1 | 20 | 3.63 | 10.4 | 239 |
| Ex. 8 | BH1-8 | BD1 | 5 | BH2 | BD1 | 20 | 3.62 | 10.4 | 224 |
| Ex. 9 | BH1-9 | BD1 | 5 | BH2 | BD1 | 20 | 3.70 | 10.8 | 249 |
| Ex. 10 | BH1-10 | BD1 | 5 | BH2 | BD1 | 20 | 3.34 | 10.4 | 216 |
| Ex. 11 | BH1-11 | BD1 | 5 | BH2 | BD1 | 20 | 3.48 | 10.8 | 275 |
| Ex. 12 | BH1-12 | BD1 | 5 | BH2 | BD1 | 20 | 3.39 | 10.6 | 212 |
| Ex. 13 | BH1-13 | BD1 | 5 | BH2 | BD1 | 20 | 3.51 | 10.6 | 231 |
| Ex. 14 | BH1-14 | BD1 | 5 | BH2 | BD1 | 20 | 3.36 | 10.4 | 198 |
| Ex. 15 | BH1-15 | BD1 | 5 | BH2 | BD1 | 20 | 3.43 | 10.5 | 190 |
| Ex. 16 | BH1-16 | BD1 | 5 | BH2 | BD1 | 20 | 3.30 | 10.5 | 192 |
| Ex. 17 | BH1-17 | BD1 | 5 | BH2 | BD1 | 20 | 3.38 | 10.2 | 185 |
| Ex. 18 | BH1-18 | BD1 | 5 | BH2 | BD1 | 20 | 3.41 | 10.6 | 204 |
| Ex. 19 | BH1-19 | BD1 | 5 | BH2 | BD1 | 20 | 3.39 | 10.3 | 191 |
| Ex. 20 | R-BH1 | BD1 | 5 | BH2 | BD1 | 20 | 3.91 | 10.1 | — |

TABLE 4

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT95 [hr] |
| Comp. 1 | BH1 | BD1 | 25 | — | — | — | — | 7.6 | 65 |
| Comp. 2 | — | — | — | BH2 | BD1 | 25 | — | 9.9 | 167 |
| Comp. 3 | BH1-2 | BD1 | 25 | — | — | — | — | 7.2 | 59 |
| Comp. 4 | BH1-3 | BD1 | 25 | — | — | — | — | 7.4 | 71 |
| Comp. 5 | BH1-4 | BD1 | 25 | — | — | — | — | 7.8 | 70 |
| Comp. 6 | BH1-5 | BD1 | 25 | — | — | — | — | 7.5 | 62 |
| Comp. 7 | BH1-6 | BD1 | 25 | — | — | — | — | 7.4 | 60 |
| Comp. 8 | BH1-7 | BD1 | 25 | — | — | — | — | 7.3 | 53 |
| Comp. 9 | BH1-8 | BD1 | 25 | — | — | — | — | 7.4 | 55 |
| Comp. 10 | BH1-9 | BD1 | 25 | — | — | — | — | 7.5 | 67 |
| Comp. 11 | BH1-10 | BD1 | 25 | — | — | — | — | 7.1 | 51 |
| Comp. 12 | BH1-11 | BD1 | 25 | — | — | — | — | 7.8 | 81 |
| Comp. 13 | BH1-12 | BD1 | 25 | — | — | — | — | 7.0 | 48 |
| Comp. 14 | BH1-13 | BD1 | 25 | — | — | — | — | 7.1 | 53 |
| Comp. 15 | BH1-14 | BD1 | 25 | — | — | — | — | 6.9 | 56 |
| Comp. 16 | BH1-15 | BD1 | 25 | — | — | — | — | 7.1 | 59 |
| Comp. 17 | BH1-16 | BD1 | 25 | — | — | — | — | 7.0 | 62 |
| Comp. 18 | BH1-17 | BD1 | 25 | — | — | — | — | 6.7 | 53 |
| Comp. 19 | BH1-18 | BD1 | 25 | — | — | — | — | 7.1 | 62 |
| Comp. 20 | BH1-19 | BD1 | 25 | — | — | — | — | 6.9 | 43 |
| Comp. 21 | BH1-20 | BD1 | 25 | — | — | — | — | 6.5 | 21 |

Example 21

The organic EL device of Example 21 was manufactured in the same manner as that of Example 1 except that the compound BH2 (second host material) in the second emitting layer was replaced with the compound shown in Table 5.

Examples 22 and 23

The organic EL devices of Examples 22 and 23 were manufactured in the same manner as that of Example 1 except that the compound BH1 (first host material) in the first emitting layer and the compound BH2 (second host material) in the second emitting layer were replaced with the compounds shown in Table 5.

Comparative 22

The organic EL device of Comparative 22 was manufactured in the same manner as that of Comparative 2 except that the compound BH2 (second host material) in the second emitting layer was replaced with the compound shown in Table 5.

TABLE 5

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 21 | BH1 | BD1 | 5 | BH2-2 | BD1 | 20 | 3.96 | 9.8 | 192 |
| Ex. 22 | R-BH1 | BD1 | 5 | BH2-2 | BD1 | 20 | 4.40 | 9.4 | — |
| Ex. 23 | R-BH2 | BD1 | 5 | BH2-2 | BD1 | 20 | 4.68 | 9.5 | — |
| Comp. 1 | BH1 | BD1 | 25 | — | — | — | — | 7.6 | 65 |
| Comp. 22 | — | — | — | BH2-2 | BD1 | 25 | — | 9.2 | 115 |

Example 24

The organic EL device of Example 24 was manufactured in the same manner as that of Example 1 except that the compound BH2 (second host material) in the second emitting layer was replaced with the compound shown in Table 6.

Examples 25 and 26

The organic EL devices of Examples 25 and 26 were manufactured in the same manner as that of Example 1 except that the compound BH1 (first host material) in the first emitting layer and the compound BH2 (second host material) in the second emitting layer were replaced with the compounds shown in Table 6.

Comparative 23

The organic EL device of Comparative 23 was manufactured in the same manner as that of Comparative 2 except that the compound BH2 (second host material) in the second emitting layer was replaced with the compound shown in Table 6.

TABLE 6

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 24 | BH1 | BD1 | 5 | BH2-3 | BD1 | 20 | 3.54 | 10.6 | 278 |
| Ex. 25 | R-BH1 | BD1 | 5 | BH2-3 | BD1 | 20 | 3.98 | 10.1 | — |
| Ex. 26 | R-BH2 | BD1 | 5 | BH2-3 | BD1 | 20 | 4.26 | 10.2 | — |
| Comp. 1 | BH1 | BD1 | 25 | — | — | — | — | 7.6 | 65 |
| Comp. 23 | — | — | — | BH2-3 | BD1 | 25 | — | 9.9 | 182 |

Example 27

The organic EL device of Example 27 was manufactured in the same manner as that of Example 1 except that the compound BH2 (second host material) in the second emitting layer was replaced with the compound shown in Table 7.

Examples 28 and 29

The organic EL devices of Examples 28 and 29 were manufactured in the same manner as that of Example 1 except that the compound BH1 (first host material) in the first emitting layer and the compound BH2 (second host material) in the second emitting layer were replaced with the compounds shown in Table 7.

Comparative 24

The organic EL device of Comparative 24 was manufactured in the same manner as that of Comparative 2 except that the compound BH2 (second host material) in the second emitting layer was replaced with the compound shown in Table 7.

TABLE 7

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 27 | BH1 | BD1 | 5 | BH2-4 | BD1 | 20 | 3.26 | 8.1 | 272 |
| Ex. 28 | R-BH1 | BD1 | 5 | BH2-4 | BD1 | 20 | 3.70 | 7.9 | — |
| Ex. 29 | R-BH2 | BD1 | 5 | BH2-4 | BD1 | 20 | 3.98 | 7.9 | — |
| Comp. 1 | BH1 | BD1 | 25 | — | — | — | — | 7.6 | 65 |
| Comp. 24 | — | — | — | BH2-4 | BD1 | 25 | — | 7.7 | 114 |

Example 30

The organic EL device of Example 30 was manufactured in the same manner as that of Example 1 except that the compound BH2 (second host material) in the second emitting layer was replaced with the compound shown in Table 8.

Examples 31 and 32

The organic EL devices of Examples 31 and 32 were manufactured in the same manner as that of Example 1 except that the compound BH1 (first host material) in the first emitting layer and the compound BH2 (second host material) in the second emitting layer were replaced with the compounds shown in Table 8.

Comparative 25

The organic EL device of Comparative 25 was manufactured in the same manner as that of Comparative 2 except that the compound BH2 (second host material) in the second emitting layer was replaced with the compound shown in Table 8.

TABLE 8

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 30 | BH1 | BD1 | 5 | BH2-5 | BD1 | 20 | 3.76 | 8.0 | 196 |
| Ex. 31 | R-BH1 | BD1 | 5 | BH2-5 | BD1 | 20 | 4.20 | 7.8 | — |
| Ex. 32 | R-BH2 | BD1 | 5 | BH2-5 | BD1 | 20 | 4.48 | 7.8 | — |
| Comp. 1 | BH1 | BD1 | 25 | — | — | — | — | 7.6 | 65 |
| Comp. 25 | — | — | — | BH2-5 | BD1 | 25 | — | 7.6 | 92 |

Example 33

The organic EL device of Example 33 was manufactured in the same manner as that of Example 1 except that the compound BH2 (second host material) in the second emitting layer was replaced with the compound shown in Table 9.

Examples 34 and 35

The organic EL devices of Examples 34 and 35 were manufactured in the same manner as that of Example 1 except that the compound BH1 (first host material) in the first emitting layer and the compound BH2 (second host material) in the second emitting layer were replaced with the compounds shown in Table 9.

Comparative 26

The organic EL device of Comparative 26 was manufactured in the same manner as that of Comparative 2 except that the compound BH2 (second host material) in the second emitting layer was replaced with the compound shown in Table 9.

TABLE 9

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 33 | BH1 | BD1 | 5 | BH2-6 | BD1 | 20 | 3.14 | 10.5 | 198 |
| Ex. 34 | R-BH1 | BD1 | 5 | BH2-6 | BD1 | 20 | 3.58 | 8.2 | — |
| Ex. 35 | R-BH2 | BD1 | 5 | BH2-6 | BD1 | 20 | 3.86 | 8.2 | — |
| Comp. 1 | BH1 | BD1 | 25 | — | — | — | — | 7.6 | 65 |
| Comp. 26 | — | — | — | BH2-6 | BD1 | 25 | — | 8.0 | 71 |

Example 36

The organic EL device of Example 36 was manufactured in the same manner as that of Example 1 except that the compound BH2 (second host material) in the second emitting layer was replaced with the compound shown in Table 10.

Examples 37 and 38

The organic EL devices of Examples 37 and 38 were manufactured in the same manner as that of Example 1 except that the compound BH1 (first host material) in the first emitting layer and the compound BH2 (second host material) in the second emitting layer were replaced with the compounds shown in Table 10.

Comparative 27

The organic EL device of Comparative 27 was manufactured in the same manner as that of Comparative 2 except that the compound BH2 (second host material) in the second emitting layer was replaced with the compound shown in Table 10.

TABLE 10

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 36 | BH1 | BD1 | 5 | BH2-7 | BD1 | 20 | 3.21 | 10.7 | 217 |
| Ex. 37 | R-BH1 | BD1 | 5 | BH2-7 | BD1 | 20 | 3.65 | 8.0 | — |
| Ex. 38 | R-BH2 | BD1 | 5 | BH2-7 | BD1 | 20 | 3.93 | 8.0 | — |
| Comp. 1 | BH1 | BD1 | 25 | — | — | — | — | 7.6 | 65 |
| Comp. 27 | — | — | — | BH2-7 | BD1 | 25 | — | 7.8 | 106 |

Example 39

The organic EL device of Example 39 was manufactured in the same manner as that of Example 1 except that the compound BH2 (second host material) in the second emitting layer was replaced with the compound shown in Table 11.

Examples 40 and 41

The organic EL devices of Examples 40 and 41 were manufactured in the same manner as that of Example 1 except that the compound BH1 (first host material) in the first emitting layer and the compound BH2 (second host material) in the second emitting layer were replaced with the compounds shown in Table 11.

Comparative 28

The organic EL device of Comparative 28 was manufactured in the same manner as that of Comparative 2 except that the compound BH2 (second host material) in the second emitting layer was replaced with the compound shown in Table 11.

TABLE 11

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 39 | BH1 | BD1 | 5 | BH2-8 | BD1 | 20 | 3.39 | 9.2 | 192 |
| Ex. 40 | R-BH1 | BD1 | 5 | BH2-8 | BD1 | 20 | 3.83 | 8.0 | — |
| Ex. 41 | R-BH2 | BD1 | 5 | BH2-8 | BD1 | 20 | 4.11 | 8.0 | — |
| Comp. 1 | BH1 | BD1 | 25 | — | — | — | — | 7.6 | 65 |
| Comp. 28 | — | — | — | BH2-8 | BD1 | 25 | — | 7.8 | 74 |

Example 42

The organic EL device of Example 42 was manufactured in the same manner as that of Example 1 except that the compound BH2 (second host material) in the second emitting layer was replaced with the compound shown in Table 12.

Examples 43 and 44

The organic EL devices of Examples 43 and 44 were manufactured in the same manner as that of Example 1 except that the compound BH1 (first host material) in the first emitting layer and the compound BH2 (second host material) in the second emitting layer were replaced with the compounds shown in Table 12.

Comparative 29

The organic EL device of Comparative 29 was manufactured in the same manner as that of Comparative 2 except that the compound BH2 (second host material) in the second emitting layer was replaced with the compound shown in Table 12.

TABLE 12

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 42 | BH1 | BD1 | 5 | BH2-9 | BD1 | 20 | 3.56 | 10.5 | 300 |
| Ex. 43 | R-BH1 | BD1 | 5 | BH2-9 | BD1 | 20 | 4.00 | 10.0 | — |
| Ex. 44 | R-BH2 | BD1 | 5 | BH2-9 | BD1 | 20 | 4.28 | 10.1 | — |
| Comp. 1 | BH1 | BD1 | 25 | — | — | — | — | 7.6 | 65 |
| Comp. 29 | — | — | — | BH2-9 | BD1 | 25 | — | 9.8 | 195 |

Example 45

The organic EL device of Example 45 was manufactured in the same manner as that of Example 1 except that the compound BD1 in the first emitting layer and the compound BD1 in the second emitting layer were replaced with the compounds shown in Table 13.

Examples 46 and 47

The organic EL devices of Examples 46 and 47 were manufactured in the same manner as that of Example 1 except that the compound BH1 (first host material) and the compound BD1 in the first emitting layer and the compound BD1 in the second emitting layer were replaced with the compounds shown in Table 13.

Comparative 30

The organic EL device of Comparative 30 was manufactured in the same manner as that of Comparative 1 except that the compound BD1 in the first emitting layer was replaced with the compound shown in Table 13.

Comparative 31

The organic EL device of Comparative 31 was manufactured in the same manner as that of Comparative 2 except that the compound BD1 in the second emitting layer was replaced with the compound shown in Table 13.

TABLE 13

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT95 [hr] |
| Ex. 45 | BH1 | BD2 | 5 | BH2 | BD2 | 20 | 3.57 | 9.7 | 203 |
| Ex. 46 | R-BH1 | BD2 | 5 | BH2 | BD2 | 20 | 4.01 | 9.3 | — |
| Ex. 47 | R-BH2 | BD2 | 5 | BH2 | BD2 | 20 | 4.29 | 9.4 | — |
| Comp. 30 | BH1 | BD2 | 25 | — | — | — | — | 7.0 | 51 |
| Comp. 31 | — | — | — | BH2 | BD2 | 25 | — | 9.1 | 120 |

Example 48

The organic EL device of Example 48 was manufactured in the same manner as that of Example 1 except that the compound BD1 in the first emitting layer and the compound BD1 in the second emitting layer were replaced with the compounds shown in Table 14.

Examples 49 and 50

The organic EL devices of Examples 49 and 50 were manufactured in the same manner as that of Example 1 except that the compound BH1 (first host material) and the compound BD1 in the first emitting layer and the compound BD1 in the second emitting layer were replaced with the compounds shown in Table 14.

Comparative 32

The organic EL device of Comparative 32 was manufactured in the same manner as that of Comparative 1 except that the compound BD1 in the first emitting layer was replaced with the compound shown in Table 14.

Comparative 33

The organic EL device of Comparative 33 was manufactured in the same manner as that of Comparative 2 except that the compound BD1 in the second emitting layer was replaced with the compound shown in Table 14.

TABLE 14

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT95 [hr] |
| Ex. 48 | BH1 | BD3 | 5 | BH2 | BD3 | 20 | 3.51 | 10.2 | 167 |
| Ex. 49 | R-BH1 | BD3 | 5 | BH2 | BD3 | 20 | 3.95 | 9.7 | — |
| Ex. 50 | R-BH2 | BD3 | 5 | BH2 | BD3 | 20 | 4.23 | 9.8 | — |
| Comp. 32 | BH1 | BD3 | 25 | — | — | — | — | 7.4 | 46 |
| Comp. 33 | — | — | — | BH2 | BD3 | 25 | — | 9.5 | 103 |

Examples 51 to 69

The organic EL device of Examples 51 to 69 were manufactured in the same manner as that of Example 1 except that the compound BH1 (first host material) in the first emitting layer was replaced with the compounds shown in Table 15.

TABLE 15

| | First Emitting Layer | | | Second Emitting Layer | | | | |
|---|---|---|---|---|---|---|---|---|
| | First Compound | Third Compound | Film Thick-ness [nm] | Second Compound | Fourth Compound | Film Thick-ness [nm] | EQE [%] | LT95 [hr] |
| Ex. 51 | BH1-23 | BD1 | 5 | BH2 | BD1 | 20 | 10.2 | 198 |
| Ex. 52 | BH1-26 | BD1 | 5 | BH2 | BD1 | 20 | 10.3 | 214 |
| Ex. 53 | BH1-27 | BD1 | 5 | BH2 | BD1 | 20 | 10.6 | 239 |
| Ex. 54 | BH1-28 | BD1 | 5 | BH2 | BD1 | 20 | 10.5 | 222 |
| Ex. 55 | BH1-32 | BD1 | 5 | BH2 | BD1 | 20 | 10.4 | 207 |
| Ex. 56 | BH1-33 | BD1 | 5 | BH2 | BD1 | 20 | 10.3 | 205 |
| Ex. 57 | BH1-34 | BD1 | 5 | BH2 | BD1 | 20 | 10.5 | 213 |
| Ex. 58 | BH1-35 | BD1 | 5 | BH2 | BD1 | 20 | 10.4 | 198 |
| Ex. 59 | BH1-40 | BD1 | 5 | BH2 | BD1 | 20 | 10.4 | 221 |
| Ex. 60 | BH1-41 | BD1 | 5 | BH2 | BD1 | 20 | 10.7 | 248 |
| Ex. 61 | BH1-42 | BD1 | 5 | BH2 | BD1 | 20 | 10.5 | 232 |
| Ex. 62 | BH1-43 | BD1 | 5 | BH2 | BD1 | 20 | 10.6 | 211 |
| Ex. 63 | BH1-44 | BD1 | 5 | BH2 | BD1 | 20 | 10.5 | 205 |
| Ex. 64 | BH1-45 | BD1 | 5 | BH2 | BD1 | 20 | 10.4 | 230 |
| Ex. 65 | BH1-46 | BD1 | 5 | BH2 | BD1 | 20 | 10.8 | 249 |
| Ex. 66 | BH1-47 | BD1 | 5 | BH2 | BD1 | 20 | 10.6 | 217 |
| Ex. 67 | BH1-48 | BD1 | 5 | BH2 | BD1 | 20 | 10.6 | 243 |
| Ex. 68 | BH1-49 | BD1 | 5 | BH2 | BD1 | 20 | 10.7 | 268 |
| Ex. 69 | R-BH3 | BD1 | 5 | BH2 | BD1 | 20 | 10.1 | 183 |

Comparatives 34 to 51

The organic EL devices of Comparatives 34 to 51 were manufactured in the same manner as that of Comparative 1 except that the compound BH1 (first host material) in the first emitting layer was replaced with the compounds shown in Table 16.

TABLE 16

| | First Emitting Layer | | | Second Emitting Layer | | | | |
|---|---|---|---|---|---|---|---|---|
| | First Compound | Third Compound | Film Thick-ness [nm] | Second Compound | Fourth Compound | Film Thick-ness [nm] | EQE [%] | LT95 [hr] |
| Comp. 34 | BH1-23 | BD1 | 25 | — | — | — | 6.3 | 50 |
| Comp. 35 | BH1-26 | BD1 | 25 | — | — | — | 6.6 | 78 |
| Comp. 36 | BH1-27 | BD1 | 25 | — | — | — | 6.7 | 81 |
| Comp. 37 | BH1-28 | BD1 | 25 | — | — | — | 6.5 | 72 |
| Comp. 38 | BH1-32 | BD1 | 25 | — | — | — | 6.1 | 49 |
| Comp. 39 | BH1-33 | BD1 | 25 | — | — | — | 6.2 | 55 |
| Comp. 40 | BH1-34 | BD1 | 25 | — | — | — | 6.2 | 57 |
| Comp. 41 | BH1-35 | BD1 | 25 | — | — | — | 6.0 | 49 |
| Comp. 42 | BH1-40 | BD1 | 25 | — | — | — | 6.2 | 68 |
| Comp. 43 | BH1-41 | BD1 | 25 | — | — | — | 6.6 | 91 |
| Comp. 44 | BH1-42 | BD1 | 25 | — | — | — | 6.4 | 85 |
| Comp. 45 | BH1-43 | BD1 | 25 | — | — | — | 6.4 | 72 |
| Comp. 46 | BH1-44 | BD1 | 25 | — | — | — | 6.4 | 77 |
| Comp. 47 | BH1-45 | BD1 | 25 | — | — | — | 6.2 | 81 |
| Comp. 48 | BH1-46 | BD1 | 25 | — | — | — | 6.3 | 94 |
| Comp. 49 | BH1-47 | BD1 | 25 | — | — | — | 6.2 | 67 |
| Comp. 50 | BH1-48 | BD1 | 25 | — | — | — | 6.1 | 64 |
| Comp. 51 | BH1-49 | BD1 | 25 | — | — | — | 6.8 | 97 |
| Comp. 2 | — | — | — | BH2 | BD1 | 25 | 9.9 | 167 |

Manufacture 2 of Organic EL Device

Organic EL devices were manufactured and evaluated as follows.

Example 70

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, a compound HT3 was vapor-deposited to form an 80-nm-thick first hole transporting layer (HT).

After the formation of the first hole transporting layer, a compound HT4 was vapor-deposited to form a 10-nm-thick second hole transporting layer (also referred to as an electron blocking layer (EBL)).

A compound BH1-21 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

A compound ET4 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 70 is roughly shown as follows.

ITO (130)/HA1 (5)/HT3 (80)/HT4 (10)/BH1-21:BD1 (5, 98%:2%)/BH2:BD1 (20, 98%:2%)/ET4 (10)/ET2 (15)/LiF (1)/Al (80)

Numerals in parentheses represent a film thickness (unit: nm).

The numerals (98%:2%) represented by percentage in the same parentheses indicate a ratio (mass %) between the host material (compound BH1-21 or BH2) and the compound BD1 in the first emitting layer or the second emitting layer. Similar notations apply to the description below.

Examples 71 to 78

The organic EL devices of Examples 71 to 78 were manufactured in the same manner as that of Example 70 except that the compound BH1-21 (first host material) in the first emitting layer was replaced with the first compounds shown in Table 17.

Comparatives 52 to 59

The organic EL devices of Comparatives 52 to 59 were manufactured in the same manner as that of Example 70 except that a 25-nm thick first emitting layer was formed as the emitting layer and the first electron transporting layer was formed on the first emitting layer without forming the second emitting layer, and the first compound (first host material) in the first emitting layer was replaced with the first compounds shown in Table 17.

Comparative 60

The organic EL device of Comparative 60 was manufactured in the same manner as that of Example 70 except that a 25-nm-thick second emitting layer was formed on the second hole transporting layer without forming the first emitting layer as shown in Table 17.

LiF was vapor-deposited on the second electron transporting layer to form a 1-nm-thick electron injecting layer.

TABLE 17

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT95 [hr] |
| Ex. 70 | BH1-21 | BD1 | 5 | BH2 | BD1 | 20 | 3.40 | 8.7 | 160 |
| Ex. 71 | BH1-22 | BD1 | 5 | BH2 | BD1 | 20 | 3.46 | 9.0 | 225 |
| Ex. 72 | BH1-24 | BD1 | 5 | BH2 | BD1 | 20 | 3.27 | 8.4 | 79 |
| Ex. 73 | BH1-25 | BD1 | 5 | BH2 | BD1 | 20 | 3.35 | 8.7 | 174 |
| Ex. 74 | BH1-36 | BD1 | 5 | BH2 | BD1 | 20 | 3.39 | 8.5 | 125 |
| Ex. 75 | BH1-37 | BD1 | 5 | BH2 | BD1 | 20 | 3.44 | 8.8 | 135 |
| Ex. 76 | BH1-50 | BD1 | 5 | BH2 | BD1 | 20 | 3.42 | 8.5 | 111 |
| Ex. 77 | BH1-51 | BD1 | 5 | BH2 | BD1 | 20 | 3.31 | 8.4 | 105 |
| Ex. 78 | R-BH3 | BD1 | 5 | BH2 | BD1 | 20 | 3.53 | 7.9 | 36 |
| Comp. 52 | BH1-21 | BD1 | 25 | — | — | — | — | 6.2 | 32 |
| Comp. 53 | BH1-22 | BD1 | 25 | — | — | — | — | 6.4 | 45 |
| Comp. 54 | BH1-24 | BD1 | 25 | — | — | — | — | 6.0 | 13 |
| Comp. 55 | BH1-25 | BD1 | 25 | — | — | — | — | 6.2 | 25 |
| Comp. 56 | BH1-36 | BD1 | 25 | — | — | — | — | 6.1 | 25 |
| Comp. 57 | BH1-37 | BD1 | 25 | — | — | — | — | 6.3 | 27 |
| Comp. 58 | BH1-50 | BD1 | 25 | — | — | — | — | 6.1 | 21 |
| Comp. 59 | BH1-51 | BD1 | 25 | — | — | — | — | 6.0 | 19 |
| Comp. 60 | — | — | — | BH2 | BD1 | 25 | — | 7.7 | 56 |

Manufacture 3 of Organic EL Device

Organic EL devices were manufactured and evaluated as follows.

Example 79

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT3 was vapor-deposited to form an 80-nm-thick first hole transporting layer (HT).

After the formation of the first hole transporting layer, a compound HT4 was vapor-deposited to form a 10-nm-thick second hole transporting layer (also referred to as an electron blocking layer (EBL)).

A compound BH1-29 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET3 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

Metal aluminum (Al) was vapor-deposited on the electron injecting layer to form an 80-nm-thick cathode.

A device arrangement of the organic EL device of Example 79 is roughly shown as follows.

ITO (130)/HA1 (5)/HT3 (80)/HT4 (10)/BH1-29:BD1 (5, 98%:2%)/BH2:BD1 (20, 98%:2%)/ET3 (10)/ET2 (15)/LiF (1)/Al (80)

Numerals in parentheses represent a film thickness (unit: nm).

The numerals (98%:2%) represented by percentage in the same parentheses indicate a ratio (mass %) between the host material (compound BH1-29 or BH2) and the compound BD1 in the first emitting layer or the second emitting layer. Similar notations apply to the description below.

Examples 80 to 90

The organic EL devices of Examples 80 to 90 were manufactured in the same manner as that of Example 79 except that the compound BH1-29 (first host material) in the first emitting layer was replaced with the first compounds shown in Table 18.

Comparatives 61 to 71

The organic EL devices of Comparatives 61 to 71 were manufactured in the same manner as that of Example 79 except that a 25-nm-thick first emitting layer was formed as the emitting layer and the first electron transporting layer was formed on the first emitting layer without forming the second emitting layer, and the first compound (first host material) in the first emitting layer was replaced with the first compounds shown in Table 18.

Comparative 72

The organic EL device of Comparative 72 was manufactured in the same manner as that of Example 79 except that a 25-nm-thick second emitting layer was formed on the second hole transporting layer without forming the first emitting layer as shown in Table 18.

TABLE 18

| | First Emitting Layer | | | Second Emitting Layer | | | | |
|---|---|---|---|---|---|---|---|---|
| | First Compound | Third Compound | Film Thick-ness [nm] | Second Compound | Fourth Compound | Film Thick-ness [nm] | EQE [%] | LT95 [hr] |
| Ex. 79 | BH1-29 | BD1 | 5 | BH2 | BD1 | 20 | 9.3 | 125 |
| Ex. 80 | BH1-30 | BD1 | 5 | BH2 | BD1 | 20 | 9.3 | 103 |
| Ex. 81 | BH1-31 | BD1 | 5 | BH2 | BD1 | 20 | 9.6 | 119 |
| Ex. 82 | BH1-38 | BD1 | 5 | BH2 | BD1 | 20 | 9.8 | 138 |
| Ex. 83 | BH1-39 | BD1 | 5 | BH2 | BD1 | 20 | 9.7 | 122 |
| Ex. 84 | BH1-52 | BD1 | 5 | BH2 | BD1 | 20 | 9.5 | 151 |
| Ex. 85 | BH1-53 | BD1 | 5 | BH2 | BD1 | 20 | 9.3 | 132 |
| Ex. 86 | BH1-54 | BD1 | 5 | BH2 | BD1 | 20 | 9.1 | 110 |
| Ex. 87 | BH1-55 | BD1 | 5 | BH2 | BD1 | 20 | 9.4 | 109 |
| Ex. 88 | BH1-56 | BD1 | 5 | BH2 | BD1 | 20 | 9.2 | 111 |
| Ex. 89 | BH1-57 | BD1 | 5 | BH2 | BD1 | 20 | 9.2 | 121 |
| Ex. 90 | R-BH3 | BD1 | 5 | BH2 | BD1 | 20 | 8.3 | 97 |
| Comp. 61 | BH1-29 | BD1 | 25 | — | — | — | 6.7 | 61 |
| Comp. 62 | BH1-30 | BD1 | 25 | — | — | — | 6.9 | 53 |
| Comp. 63 | BH1-31 | BD1 | 25 | — | — | — | 6.4 | 51 |
| Comp. 64 | BH1-38 | BD1 | 25 | — | — | — | 6.1 | 48 |
| Comp. 65 | BH1-39 | BD1 | 25 | — | — | — | 6.1 | 45 |
| Comp. 66 | BH1-52 | BD1 | 25 | — | — | — | 6.8 | 62 |
| Comp. 67 | BH1-53 | BD1 | 25 | — | — | — | 6.8 | 54 |
| Comp. 68 | BH1-54 | BD1 | 25 | — | — | — | 6.7 | 42 |
| Comp. 69 | BH1-55 | BD1 | 25 | — | — | — | 6.7 | 59 |
| Comp. 70 | BH1-56 | BD1 | 25 | — | — | — | 6.5 | 40 |
| Comp. 71 | BH1-57 | BD1 | 25 | — | — | — | 6.2 | 34 |
| Comp. 72 | — | — | — | BH2 | BD1 | 25 | 8.1 | 89 |

Manufacture 4 of Organic EL Device

Organic EL devices were manufactured and evaluated as follows.

Example 91

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HT5 and a compound HA2 were co-deposited on a surface provided with the transparent electrode line to cover the transparent electrode, thereby forming a 10-nm-thick hole injecting layer (HI). The compound HT5 and the compound HA2 accounted in ratio for 97 mass % and 3 mass %, respectively, in the hole injecting layer.

After the formation of the hole injecting layer, the compound HT5 was vapor-deposited to form an 85-nm-thick first hole transporting layer (HT).

After the formation of the first hole transporting layer, the compound HT4 was vapor-deposited to form a 5-nm-thick second hole transporting layer (also referred to as an electron blocking layer (EBL)).

A compound BH1-61 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET3 was vapor-deposited on the second emitting layer to form a 5-nm-thick first electron transporting layer (also referred to as a hole blocking layer (HBL)).

A compound ET6 and a compound Liq were co-deposited on the first electron transporting layer (HBL) to form a 25-nm-thick electron transporting layer (ET). The compound ET6 and the compound Liq accounted in ratio for 50 mass % and 50 mass %, respectively, in the electron transporting layer (ET). Liq is an abbreviation of (8-quinolinolato)lithium ((8-Quinolinolato)lithium).

Liq was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 91 is roughly shown as follows.

ITO (130)/HT5:HA2 (10, 97%:3%)/HT5 (85)/HT4 (5)/BH1-61:BD1 (5, 98%:2%)/BH2:BD1 (20, 98%:2%)/ET3 (5)/ET6:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT5 and the compound HA2 in the hole injecting layer. The numerals (98%:2%) represented by percentage in the same parentheses indicate a ratio (mass %) between the host material (compound BH1-61 or BH2) and the dopant material (compound BD1) in the first emitting layer or the second emitting layer. The numerals (50%:50%) represented by percentage in the same parentheses indicate a ratio (mass %) between the compound ET6 and the compound Liq in the electron transporting layer (ET). Similar notations apply to the description below.

Examples 92 to 95

The organic EL devices of Examples 92 to 95 were manufactured in the same manner as that of Example 91 except that the compound BH1-61 (first host material) in the first emitting layer was replaced with the first compounds shown in Table 19.

Comparatives 73 to 76

The organic EL devices of Comparatives 73 to 76 were manufactured in the same manner as that of Example 91 except that a 25-nm-thick first emitting layer was formed as the emitting layer and the first electron transporting layer was formed on the first emitting layer without forming the second emitting layer, and the first compound (first host material) in the first emitting layer was replaced with the first compounds shown in Table 19.

Comparative 77

The organic EL device of Comparative 77 was manufactured in the same manner as that of Example 91 except that a 25-nm-thick second emitting layer was formed on the second hole transporting layer without forming the first emitting layer as shown in Table 19.

A compound BH1-75 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET3 was vapor-deposited on the second emitting layer to form a 5-nm-thick first electron transporting layer (also referred to as a hole blocking layer (HBL)).

A compound ET8 and the compound Liq were co-deposited on the first electron transporting layer (HBL) to form a 25-nm-thick electron transporting layer (ET). The compound ET5 and the compound Liq accounted in ratio for 50 mass % and 50 mass %, respectively, in the electron transporting layer (ET). Liq is an abbreviation of (8-quinolinolato)lithium ((8-Quinolinolato)lithium).

Liq was vapor-deposited on the second electron transporting layer to form a 1-nm-thick electron injecting layer.

TABLE 19

| | First Emitting Layer | | | Second Emitting Layer | | | | |
|---|---|---|---|---|---|---|---|---|
| | First Compound | Third Compound | Film Thickness [nm] | Second Compound | Fourth Compound | Film Thickness [nm] | EQE [%] | LT95 [hr] |
| Ex. 91 | BH1-61 | BD1 | 5 | BH2 | BD1 | 20 | 9.2 | 128 |
| Ex. 92 | BH1-62 | BD1 | 5 | BH2 | BD1 | 20 | 9.7 | 153 |
| Ex. 93 | BH1-63 | BD1 | 5 | BH2 | BD1 | 20 | 9.5 | 144 |
| Ex. 94 | BH1-69 | BD1 | 5 | BH2 | BD1 | 20 | 9.0 | 110 |
| Ex. 95 | R-BH3 | BD1 | 5 | BH2 | BD1 | 20 | 8.8 | 101 |
| Comp. 73 | BH1-61 | BD1 | 25 | — | — | — | 6.1 | 47 |
| Comp. 74 | BH1-62 | BD1 | 25 | — | — | — | 6.4 | 64 |
| Comp. 75 | BH1-63 | BD1 | 25 | — | — | — | 6.3 | 60 |
| Comp. 76 | BH1-69 | BD1 | 25 | — | — | — | 5.9 | 19 |
| Comp. 77 | — | — | — | BH2 | BD1 | 25 | 8.4 | 72 |

<Manufacture 5 of Organic EL Device>

Organic EL devices were manufactured and evaluated as follows.

Example 96

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. The compound HT3 and the compound HA2 were co-deposited on a surface provided with the transparent electrode line to cover the transparent electrode, thereby forming a 10-nm-thick hole injecting layer (HI). The compound HT3 and the compound HA2 accounted in ratio for 97 mass % and 3 mass %, respectively, in the hole injecting layer.

After the formation of the hole injecting layer, the compound HT3 was vapor-deposited to form an 85-nm-thick first hole transporting layer (HT).

After the formation of the first hole transporting layer, the compound HT4 was vapor-deposited to form a 5-nm-thick second hole transporting layer (also referred to as an electron blocking layer (EBL)).

Metal aluminum (Al) was vapor-deposited on the electron injecting layer to form an 80-nm-thick cathode.

A device arrangement of the organic EL device of Example 96 is roughly shown as follows.

ITO (130)/HT3:HA2 (10, 97%:3%)/HT3 (85)/HT4 (5)/BH1-75:BD1 (5, 98%:2%)/BH2:BD1 (20, 98%:2%)/ET3 (5)/ET8:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT3 and the compound HA2 in the hole injecting layer. The numerals (98%:2%) represented by percentage in the same parentheses indicate a ratio (mass %) between the host material (compound BH1-75 or BH2) and the dopant material (compound BD1) in the first emitting layer or the second emitting layer. The numerals (50%:50%) represented by percentage in the same parentheses indicate a ratio (mass %) between the compound ET8 and the compound Liq in the electron transporting layer (ET). Similar notations apply to the description below.

Example 97

The organic EL device of Example 97 was manufactured in the same manner as that of Example 96 except that the compound BH1-75 (first host material) in the first emitting layer was replaced with the first compound shown in Table 20.

Comparative 78

The organic EL device of Comparative 78 was manufactured in the same manner as that of Example 96 except that a 25-nm-thick first emitting layer was formed as the emitting layer and the first electron transporting layer was formed on the first emitting layer without forming the second emitting layer, and the first compound (first host material) in the first emitting layer was replaced with the first compound shown in Table 20.

Comparative 79

The organic EL device of Comparative 79 was manufactured in the same manner as that of Example 96 except that a 25-nm thick second emitting layer was formed on the second hole transporting layer without forming the first emitting layer as shown in Table 20.

TABLE 20

| | First Emitting Layer | | | Second Emitting Layer | | | | |
|---|---|---|---|---|---|---|---|---|
| | First Compound | Third Compound | Film Thickness [nm] | Second Compound | Fourth Compound | Film Thickness [nm] | EQE [%] | LT95 [hr] |
| Ex. 6 | BH1-75 | BD1 | 5 | BH2 | BD1 | 20 | 9.2 | 169 |
| Ex. 97 | R-BH3 | BD1 | 5 | BH2 | BD1 | 20 | — | 118 |
| Comp. 78 | BH1-75 | BD1 | 25 | — | — | — | 6.0 | 63 |
| Comp. 79 | — | — | — | BH2 | BD1 | 25 | 8.1 | 91 |

<Manufacture 6 of Organic EL Device>

Organic EL devices were manufactured and evaluated as follows.

Example 98

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HT5 and a compound HA2 were co-deposited on a surface provided with the transparent electrode line to cover the transparent electrode, thereby forming a 10-nm-thick hole injecting layer (HI). The compound HT5 and the compound HA2 accounted in ratio for 97 mass % and 3 mass %, respectively, in the hole injecting layer.

After the formation of the hole injecting layer, the compound HT5 was vapor-deposited to form an 85-nm-thick first hole transporting layer (HT).

After the formation of the first hole transporting layer, the compound HT4 was vapor-deposited to form a 5-nm-thick second hole transporting layer (also referred to as an electron blocking layer (EBL)).

A compound BH1-64 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET3 was vapor-deposited on the second emitting layer to form a 5-nm-thick first electron transporting layer (also referred to as a hole blocking layer (HBL)).

A compound ET8 and the compound Liq were co-deposited on the first electron transporting layer (HBL) to form a 25-nm-thick electron transporting layer (ET). The compound ET8 and the compound Liq accounted in ratio for 50 mass % and 50 mass %, respectively, in the electron transporting layer (ET).

Liq was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 98 is roughly shown as follows.

ITO (130)/HT5:HA2 (10, 97%:3%)/HT5 (85)/HT4 (5)/BH1-64:BD1 (5, 98%:2%)/BH2:BD1 (20, 98%:2%)/ET3 (5)/ET8:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT5 and the compound HA2 in the hole injecting layer. The numerals (98%:2%) represented by percentage in the same parentheses indicate a ratio (mass %) between the host material (compound BH1-64 or BH2) and the dopant material (compound BD1) in the first emitting layer or the second emitting layer. The numerals (50%:50%) represented by percentage in the same parentheses indicate a ratio (mass %) between the compound ET8 and the compound Liq in the electron transporting layer (ET). Similar notations apply to the description below.

Examples 99 to 103

The organic EL devices of Examples 99 to 103 were manufactured in the same manner as that of Example 98 except that the compound BH1-64 (first host material) in the first emitting layer was replaced with the first compounds shown in Table 21.

Comparatives 80 to 84

The organic EL device of Comparatives 80 to 84 were manufactured in the same manner as that of Example 98 except that a 25-nm-thick first emitting layer was formed as the emitting layer and the first electron transporting layer was formed on the first emitting layer without forming the second emitting layer, and the first compound (first host material) in the first emitting layer was replaced with the first compounds shown in Table 21.

Comparative 85

The organic EL device of Comparative 85 was manufactured in the same manner as that of Example 98 except that a 25-nm thick second emitting layer was formed on the second hole transporting layer without forming the first emitting layer as shown in Table 21.

TABLE 21

| | First Emitting Layer | | | Second Emitting Layer | | | | |
|---|---|---|---|---|---|---|---|---|
| | First Compound | Third Compound | Film Thickness [nm] | Second Compound | Fourth Compound | Film Thickness [nm] | EQE [%] | LT95 [hr] |
| Ex. 98 | BH1-64 | BD1 | 5 | BH2 | BD1 | 20 | 9.6 | 106 |
| Ex. 99 | BH1-65 | BD1 | 5 | BH2 | BD1 | 20 | 9.7 | 112 |
| Ex. 100 | BH1-66 | BD1 | 5 | BH2 | BD1 | 20 | 9.5 | 83 |
| Ex. 101 | BH1-67 | BD1 | 5 | BH2 | BD1 | 20 | 9.4 | 93 |
| Ex. 102 | BH1-68 | BD1 | 5 | BH2 | BD1 | 20 | 9.5 | 101 |
| Ex. 103 | R-BH3 | BD1 | 5 | BH2 | BD1 | 20 | 9.1 | |
| Comp. 80 | BH1-64 | BD1 | 25 | — | — | — | 6.1 | 31 |
| Comp. 81 | BH1-65 | BD1 | 25 | — | — | — | 6.3 | 48 |
| Comp. 82 | BH1-66 | BD1 | 25 | — | — | — | 6.1 | 31 |
| Comp. 83 | BH1-67 | BD1 | 25 | — | — | — | 6.3 | 55 |
| Comp. 84 | BH1-68 | BD1 | 25 | — | — | — | 6.0 | 28 |
| Comp. 85 | — | — | — | BH2 | BD1 | 25 | 8.6 | 61 |

<Manufacture 7 of Organic EL Device>

Organic EL devices were manufactured and evaluated as follows.

Example 104

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HT5 and a compound HA2 were co-deposited on a surface provided with the transparent electrode line to cover the transparent electrode, thereby forming a 10-nm-thick hole injecting layer (HI). The compound HT5 and the compound HA2 accounted in ratio for 97 mass % and 3 mass %, respectively, in the hole injecting layer.

After the formation of the hole injecting layer, the compound HT5 was vapor-deposited to form an 85-nm-thick first hole transporting layer (HT).

After the formation of the first hole transporting layer, the compound HT4 was vapor-deposited to form a 5-nm-thick second hole transporting layer (also referred to as an electron blocking layer (EBL)).

A compound BH1-70 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

ron transporting layer (HBL) to form a 25-nm-thick electron transporting layer (ET). The compound ET6 and the compound Liq accounted in ratio for 50 mass % and 50 mass %, respectively, in the electron transporting layer (ET).

Liq was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 104 is roughly shown as follows.

ITO (130)/HT5:HA2 (10, 97%:3%)/HT5 (85)/HT4 (5)/BH1-70:BD1 (5, 98%:2%)/BH2:BD1 (20, 98%:2%)/ET1 (5)/ET6:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT5 and the compound HA2 in the hole injecting layer. The numerals (98%:2%) represented by percentage in the same parentheses indicate a ratio (mass %) between the host material (compound BH1-70 or BH2) and the dopant material (compound BD1) in the first emitting layer or the second emitting layer. The numerals (50%:50%) represented by percentage in the same parentheses indicate a ratio (mass %) between the compound ET6 and the compound Liq in the electron transporting layer (ET). Similar notations apply to the description below.

Examples 105 to 109

The organic EL devices of Examples 105 to 109 were manufactured in the same manner as that of Example 104 except that the compound BH1-70 (first host material) in the first emitting layer was replaced with the first compounds shown in Table 22.

Comparatives 86 to 90

The organic EL devices of Comparatives 86 to 90 were manufactured in the same manner as that of Example 104 except that a 25-nm-thick first emitting layer was formed as the emitting layer and the first electron transporting layer was formed on the first emitting layer without forming the second emitting layer, and the first compound (first host material) in the first emitting layer was replaced with the first compounds shown in Table 22.

Comparative 91

The organic EL device of Comparative 91 was manufactured in the same manner as that of Example 104 except that a 25-nm thick second emitting layer was formed on the second hole transporting layer without forming the first emitting layer as shown in Table 22.

TABLE 22

| | First Emitting Layer | | | Second Emitting Layer | | | | |
|---|---|---|---|---|---|---|---|---|
| | First Compound | Third Compound | Film Thickness [nm] | Second Compound | Fourth Compound | Film Thickness [nm] | EQE [%] | LT95 [hr] |
| Ex. 104 | BH1-70 | BD1 | 5 | BH2 | BD1 | 20 | 10.2 | 185 |
| Ex. 105 | BH1-71 | BD1 | 5 | BH2 | BD1 | 20 | 10.7 | 223 |
| Ex. 106 | BH1-72 | BD1 | 5 | BH2 | BD1 | 20 | 10.4 | 212 |
| Ex. 107 | BH1-73 | BD1 | 5 | BH2 | BD1 | 20 | 10.6 | 220 |
| Ex. 108 | BH1-74 | BD1 | 5 | BH2 | BD1 | 20 | 10.3 | 218 |
| Ex. 109 | R-BH3 | BD1 | 5 | BH2 | BD1 | 20 | 8.7 | 101 |
| Comp. 86 | BH1-70 | BD1 | 25 | — | — | — | 6.2 | 59 |
| Comp. 87 | BH1-71 | BD1 | 25 | — | — | — | 6.6 | 63 |
| Comp. 88 | BH1-72 | BD1 | 25 | — | — | — | 6.5 | 51 |
| Comp. 89 | BH1-73 | BD1 | 25 | — | — | — | 6.5 | 62 |
| Comp. 90 | BH1-74 | BD1 | 25 | — | — | — | 6.4 | 60 |
| Comp. 91 | — | — | — | BH2 | BD1 | 25 | 8.3 | 76 |

<Manufacture 8 of Organic EL Device>

Example 110

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT8 was vapor-deposited to form a 10-nm-thick second hole transporting layer (also referred to as an electron blocking layer (EBL)).

A compound BH1-81 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

A compound ET1 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 110 is roughly shown as follows.

ITO (130)/HA1 (5)/HT1 (80)/HT8 (10)/BH1-81:BD1 (5, 98%:2%)/BH2:BD1 (20, 98%:2%)/ET1 (10)/ET2 (15)/LiF (1)/Al (80)

Numerals in parentheses represent a film thickness (unit: nm).

The numerals (98%:2%) represented by percentage in the same parentheses indicate a ratio (mass %) between the host material (compound BH1-81 or BH2) and the compound BD1 in the first emitting layer or the second emitting layer. Similar notations apply to the description below.

Example 111

The organic EL device of Example 111 was manufactured in the same manner as that of Example 110 except that the compound BH1-81 (first host material) in the first emitting layer was replaced with the first compound shown in Table 23.

Comparative 92

The organic EL device of Comparative 92 was manufactured in the same manner as that of Example 110 except that a 25-nm-thick first emitting layer was formed as the emitting layer and the first electron transporting layer was formed on the first emitting layer without forming the second emitting layer.

Comparative 93

The organic EL device of Comparative 93 was manufactured in the same manner as that of Example 110 except that a 25-nm thick second emitting layer was formed on the second hole transporting layer without forming the first emitting layer as shown in Table 23.

TABLE 23

| | First Emitting Layer | | | Second Emitting Layer | | | | |
|---|---|---|---|---|---|---|---|---|
| | First Compound | Third Compound | Film Thick-ness [nm] | Second Compound | Fourth Compound | Film Thick-ness [nm] | EQE [%] | LT95 [hr] |
| Ex. 110 | BH1-81 | BD1 | 5 | BH2 | BD1 | 20 | 10.7 | 134 |
| Ex. 111 | R-BH3 | BD1 | 5 | BH2 | BD1 | 20 | 10.4 | — |
| Comp. 92 | BH1-81 | BD1 | 25 | — | — | — | 6.4 | 35 |
| Comp. 93 | — | — | — | BH2 | BD1 | 25 | 10.2 | 102 |

<Manufacture 9 of Organic EL Device>

Examples 112 and 113

The organic EL devices of Examples 112 and 113 were manufactured in the same manner as that of Example 1 except that the compound BH1 (first host material) in the first emitting layer was replaced with the compounds shown in Table 24.

Comparative 94

The organic EL device of Comparative 94 was manufactured in the same manner as that of Comparative 1 except that the compound BH1 (first host material) in the first emitting layer was replaced with the compound shown in Table 24.

TABLE 24

| | First Emitting Layer | | | Second Emitting Layer | | | | |
|---|---|---|---|---|---|---|---|---|
| | First Compound | Third Compound | Film Thick-ness [nm] | Second Compound | Forth Compound | Film Thick-ness [nm] | EQE [%] | LT95 [hr] |
| Ex. 112 | BH1-82 | BD1 | 5 | BH2 | BD1 | 20 | 10.4 | 219 |
| Ex. 113 | R-BH3 | BD1 | 5 | BH2 | BD1 | 20 | 10.1 | 183 |
| Comp. 94 | BH1-82 | BD1 | 25 | — | — | — | 6.2 | 71 |
| Comp. 2 | — | — | — | BH2 | BD1 | 25 | 9.9 | 167 |

<Manufacture 10 of Organic EL Device>

Example 114

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT2 was vapor-deposited to form a 10-nm-thick second hole transporting layer (also referred to as an electron blocking layer (EBL)).

A compound BH1-83 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET7 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 114 is roughly shown as follows.

ITO (130)/HA1 (5)/HT1 (80)/HT2 (10)/BH1-83:BD1 (5, 98%:2%)/BH2:BD1 (20, 98%:2%)/ET7 (10)/ET2 (15)/LiF (1)/Al (80)

Numerals in parentheses represent a film thickness (unit: nm).

The numerals (98%:2%) represented by percentage in the same parentheses indicate a ratio (mass %) between the host material (compound BH1-83 or BH2) and the compound BD1 in the first emitting layer or the second emitting layer. Similar notations apply to the description below.

Example 115

The organic EL device of Example 115 was manufactured in the same manner as that of Example 114 except that the compound BH1-83 (first host material) in the first emitting layer was replaced with the first compound shown in Table 25.

Comparative 95

The organic EL device of Comparative 95 was manufactured in the same manner as that of Example 114 except that a 25-nm-thick first emitting layer was formed as the emitting layer and the first electron transporting layer was formed on the first emitting layer without forming the second emitting layer.

Comparative 96

The organic EL device of Comparative 96 was manufactured in the same manner as that of Example 114 except that a 25-nm-thick second emitting layer was formed on the second hole transporting layer without forming the first emitting layer as shown in Table 25.

TABLE 25

| | First Emitting Layer | | | Second Emitting Layer | | | | |
|---|---|---|---|---|---|---|---|---|
| | First Compound | Third Compound | Film Thickness [nm] | Second Compound | Fourth Compound | Film Thickness [nm] | EQE [%] | LT95 [hr] |
| Ex. 114 | BH1-83 | BD1 | 5 | BH2 | BD1 | 20 | 9.7 | 247 |
| Ex. 115 | R-BH3 | BD1 | 5 | BH2 | BD1 | 20 | 8.5 | — |
| Comp. 95 | BH1-83 | BD1 | 25 | — | — | — | 6.0 | 76 |
| Comp. 96 | — | — | — | BH2 | BD1 | 25 | 9.1 | 183 |

<Manufacture 11 of Organic EL Device>

Example 116

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT4 was vapor-deposited to form a 10-nm-thick second hole transporting layer (also referred to as an electron blocking layer (EBL)).

The compound BH1 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

A compound BH2-8 (second host material (BH)) and the compound BD1 (dopant material (BD)) were co-deposited on the first emitting layer so that a ratio of the compound BD1 accounted for 2 mass %, thereby forming a 20-nm-thick second emitting layer.

A compound ET1 was vapor-deposited on the second emitting layer to form a 10-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 116 is roughly shown as follows.

ITO (130)/HA1 (5)/HT1 (80)/HT4 (10)/BH1:BD1 (5, 98%:2%)/BH2-8:BD1 (20, 98%:2%)/ET1 (10)/ET2 (20)/LiF (1)/Al (80)

Numerals in parentheses represent a film thickness (unit: nm).

The numerals (98%:2%) represented by percentage in the same parentheses indicate a ratio (mass %) between the host material (compound BH1) and the compound BD1 in the first emitting layer. Alternatively, the numerals (98%:2%) represented by percentage in the same parentheses indicate a ratio (mass %) between the host material (compound BH2-8) and the compound BD1 in the second emitting layer. Similar notations apply to the description below.

Example 117

The organic EL device of Example 117 was manufactured in the same manner as that of Example 116 except that the compound BH2-8 (second host material) in the second emitting layer was replaced with the second compound shown in Table 26.

Comparative 97

The organic EL device of Comparative 97 was manufactured in the same manner as that of Example 116 except that a 25-nm-thick second emitting layer was formed on the second hole transporting layer without forming the first emitting layer as shown in Table 26, and the second compound (second host material) in the second emitting layer was replaced with the second compound shown in Table 26.

TABLE 26

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT90 [hr] |
| Ex. 116 | BH1 | BD1 | 5 | BH2-8 | BD1 | 20 | 3.4 | 9.8 | 120 |
| Ex. 117 | BH1 | BD1 | 5 | BH2-5 | BD1 | 20 | 3.6 | 10.1 | 160 |
| Comp. 97 | — | — | — | BH2-5 | BD1 | 25 | 3.8 | 8.9 | 110 |

<Manufacture 12 of Organic EL Device>

Examples 118 and 119

The organic EL devices of Examples 118 and 119 were manufactured in the same manner as that of Example 116 except that the compound BH2-8 (second host material) in the second emitting layer was replaced with the second compound shown in Table 27.

Comparative 98

The organic EL device of Comparative 98 was manufactured in the same manner as that of Example 116 except that a 25-nm-thick second emitting layer was formed on the second hole transporting layer without forming the first emitting layer as shown in Table 27, and the second compound (second host material) in the second emitting layer was replaced with the second compound shown in Table 27.

TABLE 27

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT90 [hr] |
| Ex. 118 | BH1 | BD1 | 5 | BH2-2 | BD1 | 20 | 3.8 | 10.5 | 200 |
| Ex. 119 | BH1 | BD1 | 5 | BH2-10 | BD1 | 20 | 3.8 | 10.5 | 240 |
| Comp. 98 | — | — | — | BH2-10 | BD1 | 25 | 4.0 | 9.8 | 140 |

Example 120

The organic EL device of Example 120 was manufactured in the same manner as that of Example 116 except that the compound BH2-8 (second host material) in the second emitting layer was replaced with the second compound shown in Table 28.

Comparative 99

The organic EL device of Comparative 99 was manufactured in the same manner as that of Example 116 except that a 25-nm-thick second emitting layer was formed on the second hole transporting layer without forming the first emitting layer as shown in Table 28, and the second compound (second host material) in the second emitting layer was replaced with the second compound shown in Table 28.

TABLE 28

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 116 | BH1 | BD1 | 5 | BH2-8 | BD1 | 20 | 3.4 | 9.8 | 120 |
| Ex. 120 | BH1 | BD1 | 5 | BH2-11 | BD1 | 20 | 3.4 | 9.8 | 150 |
| Comp. 99 | — | — | — | BH2-11 | BD1 | 25 | 3.6 | 7.5 | 100 |

<Manufacture 13 of Organic EL Device>

Example 121

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, a compound HT3 was vapor-deposited to form an 80-nm-thick first hole transporting layer (HT).

After the formation of the first hole transporting layer, a compound HT4 was vapor-deposited to form a 10-nm-thick second hole transporting layer (also referred to as an electron blocking layer (EBL)).

The compound BH1 (first host material (BH)) and the compound BD2 (dopant material (BD)) were co-deposited on the second hole transporting layer so that a ratio of the compound BD2 accounted for 2 mass %, thereby forming a 5-nm-thick first emitting layer.

A compound BH2-2 (second host material (BH)) and the compound BD2 (dopant material (BD)) were co-deposited on the first emitting layer so that a ratio of the compound BD2 accounted for 2 mass %, thereby forming a 20-nm-thick second emitting layer.

The compound ET7 was vapor-deposited on the second emitting layer to form a 10-nm-thick first electron transporting layer (also referred to as a hole blocking layer (HBL)).

Metal aluminum (Al) was vapor-deposited on the electron injecting layer to form an 80-nm-thick cathode.

A device arrangement of the organic EL device of Example 121 is roughly shown as follows.

ITO (130)/HA1 (5)/HT3 (80)/HT4 (10)/BH1:BD2 (5, 98%: 2%)/BH2-2:BD2 (20, 98%:2%)/ET7 (10)/ET2 (20)/LiF (1)/Al (80)

Numerals in parentheses represent a film thickness (unit: nm).

The numerals (98%:2%) represented by percentage in the same parentheses indicate a ratio (mass %) between the host material (compound BH1) and the compound BD2 in the first emitting layer. Alternatively, the numerals (98%:2%) represented by percentage in the same parentheses indicate a ratio (mass %) between the host material (compound BH2-2) and the compound BD2 in the second emitting layer. Similar notations apply to the description below.

Example 122

The organic EL device of Example 122 was manufactured in the same manner as that of Example 121 except that the compound BH2-2 (second host material) in the second emitting layer was replaced with the second compound shown in Table 29.

Comparative 100

The organic EL device of Comparative 100 was manufactured in the same manner as that of Example 121 except that a 25-nm-thick second emitting layer was formed on the second hole transporting layer without forming the first emitting layer as shown in Table 29, and the second compound (second host material) in the second emitting layer was replaced with the second compound shown in Table 29.

TABLE 29

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 121 | BH1 | BD2 | 5 | BH2-2 | BD2 | 20 | 3.8 | 10.1 | 180 |
| Ex. 122 | BH1 | BD2 | 5 | BH2-12 | BD2 | 20 | 4.0 | 10.3 | 200 |
| Comp. 100 | — | — | — | BH2-12 | BD2 | 25 | 4.2 | 8.8 | 110 |

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

<Manufacture 14 of Organic EL Device>

Example 123

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT5 was vapor-deposited to form an 80-nm-thick first hole transporting layer (HT).

After the formation of the first hole transporting layer, the compound HT6 was vapor-deposited to form a 10-nm-thick second hole transporting layer (also referred to as an electron blocking layer (EBL)).

A compound BH1-10 (first host material (BH)) and the compound BD2 (dopant material (BD)) were co-deposited on the second hole transporting layer so that a ratio of the compound BD2 accounted for 2 mass %, thereby forming a 5-nm-thick first emitting layer.

The compound BH2-2 (second host material (BH)) and the compound BD2 (dopant material (BD)) were co-deposited on the first emitting layer so that a ratio of the compound BD2 accounted for 2 mass %, thereby forming a 20-nm-thick second emitting layer.

The compound ET7 was vapor-deposited on the second emitting layer to form a 10-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 123 is roughly shown as follows.

ITO (130)/HA1 (5)/HT5 (80)/HT6 (10)/BH1-10:BD2 (5, 98%:2%)/BH2-2:BD2 (20, 98%:2%)/ET7 (10)/ET2 (20)/LiF (1)/Al (80)

Numerals in parentheses represent a film thickness (unit: nm).

The numerals (98%:2%) represented by percentage in the same parentheses indicate a ratio (mass %) between the host material (compound BH1-10) and the compound BD2 in the first emitting layer. Alternatively, the numerals (98%:2%) represented by percentage in the same parentheses indicate a ratio (mass %) between the host material (compound BH2-2) and the compound BD2 in the second emitting layer. Similar notations apply to the description below.

Example 124

The organic EL device of Example 124 was manufactured in the same manner as that of Example 123 except that the compound BH2-2 (second host material) in the second emitting layer was replaced with the second compound shown in Table 30.

Comparative 101

The organic EL device of Comparative 101 was manufactured in the same manner as that of Example 123 except that a 25-nm-thick second emitting layer was formed on the second hole transporting layer without forming the first emitting layer as shown in Table 30, and the second compound (second host material) in the second emitting layer was replaced with the second compound shown in Table 30.

TABLE 30

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 123 | BH1-10 | BD2 | 5 | BH2-2 | BD2 | 20 | 3.9 | 10.0 | 210 |
| Ex. 124 | BH1-10 | BD2 | 5 | BH2-13 | BD2 | 20 | 3.8 | 10.3 | 190 |
| Comp. 101 | — | — | — | BH2-13 | BD2 | 25 | 4.1 | 9.2 | 110 |

<Manufacture 15 of Organic EL Device>

Example 125

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, a compound HT3 was vapor-deposited to form an 80-nm-thick first hole transporting layer (HT).

After the formation of the first hole transporting layer, a compound HT7 was vapor-deposited to form a 10-nm-thick second hole transporting layer (also referred to as an electron blocking layer (EBL)).

The compound BH1-10 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2-2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET7 was vapor-deposited on the second emitting layer to form a 10-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 125 is roughly shown as follows.

ITO (130)/HA1 (5)/HT3 (80)/HT7 (10)/BH1-10:BD1 (5, 98%:2%)/BH2-2:BD1 (20, 98%:2%)/ET7 (10)/ET2 (20)/LiF (1)/Al (80)

Numerals in parentheses represent a film thickness (unit: nm).

The numerals (98%:2%) represented by percentage in the same parentheses indicate a ratio (mass %) between the host material (compound BH1-10) and the compound BD1 in the first emitting layer. Alternatively, the numerals (98%:2%) represented by percentage in the same parentheses indicate a ratio (mass %) between the host material (compound BH2-2) and the compound BD1 in the second emitting layer. Similar notations apply to the description below.

Example 126

The organic EL device of Example 126 was manufactured in the same manner as that of Example 125 except that the compound BH2-2 (second host material) in the second emitting layer was replaced with the second compound shown in Table 31.

Comparative 102

The organic EL device of Comparative 102 was manufactured in the same manner as that of Example 125 except that a 25-nm-thick second emitting layer was formed on the second hole transporting layer without forming the first emitting layer as shown in Table 31, and the second compound (second host material) in the second emitting layer was replaced with the second compound shown in Table 31.

TABLE 31

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 125 | BH1-10 | BD1 | 5 | BH2-2 | BD1 | 20 | 4.0 | 10.5 | 150 |
| Ex. 126 | BH1-10 | BD1 | 5 | BH2-14 | BD1 | 20 | 4.0 | 10.8 | 160 |
| Comp. 102 | — | — | — | BH2-14 | BD1 | 25 | 4.2 | 9.5 | 100 |

Example 127

The organic EL device of Example 127 was manufactured in the same manner as that of Example 125 except that the compound BH2-2 (second host material) in the second emitting layer was replaced with the second compound shown in Table 32.

Comparative 103

The organic EL device of Comparative 103 was manufactured in the same manner as that of Example 125 except that a 25-nm-thick second emitting layer was formed on the second hole transporting layer without forming the first emitting layer as shown in Table 32, and the second compound (second host material) in the second emitting layer was replaced with the second compound shown in Table 32.

TABLE 32

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 125 | BH1-10 | BD1 | 5 | BH2-2 | BD1 | 20 | 4.0 | 10.5 | 150 |
| Ex. 127 | BH1-10 | BD1 | 5 | BH2-15 | BD1 | 20 | 3.9 | 10.3 | 180 |
| Comp. 103 | — | — | — | BH2-15 | BD1 | 25 | 4.0 | 9.2 | 80 |

Example 128

The organic EL device of Example 128 was manufactured in the same manner as that of Example 125 except that the compound BH2-2 (second host material) in the second emitting layer was replaced with the second compound shown in Table 33.

Comparative 104

The organic EL device of Comparative 104 was manufactured in the same manner as that of Example 125 except that a 25-nm-thick second emitting layer was formed on the second hole transporting layer without forming the first emitting layer as shown in Table 33, and the second compound (second host material) in the second emitting layer was replaced with the second compound shown in Table 33.

TABLE 33

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT90 [hr] |
| Ex. 125 | BH1-10 | BD1 | 5 | BH2-2 | BD1 | 20 | 4.0 | 10.5 | 150 |
| Ex. 128 | BH1-10 | BD1 | 5 | BH2-16 | BD1 | 20 | 3.8 | 10.5 | 170 |
| Comp. 104 | — | — | — | BH2-16 | BD1 | 25 | 4.1 | 9.5 | 70 |

Example 129

The organic EL device of Example 129 was manufactured in the same manner as that of Example 125 except that the compound BH2-2 (second host material) in the second emitting layer was replaced with the second compound shown in Table 34.

Comparative 105

The organic EL device of Comparative 105 was manufactured in the same manner as that of Example 125 except that a 25-nm-thick second emitting layer was formed on the second hole transporting layer without forming the first emitting layer as shown in Table 34, and the second compound (second host material) in the second emitting layer was replaced with the second compound shown in Table 34.

TABLE 34

| | First Emitting Layer | | | Second Emitting Layer | | | | | |
|---|---|---|---|---|---|---|---|---|---|
| | First Compound | Third Compound | Film Thick-ness [nm] | Second Compound | Fourth Compound | Film Thick-ness [nm] | Voltage [V] | EQE [%] | LT90 [hr] |
| Ex. 125 | BH1-10 | BD1 | 5 | BH2-2 | BD1 | 20 | 4.0 | 10.5 | 150 |
| Ex. 129 | BH1-10 | BD1 | 5 | BH2-17 | BD1 | 20 | 3.7 | 10.6 | 170 |
| Comp. 105 | — | — | — | BH2-17 | BD1 | 25 | 4.0 | 9.1 | 60 |

<Manufacture 16 of Organic EL Device>

Example 130

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, a compound HT3 was vapor-deposited to form an 80-nm-thick first hole transporting layer (HT).

After the formation of the first hole transporting layer, the compound HT7 was vapor-deposited to form a 10-nm-thick second hole transporting layer (also referred to as an electron blocking layer (EBL)).

The compound BH1-10 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2-8 (second host material (BH)) and the compound BD1 (dopant material (BD)) were co-deposited on the first emitting layer so that a ratio of the compound BD1 accounted for 2 mass %, thereby forming a 20-nm-thick second emitting layer.

A compound ET1 was vapor-deposited on the second emitting layer to form a 10-nm-thick first electron transporting layer (also referred to as a hole blocking layer (HBL)).

The compound ET5 was vapor-deposited on the first electron transporting layer to form a 20-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 130 is roughly shown as follows.

ITO (130)/HA1 (5)/HT3 (80)/HT7 (10)/BH1-10:BD1 (5, 98%:2%)/BH2-8:BD1 (20, 98%:2%)/ET1 (10)/ET5 (20)/LiF (1)/Al (80)

Numerals in parentheses represent a film thickness (unit: nm).

The numerals (98%:2%) represented by percentage in the same parentheses indicate a ratio (mass %) between the host material (compound BH1-10) and the compound BD1 in the first emitting layer. Alternatively, the numerals (98%:2%) represented by percentage in the same parentheses indicate a ratio (mass %) between the host material (compound BH2-8) and the compound BD1 in the second emitting layer. Similar notations apply to the description below.

Example 131

The organic EL device of Example 131 was manufactured in the same manner as that of Example 130 except that the compound BH2-8 (second host material) in the second emitting layer was replaced with the second compound shown in Table 35.

Comparative 106

The organic EL device of Comparative 106 was manufactured in the same manner as that of Example 130 except that a 25-nm-thick second emitting layer was formed on the second hole transporting layer without forming the first emitting layer as shown in Table 35, and the second compound (second host material) in the second emitting layer was replaced with the second compound shown in Table 35.

TABLE 35

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 130 | BH1-10 | BD1 | 5 | BH2-8 | BD1 | 20 | 3.4 | 9.5 | 140 |
| Ex. 131 | BH1-10 | BD1 | 5 | BH2-18 | BD1 | 20 | 3.4 | 10.0 | 150 |
| Comp. 106 | — | — | — | BH2-18 | BD1 | 25 | 3.6 | 9.0 | 100 |

Example 132

The organic EL device of Example 132 was manufactured in the same manner as that of Example 130 except that the compound BH2-8 (second host material) in the second emitting layer was replaced with the second compound shown in Table 36.

Comparative 107

The organic EL device of Comparative 107 was manufactured in the same manner as that of Example 130 except that a 25-nm-thick second emitting layer was formed on the second hole transporting layer without forming the first emitting layer as shown in Table 36, and the second compound (second host material) in the second emitting layer was replaced with the second compound shown in Table 36.

TABLE 36

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 130 | BH1-10 | BD1 | 5 | BH2-8 | BD1 | 20 | 3.4 | 9.5 | 140 |
| Ex. 132 | BH1-10 | BD1 | 5 | BH2-19 | BD1 | 20 | 3.5 | 10.3 | 140 |
| Comp. 107 | — | — | — | BH2-19 | BD1 | 25 | 3.6 | 9.2 | 80 |

Example 133

The organic EL device of Example 133 was manufactured in the same manner as that of Example 130 except that the compound BH2-8 (second host material) in the second emitting layer was replaced with the second compound shown in Table 37.

Comparative 108

The organic EL device of Comparative 108 was manufactured in the same manner as that of Example 130 except that a 25-nm-thick second emitting layer was formed on the second hole transporting layer without forming the first emitting layer as shown in Table 37, and the second compound (second host material) in the second emitting layer was replaced with the second compound shown in Table 37.

TABLE 37

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 130 | BH1-10 | BD1 | 5 | BH2-8 | BD1 | 20 | 3.4 | 9.5 | 140 |
| Ex. 133 | BH1-10 | BD1 | 5 | BH2-20 | BD1 | 20 | 3.4 | 9.9 | 160 |
| Comp. 108 | — | — | — | BH2-20 | BD1 | 25 | 3.7 | 8.8 | 120 |

<Manufacture 17 of Organic EL Device>

Example 134

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT2 was vapor-deposited to form a 10-nm-thick second hole transporting layer (also referred to as an electron blocking layer (EBL)).

The compound BH1 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2-8 (second host material (BH)) and the compound BD1 (dopant material (BD)) were co-deposited on the first emitting layer so that a ratio of the compound BD1 accounted for 2 mass %, thereby forming a 20-nm-thick second emitting layer.

A compound ET4 was vapor-deposited on the second emitting layer to form a 10-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 134 is roughly shown as follows.

ITO (130)/HA1 (5)/HT1 (80)/HT2 (10)/BH1:BD1 (5, 98%: 2%)/BH2-8:BD1 (20, 98%:2%)/ET4 (10)/ET2 (20)/LiF (1)/ Al (80)

Numerals in parentheses represent a film thickness (unit: nm).

The numerals (98%:2%) represented by percentage in the same parentheses indicate a ratio (mass %) between the host material (compound BH1) and the compound BD1 in the first emitting layer. Alternatively, the numerals (98%:2%) represented by percentage in the same parentheses indicate a ratio (mass %) between the host material (compound BH2-8) and the compound BD1 in the second emitting layer. Similar notations apply to the description below.

Example 135

The organic EL device of Example 135 was manufactured in the same manner as that of Example 134 except that the compound BH2-8 (second host material) in the second emitting layer was replaced with the second compound shown in Table 38.

Comparative 109

The organic EL device of Comparative 109 was manufactured in the same manner as that of Example 134 except that a 25-nm-thick second emitting layer was formed on the second hole transporting layer without forming the first emitting layer as shown in Table 38, and the second compound (second host material) in the second emitting layer was replaced with the second compound shown in Table 38.

TABLE 38

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 135 | BH1 | BD1 | 5 | BH2-21 | BD1 | 20 | 3.3 | 9.6 | 130 |
| Comp. 109 | — | — | — | BH2-21 | BD1 | 25 | 3.5 | 8.5 | 80 |

Example 136

The organic EL device of Example 136 was manufactured in the same manner as that of Example 134 except that the compound BH2-8 (second host material) in the second emitting layer was replaced with the second compound shown in Table 39.

Comparative 110

The organic EL device of Comparative 110 was manufactured in the same manner as that of Example 134 except that a 25-nm-thick second emitting layer was formed on the second hole transporting layer without forming the first emitting layer as shown in Table 39, and the second compound (second host material) in the second emitting layer was replaced with the second compound shown in Table 39.

TABLE 39

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 136 | BH1 | BD1 | 5 | BH2-22 | BD1 | 20 | 3.4 | 8.3 | 140 |
| Comp. 110 | — | — | — | BH2-22 | BD1 | 25 | 3.5 | 7.3 | 80 |

Example 137

The organic EL device of Example 137 was manufactured in the same manner as that of Example 134 except that the compound BH2-8 (second host material) in the second emitting layer was replaced with the second compound shown in Table 40.

Comparative 111

The organic EL device of Comparative 111 was manufactured in the same manner as that of Example 134 except that a 25-nm-thick second emitting layer was formed on the second hole transporting layer without forming the first emitting layer as shown in Table 40, and the second compound (second host material) in the second emitting layer was replaced with the second compound shown in Table 40.

TABLE 40

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 137 | BH1 | BD1 | 5 | BH2-23 | BD1 | 20 | 3.3 | 8.8 | 130 |
| Comp. 111 | — | — | — | BH2-23 | BD1 | 25 | 3.4 | 8.0 | 80 |

Example 138

The organic EL device of Example 138 was manufactured in the same manner as that of Example 134 except that the compound BH2-8 (second host material) in the second emitting layer was replaced with the second compound shown in Table 41.

Comparative 112

The organic EL device of Comparative 112 was manufactured in the same manner as that of Example 134 except that a 25-nm-thick second emitting layer was formed on the second hole transporting layer without forming the first emitting layer as shown in Table 41, and the second compound (second host material) in the second emitting layer was replaced with the second compound shown in Table 41.

TABLE 41

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 138 | BH1 | BD1 | 5 | BH2-24 | BD1 | 20 | 3.5 | 9.1 | 120 |
| Comp. 112 | — | — | — | BH2-24 | BD1 | 25 | 3.7 | 7.8 | 90 |

Example 139

The organic EL device of Example 139 was manufactured in the same manner as that of Example 134 except that the compound BH2-8 (second host material) in the second emitting layer was replaced with the second compound shown in Table 42.

Comparative 113

The organic EL device of Comparative 113 was manufactured in the same manner as that of Example 134 except that a 25-nm-thick second emitting layer was formed on the second hole transporting layer without forming the first emitting layer as shown in Table 42, and the second compound (second host material) in the second emitting layer was replaced with the second compound shown in Table 42.

TABLE 42

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 139 | BH1 | BD1 | 5 | BH2-25 | BD1 | 20 | 3.4 | 9.4 | 130 |
| Comp. 113 | — | — | — | BH2-25 | BD1 | 25 | 3.4 | 7.1 | 70 |

Example 140

The organic EL device of Example 140 was manufactured in the same manner as that of Example 134 except that the compound BH2-8 (second host material) in the second emitting layer was replaced with the second compound shown in Table 43.

Comparative 114

The organic EL device of Comparative 114 was manufactured in the same manner as that of Example 134 except that a 25-nm-thick second emitting layer was formed on the second hole transporting layer without forming the first emitting layer as shown in Table 43, and the second compound (second host material) in the second emitting layer was replaced with the second compound shown in Table 43.

TABLE 43

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 140 | BH1 | BD1 | 5 | BH2-26 | BD1 | 20 | 3.5 | 9.2 | 130 |
| Comp. 114 | — | — | — | BH2-26 | BD1 | 25 | 3.4 | 7.5 | 75 |

Example 141

The organic EL device of Example 141 was manufactured in the same manner as that of Example 134 except that the compound BH2-8 (second host material) in the second emitting layer was replaced with the second compound shown in Table 44.

Comparative 115

The organic EL device of Comparative 115 was manufactured in the same manner as that of Example 134 except that a 25-nm-thick second emitting layer was formed on the second hole transporting layer without forming the first emitting layer as shown in Table 44, and the second compound (second host material) in the second emitting layer was replaced with the second compound shown in Table 44.

TABLE 44

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 141 | BH1 | BD1 | 5 | BH2-27 | BD1 | 20 | 3.2 | 9.1 | 130 |
| Comp. 115 | — | — | — | BH2-27 | BD1 | 25 | 3.5 | 7.2 | 80 |

Example 142

The organic EL device of Example 142 was manufactured in the same manner as that of Example 134 except that the compound BH2-8 (second host material) in the second emitting layer was replaced with the second compound shown in Table 45.

Comparative 116

The organic EL device of Comparative 116 was manufactured in the same manner as that of Example 134 except that a 25-nm-thick second emitting layer was formed on the second hole transporting layer without forming the first emitting layer as shown in Table 45, and the second compound (second host material) in the second emitting layer was replaced with the second compound shown in Table 45.

TABLE 45

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 134 | BH1 | BD1 | 5 | BH2-8 | BD1 | 20 | 3.3 | 9.8 | 90 |
| Ex. 142 | BH1 | BD1 | 5 | BH2-28 | BD1 | 20 | 3.3 | 9.0 | 140 |
| Comp. 116 | — | — | — | BH2-28 | BD1 | 25 | 3.4 | 7.4 | 65 |

<Manufacture 18 of Organic EL Device>

Example 143

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT2 was vapor-deposited to form a 10-nm-thick second hole transporting layer (also referred to as an electron blocking layer (EBL)).

The compound BH1 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2-8 (second host material (BH)) and the compound BD1 (dopant material (BD)) were co-deposited on the first emitting layer so that a ratio of the compound BD1 accounted for 2 mass %, thereby forming a 20-nm-thick second emitting layer.

The compound ET7 was vapor-deposited on the second emitting layer to form a 10-nm-thick first electron transporting layer (also referred to as a hole blocking layer (HBL)).

Metal aluminum (Al) was vapor-deposited on the electron injecting layer to form an 80-nm-thick cathode.

A device arrangement of the organic EL device of Example 143 is roughly shown as follows.

ITO (130)/HA1 (5)/HT1 (80)/HT2 (10)/BH1:BD1 (5, 98%: 2%)/BH2-8:BD1 (20, 98%:2%)/ET7 (10)/ET2 (20)/LiF (1)/Al (80)

Numerals in parentheses represent a film thickness (unit: nm).

The numerals (98%:2%) represented by percentage in the same parentheses indicate a ratio (mass %) between the host material (compound BH1) and the compound BD1 in the first emitting layer. Alternatively, the numerals (98%:2%) represented by percentage in the same parentheses indicate a ratio (mass %) between the host material (compound BH2-8) and the compound BD1 in the second emitting layer. Similar notations apply to the description below.

Example 144

The organic EL device of Example 144 was manufactured in the same manner as that of Example 143 except that the compound BH2-8 (second host material) in the second emitting layer was replaced with the second compound shown in Table 46.

Comparative 117

The organic EL device of Comparative 117 was manufactured in the same manner as that of Example 143 except that a 25-nm-thick second emitting layer was formed on the second hole transporting layer without forming the first emitting layer as shown in Table 46, and the second compound (second host material) in the second emitting layer was replaced with the second compound shown in Table 46.

TABLE 46

| | First Emitting Layer | | | Second Emitting Layer | | | | | |
|---|---|---|---|---|---|---|---|---|---|
| | First Compound | Third Compound | Film Thickness [nm] | Second Compound | Fourth Compound | Film Thickness [nm] | Voltage [V] | EQE [%] | LT90 [hr] |
| Ex. 143 | BH1 | BD1 | 5 | BH2-8 | BD1 | 20 | 3.5 | 9.0 | 120 |
| Ex. 144 | BH1 | BD1 | 5 | BH2-29 | BD1 | 20 | 4.0 | 10.1 | 80 |
| Comp. 117 | — | — | — | BH2-29 | BD1 | 25 | 4.5 | 8.2 | 40 |

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Example 145

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT2 was vapor-deposited to form a 10-nm-thick second hole transporting layer (also referred to as an electron blocking layer (EBL)).

A compound 1BH-1 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD1 (dopant material (BD)) were co-deposited on the first emitting layer so that a ratio of the compound BD1 accounted for 2 mass %, thereby forming a 20-nm-thick second emitting layer.

A compound ET1 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 145 is roughly shown as follows.

ITO (130)/HA1 (5)/HT1 (80)/HT2 (10)/1BH-1:BD1 (5, 98%:2%)/BH2:BD1 (20, 98%:2%)/ET1 (10)/ET2 (15)/LiF (1)/Al (80)

Numerals in parentheses represent a film thickness (unit: nm).

The numerals (98%:2%) represented by percentage in the same parentheses indicate a ratio (mass %) between the host material (compound 1BH-1 or compound BH2) and the compound BD1 in the first emitting layer or the second emitting layer.

Comparative 118

The organic EL device according to Comparative 118 was manufactured in the same manner as that of Example 145 except that a 25-nm-thick first emitting layer was formed as the emitting layer and the first electron transporting layer was formed on the first emitting layer without forming the second emitting layer as shown in Table 47.

TABLE 47

| | First Emitting Layer | | | Second Emitting Layer | | | |
|---|---|---|---|---|---|---|---|
| | First Compound | Third Compound | Film Thickness [nm] | Second Compound | Fourth Compound | Film Thickness [nm] | EQE [%] |
| Ex. 145 | 1BH-1 | BD1 | 5 | BH2 | BD1 | 20 | 10.5 |
| Comp. 118 | 1BH-1 | BD1 | 25 | — | — | — | 7.5 |
| Comp. 2 | — | — | — | BH2 | BD1 | 25 | 9.9 |

<Manufacture 19 of Organic EL Device>

Example 146

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HA1 was vapor-deposited on a surface provided with the transparent electrode line to cover the transparent electrode, thereby forming a 5-nm-thick hole injecting layer (HI).

After the formation of the hole injecting layer, the compound HT1 was vapor-deposited to form an 80-nm-thick first hole transporting layer (HT).

After the formation of the first hole transporting layer, a compound HT2 was vapor-deposited to form a 10-nm-thick second hole transporting layer (also referred to as an electron blocking layer (EBL)).

A compound BH3-1 (first host material (BH)) and the compound BD2 (dopant material (BD)) were co-deposited on the second hole transporting layer so that a ratio of the compound BD2 accounted for 2 mass %, thereby forming a 5-nm-thick first emitting layer.

A compound BH3-2 (second host material (BH)) and the compound BD2 (dopant material (BD)) were co-deposited on the first emitting layer so that a ratio of the compound BD2 accounted for 2 mass %, thereby forming a 20-nm-thick second emitting layer.

A compound ET1 was vapor-deposited on the second emitting layer to form a 10-nm-thick first electron transporting layer (also referred to as a hole blocking layer (HBL)).

A compound ET2 was vapor-deposited on the first electron transporting layer to form a 15-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 146 is roughly shown as follows.

ITO (130)/HA1 (5)/HT1 (80)/HT2 (10)/BH3-1:BD2 (5, 98%:2%)/BH3-2:BD2 (20, 98%:2%)/ET1 (10)/ET2 (15)/LiF (1)/Al (80)

Numerals in parentheses represent a film thickness (unit: nm).

The numerals (98%:2%) represented by percentage in the same parentheses indicate a ratio (mass %) between the host material (compound BH3-1 or compound BH3-2) and the compound BD2 in the first emitting layer or the second emitting layer.

Comparative 119

The organic EL device according to Comparative 119 was manufactured in the same manner as that of Example 146 except that a 25-nm-thick first emitting layer was formed as the emitting layer and the first electron transporting layer was formed on the first emitting layer without forming the second emitting layer as shown in Table 48.

Comparative 120

The organic EL device according to Comparative 120 was manufactured in the same manner as that of Example 146 except that a 25-nm-thick second emitting layer was formed as the emitting layer on the second hole transporting layer without forming the first emitting layer as shown in Table 48.

TABLE 48

| | First Emitting Layer | | | | Second Emitting Layer | | | | | | |
|---|---|---|---|---|---|---|---|---|---|---|---|
| | First Compound | | Third | Film Thick- | Second Compound | | Fourth | Film Thick- | Drive | | |
| | Name | $T_1$ [ev] | Compound Name | ness [nm] | Name | $T_1$ [ev] | Compound Name | ness [nm] | Voltage [V] | EQE [%] | LT95 [h] |
| Ex. 146 | BH3-1 | 2.11 | BD2 | 5 | BH3-2 | 2.08 | BD2 | 20 | 3.4 | 9.5 | 200 |
| Comp. 119 | BH3-1 | 2.11 | BD2 | 25 | — | — | — | — | 3.8 | 8.2 | 92 |
| Comp. 120 | — | — | — | — | BH3-2 | 2.08 | BD2 | 25 | 3.4 | 7.1 | 125 |

Example 147

The organic EL device of Example 147 was manufactured in the same manner as that of Example 146 except that the compound BH3-1 (first host material) in the first emitting layer was replaced with the first compound shown in Table 49.

Comparative 121

The organic EL device of Comparative 121 was manufactured in the same manner as that of Comparative 119 except that the compound BH3-1 (first host material) in the first emitting layer was replaced with the first compound shown in Table 49.

TABLE 49

| | First Emitting Layer | | | | Second Emitting Layer | | | | | | |
|---|---|---|---|---|---|---|---|---|---|---|---|
| | First Compound | | Third | Film Thick- | Second Compound | | Fourth | Film Thick- | Drive | | |
| | Name | $T_1$ [ev] | Compound Name | ness [nm] | Name | $T_1$ [ev] | Compound Name | ness [nm] | Voltage [V] | EQE [%] | LT95 [h] |
| Ex. 147 | BH3-3 | 2.23 | BD2 | 5 | BH3-2 | 2.08 | BD2 | 20 | 3.5 | 9.1 | 230 |
| Comp. 121 | BH3-3 | 2.23 | BD2 | 25 | — | — | — | — | 3.6 | 6.8 | 52 |
| Comp. 120 | — | — | — | — | BH3-2 | 2.08 | BD2 | 25 | 3.4 | 7.1 | 125 |

Example 148

The organic EL device of Example 148 was manufactured in the same manner as that of Example 146 except that the compound BH3-1 (first host material) in the first emitting layer and the compound BH3-2 in the second emitting layer were replaced with the first compound and the second compound, respectively, shown in Table 50.

TABLE 50

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 148 | BH3-3 | 2.23 | BD2 | 5 | BH3-1 | 2.11 | BD2 | 20 | 3.3 | 10.1 | 170 |
| Comp. 121 | BH3-3 | 2.23 | BD2 | 25 | — | — | — | — | 3.6 | 6.8 | 52 |
| Comp. 119 | BH3-1 | 2.11 | BD2 | 25 | — | — | — | — | 3.8 | 8.2 | 92 |

Example 149

The organic EL device of Example 149 was manufactured in the same manner as that of Example 146 except that the compound BH3-1 (first host material) in the first emitting layer and the compound BH3-2 in the second emitting layer were replaced with the first compound and the second compound, respectively, shown in Table 51.

Comparative 122

The organic EL device of Comparative 122 was manufactured in the same manner as that of Comparative 119 except that the compound BH3-1 (first host material) in the first emitting layer was replaced with the first compound shown in Table 51.

Comparative 123

The organic EL device of Comparative 123 was manufactured in the same manner as that of Comparative 120 except that the compound BH3-2 (first host material) in the second emitting layer was replaced with the second compound shown in Table 51.

TABLE 51

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 149 | BH3-4 | 2.27 | BD2 | 5 | BH3-5 | 1.80 | BD2 | 20 | 3.2 | 10.5 | 165 |
| Comp. 122 | BH3-4 | 2.27 | BD2 | 25 | — | — | — | — | 3.4 | 6.2 | 103 |
| Comp. 123 | — | — | — | — | BH3-5 | 1.80 | BD2 | 25 | 4.0 | 8.8 | 140 |

Example 150

The organic EL device of Example 150 was manufactured in the same manner as that of Example 146 except that the compound BH3-1 (first host material) in the first emitting layer was replaced with the first compound shown in Table 52.

TABLE 52

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 150 | BH3-4 | 2.27 | BD2 | 5 | BH3-2 | 2.08 | BD2 | 20 | 3.4 | 9.5 | 205 |
| Comp. 122 | BH3-4 | 2.27 | BD2 | 25 | — | — | — | — | 3.4 | 6.2 | 103 |
| Comp. 120 | — | — | — | — | BH3-2 | 2.08 | BD2 | 25 | 3.4 | 7.1 | 125 |

Example 151

The organic EL device of Example 151 was manufactured in the same manner as that of Example 146 except that the compound BH3-1 (first host material) in the first emitting layer and the compound BH3-2 in the second emitting layer were respectively replaced with the first compound and the second compound shown in Table 53.

TABLE 53

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 151 | BH3-4 | 2.27 | BD2 | 5 | BH3-1 | 2.11 | BD2 | 20 | 3.3 | 9.9 | 180 |
| Comp. 122 | BH3-4 | 2.27 | BD2 | 25 | — | — | — | — | 3.4 | 6.2 | 103 |
| Comp. 119 | BH3-1 | 2.11 | BD2 | 25 | — | — | — | — | 3.8 | 8.2 | 92 |

Example 152

The organic EL device of Example 152 was manufactured in the same manner as that of Example 146 except that the compound BH3-1 (first host material) in the first emitting layer and the compound BH3-2 in the second emitting layer were respectively replaced with the first compound and the second compound shown in Table 54.

Comparative 124

The organic EL device of Comparative 124 was manufactured in the same manner as that of Comparative 119 except that the compound BH3-1 (first host material) in the first emitting layer was replaced with the first compound shown in Table 54.

TABLE 54

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 152 | BH3-6 | 2.35 | BD2 | 5 | BH3-5 | 1.80 | BD2 | 20 | 3.5 | 10.0 | 175 |
| Comp. 124 | BH3-6 | 2.35 | BD2 | 25 | — | — | — | — | 4.2 | 4.5 | 21 |
| Comp. 123 | — | — | — | — | BH3-5 | 1.80 | BD2 | 25 | 4.0 | 8.8 | 140 |

Example 153

The organic EL device of Example 153 was manufactured in the same manner as that of Example 146 except that the compound BH3-1 (first host material) in the first emitting layer was replaced with the first compound shown in Table 55.

TABLE 55

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 153 | BH3-6 | 2.35 | BD2 | 5 | BH3-2 | 2.08 | BD2 | 20 | 3.6 | 9.2 | 210 |
| Comp. 124 | BH3-6 | 2.35 | BD2 | 25 | — | — | — | — | 4.2 | 4.5 | 21 |
| Comp. 120 | — | — | — | — | BH3-2 | 2.08 | BD2 | 25 | 3.4 | 7.1 | 125 |

Example 154

The organic EL device of Example 154 was manufactured in the same manner as that of Example 146 except that the compound BH3-1 (first host material) in the first emitting layer and the compound BH3-2 in the second emitting layer were respectively replaced with the first compound and the second compound shown in Table 56.

TABLE 56

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [h] |
| Ex. 154 | BH3-6 | 2.35 | BD2 | 5 | BH3-1 | 2.11 | BD2 | 20 | 3.6 | 9.8 | 190 |
| Comp. 124 | BH3-6 | 2.35 | BD2 | 25 | — | — | — | — | 4.2 | 4.5 | 21 |
| Comp. 119 | BH3-1 | 2.11 | BD2 | 25 | — | — | — | — | 3.8 | 8.2 | 92 |

Example 155

The organic EL device of Example 155 was manufactured in the same manner as that of Example 146 except that the compound BH3-1 (first host material) in the first emitting layer and the compound BH3-2 in the second emitting layer were respectively replaced with the first compound and the second compound shown in Table 57.

Comparative 125

The organic EL device of Comparative 125 was manufactured in the same manner as that of Comparative 120 except that the compound BH3-2 (second host material) in the second emitting layer was replaced with the second compound shown in Table 57.

TABLE 57

| | First Emitting Layer | | | | Second Emitting Layer | | | | | | | | |
|---|---|---|---|---|---|---|---|---|---|---|---|---|---|
| | First Compound | | Third | Film | Second Compound | | Fourth | Film | Drive | | | | |
| | Name | $T_1$ [ev] | Compound Name | Thickness [nm] | Name | $T_1$ [ev] | Compound Name | Thickness [nm] | Voltage [V] | CIE-x | CIE-y | λp [nm] | EQE [%] |
| Ex. 155 | BH3-7 | 2.20 | BD1 | 5 | BH2 | 1.87 | BD1 | 20 | 3.48 | 0.135 | 0.104 | 460 | 10.4 |
| Comp. 125 | — | — | — | — | BH2 | 1.87 | BD1 | 25 | 3.61 | 0.134 | 0.104 | 460 | 9.9 |

Manufacture 20 of Organic EL Device

Organic EL devices were manufactured and evaluated as follows.

Example 156

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. A compound HT5 and a compound HA2 were co-deposited on a surface provided with the transparent electrode line to cover the transparent electrode, thereby forming a 10-nm-thick hole injecting layer (HI). The compound HT5 and the compound HA2 accounted in ratio for 97 mass % and 3 mass %, respectively, in the hole injecting layer.

After the formation of the hole injecting layer, the compound HT5 was vapor-deposited to form an 80-nm-thick first hole transporting layer (HT).

After the formation of the first hole transporting layer, the compound HT4 was vapor-deposited to form a 5-nm-thick second hole transporting layer (also referred to as an electron blocking layer (EBL)).

A compound BH4-1 (first host material (BH)) and the compound BD2 (dopant material (BD)) were co-deposited on the second hole transporting layer so that a ratio of the compound BD2 accounted for 2 mass %, thereby forming a 5-nm-thick first emitting layer.

A compound BH2-19 (second host material (BH)) and a compound BD4 (dopant material (BD)) were co-deposited on the first emitting layer so that a ratio of the compound BD4 accounted for 2 mass %, thereby forming a 15-nm-thick second emitting layer.

The compound ET3 was vapor-deposited on the second emitting layer to form a 5-nm-thick first electron transporting layer (also referred to as a hole blocking layer (HBL)).

The compound ET8 and the compound Liq were co-deposited on the first electron transporting layer (HBL) to form a 25-nm-thick electron transporting layer (ET). The compound ET8 and the compound Liq accounted in ratio for 50 mass % and 50 mass %, respectively, in the electron transporting layer (ET). Liq is an abbreviation of (8-quinolinolato)lithium ((8-Quinolinolato)lithium).

Liq was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device in Example 156 is roughly shown as follows.

ITO (130)/HT5:HA2 (10, 97%:3%)/HT5 (80)/HT4 (5)/BH4-1:BD2 (5, 98%:2%)/BH2-19:BD4 (15, 98%:2%)/ET3 (5)/ET8:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT5 and the compound HA2 in the hole injecting layer. The numerals (98%:2%) represented by percentage in the same parentheses indicate a ratio (mass %) between the host material (compound BH4-1 or BH2-19) and the dopant material (compound BD2 or BD4) in the first emitting layer or the second emitting layer. The numerals (50%:50%) represented by percentage in the same parentheses indicate a ratio (mass %) between the compound ET8 and the compound Liq in the electron transporting layer (ET). Similar notations apply to the description below.

Reference Examples 1 and 2

The organic EL device of Reference Example 1 was manufactured in the same manner as that of Example 156 except that the compound BD4 in the second emitting layer was replaced with the fourth compound shown in Table 58.

The organic EL device of Reference Example 2 was manufactured in the same manner as that of Example 156 except that the compound BD2 in the first emitting layer was replaced with the third compound shown in Table 58.

Comparative 126

The organic EL device according to Comparative 126 was manufactured in the same manner as that of Example 156 except that a 20-nm-thick first emitting layer was formed as the emitting layer and the first electron transporting layer was formed on the first emitting layer without forming the second emitting layer as shown in Table 58.

Comparative 127

The organic EL device according to Comparative 127 was manufactured in the same manner as that of Example 156 except that a 20-nm-thick second emitting layer was formed as the emitting layer on the second hole transporting layer without forming the first emitting layer as shown in Table 58.

TABLE 58

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT90 [hr] |
| Ex. 156 | BH4-1 | 2.09 | BD2 | 5 | BH2-19 | 1.86 | BD4 | 15 | 3.6 | 11.4 | 195 |
| Ref. 1 | BH4-1 | 2.09 | BD2 | 5 | BH2-19 | 1.86 | BD2 | 15 | 3.6 | 11.0 | 200 |
| Ref. 2 | BH4-1 | 2.09 | BD4 | 5 | BH2-19 | 1.86 | BD4 | 15 | 3.6 | 11.4 | 180 |
| Comp. 126 | BH4-1 | 2.09 | BD2 | 20 | — | — | — | — | 3.4 | 6.5 | 100 |
| Comp. 127 | — | — | — | — | BH2-19 | 1.86 | BD4 | 20 | 3.6 | 10.6 | 145 |

Manufacture 21 of Organic EL Device

Organic EL devices were manufactured and evaluated as follows.

Example 157

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. The compound HT1 and the compound HA2 were co-deposited on a surface provided with the transparent electrode line to cover the transparent electrode, thereby forming a 10-nm-thick hole injecting layer (HI). The ratios of the compound HT1 and the compound HA2 in the hole injecting layer were 97 mass % and 3 mass %, respectively.

After the formation of the hole injecting layer, the compound HT1 was vapor-deposited to form an 80-nm-thick first hole transporting layer (HT).

After the formation of the first hole transporting layer, the compound HT6 was vapor-deposited to form a 10-nm-thick second hole transporting layer (also referred to as an electron blocking layer (EBL)).

The compound BH1 (first host material (BH)) and the compound BD1 (dopant material (BD)) were co-deposited on the second hole transporting layer so that a ratio of the compound BD1 accounted for 2 mass %, thereby forming a 5-nm-thick first emitting layer.

The compound BH2 (second host material (BH)) and the compound BD5 (dopant material (BD)) were co-deposited on the first emitting layer so that a ratio of the compound BD5 accounted for 2 mass %, thereby forming a 20-nm-thick second emitting layer.

The compound ET7 was vapor-deposited on the second emitting layer to form a 10-nm-thick first electron transporting layer (also referred to as a hole blocking layer (HBL)).

The compound ET9 was vapor-deposited on the first electron transporting layer to form a 25-nm-thick second electron transporting layer (ET).

LiF was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 157 is roughly shown as follows.

ITO (130)/HT1:HA2 (10, 97%:3%)/HT1 (80)/HT6 (10)/BH1:BD1 (5, 98%:2%)/BH2:BD5 (20, 98%:2%)/ET7 (10)/ET9 (25)/LiF (1)/Al (80)

Numerals in parentheses represent a film thickness (unit: nm).

The numerals (97%:3%) represented by percentage in the same parentheses indicate a ratio (mass %) between the compound HT1 and the compound HA2 in the hole injecting layer. The numerals (98%:2%) represented by percentage in the same parentheses indicate a ratio (mass %) between the host material (compound BH1 or BH2) and the dopant material (compound BD1 or BD5) in each of the first emitting layer and the second emitting layer. Similar notations apply to the description below.

Reference Examples 3 and 4

The organic EL device of Reference Example 3 was manufactured in the same manner as that of Example 157 except that the compound BD5 in the second emitting layer was replaced with the fourth compound shown in Table 59.

The organic EL device of Reference Example 4 was manufactured in the same manner as that of Example 157 except that the compound BD1 in the first emitting layer was replaced with the third compound shown in Table 59.

Comparative 128

The organic EL device according to Comparative 128 was manufactured in the same manner as that of Example 157 except that a 25-nm-thick first emitting layer was formed as the emitting layer and the first electron transporting layer was formed on the first emitting layer without forming the second emitting layer as shown in Table 59.

Comparative 129

The organic EL device according to Comparative 129 was manufactured in the same manner as that of Example 157 except that a 25-nm-thick second emitting layer was formed as the emitting layer on the second hole transporting layer without forming the first emitting layer as shown in Table 59.

TABLE 59

| | First Emitting Layer | | | | Second Emitting Layer | | | | | | |
|---|---|---|---|---|---|---|---|---|---|---|---|
| | First Compound | | Third | Film | Second Compound | | Fourth | Film | Drive | | |
| | Name | $T_1$ [ev] | Compound Name | Thickness [nm] | Name | $T_1$ [ev] | Compound Name | Thickness [nm] | Voltage [V] | EQE [%] | LT95 [hr] |
| Ex. 157 | BH1 | 2.10 | BD1 | 5 | BH2 | 1.87 | BD5 | 20 | 3.6 | 11.6 | 205 |
| Ref. 3 | BH1 | 2.10 | BD1 | 5 | BH2 | 1.87 | BD1 | 20 | 3.6 | 11.7 | 200 |
| Ref. 4 | BH1 | 2.10 | BD5 | 5 | BH2 | 1.87 | BD5 | 20 | 3.5 | 9.1 | 60 |
| Comp. 128 | BH1 | 2.10 | BD1 | 25 | — | — | — | — | 3.3 | 6.8 | 25 |
| Comp. 129 | — | — | — | — | BH2 | 1.87 | BD5 | 25 | 3.8 | 9.8 | 150 |

<Manufacture 22 of Organic EL Device>

Organic EL devices were manufactured and evaluated as follows.

Example 158

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. The compound HT9 and the compound HA2 were co-deposited on a surface provided with the transparent electrode line to cover the transparent electrode, thereby forming a 5-nm-thick hole injecting layer (HI). The compound HT9 and the compound HA2 accounted in ratio for 97 mass % and 3 mass %, respectively, in the hole injecting layer.

After the formation of the hole injecting layer, the compound HT9 was vapor-deposited to form an 85-nm-thick first hole transporting layer (HT).

After the formation of the first hole transporting layer, the compound HT8 was vapor-deposited to form a 5-nm-thick second hole transporting layer (also referred to as an electron blocking layer (EBL)).

A compound BH4-1 (first host material (BH)) and the compound BD6 (dopant material (BD)) were co-deposited on the second hole transporting layer so that a ratio of the compound BD6 accounted for 2 mass %, thereby forming a 10-nm-thick first emitting layer.

A compound BH2-19 (second host material (BH)) and a compound BD2 (dopant material (BD)) were co-deposited on the first emitting layer so that a ratio of the compound BD2 accounted for 2 mass %, thereby forming a 10-nm-thick second emitting layer.

The compound ET3 was vapor-deposited on the second emitting layer to form a 5-nm-thick first electron transporting layer (also referred to as a hole blocking layer (HBL)).

The compound ET8 and the compound Liq were co-deposited on the first electron transporting layer (HBL) to form a 25-nm-thick electron transporting layer (ET). The compound ET8 and the compound Liq accounted in ratio for 50 mass % and 50 mass %, respectively, in the electron transporting layer (ET). Liq is an abbreviation of (8-quinolinolato)lithium ((8-Quinolinolato)lithium).

Liq was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 158 is roughly shown as follows.

ITO (130)/HT9:HA2 (5, 97%:3%)/HT9 (85)/HT8 (5)/BH4-1:BD6 (10, 98%:2%)/BH2-19:BD2 (10, 98%:2%)/ET3 (5)/ET8:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT9 and the compound HA2 in the hole injecting layer. The numerals (98%:2%) represented by percentage in the same parentheses indicate a ratio (mass %) between the host material (compound BH4-1 or BH2-19) and the dopant material (compound BD6 or BD2) in the first emitting layer or the second emitting layer. The numerals (50%:50%) represented by percentage in the same parentheses indicate a ratio (mass %) between the compound ET8 and the compound Liq in the electron transporting layer (ET). Similar notations apply to the description below.

Examples 159 and 160

The organic EL device of Example 159 was manufactured in the same manner as that of Example 158 except that the compound BD2 in the second emitting layer was replaced with the fourth compound shown in Table 60.

The organic EL device of Example 160 was manufactured in the same manner as that of Example 158 except that the compound BD2 in the second emitting layer was replaced with the fourth compound shown in Table 60.

Reference Example 5

The organic EL device of Reference Example 5 was manufactured in the same manner as that of Example 158 except that the compound BD2 in the second emitting layer was replaced with the fourth compound shown in Table 60.

Comparative 130

The organic EL device according to Comparative 130 was manufactured in the same manner as that of Example 158 except that a 20-nm-thick first emitting layer was formed as the emitting layer and the first electron transporting layer was formed on the first emitting layer without forming the second emitting layer as shown in Table 60.

TABLE 60

| | First Emitting Layer | | | | Second Emitting Layer | | | | Device Evaluation Result | | |
|---|---|---|---|---|---|---|---|---|---|---|---|
| | First Compound | | Third Compound | Film | Second Compound | | Fourth Compound | Film | | | |
| | Compound Name | $T_1$ [eV] | Compound Name | Thickness [nm] | Compound Name | $T_1$ [eV] | Compound Name | Thickness [nm] | EQE [%] | LT95 [hr] | CIEy |
| Ex. 158 | BH4-1 | 2.09 | BD6 | 10 | BH2-19 | 1.86 | BD2 | 10 | 10.1 | 235 | 0.077 |
| Ex. 159 | BH4-1 | 2.09 | BD6 | 10 | BH2-19 | 1.86 | BD7 | 10 | 10.4 | 250 | 0.082 |
| Ex. 160 | BH4-1 | 2.09 | BD6 | 10 | BH2-19 | 1.86 | BD8 | 10 | 10.2 | 227 | 0.065 |
| Ref. 5 | BH4-1 | 2.09 | BD6 | 10 | BH2-19 | 1.86 | BD6 | 10 | 9.9 | 250 | 0.069 |
| Comp. 130 | BH4-1 | 2.09 | BD6 | 20 | — | — | — | — | 9.7 | 142 | 0.059 |

Examples 161 to 163

The organic EL device of each of Examples 161 to 163 was manufactured in the same manner as that of Example 158 except that the third compound in the first emitting layer and the fourth compound in the second emitting layer were replaced as shown in Table 61.

Reference Example 6

The organic EL device of Reference Example 6 was manufactured in the same manner as that of Example 158 except that the third compound in the first emitting layer and the fourth compound in the second emitting layer were replaced as shown in Table 61.

Comparative 131

The organic EL device according to Comparative 131 was manufactured in the same manner as that of Example 161 except that a 20-nm-thick first emitting layer was formed as the emitting layer and the first electron transporting layer was formed on the first emitting layer without forming the second emitting layer as shown in Table 61.

TABLE 61

| | First Emitting Layer | | | | Second Emitting Layer | | | | Device Evaluation Result | | |
|---|---|---|---|---|---|---|---|---|---|---|---|
| | First Compound | | Third Compound | Film | Second Compound | | Fourth Compound | Film | | | |
| | Compound Name | $T_1$ [eV] | Compound Name | Thickness [nm] | Compound Name | $T_1$ [eV] | Compound Name | Thickness [nm] | EQE [%] | LT95 [hr] | CIEy |
| Ex. 161 | BH4-1 | 2.09 | BD2 | 10 | BH2-19 | 1.86 | BD6 | 10 | 10.4 | 300 | 0.082 |
| Ex. 162 | BH4-1 | 2.09 | BD2 | 10 | BH2-19 | 1.86 | BD7 | 10 | 10.7 | 320 | 0.092 |
| Ex. 163 | BH4-1 | 2.09 | BD2 | 10 | BH2-19 | 1.86 | BD8 | 10 | 10.6 | 320 | 0.079 |
| Ref. 6 | BH4-1 | 2.09 | BD2 | 10 | BH2-19 | 1.86 | BD2 | 10 | 10.5 | 270 | 0.090 |
| Comp. 131 | BH4-1 | 2.09 | BD2 | 20 | — | — | — | — | 10.3 | 129 | 0.082 |

Examples 164 to 166

The organic EL device of each of Examples 164 to 166 was manufactured in the same manner as that of Example 158 except that the third compound in the first emitting layer and the fourth compound in the second emitting layer were replaced as shown in Table 62.

Reference Example 7

The organic EL device of Reference Example 7 was manufactured in the same manner as that of Example 158 except that the third compound in the first emitting layer and the fourth compound in the second emitting layer were replaced as shown in Table 62.

Comparative 132

The organic EL device according to Comparative 132 was manufactured in the same manner as that of Example 164 except that a 20-nm-thick first emitting layer was formed as the emitting layer and the first electron transporting layer was formed on the first emitting layer without forming the second emitting layer as shown in Table 62.

TABLE 62

| | First Emitting Layer | | | | Second Emitting Layer | | | | Device Evaluation Result | | |
|---|---|---|---|---|---|---|---|---|---|---|---|
| | First Compound | | Third Compound | Film | Second Compound | | Fourth Compound | Film | | | |
| | Compound Name | $T_1$ [eV] | Compound Name | Thickness [nm] | Compound Name | $T_1$ [eV] | Compound Name | Thickness [nm] | EQE [%] | LT95 [hr] | CIEy |
| Ex. 164 | BH4-1 | 2.09 | BD7 | 10 | BH2-19 | 1.86 | BD6 | 10 | 11.4 | 400 | 0.100 |
| Ex. 165 | BH4-1 | 2.09 | BD7 | 10 | BH2-19 | 1.86 | BD2 | 10 | 11.5 | 400 | 0.104 |
| Ex. 166 | BH4-1 | 2.09 | BD7 | 10 | BH2-19 | 1.86 | BD8 | 10 | 11.6 | 400 | 0.097 |
| Ref. 7 | BH4-1 | 2.09 | BD7 | 10 | BH2-19 | 1.86 | BD7 | 10 | 11.6 | 400 | 0.107 |
| Comp. 132 | BH4-1 | 2.09 | BD7 | 20 | — | — | — | — | 10.6 | 225 | 0.092 |

Examples 167 to 169

The organic EL device of each of Examples 167 to 169 was manufactured in the same manner as that of Example 158 except that the third compound in the first emitting layer and the fourth compound in the second emitting layer were replaced as shown in Table 63.

Reference Example 8

The organic EL device of Reference Example 8 was manufactured in the same manner as that of Example 158 except that the third compound in the first emitting layer and the fourth compound in the second emitting layer were replaced as shown in Table 63.

Comparative 133

The organic EL device according to Comparative 133 was manufactured in the same manner as that of Example 167 except that a 20-nm-thick first emitting layer was formed as the emitting layer and the first electron transporting layer was formed on the first emitting layer without forming the second emitting layer as shown in Table 63.

TABLE 63

| | First Emitting Layer | | | | Second Emitting Layer | | | | Device Evaluation Result | | |
|---|---|---|---|---|---|---|---|---|---|---|---|
| | First Compound | | Third Compound | Film | Second Compound | | Fourth Compound | Film | | | |
| | Compound Name | $T_1$ [eV] | Compound Name | Thickness [nm] | Compound Name | $T_1$ [eV] | Compound Name | Thickness [nm] | EQE [%] | LT95 [hr] | CIEy |
| Ex. 167 | BH4-1 | 2.09 | BD8 | 10 | BH2-19 | 1.86 | BD6 | 10 | 10.0 | 191 | 0.065 |
| Ex. 168 | BH4-1 | 2.09 | BD8 | 10 | BH2-19 | 1.86 | BD2 | 10 | 10.3 | 170 | 0.078 |
| Ex. 169 | BH4-1 | 2.09 | BD8 | 10 | BH2-19 | 1.86 | BD7 | 10 | 10.5 | 189 | 0.085 |
| Ref. 8 | BH4-1 | 2.09 | BD8 | 10 | BH2-19 | 1.86 | BD8 | 10 | 10.3 | 160 | 0.064 |
| Comp. 133 | BH4-1 | 2.09 | BD8 | 20 | — | — | — | — | 9.7 | 28 | 0.053 |

<Manufacture 23 of Organic EL Device>

Organic EL devices were manufactured and evaluated as follows.

Example 170

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

The cleaned glass substrate having the transparent electrode line was attached to a substrate holder of a vacuum deposition apparatus. The compound HT10 and the compound HA2 were co-deposited on a surface provided with the transparent electrode line to cover the transparent electrode, thereby forming a 10-nm-thick hole injecting layer (HI). The compound HT10 and the compound HA2 accounted in ratio for 97 mass % and 3 mass %, respectively, in the hole injecting layer.

After the formation of the hole injecting layer, the compound HT10 was vapor-deposited to form an 80-nm-thick first hole transporting layer (HT).

After the formation of the first hole transporting layer, the compound HT4 was vapor-deposited to form a 5-nm-thick second hole transporting layer (also referred to as an electron blocking layer (EBL)).

A compound BH5 (first host material (BH)) and the compound BD2 (dopant material (BD)) were co-deposited on the second hole transporting layer so that a ratio of the compound BD2 accounted for 2 mass %, thereby forming a 5-nm-thick first emitting layer.

The compound BH7 (second host material (BH)) and the compound BD5 (dopant material (BD)) were co-deposited on the first emitting layer so that a ratio of the compound BD5 accounted for 2 mass %, thereby forming a 15-nm-thick second emitting layer.

The compound ET3 was vapor-deposited on the second emitting layer to form a 5-nm-thick first electron transporting layer (also referred to as a hole blocking layer (HBL)).

The compound ET7 and the compound Liq were co-deposited on the first electron transporting layer (HBL) to form a 25-nm-thick electron transporting layer (ET). The compound ET7 and the compound Liq accounted in ratio for 50 mass % and 50 mass %, respectively, in the electron transporting layer (ET).

was formed on the first emitting layer without forming the second emitting layer as shown in Table 64.

Comparative 135

The organic EL device according to Comparative 135 was manufactured in the same manner as that of Example 170 except that the first emitting layer was not formed and a 20-nm-thick second emitting layer was formed as the emitting layer on the second hole transporting layer with a ratio of the compound BH7 as the second compound being 96 mass % and a ratio of the compound BD5 as the fourth compound being 4 mass % as shown in Table 64.

TABLE 64

| | First Emitting Layer | | | | Second Emitting Layer | | | | | | |
|---|---|---|---|---|---|---|---|---|---|---|---|
| | First Compound | | Third Compound | Film | Second Compound | | Fourth Compound | Film | Device Evaluation Result | | |
| | Compound Name | $T_1$ [eV] | Compound Name | Thickness [nm] | Compound Name | $T_1$ [eV] | Compound Name | Thickness [nm] | Voltage [V] | EQE [%] | LT90 [hr] |
| Ex. 170 | BH5 | 2.04 | BD2 | 5 | BH7 | 1.80 | BD5 | 15 | 3.8 | 11.3 | 190 |
| Comp. 134 | BH5 | 2.04 | BD2 | 20 | — | — | — | — | 3.7 | 8.9 | 95 |
| Comp. 135 | — | — | — | — | BH7 | 1.80 | BD5 | 20 | 3.8 | 9.5 | 180 |

The compound Liq was vapor-deposited on the second electron transporting layer to form a 1-nm-thick electron injecting layer.

Metal aluminum (Al) was vapor-deposited on the electron injecting layer to form an 80-nm-thick cathode.

A device arrangement of the organic EL device of Example 170 is roughly shown as follows.

ITO (130)/HT10:HA2 (10, 97%:3%)/HT10 (80)/HT4 (5)/BH5:BD2 (5, 98%:2%)/BH7:BD5 (15, 98%:2%)/ET3 (5)/ET7:Liq (25, 50%:50%)/Liq (1)/Al (80)

Numerals in parentheses represent a film thickness (unit: nm).

The numerals (97%:3%) represented by percentage in the same parentheses indicate a ratio (mass %) between the compound HT10 and the compound HA2 in the hole injecting layer. The numerals (98%:2%) represented by percentage in the same parentheses indicate a ratio (mass %) between the host material (compound BH5 or BH7) and the dopant material (compound BD2 or BD5) in the first emitting layer or the second emitting layer. The numerals (50%:50%) represented by percentage in the same parentheses indicate a ratio (mass %) between the compound ET7 and the compound Liq in the electron transporting layer (ET). Similar notations apply to the description below.

Comparative 134

The organic EL device according to Comparative 134 was manufactured in the same manner as that of Example 170 except that a 20-nm-thick first emitting layer was formed as the emitting layer and the first electron transporting layer <Evaluation Method of Compounds>Triplet Energy $T_1$ A measurement target compound was dissolved in EPA (diethylether:isopentane:ethanol=5:5:2 in volume ratio) at a concentration of 10 μmol/L, and the obtained solution was encapsulated in a quartz cell to provide a measurement sample. A phosphorescence spectrum (ordinate axis: phosphorescence intensity, abscissa axis: wavelength) of the measurement sample was measured at a low temperature (77K). A tangent was drawn to the rise of the phosphorescence spectrum close to the short-wavelength region. An energy amount was calculated by a conversion equation (F1) below on a basis of a wavelength value λedge [nm] at an intersection of the tangent and the abscissa axis. The calculated energy amount was defined as triplet energy $T_1$. It should be noted that the triplet energy $T_1$ has an error of about plus or minus 0.02 eV depending on measurement conditions.

$$T_1\,[\text{eV}]=1239.85/\lambda\text{edge} \qquad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength region of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted in the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) was used.

Singlet Energy $S_1$

A toluene solution in which a measurement target compound was dissolved at a concentration of 10 μmol/L was prepared and was put into a quartz cell to provide a measurement sample. Absorption spectrum (ordinate axis: absorption intensity, abscissa axis: wavelength) of the sample was measured at normal temperature (300K). A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate the singlet energy.

$$S_1\ [\text{eV}]=1239.85/\lambda_{edge} \qquad \text{Conversion Equation (F2)}$$

A spectrophotometer (U3310 manufactured by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The maximum absorbance of 0.2 or less is not counted as the above-mentioned local maximum absorbance closest to the long-wavelength region.

Measurement values of a singlet energy $S_1$ and a triplet energy $T_1$ of each of the compounds BH1, BH2, BH2-3 and BH4 are shown in Tables. Measurement values of a triplet energy $T_1$ of each of the compounds BH4-1, BH2-19, BH5 and BH7 are shown in Tables.

A singlet energy $S_1$ and a triplet energy $T_1$ of each of the compounds BD1, BD2, BD3, BD4, BDS, BD6, BD7 and BD8 are shown in Table 65.

Stokes Shift (SS) (nm)

A measurement target compound was dissolved in toluene at a concentration of $2.0\times10^{-5}$ mol/L to prepare a measurement sample. The measurement sample was put into a quartz cell and was irradiated with continuous light falling within an ultraviolet-to-visible region at a room temperature (300K) to measure an absorption spectrum (ordinate axis: absorbance, abscissa axis: wavelength). A spectrophotometer U-3900/3900H manufactured by Hitachi High-Tech Science Corporation was used for the absorption spectrum measurement. Moreover, a measurement target compound was dissolved in toluene at a concentration of $4.9\times10^{-6}$ mol/L to prepare a measurement sample. The measurement sample was put into a quartz cell and was irradiated with excited light at a room temperature (300K) to measure fluorescence spectrum (ordinate axis: fluorescence intensity, abscissa axis: wavelength). A spectrophotofluorometer F-7000 manufactured by Hitachi High-Tech Science Corporation was used for the fluorescence spectrum measurement.

A difference between an absorption local-maximum wavelength and a fluorescence local-maximum wavelength was calculated from the absorption spectrum and the fluorescence spectrum to obtain a Stokes shift (SS). A unit of the Stokes shift (SS) was denoted by nm.

A Stokes shift (SS) of the compound BD1 was 14 nm.

Preparation of Toluene Solution

A toluene solution of the compound BD1 (measurement sample) in which the compound BD1 was dissolved at a concentration of 5 μmol/L was prepared. Toluene solutions of the compounds BD2, BD3, BD4, BDS, BD6, BD7 and BD8 (measurement samples) were prepared in the same manner as the above.

Measurement of Maximum Fluorescence Peak Wavelength (FL-peak)

The prepared toluene solution was put into a quartz cell. The measurement sample in the quartz cell was irradiated with exciting light at normal temperature (300K) using a fluorescence spectrum measurement device (spectrophotofluorometer F-7000 manufactured by Hitachi High-Tech Science Corporation). The maximum fluorescence peak wavelength of the toluene solution of the compound BD1 when excited at 390 nm was measured. The maximum fluorescence peak wavelength of each of the toluene solutions of the compounds BD2, BD3, BD4, BDS, BD6, BD7 and BD8 was measured in the same manner as that of the compound BD1. Measurement results of the maximum fluorescence peak wavelength are shown in Table 65.

TABLE 65

| | $S_1$ [eV] | $T_1$ [eV] | Maximum Fluorescence Peak Wavelength |
|---|---|---|---|
| BD1 | 2.73 | 2.29 | 453 |
| BD2 | 2.73 | 2.29 | 455 |
| BD3 | 2.77 | 2.27 | 451 |
| BD4 | 2.80 | 2.29 | 449 |
| BD5 | 2.78 | 1.97 | 456 |
| BD6 | 2.74 | 2.65 | 459 |
| BD7 | 2.74 | 2.30 | 460 |
| BD8 | 2.75 | 2.56 | 456 |

The invention claimed is:

1. An organic electroluminescence device comprising:

a first emitting layer and a second emitting layer, wherein the first emitting layer comprises a first host material and a first dopant material, the second emitting layer comprises a second host material and a second dopant material, the first host material and the second host material are different from each other, the first dopant material is a compound having a maximum peak wavelength of 500 nm or less, the second dopant material is a compound having a maximum peak wavelength of 500 nm or less, the first dopant material and the second dopant material are different from each other, and a triplet energy $T_1(H1)$ of the first host material and a triplet energy $T_1(H2)$ of the second host material satisfy a relationship of a numerical formula (Numerical Formula 1) below, $$T_1(H1)>T_1(H2) \quad \text{(Numerical Formula 1)}$$

wherein the triplet energy $T_1(H1)$ of the first host material and a triplet energy $T_1(D1)$ of the first dopant material satisfy a relationship of a numerical formula (Numerical Formula 2A) below, $$T_1(D1)>T_1(H1) \quad \text{(Numerical Formula 2A),}$$

wherein the first host material is a compound represented by a formula (1), (1X), (12X), (13X), (14X) or (15X)

(1)

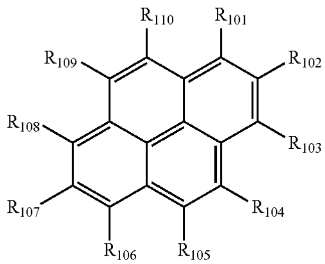

(11)

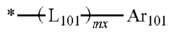

where in the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by a formula (11) above;

at least one combination of adjacent two or more of $R_{101}$ to $R_{110}$ are optionally bonded to form a ring;

at least one of $R_{101}$ to $R_{110}$ is the group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5;

when two or more $L_{101}$ are present, two or more $L_{101}$ are mutually the same or different;

when two or more $Ar_{101}$ are present, two or more $Ar_{101}$ are mutually the same or different; and

* in the formula (11) represents a bonding position to a pyrene ring in the formula (1), (1X)

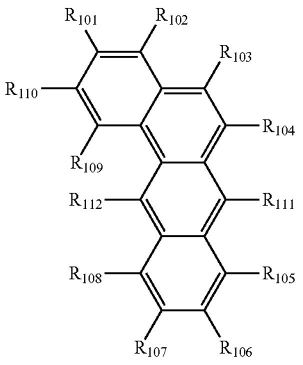

(11X)

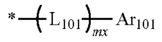

where in the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O) R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by a formula (11X) above;

at least one combination of adjacent two or more of $R_{101}$ to $R_{110}$ are optionally bonded to form a ring;

at least one of $R_{101}$ to $R_{112}$ is the group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4 or 5;

when two or more $L_{101}$ are present, two or more $L_{101}$ are mutually the same or different;

when two or more $Ar_{101}$ are present, two or more $Ar_{101}$ are mutually the same or different; and

* in the formula (11X) represents a bonding position to a benz[a]anthracene ring in the formula (1X), (12X)

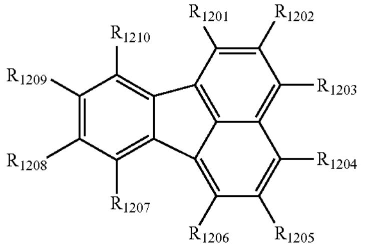

(121)

$$*-(L_{1201})_{mx2}-Ar_{1201}$$

where in the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ neither forming the substituted or unsubstituted monocyclic ring nor forming the substituted or unsubstituted fused ring each independently represent a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by the formula (121);

a substituent for substituting the substituted or unsubstituted monocyclic ring, a substituent for substituting a substituted or unsubstituted fused ring, and at least one of $R_{1201}$ to $R_{1210}$ are the group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms; and $Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X), (13X)

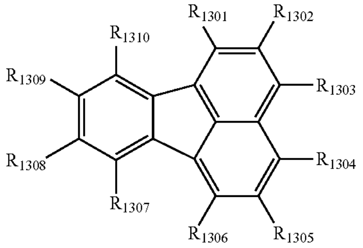

(131)

$$*-(L_{1301})_{mx3}-Ar_{1301}$$

where in the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is the group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, two or more $Ar_{1301}$ are mutually the same or different; and

* in the formula (131) represents a bonding position to a fluoranthene ring in the formula (13X), (14X)

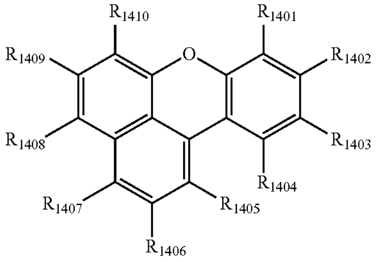

-continued (141)

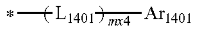

where in the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(═O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one combination of adjacent two or more of $R_{1401}$ to $R_{1410}$ are optionally bonded to form a ring;

at least one of $R_{1401}$ to $R_{1410}$ is the group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X), (15X)

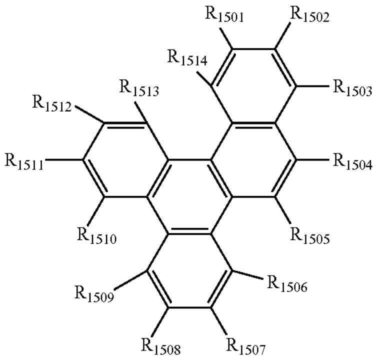

(151)

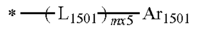

where in the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(═O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one combination of adjacent two or more of $R_{1501}$ to $R_{1514}$ are optionally bonded to form a ring;

at least one of $R_{1501}$ to $R_{1514}$ is the group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X), wherein the second host material is a compound represented by a formula (2), (2)

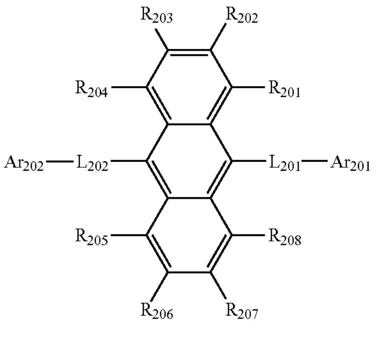

where in the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ to $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms, in the first host material and the second host material, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different, the first dopant material and the second dopant material are each independently at least one compound selected from the group consisting of a compound represented by a formula (3), a compound represented by a formula (4), a compound represented by a formula (5), a compound represented by a formula (6), a compound represented by a formula (7), a compound represented by a formula (8), a compound represented by a formula (9), and a compound represented by a formula (10), (3)

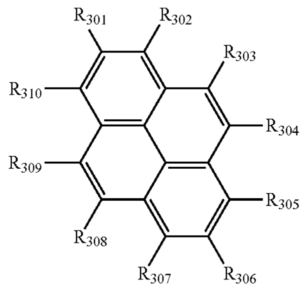

where in the formula (3):

at least one combination of adjacent two or more of $R_{301}$ to $R_{310}$ are mutually bonded to form a substituted or unsubstituted monocyclic ring, mutually bonded to form a substituted or unsubstituted fused ring, or not mutually bonded;

at least one of $R_{301}$ to $R_{310}$ is a monovalent group represented by a formula (31) below; and $R_{301}$ to $R_{310}$ neither forming the monocyclic ring, forming the fused ring, nor being the monovalent group represented by the formula (31) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, (31)

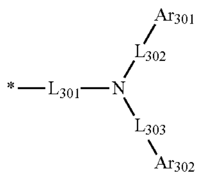

where in the formula (31):

$Ar_{301}$ and $Ar_{302}$ are each independently a substituted or unsubstituted aryl group having 6 to 50 ring carbon atoms, or a substituted or unsubstituted heterocyclic group having 5 to 50 ring atoms;

$L_{301}$ to $L_{303}$ are each independently a single bond, a substituted or unsubstituted arylene group having 6 to 30 ring carbon atoms, or a substituted or unsubstituted divalent heterocyclic group having 5 to 30 ring atoms; and

* represents a bonding position to a pyrene ring in the formula (3), (4)

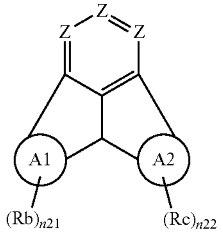

where in the formula (4);

Z are each independently CRa or a nitrogen atom;

A1 ring and A2 ring are each independently a substituted or unsubstituted aromatic hydrocarbon ring having 6 to 50 ring carbon atoms or a substituted or unsubstituted heterocycle having 5 to 50 ring atoms;

when a plurality of Ra are present, at least one combination of adjacent two or more of Ra are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of Rb are present, at least one combination of adjacent two or more of Rb are mutually bonded to form a substituted or unsubstituted monocyclic ring, mutually bonded to form a substituted or unsubstituted fused ring, or not mutually bonded;

when a plurality of Rc are present, at least one combination of adjacent two or more of Rc are mutually bonded to form a substituted or unsubstituted monocyclic ring, mutually bonded to form a substituted or unsubstituted fused ring, or not mutually bonded; and Ra, Rb, and Rc neither forming the monocyclic ring nor forming the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, (5)

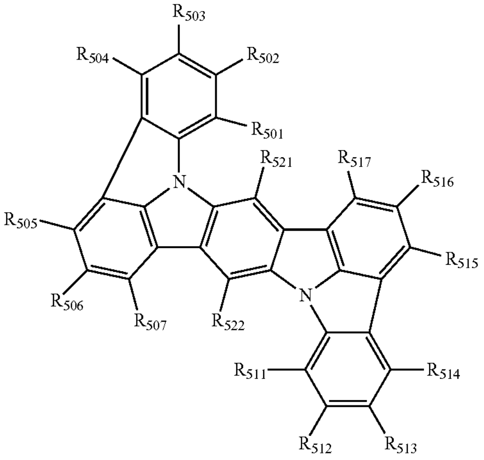

where in the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded;

$R_{501}$ to $R_{507}$ and $R_{511}$ to $R_{517}$ neither forming the monocyclic ring nor forming the fused ring each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{521}$ and $R_{522}$ each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, (6)

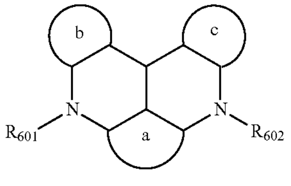

where in the formula (6):

a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{601}$ and $R_{602}$ are each independently bonded with the a ring, b ring, or a c ring to form a substituted or unsubstituted heterocycle or to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, (7)

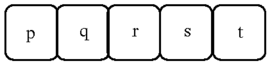

(72)

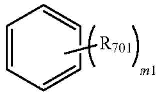

(73)

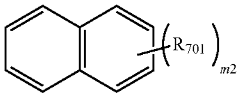

(74)

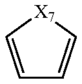

(75)

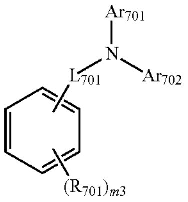

(76)

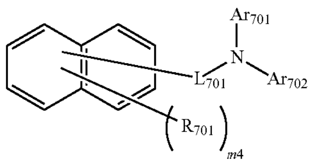

where in the formula (7):

r ring is a ring represented by the formula (72) or the formula (73), the r ring being fused with at any position (s) of respective adjacent rings;

q ring and s ring are each independently a ring represented by the formula (74) and fused with any position(s) of respective adjacent rings;

p ring and t ring are each independently a moiety represented by the formula (75) or the formula (76) and fused with any position(s) of respective adjacent rings;

$X_7$ is an oxygen atom, a sulfur atom, or $NR_{702}$;

when a plurality of $R_{701}$ are present, adjacent ones of the plurality of $R_{701}$ are mutually bonded to form a substituted or unsubstituted monocyclic ring, mutually bonded to form a substituted or unsubstituted fused ring, or not mutually bonded;

$R_{701}$ and $R_{702}$ neither forming the monocyclic ring nor forming the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$Ar_{701}$ and $Ar_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$L_{701}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms;

m1 is 0, 1, or 2;

m2 is 0, 1, 2, 3, or 4;

m3 is each independently 0, 1, 2, or 3;

m4 is each independently 0, 1, 2, 3, 4, or 5;

when a plurality of $R_{701}$ are present, the plurality of $R_{701}$ are mutually the same or different;

when a plurality of $X_7$ are present, the plurality of $X_7$ are mutually the same or different;

when a plurality of $R_{702}$ are present, the plurality of $R_{702}$ are mutually the same or different;

when a plurality of $Ar_{701}$ are present, the plurality of $Ar_{701}$ are mutually the same or different;

when a plurality of $Ar_{702}$ are present, the plurality of $Ar_{702}$ are mutually the same or different; and when a plurality of $L_{701}$ are present, the plurality of $L_{701}$ are mutually the same or different, (8)

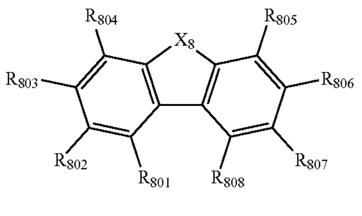

where in the formula (8):

at least one combination of a combination of $R_{801}$ and $R_{802}$, a combination of $R_{802}$ and $R_{803}$, or a combination of $R_{803}$ and $R_{804}$ are mutually bonded to form a divalent group represented by a formula (82) below; and at least one combination of a combination of $R_{805}$ and $R_{806}$, a combination of $R_{806}$ and $R_{807}$, or a combination of $R_{807}$ and $R_{808}$ are mutually bonded to form a divalent group represented by a formula (83) below, (82)

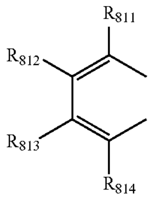

(83)

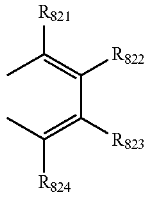

at least one of $R_{801}$ to $R_{804}$ not forming the divalent group represented by the formula (82) or $R_{811}$ to $R_{814}$ is a monovalent group represented by a formula (84) below, at least one of $R_{805}$ to $R_{808}$ not forming the divalent group represented by the formula (83) or $R_{821}$ to $R_{824}$ is a monovalent group represented by the formula (84) below, $X_8$ is an oxygen atom, a sulfur atom, or $NR_{809}$, $R_{801}$ to $R_{808}$ neither forming the divalent groups represented by the formulae (82) and (83) nor being the monovalent group represented by the formula (84), $R_{811}$ to $R_{814}$ and $R_{821}$ to $R_{824}$ not being the monovalent group represented by the formula (84), and $R_{809}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, (84)

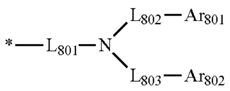

where in the formula (84):

$Ar_{801}$ and $Ar_{802}$ each independently represent a substituted or unsubstituted aryl group having 6 to 50 ring carbon atoms, or a substituted or unsubstituted heterocyclic group having 5 to 50 ring atoms;

$L_{801}$ to $L_{803}$ each independently represent a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of the substituted or unsubstituted arylene group having 6 to 30 ring carbon atoms and a substituted or unsubstituted divalent heterocyclic group having 5 to 30 ring atoms; and

* in the formula (84) represents a bonding position to the cyclic structure represented by the formula (8) or the group represented by the formula (82) or (83), (9)

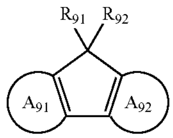

where in the formula (9):

$A_{91}$ ring and $A_{92}$ ring are each independently a substituted or unsubstituted aromatic hydrocarbon ring having 6 to 50 ring carbon atoms or a substituted or unsubstituted heterocycle having 5 to 50 ring atoms; and at least one of $A_{91}$ ring or $A_{92}$ ring is bonded to * in a structure represented by a formula (92) below, (92)

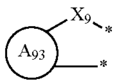

where in the formula (92);

$A_{93}$ ring is a substituted or unsubstituted aromatic hydrocarbon ring having 6 to 50 ring carbon atoms or a substituted or unsubstituted heterocycle having 5 to 50 ring atoms;

$X_9$ is $NR_{93}$, C($R_{94}$)($R_{95}$), Si($R_{96}$)($R_{97}$), Ge($R_{98}$)($R_{99}$), an oxygen atom, a sulfur atom, or a selenium atom;

$R_{91}$ and $R_{92}$ are mutually bonded to form a substituted or unsubstituted monocyclic ring, mutually bonded to form a substituted or unsubstituted fused ring, or not mutually bonded; and $R_{91}$ and $R_{92}$ neither forming the monocyclic ring nor forming the fused ring, and $R_{93}$ to $R_{99}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, (10)

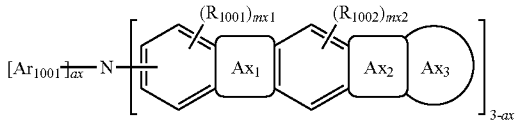

(10a)

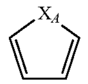

(10b)

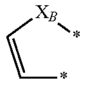

where in the formula (10);

$Ax_1$ ring is a ring represented by the formula (10a) and fused with any positions of adjacent rings;

$Ax_2$ ring is a ring represented by the formula (10b) and fused with any positions of adjacent rings;

two * in the formula (10b) are bonded to any position of $Ax_3$ ring;

$X_A$ and $X_B$ are each independently $C(R_{1003})(R_{1004})$, $Si(R_{1005})(R_{1006})$, an oxygen atom or a sulfur atom;

$Ax_3$ ring is a substituted or unsubstituted aromatic hydrocarbon ring having 6 to 50 ring carbon atoms or a substituted or unsubstituted heterocycle having 5 to 50 ring atoms;

$Ar_{1001}$ is a substituted or unsubstituted aryl group having 6 to 50 ring carbon atoms, or a substituted or unsubstituted heterocyclic group having 5 to 50 ring atoms;

$R_{1001}$ to $R_{1006}$ each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

mx1 is 3, and mx2 is 2;

a plurality of $R_{1001}$ are mutually the same or different;

a plurality of $R_{1002}$ are mutually the same or different;

ax is 0, 1, or 2;

when ax is 0 or 1, the structures enclosed by brackets indicated by "3-ax" are mutually the same or different; and when ax is 2, a plurality of $Ar_{1001}$ are mutually the same or different, in the first dopant material and the second dopant material, $R_{901}$, $R_{902}$, $R_{903}$, $R_{904}$, $R_{905}$, $R_{906}$ and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

2. The organic electroluminescence device according to claim 1, wherein a singlet energy $S_1(H1)$ of the first host material and a singlet energy $S_1(D1)$ of the first dopant material satisfy a relationship of a numerical formula (Numerical Formula 2) below, $$S_1(H1)>S_1(D1) \quad \text{(Numerical Formula 2).}$$

3. The organic electroluminescence device according to claim 1, wherein the first dopant material is not a complex.

4. The organic electroluminescence device according to claim 1, wherein the first dopant material is comprised at more than 1.1 mass % in the first emitting layer.

5. The organic electroluminescence device according to claim 1, wherein the second dopant material comprises a full width at half maximum in a range from 1 nm to 20 nm at a maximum peak.

6. The organic electroluminescence device according to claim 1, wherein the second dopant material comprises a Stokes shift exceeding 7 nm.

7. The organic electroluminescence device according to claim 1, wherein a triplet energy $T_1(D2)$ of the second dopant material and the triplet energy $T_1(H2)$ of the second host material satisfy a relationship of a numerical formula (Numerical Formula 3) below, $$T_1(D2)>T_1(H2) \quad \text{(Numerical Formula 3).}$$

8. The organic electroluminescence device according to claim 1, wherein a singlet energy $S_1(H2)$ of the second host material and a singlet energy $S_1(D2)$ of the second dopant material satisfy a relationship of a numerical formula (Numerical Formula 4) below, $$S_1(H2)>S_1(D2) \quad \text{(Numerical Formula 4).}$$

9. The organic electroluminescence device according to claim 1, wherein an electron mobility $\mu e(H1)$ of the first host material and an electron mobility $\mu e(H2)$ of the second host material satisfy a relationship of a numerical formula (Numerical Formula 30) below, $$\mu e(H2)>\mu e(H1) \quad \text{(Numerical Formula 30).}$$

10. The organic electroluminescence device according to claim 1, wherein the second dopant material is not a complex.

11. The organic electroluminescence device according to claim 1, wherein the second dopant material is comprised at more than 1.1 mass % in the second emitting layer.

12. The organic electroluminescence device according to claim 1, further comprising: an anode and a cathode, wherein the first emitting layer is provided between the anode and the cathode, and the second emitting layer is provided between the first emitting layer and the cathode.

13. The organic electroluminescence device according to claim 1, further comprising: an anode, a cathode, and a hole transporting layer provided between the anode, and the first emitting layer or the second emitting layer which is closer to the anode.

14. The organic electroluminescence device according to claim 1, further comprising: an anode, a cathode, and an electron transporting layer provided between the cathode, and the first emitting layer or the second emitting layer which is closer to the cathode.

15. The organic electroluminescence device according to claim 1, wherein the triplet energy $T_1$(H1) of the first host material and the triplet energy $T_1$(H2) of the second host material satisfy a relationship of a numerical formula (Numerical Formula 5) below, $$T_1(H1)-T_1(H2)>0.03\text{ eV} \quad \text{(Numerical Formula 5).}$$

16. The organic electroluminescence device according to claim 1, wherein the first emitting layer emits light having a maximum peak wavelength of 500 nm or less when the device is driven.

17. The organic electroluminescence device according to claim 1, wherein the second emitting layer emits light having a maximum peak wavelength of 500 nm or less when the device is driven.

18. The organic electroluminescence device according to claim 1, wherein the organic electroluminescence device emits light having a maximum peak wavelength of 500 nm or less when the device is driven.

19. The organic electroluminescence device according to claim 1, wherein the first emitting layer does not comprise a metal complex.

20. The organic electroluminescence device according to claim 1, wherein the second emitting layer does not comprise a metal complex.

21. The organic electroluminescence device according to claim 1, wherein the first emitting layer comprises a film thickness in a range from 3 nm to 15 nm.

22. The organic electroluminescence device according to claim 1, wherein the second emitting layer comprises a film thickness in a range from 5 nm to 20 nm.

23. The organic electroluminescence device according to claim 1, further comprising: a third emitting layer, wherein the third emitting layer comprises a third host material, the first host material, the second host material, and the third host material are different from each other, the third emitting layer at least comprises a compound having a maximum peak wavelength of 500 nm or less, the first dopant material, the second dopant material, and the compound having the maximum peak wavelength of 500 nm or less contained in the third emitting layer are mutually the same or different, the triplet energy $T_1$(H1) of the first host material and a triplet energy $T_1$(H3) of the third host material satisfy a relationship of a numerical formula (Numerical Formula 1A) below, $$T_1(H1)>T_1(H3) \quad \text{(Numerical Formula 1A).}$$

24. The organic electroluminescence device according to claim 23, wherein the triplet energy $T_1$(H2) of the second host material and the triplet energy $T_1$(H3) of the third host material satisfy a relationship of a numerical formula (Numerical Formula 1B) below, $$T_1(H2)>T_1(H3) \quad \text{(Numerical Formula 1B).}$$

25. The organic electroluminescence device according to claim 1, wherein the first emitting layer and the second emitting layer are in direct contact with each other.

26. The organic electroluminescence device according to claim 23, wherein the first emitting layer and the second emitting layer are in direct contact with each other, and the second emitting layer and the third emitting layer are in direct contact with each other.

27. The organic electroluminescence device according to claim 1, wherein a triplet energy $T_1$(DX) of the first dopant material or the second dopant material, the triplet energy $T_1$(H1) of the first host material, and the triplet energy $T_1$(H2) of the second host material satisfy a relationship of a numerical formula (Numerical Formula 10X) below, $$2.7\text{ eV}>T_1(DX)>T_1(H1)>T_1(H2) \quad \text{(Numerical Formula 10X).}$$

28. The organic electroluminescence device according to claim 1, wherein the triplet energy $T_1$(DX) of the first dopant material or the second dopant material and the triplet energy $T_1$(H1) of the first host material satisfy a relationship of a numerical formula (Numerical Formula 11X) below, $$0\text{ eV}<T_1(DX)-T_1(H1)<0.7\text{ eV} \quad \text{(Numerical Formula 11X).}$$

29. The organic electroluminescence device according to claim 1, wherein the triplet energy $T_1$(H1) of the first host material satisfies a relationship of a numerical formula (Numerical Formula 12) below, $$T_1(H1)>2.0\text{ eV} \quad \text{(Numerical Formula 12).}$$

30. The organic electroluminescence device according to claim 1, wherein the triplet energy $T_1$(H2) of the second host material satisfies a numerical formula (Numerical Formula 13) below, $$T_1(H2)\geq 1.9\text{ eV} \quad \text{(Numerical Formula 13).}$$

31. An electronic device comprising the organic electroluminescence device according to claim 1.

* * * * *